US011527720B1

(12) United States Patent
Kudo et al.

(10) Patent No.: US 11,527,720 B1
(45) Date of Patent: Dec. 13, 2022

(54) ORGANIC ELECTROLUMINESCENCE DEVICE, ELECTRONIC DEVICE, AND COMPOUND

(71) Applicant: IDEMITSU KOSAN CO., LTD., Tokyo (JP)

(72) Inventors: Yu Kudo, Sodegaura (JP); Hiroaki Itoi, Sodegaura (JP); Shintaro Ban, Sodegaura (JP); Taro Yamaki, Sodegaura (JP); Takamoto Morita, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 17/566,224

(22) Filed: Dec. 30, 2021

(30) Foreign Application Priority Data

Aug. 13, 2021 (JP) ............................ JP2021-131972

(51) Int. Cl.
*H01L 51/00* (2006.01)
*H01L 51/50* (2006.01)

(52) U.S. Cl.
CPC ...... *H01L 51/0058* (2013.01); *H01L 51/0054* (2013.01); *H01L 51/0055* (2013.01);
(Continued)

(58) Field of Classification Search
CPC ............. H01L 51/0058; H01L 51/0054; H01L 51/0055; H01L 51/0073
See application file for complete search history.

(56) References Cited

U.S. PATENT DOCUMENTS

2010/0289013 A1 11/2010 Ito et al.
2010/0295444 A1 11/2010 Kuma et al.
(Continued)

FOREIGN PATENT DOCUMENTS

CN 113429399 A 9/2021
JP 2019-161218 A 9/2019
(Continued)

OTHER PUBLICATIONS

International Searching Authority, "International Search Report," issued in connection with International Patent Application No. PCT/JP2022/027577, dated Sep. 6, 2022.

*Primary Examiner* — Anthony Ho
(74) *Attorney, Agent, or Firm* — Foley & Lardner LLP

(57) ABSTRACT

An organic electroluminescence device includes an emitting region provided between an anode and a cathode, in which the emitting region includes a first emitting layer and a second emitting layer, a ratio $D_{EM1}/D_{EM2}$ of a film thickness of the first emitting layer $D_{EM1}$ to a film thickness of the second emitting layer $D_{EM2}$ is in a range from 2/3 to 3/2, the first emitting layer contains a first host material and a first emitting compound, the second emitting layer contains a second host material and a second emitting compound, and the first host material has a group represented by a formula (10) below and is a compound represented by a formula (1) below.

(1)

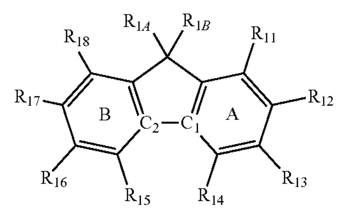

(10)

$$*\!-\!\left(L_1\right)_{mx}\!-\!Ar_1$$

28 Claims, 2 Drawing Sheets

Figure 1:
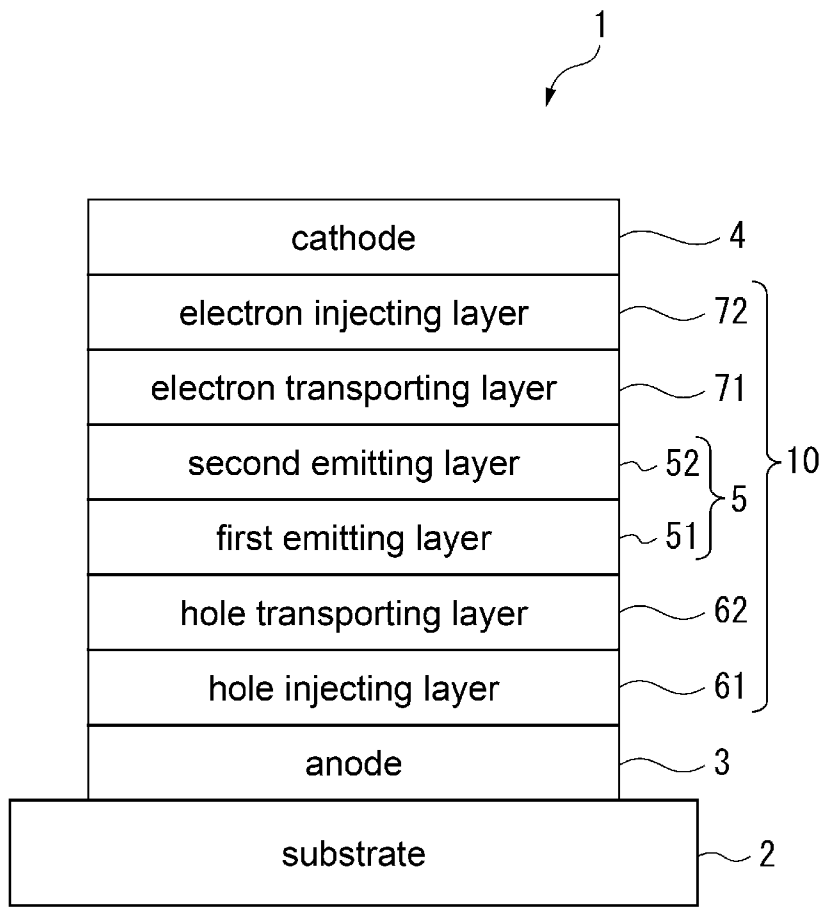

(52) U.S. Cl.
CPC ........ *H01L 51/0073* (2013.01); *H01L 51/504* (2013.01); *H01L 51/5016* (2013.01); *H01L 2251/5384* (2013.01)

(56) References Cited

U.S. PATENT DOCUMENTS

| | | | |
|---|---|---|---|
| 2016/0181543 | A1 | 6/2016 | Ito et al. |
| 2020/0235320 | A1 | 7/2020 | Yen et al. |

FOREIGN PATENT DOCUMENTS

| | | | |
|---|---|---|---|
| WO | WO-2009/081774 | A1 | 7/2009 |
| WO | WO-2010/134350 | A1 | 11/2010 |
| WO | WO-2021/049653 | A1 | 3/2021 |
| WO | WO-2021/049662 | A1 | 3/2021 |
| WO | WO-2022/025511 | A1 | 2/2022 |

ORGANIC ELECTROLUMINESCENCE DEVICE, ELECTRONIC DEVICE, AND COMPOUND

The disclosure of Japanese Patent Application No. 2021-131972 filed Aug. 13, 2021 is expressly incorporated by reference herein.

TECHNICAL FIELD

The present invention relates to an organic electroluminescence device, an electronic device, and a compound.

BACKGROUND ART

An organic electroluminescence device (hereinafter, occasionally referred to as "organic EL device") has found its application in a full-color display for mobile phones, televisions and the like. When a voltage is applied to an organic EL device, holes and electrons are injected from an anode and a cathode, respectively, into an emitting layer. The injected holes and electrons are recombined in the emitting layer to form excitons. Specifically, according to the electron spin statistics theory, singlet excitons and triplet excitons are generated at a ratio of 25%:75%.

In order to improve performance of an organic EL device, studies on laminating a plurality of emitting layers have been made, for instance, in Literature 1 (JP 2019-161218 A) and Literature 2 (International Publication No. WO2021/049662). In addition, Literature 3 (International Publication No. WO2010/134350) describes a phenomenon where singlet excitons are generated by collision and fusion of two triplet excitons (hereinafter, occasionally referred to as a Triplet-Triplet Fusion (TTF) phenomenon) in order to improve performance of an organic EL device.

The performance of the organic EL device is evaluatable in terms of, for instance, luminance, emission wavelength, chromaticity, emission efficiency, drive voltage, and lifetime.

SUMMARY OF THE INVENTION

An object of the invention is to provide an organic electroluminescence device having a low drive voltage and high luminous efficiency, a compound capable of decreasing a drive voltage to improve luminous efficiency of an organic electroluminescence device, and an electronic device including the organic electroluminescence device.

According to an aspect of the invention, there is provided an organic electroluminescence device including: an anode; a cathode; and an emitting region provided between the anode and the cathode, in which the emitting region includes a first emitting layer and a second emitting layer, a ratio $D_{EM1}/D_{EM2}$ of a film thickness of the first emitting layer $D_{EM1}$ to a film thickness of the second emitting layer $D_{EM2}$ is in a range from 2/3 to 3/2, the first emitting layer contains a first host material and a first emitting compound, the second emitting layer contains a second host material and a second emitting compound, the first host material is a compound represented by a formula (1) below, the first host material is different from the second host material, and the first emitting compound and the second emitting compound are mutually the same or different.

(1)

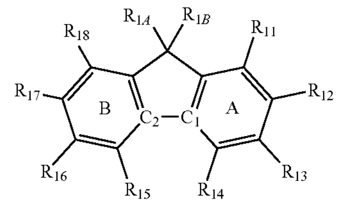

(10)

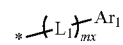

In the formula (1):

$R_{1A}$ and $R_{1B}$ are each independently a substituted or unsubstituted alkyl group having 1 to 15 carbon atoms, a substituted or unsubstituted aryl group having 6 to 17 ring carbon atoms, or a substituted or unsubstituted heterocyclic group having 5 to 17 ring atoms;

at least one of $R_{1A}$ or $R_{1B}$ is a substituted or unsubstituted alkyl group having 1 to 15 carbon atoms;

one combination of a combination of adjacent two or more of $R_{11}$ to $R_{14}$ and a combination of adjacent two or more of $R_{15}$ to $R_{18}$ are mutually bonded to form a substituted or unsubstituted monocyclic ring, or mutually bonded to form a substituted or unsubstituted fused ring;

when the substituted or unsubstituted monocyclic ring or the substituted or unsubstituted fused ring is formed with a ring A, a group represented by a formula (10) is bonded to a carbon atom bonded to $R_{12}$ or a carbon atom, among carbon atoms forming the substituted or unsubstituted monocyclic ring or the substituted or unsubstituted fused ring, at a position farthest from a carbon atom $C_1$ of the ring A bonded by a single bond to a carbon atom $C_2$ of a ring B;

when the substituted or unsubstituted monocyclic ring or the substituted or unsubstituted fused ring is formed not with the ring A but with the ring B, the group represented by the formula (10) is bonded to the carbon atom bonded to $R_{12}$; and $R_{12}$ not bonded with the group represented by the formula (10), and $R_{11}$, $R_{13}$, $R_{14}$ and $R_{15}$ to $R_{18}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a substituted or unsubstituted aralkyl group having 7 to 50 carbon atoms, a group represented by —$C(=O)R_{801}$, a group represented by —$COOR_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

In the formula (10):

$Ar_1$ is a substituted or unsubstituted aryl group having four or more fused rings, or a substituted or unsubstituted heterocyclic group having four or more fused rings;

$L_1$ is a single bond, a substituted or unsubstituted arylene group having 6 to 17 ring carbon atoms, or a substituted or unsubstituted divalent heterocyclic group having 5 to 17 ring atoms;

mx is 0, 1, or 2;

* represents a bonding position to an atom forming a ring of the formula (1); and the first host material does not contain, in a molecule of the first host material, three or more of: a substituted or unsubstituted aryl group having four or more fused rings; and a substituted or unsubstituted heterocyclic group having four or more fused rings.

In the first host material:

$R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 17 ring carbon atoms, or a substituted or unsubstituted heterocyclic group having 5 to 17 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

According to another aspect of the invention, there is provided a compound represented by a formula (1A) below.

(1A)

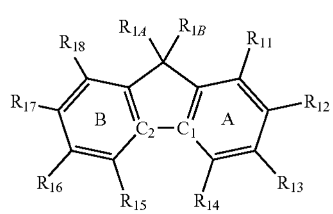

(10A)

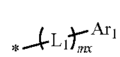

In the formula (1A):

$R_{1A}$ and $R_{1B}$ are each independently a substituted or unsubstituted alkyl group having 1 to 15 carbon atoms, a substituted or unsubstituted aryl group having 6 to 17 ring carbon atoms, or a substituted or unsubstituted heterocyclic group having 5 to 17 ring atoms;

at least one of $R_{1A}$ or $R_{1B}$ is a substituted or unsubstituted alkyl group having 1 to 15 carbon atoms;

at least one combination of a combination of $R_{11}$ and $R_{12}$, a combination of $R_{12}$ and $R_{13}$, a combination of $R_{16}$ and $R_{17}$, and a combination of $R_{17}$ and $R_{18}$, are mutually bonded to form a substituted or unsubstituted monocyclic ring, or mutually bonded to form a substituted or unsubstituted fused ring;

when the combination of $R_{11}$ and $R_{12}$ or the combination of $R_{12}$ and $R_{13}$ are mutually bonded to form a substituted or unsubstituted monocyclic ring or a substituted or unsubstituted fused ring with a ring A, a group represented by the formula (10A) is bonded to a carbon atom, among carbon atoms forming the substituted or unsubstituted monocyclic ring or the substituted or unsubstituted fused ring, at a position farthest from a carbon atom $C_1$ of the ring A bonded by a single bond to a carbon atom $C_2$ of a ring B;

$R_{12}$ not forming the substituted or unsubstituted monocyclic ring and not forming the substituted or unsubstituted fused ring is the group represented by the formula (10A); and $R_{11}$, $R_{13}$, $R_{14}$ and $R_{15}$ to $R_1$, not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

In the formula (10A):

$Ar_1$ is a substituted or unsubstituted aryl group having four or more fused rings, or a substituted or unsubstituted heterocyclic group having four or more fused rings;

$L_1$ is a single bond, a substituted or unsubstituted arylene group having 6 to 17 ring carbon atoms, or a substituted or unsubstituted divalent heterocyclic group having 5 to 17 ring atoms;

mx is 0, 1, or 2;

* represents a bonding position to an atom forming a ring of the formula (1A); and the compound represented by the formula (1A) does not contain, in a molecule of the compound, three or more of: a substituted or unsubstituted aryl group having four or more fused rings; and a substituted or unsubstituted heterocyclic group having four or more fused rings.

In the compound represented by the formula (1A):

$R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 17 ring carbon atoms, or a substituted or unsubstituted heterocyclic group having 5 to 17 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

According to still another aspect of the invention, there is provided a compound represented by a formula (1B) below.

(1B)

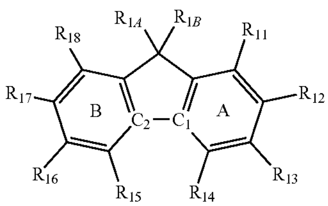

(10B)

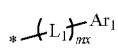

In the formula (1B):

$R_{1A}$ and $R_{1B}$ are each independently a substituted or unsubstituted alkyl group having 1 to 15 carbon atoms, a substituted or unsubstituted aryl group having 6 to 17 ring carbon atoms, or a substituted or unsubstituted heterocyclic group having 5 to 17 ring atoms;

at least one of $R_{1A}$ or $R_{1B}$ is a substituted or unsubstituted alkyl group having 1 to 15 carbon atoms;

one combination of a combination of adjacent two or more of $R_{11}$ to $R_{14}$ and a combination of adjacent two or more of $R_{15}$ to $R_{18}$ are mutually bonded to form a substituted or unsubstituted monocyclic ring, or mutually bonded to form a substituted or unsubstituted fused ring;

when the substituted or unsubstituted monocyclic ring or the substituted or unsubstituted fused ring is formed with a ring A, a group represented by a formula (10B) is bonded to a carbon atom bonded to $R_{12}$ or a carbon atom, among carbon atoms forming the substituted or unsubstituted monocyclic ring or the substituted or unsubstituted fused ring, at a position farthest from a carbon atom $C_1$ of the ring A bonded by a single bond to a carbon atom $C_2$ of a ring B;

when the substituted or unsubstituted monocyclic ring or the substituted or unsubstituted fused ring is formed not with the ring A but with the ring B, the group represented by the formula (10B) is bonded to the carbon atom bonded to $R_{12}$; and $R_{12}$ not bonded with the group represented by the formula (10B), and $R_{11}$, $R_{13}$, $R_{14}$ and $R_{15}$ to $R_{18}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

In the formula (10B):

$Ar_1$ is a substituted or unsubstituted aryl group having four or more fused rings, or a substituted or unsubstituted heterocyclic group having four or more fused rings;

$Ar_1$ is not a substituted or unsubstituted pyrenyl group;

$L_1$ is a single bond, a substituted or unsubstituted arylene group having 6 to 17 ring carbon atoms, or a substituted or unsubstituted divalent heterocyclic group having 5 to 17 ring atoms;

mx is 0, 1, or 2;

* represents a bonding position to an atom forming a ring of the formula (1B); and the compound represented by the formula (1B) does not contain, in a molecule of the compound, three or more of: a substituted or unsubstituted aryl group having four or more fused rings; and a substituted or unsubstituted heterocyclic group having four or more fused rings.

In the compound represented by the formula (1B):

$R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 17 ring carbon atoms, or a substituted or unsubstituted heterocyclic group having 5 to 17 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

According to a further aspect of the invention, there is provided an electronic device including the organic electroluminescence device according to the above aspect of the invention.

According to a still further aspect of the invention, there are provided an organic electroluminescence device having a low drive voltage and high luminous efficiency, a compound capable of decreasing a drive voltage to improve luminous efficiency of an organic electroluminescence device, and an electronic device including the organic electroluminescence device.

BRIEF DESCRIPTION OF DRAWING(S)

FIG. 1 schematically shows an exemplary arrangement of an organic electroluminescence device according to an exemplary embodiment of the invention.

Figure 2:
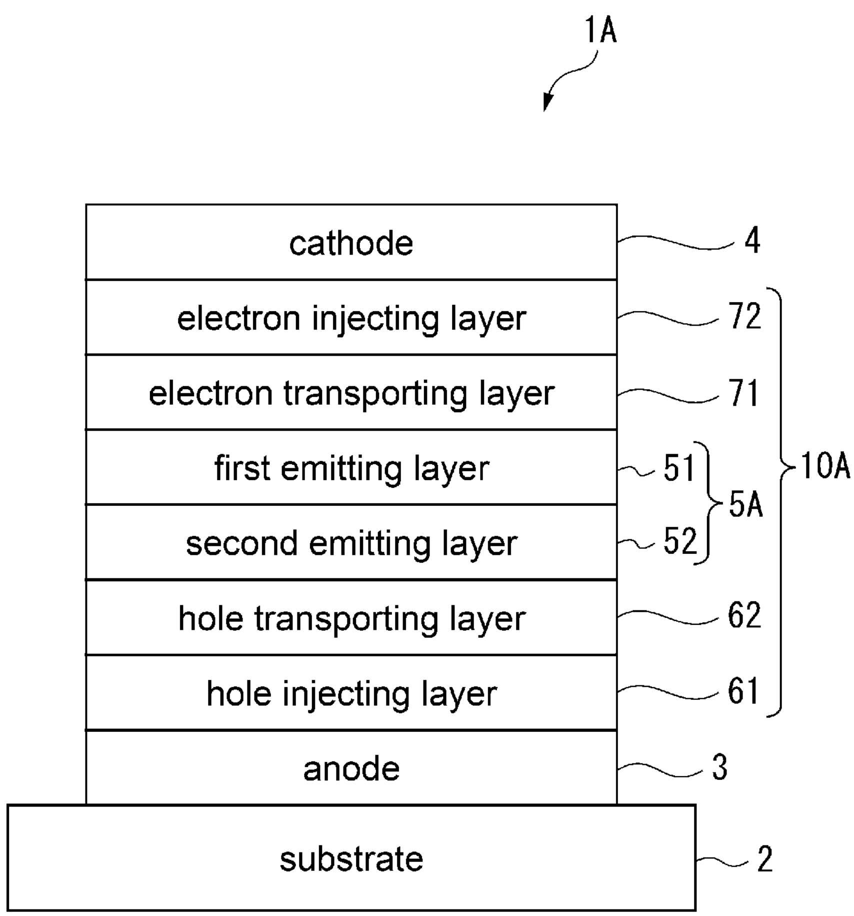

FIG. 2 schematically shows another exemplary arrangement of the organic electroluminescence device according to the exemplary embodiment of the invention.

DESCRIPTION OF EMBODIMENT(S)

Definitions

Herein, a hydrogen atom includes isotope having different numbers of neutrons, specifically, protium, deuterium and tritium.

In chemical formulae herein, it is assumed that a hydrogen atom (i.e. protium, deuterium and tritium) is bonded to each of bondable positions that are not annexed with signs "R" or the like or "D" representing a deuterium.

Herein, the ring carbon atoms refer to the number of carbon atoms among atoms forming a ring of a compound (e.g., a monocyclic compound, fused-ring compound, cross-linking compound, carbon ring compound, and heterocyclic compound) in which the atoms are bonded to each other to form the ring. When the ring is substituted by a substituent(s), carbon atom(s) contained in the substituent(s) is not counted in the ring carbon atoms. Unless otherwise specified, the same applies to the "ring carbon atoms" described later. For instance, a benzene ring has 6 ring carbon atoms, a naphthalene ring has 10 ring carbon atoms, a pyridine ring has 5 ring carbon atoms, and a furan ring has 4 ring carbon atoms. Further, for instance, 9,9-diphenylfluorenyl group has 13 ring carbon atoms and 9,9'-spirobifluorenyl group has 25 ring carbon atoms.

When a benzene ring is substituted by a substituent in a form of, for instance, an alkyl group, the number of carbon atoms of the alkyl group is not counted in the number of the ring carbon atoms of the benzene ring. Accordingly, the benzene ring substituted by an alkyl group has 6 ring carbon atoms. When a naphthalene ring is substituted by a substituent in a form of, for instance, an alkyl group, the number of carbon atoms of the alkyl group is not counted in the number of the ring carbon atoms of the naphthalene ring. Accordingly, the naphthalene ring substituted by an alkyl group has 10 ring carbon atoms.

Herein, the ring atoms refer to the number of atoms forming a ring of a compound (e.g., a monocyclic compound, fused-ring compound, cross-linking compound, carbon ring compound, and heterocyclic compound) in which the atoms are bonded to each other to form the ring (e.g., monocyclic ring, fused ring, and ring assembly). Atom(s) not forming the ring (e.g., hydrogen atom(s) for saturating the valence of the atom which forms the ring) and atom(s) in a substituent by which the ring is substituted are not counted as the ring atoms. Unless otherwise specified, the same applies to the "ring atoms" described later. For instance, a pyridine ring has 6 ring atoms, a quinazoline ring has 10 ring atoms, and a furan ring has 5 ring atoms. For instance, the number of hydrogen atom(s) bonded to a pyridine ring or the number of atoms forming a substituent are not counted as the pyridine ring atoms. Accordingly, a pyridine ring bonded to a hydrogen atom(s) or a substituent(s) has 6 ring atoms. For instance, the hydrogen atom(s) bonded to carbon atom(s) of a quinazoline ring or the atoms forming a substituent are not counted as the quinazoline ring atoms. Accordingly, a quinazoline ring bonded to hydrogen atom(s) or a substituent(s) has 10 ring atoms.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group. Herein, "YY" is larger than "XX," "XX" representing an integer of 1 or more and "YY" representing an integer of 2 or more.

Herein, "XX to YY atoms" in the description of "substituted or unsubstituted ZZ group having XX to YY atoms" represent atoms of an unsubstituted ZZ group and do not include atoms of a substituent(s) of the substituted ZZ group. Herein, "YY" is larger than "XX," "XX" representing an integer of 1 or more and "YY" representing an integer of 2 or more.

Herein, an unsubstituted ZZ group refers to an "unsubstituted ZZ group" in a "substituted or unsubstituted ZZ group," and a substituted ZZ group refers to a "substituted ZZ group" in a "substituted or unsubstituted ZZ group."

Herein, the term "unsubstituted" used in a "substituted or unsubstituted ZZ group" means that a hydrogen atom(s) in the ZZ group is not substituted with a substituent(s). The hydrogen atom(s) in the "unsubstituted ZZ group" is protium, deuterium, or tritium.

Herein, the term "substituted" used in a "substituted or unsubstituted ZZ group" means that at least one hydrogen atom in the ZZ group is substituted with a substituent. Similarly, the term "substituted" used in a "BB group substituted by AA group" means that at least one hydrogen atom in the BB group is substituted with the AA group.

Substituents Mentioned Herein

Substituents mentioned herein will be described below.

An "unsubstituted aryl group" mentioned herein has, unless otherwise specified herein, 6 to 50, preferably 6 to 30, more preferably 6 to 18 ring carbon atoms.

An "unsubstituted heterocyclic group" mentioned herein has, unless otherwise specified herein, 5 to 50, preferably 5 to 30, more preferably 5 to 18 ring atoms.

An "unsubstituted alkyl group" mentioned herein has, unless otherwise specified herein, 1 to 50, preferably 1 to 20, more preferably 1 to 6 carbon atoms.

An "unsubstituted alkenyl group" mentioned herein has, unless otherwise specified herein, 2 to 50, preferably 2 to 20, more preferably 2 to 6 carbon atoms.

An "unsubstituted alkynyl group" mentioned herein has, unless otherwise specified herein, 2 to 50, preferably 2 to 20, more preferably 2 to 6 carbon atoms.

An "unsubstituted cycloalkyl group" mentioned herein has, unless otherwise specified herein, 3 to 50, preferably 3 to 20, more preferably 3 to 6 ring carbon atoms.

An "unsubstituted arylene group" mentioned herein has, unless otherwise specified herein, 6 to 50, preferably 6 to 30, more preferably 6 to 18 ring carbon atoms.

An "unsubstituted divalent heterocyclic group" mentioned herein has, unless otherwise specified herein, 5 to 50, preferably 5 to 30, more preferably 5 to 18 ring atoms.

An "unsubstituted alkylene group" mentioned herein has, unless otherwise specified herein, 1 to 50, preferably 1 to 20, more preferably 1 to 6 carbon atoms.

Substituted or Unsubstituted Aryl Group

Specific examples (specific example group G1) of the "substituted or unsubstituted aryl group" mentioned herein include unsubstituted aryl groups (specific example group G1A) below and substituted aryl groups (specific example group G1B) below. (Herein, an unsubstituted aryl group refers to an "unsubstituted aryl group" in a "substituted or unsubstituted aryl group", and a substituted aryl group refers to a "substituted aryl group" in a "substituted or unsubstituted aryl group.") A simply termed "aryl group" herein includes both of an "unsubstituted aryl group" and a "substituted aryl group."

The “substituted aryl group” refers to a group derived by substituting at least one hydrogen atom in an “unsubstituted aryl group” with a substituent. Examples of the “substituted aryl group” include a group derived by substituting at least one hydrogen atom in the “unsubstituted aryl group” in the specific example group G1A below with a substituent, and examples of the substituted aryl group in the specific example group G1B below. It should be noted that the examples of the “unsubstituted aryl group” and the “substituted aryl group” mentioned herein are merely exemplary, and the “substituted aryl group” mentioned herein includes a group derived by further substituting a hydrogen atom bonded to a carbon atom of a skeleton of a “substituted aryl group” in the specific example group G1B below, and a group derived by further substituting a hydrogen atom of a substituent of the “substituted aryl group” in the specific example group G1B below.

Unsubstituted Aryl Group (Specific Example Group G1A):

a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, benzanthryl group, phenanthryl group, benzophenanthryl group, phenalenyl group, pyrenyl group, chrysenyl group, benzochrysenyl group, triphenylenyl group, benzotriphenylenyl group, tetracenyl group, pentacenyl group, fluorenyl group, 9,9'-spirobifluorenyl group, benzofluorenyl group, dibenzofluorenyl group, fluoranthenyl group, benzofluoranthenyl group, perylenyl group, and a monovalent aryl group derived by removing one hydrogen atom from cyclic structures represented by formulae (TEMP-1) to (TEMP-15) below.

(TEMP-1)

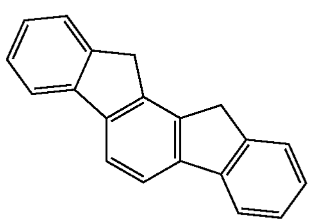

(TEMP-2)

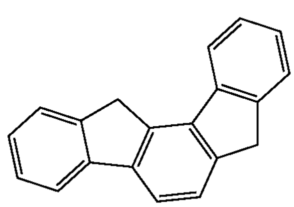

(TEMP-3)

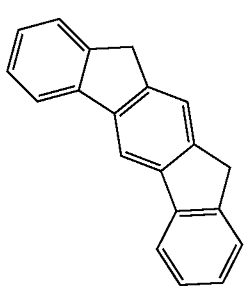

-continued (TEMP-4)

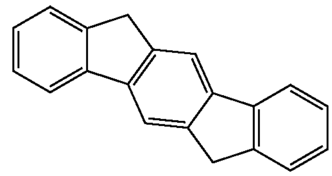

(TEMP-5)

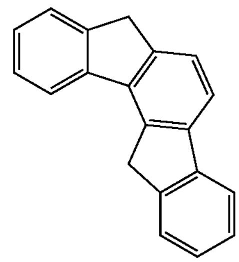

(TEMP-6)

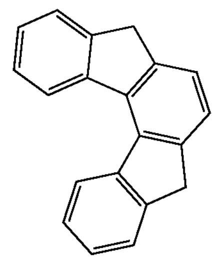

(TEMP-7)

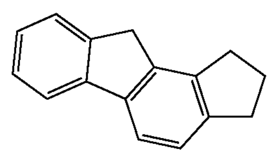

(TEMP-8)

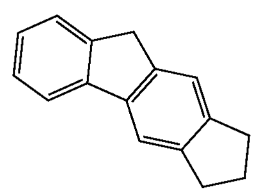

(TEMP-9)

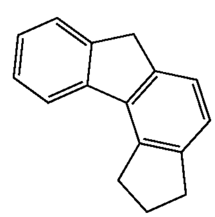

(TEMP-10)

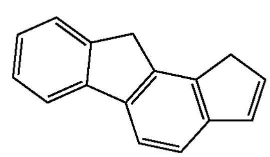

(TEMP-11)

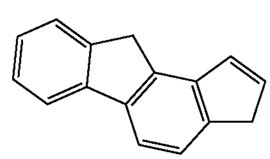

-continued (TEMP-12)

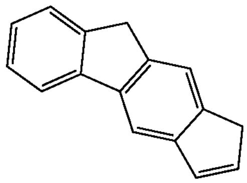

(TEMP-13)

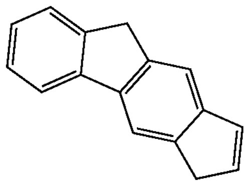

(TEMP-14)

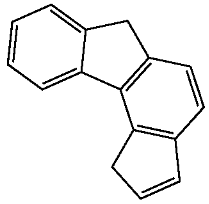

(TEMP-15)

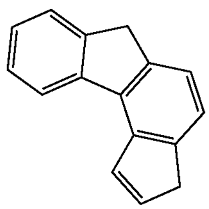

Substituted Aryl Group (Specific Example Group G1B):

o-tolyl group, m-tolyl group, p-tolyl group, para-xylyl group, meta-xylyl group, ortho-xylyl group, para-isopropylphenyl group, meta-isopropylphenyl group, ortho-isopropylphenyl group, para-t-butylphenyl group, meta-t-butylphenyl group, ortho-t-butylphenyl group, 3,4,5-trimethylphenyl group, 9,9-dimethylfluorenyl group, 9,9-diphenylfluorenyl group, 9,9-bis(4-methylphenyl)fluorenyl group, 9,9-bis(4-isopropylphenyl)fluorenyl group, 9,9-bis(4-t-butylphenyl)fluorenyl group, cyanophenyl group, triphenylsilylphenyl group, trimethylsilylphenyl group, phenylnaphthyl group, naphthylphenyl group, and a group derived by substituting at least one hydrogen atom of a monovalent group derived from one of the cyclic structures represented by the formulae (TEMP-1) to (TEMP-15) with a substituent.

Substituted or Unsubstituted Heterocyclic Group The "heterocyclic group" mentioned herein refers to a cyclic group having at least one hetero atom in the ring atoms. Specific examples of the hetero atom include a nitrogen atom, oxygen atom, sulfur atom, silicon atom, phosphorus atom, and boron atom.

The "heterocyclic group" mentioned herein is a monocyclic group or a fused-ring group.

The "heterocyclic group" mentioned herein is an aromatic heterocyclic group or a non-aromatic heterocyclic group.

Specific examples (specific example group G2) of the "substituted or unsubstituted heterocyclic group" mentioned herein include unsubstituted heterocyclic groups (specific example group G2A) and substituted heterocyclic groups (specific example group G2B). (Herein, an unsubstituted heterocyclic group refers to an "unsubstituted heterocyclic group" in a "substituted or unsubstituted heterocyclic group," and a substituted heterocyclic group refers to a "substituted heterocyclic group" in a "substituted or unsubstituted heterocyclic group.") A simply termed "heterocyclic group" herein includes both of "unsubstituted heterocyclic group" and "substituted heterocyclic group."

The "substituted heterocyclic group" refers to a group derived by substituting at least one hydrogen atom in an "unsubstituted heterocyclic group" with a substituent. Specific examples of the "substituted heterocyclic group" include a group derived by substituting at least one hydrogen atom in the "unsubstituted heterocyclic group" in the specific example group G2A below with a substituent, and examples of the substituted heterocyclic group in the specific example group G2B below. It should be noted that the examples of the "unsubstituted heterocyclic group" and the "substituted heterocyclic group" mentioned herein are merely exemplary, and the "substituted heterocyclic group" mentioned herein includes a group derived by further substituting a hydrogen atom bonded to a ring atom of a skeleton of a "substituted heterocyclic group" in the specific example group G2B below, and a group derived by further substituting a hydrogen atom of a substituent of the "substituted heterocyclic group" in the specific example group G2B below.

The specific example group G2A includes, for instance, unsubstituted heterocyclic groups including a nitrogen atom (specific example group G2A1) below, unsubstituted heterocyclic groups including an oxygen atom (specific example group G2A2) below, unsubstituted heterocyclic groups including a sulfur atom (specific example group G2A3) below, and monovalent heterocyclic groups (specific example group G2A4) derived by removing a hydrogen atom from cyclic structures represented by formulae (TEMP-16) to (TEMP-33) below.

The specific example group G2B includes, for instance, substituted heterocyclic groups including a nitrogen atom (specific example group G2B1) below, substituted heterocyclic groups including an oxygen atom (specific example group G2B2) below, substituted heterocyclic groups including a sulfur atom (specific example group G2B3) below, and groups derived by substituting at least one hydrogen atom of the monovalent heterocyclic groups (specific example group G2B4) derived from the cyclic structures represented by formulae (TEMP-16) to (TEMP-33) below.

Unsubstituted Heterocyclic Groups Including Nitrogen Atom (Specific Example Group G2A1):

pyrrolyl group, imidazolyl group, pyrazolyl group, triazolyl group, tetrazolyl group, oxazolyl group, isoxazolyl group, oxadiazolyl group, thiazolyl group, isothiazolyl group, thiadiazolyl group, pyridyl group, pyridazynyl group, pyrimidinyl group, pyrazinyl group, triazinyl group, indolyl group, isoindolyl group, indolizinyl group, quinolizinyl group, quinolyl group, isoquinolyl group, cinnolyl group, phthalazinyl group, quinazolinyl group, quinoxalinyl group, benzimidazolyl group, indazolyl group, phenanthrolinyl group, phenanthridinyl group, acridinyl group, phenazinyl group, carbazolyl group, benzocarbazolyl group, morpholino group, phenoxazinyl group, phenothiazinyl group, azacarbazolyl group, and diazacarbazolyl group.

Unsubstituted Heterocyclic Groups Including Oxygen Atom (Specific Example Group G2A2):

furyl group, oxazolyl group, isoxazolyl group, oxadiazolyl group, xanthenyl group, benzofuranyl group, isobenzofuranyl group, dibenzofuranyl group, naphthobenzofuranyl group, benzoxazolyl group, benzisoxazolyl group, phenoxazinyl group, morpholino group, dinaphthofuranyl group, azadibenzofuranyl group, diazadibenzofuranyl group, azanaphthobenzofuranyl group, and diazanaphthobenzofuranyl group.

Unsubstituted Heterocyclic Groups Including Sulfur Atom (Specific Example Group G2A3):

thienyl group, thiazolyl group, isothiazolyl group, thiadiazolyl group, benzothiophenyl group (benzothienyl group), isobenzothiophenyl group (isobenzothienyl group), dibenzothiophenyl group (dibenzothienyl group), naphthobenzothiophenyl group (nahthobenzothienyl group), benzothiazolyl group, benzisothiazolyl group, phenothiazinyl group, dinaphthothiophenyl group (dinaphthothienyl group), azadibenzothiophenyl group (azadibenzothienyl group), diazadibenzothiophenyl group (diazadibenzothienyl group), azanaphthobenzothiophenyl group (azanaphthobenzothienyl group), and diazanaphthobenzothiophenyl group (diazanaphthobenzothienyl group).

Monovalent Heterocyclic Groups Derived by Removing One Hydrogen Atom from Cyclic Structures Represented by Formulae (TEMP-16) to (TEMP-33) (Specific Example Group G2A4):

(TEMP-16)

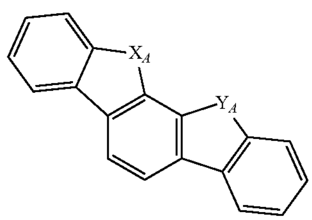

(TEMP-17)

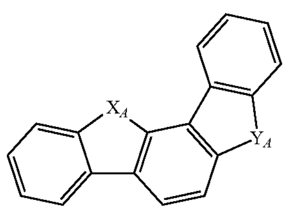

(TEMP-18)

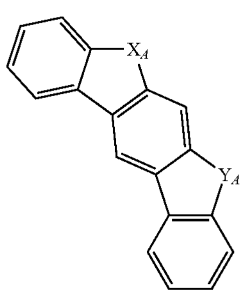

(TEMP-19)

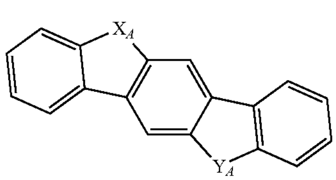

-continued (TEMP-20)

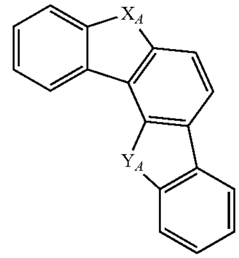

(TEMP-21)

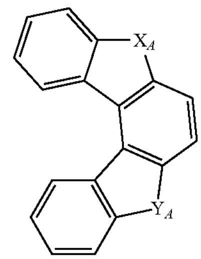

(TEMP-22)

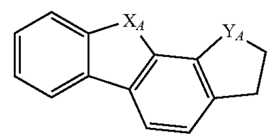

(TEMP-23)

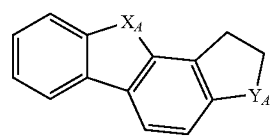

(TEMP-24)

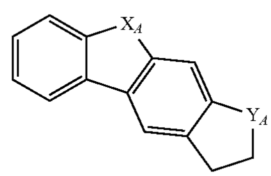

(TEMP-25)

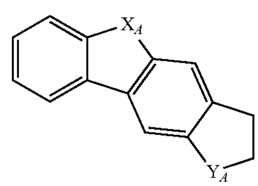

(TEMP-26)

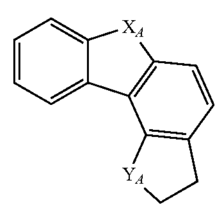

(TEMP-27)

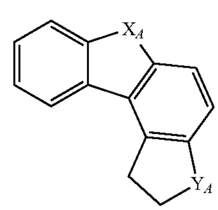

-continued (TEMP-28)

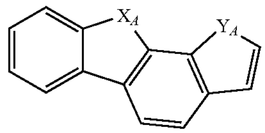

(TEMP-29)

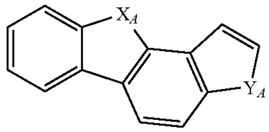

(TEMP-30)

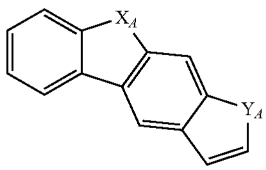

(TEMP-31)

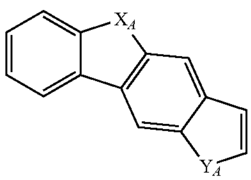

(TEMP-32)

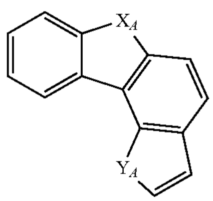

(TEMP-33)

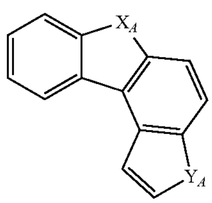

In the formulae (TEMP-16) to (TEMP-33), $X_A$ and $Y_A$ are each independently an oxygen atom, a sulfur atom, NH or $CH_2$, with a proviso that at least one of $X_A$ or $Y_A$ is an oxygen atom, a sulfur atom, or NH.

When at least one of $X_A$ or $Y_A$ in the formulae (TEMP-16) to (TEMP-33) is NH or $CH_2$, the monovalent heterocyclic groups derived from the cyclic structures represented by the formulae (TEMP-16) to (TEMP-33) include a monovalent group derived by removing one hydrogen atom from NH or $CH_2$.

Substituted Heterocyclic Groups Including Nitrogen Atom (Specific Example Group G2B1):

(9-phenyl)carbazolyl group, (9-biphenylyl)carbazolyl group, (9-phenyl)phenylcarbazolyl group, (9-naphthyl)carbazolyl group, diphenylcarbazole-9-yl group, phenylcarbazole-9-yl group, methylbenzimidazolyl group, ethylbenzimidazolyl group, phenyltriazinyl group, biphenylyltriazinyl group, diphenyltriazinyl group, phenylquinazolinyl group, and biphenylquinazolinyl group.

Substituted Heterocyclic Groups Including Oxygen Atom (Specific Example Group G2B2):

phenyldibenzofuranyl group, methyldibenzofuranyl group, t-butyldibenzofuranyl group, and monovalent residue of spiro[9H-xanthene-9,9'-[9H]fluorene].

Substituted Heterocyclic Groups Including Sulfur Atom (Specific Example Group G2B3):

phenyldibenzothiophenyl group, methyldibenzothiophenyl group, t-butyldibenzothiophenyl group, and monovalent residue of spiro[9H-thioxanthene-9,9'-[9H]fluorene].

Groups Obtained by Substituting at Least One Hydrogen Atom of Monovalent Heterocyclic Group Derived from Cyclic Structures Represented by Formulae (TEMP-16) to (TEMP-33) with Substituent (Specific Example Group G2B4):

The "at least one hydrogen atom of a monovalent heterocyclic group" means at least one hydrogen atom selected from a hydrogen atom bonded to a ring carbon atom of the monovalent heterocyclic group, a hydrogen atom bonded to a nitrogen atom of at least one of XA or YA in a form of NH, and a hydrogen atom of one of XA and YA in a form of a methylene group (CH2).

Substituted or Unsubstituted Alkyl Group

Specific examples (specific example group G3) of the "substituted or unsubstituted alkyl group" mentioned herein include unsubstituted alkyl groups (specific example group G3A) and substituted alkyl groups (specific example group G3B) below. (Herein, an unsubstituted alkyl group refers to an "unsubstituted alkyl group" in a "substituted or unsubstituted alkyl group," and a substituted alkyl group refers to a "substituted alkyl group" in a "substituted or unsubstituted alkyl group.") A simply termed "alkyl group" herein includes both of "unsubstituted alkyl group" and "substituted alkyl group."

The "substituted alkyl group" refers to a group derived by substituting at least one hydrogen atom in an "unsubstituted alkyl group" with a substituent. Specific examples of the "substituted alkyl group" include a group derived by substituting at least one hydrogen atom of an "unsubstituted alkyl group" (specific example group G3A) below with a substituent, and examples of the substituted alkyl group (specific example group G3B) below. Herein, the alkyl group for the "unsubstituted alkyl group" refers to a chain alkyl group. Accordingly, the "unsubstituted alkyl group" include linear "unsubstituted alkyl group" and branched "unsubstituted alkyl group." It should be noted that the examples of the "unsubstituted alkyl group" and the "substituted alkyl group" mentioned herein are merely exemplary, and the "substituted alkyl group" mentioned herein includes a group derived by further substituting a hydrogen atom bonded to a carbon atom of a skeleton of the "substituted alkyl group" in the specific example group G3B, and a group derived by further substituting a hydrogen atom of a substituent of the "substituted alkyl group" in the specific example group G3B.

Unsubstituted Alkyl Group (Specific Example Group G3A):

methyl group, ethyl group, n-propyl group, isopropyl group, n-butyl group, isobutyl group, s-butyl group, and t-butyl group.

Substituted Alkyl Group (Specific Example Group G3B):

heptafluoropropyl group (including isomer thereof), pentafluoroethyl group, 2,2,2-trifluoroethyl group, and trifluoromethyl group.

Substituted or Unsubstituted Alkenyl Group

Specific examples (specific example group G4) of the "substituted or unsubstituted alkenyl group" mentioned herein include unsubstituted alkenyl groups (specific example group G4A) and substituted alkenyl groups (specific example group G4B). (Herein, an unsubstituted alkenyl group refers to an "unsubstituted alkenyl group" in a "substituted or unsubstituted alkenyl group," and a substituted alkenyl group refers to a "substituted alkenyl group" in a "substituted or unsubstituted alkenyl group.") A simply termed "alkenyl group" herein includes both of "unsubstituted alkenyl group" and "substituted alkenyl group."

The "substituted alkenyl group" refers to a group derived by substituting at least one hydrogen atom in an "unsubstituted alkenyl group" with a substituent. Specific examples of the "substituted alkenyl group" include an "unsubstituted alkenyl group" (specific example group G4A) substituted by a substituent, and examples of the substituted alkenyl group (specific example group G4B) below. It should be noted that the examples of the "unsubstituted alkenyl group" and the "substituted alkenyl group" mentioned herein are merely exemplary, and the "substituted alkenyl group" mentioned herein includes a group derived by further substituting a hydrogen atom of a skeleton of the "substituted alkenyl group" in the specific example group G4B with a substituent, and a group derived by further substituting a hydrogen atom of a substituent of the "substituted alkenyl group" in the specific example group G4B with a substituent.

Unsubstituted Alkenyl Group (Specific Example Group G4A):

vinyl group, allyl group, 1-butenyl group, 2-butenyl group, and 3-butenyl group.

Substituted Alkenyl Group (Specific Example Group G4B):

1,3-butanedienyl group, 1-methylvinyl group, 1-methylallyl group, 1,1-dimethylallyl group, 2-methylallyl group, and 1,2-dimethylallyl group.

Substituted or Unsubstituted Alkynyl Group

Specific examples (specific example group G5) of the "substituted or unsubstituted alkynyl group" mentioned herein include unsubstituted alkynyl groups (specific example group G5A) below. (Herein, an unsubstituted alkynyl group refers to an "unsubstituted alkynyl group" in a "substituted or unsubstituted alkynyl group.") A simply termed "alkynyl group" herein includes both of "unsubstituted alkynyl group" and "substituted alkynyl group."

The "substituted alkynyl group" refers to a group derived by substituting at least one hydrogen atom in an "unsubstituted alkynyl group" with a substituent. Specific examples of the "substituted alkynyl group" include a group derived by substituting at least one hydrogen atom of the "unsubstituted alkynyl group" (specific example group G5A) below with a substituent.

Unsubstituted Alkynyl Group (Specific Example Group G5A): ethynyl group.

Substituted or Unsubstituted Cycloalkyl Group

Specific examples (specific example group G6) of the "substituted or unsubstituted cycloalkyl group" mentioned herein include unsubstituted cycloalkyl groups (specific example group G6A) and substituted cycloalkyl groups (specific example group G6B). (Herein, an unsubstituted cycloalkyl group refers to an "unsubstituted cycloalkyl group" in a "substituted or unsubstituted cycloalkyl group," and a substituted cycloalkyl group refers to a "substituted cycloalkyl group" in a "substituted or unsubstituted cycloalkyl group.") A simply termed "cycloalkyl group" herein includes both of "unsubstituted cycloalkyl group" and "substituted cycloalkyl group."

The "substituted cycloalkyl group" refers to a group derived by substituting at least one hydrogen atom of an "unsubstituted cycloalkyl group" with a substituent. Specific examples of the "substituted cycloalkyl group" include a group derived by substituting at least one hydrogen atom of the "unsubstituted cycloalkyl group" (specific example group G6A) below with a substituent, and examples of the substituted cycloalkyl group (specific example group G6B) below. It should be noted that the examples of the "unsubstituted cycloalkyl group" and the "substituted cycloalkyl group" mentioned herein are merely exemplary, and the "substituted cycloalkyl group" mentioned herein includes a group derived by substituting at least one hydrogen atom bonded to a carbon atom of a skeleton of the "substituted cycloalkyl group" in the specific example group G6B with a substituent, and a group derived by further substituting a hydrogen atom of a substituent of the "substituted cycloalkyl group" in the specific example group G6B with a substituent.

Unsubstituted Cycloalkyl Group (Specific Example Group G6A):

cyclopropyl group, cyclobutyl group, cyclopentyl group, cyclohexyl group, 1-adamantyl group, 2-adamantyl group, 1-norbornyl group, and 2-norbornyl group.

Substituted Cycloalkyl Group (Specific Example Group G6B): 4-methylcyclohexyl group.

Group Represented by —Si($R_{901}$)($R_{902}$)($R_{903}$)

Specific examples (specific example group G7) of the group represented herein by —Si($R_{901}$)($R_{902}$)($R_{903}$) include: —Si(G1)(G1)(G1); —Si(G1)(G2)(G2); —Si(G1)(G1)(G2); —Si(G2)(G2)(G2); —Si(G3)(G3)(G3); and —Si(G6)(G6)(G6), where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3;

G6 represents a "substituted or unsubstituted cycloalkyl group" in the specific example group G6;

a plurality of G1 in —Si(G1)(G1)(G1) are mutually the same or different;

a plurality of G2 in —Si(G1)(G2)(G2) are mutually the same or different;

a plurality of G1 in —Si(G1)(G1)(G2) are mutually the same or different;

a plurality of G2 in —Si(G2)(G2)(G2) are mutually the same or different;

a plurality of G3 in —Si(G3)(G3)(G3) are mutually the same or different; and a plurality of G6 in —Si(G6)(G6)(G6) are mutually the same or different.

Group Represented by —O—($R_{904}$)

Specific examples (specific example group G8) of a group represented by —O—($R_{904}$) herein include: —O(G1); —O(G2); —O(G3); and —O(G6), where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

Group Represented by —S—($R_{905}$)

Specific examples (specific example group G9) of a group represented herein by —S—($R_{905}$) include: —S(G1); —S(G2); —S(G3); and —S(G6), where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

Group Represented by —N($R_{906}$)($R_{907}$)

Specific examples (specific example group G10) of a group represented herein by —N($R_{906}$)($R_{907}$) include: —N(G1)(G1); —N(G2)(G2); —N(G1)(G2); —N(G3)(G3); and —N(G6)(G6), where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3;

G6 represents a "substituted or unsubstituted cycloalkyl group" in the specific example group G6;

a plurality of G1 in —N(G1)(G1) are mutually the same or different;

a plurality of G2 in —N(G2)(G2) are mutually the same or different;

a plurality of G3 in —N(G3)(G3) are mutually the same or different; and a plurality of G6 in —N(G6)(G6) are mutually the same or different.

Halogen Atom

Specific examples (specific example group G11) of "halogen atom" mentioned herein include a fluorine atom, chlorine atom, bromine atom, and iodine atom.

Substituted or Unsubstituted Fluoroalkyl Group

The "substituted or unsubstituted fluoroalkyl group" mentioned herein refers to a group derived by substituting at least one hydrogen atom of the "substituted or unsubstituted alkyl group" with a fluorine atom, and also includes a group (perfluoro group) derived by substituting all of the hydrogen atoms bonded to a carbon atom(s) of the alkyl group in the "substituted or unsubstituted alkyl group" with fluorine atoms. An "unsubstituted fluoroalkyl group" has, unless otherwise specified herein, 1 to 50, preferably 1 to 30, more preferably 1 to 18 carbon atoms. The "substituted fluoroalkyl group" refers to a group derived by substituting at least one hydrogen atom in a "fluoroalkyl group" with a substituent. It should be noted that the examples of the "substituted fluoroalkyl group" mentioned herein include a group derived by further substituting at least one hydrogen atom bonded to a carbon atom of an alkyl chain of a "substituted fluoroalkyl group" with a substituent, and a group derived by further substituting at least one hydrogen atom of a substituent of the "substituted fluoroalkyl group" with a substituent. Specific examples of the "substituted fluoroalkyl group" include a group derived by substituting at least one hydrogen atom of the "alkyl group" (specific example group G3) with a fluorine atom.

Substituted or Unsubstituted Haloalkyl Group

The "substituted or unsubstituted haloalkyl group" mentioned herein refers to a group derived by substituting at least one hydrogen atom of the "substituted or unsubstituted alkyl group" with a halogen atom, and also includes a group derived by substituting all of the hydrogen atoms bonded to a carbon atom(s) of the alkyl group in the "substituted or unsubstituted alkyl group" with halogen atoms. An "unsubstituted haloalkyl group" has, unless otherwise specified herein, 1 to 50, preferably 1 to 30, more preferably 1 to 18 carbon atoms. The "substituted haloalkyl group" refers to a group derived by substituting at least one hydrogen atom in a "haloalkyl group" with a substituent. It should be noted that the examples of the "substituted haloalkyl group" mentioned herein include a group derived by further substituting at least one hydrogen atom bonded to a carbon atom of an alkyl chain of a "substituted haloalkyl group" with a substituent, and a group derived by further substituting at least one hydrogen atom of a substituent of the "substituted haloalkyl group" with a substituent. Specific examples of the "unsubstituted haloalkyl group" include a group derived by substituting at least one hydrogen atom of the "alkyl group" (specific example group G3) with a halogen atom. The haloalkyl group is sometimes referred to as a halogenated alkyl group.

Substituted or Unsubstituted Alkoxy Group

Specific examples of a "substituted or unsubstituted alkoxy group" mentioned herein include a group represented by —O(G3), G3 being the "substituted or unsubstituted alkyl group" in the specific example group G3. An "unsubstituted alkoxy group" has, unless otherwise specified herein, 1 to 50, preferably 1 to 30, more preferably 1 to 18 carbon atoms.

Substituted or Unsubstituted Alkylthio Group

Specific examples of a "substituted or unsubstituted alkylthio group" mentioned herein include a group represented by —S(G3), G3 being the "substituted or unsubstituted alkyl group" in the specific example group G3. An "unsubstituted alkylthio group" has, unless otherwise specified herein, 1 to 50, preferably 1 to 30, more preferably 1 to 18 carbon atoms.

Substituted or Unsubstituted Aryloxy Group

Specific examples of a "substituted or unsubstituted aryloxy group" mentioned herein include a group represented by —O(G1), G1 being the "substituted or unsubstituted aryl group" in the specific example group G1. An "unsubstituted aryloxy group" has, unless otherwise specified herein, 6 to 50, preferably 6 to 30, more preferably 6 to 18 ring carbon atoms.

Substituted or Unsubstituted Arylthio Group

Specific examples of a "substituted or unsubstituted arylthio group" mentioned herein include a group represented by —S(G1), G1 being the "substituted or unsubstituted aryl group" in the specific example group G1. An "unsubstituted arylthio group" has, unless otherwise specified herein, 6 to 50, preferably 6 to 30, more preferably 6 to 18 ring carbon atoms.

Substituted or Unsubstituted Trialkylsilyl Group

Specific examples of a "trialkylsilyl group" mentioned herein include a group represented by —Si(G3)(G3)(G3), G3 being the "substituted or unsubstituted alkyl group" in the specific example group G3. The plurality of G3 in —Si(G3)(G3)(G3) are mutually the same or different. Each of the alkyl groups in the "trialkylsilyl group" has, unless otherwise specified herein, 1 to 50, preferably 1 to 20, more preferably 1 to 6 carbon atoms.

Substituted or Unsubstituted Aralkyl Group

Specific examples of a "substituted or unsubstituted aralkyl group" mentioned herein include a group represented by (G3)-(G1), G3 being the "substituted or unsubstituted alkyl group" in the specific example group G3, G1 being the "substituted or unsubstituted aryl group" in the specific example group G1. Accordingly, the "aralkyl group" is a group derived by substituting a hydrogen atom of the "alkyl group" with a substituent in a form of the "aryl group," which is an example of the "substituted alkyl group." An "unsubstituted aralkyl group," which is an "unsubstituted alkyl group" substituted by an "unsubstituted aryl group,"

has, unless otherwise specified herein, 7 to 50 carbon atoms, preferably 7 to 30 carbon atoms, more preferably 7 to 18 carbon atoms.

Specific examples of the “substituted or unsubstituted aralkyl group” include a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

Preferable examples of the substituted or unsubstituted aryl group mentioned herein include, unless otherwise specified herein, a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, phenanthryl group, pyrenyl group, chrysenyl group, triphenylenyl group, fluorenyl group, 9,9'-spirobifluorenyl group, 9,9-dimethylfluorenyl group, and 9,9-diphenylfluorenyl group.

Preferable examples of the substituted or unsubstituted heterocyclic group mentioned herein include, unless otherwise specified herein, a pyridyl group, pyrimidinyl group, triazinyl group, quinolyl group, isoquinolyl group, quinazolinyl group, benzimidazolyl group, phenanthrolinyl group, carbazolyl group (1-carbazolyl group, 2-carbazolyl group, 3-carbazolyl group, 4-carbazolyl group, or 9-carbazolyl group), benzocarbazolyl group, azacarbazolyl group, diazacarbazolyl group, dibenzofuranyl group, naphthobenzofuranyl group, azadibenzofuranyl group, diazadibenzofuranyl group, dibenzothiophenyl group, naphthobenzothiophenyl group, azadibenzothiophenyl group, diazadibenzothiophenyl group, (9-phenyl)carbazolyl group ((9-phenyl)carbazole-1-yl group, (9-phenyl)carbazole-2-yl group, (9-phenyl)carbazole-3-yl group, or (9-phenyl)carbazole-4-yl group), (9-biphenylyl)carbazolyl group, (9-phenyl)phenylcarbazolyl group, diphenylcarbazole-9-yl group, phenylcarbazole-9-yl group, phenyltriazinyl group, biphenylyltriazinyl group, diphenyltriazinyl group, phenyldibenzofuranyl group, and phenyldibenzothiophenyl group.

The carbazolyl group mentioned herein is, unless otherwise specified herein, specifically a group represented by one of formulae below.

(TEMP-Cz1)

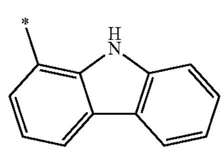

(TEMP-Cz2)

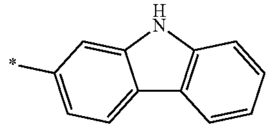

(TEMP-Cz3)

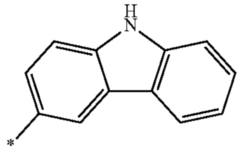

-continued (TEMP-Cz4)

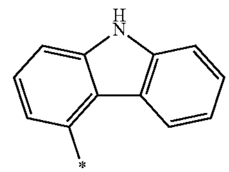

(TEMP-Cz5)

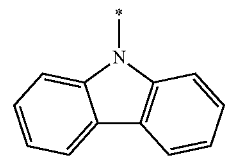

The (9-phenyl)carbazolyl group mentioned herein is, unless otherwise specified herein, specifically a group represented by one of formulae below.

(TEMP-Cz6)

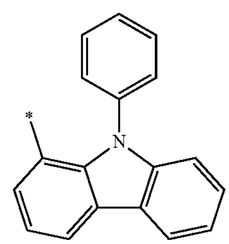

(TEMP-Cz7)

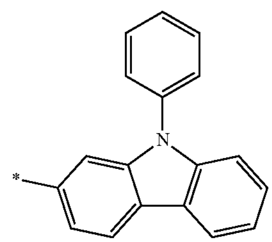

(TEMP-Cz8)

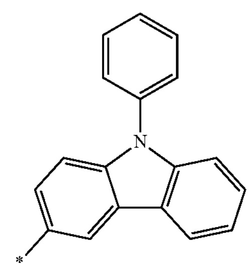

TEMP-Cz9)

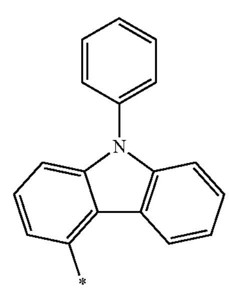

In the formulae (TEMP-Cz1) to (TEMP-Cz9), * represents a bonding position.

The dibenzofuranyl group and dibenzothiophenyl group mentioned herein are, unless otherwise specified herein, each specifically represented by one of formulae below.

(TEMP-34)

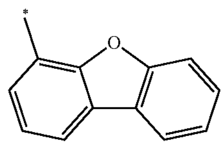

(TEMP-35)

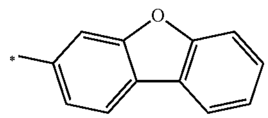

(TEMP-36)

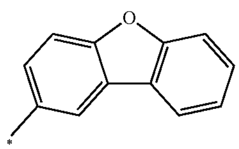

(TEMP-37)

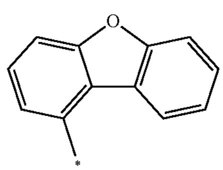

(TEMP-38)

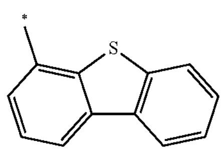

(TEMP-39)

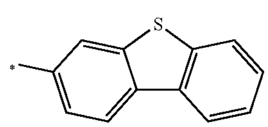

(TEMP-40)

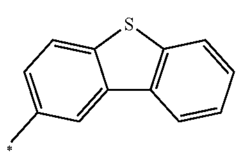

(TEMP-41)

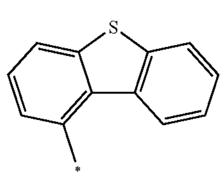

In the formulae (TEMP-34) to (TEMP-41), * represents a bonding position.

Preferable examples of the substituted or unsubstituted alkyl group mentioned herein include, unless otherwise specified herein, a methyl group, ethyl group, propyl group, isopropyl group, n-butyl group, isobutyl group, and t-butyl group.

Substituted or Unsubstituted Arylene Group

The "substituted or unsubstituted arylene group" mentioned herein is, unless otherwise specified herein, a divalent group derived by removing one hydrogen atom on an aryl ring of the "substituted or unsubstituted aryl group." Specific examples of the "substituted or unsubstituted arylene group" (specific example group G12) include a divalent group derived by removing one hydrogen atom on an aryl ring of the "substituted or unsubstituted aryl group" in the specific example group G1.

Substituted or Unsubstituted Divalent Heterocyclic Group

The "substituted or unsubstituted divalent heterocyclic group" mentioned herein is, unless otherwise specified herein, a divalent group derived by removing one hydrogen atom on a heterocycle of the "substituted or unsubstituted heterocyclic group." Specific examples of the "substituted or unsubstituted divalent heterocyclic group" (specific example group G13) include a divalent group derived by removing one hydrogen atom on a heterocyclic ring of the "substituted or unsubstituted heterocyclic group" in the specific example group G2.

Substituted or Unsubstituted Alkylene Group

The "substituted or unsubstituted alkylene group" mentioned herein is, unless otherwise specified herein, a divalent group derived by removing one hydrogen atom on an alkyl chain of the "substituted or unsubstituted alkyl group." Specific examples of the "substituted or unsubstituted alkylene group" (specific example group G14) include a divalent group derived by removing one hydrogen atom on an alkyl chain of the "substituted or unsubstituted alkyl group" in the specific example group G3.

The substituted or unsubstituted arylene group mentioned herein is, unless otherwise specified herein, preferably any one of groups represented by formulae (TEMP-42) to (TEMP-68) below.

(TEMP-42)

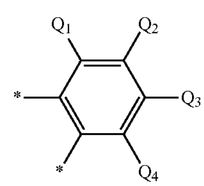

(TEMP-43)

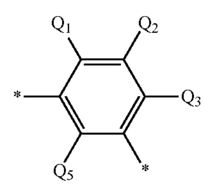

(TEMP-44)

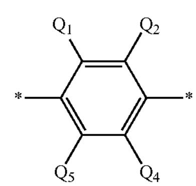

(TEMP-45)

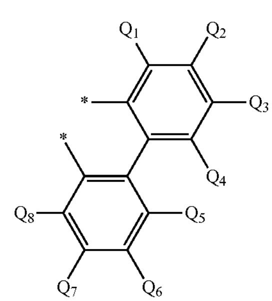

-continued
(TEMP-46)
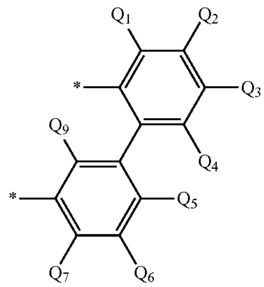
(TEMP-47)
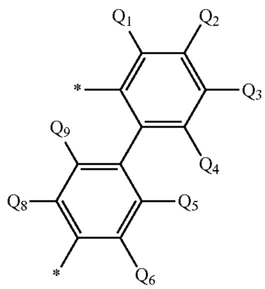
(TEMP-48)
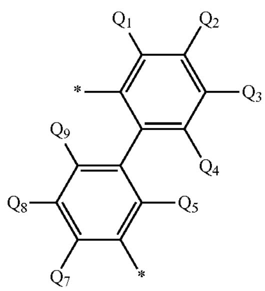
(TEMP-49)
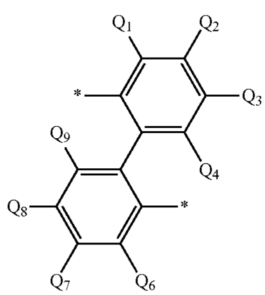
(TEMP-50)
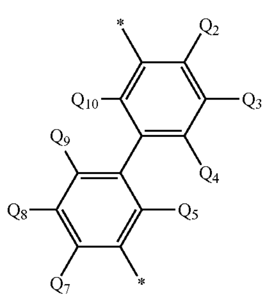
-continued
(TEMP-51)
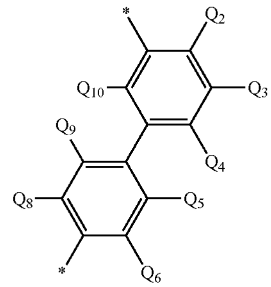
(TEMP-52)
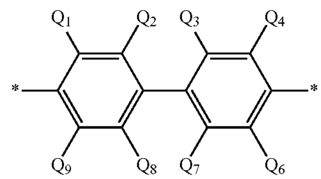
In the formulae (TEMP-42) to (TEMP-52), $Q_1$ to $Q_{10}$ each independently are a hydrogen atom or a substituent.
In the formulae (TEMP-42) to (TEMP-52), * represents a bonding position.
(TEMP-53)
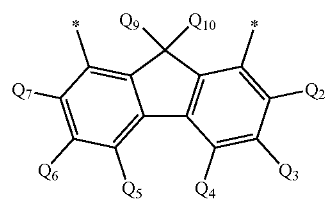
(TEMP-54)
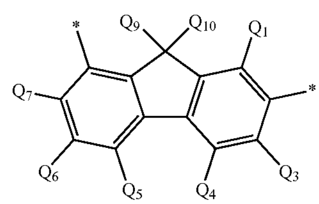
(TEMP-55)
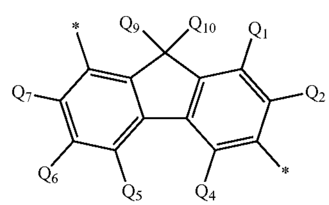
(TEMP-56)
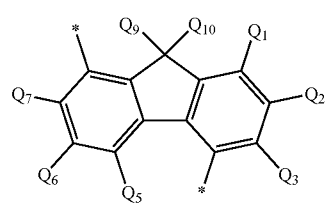

-continued (TEMP-57)

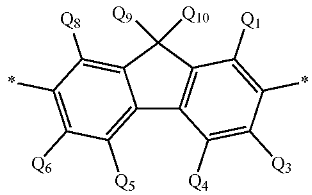

(TEMP-58)

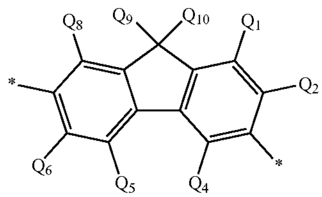

(TEMP-59)

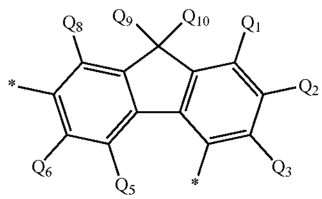

(TEMP-60)

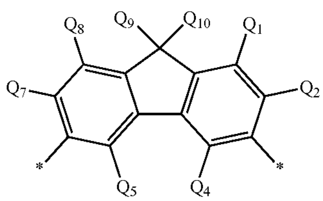

(TEMP-61)

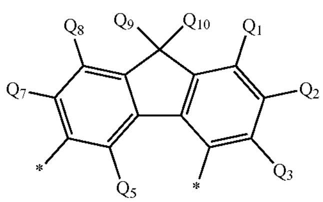

(TEMP-62)

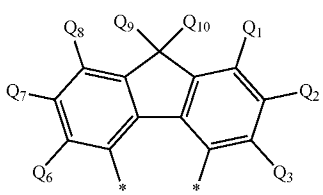

In the formulae (TEMP-53) to (TEMP-62), $Q_1$ to $Q_{10}$ each independently are a hydrogen atom or a substituent.

In the formulae, $Q_9$ and $Q_{10}$ may be mutually bonded through a single bond to form a ring.

In the formulae (TEMP-53) to (TEMP-62), * represents a bonding position.

(TEMP-63)

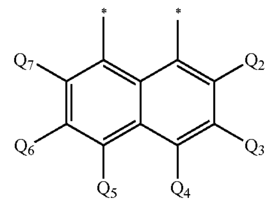

(TEMP-64)

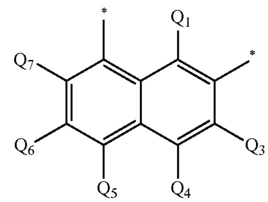

(TEMP-65)

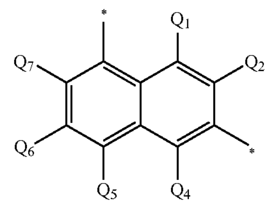

(TEMP-66)

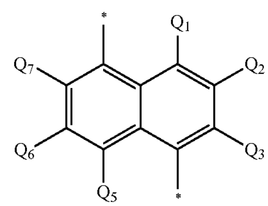

(TEMP-67)

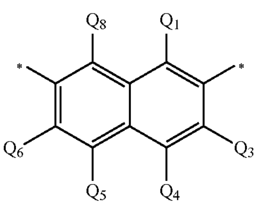

(TEMP-68)

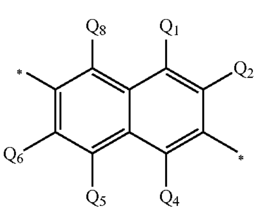

In the formulae (TEMP-63) to (TEMP-68), $Q_1$ to $Q_8$ each independently are a hydrogen atom or a substituent.

In the formulae (TEMP-63) to (TEMP-68), * represents a bonding position.

The substituted or unsubstituted divalent heterocyclic group mentioned herein is, unless otherwise specified herein, preferably a group represented by any one of formulae (TEMP-69) to (TEMP-102) below.

(TEMP-69)
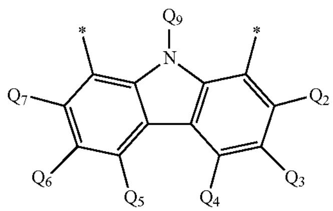
(TEMP-70)
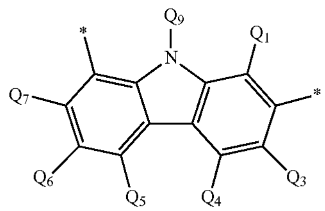
(TEMP-71)
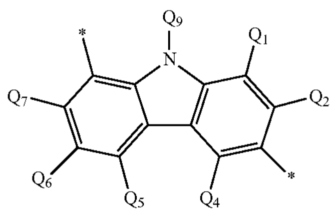
(TEMP-72)
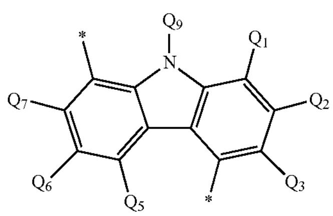
(TEMP-73)
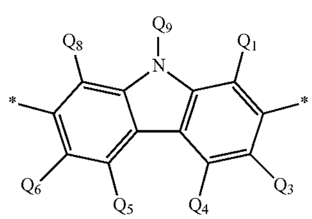
(TEMP-74)
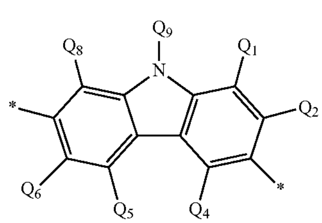
(TEMP-75)
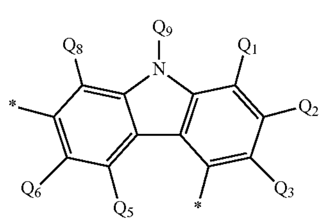
-continued
(TEMP-76)
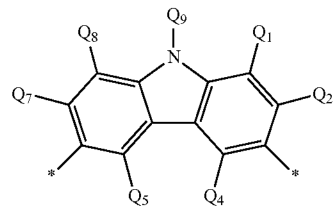
(TEMP-77)
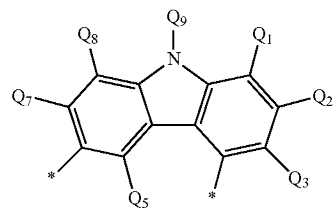
(TEMP-78)
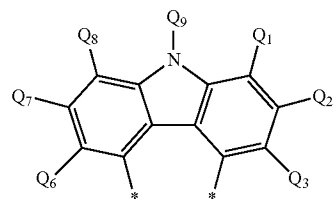
(TEMP-79)
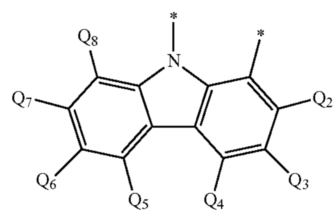
(TEMP-80)
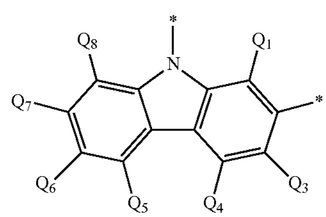
(TEMP-81)
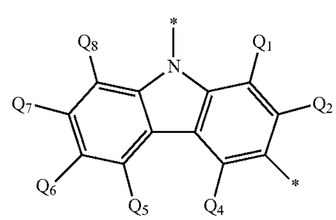
(TEMP-82)
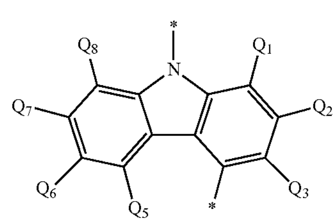
In the formulae (TEMP-69) to (TEMP-82), $Q_1$ to $Q_9$ each independently are a hydrogen atom or a substituent.

-continued
(TEMP-83)
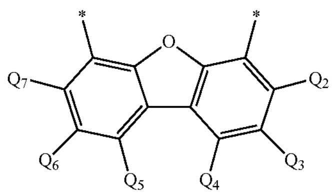
(TEMP-84)
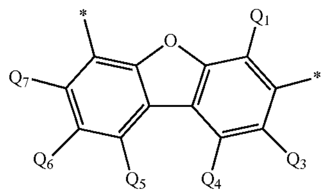
(TEMP-85)
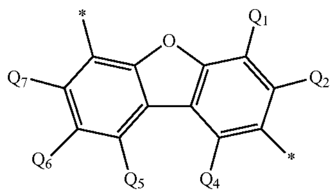
(TEMP-86)
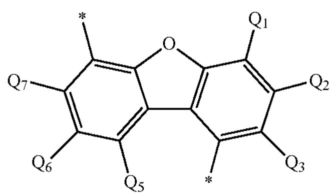
(TEMP-87)
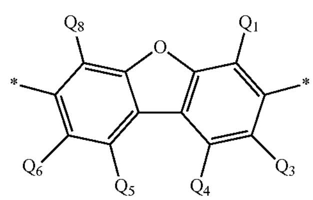
(TEMP-88)
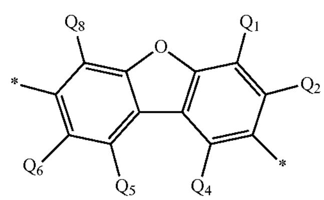
(TEMP-89)
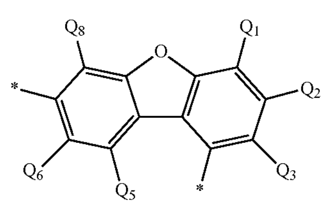
(TEMP-90)
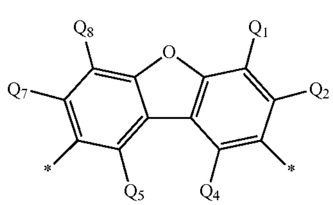
(TEMP-91)
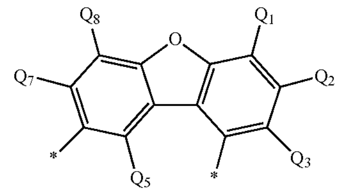
(TEMP-92)
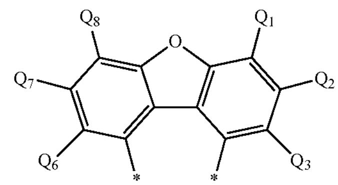
(TEMP-93)
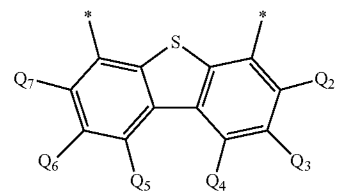
(TEMP-94)
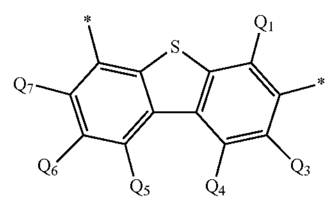
(TEMP-95)
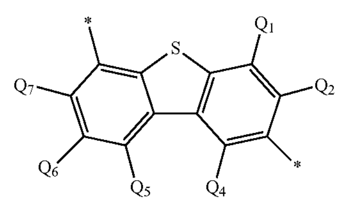
(TEMP-96)
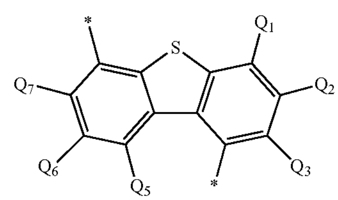
(TEMP-97)
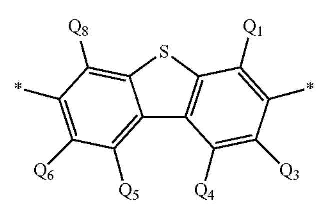
(TEMP-98)
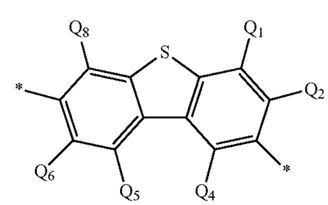

-continued (TEMP-99)

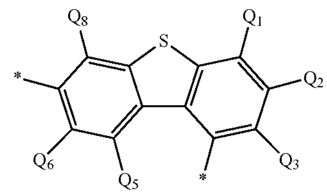

(TEMP-100)

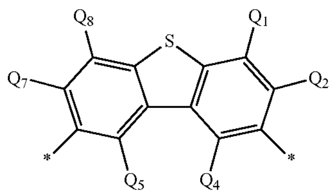

(TEMP-101)

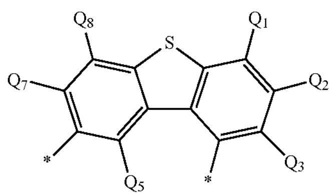

(TEMP-102)

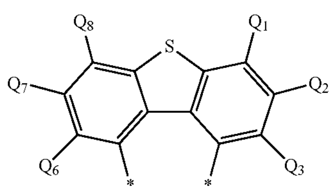

In the formulae (TEMP-83) to (TEMP-102), $Q_1$ to $Q_8$ each independently are a hydrogen atom or a substituent.

The substituent mentioned herein has been described above.

Instance of "Bonded to Form Ring"

Instances where "at least one combination of adjacent two or more (of . . . ) are mutually bonded to form a substituted or unsubstituted monocyclic ring, mutually bonded to form a substituted or unsubstituted fused ring, or not mutually bonded" mentioned herein refer to instances where "at least one combination of adjacent two or more (of . . . ) are mutually bonded to form a substituted or unsubstituted monocyclic ring, "at least one combination of adjacent two or more (of . . . ) are mutually bonded to form a substituted or unsubstituted fused ring," and "at least one combination of adjacent two or more (of . . . ) are not mutually bonded."

Instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (these instances will be sometimes collectively referred to as an instance of "bonded to form a ring" hereinafter) will be described below. An anthracene compound having a basic skeleton in a form of an anthracene ring and represented by a formula (TEMP-103) below will be used as an example for the description.

(TEMP-103)

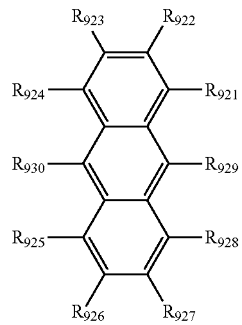

For instance, when "at least one combination of adjacent two or more of $R_{921}$ to $R_{930}$ are mutually bonded to form a ring," the combination of adjacent ones of $R_{921}$ to $R_{930}$ (i.e. the combination at issue) is a combination of $R_{921}$ and $R_{922}$, a combination of $R_{922}$ and $R_{923}$, a combination of $R_{923}$ and $R_{924}$, a combination of $R_{924}$ and $R_{930}$, a combination of $R_{930}$ and $R_{925}$, a combination of $R_{925}$ and $R_{926}$, a combination of $R_{926}$ and $R_{927}$, a combination of $R_{927}$ and $R_{928}$, a combination of $R_{928}$ and $R_{929}$, or a combination of $R_{929}$ and $R_{921}$.

The term "at least one combination" means that two or more of the above combinations of adjacent two or more of $R_{921}$ to $R_{930}$ may simultaneously form rings. For instance, when $R_{921}$ and $R_{922}$ are mutually bonded to form a ring $Q_A$ and $R_{925}$ and $R_{926}$ are simultaneously mutually bonded to form a ring $Q_B$, the anthracene compound represented by the formula (TEMP-103) is represented by a formula (TEMP-104) below.

(TEMP-104)

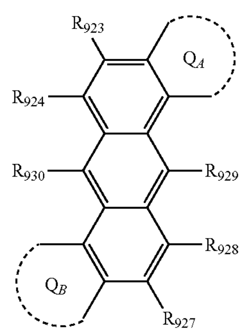

The instance where the "combination of adjacent two or more" form a ring means not only an instance where the "two" adjacent components are bonded but also an instance where adjacent "three or more" are bonded. For instance, $R_{921}$ and $R_{922}$ are mutually bonded to form a ring $Q_A$ and $R_{922}$ and $R_{923}$ are mutually bonded to form a ring $Q_C$, and mutually adjacent three components ($R_{921}$, $R_{922}$ and $R_{923}$) are mutually bonded to form a ring fused to the anthracene basic skeleton. In this case, the anthracene compound represented by the formula (TEMP-103) is represented by a formula (TEMP-105) below. In the formula (TEMP-105) below, the ring $Q_A$ and the ring $Q_C$ share $R_{922}$.

(TEMP-105)

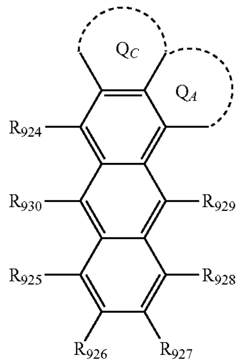

The formed "monocyclic ring" or "fused ring" may be, in terms of the formed ring in itself, a saturated ring or an unsaturated ring. When the "combination of adjacent two" form a "monocyclic ring" or a "fused ring," the "monocyclic ring" or "fused ring" may be a saturated ring or an unsaturated ring. For instance, the ring $Q_A$ and the ring $Q_B$ formed in the formula (TEMP-104) are each independently a "monocyclic ring" or a "fused ring." Further, the ring $Q_A$ and the ring $Q_C$ formed in the formula (TEMP-105) are each a "fused ring." The ring $Q_A$ and the ring $Q_C$ in the formula (TEMP-105) are fused to form a fused ring. When the ring $Q_A$ in the formula (TMEP-104) is a benzene ring, the ring $Q_A$ is a monocyclic ring. When the ring $Q_A$ in the formula (TMEP-104) is a naphthalene ring, the ring $Q_A$ is a fused ring.

The "unsaturated ring" represents an aromatic hydrocarbon ring or an aromatic heterocycle. The "saturated ring" represents an aliphatic hydrocarbon ring or a non-aromatic heterocycle.

Specific examples of the aromatic hydrocarbon ring include a ring formed by terminating a bond of a group in the specific example of the specific example group G1 with a hydrogen atom.

Specific examples of the aromatic heterocycle include a ring formed by terminating a bond of an aromatic heterocyclic group in the specific example of the specific example group G2 with a hydrogen atom.

Specific examples of the aliphatic hydrocarbon ring include a ring formed by terminating a bond of a group in the specific example of the specific example group G6 with a hydrogen atom.

The phrase "to form a ring" herein means that a ring is formed only by a plurality of atoms of a basic skeleton, or by a combination of a plurality of atoms of the basic skeleton and one or more optional atoms. For instance, the ring $Q_A$ formed by mutually bonding $R_{921}$ and $R_{922}$ shown in the formula (TEMP-104) is a ring formed by a carbon atom of the anthracene skeleton bonded to $R_{921}$, a carbon atom of the anthracene skeleton bonded to $R_{922}$, and one or more optional atoms. Specifically, when the ring $Q_A$ is a monocyclic unsaturated ring formed by $R_{921}$ and $R_{922}$, the ring formed by a carbon atom of the anthracene skeleton bonded to $R_{921}$, a carbon atom of the anthracene skeleton bonded to $R_{922}$, and four carbon atoms is a benzene ring.

The "optional atom" is, unless otherwise specified herein, preferably at least one atom selected from the group consisting of a carbon atom, nitrogen atom, oxygen atom, and sulfur atom. A bond of the optional atom (e.g. a carbon atom and a nitrogen atom) not forming a ring may be terminated by a hydrogen atom or the like or may be substituted by an "optional substituent" described later. When the ring includes an optional element other than carbon atom, the resultant ring is a heterocycle.

The number of "one or more optional atoms" forming the monocyclic ring or fused ring is, unless otherwise specified herein, preferably in a range from 2 to 15, more preferably in a range from 3 to 12, further preferably in a range from 3 to 5.

Unless otherwise specified herein, the ring, which may be a "monocyclic ring" or "fused ring," is preferably a "monocyclic ring."

Unless otherwise specified herein, the ring, which may be a "saturated ring" or "unsaturated ring," is preferably an "unsaturated ring."

Unless otherwise specified herein, the "monocyclic ring" is preferably a benzene ring.

Unless otherwise specified herein, the "unsaturated ring" is preferably a benzene ring.

When "at least one combination of adjacent two or more" (of . . . ) are "mutually bonded to form a substituted or unsubstituted monocyclic ring" or "mutually bonded to form a substituted or unsubstituted fused ring," unless otherwise specified herein, at least one combination of adjacent two or more of components are preferably mutually bonded to form a substituted or unsubstituted "unsaturated ring" formed of a plurality of atoms of the basic skeleton, and 1 to 15 atoms of at least one element selected from the group consisting of carbon, nitrogen, oxygen and sulfur.

When the "monocyclic ring" or the "fused ring" has a substituent, the substituent is the substituent described in later-described "optional substituent." When the "monocyclic ring" or the "fused ring" has a substituent, specific examples of the substituent are the substituents described in the above under the subtitle "Substituent Mentioned Herein."

When the "saturated ring" or the "unsaturated ring" has a substituent, the substituent is the substituent described in later-described "optional substituent." When the "monocyclic ring" or the "fused ring" has a substituent, specific examples of the substituent are the substituents described in the above under the subtitle "Substituent Mentioned Herein."

The above is the description for the instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (sometimes referred to as an instance of "bonded to form a ring").

Substituent for Substituted or Unsubstituted Group

In an exemplary embodiment herein, a substituent for the substituted or unsubstituted group (sometimes referred to as an "optional substituent" hereinafter) is, for instance, a group selected from the group consisting of an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si($R_{901}$)($R_{902}$)($R_{903}$), —O—($R_{904}$), —S—($R_{905}$), —N($R_{906}$)($R_{907}$), a halogen atom, a cyano group, a nitro group, an unsubstituted aryl group having 6 to 50 ring carbon atoms, and an unsubstituted heterocyclic group having 5 to 50 ring atoms;

$R_{901}$ to $R_{907}$ each independently are a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when two or more $R_{901}$ are present, the two or more $R_{901}$ are mutually the same or different;

when two or more $R_{902}$ are present, the two or more $R_{902}$ are mutually the same or different;

when two or more $R_{903}$ are present, the two or more $R_{903}$ are mutually the same or different;

when two or more $R_{904}$ are present, the two or more $R_{904}$ are mutually the same or different;

when two or more $R_{905}$ are present, the two or more $R_{905}$ are mutually the same or different;

when two or more $R_{906}$ are present, the two or more $R_{906}$ are mutually the same or different; and when two or more $R_{907}$ are present, the two or more $R_{907}$ are mutually the same or different.

In an exemplary embodiment, a substituent for the substituted or unsubstituted group is selected from the group consisting of an alkyl group having 1 to 50 carbon atoms, an aryl group having 6 to 50 ring carbon atoms, and a heterocyclic group having 5 to 50 ring atoms.

In an exemplary embodiment, a substituent for the substituted or unsubstituted group is selected from the group consisting of an alkyl group having 1 to 18 carbon atoms, an aryl group having 6 to 18 ring carbon atoms, and a heterocyclic group having 5 to 18 ring atoms.

Specific examples of the above optional substituent are the same as the specific examples of the substituent described in the above under the subtitle "Substituent Mentioned Herein."

Unless otherwise specified herein, adjacent ones of the optional substituents may form a "saturated ring" or an "unsaturated ring," preferably a substituted or unsubstituted saturated five-membered ring, a substituted or unsubstituted saturated six-membered ring, a substituted or unsubstituted unsaturated five-membered ring, or a substituted or unsubstituted unsaturated six-membered ring, more preferably a benzene ring.

Unless otherwise specified herein, the optional substituent may further include a substituent. Examples of the substituent for the optional substituent are the same as the examples of the optional substituent.

Herein, numerical ranges represented by "AA to BB" represents a range whose lower limit is the value (AA) recited before "to" and whose upper limit is the value (BB) recited after "to."

Herein, a numerical formula represented by "A≥B" means that the value A is equal to the value B, or the value A is larger than the value B.

Herein, a numerical formula represented by "A≤B" means that the value A is equal to the value B, or the value A is smaller than the value B.

First Exemplary Embodiment

Organic Electroluminescence Device

An organic EL device according to a first exemplary embodiment includes an anode, a cathode, and an emitting region provided between the anode and the cathode, in which the emitting region includes a first emitting layer and a second emitting layer, a ratio $D_{EM1}/D_{EM2}$ of a film thickness of the first emitting layer $D_{EM1}$ to a film thickness of the second emitting layer $D_{EM2}$ is in a range from 2/3 to 3/2, the first emitting layer contains a first host material and a first emitting compound, the second emitting layer contains a second host material and a second emitting compound, the first host material is a compound represented by a formula (1) below, the first host material is different from the second host material, and the first emitting compound and the second emitting compound are mutually the same or different.

Since the emitting region includes the first emitting layer and the second emitting layer and the first emitting layer contains the compound represented by the formula (1) as the first host material, the organic EL device according to the exemplary embodiment has a low drive voltage to improve luminous efficiency. In the compound represented by the formula (1), at least one of $R_{1A}$ or $R_{1B}$ is a substituted or unsubstituted alkyl group having 1 to 15 carbon atoms. Thus, interaction between such compounds is likely to occur, allowing for expectation of improved electron mobility. Further, in a molecule of the first host material, the compound represented by the formula (1) does not contain three or more of the following: a substituted or unsubstituted aryl group having four or more fused rings and a substituted or unsubstituted heterocyclic group having four or more fused rings. Thus, it can be expected to inhibit a decrease in the electron mobility caused by a decrease in intermolecular interaction. In the organic EL device according to the exemplary embodiment, the film thickness ratio $D_{EM1}/D_{EM2}$ of the first emitting layer to the second emitting layer is in a range from 2/3 to 3/2 and the ratio of the thickness of the first emitting layer to the thickness of the second emitting layer is larger than that of a typical organic EL device including laminated emitting layers (for instance, an organic EL device in which the film thickness of the first emitting layer is 5 nm, the film thickness of the second emitting layer is 20 nm and the film thickness ratio $D_{EM1}/D_{EM2}$ is 1/4). Even with the above film thickness ratio, it is presumed that the organic EL device has a low drive voltage to improve luminous efficiency because the organic EL device according to the exemplary embodiment contains the compound represented by the formula (1) as the first host material.

It should be noted that in the first host material, for instance, a pyrenyl group and a benzanthryl group are an aryl group in which four rings (six-membered rings) are fused, an anthryl group is an aryl group in which three rings (six-membered rings) are fused, and a dibenzofuranyl group and a dibenzothienyl group are a heterocyclic group in which three rings (two six-membered rings and one five-membered ring) are fused.

In the organic EL device according to the exemplary embodiment, the film thickness ratio $D_{EM1}/D_{EM2}$ of the first emitting layer to the second emitting layer can also be determined in a range from 0.67 to 1.50 or from 0.75 to 1.25.

The first emitting layer and the second emitting layer may have any film thicknesses that satisfy the above range of the film thickness ratio $D_{EM1}/D_{EM2}$. For instance, the film thicknesses of the first emitting layer and the second emitting layer are each independently preferably in a range from 5 nm to 25 nm, more preferably in a range from 5 nm to 15 nm.

First Host Material

The first host material is the compound represented by the formula (1). The compound represented by the formula (1) is occasionally referred to as a first compound.

(1)

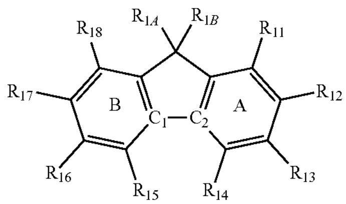

(10)

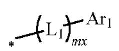

In the formula (1):

$R_{1A}$ and $R_{1B}$ are each independently a substituted or unsubstituted alkyl group having 1 to 15 carbon atoms, a substituted or unsubstituted aryl group having 6 to 17 ring carbon atoms, or a substituted or unsubstituted heterocyclic group having 5 to 17 ring atoms;

at least one of $R_{1A}$ or $R_{1B}$ is a substituted or unsubstituted alkyl group having 1 to 15 carbon atoms;

one combination of a combination of adjacent two or more of $R_{11}$ to $R_{14}$ and a combination of adjacent two or more of $R_{15}$ to $R_{18}$ are mutually bonded to form a substituted or unsubstituted monocyclic ring, or mutually bonded to form a substituted or unsubstituted fused ring;

when the substituted or unsubstituted monocyclic ring or the substituted or unsubstituted fused ring is formed with a ring A, a group represented by a formula (10) is bonded to a carbon atom bonded to $R_{12}$ or a carbon atom, among carbon atoms forming the substituted or unsubstituted monocyclic ring or the substituted or substituted fused ring, at a position farthest from a carbon atom $C_1$ of the ring A bonded by a single bond to a carbon atom $C_2$ of a ring B;

when the substituted or unsubstituted monocyclic ring or the substituted or unsubstituted fused ring is formed not with the ring A but with the ring B, the group represented by the formula (10) is bonded to the carbon atom bonded to $R_{12}$;

$R_{12}$ not bonded with the group represented by the formula (10), and $R_{11}$, $R_{13}$, $R_{14}$ and $R_{15}$ to $R_{18}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a substituted or unsubstituted aralkyl group having 7 to 50 carbon atoms, a group represented by —C(═O)$R_{801}$, a group represented by —$COOR_{802}$, a halogen atom, a cyano group, a nitro group, a substituted or unsubstituted aryl group having 6 to 17 ring carbon atoms, or a substituted or unsubstituted heterocyclic group having 5 to 17 ring atoms, and in the formula (10):

$Ar_1$ is a substituted or unsubstituted aryl group having four or more fused rings, or a substituted or unsubstituted heterocyclic group having four or more fused rings;

$L_1$ is a single bond, a substituted or unsubstituted arylene group having 6 to 17 ring carbon atoms, or a substituted or unsubstituted divalent heterocyclic group having 5 to 17 ring atoms;

mx is 0, 1, or 2;

* represents a bonding position to an atom forming a ring of the formula (1); and the first host material does not contain, in a molecule of the first host material, three or more of: a substituted or unsubstituted aryl group having four or more fused rings; and a substituted or unsubstituted heterocyclic group having four or more fused rings.

In the first host material:

$R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 17 ring carbon atoms, or a substituted or unsubstituted heterocyclic group having 5 to 17 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

In the organic EL device according to the exemplary embodiment, the substituted or unsubstituted aryl group having 6 to 17 ring carbon atoms is preferably a substituted or unsubstituted aryl group having 6 to 14 ring carbon atoms.

In the organic EL device according to the exemplary embodiment, the substituted or unsubstituted heterocyclic group having 5 to 17 ring atoms is preferably a substituted or unsubstituted heterocyclic group having 5 to 14 ring atoms.

In the organic EL device according to the exemplary embodiment, the substituted or unsubstituted arylene group having 6 to 17 ring carbon atoms is preferably a substituted or unsubstituted arylene group having 6 to 14 ring carbon atoms.

In the organic EL device according to the exemplary embodiment, the substituted or unsubstituted divalent heterocyclic group having 5 to 17 ring atoms is preferably a substituted or unsubstituted divalent heterocyclic group having 5 to 14 ring atoms.

In the organic EL device according to the exemplary embodiment, $R_{1A}$ and $R_{1B}$ are preferably each independently a substituted or unsubstituted alkyl group having 1 to 15 carbon atoms, or a substituted or unsubstituted aryl group having 6 to 17 ring carbon atoms.

In the organic EL device according to the exemplary embodiment, $R_{1A}$ and $R_{1B}$ are preferably each independently a substituted or unsubstituted alkyl group having 1 to 15 carbon atoms. $R_{1A}$ and $R_{1B}$ being a substituted or unsubstituted alkyl group having 1 to 15 carbon atoms are likely to decrease a drive voltage.

In the organic EL device according to the exemplary embodiment, $R_{1A}$ and $R_{1B}$ are preferably each independently a substituted or unsubstituted alkyl group having 1 to 10 carbon atoms.

In the organic EL device according to the exemplary embodiment, when at least one combination of adjacent two or more of $R_{11}$ to $R_{14}$ are mutually bonded to form a substituted or unsubstituted monocyclic ring or mutually bonded to form a substituted or unsubstituted fused ring or when at least one combination of adjacent two or more of $R_{15}$ to $R_{18}$ are mutually bonded to form a substituted or unsubstituted monocyclic ring or mutually bonded to form a substituted or unsubstituted fused ring, it is preferable that the substituted or unsubstituted monocyclic ring is a ring represented by a formula (11) below and the substituted or unsubstituted fused ring is a ring represented by a formula (12) below.

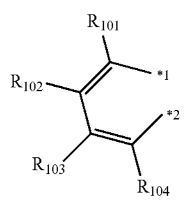

(11)

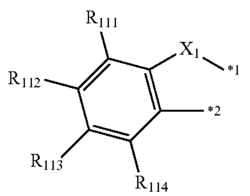

(12)

In the formula (11):

at least one combination of adjacent two or more of $R_{101}$ to $R_{104}$ are mutually bonded to form a substituted or unsubstituted monocyclic ring, mutually bonded to form a substituted or unsubstituted fused ring, or not mutually bonded, and in the formula (12):

$X_1$ is $C(R_{115})(R_{116})$, $NR_{117}$, an oxygen atom, or a sulfur atom, $R_{115}$, $R_{116}$ and $R_{117}$ are each independently a substituted or unsubstituted alkyl group having 1 to 15 carbon atoms, a substituted or unsubstituted aryl group having 6 to 17 ring carbon atoms, or a substituted or unsubstituted heterocyclic group having 5 to 17 ring atoms;

at least one of $R_{115}$ or $R_{116}$ is a substituted or unsubstituted alkyl group having 1 to 15 carbon atoms;

at least one combination of adjacent two or more of $R_{111}$ to $R_{114}$ are mutually bonded to form a substituted or unsubstituted monocyclic ring, mutually bonded to form a substituted or unsubstituted fused ring, or not mutually bonded;

$R_{101}$ to $R_{104}$ and $R_{111}$ to $R_{114}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 17 ring carbon atoms, or a substituted or unsubstituted heterocyclic group having 5 to 17 ring atoms; and

*1 and *2 each represent a bonding position to an atom forming a ring of the formula (1).

In the organic EL device according to the exemplary embodiment, when $X_1$ is $C(R_{115})(R_{116})$, $R_{115}$ and $R_{116}$ are each independently preferably a substituted or unsubstituted alkyl group having 1 to 15 carbon atoms, or a substituted or unsubstituted aryl group having 6 to 17 ring carbon atoms, more preferably a substituted or unsubstituted alkyl group having 1 to 15 carbon atoms.

In the organic EL device according to the exemplary embodiment, $R_{12}$ is also preferably the group represented by the formula (10).

In the organic EL device according to the exemplary embodiment, the first host material is preferably a compound represented by a formula (101) below.

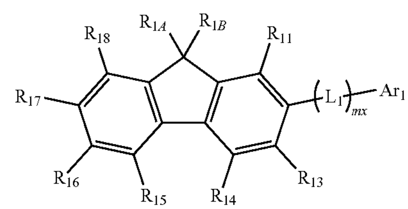

(101)

In the formula (101):

$R_{1A}$, $R_{1B}$, $R_{11}$, $R_{13}$, $R_{14}$ and $R_{15}$ to $R_{18}$ respectively represent the same as $R_{1A}$, $R_{1B}$, $R_{11}$, $R_{13}$, $R_{14}$ and $R_{15}$ to $R_1$, in the formula (1); and $Ar_1$, $L_1$ and mx respectively represent the same as $Ar_1$, $L_1$ and mx in the formula (10).

In the organic EL device according to the exemplary embodiment, it is also preferable that at least one combination of adjacent two or more of $R_{15}$ to $R_{18}$ are mutually bonded to form a substituted or unsubstituted monocyclic ring, or mutually bonded to form a substituted or unsubstituted fused ring.

In the organic EL device according to the exemplary embodiment, it is also preferable that a combination of $R_{16}$ and $R_{17}$ are mutually bonded to form a substituted or unsubstituted monocyclic ring, or mutually bonded to form a substituted or unsubstituted fused ring.

In the organic EL device according to the exemplary embodiment, it is also preferable that the combination of $R_{16}$ and $R_{17}$ are mutually bonded to form a substituted or unsubstituted monocyclic ring.

When at least one combination of adjacent two or more of $R_{15}$ to $R_{18}$ are mutually bonded to form a substituted or unsubstituted monocyclic ring or mutually bonded to form a substituted or unsubstituted fused ring, a ring directly fused with the ring B is preferably a six-membered ring, more preferably the ring represented by the formula (11). The ring directly fused with the ring B being a six-membered ring is likely to decrease a drive voltage.

In the organic EL device according to the exemplary embodiment, the first host material is also preferably a compound represented by a formula (102), (102A) or (102B) below.

(102)

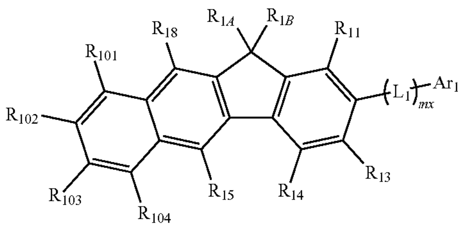

(102A)

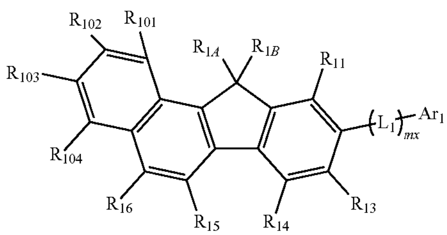

(102B)

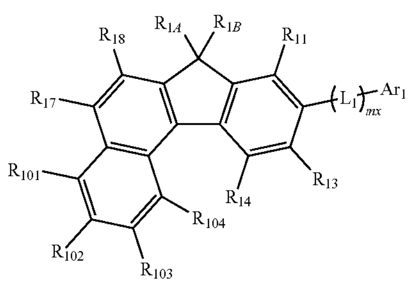

In the formulae (102), (102A) and (102B):

$R_{1A}$, $R_{1B}$, $R_{11}$, $R_{13}$, $R_{14}$, $R_{15}$, $R_{16}$, $R_{17}$ and $R_{18}$ respectively represent the same as $R_{1A}$, $R_{1B}$, $R_{11}$, $R_{13}$, $R_{14}$, $R_{15}$, $R_{16}$, $R_{17}$ and $R_{18}$ in the formula (1);

$Ar_1$, $L_1$ and mx respectively represent the same as $Ar_1$, $L_1$ and mx in the formula (10);

none of a combination of adjacent two or more of $R_{101}$ to $R_{104}$ are mutually bonded; and $R_{101}$ to $R_{104}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

In the organic EL device according to the exemplary embodiment, the first host material is also preferably a compound represented by a formula (104), (105), (106) or (107) below.

(104)

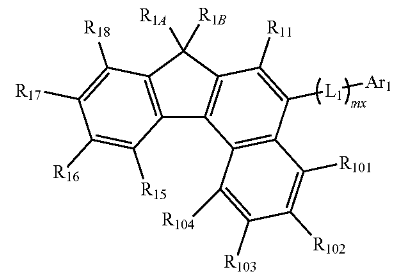

(105)

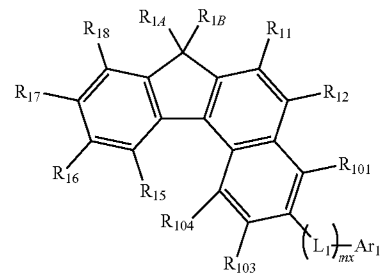

(106)

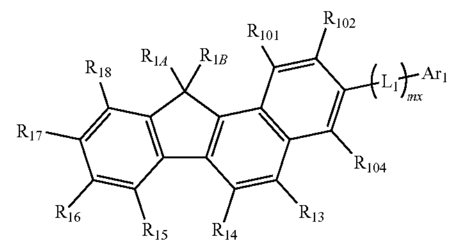

(107)

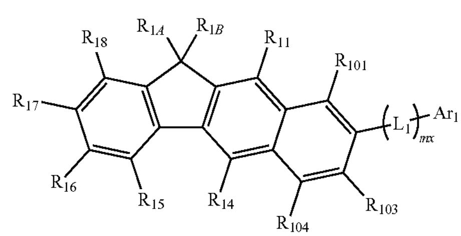

In the formulae (104) to (107):

$R_{1A}$, $R_{1B}$ and $R_{11}$ to $R_{18}$ respectively represent the same as $R_{1A}$, $R_{1B}$ and $R_{11}$ to $R_{18}$ in the formula (1);

$Ar_1$, $L_1$ and mx respectively represent the same as $Ar_1$, $L_1$ and mx in the formula (10);

none of a combination of adjacent two or more of $R_{101}$ to $R_{104}$ are mutually bonded; and $R_{101}$ to $R_{104}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

The compound represented by the formula (104) is an example of a compound in which a substituted or unsubstituted monocyclic ring is formed with the ring A and the group represented by the formula (10) is bonded to a carbon atom bonded to $R_{12}$. In the formula (104), the substituted or unsubstituted monocyclic ring formed with the ring A is a ring represented by the formula (11) formed by bonding a combination of $R_{13}$ and $R_{14}$.

The compounds represented by the formulae (105) to (107) are each an example of a compound in which a substituted or unsubstituted monocyclic ring is formed with the ring A and the group represented by the formula (10) is bonded to a carbon atom, among carbon atoms forming the monocyclic ring with the ring A, at a position farthest from the carbon atom $C_1$ of the ring A bonded by a single bond to the carbon atom $C_2$ of the ring B.

In the organic EL device according to the exemplary embodiment, the first host material is also preferably a compound represented by a formula (102C), (102D), (102E), (102F), (102G) or (102H) below.

(102C)

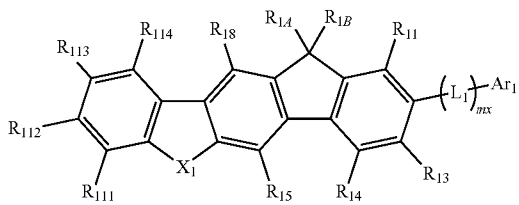

(102D)

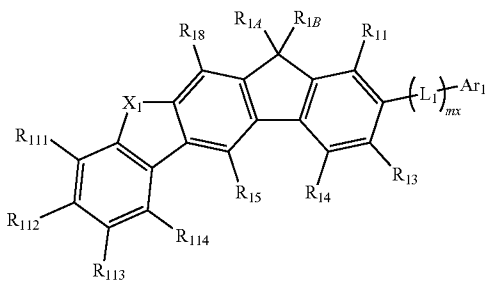

(102E)

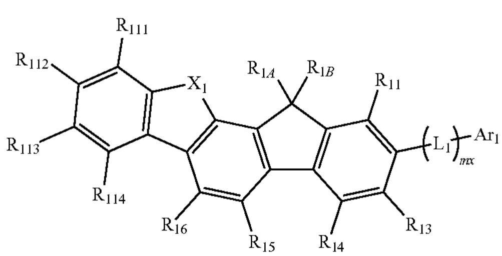

(102F)

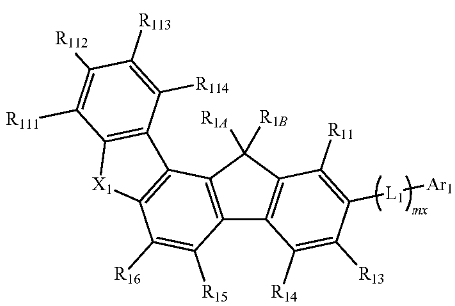

-continued (102G)

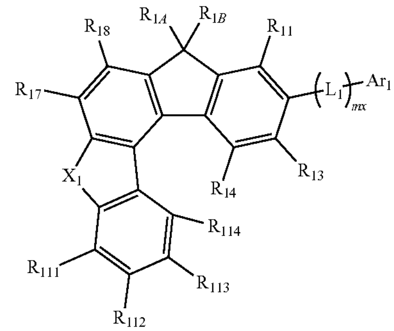

(102H)

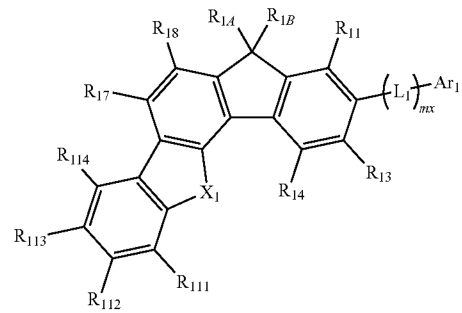

In the formulae (102C), (102D), (102E), (102F), (102G) and (102H):

$R_{1A}$, $R_{1B}$, $R_{11}$, $R_{13}$, $R_{14}$, $R_{15}$, $R_{16}$, $R_{17}$ and $R_{18}$ respectively represent the same as $R_{1A}$, $R_{1B}$, $R_{11}$, $R_{13}$, $R_{14}$, $R_{15}$, $R_{16}$, $R_{17}$ and $R_{18}$ in the formula (1);

$Ar_1$, $L_1$ and mx respectively represent the same as $Ar_1$, $L_1$ and mx in the formula (10); and $X_1$ and $R_{111}$ to $R_{114}$ respectively represent the same as $X_1$ and $R_{111}$ to $R_{114}$ in the formula (12).

In the organic EL device according to the exemplary embodiment, mx is preferably 0.

In the organic EL device according to the exemplary embodiment, $L_1$ is preferably a single bond or a substituted or unsubstituted arylene group having 6 to 17 ring carbon atoms, or preferably a single bond or a substituted or unsubstituted phenylene group.

In the organic EL device according to the exemplary embodiment, the first host material is preferably a compound represented by a formula (103), (103A) or (103B) below.

(103)

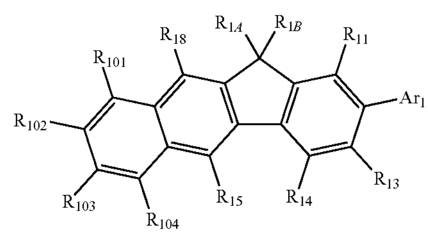

-continued

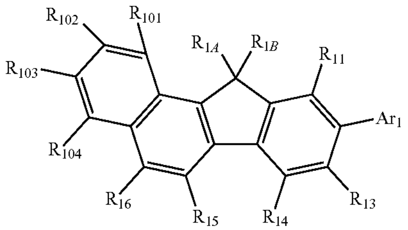

(103A)

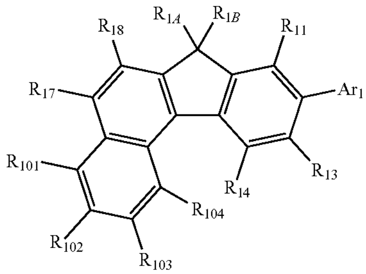

(103B)

In the formulae (103), (103A) and (103B3):

$R_{1A}$, $R_{1B}$, $R_{11}$, $R_{13}$, $R_{14}$, $R_{15}$, $R_{16}$, $R_{17}$ and $R_{18}$ respectively represent the same as $R_{1A}$, $R_{1B}$, $R_{11}$, $R_{13}$, $R_{14}$, $R_{15}$, $R_{16}$, $R_{17}$ and $R_{18}$ in the formula (1);

$R_{101}$ to $R_{104}$ respectively represent the same as $R_{101}$ to $R_{104}$ in the formulae (102), (102A) and (102B); and $Ar_1$ represents the same as $Ar_1$ in the formula (10).

In the organic EL device according to the exemplary embodiment, $R_{12}$ not bonded with the group represented by the formula (10) and $R_{11}$, $R_{13}$, $R_{14}$ and $R_{15}$ to $R_{18}$ not forming the substituted or unsubstituted monocyclic ring and not forming the substituted or unsubstituted fused ring are each independently preferably a hydrogen atom or a substituted or unsubstituted alkyl group having 1 to 15 carbon atoms, more preferably a hydrogen atom or a substituted or unsubstituted alkyl group having 1 to 10 carbon atoms, further preferably a hydrogen atom.

In the organic EL device according to the exemplary embodiment, $R_{101}$ to $R_{104}$ and $R_{111}$ to $R_{114}$ not forming the substituted or unsubstituted monocyclic ring and not forming the substituted or unsubstituted fused ring are each independently preferably a hydrogen atom or a substituted or unsubstituted alkyl group having 1 to 15 carbon atoms, more preferably a hydrogen atom or a substituted or unsubstituted alkyl group having 1 to 10 carbon atoms, further preferably a hydrogen atom.

In the organic EL device according to the exemplary embodiment, $Ar_1$ is preferably a substituted or unsubstituted aryl group having four to six fused rings, or a substituted or unsubstituted heterocyclic group having four to six fused rings, more preferably a substituted or unsubstituted aryl group having four to six fused rings.

In the organic EL device according to the exemplary embodiment, $Ar_1$ is also preferably a group derived from a substituted or unsubstituted fluoranthene ring, a substituted or unsubstituted benzofluoranthene ring, a substituted or unsubstituted benzanthracene ring, or a substituted or unsubstituted benzoxanthene ring.

In the organic EL device according to the exemplary embodiment, $Ar_1$ is also preferably a group represented by a formula (110), (114), (120), (130), (140), (150), (160), (170), (171), (180) or (190) below.

Group Represented by Formula (110)

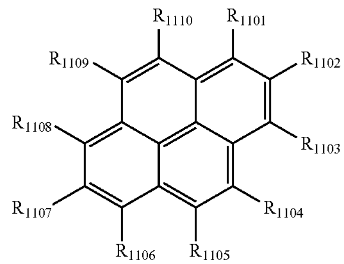

(110)

In the formula (110):

one of $R_{1101}$ to $R_{1110}$ represents a bonding position to $L_1$; and $R_{1101}$ to $R_{1110}$ not being a bonding position to $L_1$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a substituted or unsubstituted aralkyl group having 7 to 50 carbon atoms, a group represented by —$C(=O)R_{801}$, a group represented by —$COOR_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

In the organic EL device according to the exemplary embodiment, $Ar_1$ is also preferably a group represented by a formula (111), (112) or (113) below.

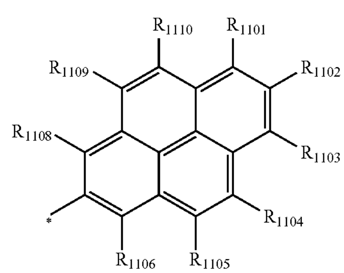

(111)

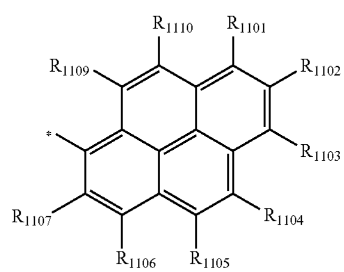

(112)

-continued (113)

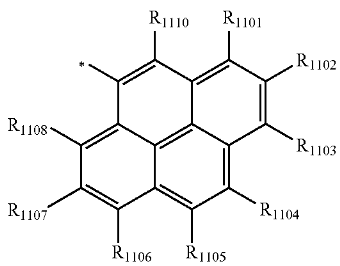

In the formulae (111), (112) and (113):

$R_{1101}$ to $R_{1110}$ respectively represent the same as $R_{1101}$ to $R_{1110}$ in the formula (110); and

* represents a bonding position to $L_1$.

In the organic EL device according to the exemplary embodiment, $R_{1101}$ to $R_{1110}$ not being a bonding position to $L_1$ are each independently preferably a hydrogen atom or a substituted or unsubstituted aryl group having 6 to 14 ring carbon atoms, more preferably a hydrogen atom or a substituted or unsubstituted phenyl group.

In the organic EL device according to the exemplary embodiment, $Ar_1$ is also preferably the group represented by the formula (112).

In the organic EL device according to the exemplary embodiment, it is also preferable that $Ar_1$ is the group represented by the formula (112) and mx is 0. In this case, the first host material is a compound represented by a formula (103C) below.

In the organic EL device according to the exemplary embodiment, the first host material is also preferably the compound represented by the formula (103C).

(103C)

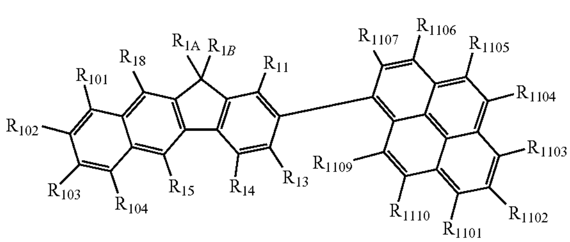

In the formula (103C):

$R_{1A}$, $R_{1B}$, $R_{11}$, $R_{13}$, $R_{14}$, $R_{15}$ and $R_{18}$ respectively represent the same as $R_{1A}$, $R_{1B}$, $R_{11}$, $R_{13}$, $R_{14}$, $R_{15}$ and $R_{18}$ in the formula (1);

$R_{101}$ to $R_{104}$ respectively represent the same as $R_{101}$ to $R_{104}$ in the formula (102); and $R_{1101}$ to $R_{1107}$, $R_{1109}$ and $R_{1110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

Group Represented by Formula (120)

(120)

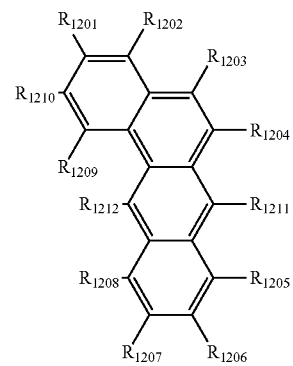

In the formula (120):

one of $R_{1201}$ to $R_{1212}$ represents a bonding position to $L_1$; and $R_{1201}$ to $R_{1212}$ not being a bonding position to $L_1$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

In the organic EL device according to the exemplary embodiment, $R_{1211}$ or $R_{1212}$ in the formula (120) is preferably a bonding position to $L_1$.

In the organic EL device according to the exemplary embodiment, $R_{1211}$ in the formula (120) is preferably a bonding position to $L_1$.

In the organic EL device according to the exemplary embodiment, $Ar_1$ is also preferably a group represented by a formula (121) or (122) below.

(121)

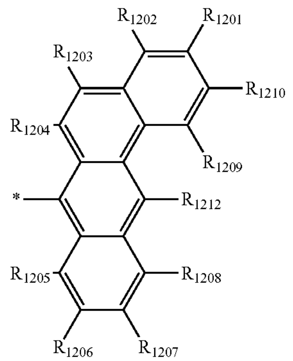

(122)

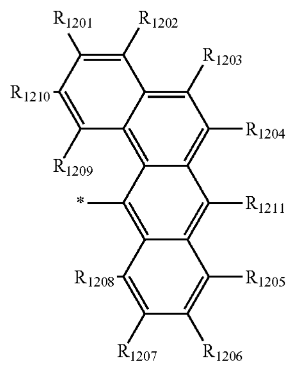

In the formulae (121) and (122):

$R_{1201}$ to $R_{1212}$ respectively represent the same as $R_{1201}$ to $R_{1212}$ in the formula (120); and

* represents a bonding position to $L_1$.

In the organic EL device according to the exemplary embodiment, $R_{1201}$ to $R_{1212}$ not being a bonding position to $L_1$ are each independently preferably a hydrogen atom or a substituted or unsubstituted aryl group having 6 to 14 ring carbon atoms, more preferably a hydrogen atom or a substituted or unsubstituted phenyl group.

Group Represented by Formula (130)

(130)

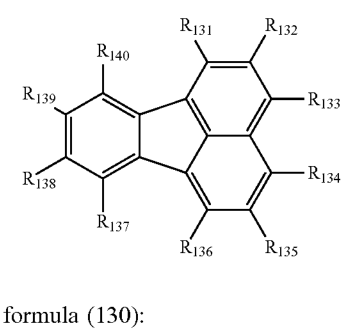

In the formula (130):

one of $R_{131}$ to $R_{140}$ represents a bonding position to $L_1$; and $R_{131}$ to $R_{140}$ not being a bonding position to $L_1$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—($R_{904}$), a group represented by —S—($R_{905}$), a group represented by —$N(R_{906})(R_{907})$, a substituted or unsubstituted aralkyl group having 7 to 50 carbon atoms, a group represented by —$C(=O)R_{801}$, a group represented by —$COOR_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

In the organic EL device according to the exemplary embodiment, $Ar_1$ is also preferably a group represented by a formula (131) or (132) below.

(131)

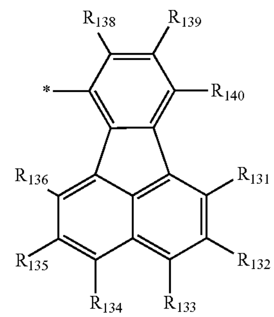

(132)

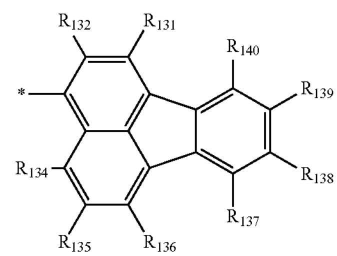

In the formulae (131) and (132):

$R_{131}$ to $R_{140}$ respectively represent the same as $R_{131}$ to $R_{140}$ in the formula (130); and

* represents a bonding position to $L_1$.

In the organic EL device according to the exemplary embodiment, $R_{131}$ to $R_{140}$ not being a bonding position to $L_1$ are each independently preferably a hydrogen atom or a substituted or unsubstituted aryl group having 6 to 14 ring carbon atoms, more preferably a hydrogen atom or a substituted or unsubstituted phenyl group.

Group Represented by Formula (140)

(140)

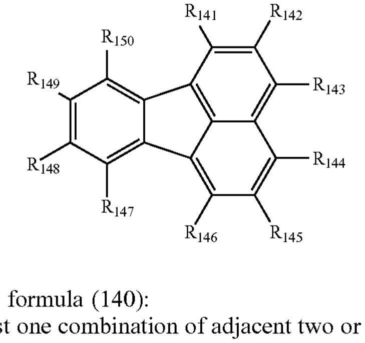

In the formula (140):

at least one combination of adjacent two or more of $R_{141}$ to $R_{150}$ are mutually bonded to form a substituted or unsubstituted monocyclic ring, or mutually bonded to form a substituted or unsubstituted fused ring;

a carbon atom selected from the group consisting of carbon atoms forming the substituted or unsubstituted monocyclic ring, carbon atoms forming the substituted or unsubstituted fused ring and carbon atoms respectively bonded with $R_{141}$ to $R_{150}$ is bonded to $L_1$; and $R_{141}$ to $R_{150}$ not bonded to $L_1$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

In the organic EL device according to the exemplary embodiment, $Ar_1$ is also preferably a group represented by a formula (141), (142), (143) or (144) below.

(141)

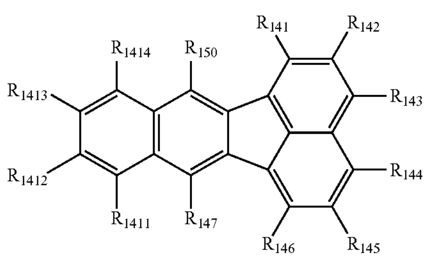

(142)

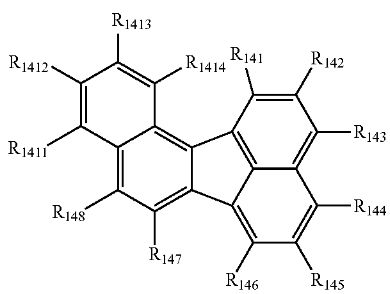

(143)

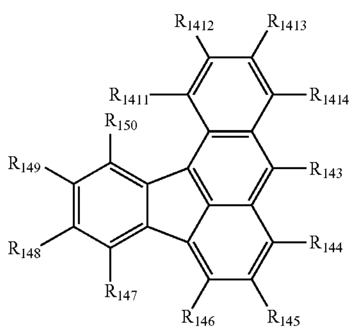

-continued (144)

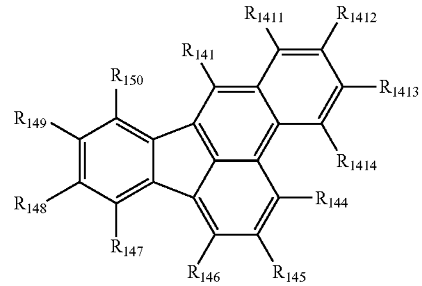

In the formulae (141) to (144):

a carbon atom selected from the group consisting of carbon atoms respectively bonded with $R_{141}$ to $R_{150}$ and $R_{1411}$ to $R_{1414}$ is bonded to $L_1$; and $R_{141}$ to $R_{150}$ and $R_{1411}$ to $R_{1414}$ not bonded to $L_1$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

In the organic EL device according to the exemplary embodiment, $Ar_1$ is also preferably a group represented by a formula (145), (146) or (147) below.

(145)

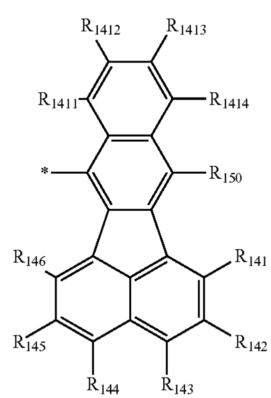

-continued (146)

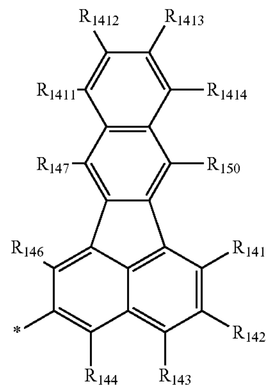

(147)

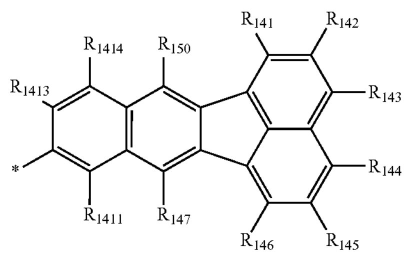

In the formulae (145) to (147):

$R_{141}$ to $R_{147}$, $R_{150}$ and $R_{1411}$ to $R_{1414}$ respectively represent the same as $R_{141}$ to $R_{147}$, $R_{150}$ and $R_{1411}$ to $R_{1414}$ in the formula (141); and

* represents a bonding position to $L_1$.

$R_{141}$ to $R_{150}$ and $R_{1411}$ to $R_{1414}$ not being a bonding position to $L_1$ are each independently preferably a hydrogen atom or a substituted or unsubstituted aryl group having 6 to 14 ring carbon atoms, more preferably a hydrogen atom or a substituted or unsubstituted phenyl group.

Group Represented by Formula (150)

(150)

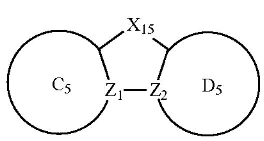

In the formula (150):

a ring $C_5$ and a ring $D_5$ are each independently a cyclic structure selected from the group consisting of a substituted or unsubstituted aryl ring having 6 to 50 ring carbon atoms, and a substituted or unsubstituted heterocycle having 5 to 50 ring atoms;

at least one of the ring $C_5$ or the ring $D_5$ is a cyclic structure selected from the group consisting of a substituted or unsubstituted aryl ring having 10 to 50 ring carbon atoms, and a substituted or unsubstituted heterocycle having 10 to 50 ring atoms;

$X_{15}$ is an oxygen atom, a sulfur atom, $NR_{71}$, $C(R_{72})(R_{73})$, $Si(R_{74})(R_{75})$, or $P(=O)(R_{76})$;

$Z_1$ and $Z_2$ are each independently a carbon atom or a nitrogen atom;

a combination of $R_{72}$ and $R_{73}$ are mutually bonded to form a substituted or unsubstituted monocyclic ring, mutually bonded to form a substituted or unsubstituted fused ring, or not mutually bonded;

a combination of $R_{74}$ and $R_{75}$ are mutually bonded to form a substituted or unsubstituted monocyclic ring, mutually bonded to form a substituted or unsubstituted fused ring, or not mutually bonded;

the ring $C_5$ and the ring $D_5$ are mutually bonded to form a substituted or unsubstituted monocyclic ring, mutually bonded to form a substituted or unsubstituted fused ring, or not mutually bonded;

a carbon atom selected from the group consisting of carbon atoms forming the ring $C_5$, carbon atoms forming the ring $D_5$, carbon atoms forming the substituted or unsubstituted monocyclic ring formed by mutually bonding the ring $C_5$ and the ring $D_5$, carbon atoms forming the substituted or unsubstituted fused ring formed by mutually bonding the ring $C_5$ and the ring $D_5$ is bonded to $L_1$;

$R_{71}$ to $R_{76}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 17 ring carbon atoms, or a substituted or unsubstituted heterocyclic group having 5 to 17 ring atoms; and the group represented by the formula (150) does not have a substituted or unsubstituted pyrenyl group as a substituent.

In the organic EL device according to the exemplary embodiment, one of $Z_1$ and $Z_2$ in the formula (150) is preferably a carbon atom. More preferably, both $Z_1$ and $Z_2$ are a carbon atom.

In the organic EL device according to the exemplary embodiment, the ring $C_5$ and the ring $D_5$ in the formula (150) are preferably each independently a cyclic structure selected from the group consisting of a substituted or unsubstituted benzene ring, a substituted or unsubstituted naphthalene ring, a substituted or unsubstituted phenanthrene ring, a substituted or unsubstituted phenalene ring, a substituted or unsubstituted pyrene ring, a substituted or unsubstituted chrysene ring, a substituted or unsubstituted triphenylene ring, a substituted or unsubstituted fluorene ring, a substituted or unsubstituted benzofluorene ring, a substituted or unsubstituted dibenzofluorene ring, a substituted or unsubstituted fluoranthene ring, a substituted or unsubstituted perylene ring, a substituted or unsubstituted pyridine ring, a substituted or unsubstituted pyrimidine ring, a substituted or unsubstituted azanaphthalene ring, a substituted or unsubstituted azaanthracene ring, a substituted or unsubstituted azaphenanthrene ring, and a substituted or unsubstituted phenanthroline ring.

Group Represented by Formula (160)

(160)

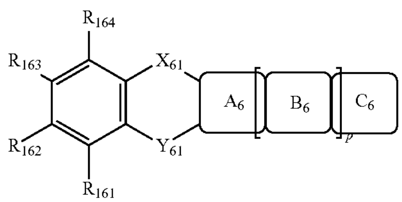

(161)

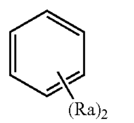

(162)

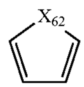

(163)

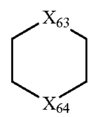

(164)

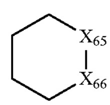

(165)

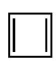

(166)

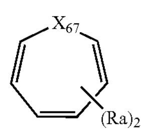

(161A)

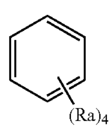

(162A)

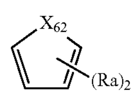

In the formula (160):

a ring $A_6$ and a ring $B_6$ are each independently a cyclic structure represented by one of formulae (161) to (166) and fused with any position(s) of respective adjacent rings;

p is 1, 2, or 3;

when a plurality of rings $B_6$ are present, the plurality of rings $B_6$ are mutually the same or different;

a ring $C_6$ is a cyclic structure represented by one of formulae (161A) and (162A) and fused with any position(s) of respective adjacent rings;

$X_{61}$ is an oxygen atom, a sulfur atom, $NR_{71}$, $C(R_{72})(R_{73})$, $Si(R_{74})(R_{75})$, $P(=O)(R_{76})$, or $C=C(R_{77})(R_{78})$;

$Y_{61}$ is a single bond, an oxygen atom, a sulfur atom, $NR_{71B}$, $C(R_{72B})(R_{73B})$, $Si(R_{74B})(R_{75B})$, $P(=O)(R_{76B})$, or $C=C(R_{77B})(R_{78B})$;

a combination of $R_{72}$ and $R_{73}$ are mutually bonded to form a substituted or unsubstituted monocyclic ring, mutually bonded to form a substituted or unsubstituted fused ring, or not mutually bonded;

a combination of $R_{74}$ and $R_{75}$ are mutually bonded to form a substituted or unsubstituted monocyclic ring, mutually bonded to form a substituted or unsubstituted fused ring, or not mutually bonded;

a combination of $R_{77}$ and $R_{78}$ are mutually bonded to form a substituted or unsubstituted monocyclic ring, mutually bonded to form a substituted or unsubstituted fused ring, or not mutually bonded;

a combination of $R_{72B}$ and $R_{73B}$ are mutually bonded to form a substituted or unsubstituted monocyclic ring, mutually bonded to form a substituted or unsubstituted fused ring, or not mutually bonded;

a combination of $R_{74B}$ and $R_{75B}$ are mutually bonded to form a substituted or unsubstituted monocyclic ring, mutually bonded to form a substituted or unsubstituted fused ring, or not mutually bonded;

a combination of $R_{77B}$ and $R_{78B}$ are mutually bonded to form a substituted or unsubstituted monocyclic ring, mutually bonded to form a substituted or unsubstituted fused ring, or not mutually bonded; and at least one combination of adjacent two or more of $R_{161}$ to $R_{164}$ are mutually bonded to form a substituted or unsubstituted monocyclic ring, mutually bonded to form a substituted or unsubstituted fused ring, or not mutually bonded, in the formulae (161) to (166) and (161A) to (162A):

$X_{62}$ to $X_{67}$ are each independently an oxygen atom, a sulfur atom, $NR_{71A}$, $C(R_{72A})(R_{73A})$, $Si(R_{74A})(R_{75A})$, $P(=O)(R_{76A})$, C=0, or $C=C(R_{77A})(R_{78A})$;

a combination of $R_{72A}$ and $R_{73A}$ are mutually bonded to form a substituted or unsubstituted monocyclic ring, mutually bonded to form a substituted or unsubstituted fused ring, or not mutually bonded;

a combination of $R_{74A}$ and $R_{75A}$ are mutually bonded to form a substituted or unsubstituted monocyclic ring, mutually bonded to form a substituted or unsubstituted fused ring, or not mutually bonded;

a combination of $R_{77A}$ and $R_{78A}$ are mutually bonded to form a substituted or unsubstituted monocyclic ring, mutually bonded to form a substituted or unsubstituted fused ring, or not mutually bonded;

at least one combination of adjacent two or more of a plurality of Ra are mutually bonded to form a substituted or unsubstituted monocyclic ring, mutually bonded to form a substituted or unsubstituted fused ring, or not mutually bonded; and a carbon atom selected from the group consisting of carbon atoms forming the ring $A_6$, carbon atoms forming the ring $B_6$, carbon atoms forming the ring $C_6$ and carbon atoms respectively bonded with $R_{161}$ to $R_{164}$ is bonded to $L_1$, and in the formulae (160), (161) to (166) and (161A) to (162A):

at least one combination of adjacent two or more of $R_{161}$ to $R_{164}$ not being a bonding position to $L_1$, $R_{71}$ to $R_{78}$, $R_{71A}$ to $R_{78A}$, $R_{71B}$ to $R_{78B}$ and the plurality of Ra are mutually bonded to form a substituted or unsubstituted monocyclic ring, mutually bonded to form a substituted or unsubstituted fused ring, or not mutually bonded;

$R_{161}$ to $R_{164}$ not being a bonding position to $L_1$, not forming the substituted or unsubstituted monocyclic ring and not forming the substituted or unsubstituted fused ring, and $R_{71}$ to $R_{78}$, $R_{71A}$ to $R_{78A}$, $R_{71B}$ to $R_{78B}$ and Ra not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 17 ring carbon atoms, a substituted or unsubstituted heterocyclic group having 5 to 17 ring atoms, or a group represented by -($L_{900}$)nx-$Ar_{900}$;

when a plurality of groups represented by -($L_{900}$)nx-$Ar_{900}$ are present, the plurality of groups represented by -($L_{900}$)nx-$Ar_{900}$ are mutually the same or different;

$L_{900}$ is a single bond, a substituted or unsubstituted arylene group having 6 to 17 ring carbon atoms, or a substituted or unsubstituted divalent heterocyclic group having 5 to 17 ring atoms;

$Ar_{900}$ is a substituted or unsubstituted aryl group having 6 to 17 ring carbon atoms, or a substituted or unsubstituted heterocyclic group having 5 to 17 ring atoms;

nx is 0, 1, 2, or 3;

when two or more $L_{900}$ are present, the two or more $L_{900}$ are mutually the same or different;

when two or more $Ar_{900}$ are present, the two or more $Ar_{900}$ are mutually the same or different;

the plurality of Ra are mutually the same or different;

when a plurality of $X_{62}$ are present, the plurality of $X_{62}$ are mutually the same or different;

when a plurality of $X_{63}$ are present, the plurality of $X_{63}$ are mutually the same or different;

when a plurality of $X_{64}$ are present, the plurality of $X_{64}$ are mutually the same or different;

when a plurality of $X_{65}$ are present, the plurality of $X_{65}$ are mutually the same or different;

when a plurality of $X_{65}$ are present, the plurality of $X_{65}$ are mutually the same or different;

when a plurality of $X_{67}$ are present, the plurality of $X_{67}$ are mutually the same or different;

when a plurality of $R_{71A}$ are present, the plurality of $R_{71A}$ are mutually the same or different;

when a plurality of $R_{72A}$ are present, the plurality of $R_{72A}$ are mutually the same or different;

when a plurality of $R_{73A}$ are present, the plurality of $R_{73A}$ are mutually the same or different;

when a plurality of $R_{74A}$ are present, the plurality of $R_{74A}$ are mutually the same or different;

when a plurality of $R_{75A}$ are present, the plurality of $R_{75A}$ are mutually the same or different;

when a plurality of $R_{76A}$ are present, the plurality of $R_{76A}$ are mutually the same or different;

when a plurality of $R_{77A}$ are present, the plurality of $R_{77A}$ are mutually the same or different; and when a plurality of $R_{78A}$ are present, the plurality of $R_{78A}$ are mutually the same or different.

Group Represented by Formula (170)

(170)

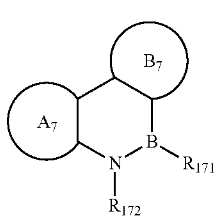

In the formula (170):

a ring $A_7$ and a ring $B_7$ are each independently a cyclic structure selected from the group consisting of a substituted or unsubstituted aryl ring having 6 to 50 ring carbon atoms, and a substituted or unsubstituted heterocycle having 5 to 50 ring atoms;

the ring $A_7$ and the ring $B_7$ are mutually bonded to form a substituted or unsubstituted monocyclic ring, mutually bonded to form a substituted or unsubstituted fused ring, or not mutually bonded;

the ring $A_7$ and $R_{172}$ are mutually bonded to form a substituted or unsubstituted monocyclic ring, mutually bonded to form a substituted or unsubstituted fused ring, or not mutually bonded;

the ring $B_7$ and $R_{171}$ are mutually bonded to form a substituted or unsubstituted monocyclic ring, mutually bonded to form a substituted or unsubstituted fused ring, or not mutually bonded;

a combination of $R_{171}$ and $R_{172}$ are mutually bonded to form a substituted or unsubstituted monocyclic ring, mutually bonded to form a substituted or unsubstituted fused ring, or not mutually bonded;

$L_1$ in the formula (10) is bonded with a carbon atom selected from the group consisting of carbon atoms forming the ring $A_7$, carbon atoms forming the ring $B_7$, carbon atoms forming the substituted or unsubstituted monocyclic ring or the substituted or unsubstituted fused ring formed by mutually bonding the ring $A_7$ and the ring $B_7$, carbon atoms forming the substituted or unsubstituted monocyclic ring or the substituted or unsubstituted fused ring formed by mutually bonding the ring $A_7$ and $R_{172}$, carbon atoms forming the substituted or unsubstituted monocyclic ring or the substituted or unsubstituted fused ring formed by mutually bonding the ring $B_7$ and $R_{171}$, and carbon atoms forming the substituted or unsubstituted monocyclic ring or the substituted or unsubstituted fused ring formed by mutually bonding $R_{171}$ and $R_{172}$;

$R_{171}$ and $R_{172}$ not being a bonding position to $L_1$, not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 17 ring carbon atoms, a substituted or unsubstituted heterocyclic group having 5 to 17 ring atoms, or a group represented by -($L_{910}$)px-$Ar_{910}$;

when a plurality of groups represented by -($L_{910}$)px-$Ar_{910}$ are present, the plurality of groups represented by -($L_{910}$)px-$Ar_{910}$ are mutually the same or different;

$L_{910}$ is a single bond, a substituted or unsubstituted arylene group having 6 to 17 ring carbon atoms, a substituted or unsubstituted divalent heterocyclic group having 5 to 17 ring atoms, or a group represented by —Si($R_{901A}$)($R_{902B}$)—;

$R_{901A}$ and $R_{902B}$ are each independently a hydrogen atom, a substituted or unsubstituted alkyl group having 1 to 18 carbon atoms, a substituted or unsubstituted haloalkyl group having 1 to 18 carbon atoms, a substituted or unsubstituted cycloalkyl group having 3 to 18 ring carbon atoms, a substituted or unsubstituted aryl group having 6 to 17 ring carbon atoms, or a substituted or unsubstituted heterocyclic group having 5 to 17 ring atoms;

$Ar_{910}$ is a substituted or unsubstituted aryl group having 6 to 17 ring carbon atoms, or a substituted or unsubstituted heterocyclic group having 5 to 17 ring atoms;

px is 0, 1, 2, or 3;

when two or more $L_{910}$ are present, the two or more $L_{910}$ are mutually the same or different; and when two or more $Ar_{910}$ are present, the two or more $Ar_{910}$ are mutually the same or different.

Group Represented by Formula (171)

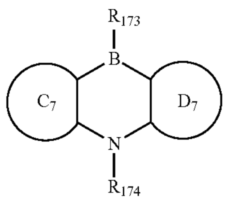

(171)

In the formula (171):

a ring $C_7$ and a ring $D_7$ are each independently a cyclic structure selected from the group consisting of a substituted or unsubstituted aryl ring having 6 to 50 ring carbon atoms, and a substituted or unsubstituted heterocycle having 5 to 50 ring atoms;

$R_{173}$ and at least one of the ring $C_7$ or the ring $D_7$ are mutually bonded to form a substituted or unsubstituted monocyclic ring, mutually bonded to form a substituted or unsubstituted fused ring, or not mutually bonded;

$R_{174}$ and at least one of the ring $C_7$ or the ring $D_7$ are mutually bonded to form a substituted or unsubstituted monocyclic ring, mutually bonded to form a substituted or unsubstituted fused ring, or not mutually bonded;

$L_1$ in the formula (10) is bonded with a carbon atom selected from the group consisting of carbon atoms forming the ring $C_7$, carbon atoms forming the ring $D_7$, carbon atoms forming the substituted or unsubstituted monocyclic ring or the substituted or unsubstituted fused ring formed by mutually bonding $R_{173}$ and at least one of the ring $C_7$ or the ring $D_7$, and carbon atoms forming the substituted or unsubstituted monocyclic ring or the substituted or unsubstituted fused ring formed by mutually bonding $R_{174}$ and at least one of the ring $C_7$ or the ring $D_7$; and $R_{173}$ and $R_{174}$ not being a bonding position to $L_1$, not forming the substituted or unsubstituted monocyclic ring and not forming the substituted or unsubstituted fused ring each independently represent the same as $R_{171}$ and $R_{172}$ in the formula (170).

Group Represented by Formula (180)

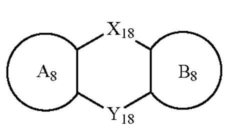

(180)

In the formula (180):

a ring $A_8$ and a ring $B_8$ are each independently a cyclic structure selected from the group consisting of a substituted or unsubstituted aryl ring having 6 to 50 ring carbon atoms, and a substituted or unsubstituted heterocycle having 5 to 50 ring atoms;

$X_{18}$ is an oxygen atom, a sulfur atom, $NR_{71}$, $C(R_{72})(R_{73})$, $Si(R_{74})(R_{75})$, or $P(=O)(R_{76})$;

$Y_1$, is a sulfur atom, $NR_{71A}$, $C(R_{72A})(R_{73A})$, $Si(R_{74A})(R_{75A})$, or $P(=O)(R_{76A})$;

a combination of $R_{72}$ and $R_{73}$ are mutually bonded to form a substituted or unsubstituted monocyclic ring, mutually bonded to form a substituted or unsubstituted fused ring, or not mutually bonded;

a combination of $R_{74}$ and $R_{75}$ are mutually bonded to form a substituted or unsubstituted monocyclic ring, mutually bonded to form a substituted or unsubstituted fused ring, or not mutually bonded;

at least one of $R_{71}$ to $R_{76}$ and at least one of the ring $A_8$ or the ring $B_8$ are mutually bonded to form a substituted or unsubstituted monocyclic ring, mutually bonded to form a substituted or unsubstituted fused ring, or not mutually bonded;

a combination of $R_{72A}$ and $R_{73A}$ are mutually bonded to form a substituted or unsubstituted monocyclic ring, mutually bonded to form a substituted or unsubstituted fused ring, or not mutually bonded;

a combination of $R_{74A}$ and $R_{75A}$ are mutually bonded to form a substituted or unsubstituted monocyclic ring, mutually bonded to form a substituted or unsubstituted fused ring, or not mutually bonded;

at least one of $R_{71A}$ to $R_{76A}$ and at least one of the ring $A_8$ or the ring $B_8$ are mutually bonded to form a substituted or unsubstituted monocyclic ring, mutually bonded to form a substituted or unsubstituted fused ring, or not mutually bonded;

when $X_{18}$ is an oxygen atom and $Y_{18}$ is $C(R_{72A})(R_{73A})$, a ring formed by bonding $R_{72A}$ and the ring $A_8$ or the ring $B_8$ is not a substituted or unsubstituted benzene ring;

a ring formed by bonding $R_{73A}$ and the ring $A_8$ or the ring $B_8$ is not a substituted or unsubstituted benzene ring;

$L_1$ in the formula (10) is bonded with a carbon atom selected from the group consisting of carbon atoms forming the ring $A_8$, carbon atoms forming the ring $B_8$, carbon atoms forming the substituted or unsubstituted monocyclic ring or the substituted or unsubstituted fused ring formed by mutually bonding at least one of $R_{71}$ to $R_{76}$ and at least one of the ring $A_8$ or the ring $B_8$, and carbon atoms forming the substituted or unsubstituted monocyclic ring or the substituted or unsubstituted fused ring formed by mutually bonding at least one of $R_{71A}$ to $R_{76A}$ and at least one of the ring $A_8$ or the ring $B_8$; and $R_{71}$ to $R_{76}$ and $R_{71A}$ to $R_{76A}$ not being a bonding position to $L_1$, not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(=O)R_{801}$, a group represented by $—COOR_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

Group Represented by Formula (190)

(190)

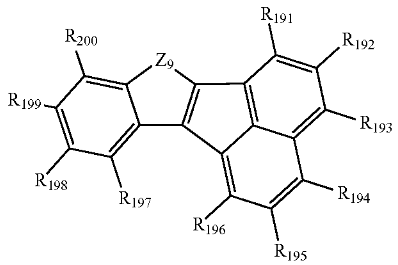

In the formula (190):

$Z_9$ is an oxygen atom, a sulfur atom, $NR_{71}$, $C(R_{72})(R_{73})$, $Si(R_{74})(R_{75})$, or $P(=O)(R_{76})$;

a combination of $R_{72}$ and $R_{73}$ are mutually bonded to form a substituted or unsubstituted monocyclic ring, mutually bonded to form a substituted or unsubstituted fused ring, or not mutually bonded;

a combination of $R_{74}$ and $R_{75}$ are mutually bonded to form a substituted or unsubstituted monocyclic ring, mutually bonded to form a substituted or unsubstituted fused ring, or not mutually bonded;

at least one combination of adjacent two or more of $R_{191}$ to $R_{196}$ are mutually bonded to form a substituted or unsubstituted monocyclic ring, mutually bonded to form a substituted or unsubstituted fused ring, or not mutually bonded;

at least one combination of adjacent two or more of $R_{197}$ to $R_{200}$ are mutually bonded to form a substituted or unsubstituted monocyclic ring, mutually bonded to form a substituted or unsubstituted fused ring, or not mutually bonded;

$L_1$ in the formula (10) is bonded with a carbon atom selected from the group consisting of carbon atoms respectively bonded with $R_{191}$ to $R_{200}$, carbon atoms forming the substituted or unsubstituted monocyclic ring or the substituted or unsubstituted fused ring formed by mutually bonding a combination of adjacent two or more of $R_{191}$ to $R_{196}$, and carbon atoms forming the substituted or unsubstituted monocyclic ring or the substituted or unsubstituted fused ring formed by mutually bonding a combination of adjacent two or more of $R_{197}$ to $R_{200}$;

$R_{191}$ to $R_{200}$ and $R_{71}$ to $R_{76}$ not being a bonding position to $L_1$, not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(=O)R_{801}$, a group represented by $—COOR_{802}$, a halogen atom, a cyano group, a nitro group, a substituted or unsubstituted aryl group having 6 to 17 ring carbon atoms, a substituted or unsubstituted heterocyclic group having 5 to 17 ring atoms, or a group represented by $-(L_{920})qx-Ar_{920}$;

when a plurality of groups represented by $-(L_{920})qx-Ar_{920}$ are present, the plurality of groups represented by $-(L_{920})qx-Ar_{920}$ are mutually the same or different;

$L_{920}$ is a single bond, a substituted or unsubstituted arylene group having 6 to 17 ring carbon atoms, or a substituted or unsubstituted divalent heterocyclic group having 5 to 17 ring atoms;

$Ar_{920}$ is a substituted or unsubstituted aryl group having 6 to 17 ring carbon atoms, or a substituted or unsubstituted heterocyclic group having 5 to 17 ring atoms;

qx is 0, 1, 2, or 3;

when two or more $L_{920}$ are present, the two or more $L_{920}$ are mutually the same or different; and when two or more $Ar_{920}$ are present, the two or more $Ar_{920}$ are mutually the same or different.

Group Represented by Formula (114)

(114)

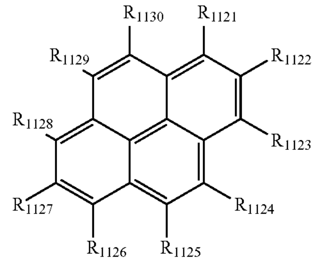

(115)

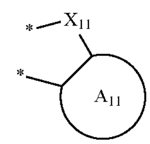

In the formula (114):

at least one combination of a combination of $R_{1121}$ and $R_{1122}$, a combination of $R_{1122}$ and $R_{1123}$, a combination of $R_{1124}$ and $R_{1125}$, a combination of $R_{1126}$ and $R_{1127}$, a combination of $R_{1127}$ and $R_{1128}$, and a combination of $R_{1129}$ and $R_{1130}$ are mutually bonded to form a ring represented by a formula (115);

$L_1$ in the formula (10) is bonded with a carbon atom selected from the group consisting of carbon atoms forming a ring $A_{11}$, and carbon atoms respectively bonded with $R_{1121}$ to $R_{1130}$;

$R_{1121}$ to $R_{1130}$ not bonded to $L_1$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(=O)R_{801}$, a group represented by $—COOR_{802}$, a halogen atom, a cyano group, a nitro group, a substituted or unsubstituted aryl group having 6 to 17 ring carbon atoms, a substituted or unsubstituted heterocyclic group having 5 to 17 ring atoms, or a group represented by $-(L_{930})rx-Ar_{930}$;

when a plurality of groups represented by $-(L_{930})rx-Ar_{930}$ are present, the plurality of groups represented by $-(L_{930})rx-Ar_{930}$ are mutually the same or different;

$L_{930}$ is a single bond, a substituted or unsubstituted arylene group having 6 to 17 ring carbon atoms, or a substituted or unsubstituted divalent heterocyclic group having 5 to 17 ring atoms;

$Ar_{930}$ is a substituted or unsubstituted aryl group having 6 to 17 ring carbon atoms, or a substituted or unsubstituted heterocyclic group having 5 to 17 ring atoms;

rx is 0, 1, 2, or 3;

when two or more $L_{930}$ are present, the two or more $L_{930}$ are mutually the same or different;

when two or more $Ar_{930}$ are present, the two or more $Ar_{930}$ are mutually the same or different; and two * in the formula (115) each represent a bonding position to a carbon atom of a pyrene ring, and in the formula (115):

a ring $A_{11}$ is a cyclic structure selected from the group consisting of a substituted or unsubstituted aryl ring having 6 to 50 ring carbon atoms, and a substituted or unsubstituted heterocycle having 5 to 50 ring atoms;

$X_{11}$ is an oxygen atom, a sulfur atom, $NR_{71}$, $C(R_{72})(R_{73})$, $Si(R_{74})(R_{75})$, or $P({=}O)(R_{76})$;

a combination of $R_{72}$ and $R_{73}$ are mutually bonded to form a substituted or unsubstituted monocyclic ring, mutually bonded to form a substituted or unsubstituted fused ring, or not mutually bonded;

a combination of $R_{74}$ and $R_{75}$ are mutually bonded to form a substituted or unsubstituted monocyclic ring, mutually bonded to form a substituted or unsubstituted fused ring, or not mutually bonded; and $R_{71}$ to $R_{76}$ not forming the substituted or unsubstituted monocyclic ring and not forming the substituted or unsubstituted fused ring each independently represent the same as $R_{1121}$ to $R_{1130}$ in the formula (114).

The compound represented by the formula (1) may be a compound in which $Ar_1$ is not a substituted or unsubstituted pyrenyl group.

In the first host material according to the exemplary embodiment, all groups described as "substituted or unsubstituted" groups are preferably "unsubstituted" groups.

Manufacturing Method of First Host Material

The first compound as the first host material can be manufactured by application of known substitution reactions and materials depending on a target compound, in accordance with or based on synthesis methods described later in Examples.

Specific Examples of First Host Material

Specific examples of the first compound as the first host material include the following compounds. It should however be noted that the invention is not limited by the specific examples of the first compound.

In the specific examples of the compound herein, D represents a deuterium atom, Me represents a methyl group, and tBu represents a tert-butyl group.

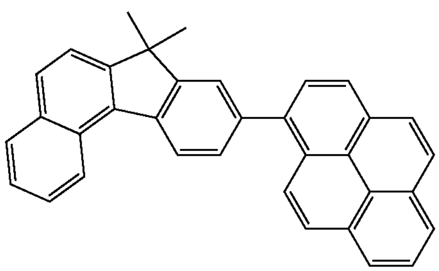

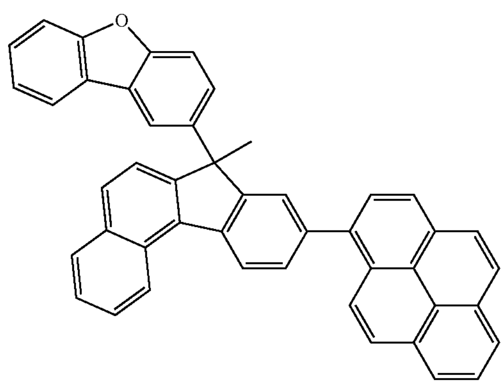

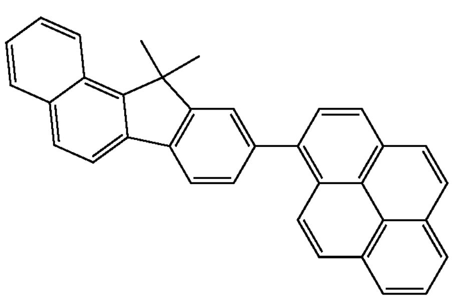

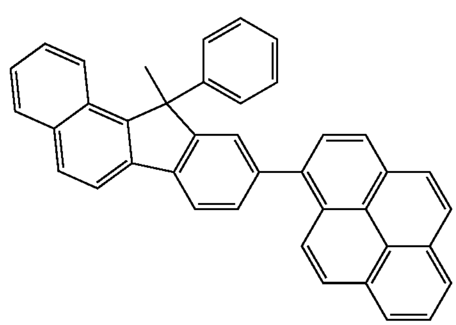

-continued
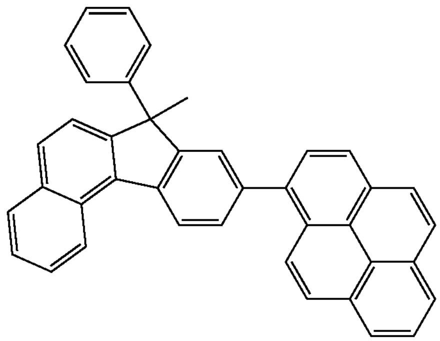
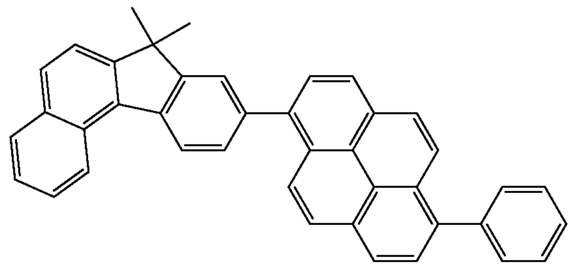
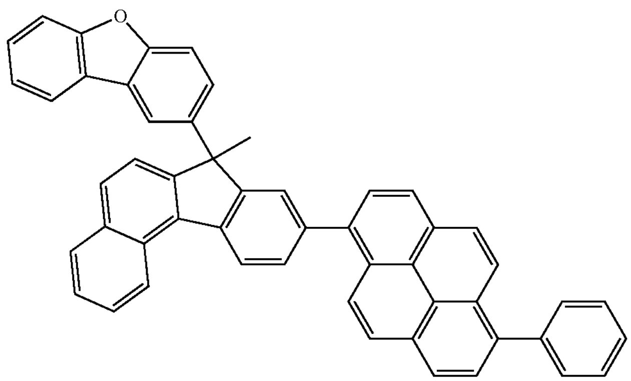
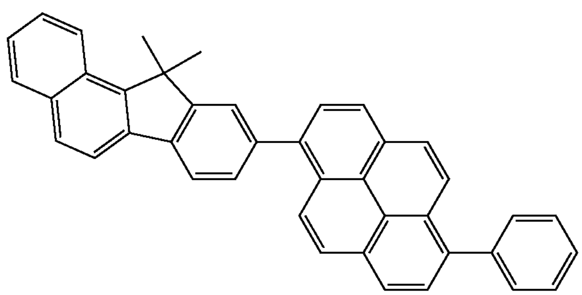
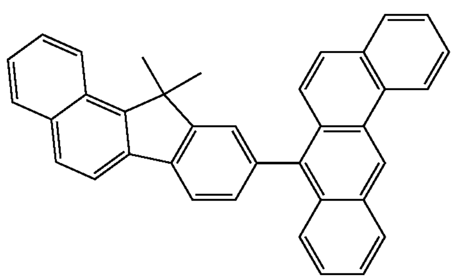
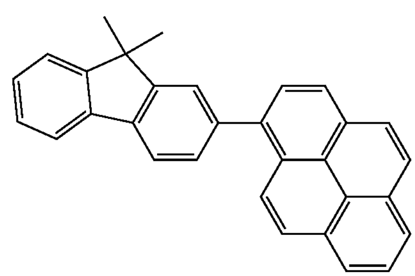
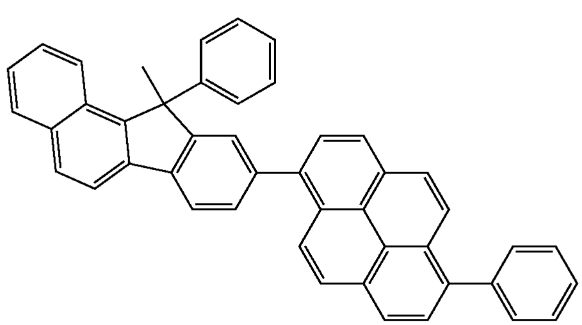
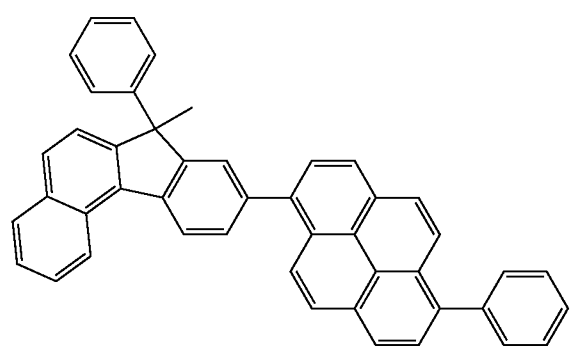

-continued
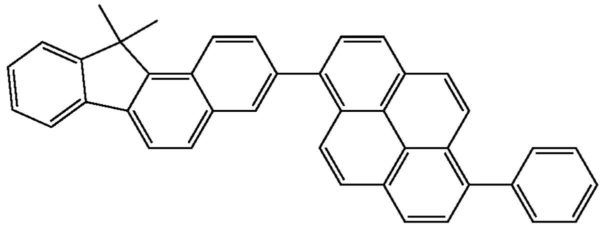
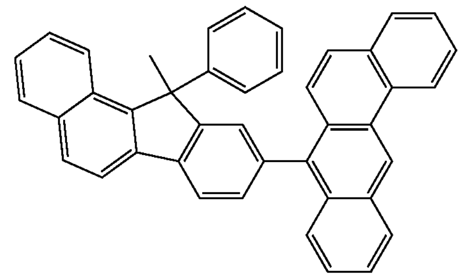
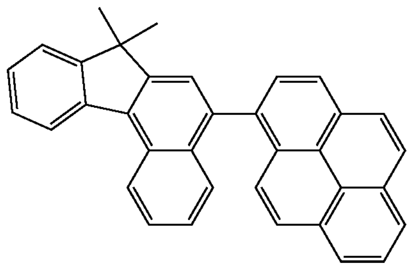
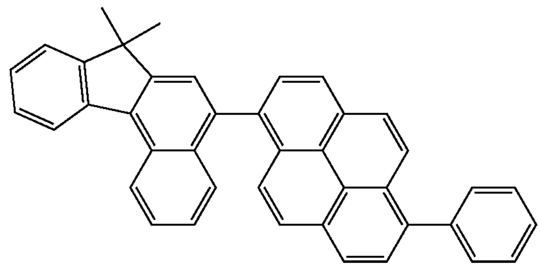
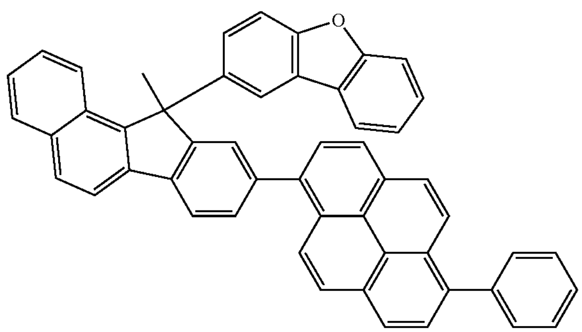
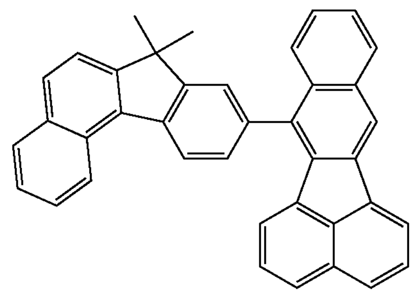
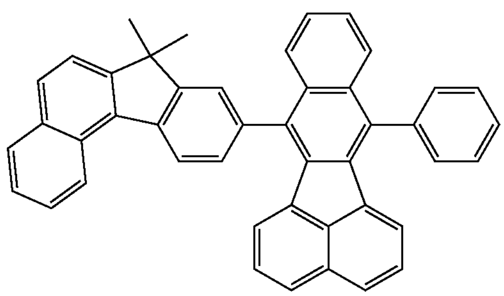
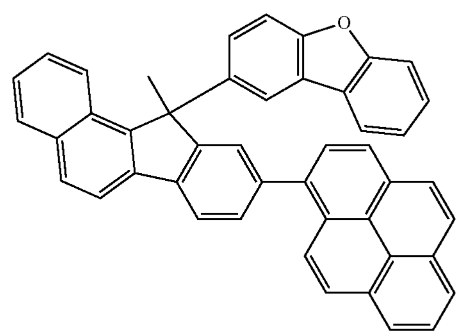
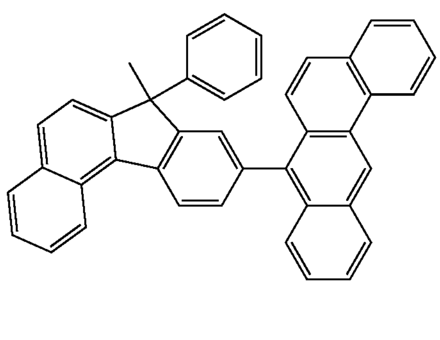
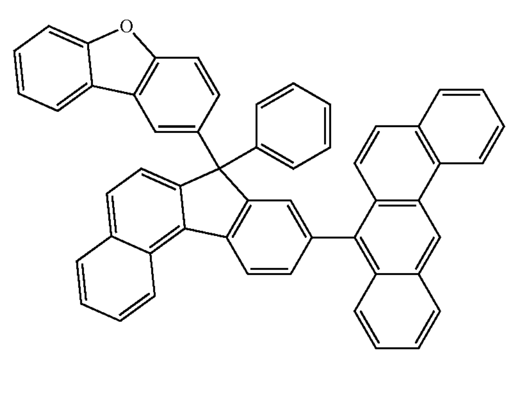

-continued
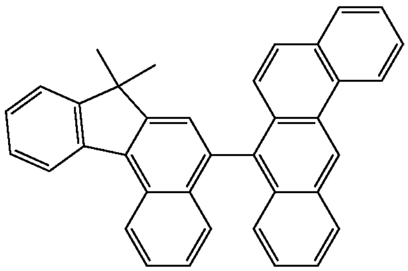
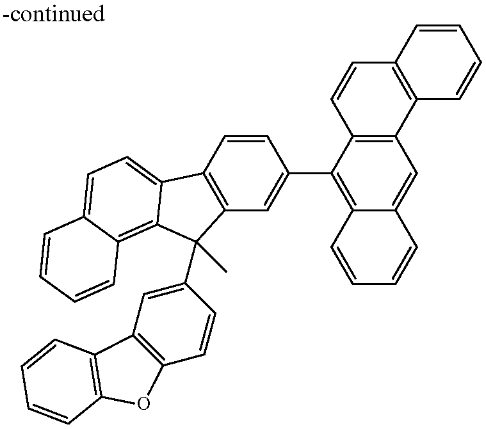
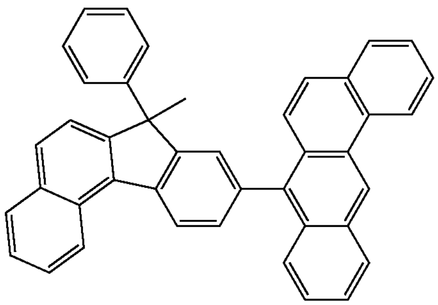
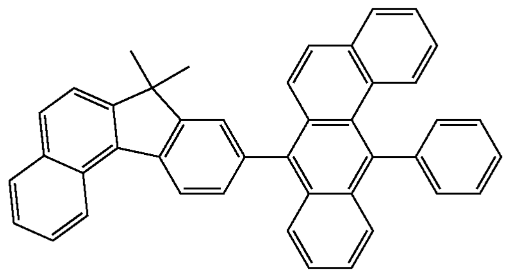
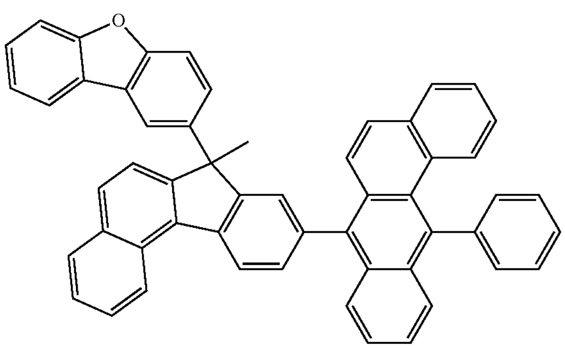
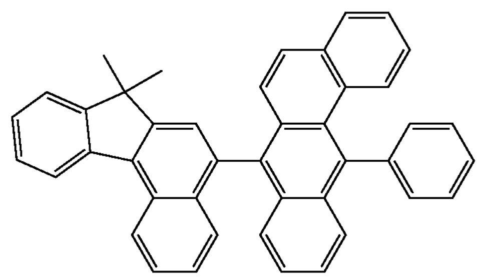
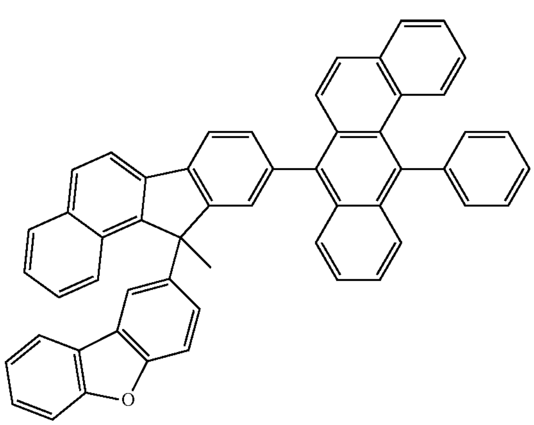
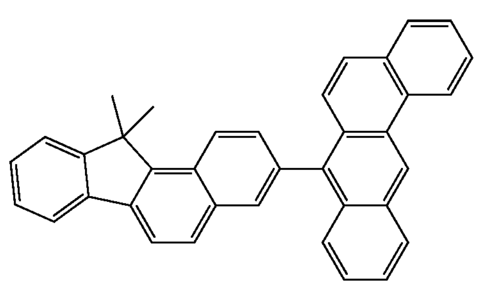

-continued
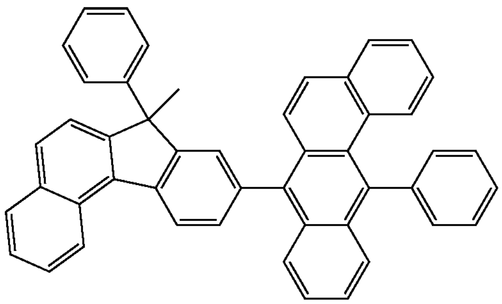
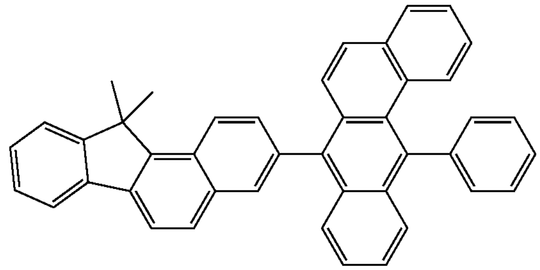
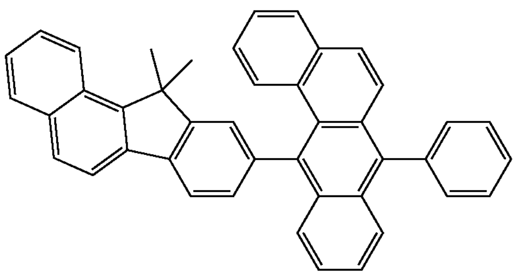
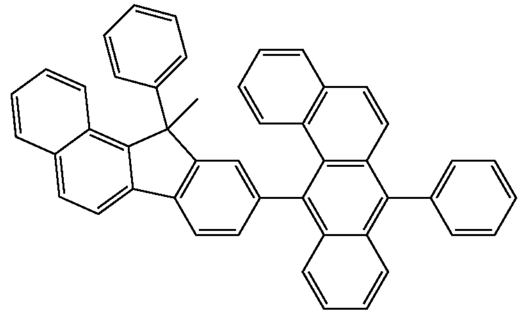
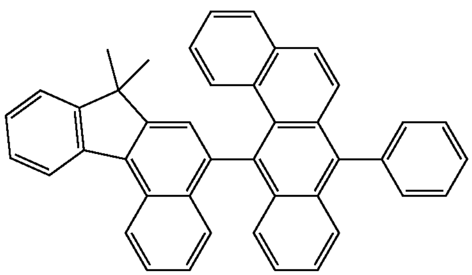
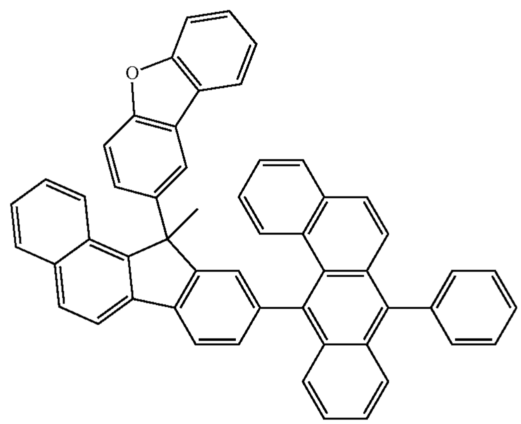
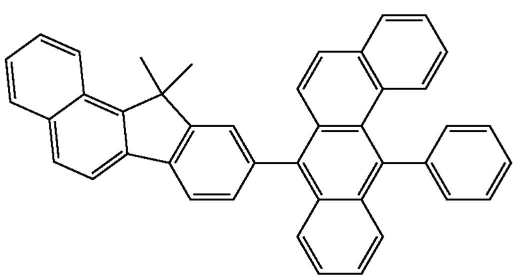
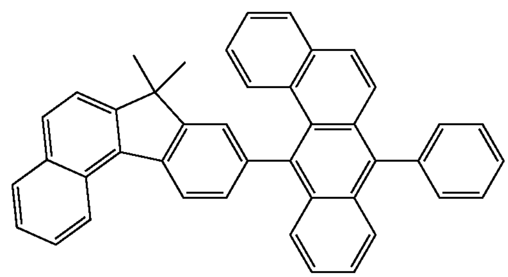
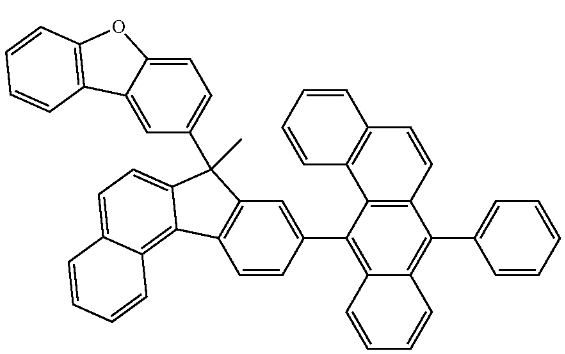
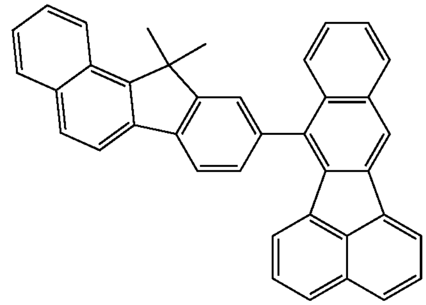

-continued
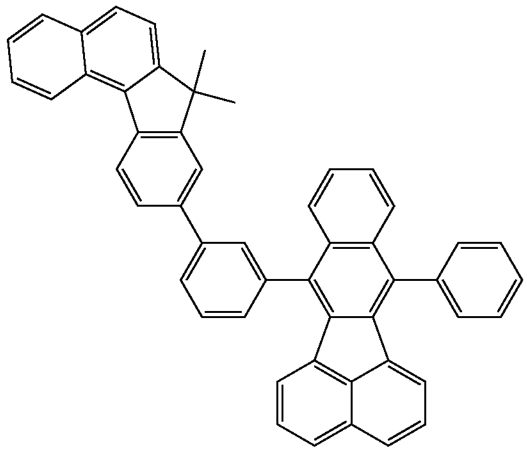
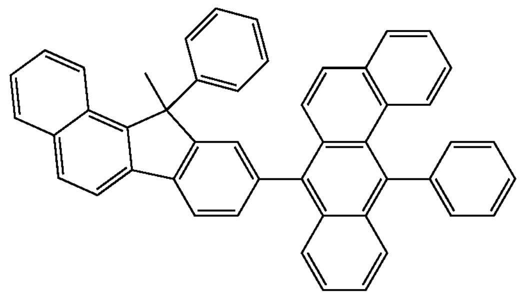
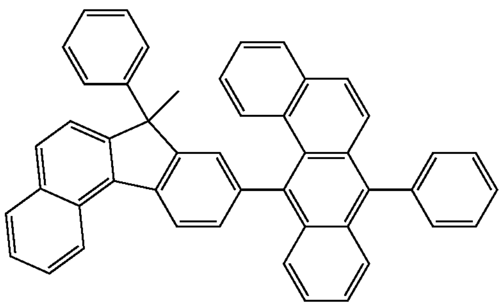
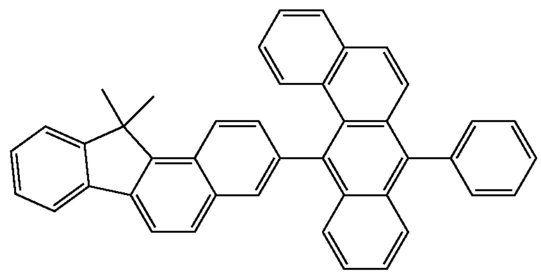
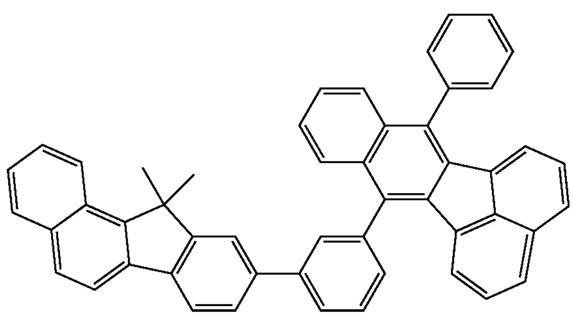
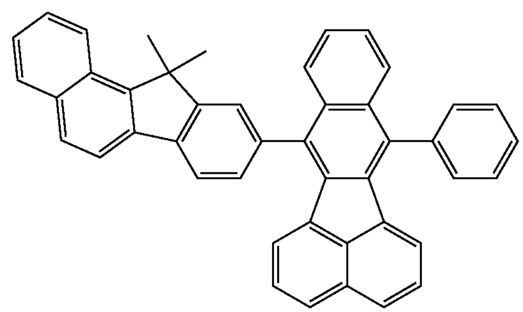
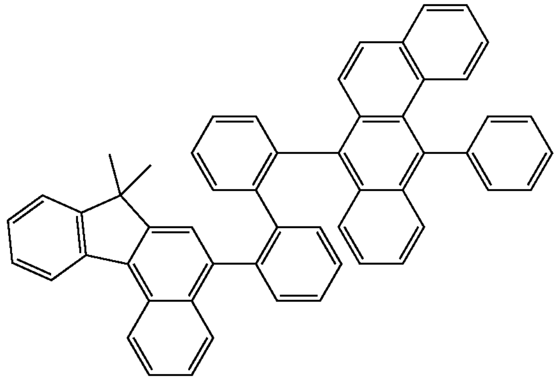
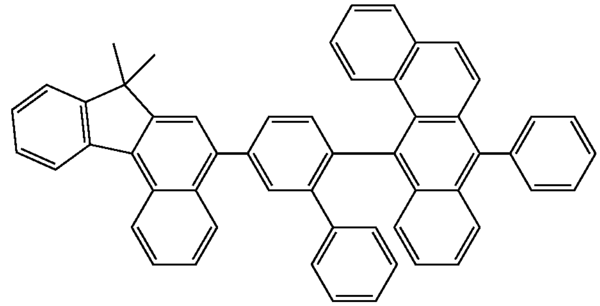

-continued
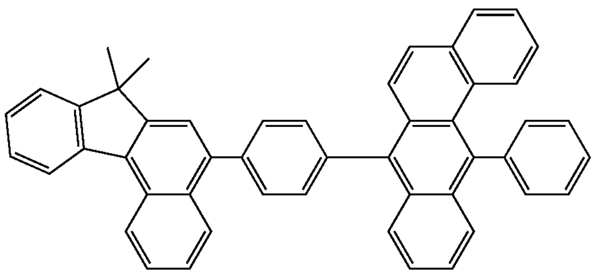
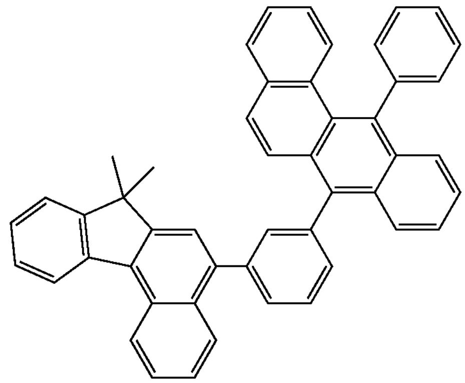
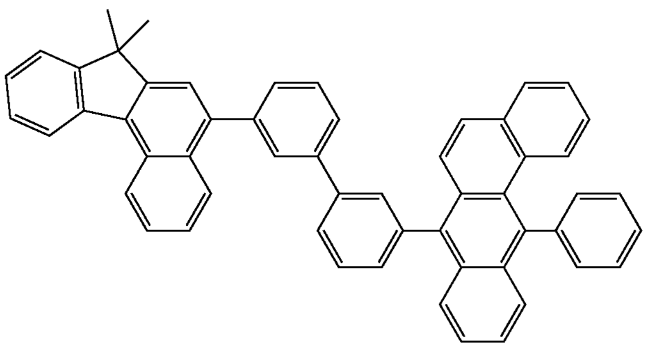
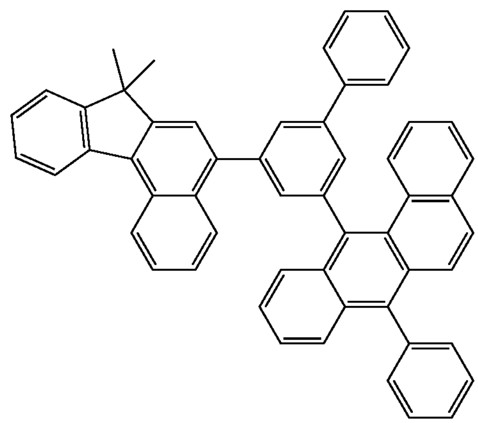
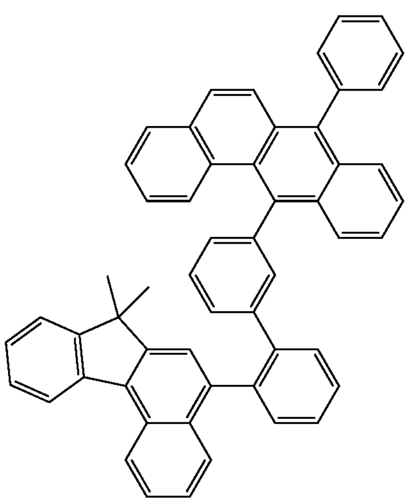
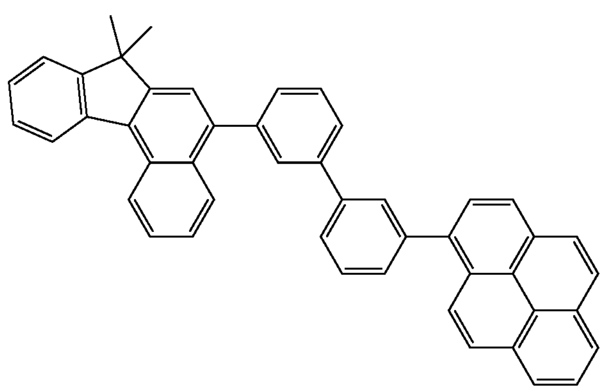

-continued
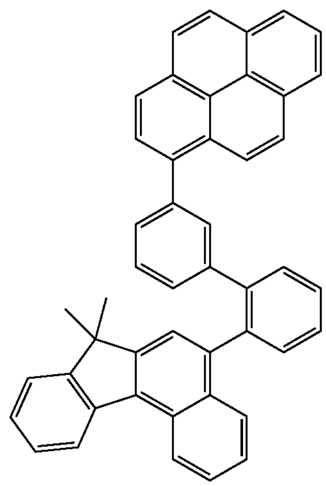
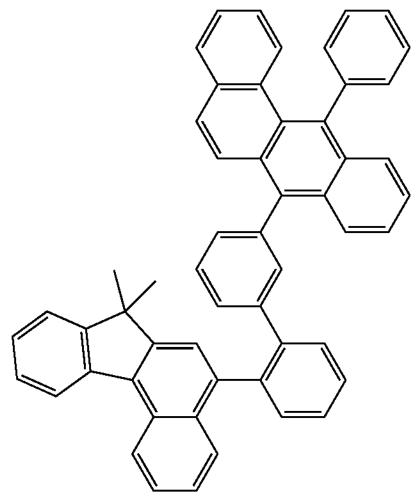
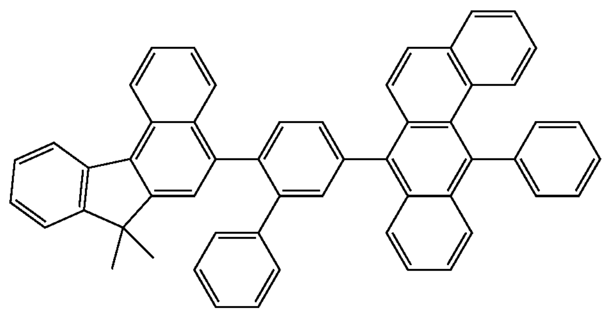
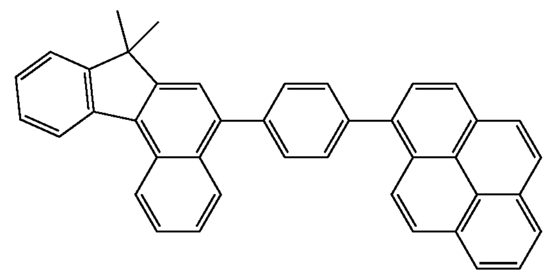
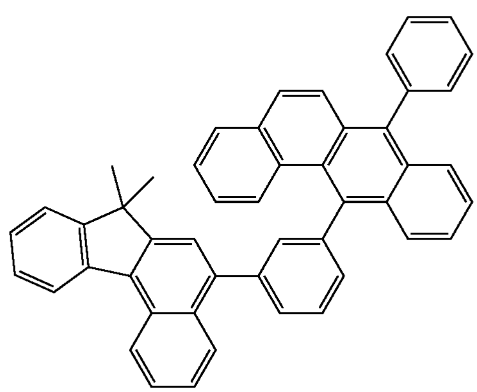
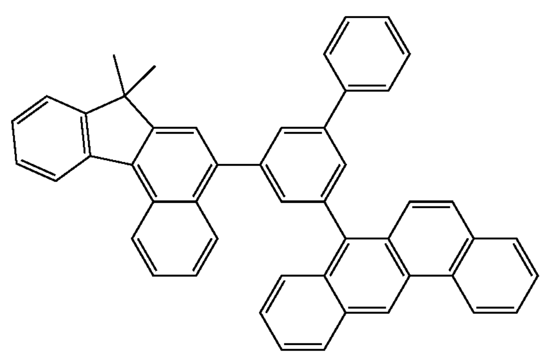
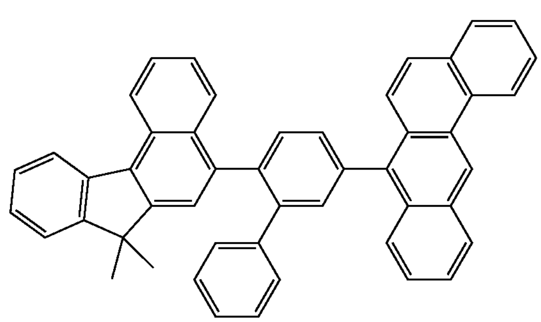
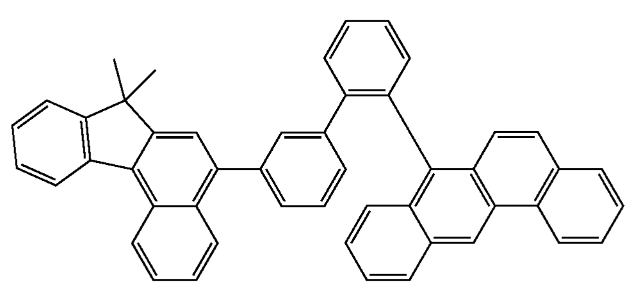

-continued
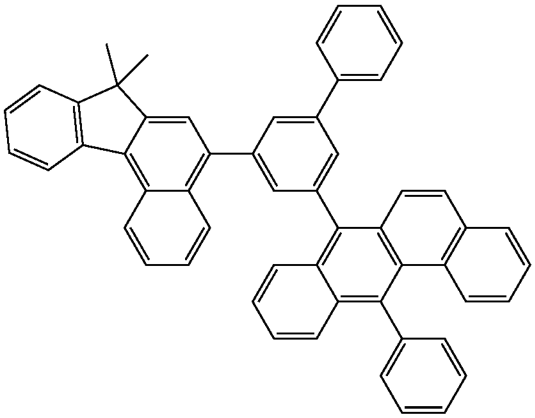
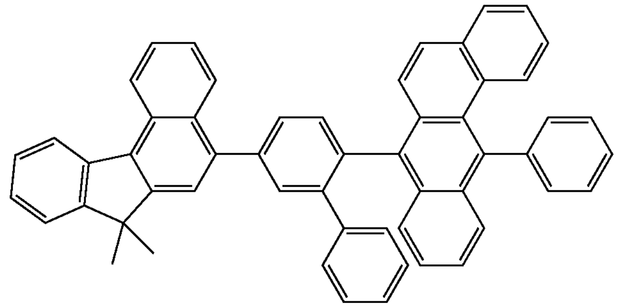
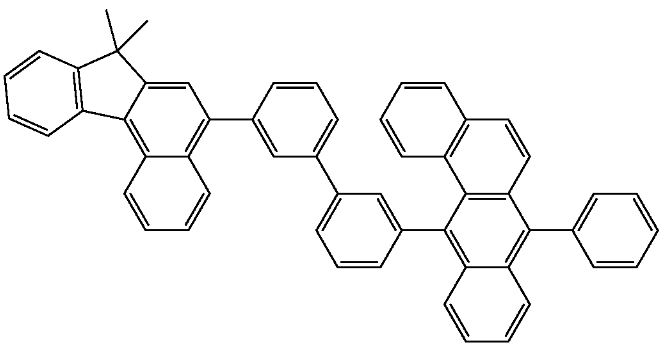
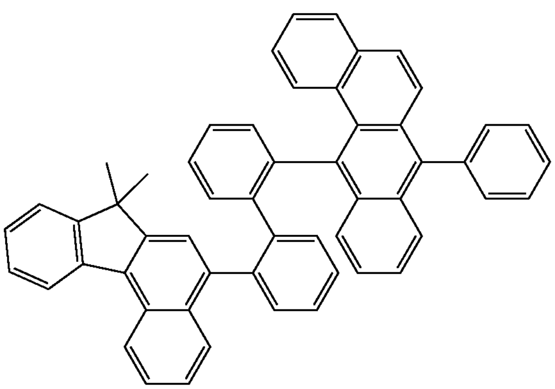
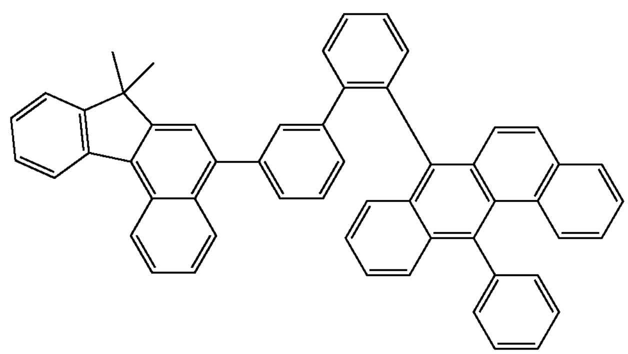
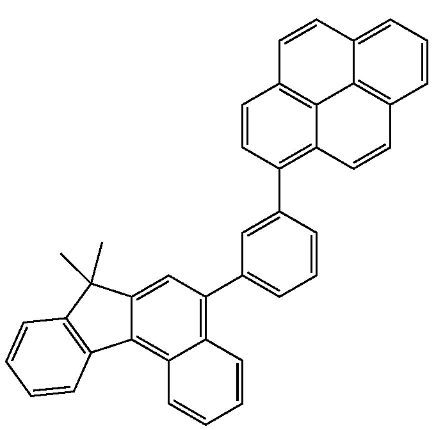
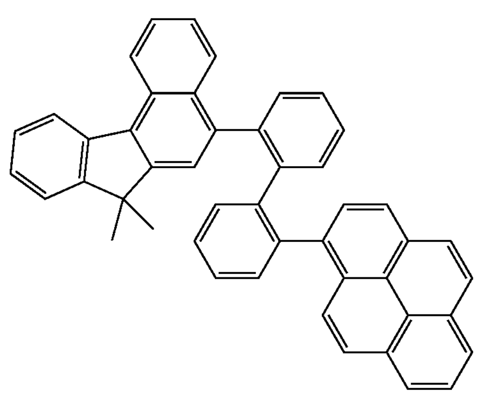

-continued
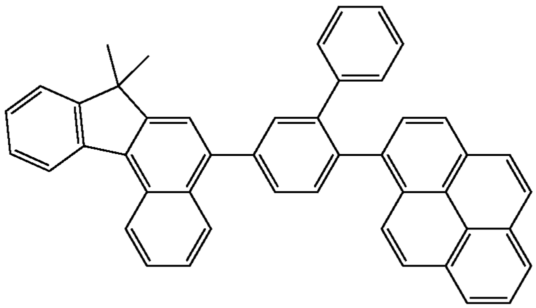
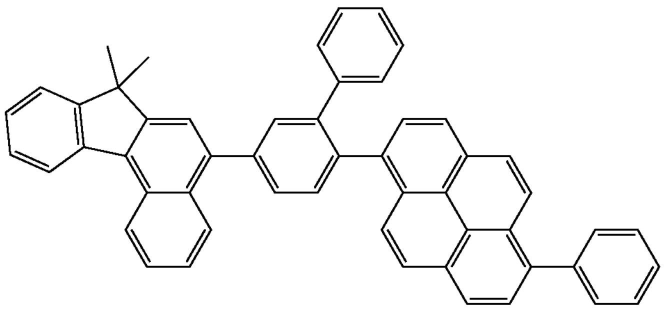
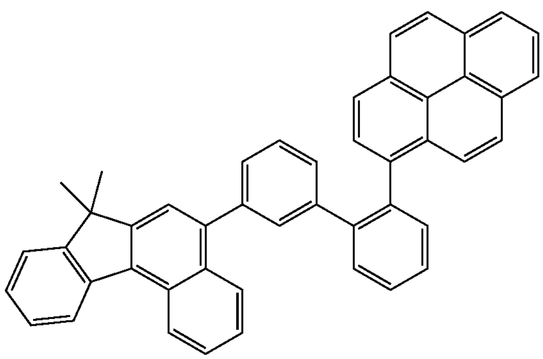
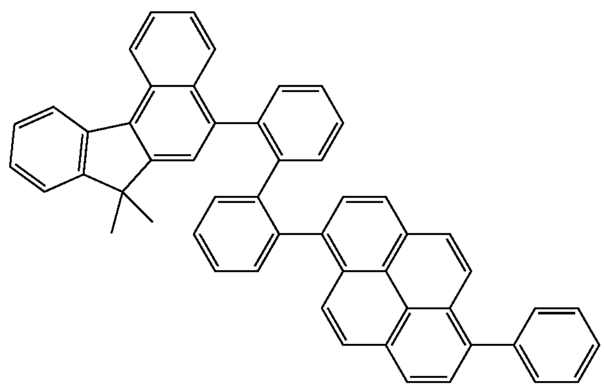
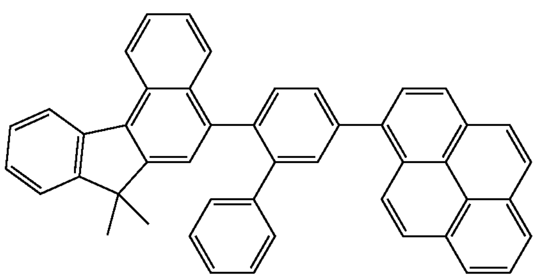
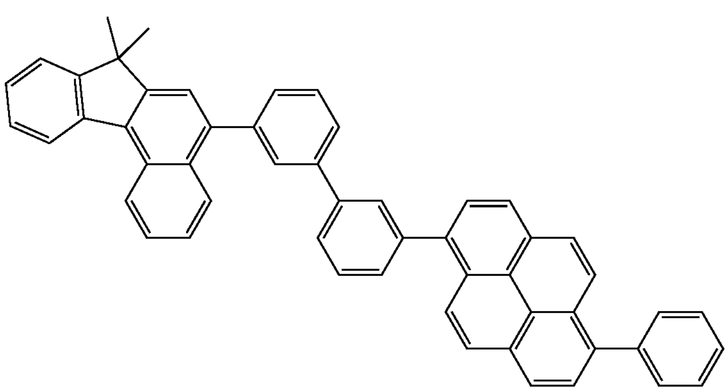

-continued
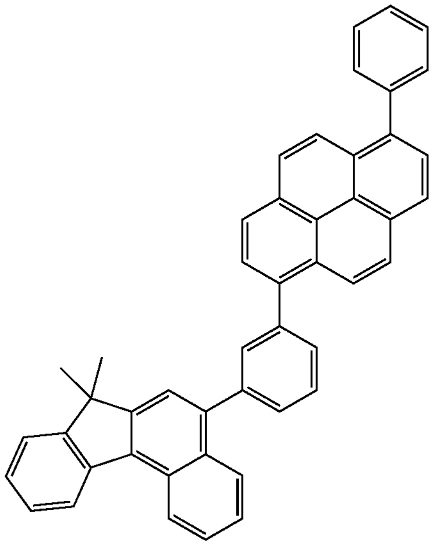
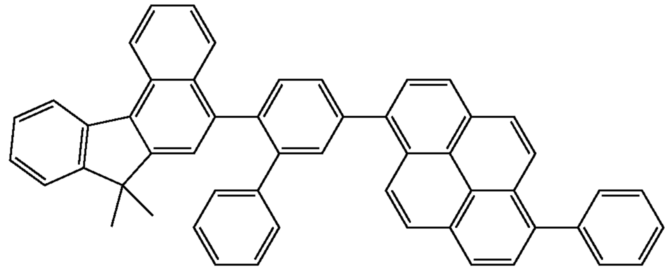
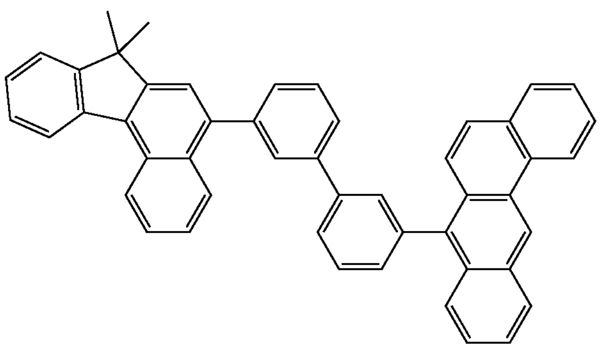
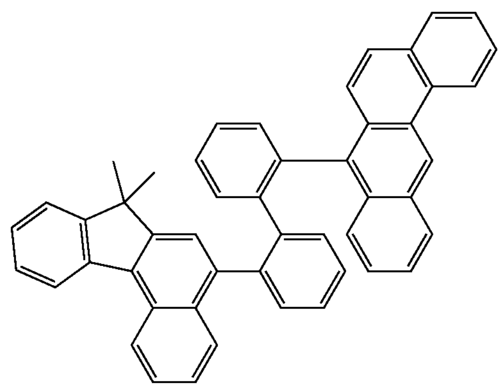
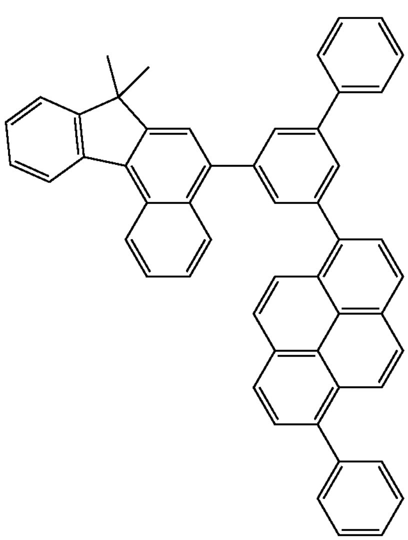
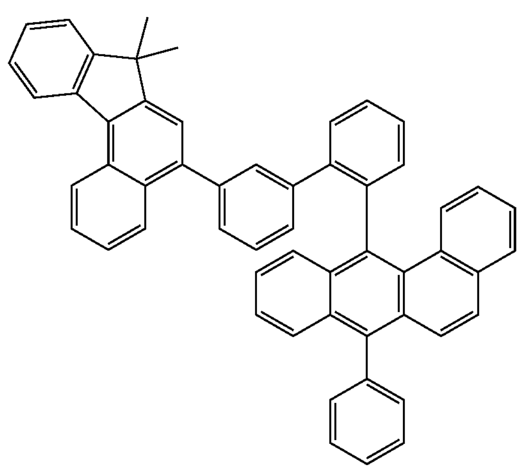

-continued
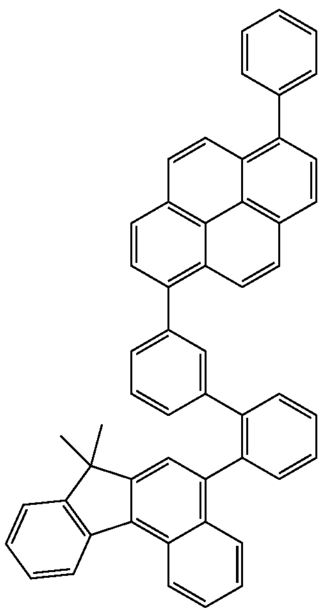
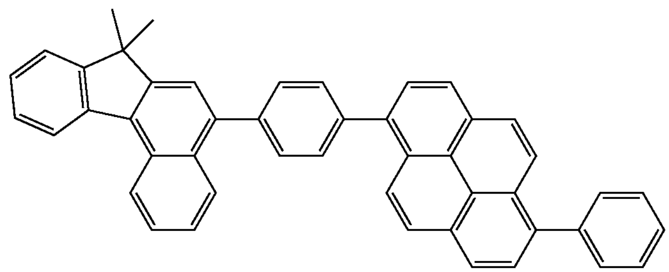
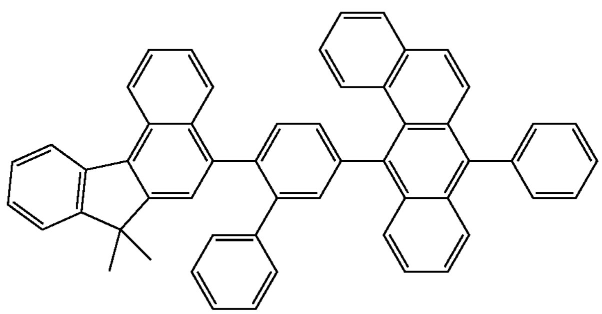
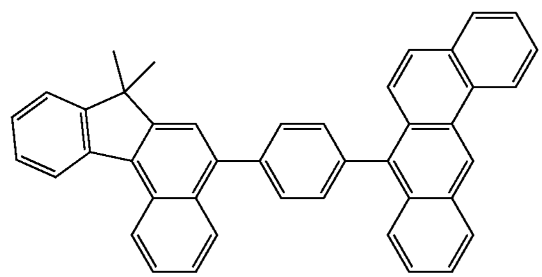
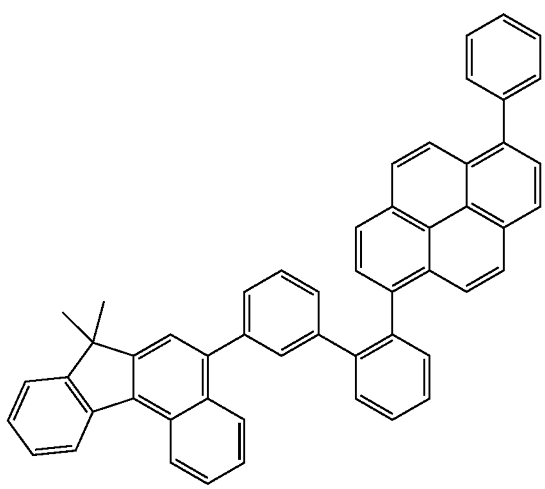
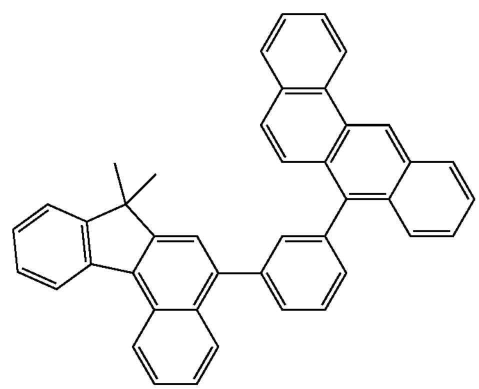
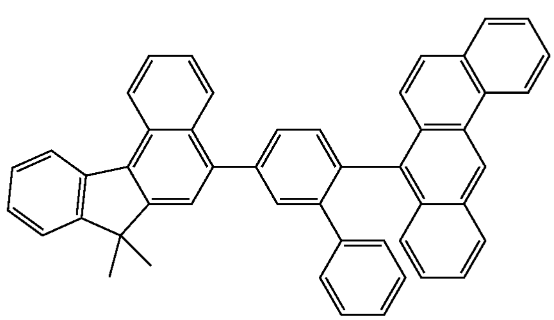
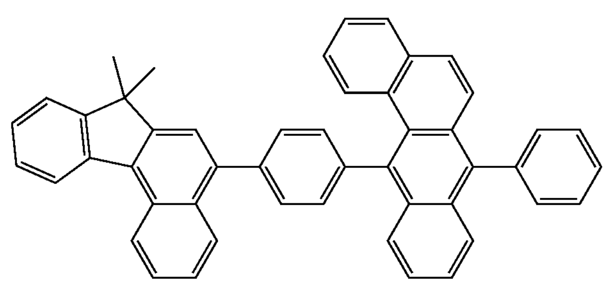

-continued
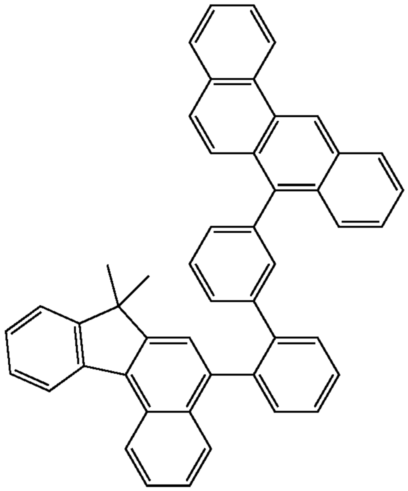
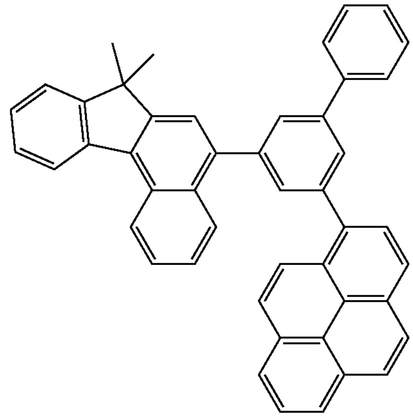
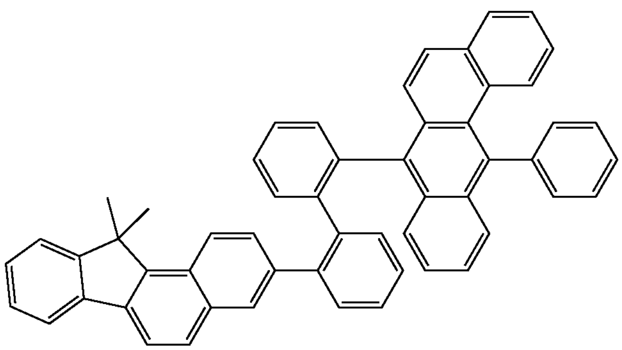
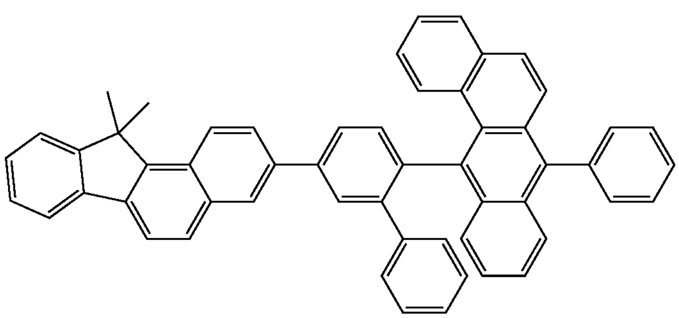
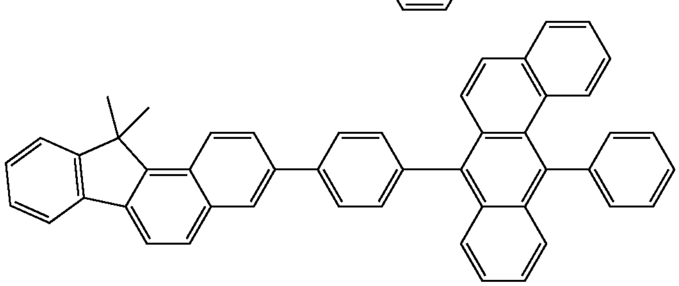

-continued
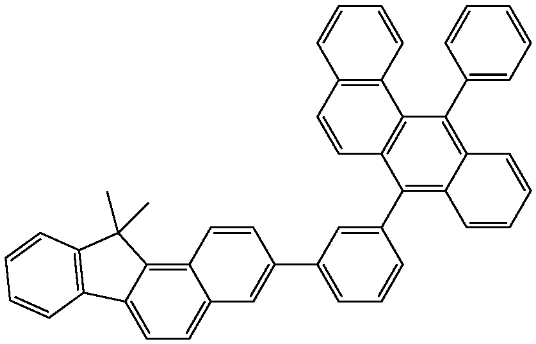
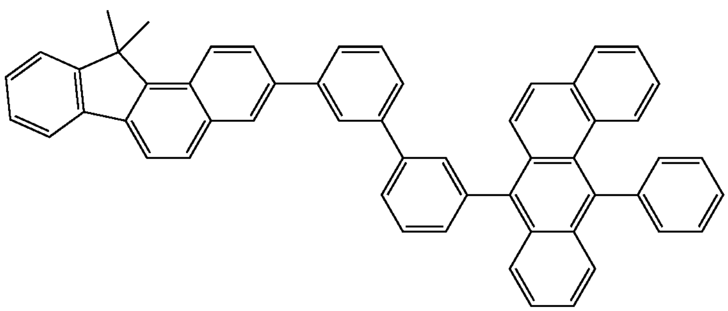
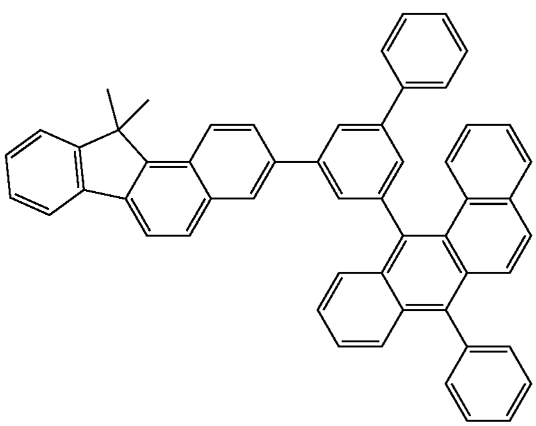
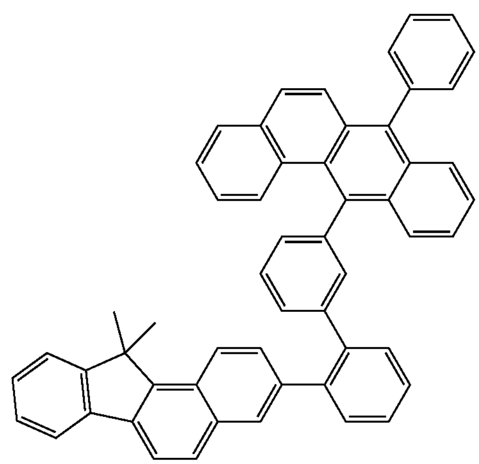
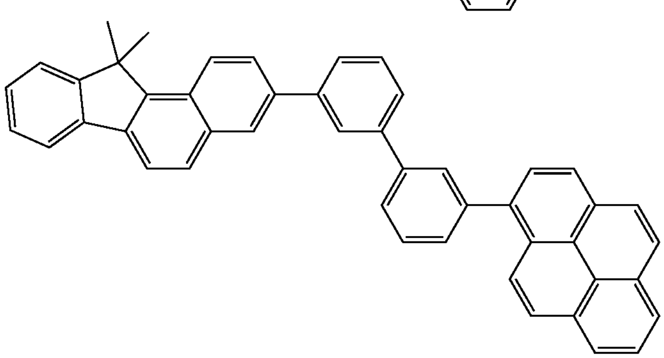

-continued
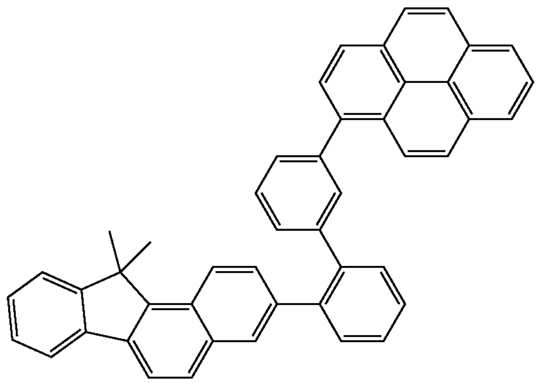
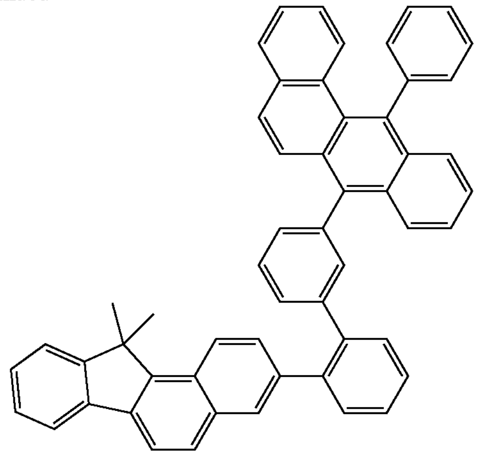
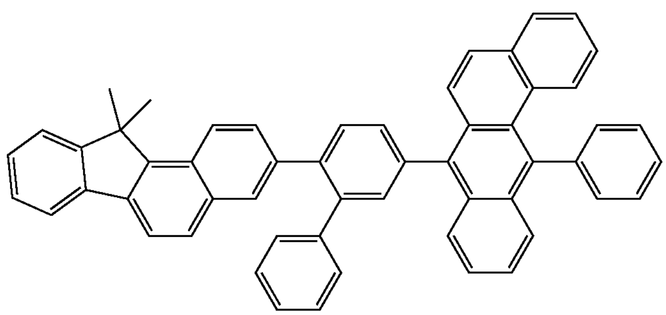
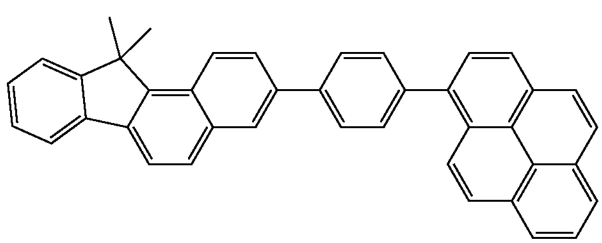
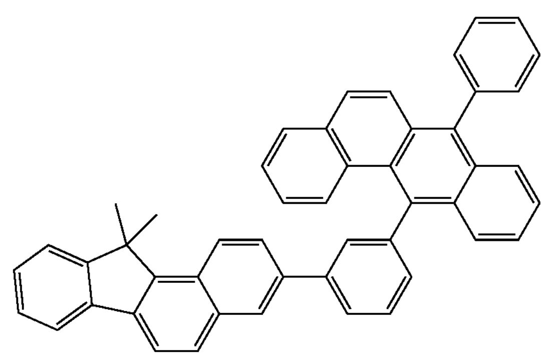
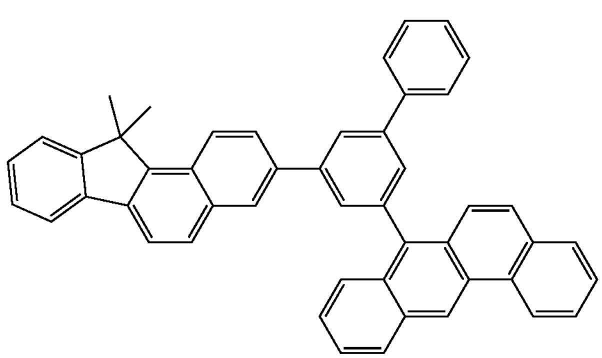

-continued
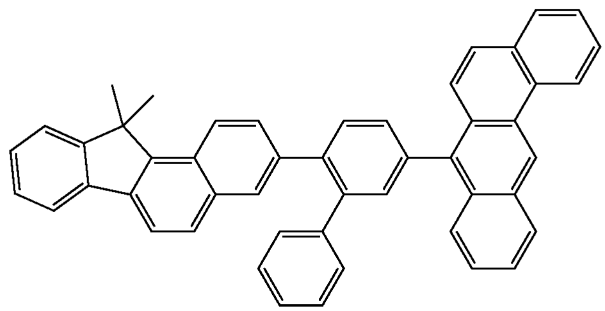
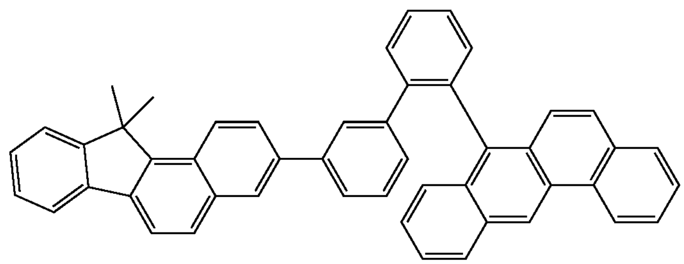
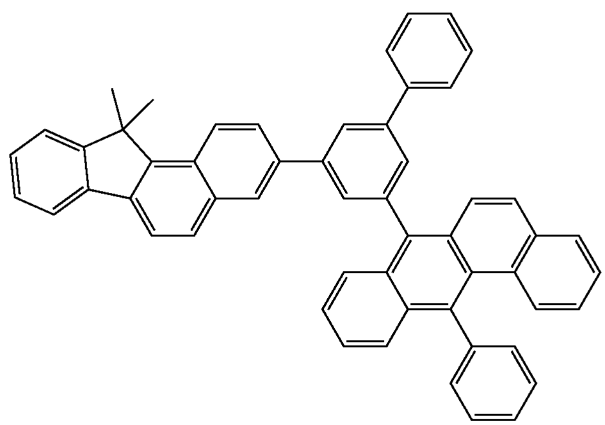
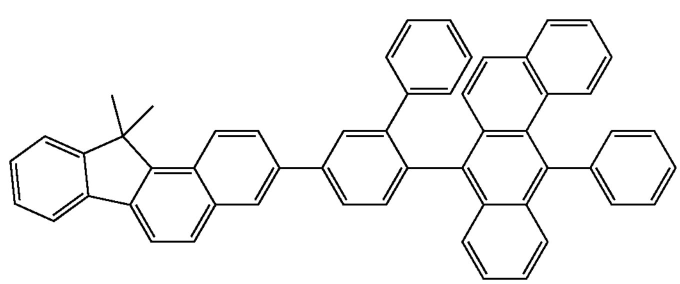
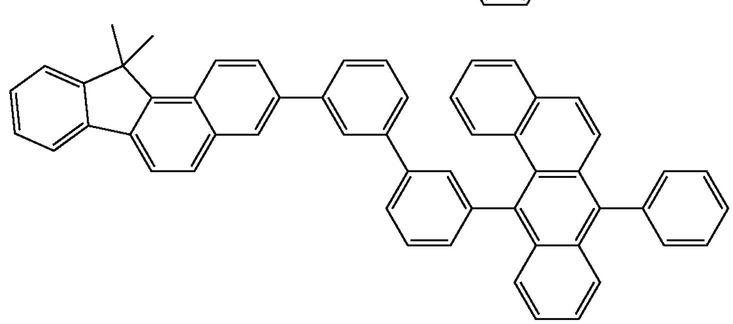

-continued
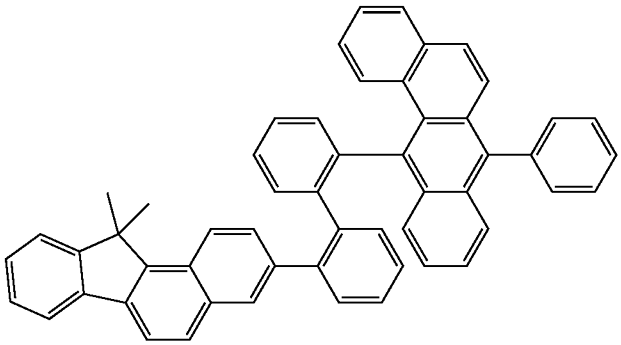
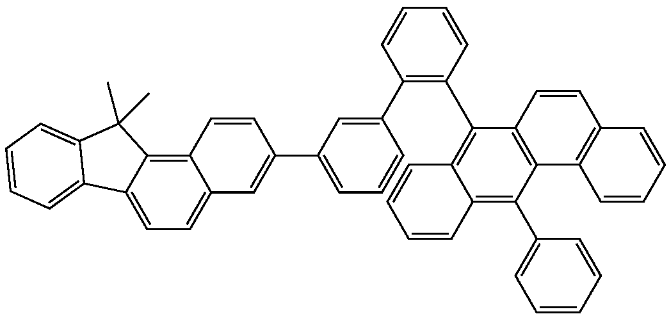
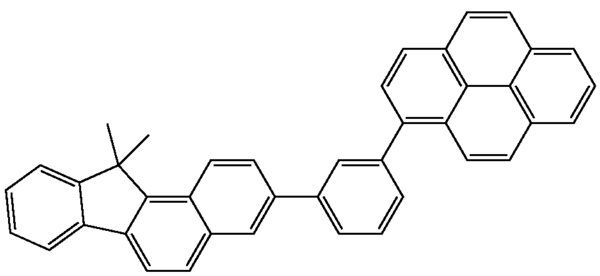
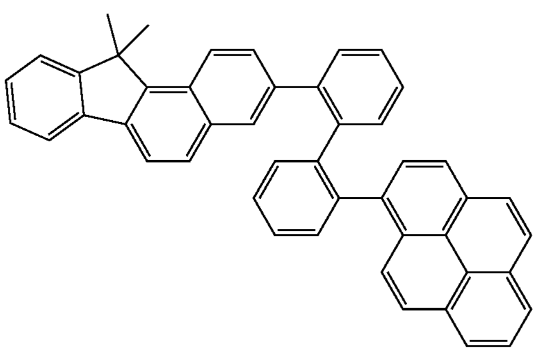
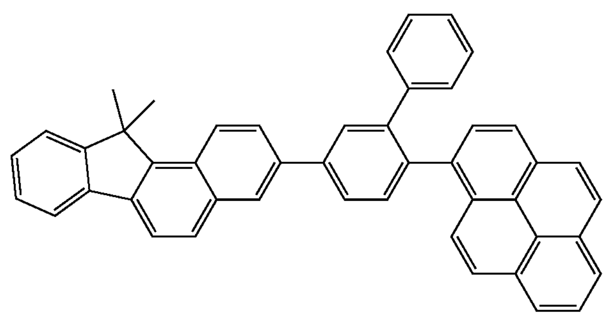
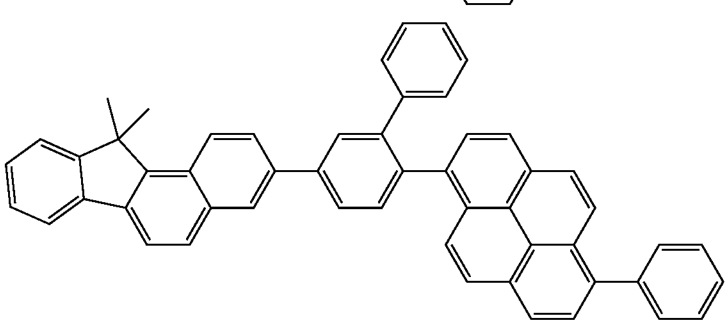

-continued
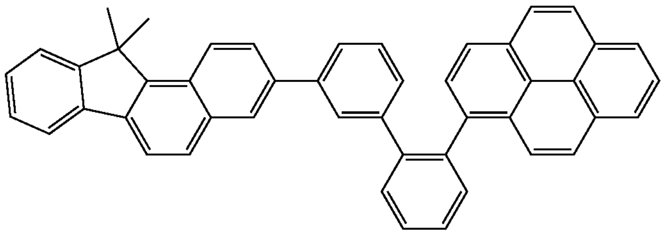
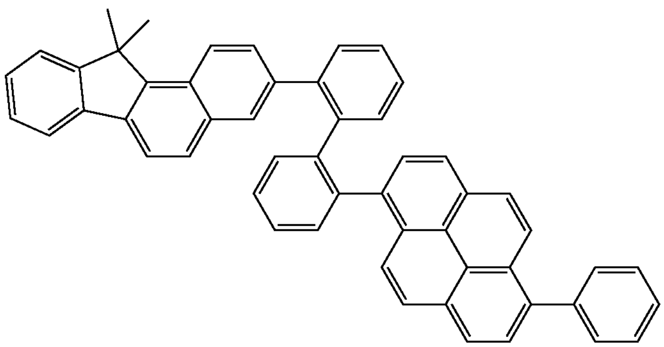
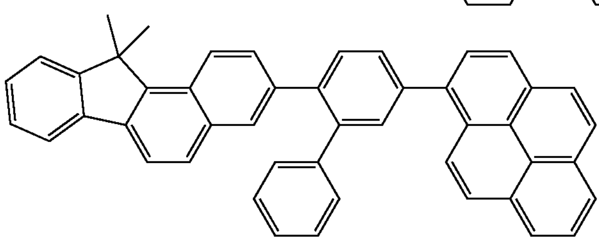
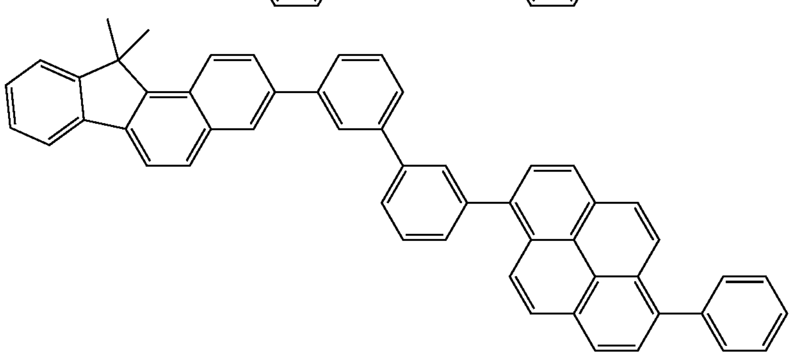
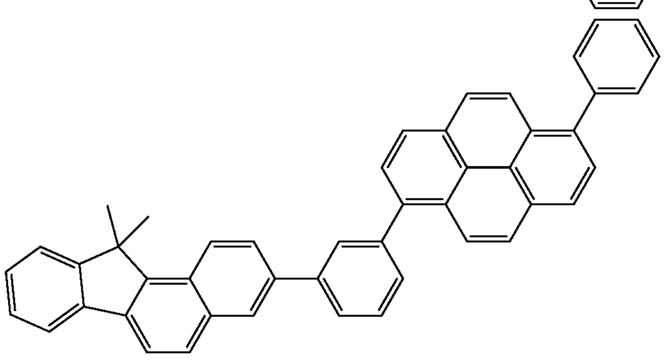
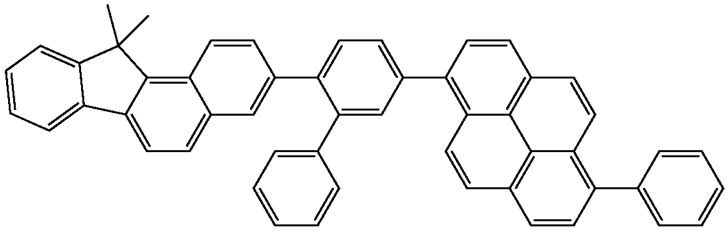

-continued
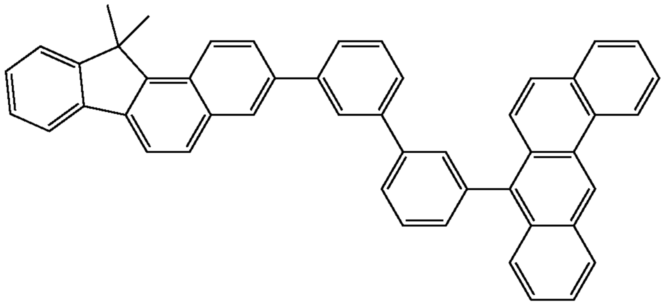
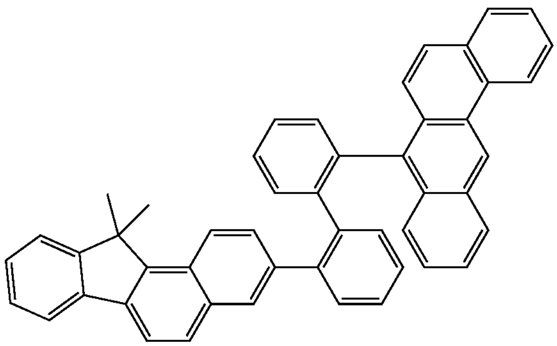
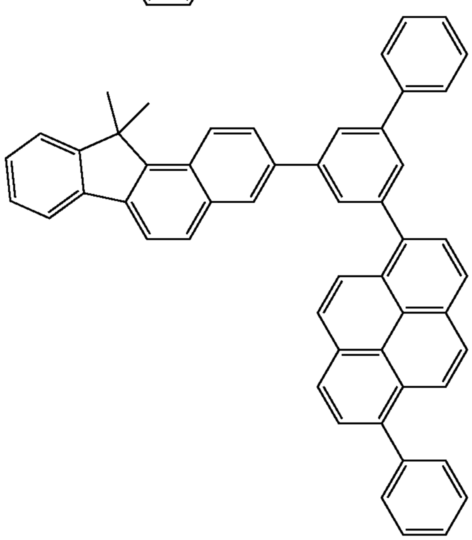
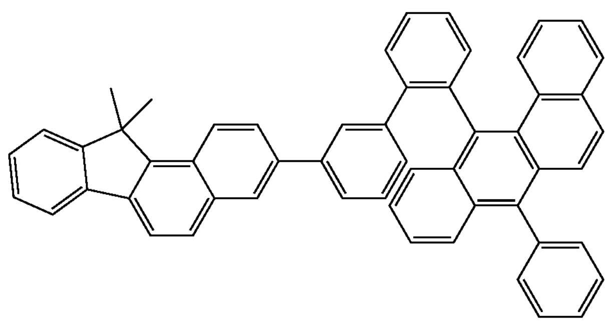
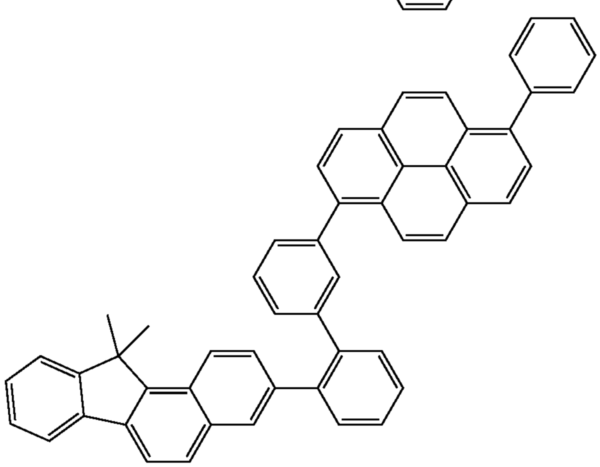

-continued
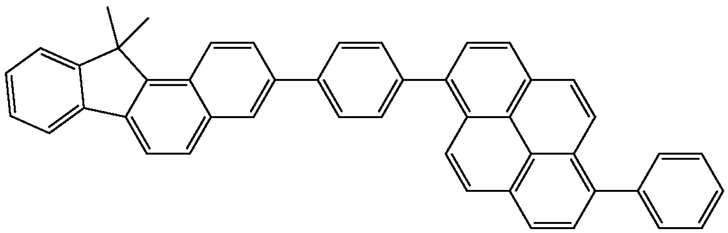
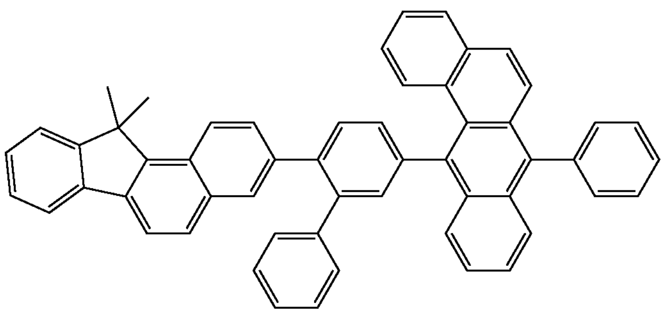
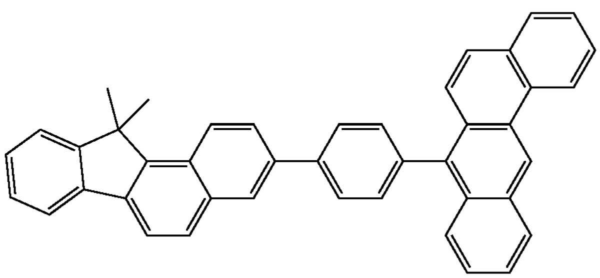
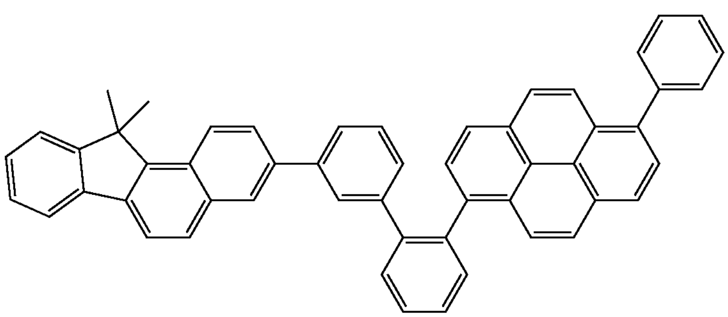
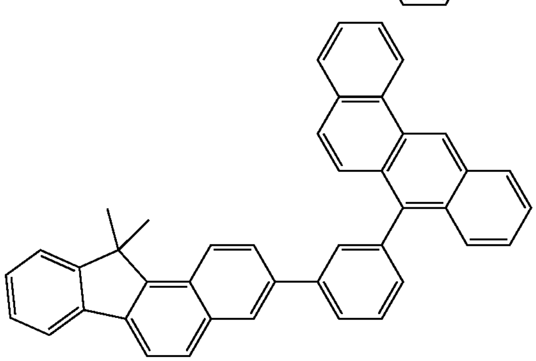
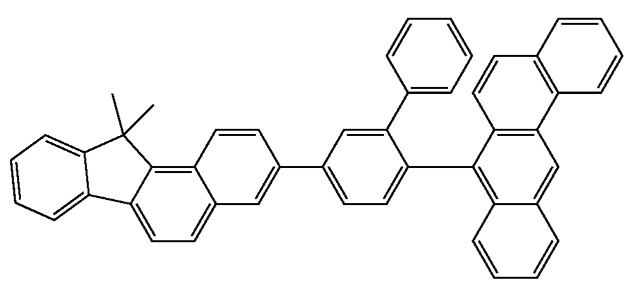

-continued
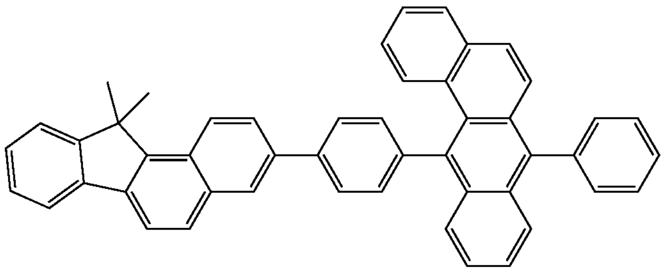
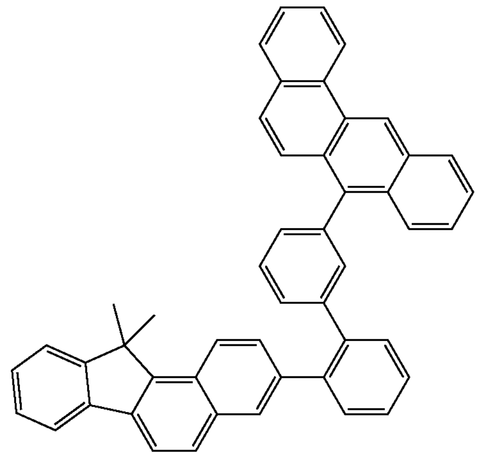
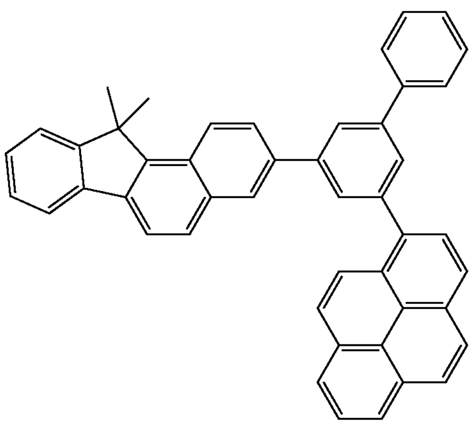
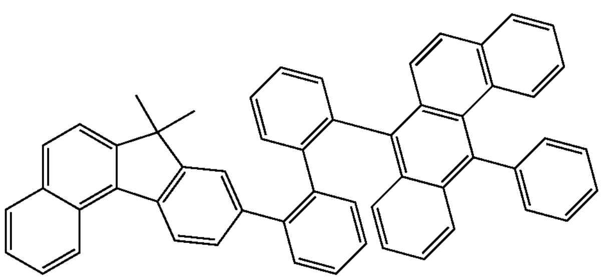
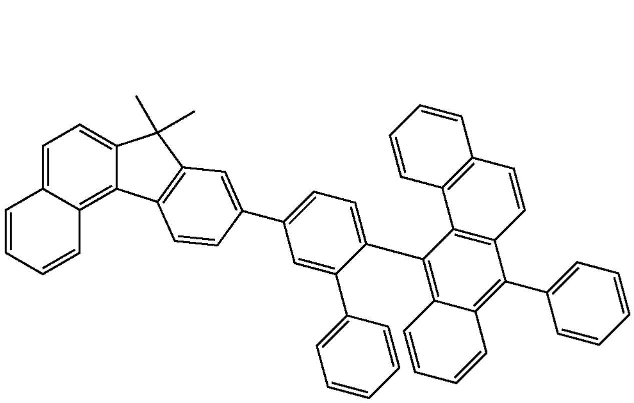

-continued
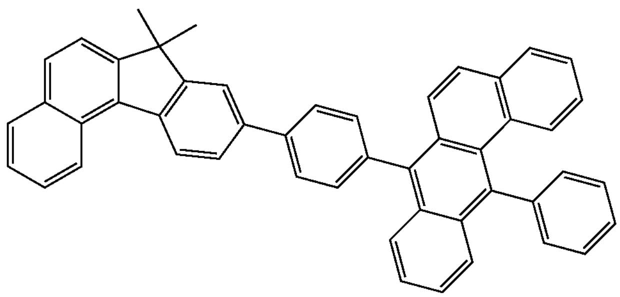
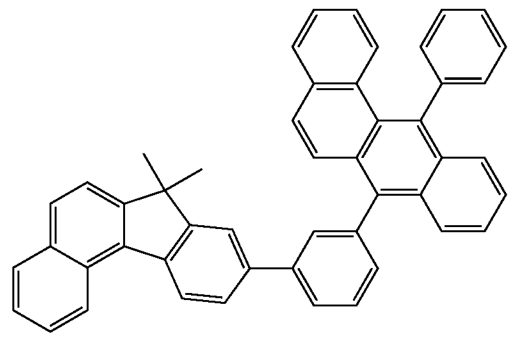
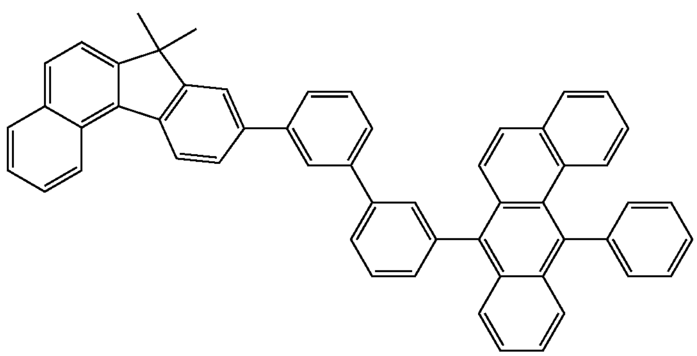
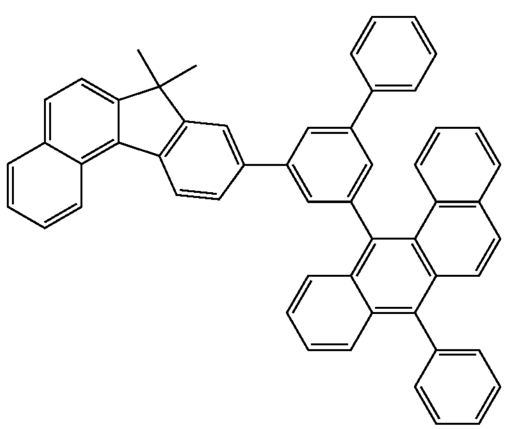
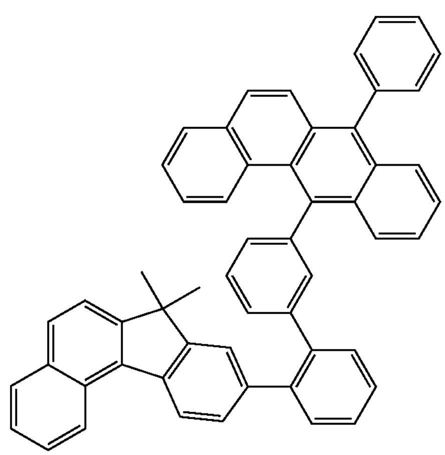
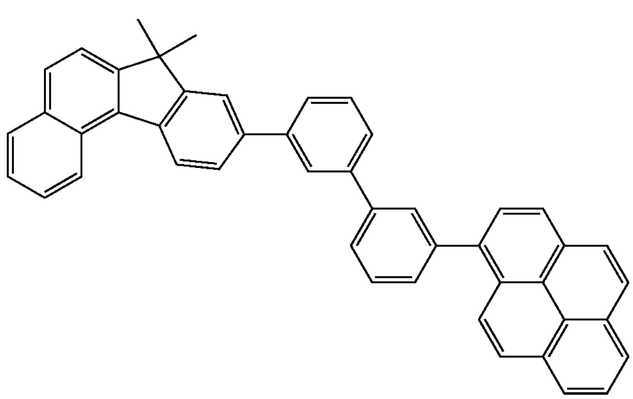
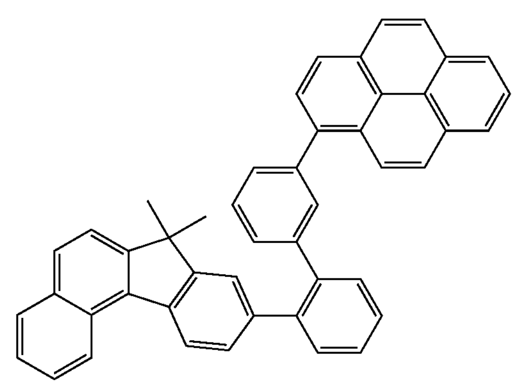

-continued
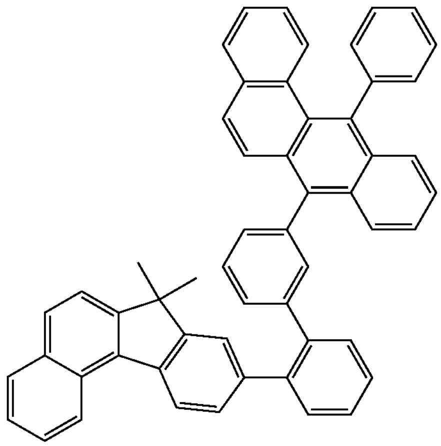
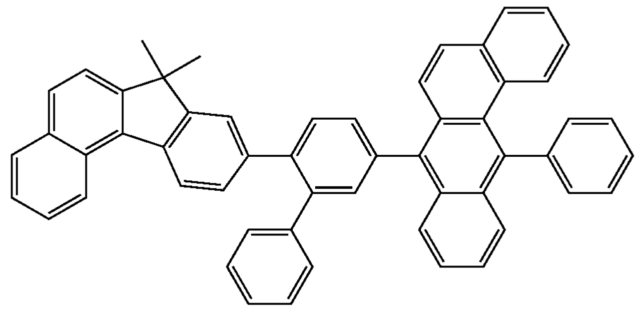
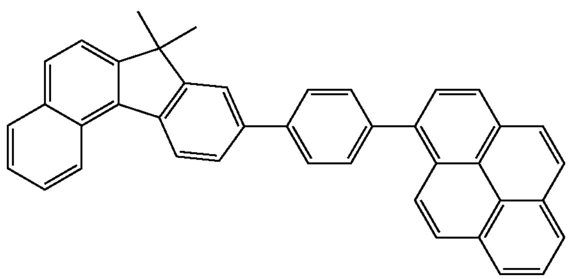
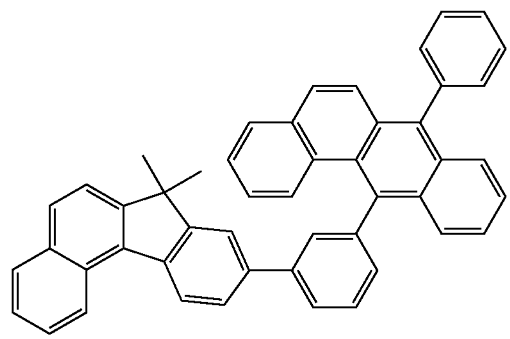
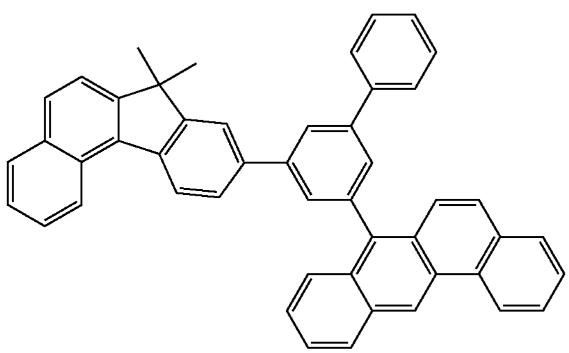
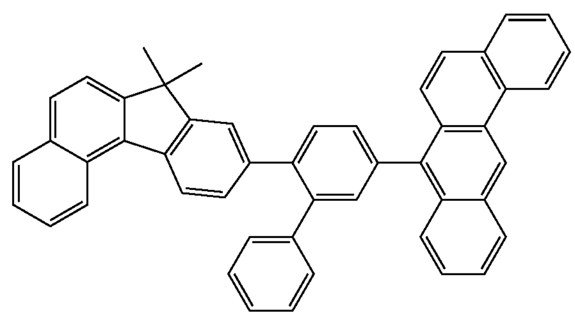
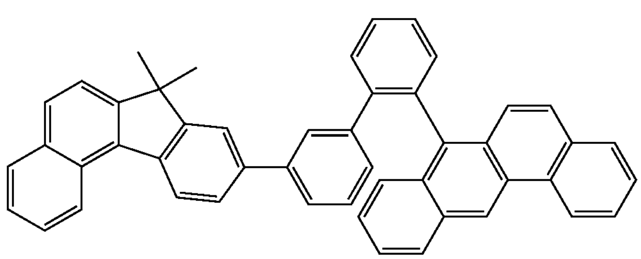

-continued
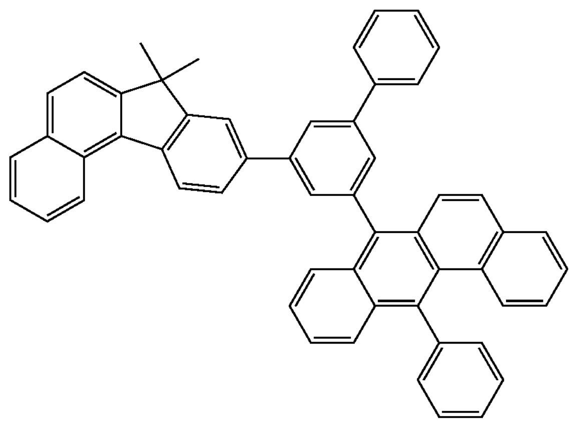
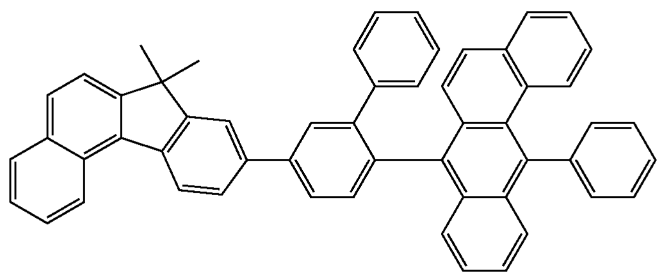
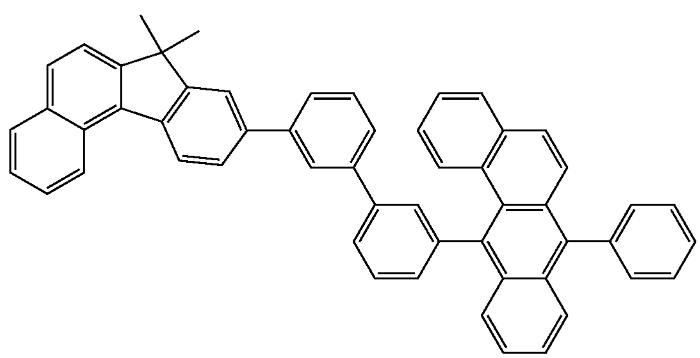
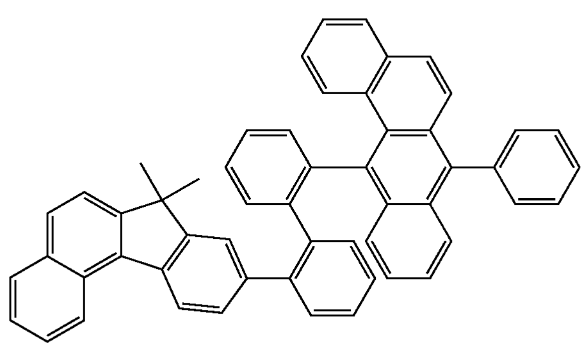

-continued
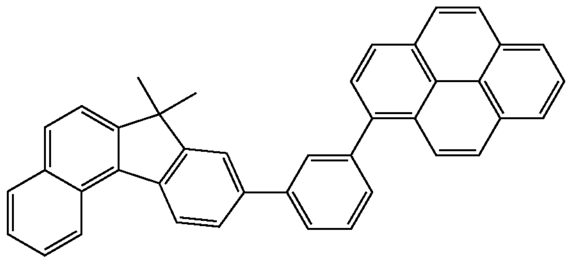
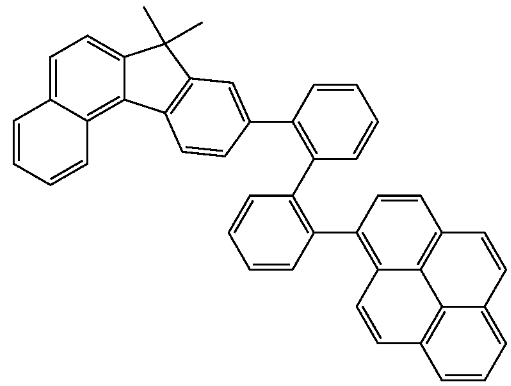
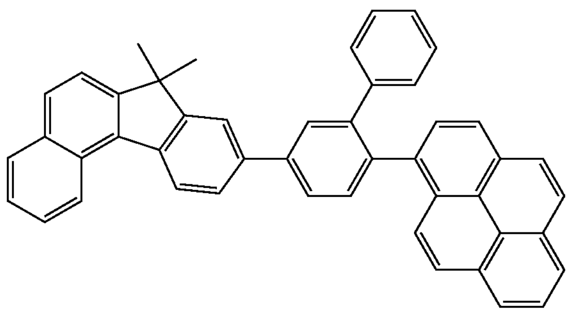
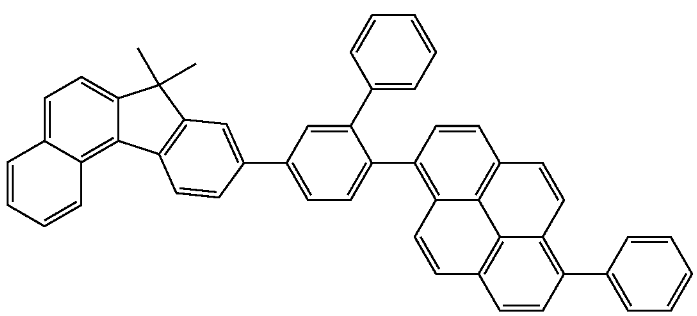
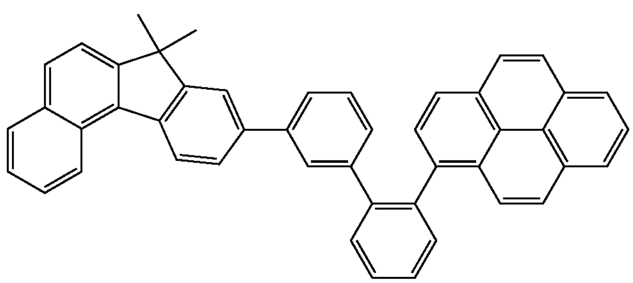
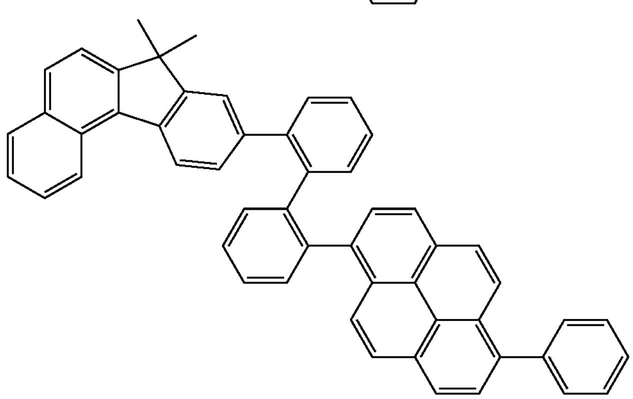

-continued
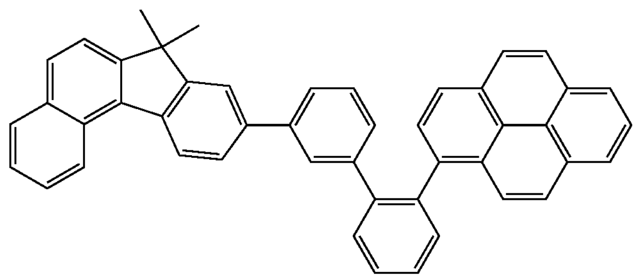
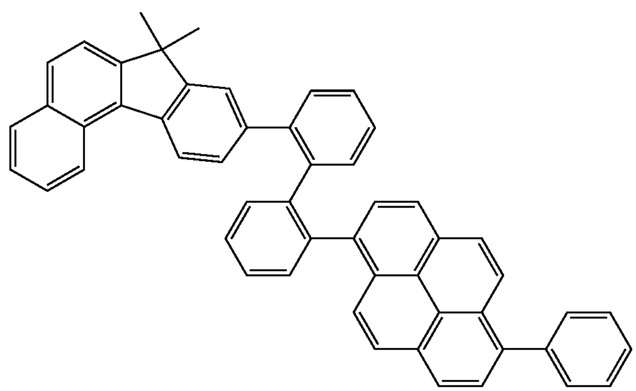
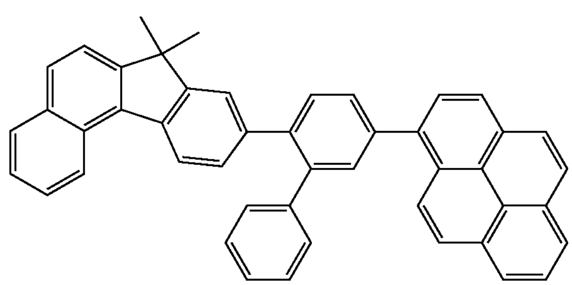
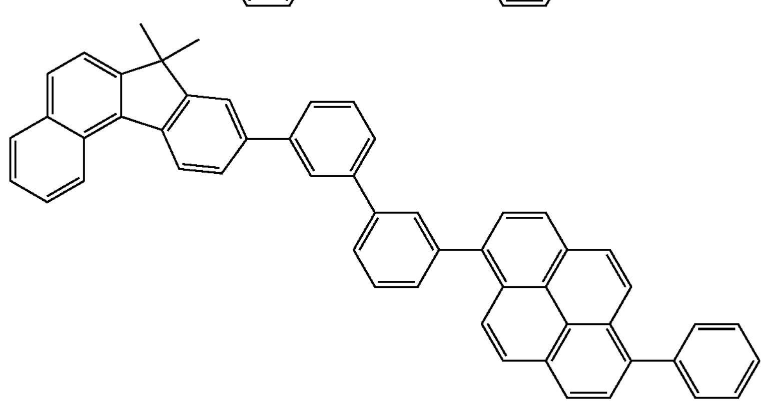
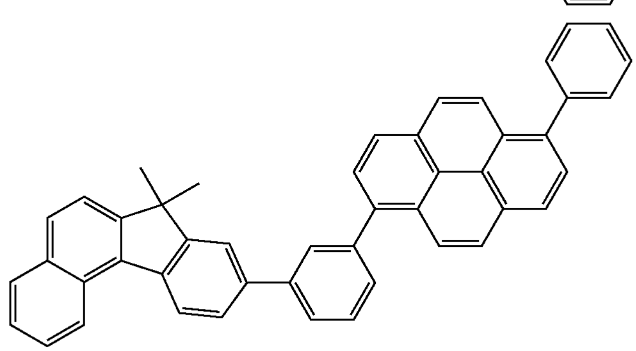

-continued
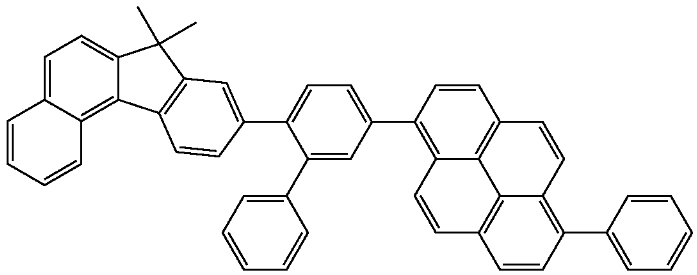
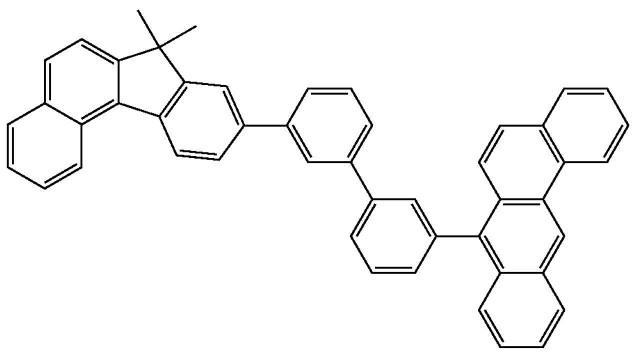
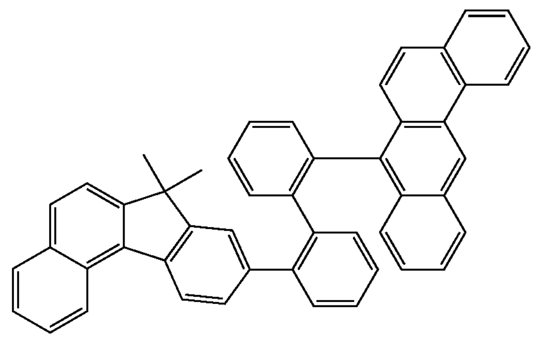
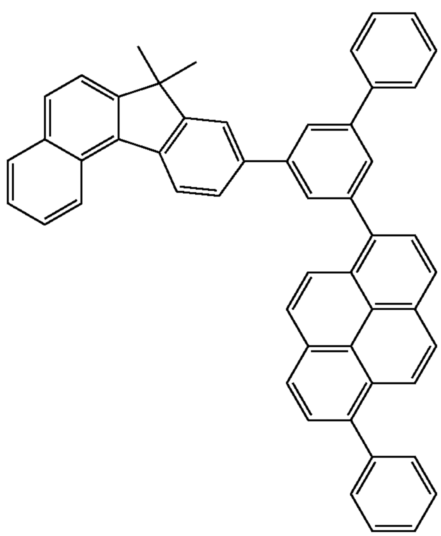
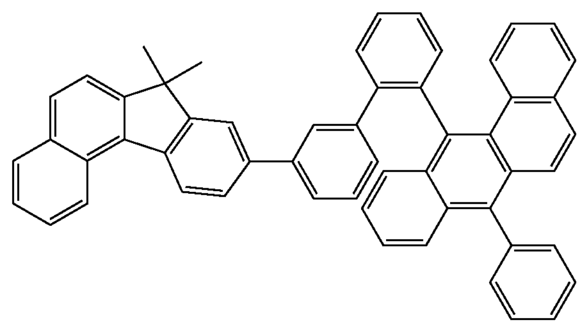
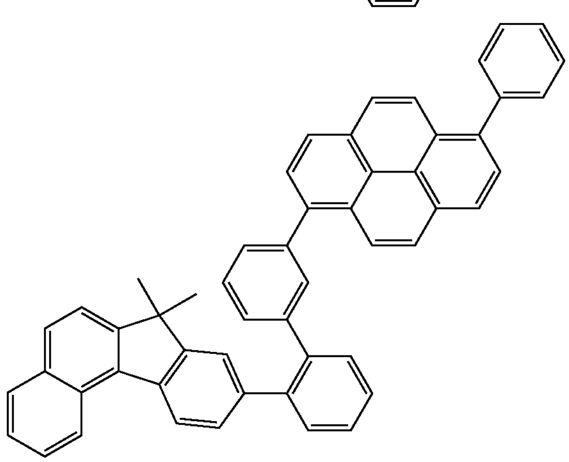

-continued
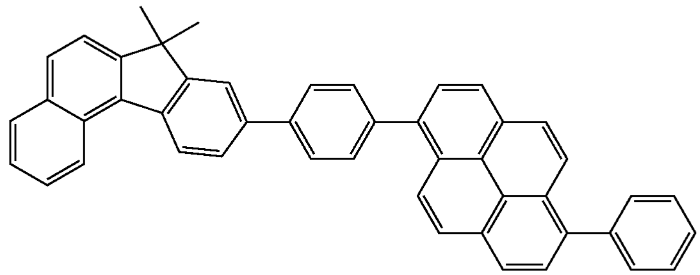
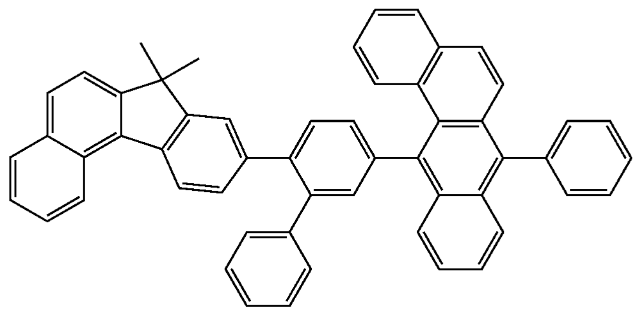
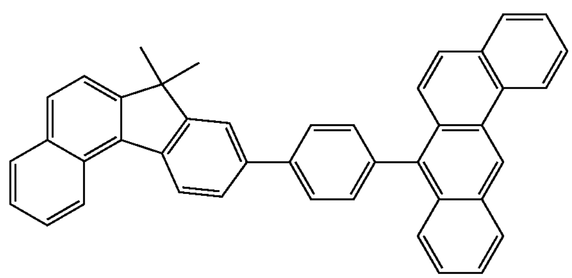
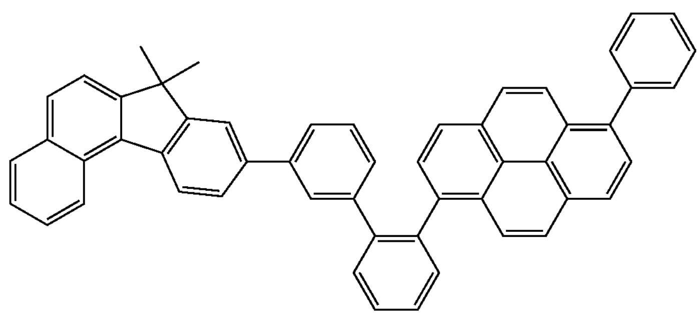
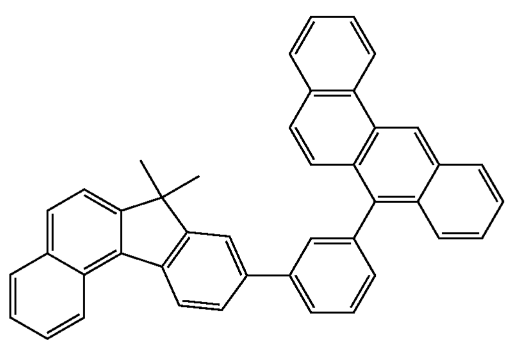
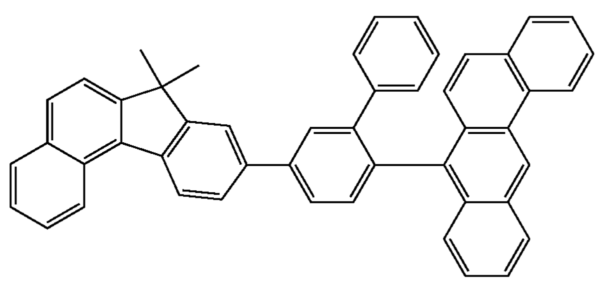

-continued
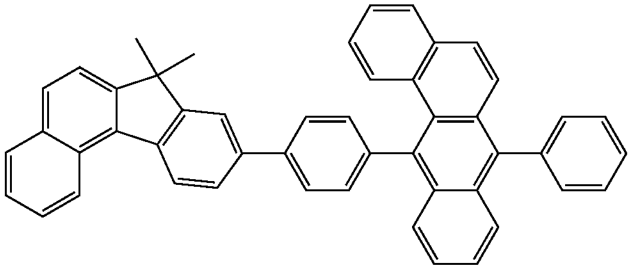
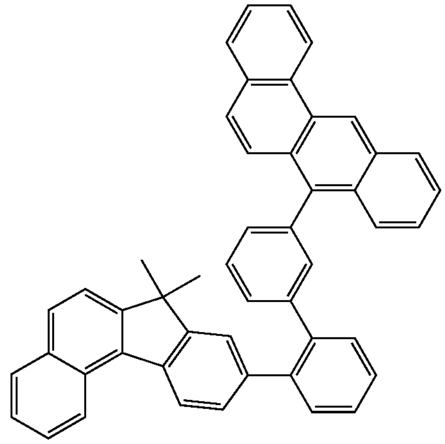
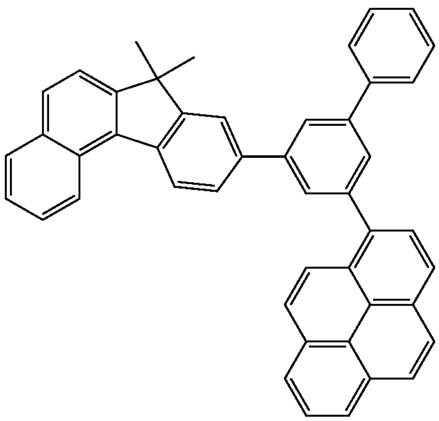
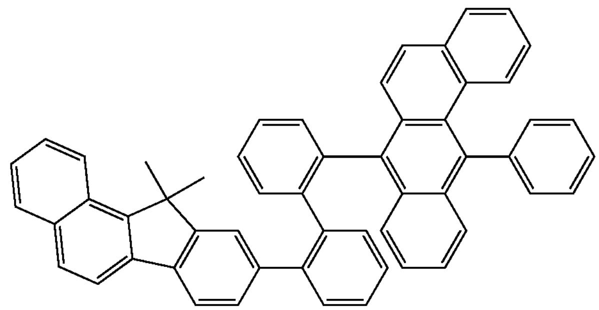
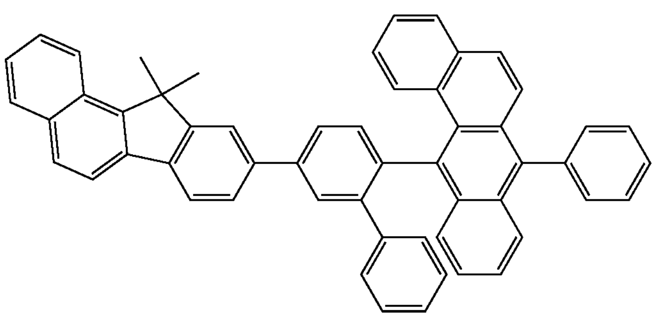
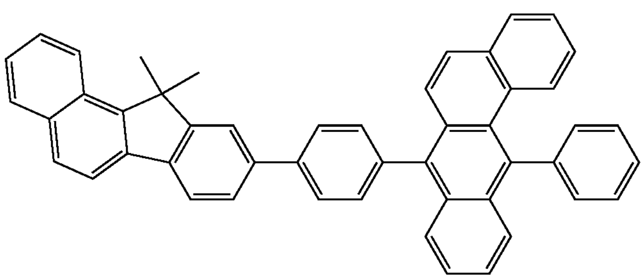
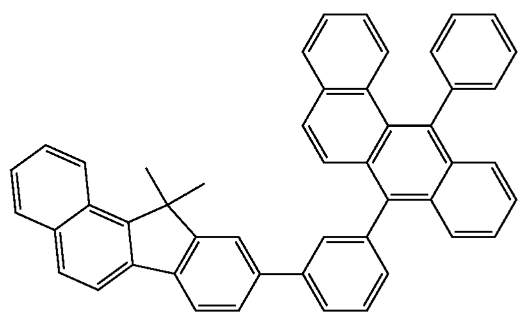

-continued
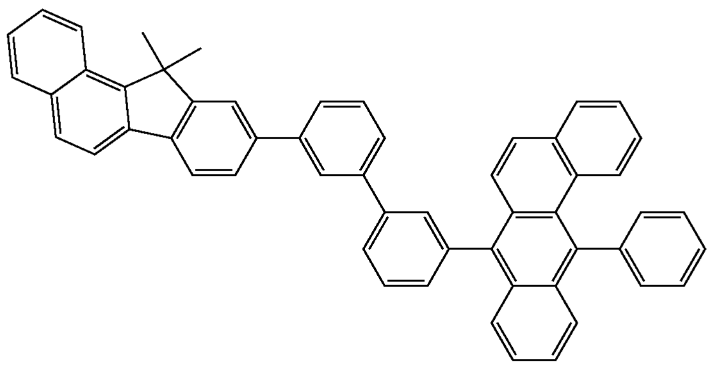
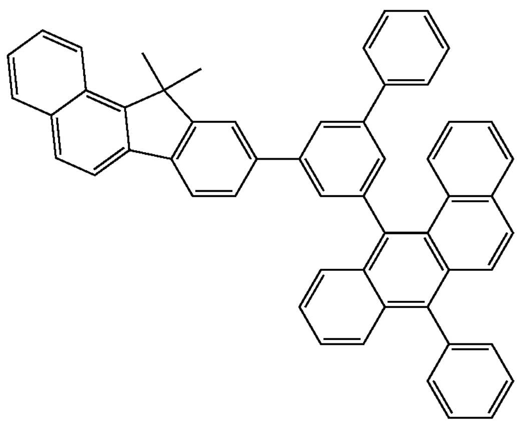
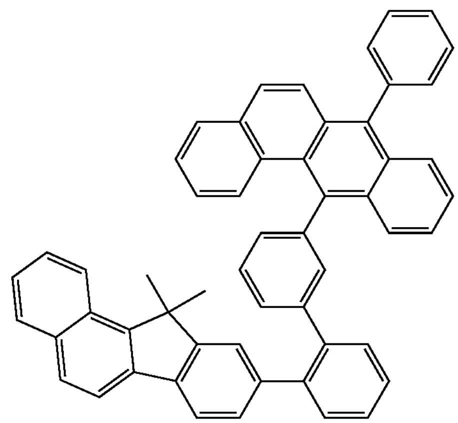
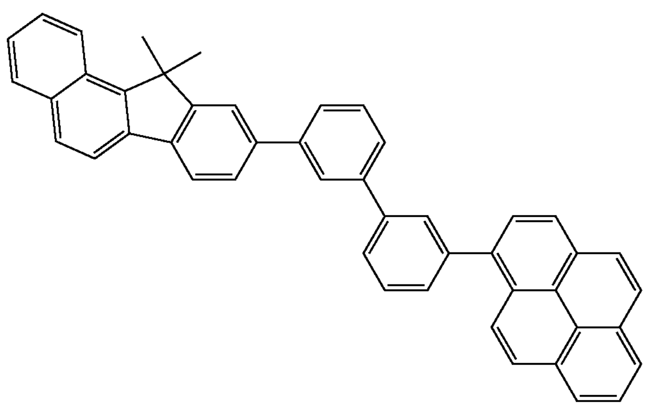
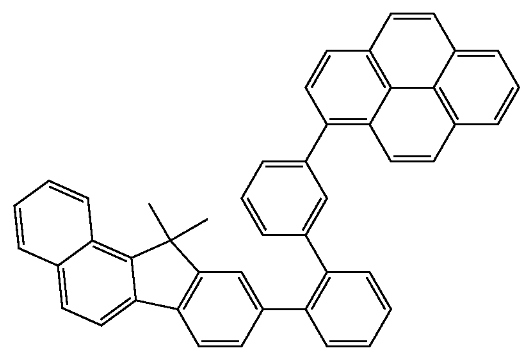
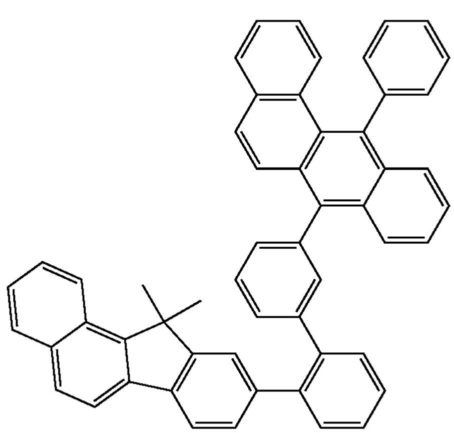
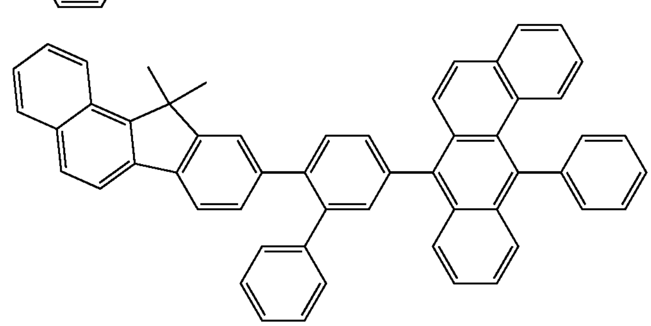

-continued
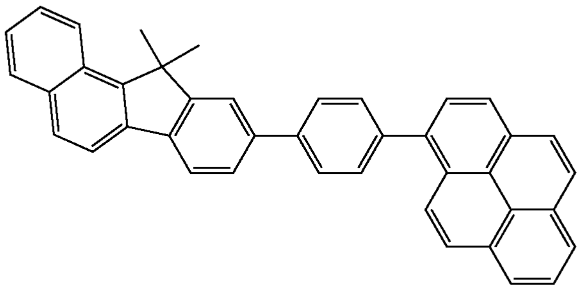
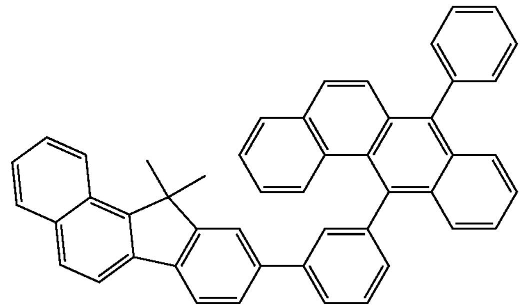
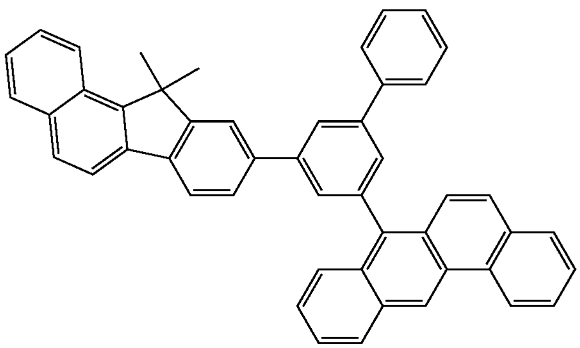
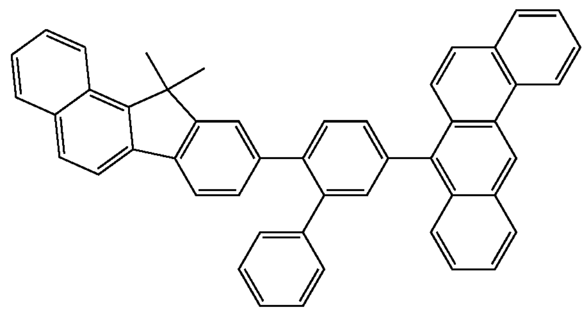
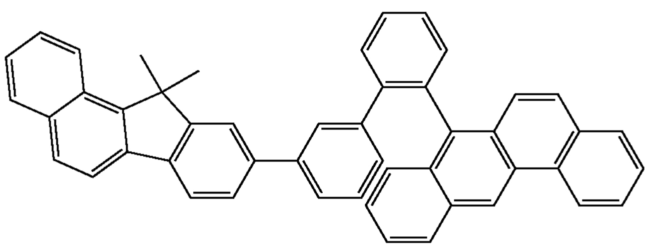
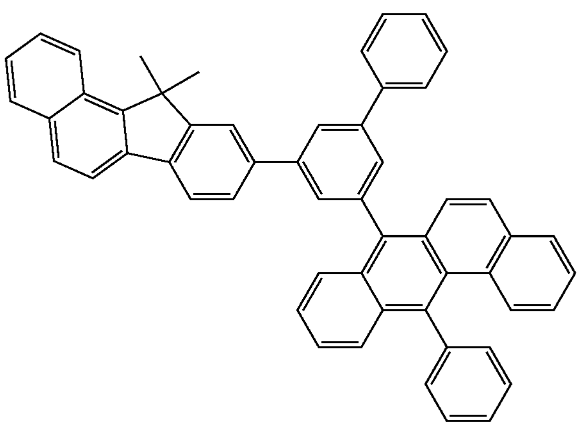
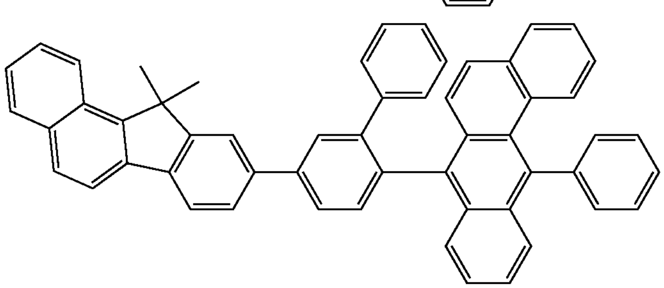

-continued
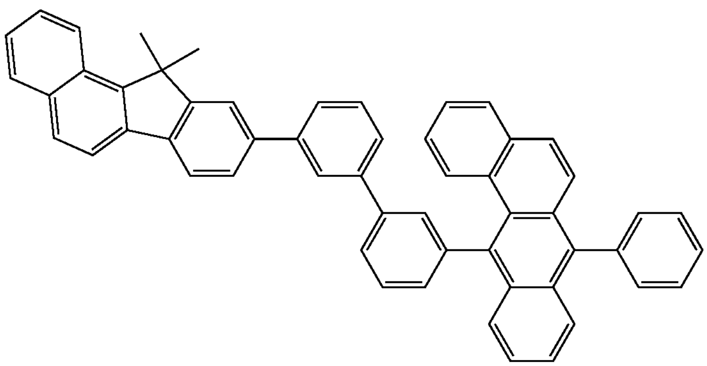
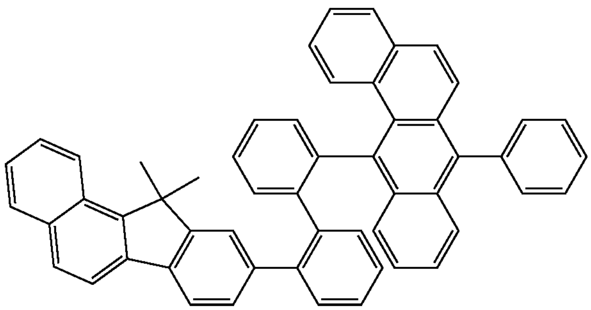
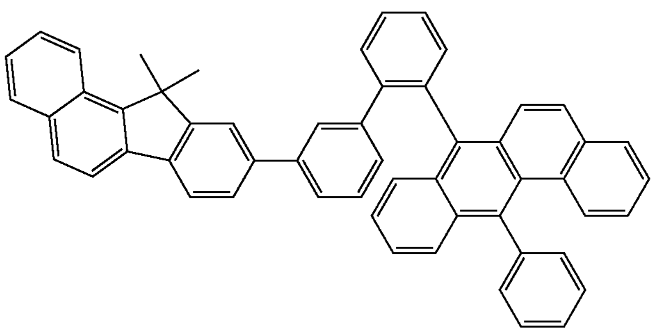
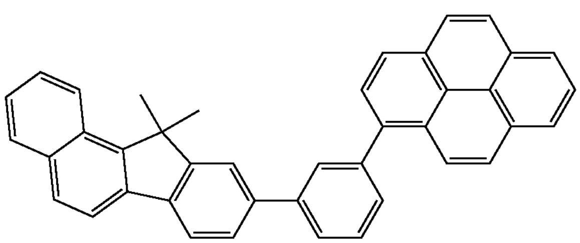
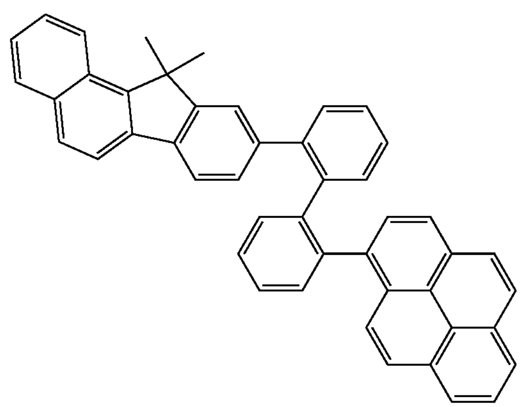
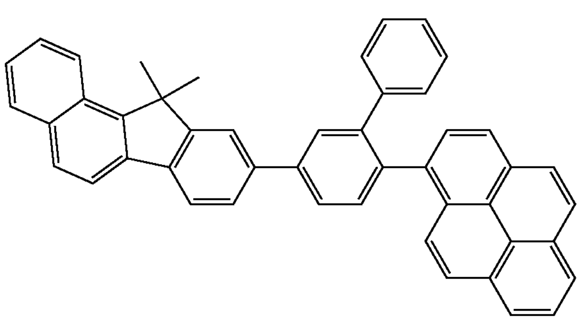

-continued
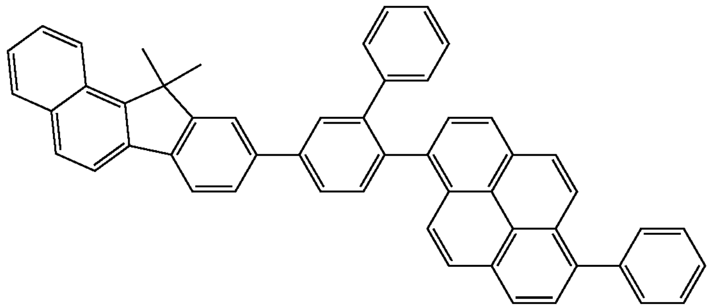
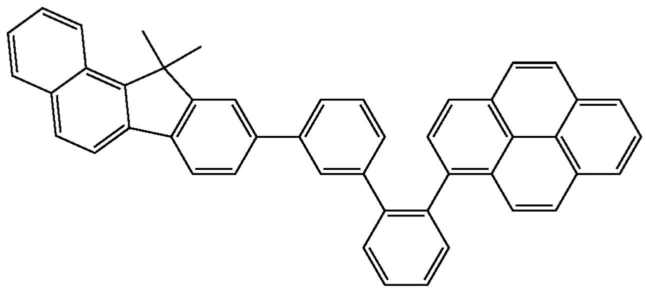
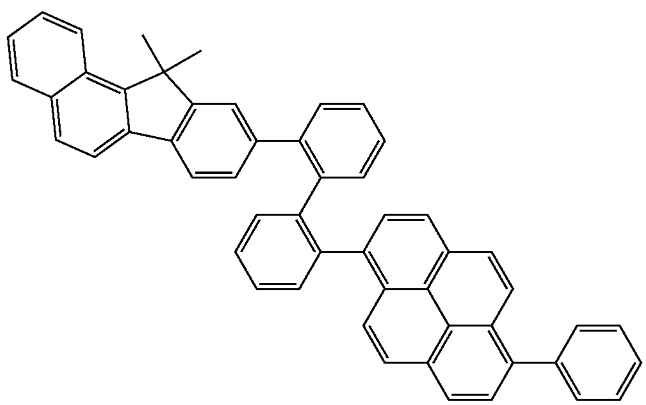
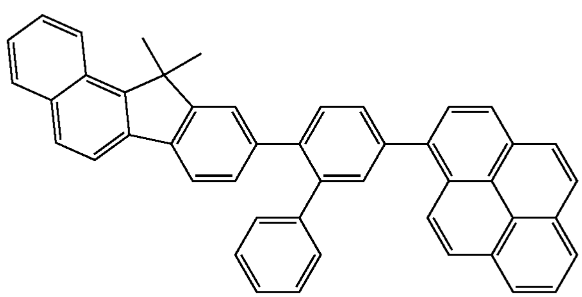
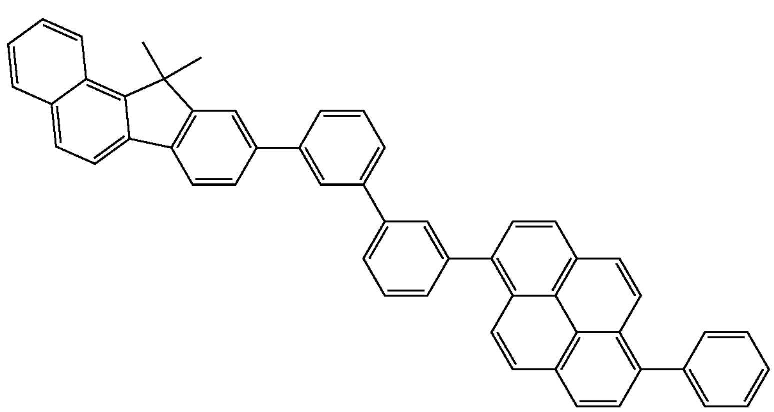

-continued
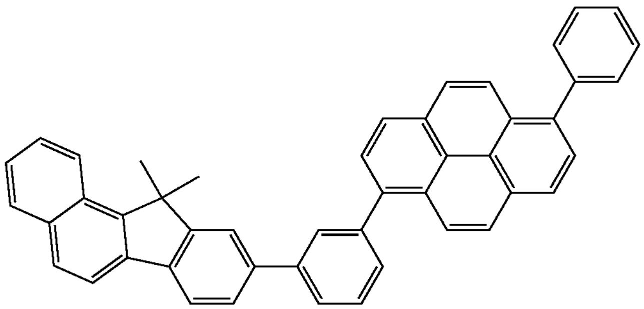
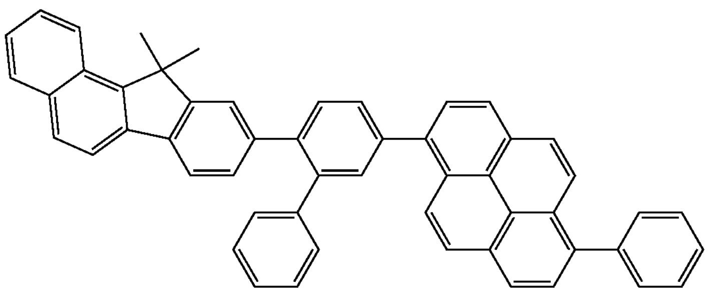
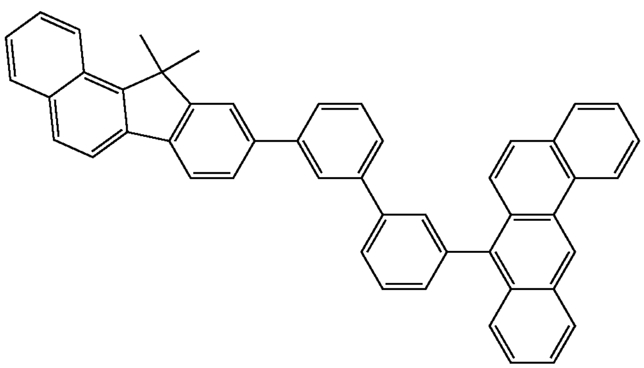
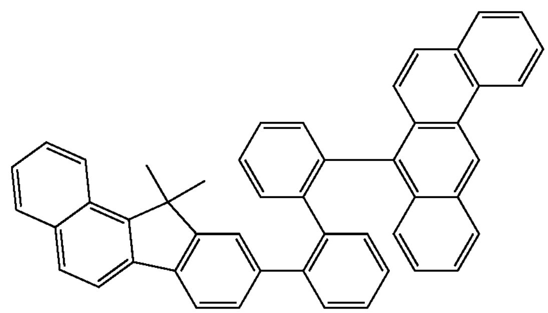
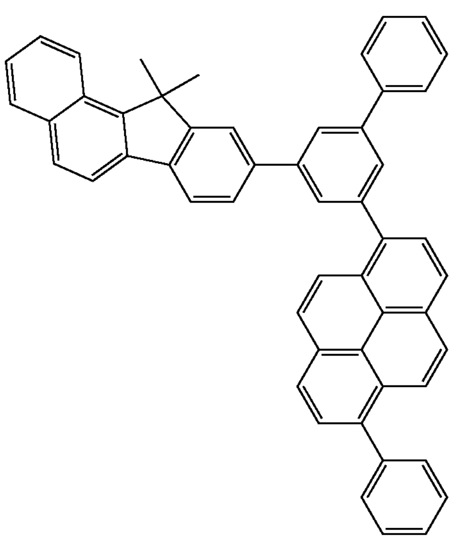
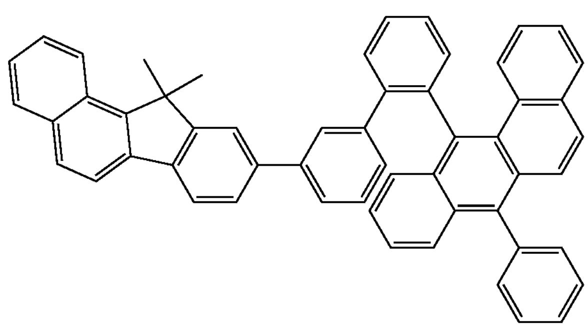

-continued
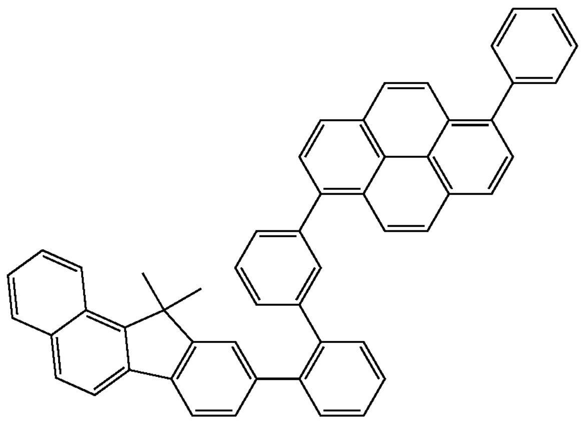
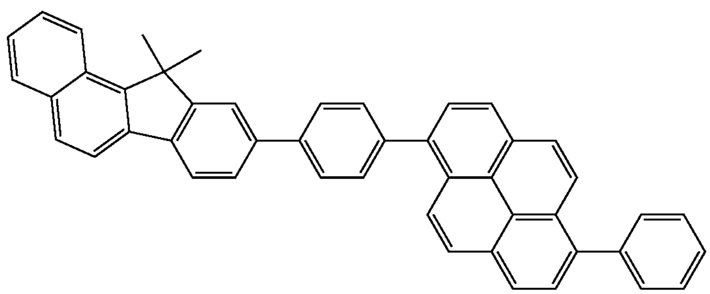
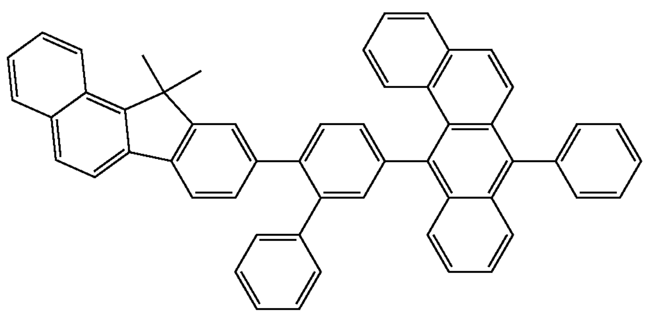
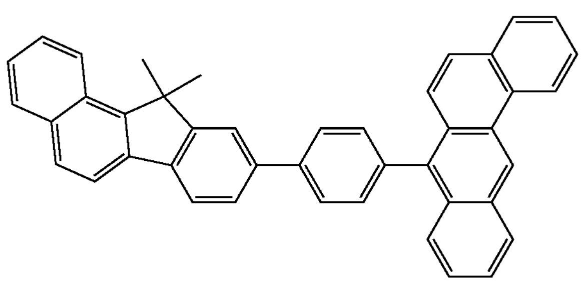
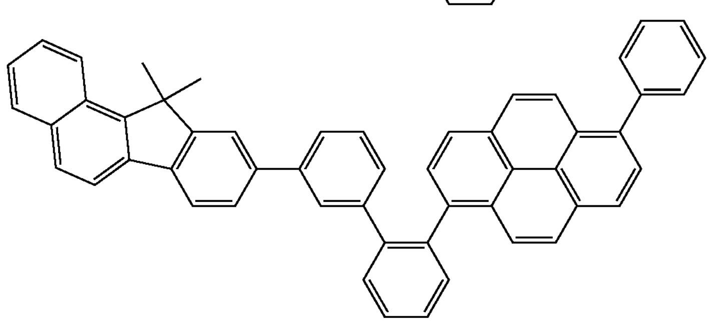

-continued
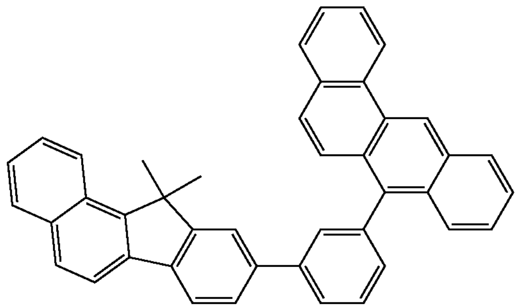
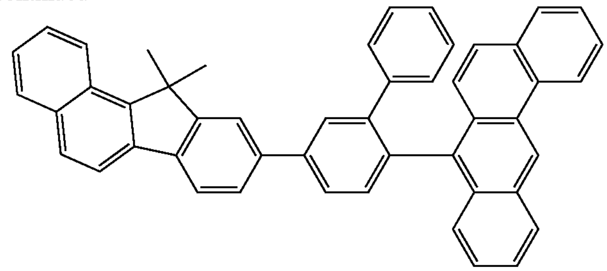
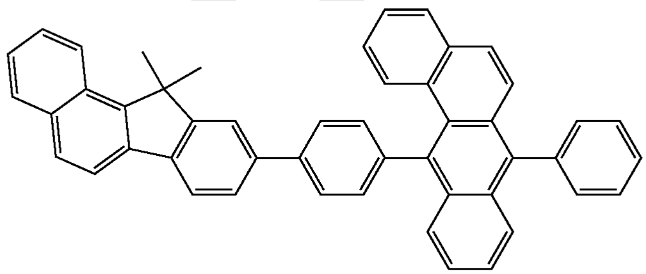
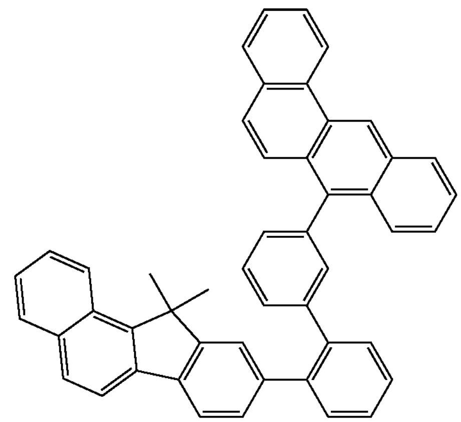
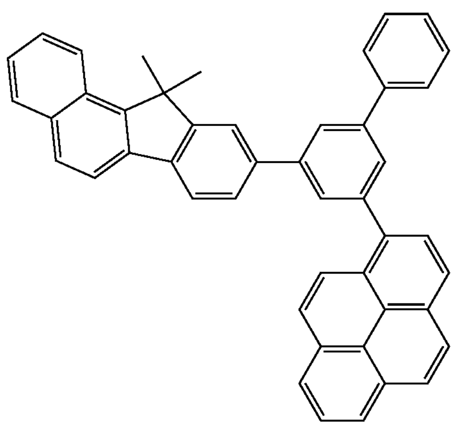
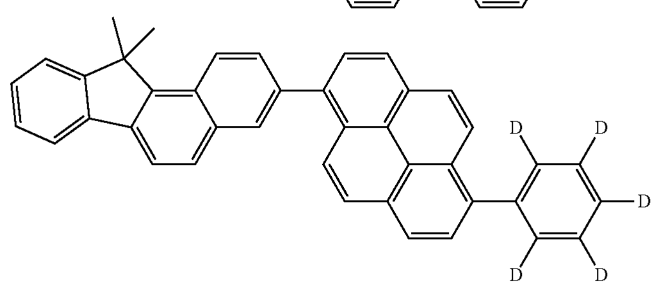
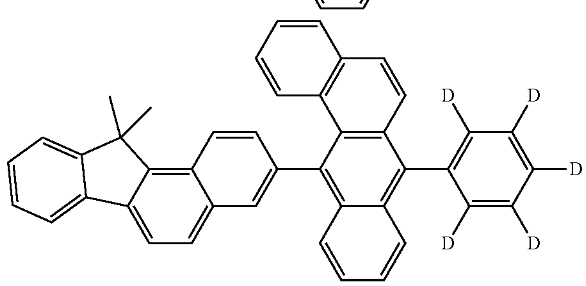
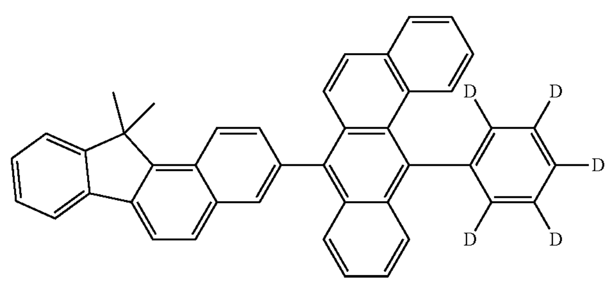
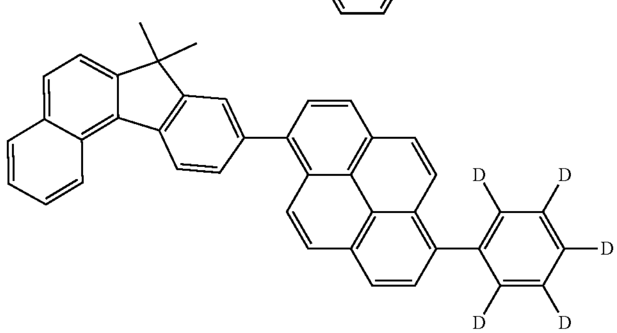
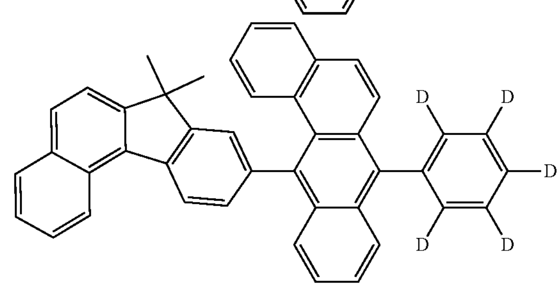

-continued
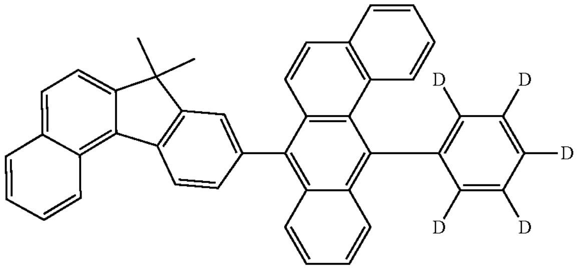
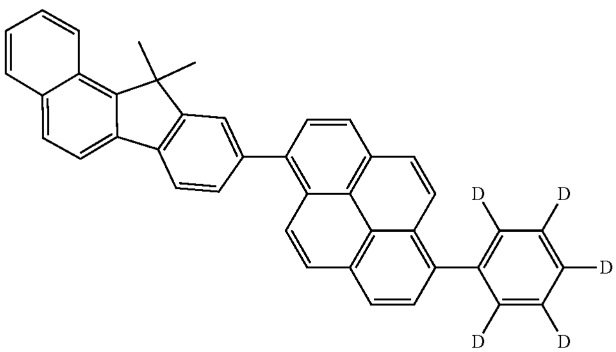
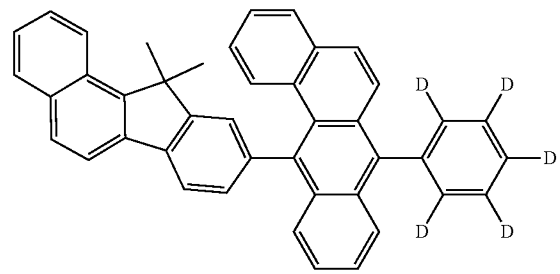
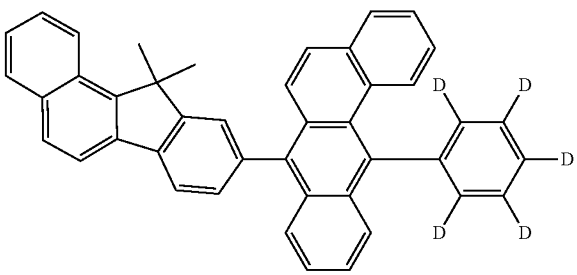
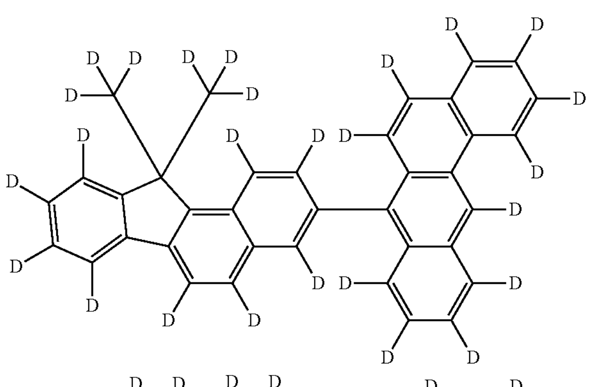
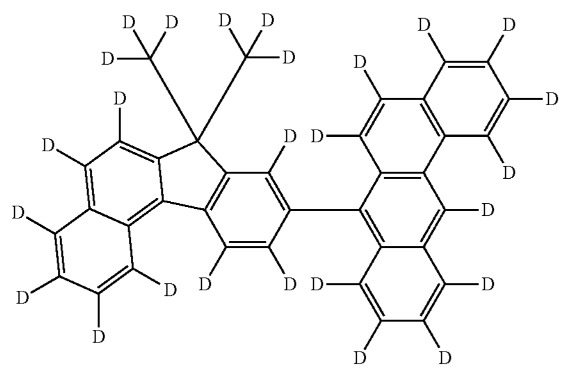
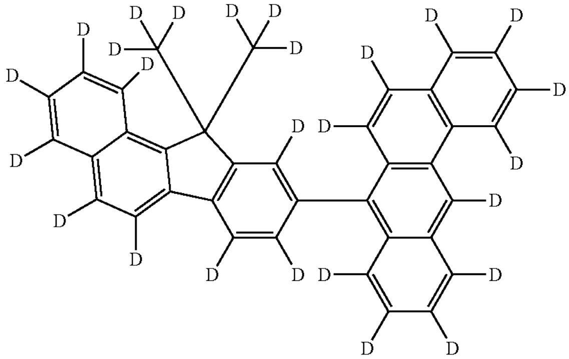
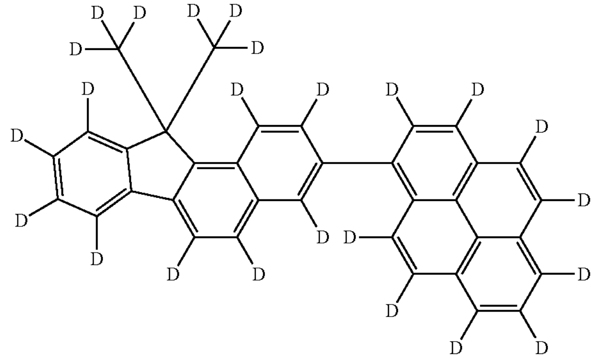

-continued
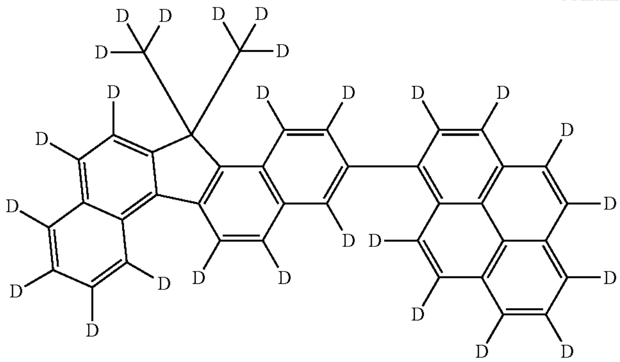
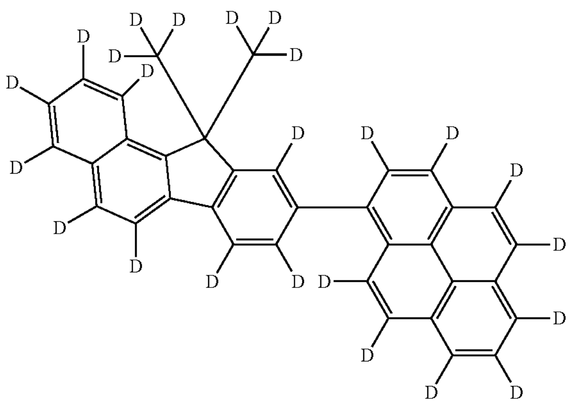
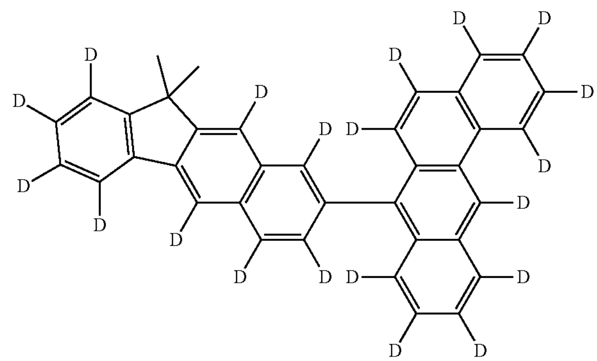
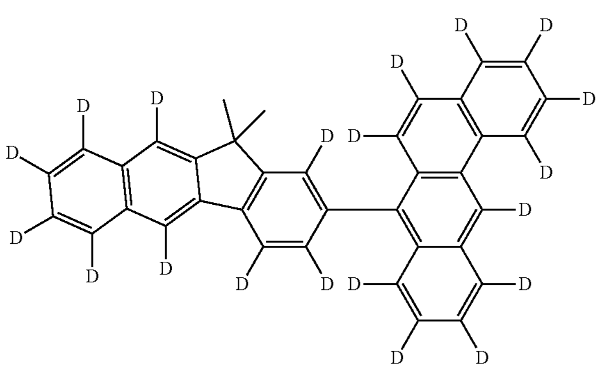
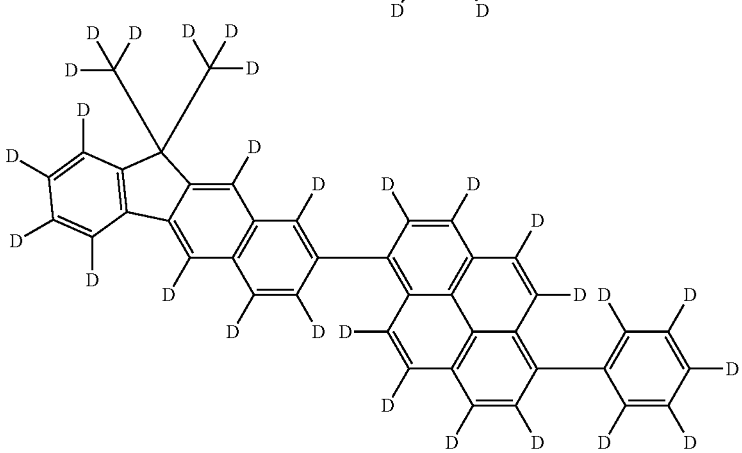

-continued
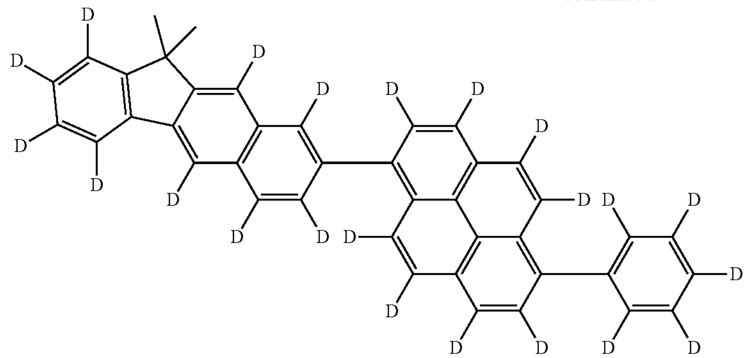
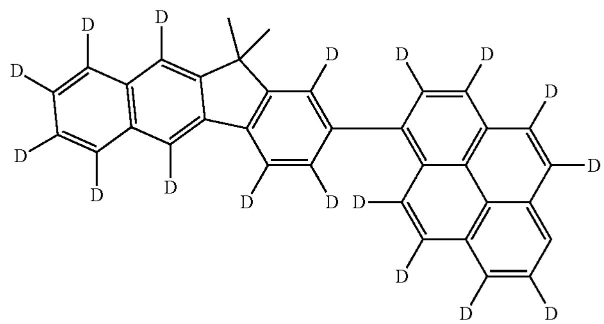
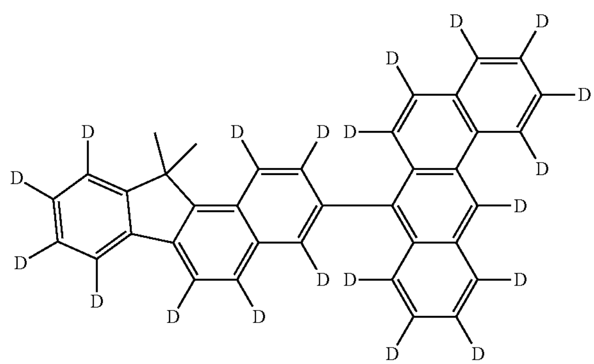
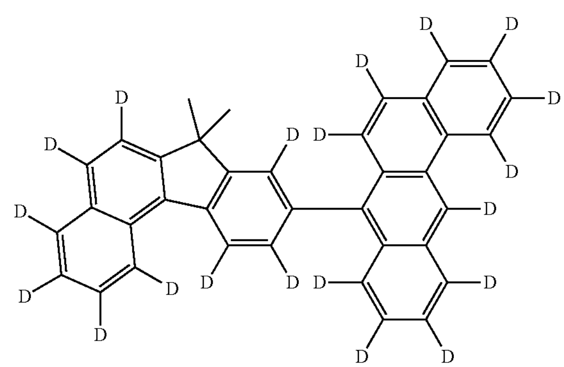
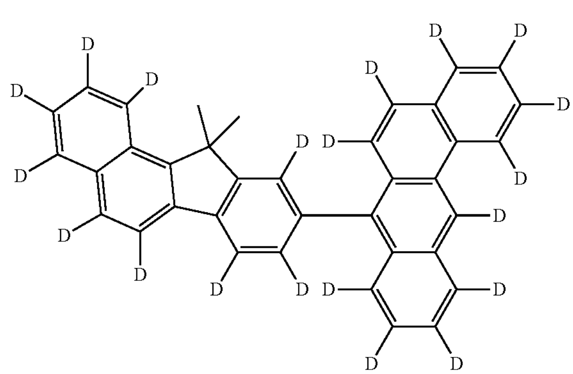
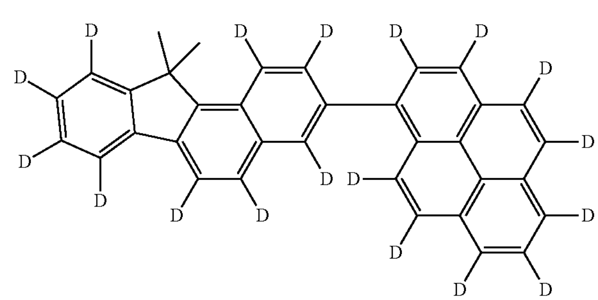

-continued
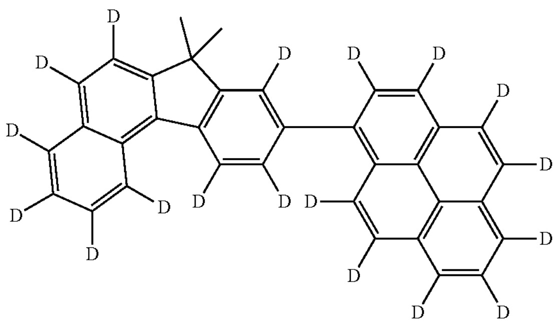
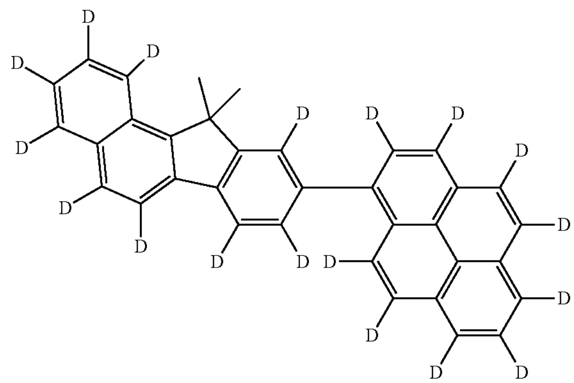
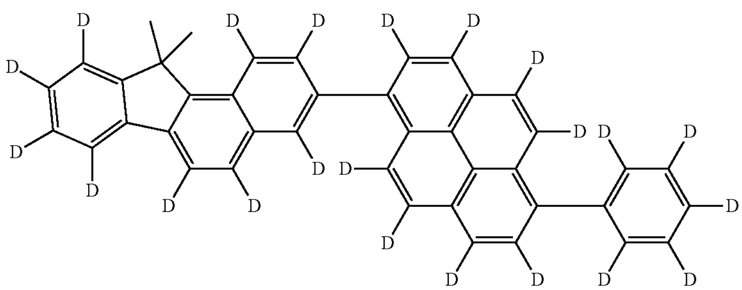
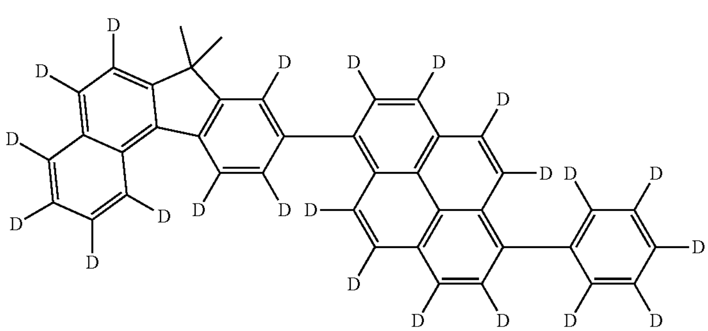
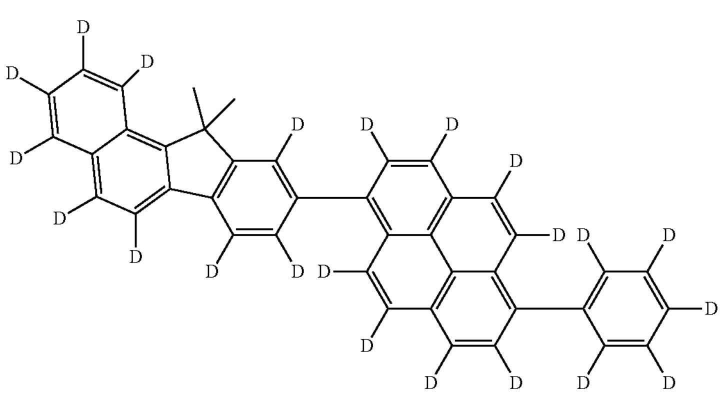

-continued
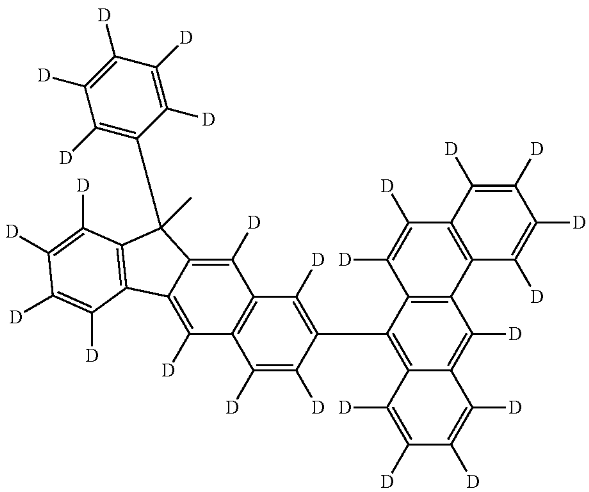
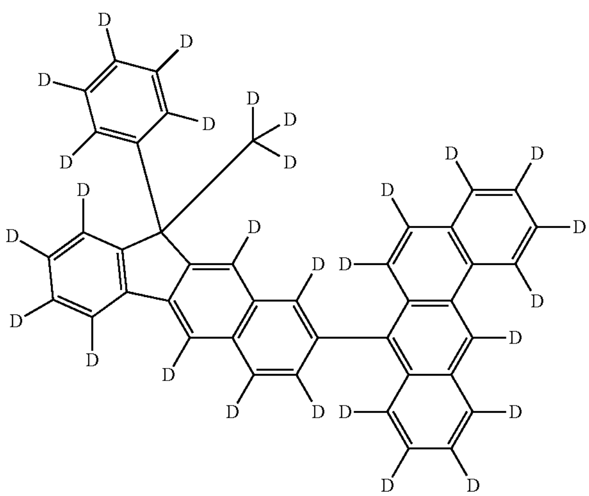
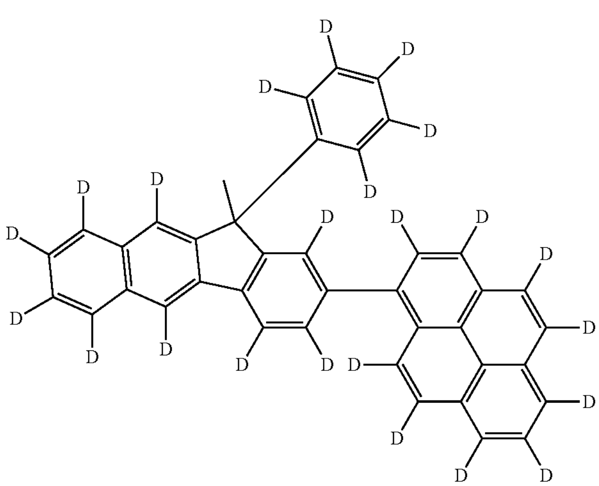

-continued
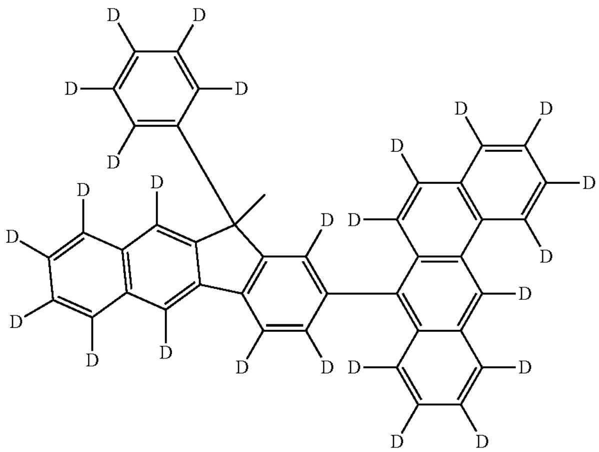
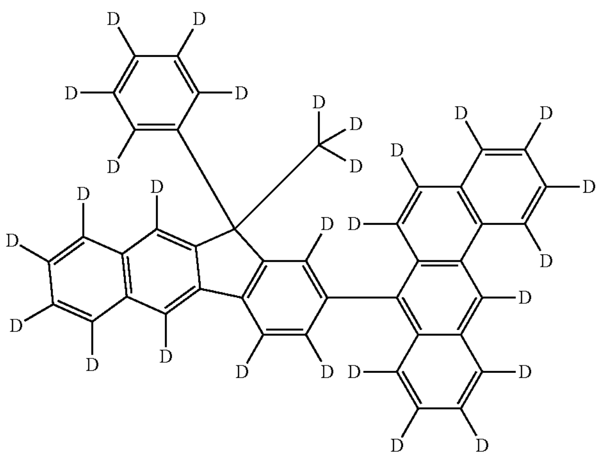
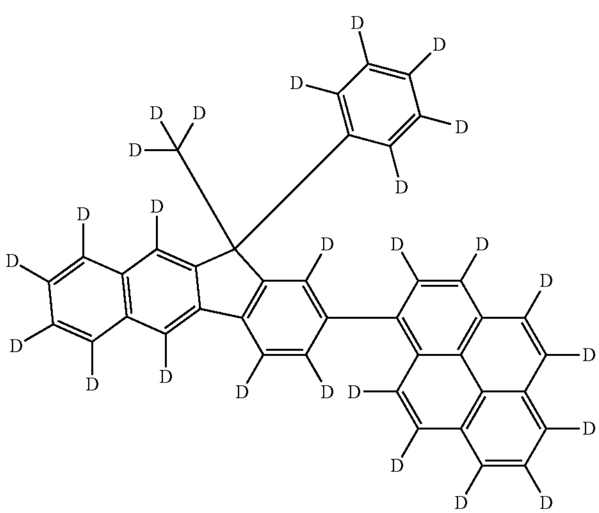

-continued
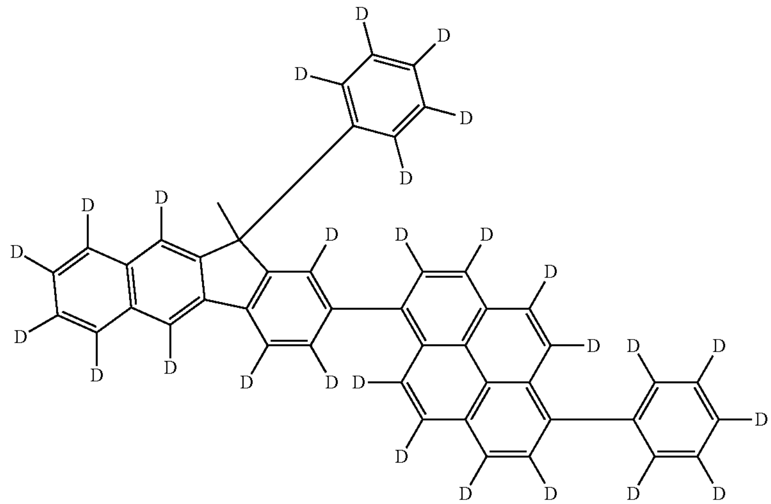
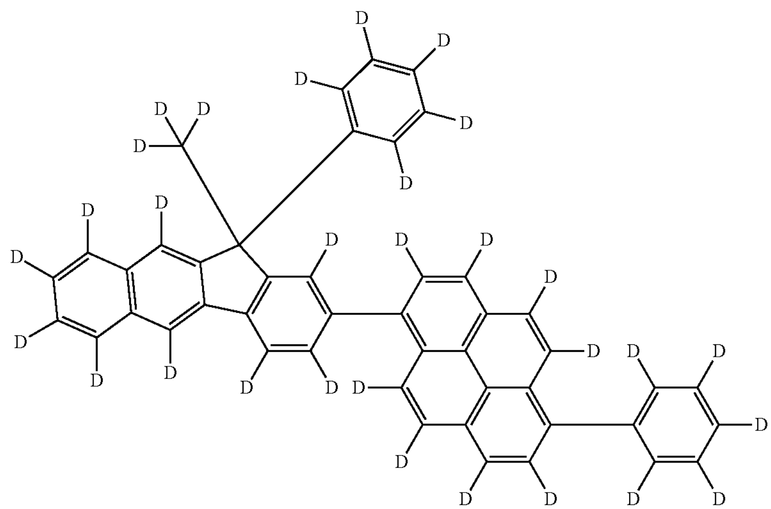
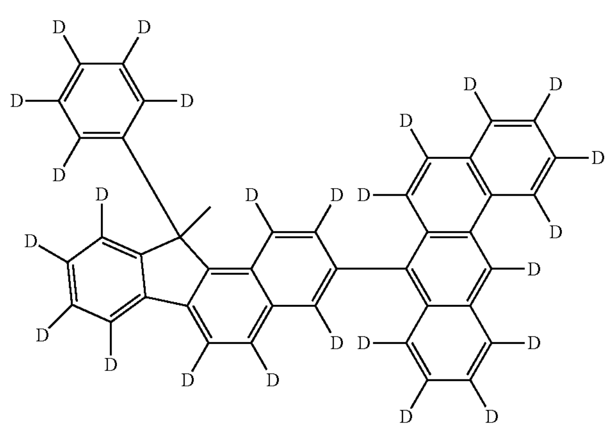

-continued
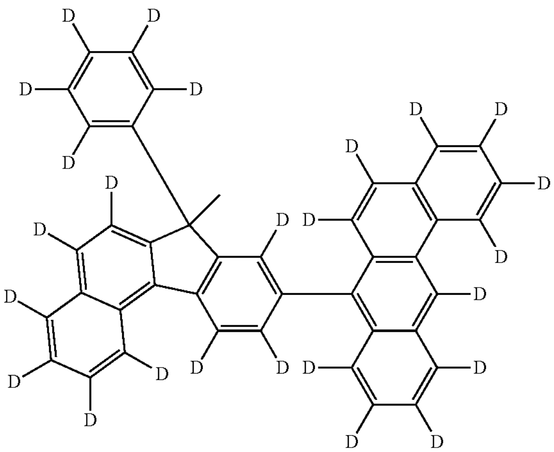
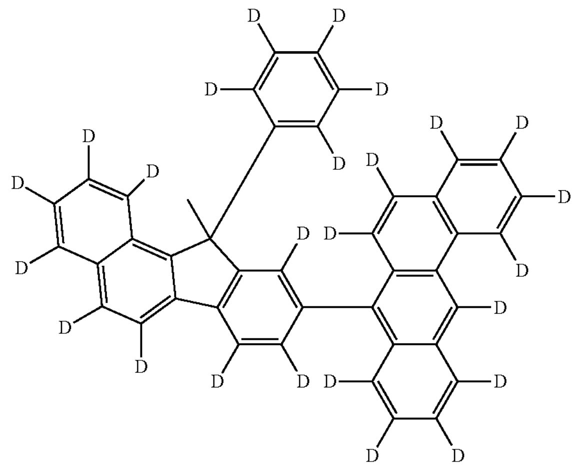
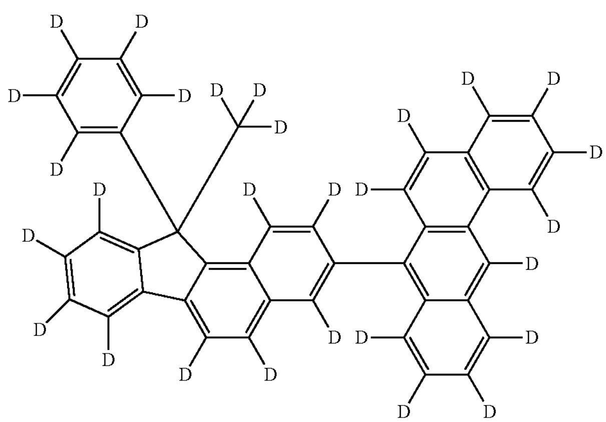
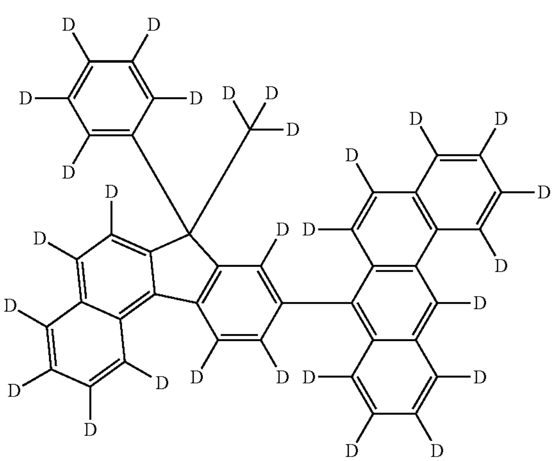
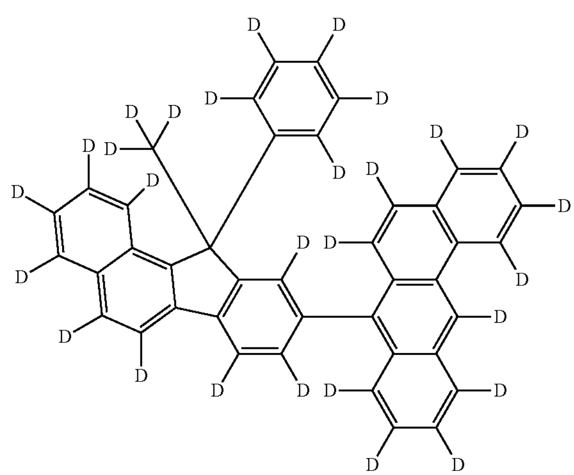

-continued
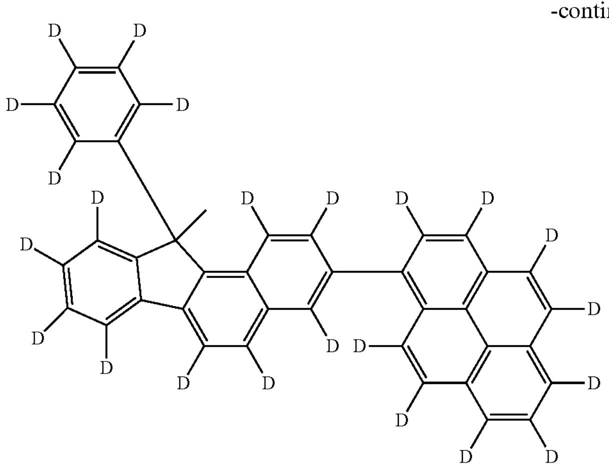
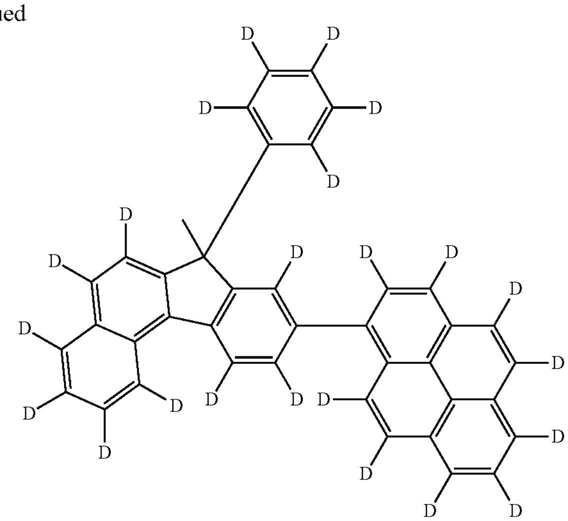
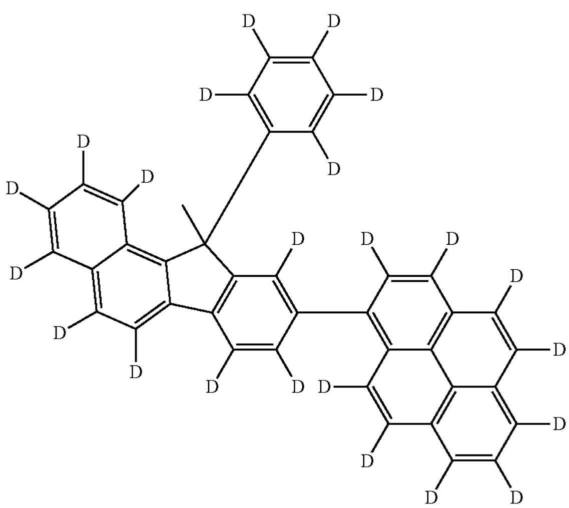
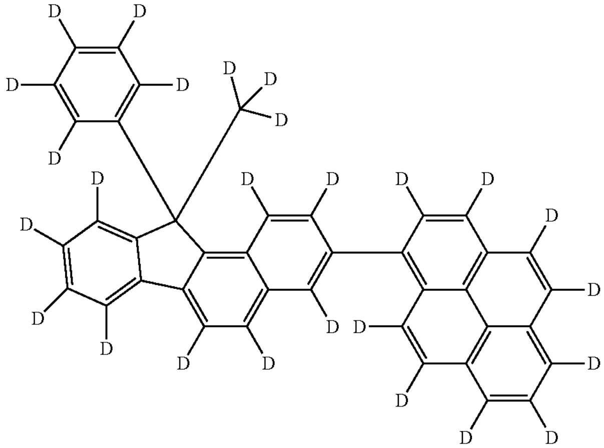
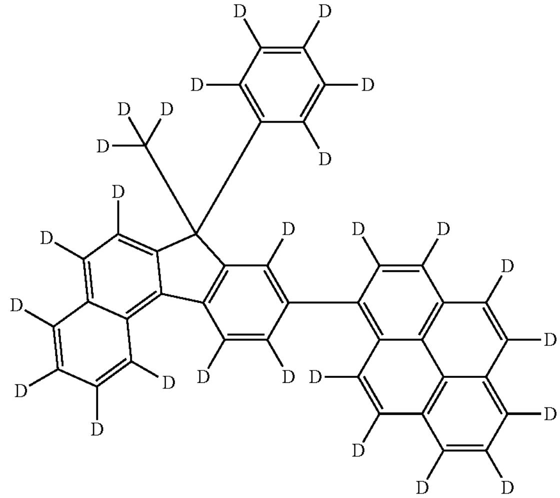

-continued
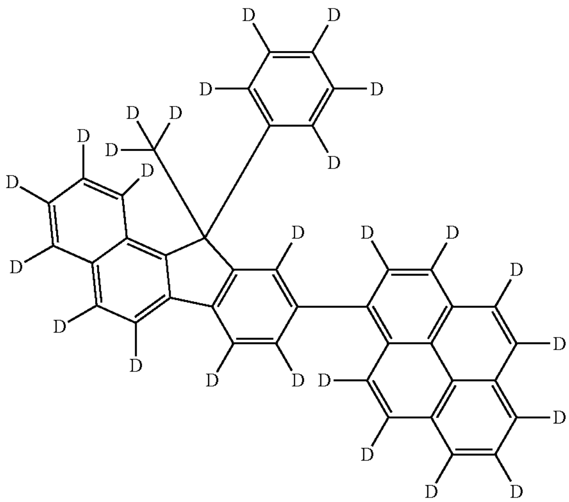
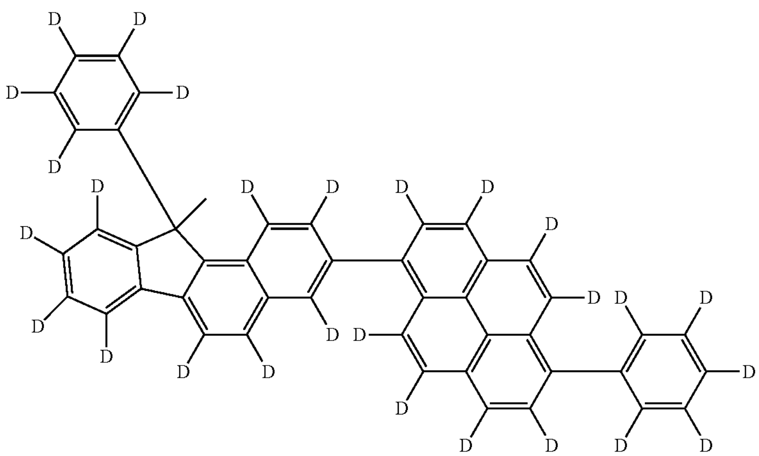
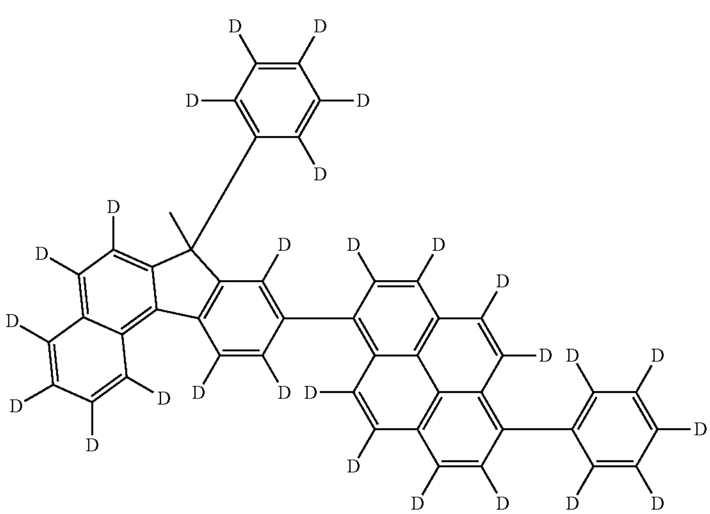

-continued
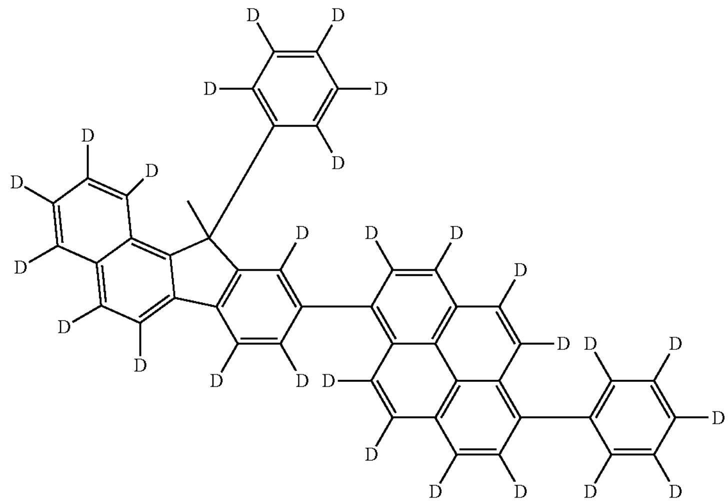
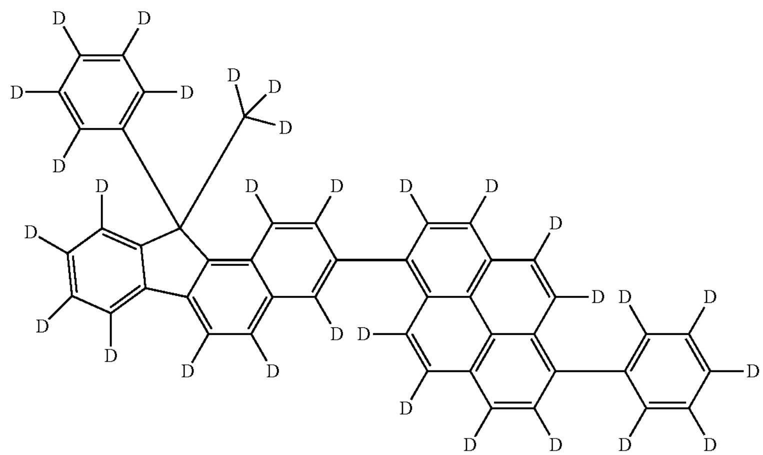
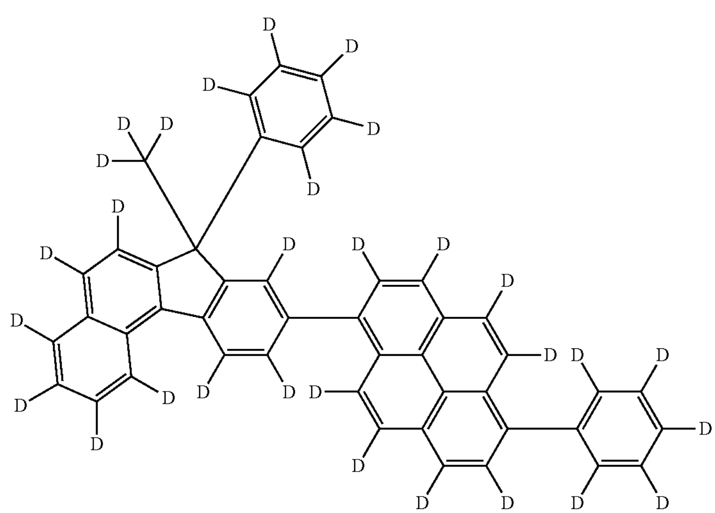

-continued

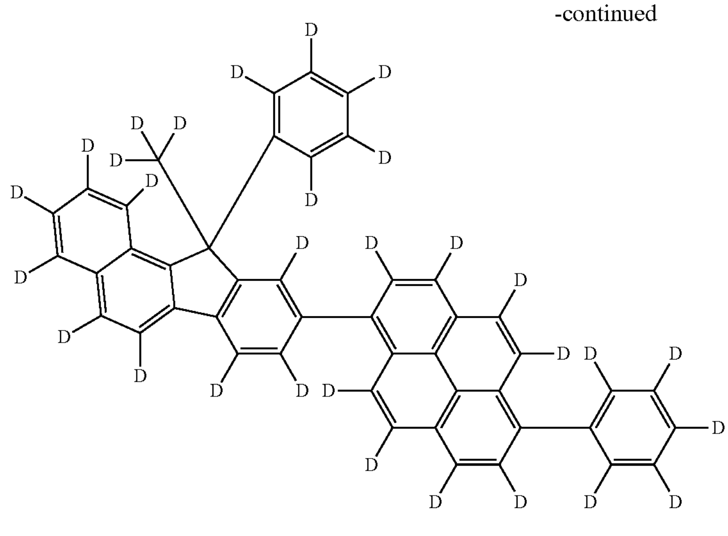

In the organic EL device according to the exemplary embodiment, a triplet energy of the first host material $T_1(H1)$ and a triplet energy of the second host material $T_1(H2)$ preferably satisfy a relationship of a numerical formula (Numerical Formula 1) below.

$$T_1(H1)>T_1(H2) \quad \text{(Numerical Formula 1)}$$

In an exemplary arrangement according to the exemplary embodiment, an organic electroluminescence device having improved luminous efficiency can be provided.

Conventionally, Triplet-Triplet-Annihilation (sometimes referred to as TTA) is known as a technique for enhancing the luminous efficiency of the organic electroluminescence device. TTA is a mechanism in which triplet excitons collide with one another to generate singlet excitons. It should be noted that the TTA mechanism is also occasionally referred to as a TTF mechanism as described in Literature 3.

The TTF phenomenon will be described. Holes injected from an anode and electrons injected from a cathode are recombined in an emitting layer to generate excitons. As for the spin state, as is conventionally known, singlet excitons account for 25% and triplet excitons account for 75%. In a conventionally known fluorescent device, light is emitted when singlet excitons of 25% are relaxed to the ground state. The remaining triplet excitons of 75% are returned to the ground state without emitting light through a thermal deactivation process. Accordingly, the theoretical limit value of the internal quantum efficiency of a conventional fluorescent device is believed to be 25%.

The behavior of triplet excitons generated within an organic substance has been theoretically examined. According to S. M. Bachilo et al. (J. Phys. Chem. A, 104, 7711 (2000)), assuming that high-order excitons such as quintet excitons are quickly returned to triplet excitons, triplet excitons (hereinafter abbreviated as $^3A^*$) collide with one another with an increase in the density thereof, whereby a reaction shown by the following formula occurs. In the formula, $^1A$ represents the ground state and $^1A^*$ represents the lowest singlet excitons.

$$^3A^*+^3A^*\rightarrow(4/9)^1A+(1/9)^1A^*+(13/9)^3A^*$$

In other words, $5^3A^*\rightarrow4^1A+1A^*$ is satisfied, and it is expected that, among triplet excitons initially generated, which account for 75%, one fifth thereof (i.e., 20%) is changed to singlet excitons. Accordingly, the amount of singlet excitons which contribute to emission is 40%, which is a value obtained by adding 15% (75%×(1/5)=15%) to 25%, which is the amount ratio of initially generated singlet excitons. At this time, a ratio of luminous intensity derived from TTF (TTF ratio) relative to the total luminous intensity is 15/40, i.e., 37.5%. Assuming that singlet excitons are generated by collision of initially generated triplet excitons accounting for 75% (i.e., one singlet exciton is generated from two triplet excitons), a significantly high internal quantum efficiency of 62.5% is obtained, which is a value obtained by adding 37.5% (75%×(1/2)=37.5%) to 25% (the amount ratio of initially generated singlet excitons). At this time, the TTF ratio is 37.5/62.5=60%.

In the organic electroluminescence device according to an exemplary arrangement of the exemplary embodiment, it is considered that triplet excitons generated by recombination of holes and electrons in the first emitting layer and present on an interface between the first emitting layer and organic layer(s) in direct contact therewith are not likely to be quenched even under the presence of excessive carriers on the interface between the first emitting layer and the organic layer(s). For instance, the presence of a recombination region locally on an interface between the first emitting layer and a hole transporting layer or an electron blocking layer is considered to cause quenching by excessive electrons. Meanwhile, the presence of a recombination region locally on an interface between the first emitting layer and an electron transporting layer or a hole blocking layer is considered to cause quenching by excessive holes.

The organic electroluminescence device according to an exemplary arrangement of the exemplary embodiment includes at least two emitting layers (i.e., the first emitting layer and the second emitting layer) which satisfy a predetermined relationship. The triplet energy of the first host material in the first emitting layer $T_1(H1)$ and the triplet energy of the second host material in the second emitting layer $T_1(H2)$ satisfy the relationship of the numerical formula (Numerical Formula 1).

By including the first emitting layer and the second emitting layer so as to satisfy the numerical formula (Numerical Formula 1), triplet excitons generated in the first emitting layer can transfer to the second emitting layer without being quenched by excessive carriers and be inhibited from back-transferring from the second emitting layer to the first emitting layer. Consequently, the second emitting layer exhibits the TTF mechanism to efficiently generate singlet excitons, thereby improving luminous efficiency.

Accordingly, the organic electroluminescence device includes, as different regions, the first emitting layer mainly generating triplet excitons and the second emitting layer mainly exhibiting the TTF mechanism using triplet excitons having transferred from the first emitting layer, and a difference in triplet energy is provided by using a compound having a smaller triplet energy than that of the first host material in the first emitting layer as the second host material in the second emitting layer, thereby improving the luminous efficiency.

In the organic EL device according to the exemplary embodiment, the triplet energy of the first host material $T_1(H1)$ and the triplet energy of the second host material $T_1(H2)$ preferably satisfy a relationship of a numerical formula (Numerical Formula 1B) below.

$$T_1(H1)-T_1(H2)>0.03\ \text{eV} \quad \text{(Numerical Formula 1B)}$$

Herein, the "host material" refers to, for instance, a material that accounts for "50 mass % or more of the layer." Accordingly, for instance, the first emitting layer contains the first host material at 50 mass % or more with respect to a total mass of the first emitting layer. For instance, the second emitting layer contains the second host material at 50 mass % or more with respect to a total mass of the second emitting layer.

First Emitting Layer

The first emitting layer contains the first host material. The first host material and the second host material contained in the second emitting layer are different compounds.

The first emitting layer preferably contains the first emitting compound. A maximum peak wavelength of the first emitting compound is preferably 500 nm or less, more preferably 480 nm or less. The first emitting compound is preferably a fluorescent compound that exhibits fluorescence having a maximum peak wavelength of 500 nm or less, more preferably a fluorescent compound that exhibits fluorescence having a maximum peak wavelength of 480 nm or less.

In the organic EL device according to the exemplary embodiment, the first emitting compound is preferably a compound containing no azine ring structure in a molecule thereof.

In the organic EL device according to the exemplary embodiment, the first emitting compound is preferably not a boron-containing complex, more preferably not a complex.

In the organic EL device according to the exemplary embodiment, the first emitting layer preferably does not contain a metal complex. Moreover, in the organic EL device according to the exemplary embodiment, the first emitting layer also preferably does not contain a boron-containing complex.

In the organic EL device according to the exemplary embodiment, the first emitting layer preferably does not contain a phosphorescent material (dopant material).

In addition, the first emitting layer preferably does not contain a heavy-metal complex and a phosphorescent rare earth metal complex. Examples of the heavy-metal complex herein include iridium complex, osmium complex, and platinum complex.

A measurement method of the maximum peak wavelength of a compound is as follows. A toluene solution of a measurement target compound at a concentration of 5 μmol/L is prepared and put in a quartz cell. An emission spectrum (ordinate axis: luminous intensity, abscissa axis: wavelength) of each of the samples is measured at a normal temperature (300K). The emission spectrum can be measured using a spectrophotometer (machine name: F-7000) manufactured by Hitachi High-Tech Science Corporation. It should be noted that the machine for measuring the emission spectrum is not limited to the machine used herein.

A peak wavelength of the emission spectrum exhibiting the maximum luminous intensity is defined as the maximum peak wavelength. Herein, the maximum peak wavelength of fluorescence is sometimes referred to as the maximum fluorescence peak wavelength (FL-peak).

In an emission spectrum of the first emitting compound, where a peak exhibiting a maximum luminous intensity is defined as a maximum peak and a height of the maximum peak is defined as 1, heights of other peaks appearing in the emission spectrum are preferably less than 0.6. It should be noted that the peaks in the emission spectrum are defined as local maximum values.

Moreover, in the emission spectrum of the first emitting compound, the number of peaks is preferably less than three.

In the organic EL device according to the exemplary embodiment, the first emitting layer preferably emits light having a maximum peak wavelength of 500 nm or less, more preferably emits light having a maximum peak wavelength of 480 nm or less, when the device is driven.

The maximum peak wavelength of light emitted from the emitting layer when the device is driven can be measured by a method described below.

Maximum Peak Wavelength λp of Light Emitted from Emitting Layer when Device is Driven For a maximum peak wavelength $\lambda_{p1}$ of light emitted from the first emitting layer when the organic EL device is driven, the organic EL device is manufactured by using the same material for the first emitting layer and the second emitting layer, and voltage is applied on the organic EL device so that a current density becomes 10 mA/cm$^2$, where spectral radiance spectrum is measured by a spectroradiometer CS-2000 (manufactured by Konica Minolta, Inc.). The maximum peak wavelength $\lambda_{p1}$ (unit: nm) is calculated from the obtained spectral radiance spectrum.

For a maximum peak wavelength $\lambda p_2$ of light emitted from the second emitting layer when the organic EL device is driven, the organic EL device is manufactured by using the same material for the first emitting layer and the second emitting layer, and voltage is applied on the organic EL device so that a current density becomes 10 mA/cm$^2$, where spectral radiance spectrum is measured by a spectroradiometer CS-2000 (manufactured by Konica Minolta, Inc.). The maximum peak wavelength $\lambda p_2$ (unit: nm) is calculated from the obtained spectral radiance spectrum.

In the organic EL device according to the exemplary embodiment, a singlet energy of the first host material $S_1(H1)$ and a singlet energy of the first emitting compound $S_1(D1)$ preferably satisfy a relationship of a numerical formula (Numerical Formula 5) below.

$$S_1(H1)>S_1(D1) \quad \text{(Numerical Formula 5)}$$

The singlet energy $S_1$ means an energy difference between the lowest singlet state and the ground state.

When the first host material and the first emitting compound satisfy the relationship of the numerical formula (Numerical Formula 5), singlet excitons generated on the first host material easily energy-transfer from the first host material to the first emitting compound, thereby contributing to fluorescence of the first emitting compound.

In the organic EL device according to the exemplary embodiment, the triplet energy of the first host material $T_1(H1)$ and a triplet energy of the first emitting compound $T_1(D1)$ preferably satisfy a relationship of a numerical formula (Numerical Formula 6) below.

$$T_1(D1)>T_1(H1) \quad \text{(Numerical Formula 6)}$$

When the first host material and the first emitting compound satisfy the relationship of the numerical formula (Numerical Formula 6), triplet excitons generated in the first emitting layer are transferred not onto the first emitting compound having higher triplet energy but onto the first host material, thereby being easily transferred to the second emitting layer.

The organic EL device according to the exemplary embodiment preferably satisfies a relationship of a numerical formula (Numerical Formula 20B) below.

$$T_1(D1)>T_1(H1)>T_1(H2) \quad \text{(Numerical Formula 20B)}$$

Triplet Energy $T_1$

A method of measuring triplet energy $T_1$ is exemplified by a method below.

A measurement target compound is dissolved in EPA (diethylether:isopentane:ethanol=5:5:2 in volume ratio) so as to fall within a range from $10^{-5}$ mol/L to $10^{-4}$ mol/L, and the obtained solution is put in a quartz cell to provide a measurement sample. A phosphorescence spectrum (ordinate axis: phosphorescent luminous intensity, abscissa axis: wavelength) of the measurement sample is measured at a low temperature (77K). A tangent is drawn to the rise of the phosphorescence spectrum close to the short-wavelength region. An energy amount is calculated by a conversion equation (F1) below on a basis of a wavelength value $\lambda_{edge}$ [nm] at an intersection of the tangent and the abscissa axis. The calculated energy amount is defined as triplet energy $T_1$.

$$T_1\ [\text{eV}]=1239.85/\lambda_{edge} \quad \text{Conversion Equation (F1):}$$

The tangent to the rise of the phosphorescence spectrum close to the short-wavelength region is drawn as follows. While moving on a curve of the phosphorescence spectrum from the short-wavelength region to the local maximum value closest to the short-wavelength region among the local maximum values of the phosphorescence spectrum, a tangent is checked at each point on the curve toward the long-wavelength of the phosphorescence spectrum. An inclination of the tangent is increased along the rise of the curve (i.e., a value of the ordinate axis is increased). A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted as the above-mentioned local maximum peak intensity closest to the short-wavelength region. The tangent drawn at a point that is closest to the local maximum peak intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 (manufactured by Hitachi High-Technologies Corporation) is usable. The measurement instrument is not limited to this arrangement. A combination of a cooling unit, a low temperature container, an excitation light source and a light-receiving unit may be used for measurement.

Singlet Energy $S_1$

A method of measuring the singlet energy $S_1$ with use of a solution (occasionally referred to as a solution method) is exemplified by a method below.

A toluene solution of a measurement target compound at a concentration ranging from $10^{-5}$ mol/L to $10^{-4}$ mol/L is prepared and put in a quartz cell. An absorption spectrum (ordinate axis: absorption intensity, abscissa axis: wavelength) of the thus-obtained sample is measured at a normal temperature (300K). A tangent is drawn to the fall of the absorption spectrum close to the long-wavelength region, and a wavelength value $\lambda_{edge}$ (nm) at an intersection of the tangent and the abscissa axis is assigned to a conversion equation (F2) below to calculate singlet energy.

$$S_1\ [\text{eV}]=1239.85/\lambda_{edge} \quad \text{Conversion Equation (F2):}$$

Any device for measuring absorption spectrum is usable. For instance, a spectrophotometer (U3310 manufactured by Hitachi, Ltd.) is usable.

The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve falls (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region.

The local maximum absorbance of 0.2 or less is not counted as the above-mentioned local maximum absorbance closest to the long-wavelength region.

In the organic EL device according to the exemplary embodiment, the first emitting layer preferably contains the first emitting compound at 0.5 mass % or more. That is, the first emitting layer preferably contains the first emitting compound at 0.5 mass % or more, more preferably at 1.0 mass % or more, further preferably at 1.2 mass % or more, further more preferably at 1.5 mass % or more, with respect to the total mass of the first emitting layer.

The first emitting layer preferably contains the first emitting compound at 10 mass % or less, more preferably at 7 mass % or less, further preferably at 5 mass % or less, with respect to the total mass of the first emitting layer.

In the organic EL device according to the exemplary embodiment, the first emitting layer preferably contains the first compound as the first host material at 60 mass % or more, more preferably at 70 mass % or more, further preferably at 80 mass % or more, further more preferably at 90 mass % or more, still further preferably at 95 mass % or more, with respect to the total mass of the first emitting layer.

The first emitting layer preferably contains the first host material at 99 mass % or less with respect to the total mass of the first emitting layer.

It should be noted that when the first emitting layer contains the first host material and the first emitting compound, an upper limit of the total of the respective content ratios of the first host material and the first emitting compound is 100 mass %.

It is not excluded that the first emitting layer according to the exemplary embodiment further contains a material(s) other than the first host material and the first emitting compound.

The first emitting layer may include a single type of the first host material or may include two or more types of the first host material. The first emitting layer may include a single type of the first emitting compound or may include two or more types of the first emitting compound.

Second Emitting Layer

The second emitting layer preferably contains the second host material. The second host material and the first host material contained in the first emitting layer are different compounds.

The second emitting layer preferably contains the second emitting compound. A maximum peak wavelength of the second emitting compound is preferably 500 nm or less, more preferably 480 nm or less. The second emitting compound is preferably a fluorescent compound that exhibits fluorescence having a maximum peak wavelength of 500 nm or less, more preferably a fluorescent compound that exhibits its fluorescence having a maximum peak wavelength of 480 nm or less.

A measurement method of the maximum peak wavelength of a compound is as described above.

In the organic EL device according to the exemplary embodiment, the second emitting layer preferably emits light having a maximum peak wavelength of 500 nm or less, more preferably emits light having a maximum peak wavelength of 480 nm or less, when the device is driven.

In the organic EL device according to the exemplary embodiment, a half bandwidth of a maximum peak of the second emitting compound is preferably in a range from 1 nm to 20 nm.

In the organic EL device according to the exemplary embodiment, a Stokes shift of the second emitting compound preferably exceeds 7 nm.

When the Stokes shift of the second emitting compound exceeds 7 nm, a reduction in luminous efficiency due to self-absorption is likely to be inhibited.

The self-absorption is a phenomenon where emitted light is absorbed by the same compound to reduce luminous efficiency. The self-absorption is notably observed in a compound having a small Stokes shift (i.e., a large overlap between an absorption spectrum and a fluorescence spectrum). Accordingly, in order to inhibit the self-absorption, it is preferable to use a compound having a large Stokes shift (i.e., a small overlap between the absorption spectrum and the fluorescence spectrum). The Stokes shift can be measured by the following method.

A measurement target compound is dissolved in toluene at a concentration of $2.0\times10^{-5}$ mol/L to prepare a measurement sample. The measurement sample is put into a quartz cell and is irradiated with continuous light falling within an ultraviolet-to-visible region at a room temperature (300K) to measure an absorption spectrum (ordinate axis: absorbance, abscissa axis: wavelength). A spectrophotometer such as a spectrophotometer U-3900/3900H manufactured by Hitachi High-Tech Science Corporation can be used for the absorption spectrum measurement. Moreover, a measurement target compound is dissolved in toluene at a concentration of $4.9\times10^{-6}$ mol/L to prepare a measurement sample. The measurement sample is put into a quartz cell and is irradiated with excited light at a room temperature (300K) to measure fluorescence spectrum (ordinate axis: fluorescence intensity, abscissa axis: wavelength). A spectrophotometer can be used for the fluorescence spectrum measurement. For instance, a spectrophotofluorometer F-7000 manufactured by Hitachi High-Tech Science Corporation can be used for the measurement.

A difference between an absorption local maximum wavelength and a fluorescence local maximum wavelength is calculated from the absorption spectrum and the fluorescence spectrum to obtain a Stokes shift (SS). A unit of the Stokes shift (SS) is denoted by nm.

In the organic EL device according to the exemplary embodiment, a triplet energy of the second emitting compound $T_1(D2)$ and the triplet energy of the second host material $T_1(H2)$ preferably satisfy a relationship of a numerical formula (Numerical Formula 8) below.

$$T_1(D2)>T_1(H2) \quad \text{(Numerical Formula 8)}$$

In the organic EL device according to the exemplary embodiment, when the second emitting compound and the second host material satisfy the relationship of the numerical formula (Numerical Formula 8), in transfer of triplet excitons generated in the first emitting layer to the second emitting layer, the triplet excitons energy-transfer not onto the second emitting compound having higher triplet energy but onto molecules of the second host material. In addition, triplet excitons generated by recombination of holes and electrons on the second host material do not transfer to the second emitting compound having higher triplet energy. Triplet excitons generated by recombination on molecules of the second emitting compound quickly energy-transfer to molecules of the second host material.

Triplet excitons in the second host material do not transfer to the second emitting compound but efficiently collide with one another on the second host material to generate singlet excitons by the TTF phenomenon.

In the organic EL device according to the exemplary embodiment, a singlet energy of the second host material $S_1(H2)$ and a singlet energy of the second emitting compound $S_1(D2)$ preferably satisfy a relationship of a numerical formula (Numerical Formula 7) below.

$$S_1(H2)>S_1(D2) \quad \text{(Numerical Formula 7)}$$

In the organic EL device according to the exemplary embodiment, when the second emitting compound and the second host material satisfy the relationship of the numerical formula (Numerical formula 7), due to the singlet energy of the second emitting compound being smaller than the singlet energy of the second host material, singlet excitons generated by the TTF phenomenon energy-transfer from the second host material to the second emitting compound, thereby contributing to fluorescence of the second emitting compound.

In the organic EL device according to the exemplary embodiment, the second emitting compound is preferably a compound containing no azine ring structure in a molecule thereof.

In the organic EL device according to the exemplary embodiment, the second emitting compound is preferably not a boron-containing complex, more preferably not a complex.

In the organic EL device according to the exemplary embodiment, the second emitting layer preferably does not contain a metal complex. Moreover, in the organic EL device according to the exemplary embodiment, the second emitting layer also preferably does not contain a boron-containing complex.

In the organic EL device according to the exemplary embodiment, the second emitting layer preferably does not contain a phosphorescent material (dopant material).

In addition, the second emitting layer preferably does not contain a heavy-metal complex and a phosphorescent rare earth metal complex. Examples of the heavy-metal complex herein include iridium complex, osmium complex, and platinum complex.

In the organic EL device according to the exemplary embodiment, the second emitting layer preferably contains the second emitting compound at 0.5 mass % or more. That is, the second emitting layer preferably contains the second emitting compound at 0.5 mass % or more, more preferably at 1.0 mass % or more, further preferably at 1.2 mass % or more, further more preferably at 1.5 mass % or more, with respect to the total mass of the second emitting layer.

The second emitting layer preferably contains the second emitting compound at 10 mass % or less, more preferably at 7 mass % or less, further preferably at 5 mass % or less, with respect to the total mass of the second emitting layer.

The second emitting layer preferably contains a second compound as the second host material at 60 mass % or more, more preferably at 70 mass % or more, further preferably at 80 mass % or more, further more preferably at 90 mass % or more, still further preferably at 95 mass % or more, with respect to the total mass of the second emitting layer.

The second emitting layer preferably contains the second host material at 99 mass % or less with respect to the total mass of the second emitting layer.

When the second emitting layer contains the second host material and the second emitting compound, an upper limit of the total of the respective content ratios of the second host material and the second emitting compound is 100 mass %.

It is not excluded that the second emitting layer according to the exemplary embodiment further contains a material(s) other than the second host material and the second emitting compound.

The second emitting layer may include a single type of the second host material or may include two or more types of the second host material. The second emitting layer may include a single type of the second emitting compound or may include two or more types of the second emitting compound.

In the organic EL device according to the exemplary embodiment, a triplet energy of the first emitting compound or the second emitting compound $T_1$(DX), the triplet energy of the first host material $T_1$(H1), and the triplet energy of the second host material $T_1$(H2) preferably satisfy a relationship of a numerical formula (Numerical Formula 10) below.

$$2.6\ \text{eV} > T_1(DX) > T_1(H1) > T_1(H2) \quad \text{(Numerical Formula 10)}$$

The triplet energy of the first emitting compound $T_1$(D1) preferably satisfies a relationship of a numerical formula (Numerical Formula 10A) below.

$$2.6\ \text{eV} > T_1(D1) > T_1(H1) > T_1(H2) \quad \text{(Numerical Formula 10A)}$$

The triplet energy of the second emitting compound $T_1$(D2) preferably satisfies a relationship of a numerical formula (Numerical Formula 10B) below.

$$2.6\ \text{eV} > T_1(D2) > T_1(H1) > T_1(H2) \quad \text{(Numerical Formula 10B)}$$

In the organic EL device according to the exemplary embodiment, the triplet energy of the first emitting compound or the second emitting compound $T_1$(DX) and the triplet energy of the first host material $T_1$(H1) preferably satisfy a relationship of a numerical formula (Numerical Formula 11) below.

$$0\ \text{eV} < T_1(DX) - T_1(H1) < 0.6\ \text{eV} \quad \text{(Numerical Formula 11)}$$

The triplet energy of the first emitting compound $T_1$(D1) preferably satisfies a relationship of a numerical formula (Numerical Formula 11A) below.

$$0\ \text{eV} < T_1(D1) - T_1(H1) < 0.6\ \text{eV} \quad \text{(Numerical Formula 11A)}$$

The triplet energy of the second emitting compound $T_1$(D2) preferably satisfies a relationship of a numerical formula (Numerical Formula 11B) below.

$$0\ \text{eV} < T_1(D2) - T_1(H2) < 0.8\ \text{eV} \quad \text{(Numerical Formula 11B)}$$

In the organic EL device according to the exemplary embodiment, the triplet energy of the first host material $T_1$(H1) preferably satisfies a relationship of a numerical formula (Numerical Formula 12) below.

$$T_1(H1) > 2.0\ \text{eV} \quad \text{(Numerical Formula 12)}$$

In the organic EL device according to the exemplary embodiment, the triplet energy of the first host material $T_1$(H1) also preferably satisfies a relationship of a numerical formula (Numerical Formula 12A) below, or also preferably satisfies a relationship of a numerical formula (Numerical Formula 12B) below.

$$T_1(H1) > 2.10\ \text{eV} \quad \text{(Numerical Formula 12A)}$$

$$T_1(H1) > 2.15\ \text{eV} \quad \text{(Numerical Formula 12B)}$$

In the organic EL device according to the exemplary embodiment, when the triplet energy of the first host material $T_1$(H1) satisfies the relationship of the numerical formula (Numerical Formula 12A) or the numerical formula (Numerical Formula 12B), triplet excitons generated in the first emitting layer are easily transferred to the second emitting layer, and also easily inhibited from back-transferring from the second emitting layer to the first emitting layer. Consequently, singlet excitons are efficiently generated in the second emitting layer, thereby improving luminous efficiency.

In the organic EL device according to the exemplary embodiment, the triplet energy of the first host material $T_1$(H1) also preferably satisfies a relationship of a numerical formula (Numerical Formula 12C) below, or also preferably satisfies a relationship of a numerical formula (Numerical Formula 12D) below.

$$2.08\ \text{eV} > T_1(H1) > 1.87\ \text{eV} \quad \text{(Numerical Formula 12C)}$$

$$2.05\ \text{eV} > T_1(H1) > 1.90\ \text{eV} \quad \text{(Numerical Formula 12D)}$$

In the organic EL device according to the exemplary embodiment, when the triplet energy of the first host material $T_1$(H1) satisfies the relationship of the numerical formula (Numerical Formula 12C) or the numerical formula (Numerical Formula 12D), energy of the triplet excitons generated in the first emitting layer is reduced, so that the organic EL device can be expected to have a longer lifetime.

In the organic EL device according to the exemplary embodiment, the triplet energy of the first emitting compound $T_1$(D1) also preferably satisfies a relationship of a numerical formula (Numerical Formula 14A) below, or also preferably satisfies a relationship of a numerical formula (Numerical Formula 14B) below.

$$2.60\ \text{eV} > T_1(D1) \quad \text{(Numerical Formula 14A)}$$

$$2.50\ \text{eV} > T_1(D1) \quad \text{(Numerical Formula 14B)}$$

When the first emitting layer contains the first emitting compound that satisfies the relationship of the numerical formula (Numerical Formula 14A) or (Numerical Formula 14B), the organic EL device has a longer lifetime.

In the organic EL device according to the exemplary embodiment, the triplet energy of the second emitting compound $T_1$(D2) also preferably satisfies a relationship of a numerical formula (Numerical Formula 14C) below, or also preferably satisfies a relationship of a numerical formula (Numerical Formula 14D) below.

$$2.60\ \text{eV} > T_1(D2) \qquad \text{(Numerical Formula 14C)}$$

$$2.50\ \text{eV} > T_1(D2) \qquad \text{(Numerical Formula 14D)}$$

When the second emitting layer contains the compound that satisfies the relationship of the numerical formula (Numerical Formula 14C) or (Numerical Formula 14D), the organic EL device has a longer lifetime.

In the organic EL device according to the exemplary embodiment, the triplet energy of the second host material $T_1$(H2) also preferably satisfies a relationship of a numerical formula (Numerical Formula 13) below.

$$T_1(H2) > 1.9\ \text{eV} \qquad \text{(Numerical Formula 13)}$$

In the organic EL device according to the exemplary embodiment, the triplet energy of the second host material $T_1$(H2) also preferably satisfies a relationship of a numerical formula (Numerical Formula 13A) below.

$$1.9\ \text{eV} \geq T_1(H2) \geq 1.8\ \text{eV} \qquad \text{(Numerical Formula 13A)}$$

In the organic EL device according to the exemplary embodiment, when the first emitting layer and the second emitting layer are laminated in this order from the anode, it is also preferable that an electron mobility of the first host material μe(H1) and an electron mobility of the second host material μe(H2) satisfy a relationship of a numerical formula (Numerical Formula 30) below.

$$\mu e(H2) > \mu e(H1) \qquad \text{(Numerical Formula 30)}$$

When the first host material and the second host material satisfy the relationship of the numerical formula (Numerical Formula 30), a recombination ability between holes and electrons in the first emitting layer is improved.

In the organic EL device according to the exemplary embodiment, when the first emitting layer and the second emitting layer are laminated in this order from the anode, it is also preferable that a hole mobility of the first host material μh(H1) and a hole mobility of the second host material μh(H2) satisfy a relationship of a numerical formula (Numerical Formula 31) below.

$$\mu h(H1) > \mu h(H2) \qquad \text{(Numerical Formula 31)}$$

In the organic EL device according to the exemplary embodiment, when the first emitting layer and the second emitting layer are laminated in this order from the anode, it is also preferable that the hole mobility of the first host material μh(H1), the electron mobility of the first host material μe(H1), the hole mobility of the second host material μh(H2) and the electron mobility of the second host material μe(H2) satisfy a relationship of a numerical formula (Numerical Formula 32) below.

$$(\mu e(H2)/\mu h(H2)) > (\mu e(H1)/\mu h(H1)) \qquad \text{(Numerical Formula 32)}$$

The electron mobility can be measured according to an impedance measurement using a mobility evaluation device manufactured by the following steps. The mobility evaluation device is, for instance, manufactured by the following steps.

A compound Target, which is to be measured for an electron mobility, is vapor-deposited on a glass substrate having an aluminum electrode (anode) so as to cover the aluminum electrode, thereby forming a measurement target layer. A compound ET-A below is vapor-deposited on this measurement target layer to form an electron transporting layer. LiF is vapor-deposited on this formed electron transporting layer to form an electron injecting layer. Metal aluminum (Al) is vapor-deposited on this formed electron injecting layer to form a metal cathode.

An arrangement of the mobility evaluation device above is roughly shown as follows.

Glass/Al(50)/Target(200)/ET-A(10)/LiF(1)/Al(50)

Numerals in parentheses represent a film thickness (nm).

ET-A

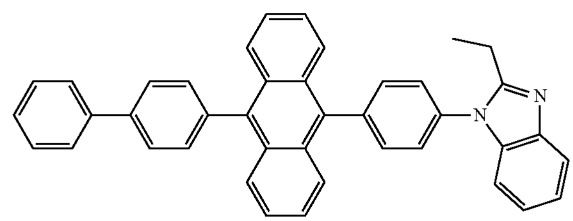

The mobility evaluation device for an electron mobility is set in an impedance measurement device to perform an impedance measurement. In the impedance measurement, a measurement frequency is swept from 1 Hz to 1 MHz. At this time, an alternating current amplitude of 0.1 V and a direct current voltage V are applied to the device. A modulus M is calculated from a measured impedance Z using a relationship of a calculation formula (C1) below.

$$M = j\omega Z \qquad \text{Calculation formula (C1):}$$

In the calculation formula (C1), j is an imaginary unit whose square is −1 and ω is an angular frequency [rad/s].

In a bode plot in which an imaginary part of the modulus M is represented by an ordinate axis and the frequency [Hz] is represented by an abscissa axis, an electrical time constant τ of the mobility evaluation device is obtained from a frequency fmax showing a peak using a calculation formula (C2) below.

$$\tau = 1/(2\pi f\text{max}) \qquad \text{Calculation formula (C2):}$$

π in the calculation formula (C2) is a symbol representing a circumference ratio.

An electron mobility μe is calculated from a relationship of a calculation formula (C3-1) below using τ.

$$\mu e = d^2/(V\tau) \qquad \text{Calculation formula (C3-1):}$$

d in the calculation formula (C3-1) is a total film thickness of organic thin film(s) forming the device. In a case of the arrangement of the mobility evaluation device for an electron mobility, d=210 [nm] is satisfied.

The hole mobility can be measured according to an impedance measurement using a mobility evaluation device manufactured by the following steps. The mobility evaluation device is, for instance, manufactured by the following steps.

A compound HA-2 below is vapor-deposited on a glass substrate having an ITO transparent electrode (anode) so as to cover the transparent electrode, thereby forming a hole injecting layer. A compound HT-A below is vapor-deposited on this formed hole injecting layer to form a hole transporting layer. Subsequently, a compound Target, which is to be measured for a hole mobility, is vapor-deposited to form a measurement target layer. Metal aluminum (Al) is vapor-deposited on this measurement target layer to form a metal cathode.

An arrangement of the mobility evaluation device above is roughly shown as follows.

ITO(130)/HA-2(5)/HT-A(10)/Target(200)/Al(80)

Numerals in parentheses represent a film thickness (nm).

HA-2

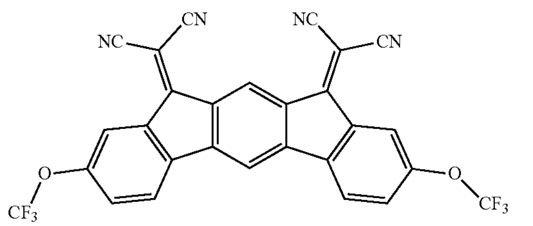

HT-A

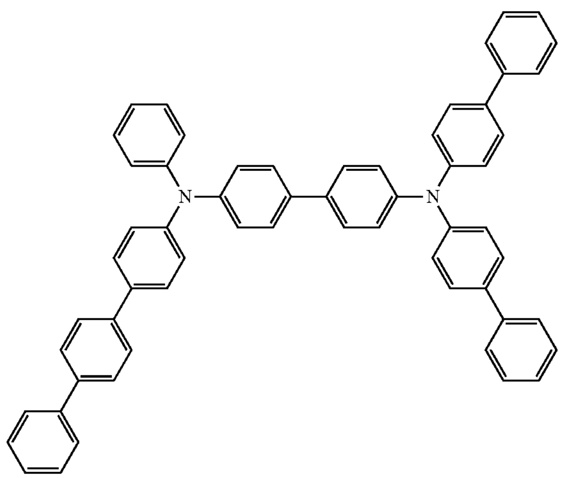

The mobility evaluation device for a hole mobility is set in an impedance measurement device to perform an impedance measurement. In the impedance measurement, a measurement frequency is swept from 1 Hz to 1 MHz. At this time, an alternating current amplitude of 0.1 V and a direct current voltage V are applied to the device. A modulus M is calculated from a measured impedance Z using the relationship of the calculation formula (C1).

In a bode plot in which an imaginary part of the modulus M is represented by an ordinate axis and the frequency [Hz] is represented by an abscissa axis, an electrical time constant τ of the mobility evaluation device is obtained from a frequency fmax showing a peak using the calculation formula (C2).

A hole mobility μh is calculated from a relationship of a calculation formula (C3-2) below using τ obtained from the calculation formula (C2).

Calculation formula (C3-2): $\mu h = d^2/(V\tau)$ d in the calculation formula (C3-2) is a total film thickness of organic thin film(s) forming the device. In a case of the arrangement of the mobility evaluation device for a hole mobility, d=215 [nm] is satisfied.

The electron mobility and the hole mobility herein are each a value obtained in a case where a square root of an electric field intensity meets $E^{1/2}=500$ [$V^{1/2}/cm^{1/2}$].

The square root of an electric field intensity, $E^{1/2}$, can be calculated from a relationship of a calculation formula (C4) below.

$$E^{1/2}=V^{1/2}/d^{1/2} \quad \text{Calculation formula (C4):}$$

For the impedance measurement, a 1260 type by Solartron Analytical is used as the impedance measurement device, and for a higher accuracy, a 1296 type dielectric constant measurement interface by Solartron Analytical can be used together therewith.

In the organic EL device according to the exemplary embodiment, the first emitting layer and the second emitting layer are preferably in direct contact with each other.

Herein, a layer arrangement in which the first emitting layer and the second emitting layer are in direct contact with each other can include one of embodiments (LS1), (LS2) and (LS3) below.

(LS1) An embodiment in which a region containing both the first host material and the second host material is generated in a process of vapor-depositing the compound of the first emitting layer and vapor-depositing the compound of the second emitting layer, and is present on the interface between the first emitting layer and the second emitting layer.

(LS2) An embodiment in which in a case of containing an emitting compound in the first emitting layer and the second emitting layer, a region containing all of the first host material, the second host material and the emitting compound is generated in a process of vapor-depositing the compound of the first emitting layer and vapor-depositing the compound of the second emitting layer, and is present on the interface between the first emitting layer and the second emitting layer.

(LS3) An embodiment in which in a case of containing an emitting compound in the first emitting layer and the second emitting layer, a region containing the emitting compound, a region containing the first host material or a region containing the second host material is generated in a process of vapor-depositing the compound of the first emitting layer and vapor-depositing the compound of the second emitting layer, and is present on the interface between the first emitting layer and the second emitting layer.

Third Emitting Layer

The organic EL device according to the exemplary embodiment may further include a third emitting layer.

The third emitting layer preferably contains a third host material. The first host material, the second host material and the third host material are preferably different from each other.

The third emitting layer preferably contains a third emitting compound. A maximum peak wavelength of the third emitting compound is preferably 500 nm or less. The third emitting compound is preferably a fluorescent compound that exhibits fluorescence having a maximum peak wavelength of 500 nm or less. A measurement method of the maximum peak wavelength of a compound is as described above. The first emitting compound, the second emitting compound and the third emitting compound are mutually the same or different.

When the organic EL device according to the exemplary embodiment includes the third emitting layer, the triplet energy of the first host material $T_1(H1)$ and a triplet energy of the third host material $T_1(H3)$ preferably satisfy a relationship of a numerical formula (Numerical Formula 1C) below.

$$T_1(H1)>T_1(H3) \quad \text{(Numerical Formula 1C)}$$

When the organic EL device according to the exemplary embodiment includes the third emitting layer, the triplet energy of the second host material $T_1(H2)$ and the triplet energy of the third host material $T_1(H3)$ also preferably satisfy a relationship of a numerical formula (Numerical Formula 1 D) below, or also preferably satisfy a relationship of a numerical formula (Numerical Formula 1E) below.

$$T_1(H3)>T_1(H2) \quad \text{(Numerical Formula 1D)}$$

$$T_1(H1)>T_1(H3)>T_1(H2) \quad \text{(Numerical Formula 1E)}$$

When the organic EL device according to the exemplary embodiment includes the third emitting layer, the triplet energy of the second host material $T_1(H2)$ and the triplet energy of the third host material $T_1(H3)$ also preferably satisfy a relationship of a numerical formula (Numerical Formula 1F) below, or also preferably satisfy a relationship of a numerical formula (Numerical Formula 1G) below.

$$T_1(H2)>T_1(H3) \quad \text{(Numerical Formula 1F)}$$

$$T_1(H1)>T_1(H2)>T_1(H3) \quad \text{(Numerical Formula 1G)}$$

When the organic EL device according to the exemplary embodiment includes the third emitting layer, the first emitting layer may be in direct contact with the second emitting layer and the second emitting layer may be in direct contact with the third emitting layer.

Herein, a layer arrangement in which the second emitting layer and the third emitting layer are in direct contact with each other can include one of embodiments (LS4), (LS5) and (LS6) below.

(LS4) An embodiment in which a region containing both the second host material and the third host material is generated in a process of vapor-depositing the compound of the second emitting layer and vapor-depositing the compound of the third emitting layer, and is present on the interface between the second emitting layer and the third emitting layer.

(LS5) An embodiment in which in a case of containing an emitting compound in the second emitting layer and the third emitting layer, a region containing all of the second host material, the third host material and the emitting compound is generated in a process of vapor-depositing the compound of the second emitting layer and vapor-depositing the compound of the third emitting layer, and is present on the interface between the second emitting layer and the third emitting layer.

(LS6) An embodiment in which in a case of containing an emitting compound in the second emitting layer and the third emitting layer, a region containing the emitting compound, a region containing the second host material or a region containing the third host material is generated in a process of vapor-depositing the compound of the second emitting layer and vapor-depositing the compound of the third emitting layer, and is present on the interface between the second emitting layer and the third emitting layer.

Interposed Layer

The organic EL device according to the exemplary embodiment may include an interposed layer as an organic layer disposed between the first emitting layer and the second emitting layer.

In the exemplary embodiment, in order to inhibit an overlap between a Singlet emitting region and a TTF emitting region, the interposed layer contains no emitting compound or may contain an emitting compound in an insubstantial amount provided that the overlap can be inhibited.

For instance, the interposed layer contains 0 mass % of an emitting compound. Alternatively, for instance, the interposed layer may contain an emitting compound provided that the emitting compound contained is a component accidentally mixed in a manufacturing process or a component contained as impurities in a material.

For instance, when the interposed layer consists of a material A, a material B, and a material C, the content ratios of the materials A, B, and C in the interposed layer are each 10 mass % or more, and the total of the content ratios of the materials A, B, and C is 100 mass %.

In the following, the interposed layer is occasionally referred to as a "non-doped layer". A layer containing an emitting compound is occasionally referred to as a "doped layer".

It is considered that the Singlet emitting region and the TTF emitting region are typically likely to be separated from each other in laminated emitting layers, thus improving luminous efficiency.

In the organic EL device according to the exemplary embodiment, when the interposed layer (non-doped layer) is disposed between the first emitting layer and the second emitting layer in the emitting region, it is expected that a region where the Singlet emitting region and the TTF emitting region overlap with each other is reduced to inhibit a decrease in TTF efficiency caused by collision between triplet excitons and carriers. That is, it is considered that providing the interposed layer (non-doped layer) between the emitting layers contributes to the improvement in the efficiency of TTF emission.

The interposed layer is the non-doped layer.

The interposed layer contains no metal atom. The interposed layer thus contains no metal complex.

The interposed layer contains an interposed layer material. The interposed layer material is not an emitting compound.

The interposed layer material may be any material except for the emitting compound.

Examples of the interposed layer material include: 1) a heterocyclic compound such as an oxadiazole derivative, benzimidazole derivative, or phenanthroline derivative; 2) a fused aromatic compound such as a carbazole derivative, anthracene derivative, phenanthrene derivative, pyrene derivative or chrysene derivative; and 3) an aromatic amine compound such as a triarylamine derivative or a fused polycyclic aromatic amine derivative.

One or both of the first host material and the second host material may be used as the interposed layer material. The interposed layer material may be any material provided that the Singlet emitting region and the TTF emitting region are separated from each other and the Singlet emission and the TTF emission are not hindered.

In the organic EL device according to the exemplary embodiment, the respective content ratios of all the materials forming the interposed layer in the interposed layer are 10 mass % or more.

The interposed layer contains the interposed layer material as a material forming the interposed layer.

The interposed layer preferably contains 60 mass % or more of the interposed layer material, more preferably contains 70 mass % or more of the interposed layer material, further preferably contains 80 mass % or more of the interposed layer material, more further preferably 90 mass % or more of the interposed layer material, still further more preferably 95 mass % or more of the interposed layer material, with respect to the total mass of the interposed layer.

The interposed layer may contain a single type of the interposed layer material or may contain two or more types of the interposed layer material.

When the interposed layer contains two or more types of the interposed layer material, an upper limit of the total of the content ratios of the two or more types of the interposed layer material is 100 mass %.

It should be noted that the interposed layer of the exemplary embodiment may further contain material(s) other than the interposed layer material.

The interposed layer may be provided in the form of a single layer or a laminate of two or more layers.

As long as the overlap between the Singlet emitting region and the TTF emitting region is inhibited, a film thickness of the interposed layer is not particularly limited but each layer in the interposed layer is preferably in a range from 3 nm to 15 nm, more preferably in a range from 5 nm to 10 nm.

The interposed layer having a film thickness of 3 nm or more easily separates the Singlet emitting region from the emitting region derived from TTF.

The interposed layer having a film thickness of 15 nm or less easily inhibits a phenomenon where the host material of the interposed layer emits light.

It is preferable that the interposed layer contains the interposed layer material as a material forming the interposed layer and the triplet energy of the first host material $T_1(H1)$, the triplet energy of the second host material $T_1(H2)$, and a triplet energy of at least one interposed layer material $T_1(M_{mid})$ satisfy a relationship of a numerical formula (Numerical Formula 21) below.

$$T_1(H1) \geq T_1(M_{mid}) \geq T_1(H2) \quad \text{(Numerical Formula 21)}$$

When the interposed layer contains two or more interposed layer materials as a material forming the interposed layer, the triplet energy of the first host material $T_1(H1)$, the triplet energy of the second host material $T_1(H2)$, and a triplet energy of each interposed layer material $T_1(M_{EA})$ more preferably satisfy a relationship of a numerical formula (Numerical Formula 21A) below.

$$T_1(H1) \geq T_1(M_{EA}) \geq T_1(H2) \quad \text{(Numerical Formula 21A)}$$

Additional Layers of Organic EL Device

The organic EL device according to the exemplary embodiment may include one or more organic layer(s) in addition to the first emitting layer and the second emitting layer. Examples of the organic layer include, for instance, at least one layer selected from the group consisting of a hole injecting layer, a hole transporting layer, an electron blocking layer, a hole blocking layer, an electron injecting layer and an electron transporting layer.

In the organic EL device according to the exemplary embodiment, the organic layer may consist of the first emitting layer and the second emitting layer. Alternatively, the organic layer may further include, for instance, at least one layer selected from the group consisting of the hole injecting layer, the hole transporting layer, the electron blocking layer, the hole blocking layer, the electron injecting layer and the electron transporting layer.

In the organic EL device according to the exemplary embodiment, the first emitting layer is also preferably disposed between the anode and the second emitting layer.

In the organic EL device according to the exemplary embodiment, the second emitting layer is also preferably disposed between the anode and the first emitting layer.

In the organic EL device according to the exemplary embodiment, one of the first emitting layer and the second emitting layer is preferably a layer disposed closest to the cathode among a plurality of layers of the emitting region.

The organic EL device according to the exemplary embodiment may include the anode, the first emitting layer, the second emitting layer, and the cathode in this order, or the order of the first emitting layer and the second emitting layer may be reversed. That is, the organic EL device according to the exemplary embodiment may include the anode, the second emitting layer, the first emitting layer and the cathode in this order. In either of the orders of including the first emitting layer and the second emitting layer, the effect of the laminate arrangement of the first emitting layer and the second emitting layer can be expected by selecting a combination of materials that satisfy the relationship of the numerical formula (Numerical Formula 1).

FIG. 1 schematically shows an exemplary arrangement of the organic EL device of the exemplary embodiment.

An organic EL device 1 includes a light-transmissive substrate 2, an anode 3, a cathode 4, and an organic layer 10 provided between the anode 3 and the cathode 4. The organic layer 10 includes a hole injecting layer 61, a hole transporting layer 62, a first emitting layer 51, a second emitting layer 52, an electron transporting layer 71, and an electron injecting layer 72, which are sequentially laminated on the anode 3. An emitting region 5 of the organic EL device 1 includes the first emitting layer 51 disposed close to the anode 3 and the second emitting layer 52 disposed close to the cathode 4.

FIG. 2 schematically shows another exemplary arrangement of the organic EL device according to the exemplary embodiment.

An organic EL device 1A includes the light-transmissive substrate 2, the anode 3, the cathode 4, and an organic layer 10A provided between the anode 3 and the cathode 4. The organic layer 10A includes the hole injecting layer 61, the hole transporting layer 62, the second emitting layer 52, the first emitting layer 51, the electron transporting layer 71, and the electron injecting layer 72, which are sequentially laminated on the anode 3. An emitting region 5A of the organic EL device 1A includes the second emitting layer 52 disposed close to the anode 3 and the first emitting layer 51 disposed close to the cathode 4.

The invention is not limited to the exemplary arrangements of the organic EL device shown in FIGS. 1 and 2.

An arrangement of an organic EL device will be further described below. It should be noted that the reference numerals will be occasionally omitted below.

Substrate

The substrate is used as a support for the organic EL device. For instance, glass, quartz, plastics and the like are usable for the substrate. A flexible substrate is also usable. The flexible substrate is a bendable substrate, which is exemplified by a plastic substrate. Examples of the material for the plastic substrate include polycarbonate, polyarylate, polyethersulfone, polypropylene, polyester, polyvinyl fluoride, polyvinyl chloride, polyimide, and polyethylene naphthalate. Moreover, an inorganic vapor deposition film is also usable.

Anode

Metal, an alloy, an electrically conductive compound, a mixture thereof, or the like having a large work function (specifically, 4.0 eV or more) is preferably used as the anode formed on the substrate. Specific examples of the material include ITO (Indium Tin Oxide), indium oxide-tin oxide containing silicon or silicon oxide, indium oxide-zinc oxide, indium oxide containing tungsten oxide and zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), and nitrides of a metal material (e.g., titanium nitride) are usable.

The material is typically formed into a film by a sputtering method. For instance, the indium oxide-zinc oxide can be formed into a film by the sputtering method using a target in which zinc oxide in a range from 1 mass % to 10 mass % is added to indium oxide. Moreover, for instance, the indium oxide containing tungsten oxide and zinc oxide can be formed by the sputtering method using a target in which tungsten oxide in a range from 0.5 mass % to 5 mass % and zinc oxide in a range from 0.1 mass % to 1 mass % are added to indium oxide. In addition, the anode may be formed by a vacuum deposition method, a coating method, an inkjet method, a spin coating method or the like.

Among the organic layers formed on the anode, since a hole injecting layer adjacent to the anode is formed of a composite material into which holes are easily injectable irrespective of the work function of the anode, a material usable as an electrode material (e.g., metal, an alloy, an electroconductive compound, a mixture thereof, and the elements belonging to the group 1 or 2 of the periodic table) is also usable for the anode.

A material having a small work function such as elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), alloys including the rare earth metal are also usable for the anode. It should be noted that the vacuum deposition method and the sputtering method are usable for forming the anode using the alkali metal, alkaline earth metal and the alloy thereof. Further, when a silver paste is used for the anode, the coating method and the inkjet method are usable.

Cathode

It is preferable to use metal, an alloy, an electroconductive compound, a mixture thereof, or the like having a small work function (specifically, 3.8 eV or less) for the cathode. Examples of the material for the cathode include elements belonging to Groups 1 and 2 in the periodic table of the elements, specifically, the alkali metal such as lithium (Li) and cesium (Cs), the alkaline earth metal such as magnesium (Mg), calcium (Ca) and strontium (Sr), alloys (e.g., MgAg and AlLi) including the alkali metal or the alkaline earth metal, the rare earth metal such as europium (Eu) and ytterbium (Yb), and alloys including the rare earth metal.

It should be noted that the vacuum deposition method and the sputtering method are usable for forming the cathode using the alkali metal, alkaline earth metal and the alloy thereof. Further, when a silver paste is used for the cathode, the coating method and the inkjet method are usable.

By providing the electron injecting layer, various conductive materials such as Al, Ag, ITO, graphene, and indium oxide-tin oxide containing silicon or silicon oxide may be used for forming the cathode regardless of the work function. The conductive materials can be formed into a film using the sputtering method, inkjet method, spin coating method and the like.

Hole Injecting Layer

The hole injecting layer is a layer containing a substance exhibiting a high hole injectability. Examples of the substance exhibiting a high hole injectability include molybdenum oxide, titanium oxide, vanadium oxide, rhenium oxide, ruthenium oxide, chrome oxide, zirconium oxide, hafnium oxide, tantalum oxide, silver oxide, tungsten oxide, and manganese oxide.

In addition, the examples of the highly hole-injectable substance further include: an aromatic amine compound, which is a low-molecule organic compound, such as 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1); and dipyrazino[2,3-f:20,30-h]quinoxaline-2,3,6,7,10,11-hexacarbonitrile (HAT-CN).

In addition, a high polymer compound (e.g., oligomer, dendrimer and polymer) is usable as the substance exhibiting a high hole injectability. Examples of the high polymer compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), and poly[N,N'-bis(4-butylphenyl)-N,N'-bis(phenyl)benzidine] (abbreviation: Poly-TPD). Moreover, an acid-added high polymer compound such as poly(3,4-ethylenedioxythiophene)/poly(styrene sulfonic acid) (PEDOT/PSS) and polyaniline/poly(styrene sulfonic acid) (PAni/PSS) are also usable.

Hole Transporting Layer

The hole transporting layer is a layer containing a highly hole-transporting substance. An aromatic amine compound, carbazole derivative, anthracene derivative and the like are usable for the hole transporting layer. Specific examples of a material for the hole transporting layer include an aromatic amine compound such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluorene-9-yl)triphenylamine (abbreviation: BAFLP), 4,4'-bis[N-(9,9-dimethylfluorene-2-yl)-N-phenylamino]biphenyl (abbreviation: DFLDPBi), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB). The above-described substances mostly have an electron mobility of $10^{-6}$ $cm^2/(V \cdot s)$ or more.

For the hole transporting layer, a carbazole derivative such as CBP, 9-[4-(N-carbazolyl)]phenyl-10-phenylanthracene (CzPA), and 9-phenyl-3-[4-(10-phenyl-9-anthryl)phenyl]-9H-carbazole (PCzPA) and an anthracene derivative such as t-BuDNA, DNA, and DPAnth may be used. A high polymer compound such as poly(N-vinylcarbazole) (abbreviation: PVK) and poly(4-vinyltriphenylamine) (abbreviation: PVTPA) is also usable.

However, in addition to the above substances, any substance exhibiting a higher hole transportability than an electron transportability may be used. It should be noted that the layer containing the substance exhibiting a high hole transportability may be not only a single layer but also a laminate of two or more layers formed of the above substance(s).

Electron Transporting Layer

The electron transporting layer is a layer containing a highly electron-transporting substance. For the electron transporting layer, 1) a metal complex such as an aluminum complex, beryllium complex, and zinc complex, 2) a hetero aromatic compound such as imidazole derivative, benzimidazole derivative, azine derivative, carbazole derivative, and phenanthroline derivative, and 3) a high polymer compound are usable. Specifically, as a low-molecule organic compound, a metal complex such as Alq, tris(4-methyl-8-quinolinato)aluminum (abbreviation: $Almq_3$), bis(10-hydroxybenzo[h]quinolinato)beryllium (abbreviation: $BeBq_2$), BAlq, Znq, ZnPBO and ZnBTZ is usable. In addition to the metal complex, a heteroaromatic compound such as 2-(4-biphenylyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) is usable. In the exemplary embodiment, a benzimidazole compound is preferably usable. The above-described substances mostly have an electron mobility of $10^{-6}$ $cm^2/Vs$ or more. It should be noted that any substance other than the above substance may be used for the electron transporting layer as long as the substance exhibits a higher electron transportability than the hole transportability. The electron transporting layer may be provided in the form of a single layer or a laminate of two or more layers of the above substance(s).

Further, a high polymer compound is usable for the electron transporting layer. For instance, poly[(9,9-dihexylfluorene-2,7-diyl)-co-(pyridine-3,5-diyl)](abbreviation: PF-Py), poly[(9,9-dioctylfluorene-2,7-diyl)-co-(2,2'-bipyridine-6,6'-diyl)](abbreviation: PF-BPy) and the like are usable.

Electron Injecting Layer

The electron injecting layer is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride ($CaF_2$), and lithium oxide (LiOx). In addition, the alkali metal, alkaline earth metal or the compound thereof may be added to the substance exhibiting the electron transportability in use. Specifically, for instance, magnesium (Mg) added to Alq may be used. In this case, the electrons can be more efficiently injected from the cathode.

Alternatively, the electron injecting layer may be provided by a composite material in a form of a mixture of the organic compound and the electron donor. Such a composite material exhibits excellent electron injectability and electron transportability since electrons are generated in the organic compound by the electron donor. In this case, the organic compound is preferably a material excellent in transporting the generated electrons. Specifically, the above examples (e.g., the metal complex and the hetero aromatic compound) of the substance forming the electron transporting layer are usable. As the electron donor, any substance exhibiting electron donating property to the organic compound is usable. Specifically, the electron donor is preferably alkali metal, alkaline earth metal and rare earth metal such as lithium, cesium, magnesium, calcium, erbium and ytterbium. The electron donor is also preferably alkali metal oxide and alkaline earth metal oxide such as lithium oxide, calcium oxide, and barium oxide. Moreover, a Lewis base such as magnesium oxide is usable. Further, the organic compound such as tetrathiafulvalene (abbreviation: TTF) is usable.

Layer Formation Method(s)

A method for forming each layer of the organic EL device in the exemplary embodiment is subject to no limitation except for the above particular description. However, known methods of dry film-forming such as vacuum deposition, sputtering, plasma or ion plating and wet film-forming such as spin coating, dipping, flow coating or ink-jet are applicable.

Film Thickness

A film thickness of each of the organic layers of the organic EL device in the exemplary embodiment is not limited unless otherwise specified in the above. In general, the thickness preferably ranges from several nanometers to 1 μm because excessively small film thickness is likely to cause defects (e.g. pin holes) and excessively large thickness leads to the necessity of applying high voltage and consequent reduction in efficiency.

Second Host Material and Third Host Material

In the organic EL device according to the exemplary embodiment, although the second host material and the third host material are not particularly limited, examples of the second host material and the third host material include the second compound represented by a formula (2) below.

Second Compound

In the organic EL device according to the exemplary embodiment, the second compound is preferably a compound represented by the formula (2). The second host material is preferably the second compound represented by the formula (2).

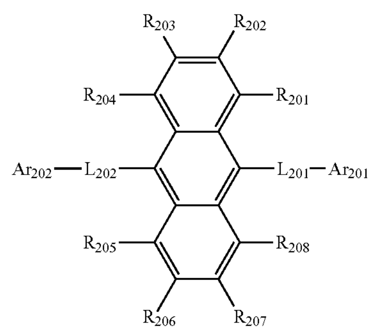

(2)

In the formula (2):

$R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—($R_{904}$), a group represented by —S—($R_{905}$), a group represented by —$N(R_{906})(R_{907})$, a substituted or unsubstituted aralkyl group having 7 to 50 carbon atoms, a group represented by —C(═O)$R_{801}$, a group represented by —$COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the second compound according to the exemplary embodiment, $R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

In the organic EL device according to the exemplary embodiment, it is preferable that: $R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(═O)$R_{801}$, a group represented by —COO$R_{802}$, a halogen atom, a cyano group, or a nitro group; $L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the organic EL device according to the exemplary embodiment, it is preferable that: $L_{201}$ and $L_{202}$ are each independently a single bond, or a substituted or unsubstituted arylene group having 6 to 50 ring carbon atoms; and $Ar_{201}$ and $Ar_{202}$ are each independently a substituted or unsubstituted aryl group having 6 to 50 ring carbon atoms.

In the organic EL device according to the exemplary embodiment, it is preferable that: $Ar_{201}$ and $Ar_{202}$ are each independently a phenyl group, a naphthyl group, a phenanthryl group, a biphenyl group, a terphenyl group, a diphenylfluorenyl group, a dimethylfluorenyl group, a benzodiphenylfluorenyl group, a benzodimethylfluorenyl group, dibenzofuranyl group, a dibenzothienyl group, a naphthobenzofuranyl group, or a naphthobenzothienyl group.

In the organic EL device according to the exemplary embodiment, the second compound represented by the formula (2) is preferably a compound represented by a formula (201), (202), (203), (204), (205), (206), (207), (208) or (209) below.

(201)

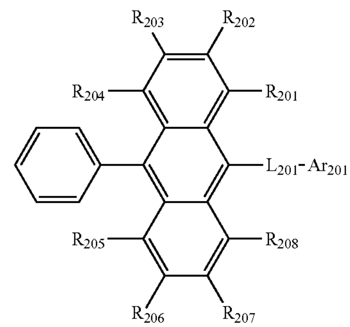

(202)

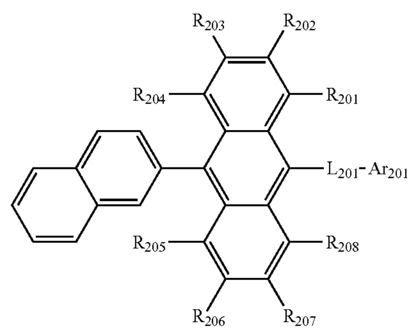

(203)

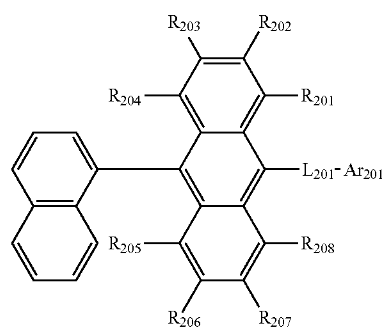

(204)

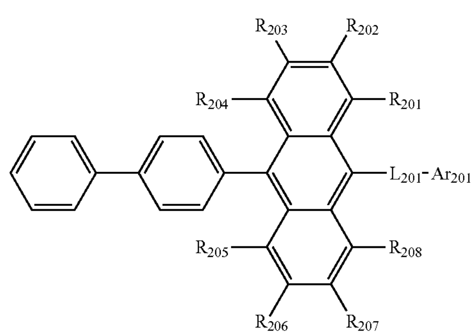

-continued
(205)
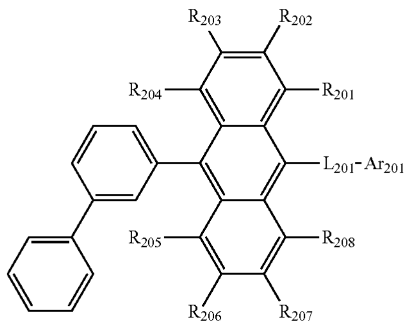
(206)
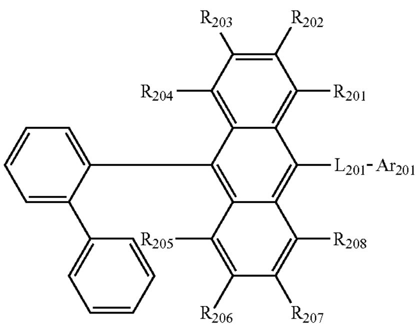
(207)
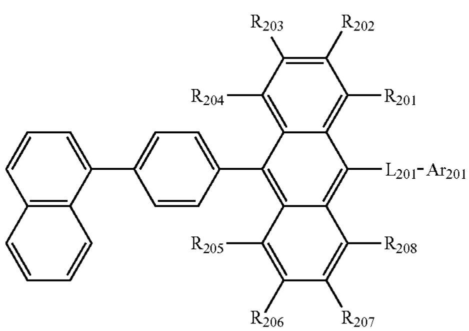
(208)
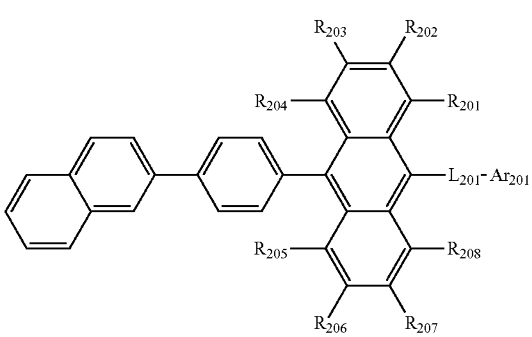
-continued
(209)
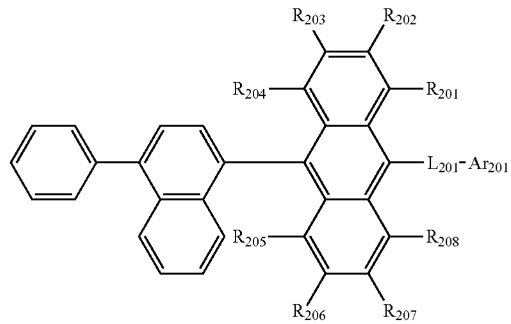
In the formulae (201) to (209):
$L_{201}$ and $Ar_{201}$ represent the same as $L_{201}$ and $Ar_{201}$ in the formula (2); and
$R_{201}$ to $R_{208}$ each independently represent the same as $R_{201}$ to $R_{208}$ in the formula (2).
The second compound represented by the formula (2) is also preferably a compound represented by a formula (221), (222), (223), (224), (225), (226), (227), (228) or (229) below.
(221)
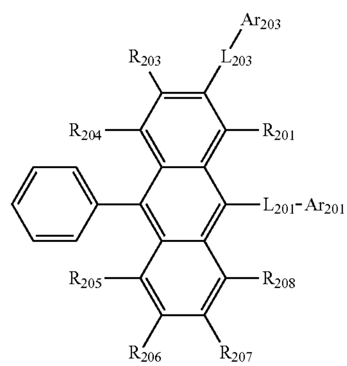
(222)
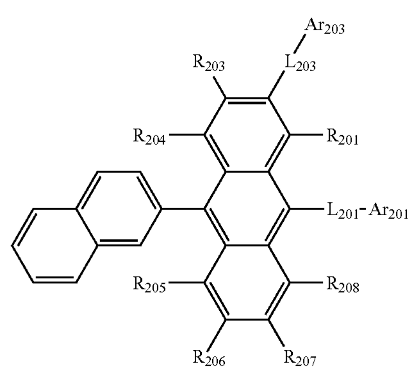

-continued (223)

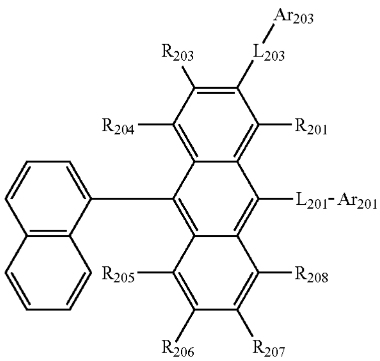

(224)

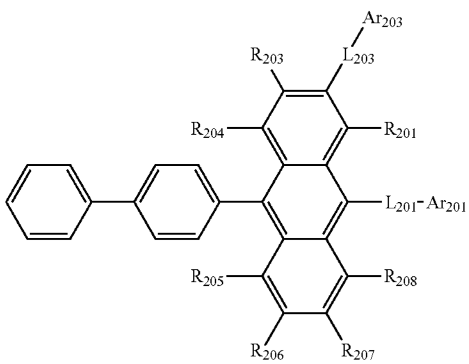

(225)

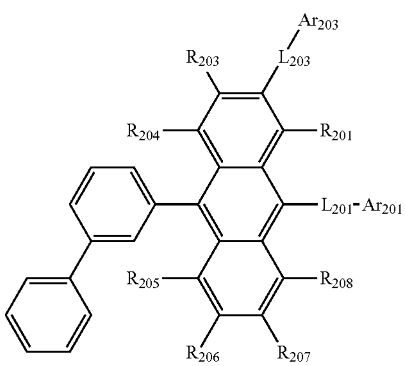

(226)

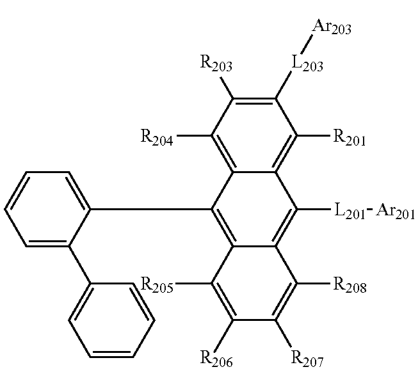

-continued (227)

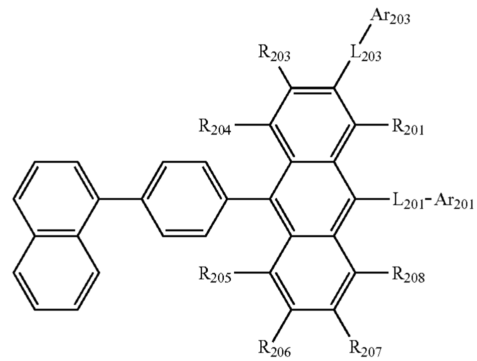

(228)

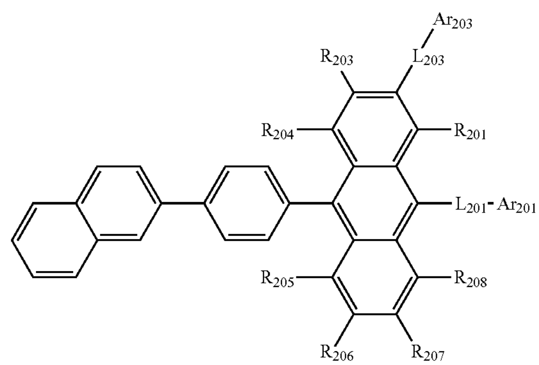

(229)

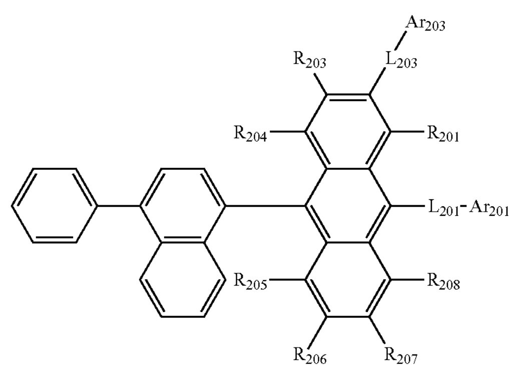

In the formulae (221), (222), (223), (224), (225), (226), (227), (228) and (229):

$R_{201}$ and $R_{203}$ to $R_{208}$ each independently represent the same as $R_{201}$ and $R_{203}$ to $R_{208}$ in the formula (2);

$L_{201}$ and $Ar_{201}$ respectively represent the same as $L_{201}$ and $Ar_{201}$ in the formula (2);

$L_{203}$ represents the same as $L_{201}$ in the formula (2);

$L_{203}$ and $L_{201}$ are mutually the same or different;

$Ar_{203}$ represents the same as $Ar_{201}$ in the formula (2); and $Ar_{203}$ and $Ar_{201}$ are mutually the same or different.

The second compound represented by the formula (2) is also preferably a compound represented by a formula (241), (242), (243), (244), (245), (246), (247), (248) or (249) below.

(241)
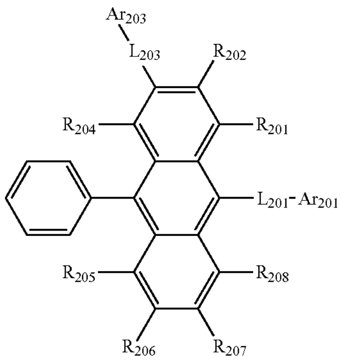
(242)
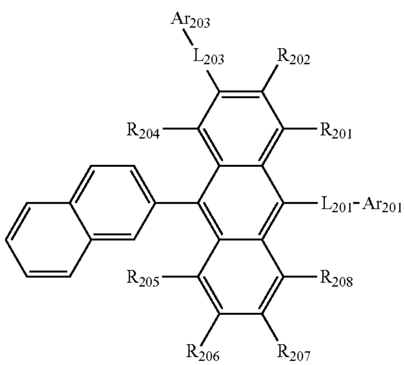
(243)
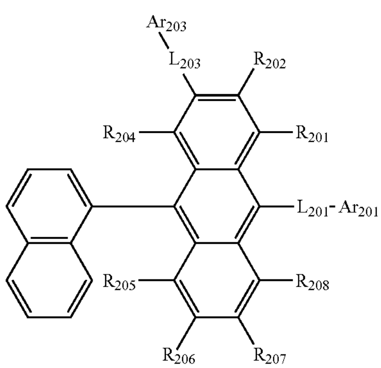
(244)
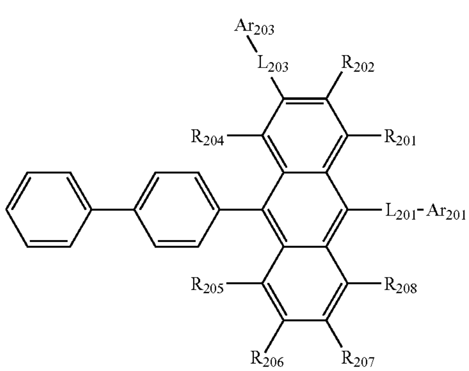
-continued
(245)
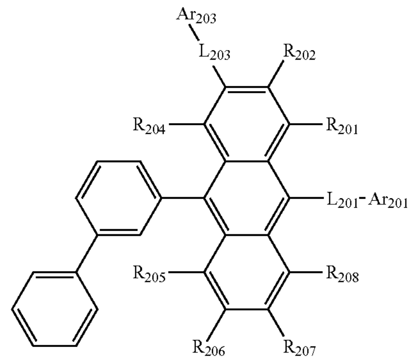
(246)
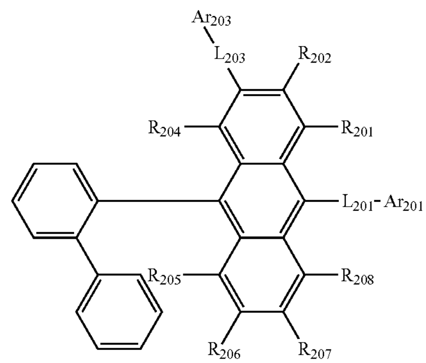
(247)
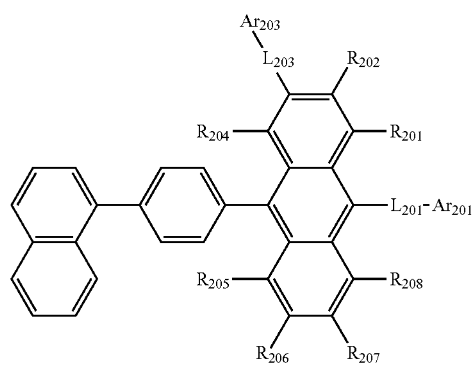
(248)
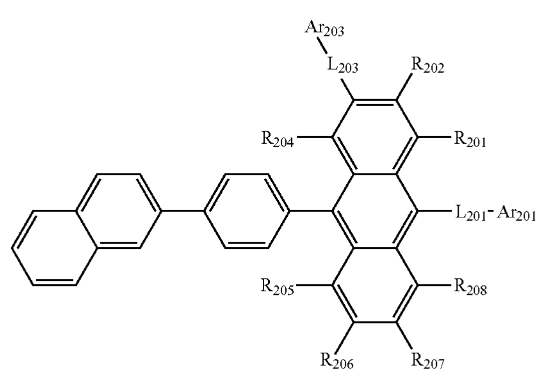

-continued (249)

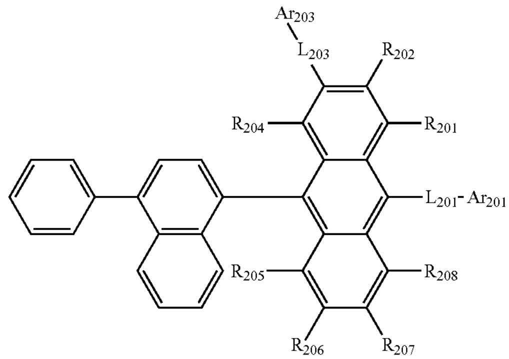

In the formulae (241), (242), (243), (244), (245), (246), (247), (248) and (249):

$R_{201}$, $R_{202}$ and $R_{204}$ to $R_{208}$ each independently represent the same as $R_{201}$, $R_{202}$ and $R_{204}$ to $R_{208}$ in the formula (2);

$L_{201}$ and $Ar_{201}$ respectively represent the same as $L_{201}$ and $Ar_{201}$ in the formula (2);

$L_{203}$ represents the same as $L_{201}$ in the formula (2);

$L_{203}$ and $L_{201}$ are mutually the same or different;

$Ar_{203}$ represents the same as $Ar_{201}$ in the formula (2); and $Ar_{203}$ and $Ar_{201}$ are mutually the same or different.

In the second compound represented by the formula (2), it is preferable that $R_{201}$ to $R_{208}$ are each independently a hydrogen atom, a substituted or unsubstituted alkyl group having 1 to 50 carbon atoms, a substituted or unsubstituted cycloalkyl group having 3 to 50 ring carbon atoms, or a group represented by —Si($R_{901}$)($R_{902}$)($R_{903}$).

It is preferable that: $L_{201}$ is a single bond, or an unsubstituted arylene group having 6 to 22 ring carbon atoms; and $Ar_{201}$ is a substituted or unsubstituted aryl group having 6 to 22 ring carbon atoms.

In the organic EL device according to the exemplary embodiment, $R_{201}$ to $R_{208}$ that are substituents on an anthracene skeleton in the second compound represented by the formula (2) are preferably hydrogen atoms in terms of preventing inhibition of intermolecular interaction to inhibit a decrease in electron mobility. However, $R_{201}$ to $R_{208}$ may be a substituted or unsubstituted aryl group having 6 to 50 ring carbon atoms or a substituted or unsubstituted heterocyclic group having 5 to 50 ring atoms.

Assuming that $R_{201}$ to $R_{208}$ each are a bulky substituent such as an alkyl group and a cycloalkyl group, intermolecular interaction may be inhibited to decrease the electron mobility of the second compound relative to that of the first host material, so that a relationship of $\mu e(H2)>\mu e(H1)$ shown by the numerical formula (Numerical Formula 30) may not be satisfied. When the second compound is used in the second emitting layer, it can be expected that satisfying the relationship of $\mu e(H2)>\mu e(H1)$ inhibits a decrease in a recombination ability between holes and electrons in the first emitting layer and a decrease in a luminous efficiency. It should be noted that substituents, namely, a haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(═O)$R_{801}$, group represented by —COO$R_{802}$, halogen atom, cyano group, and nitro group are likely to be bulky, and an alkyl group and cycloalkyl group are likely to be further bulky.

In the second compound represented by the formula (2), $R_{201}$ to $R_{208}$, which are the substituents on the anthracene skeleton, are each preferably not a bulky substituent and preferably not an alkyl group and cycloalkyl group. More preferably, $R_{201}$ to $R_{208}$ are not an alkyl group, cycloalkyl group, haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(═O)$R_{801}$, group represented by —COO$R_{802}$, halogen atom, cyano group, and nitro group.

In the organic EL device according to the exemplary embodiment, it is also preferable that $R_{201}$ to $R_{208}$ in the second compound represented by the formula (2) are each independently a hydrogen atom, a substituted or unsubstituted alkyl group having 1 to 50 carbon atoms, a substituted or unsubstituted cycloalkyl group having 3 to 50 ring carbon atoms, or a group represented by —Si($R_{901}$)($R_{902}$)($R_{903}$).

In the organic EL device according to the exemplary embodiment, $R_{201}$ to $R_{208}$ in the second compound represented by the formula (2) are preferably a hydrogen atom.

In the second compound, examples of the substituent for a "substituted or unsubstituted group" on $R_{201}$ to $R_{208}$ also preferably do not include the above-described substituent that is likely to be bulky, especially a substituted or unsubstituted alkyl group and a substituted or unsubstituted cycloalkyl group. Since examples of the substituent for a "substituted or unsubstituted" group on $R_{201}$ to $R_{208}$ do not include a substituted or unsubstituted alkyl group and a substituted or unsubstituted cycloalkyl group, inhibition of intermolecular interaction to be caused by presence of a bulky substituent such as an alkyl group and a cycloalkyl group can be prevented, thereby preventing a decrease in the electron mobility. Moreover, when the second compound described above is used in the second emitting layer, a decrease in a recombination ability between holes and electrons in the first emitting layer and a decrease in the luminous efficiency can be inhibited.

It is more preferable that $R_{201}$ to $R_{208}$, which are the substituents on the anthracene skeleton, are not bulky substituents, and $R_{201}$ to $R_{208}$ as substituents are unsubstituted. Assuming that $R_{201}$ to $R_{208}$, which are the substituents on the anthracene skeleton, are not bulky substituents and substituents are bonded to $R_{201}$ to $R_{208}$ which are the not-bulky substituents, the substituents bonded to $R_{201}$ to $R_{208}$ are preferably not the bulky substituents; the substituents bonded to $R_{201}$ to $R_{208}$ serving as substituents are preferably not an alkyl group and cycloalkyl group, more preferably not an alkyl group, cycloalkyl group, haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(═O)$R_{801}$, group represented by —COO$R_{802}$, halogen atom, cyano group, and nitro group.

In the second compound, all groups described as "substituted or unsubstituted" groups are preferably "unsubstituted" groups.

Manufacturing Method of Second Compound

The second compound can be manufactured by a known method. The second compound can also be manufactured based on a known method through a known alternative reaction using a known material(s) tailored for the target compound.

Specific Examples of Second Compound
Specific examples of the second compound include the following compounds. It should however be noted that the invention is not limited to the specific examples of the second compound.
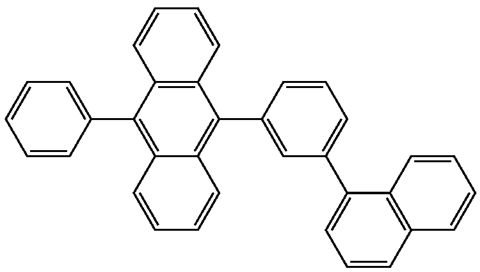
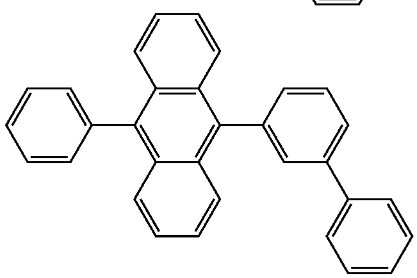
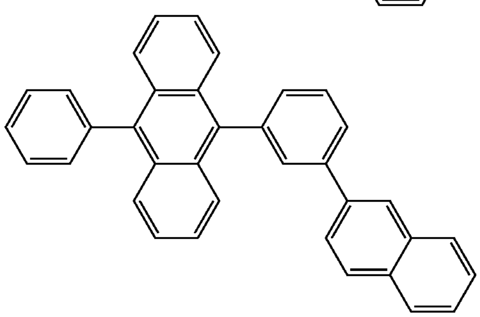
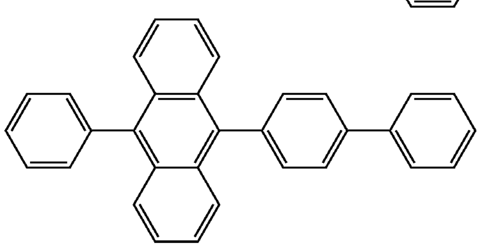
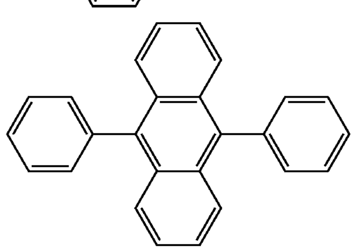
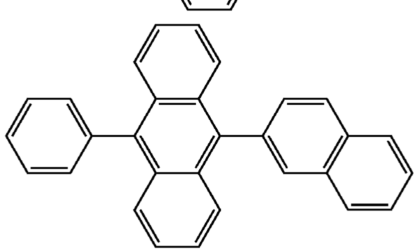
-continued
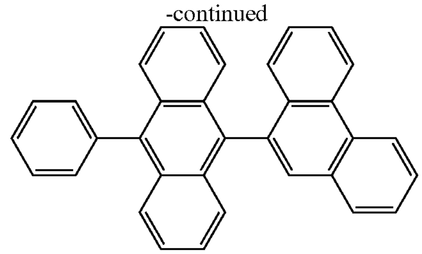
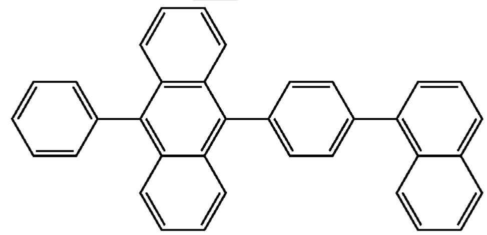
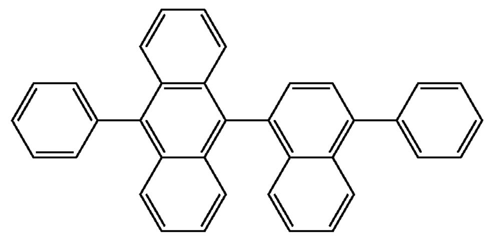
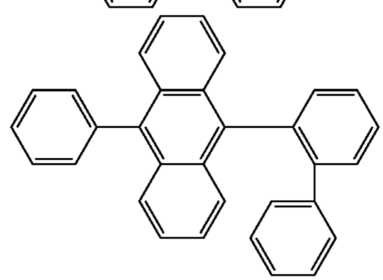
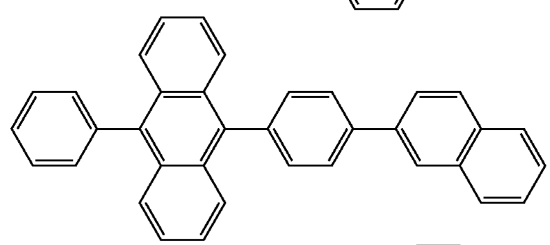
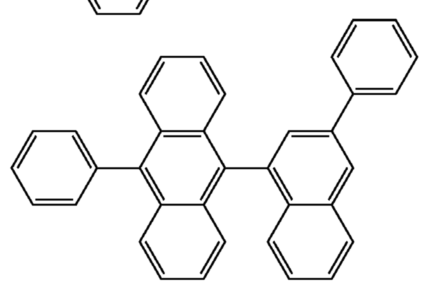
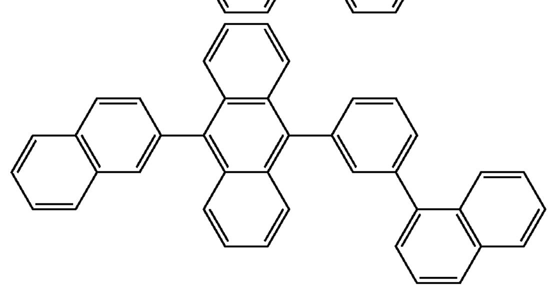

-continued
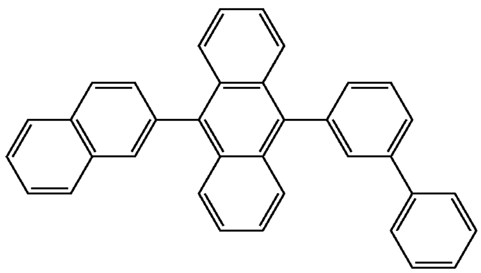
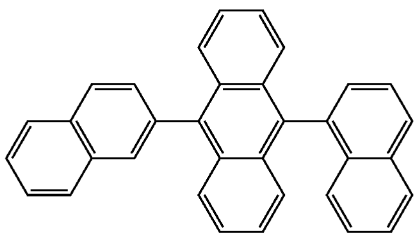
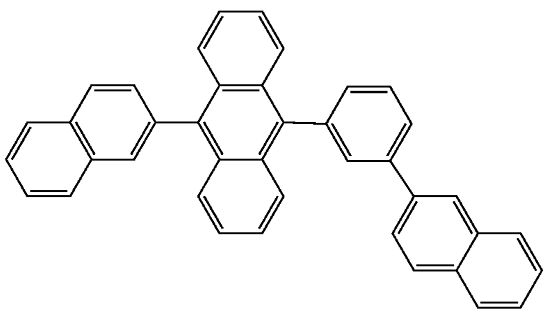
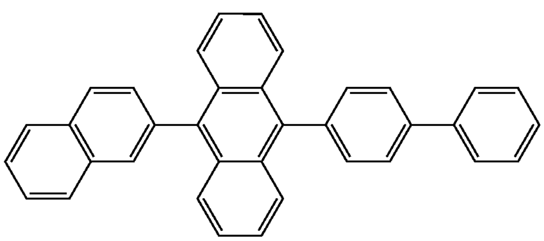
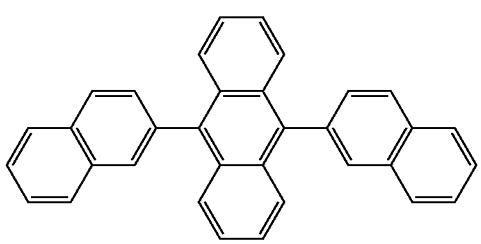
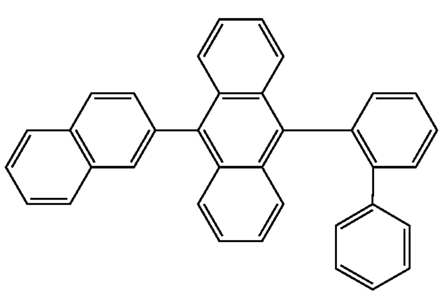
-continued
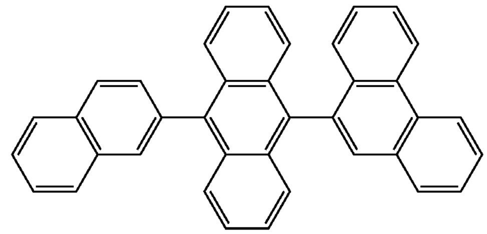
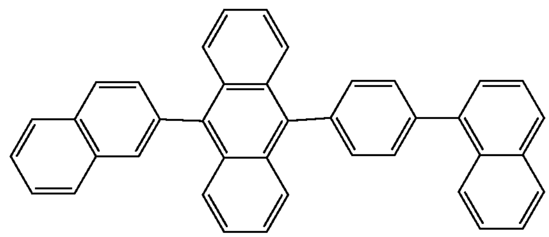
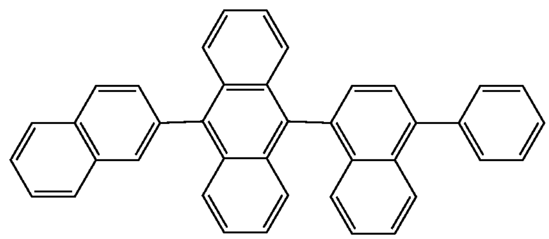
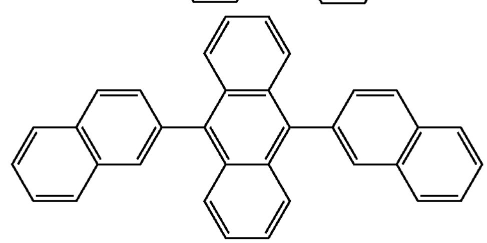
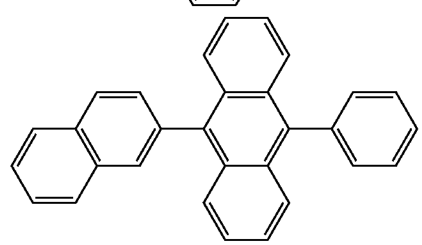
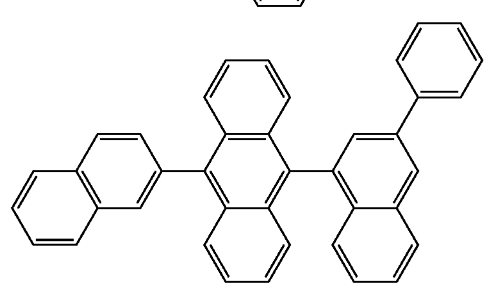
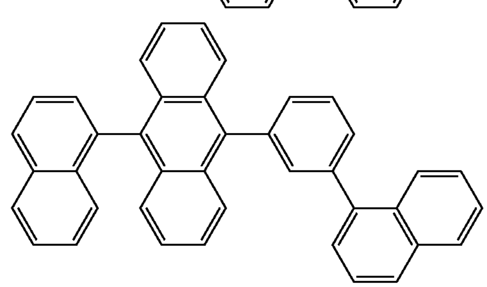

-continued
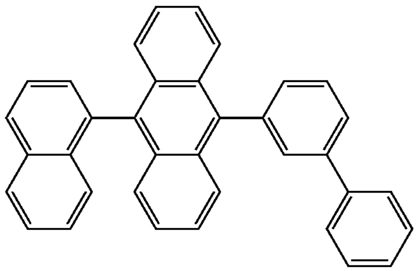
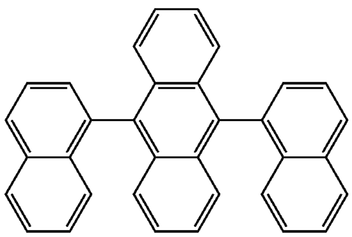
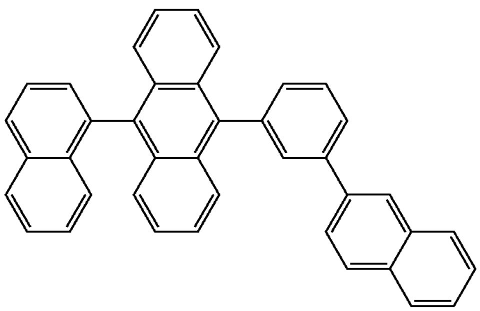
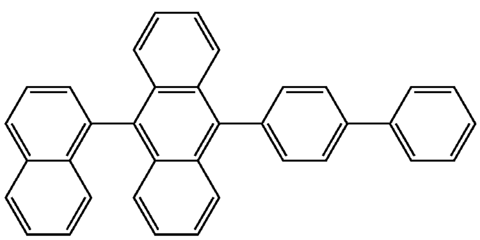
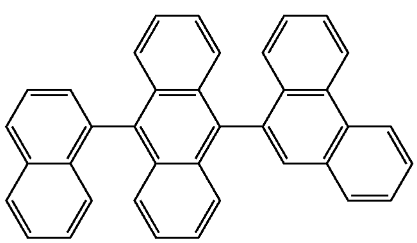
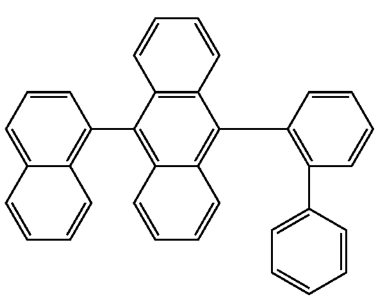
-continued
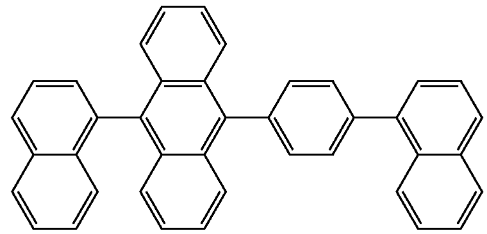
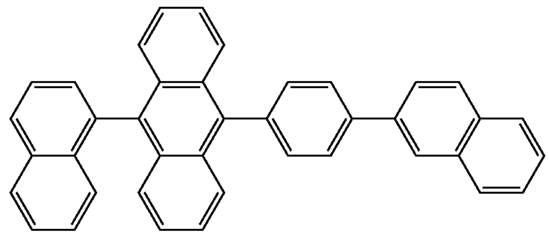
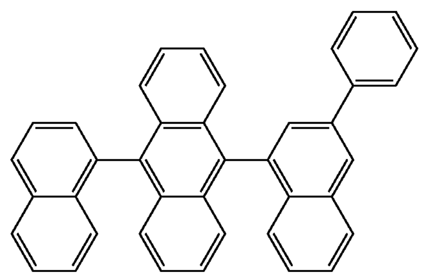
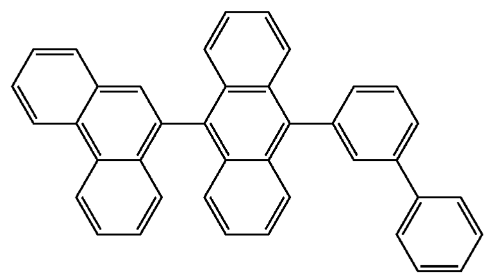
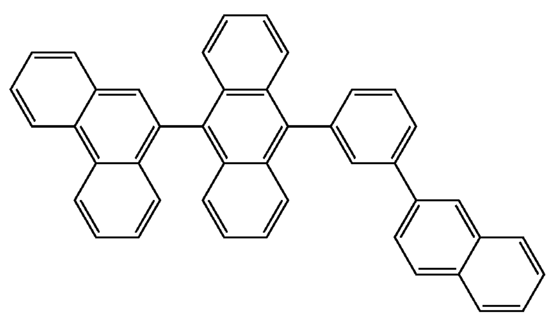
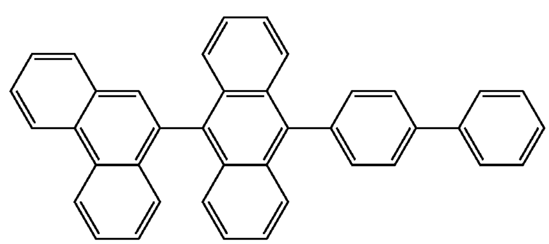

-continued
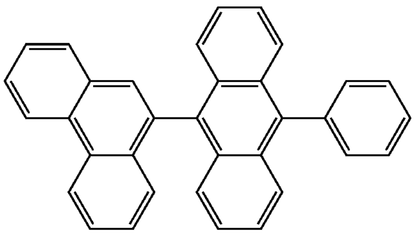
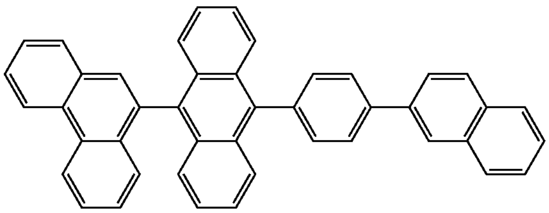
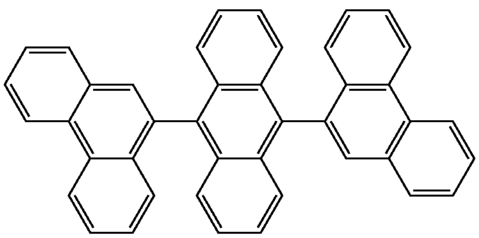
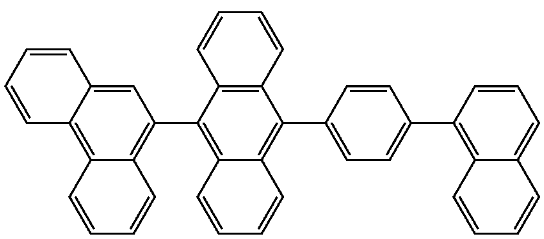
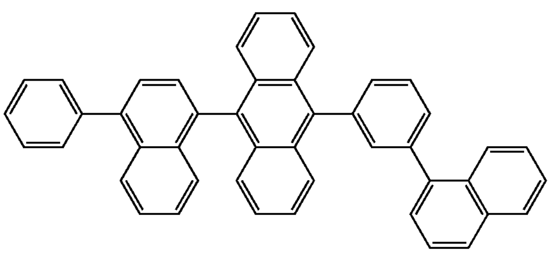
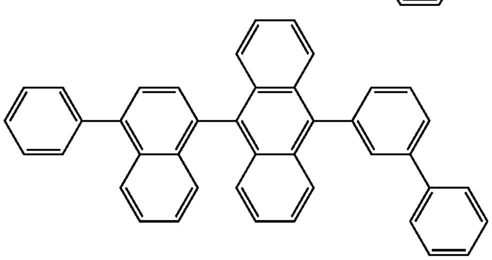
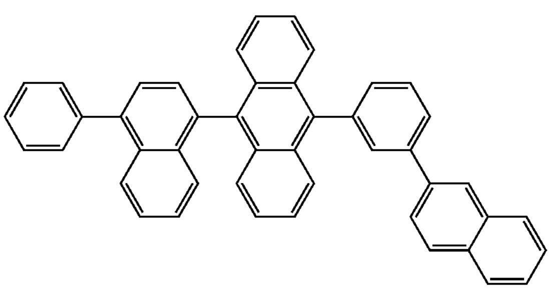
-continued
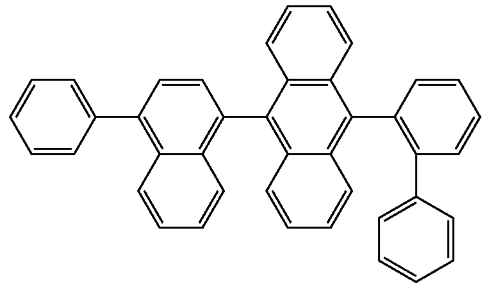
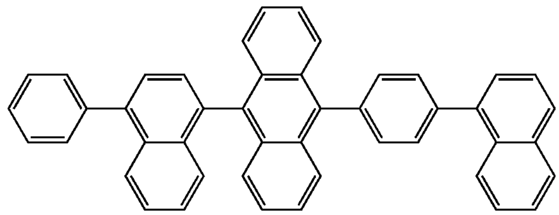
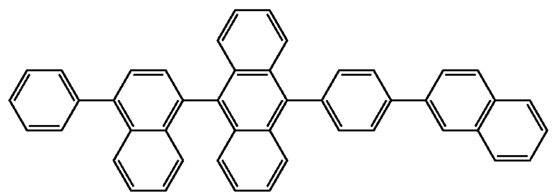
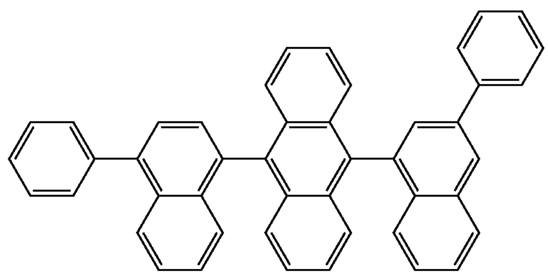
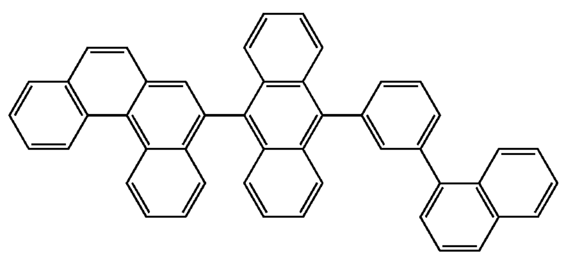
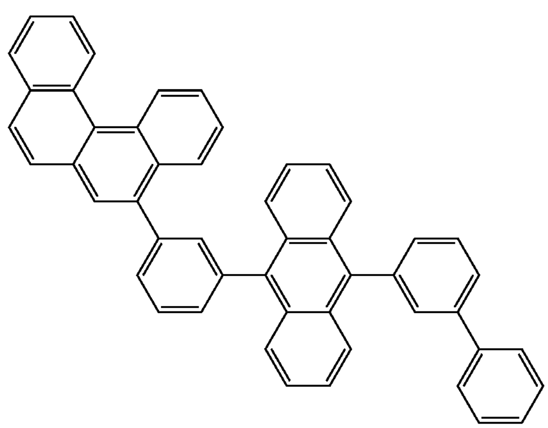

-continued
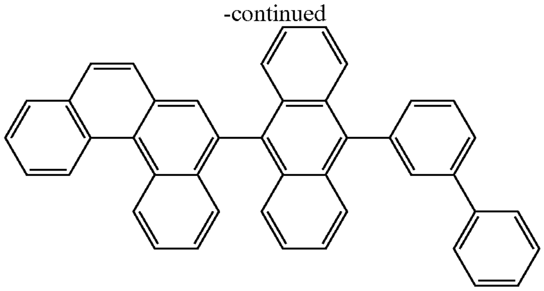
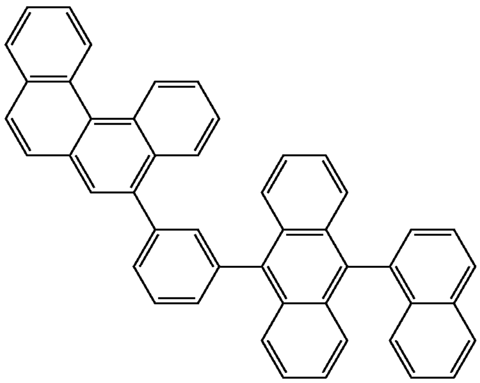
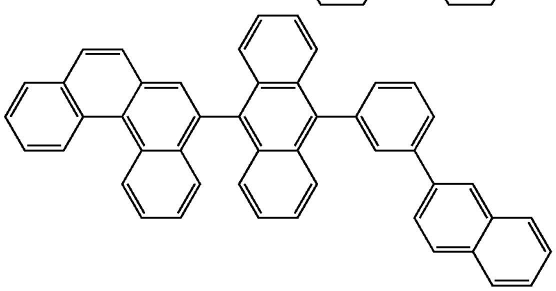
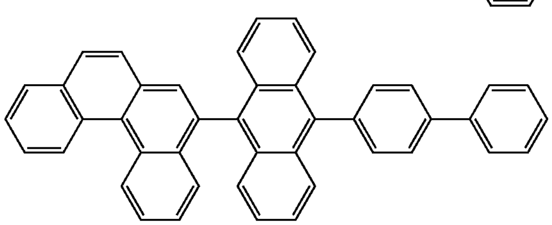
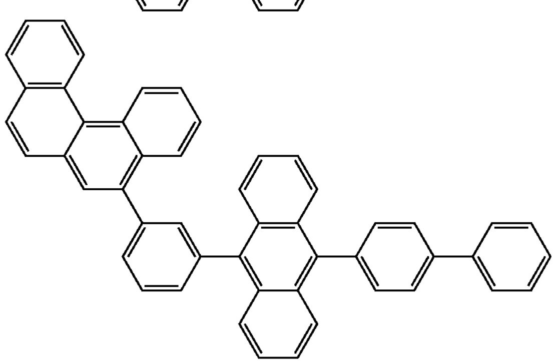
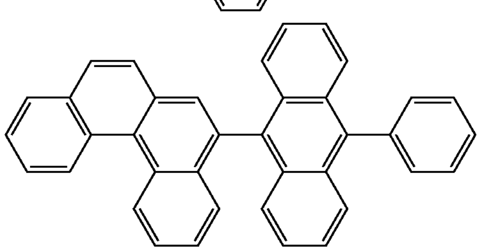
-continued
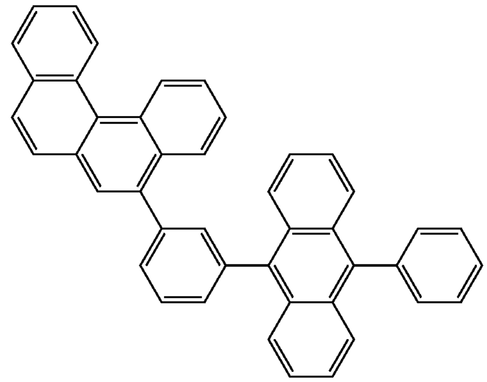
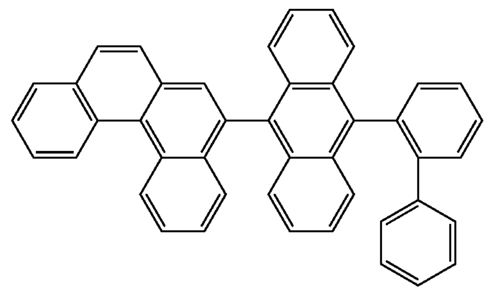
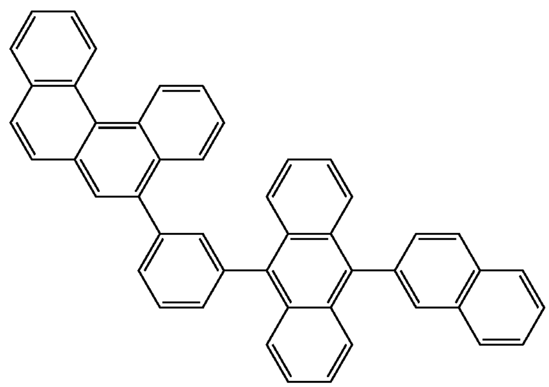
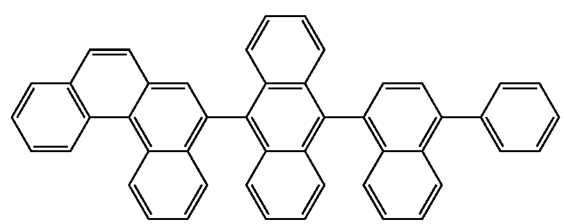
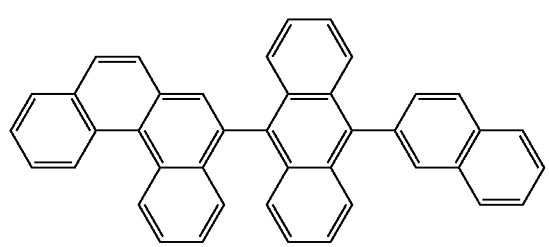

-continued
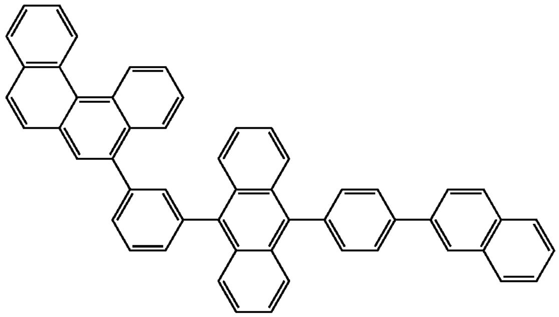
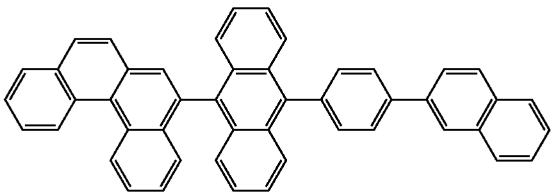
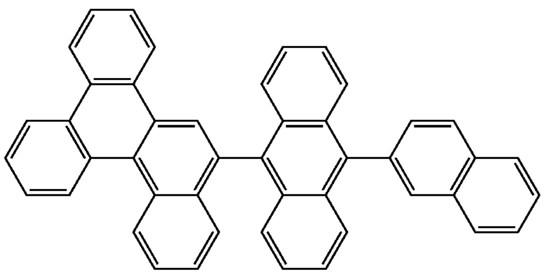
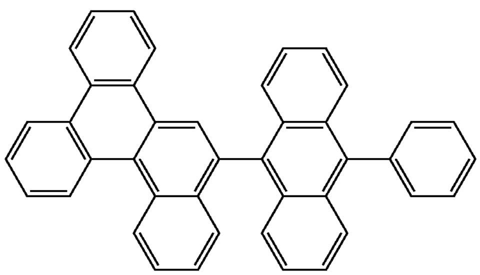
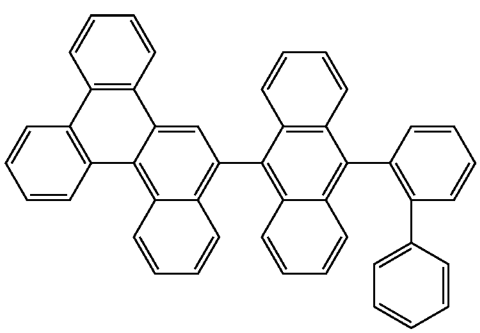
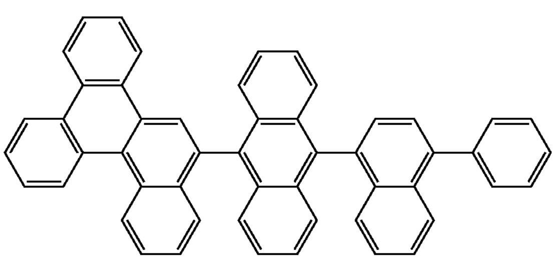
-continued
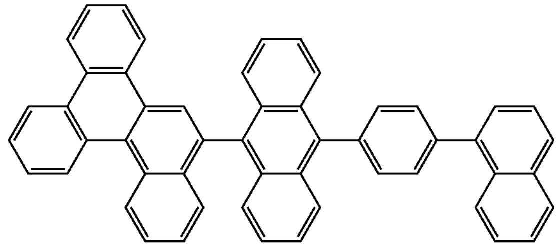
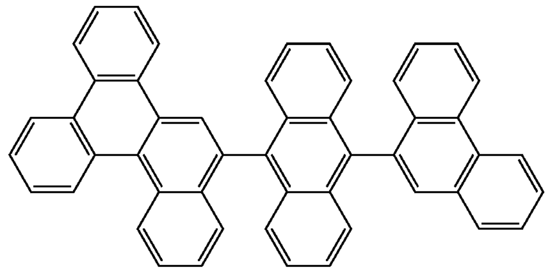
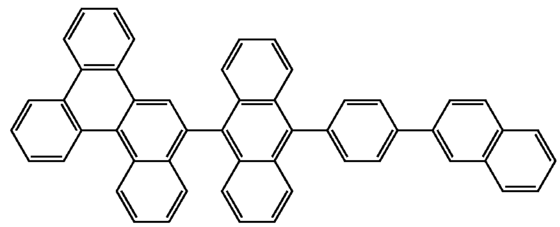
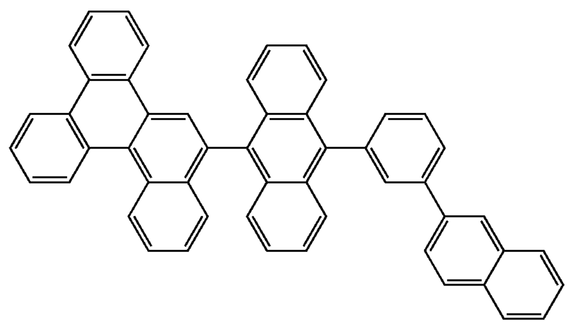
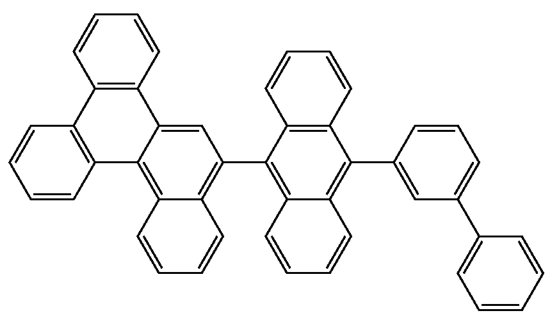
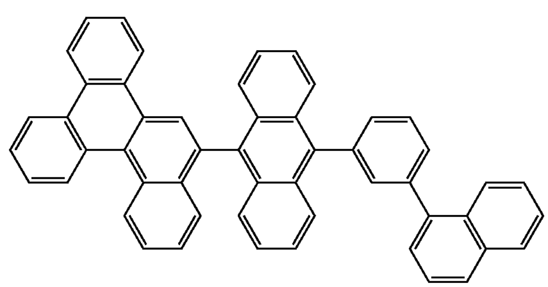

-continued
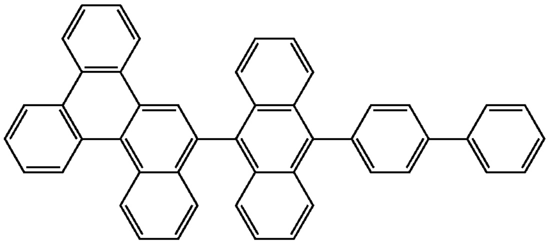
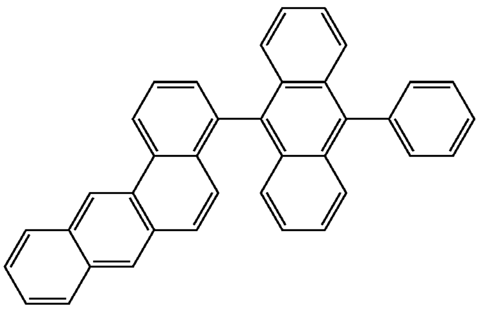
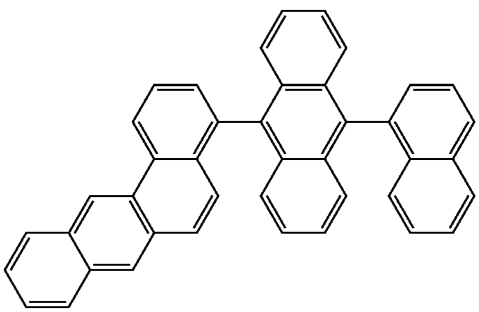
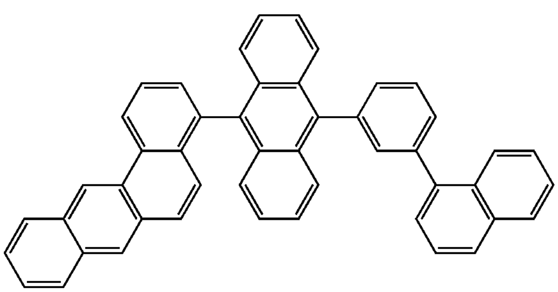
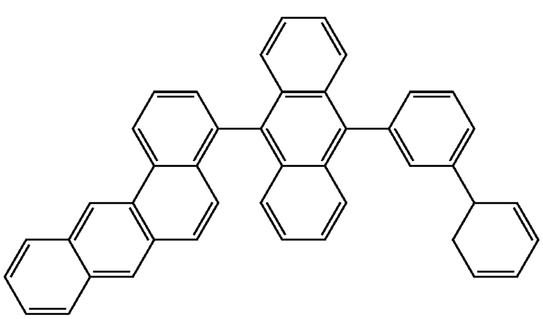
-continued
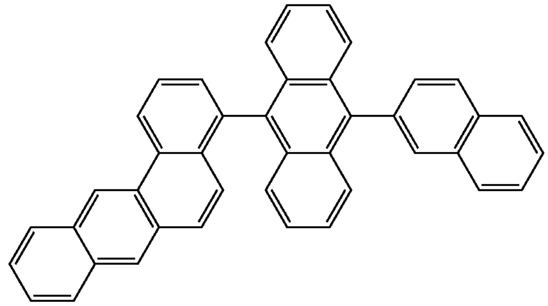
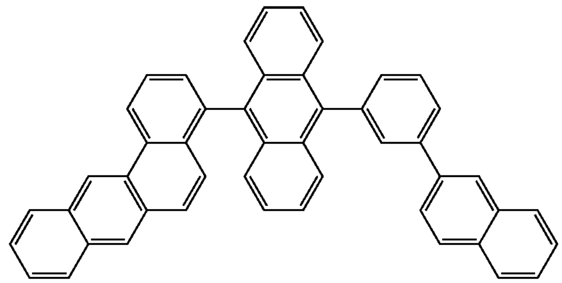
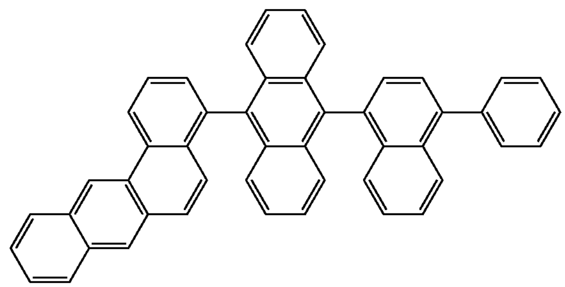
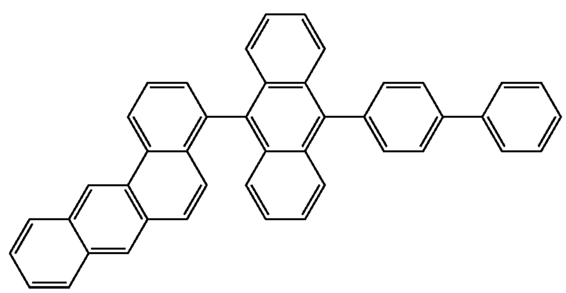
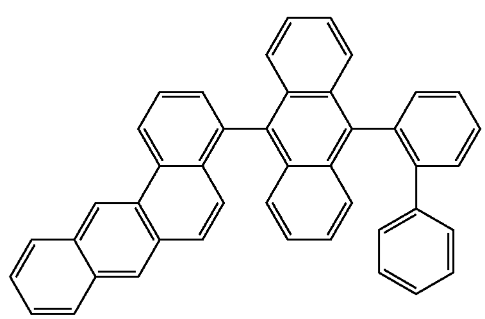

-continued
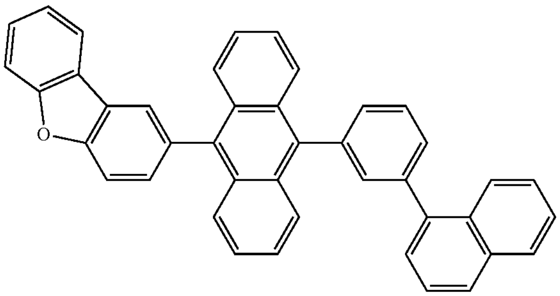
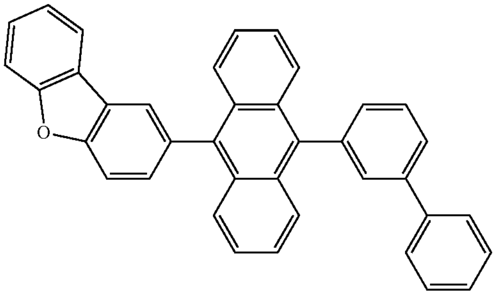
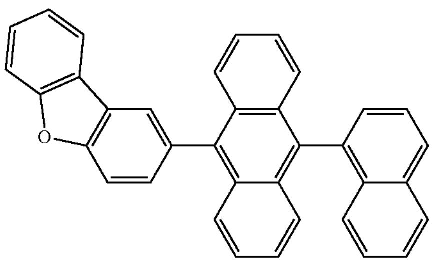
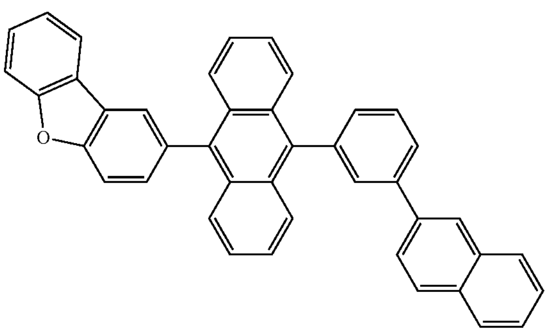
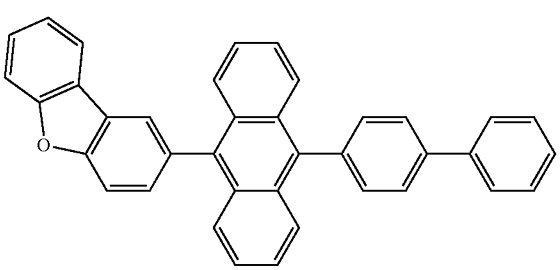
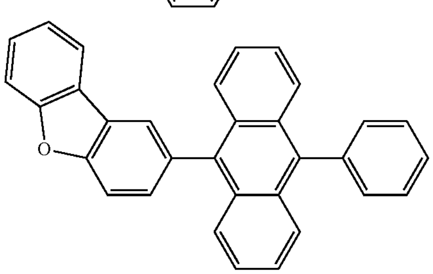
-continued
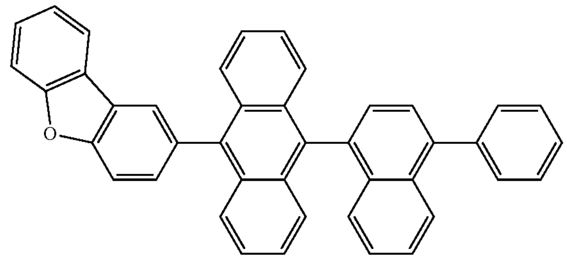
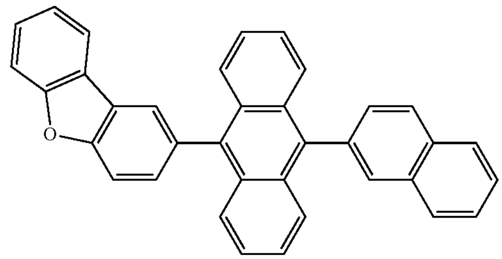
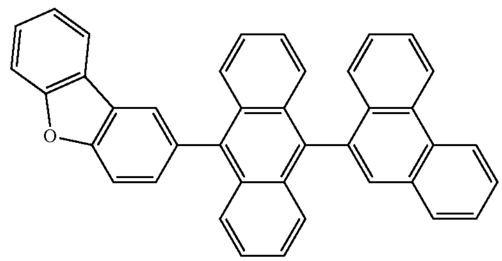
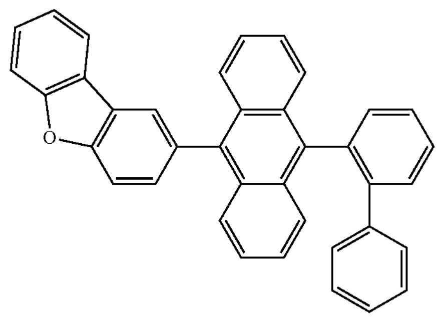
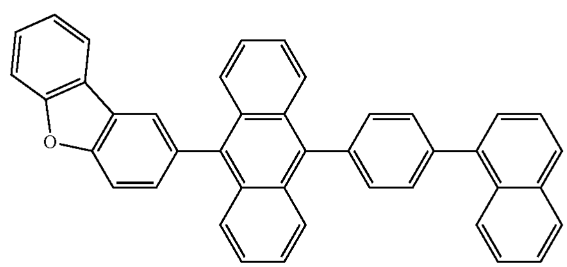
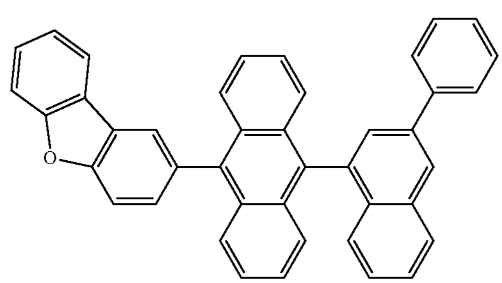

-continued
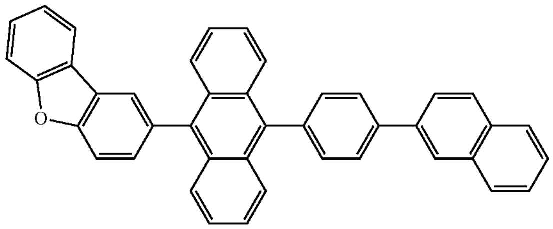
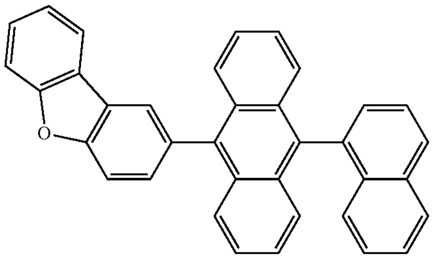
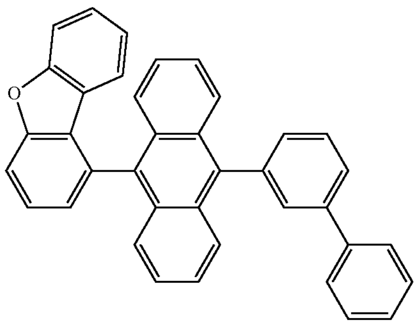
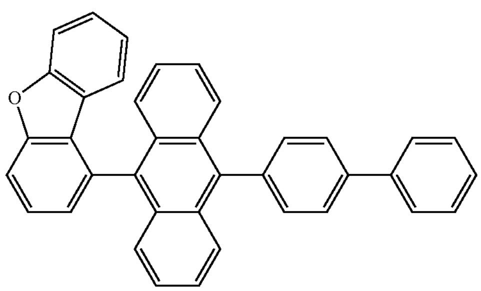
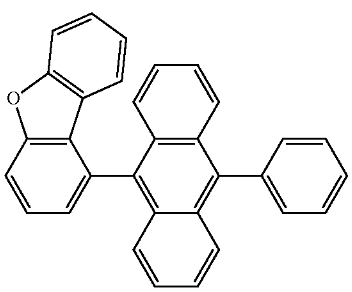
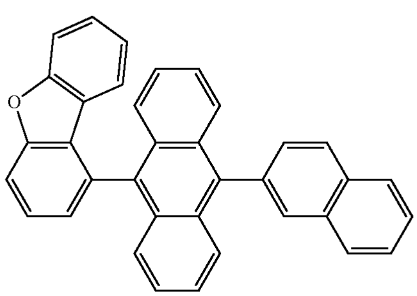
-continued
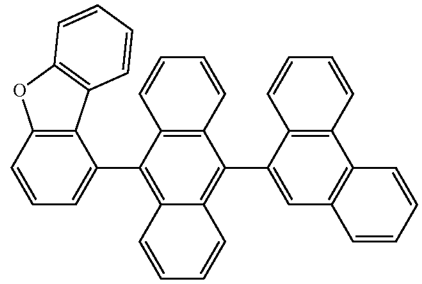
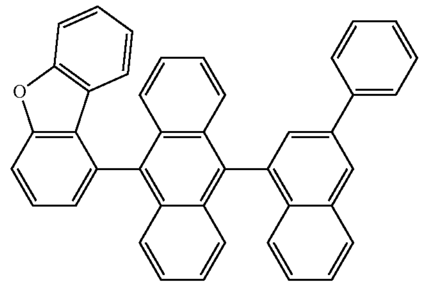
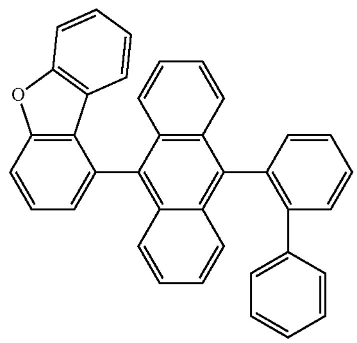
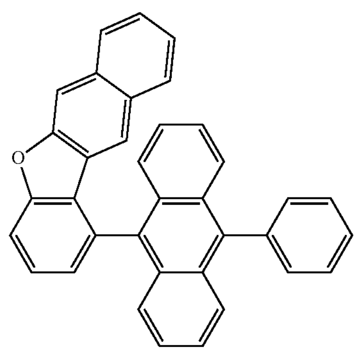
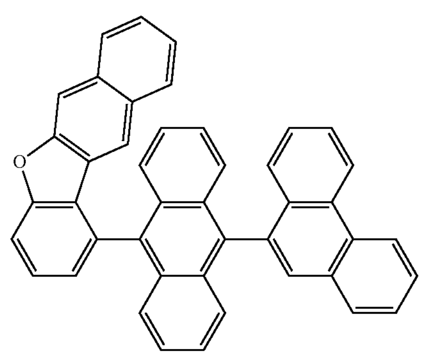

-continued
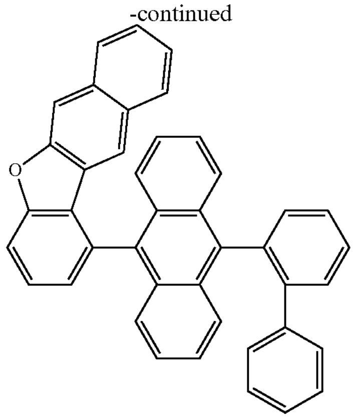
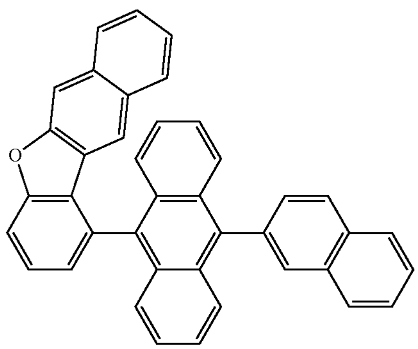
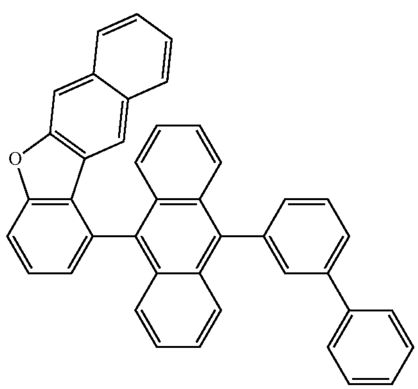
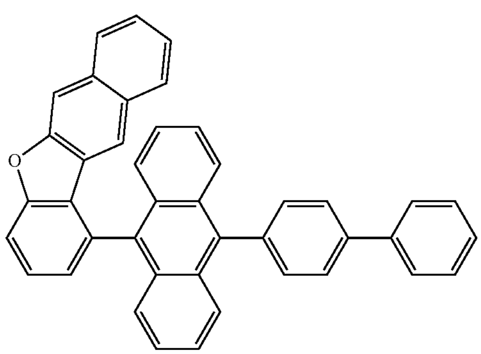
-continued
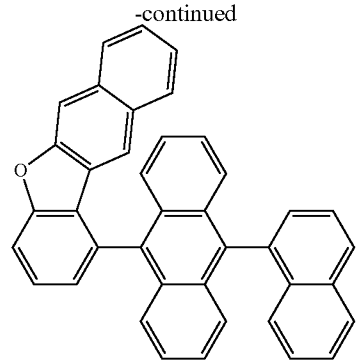
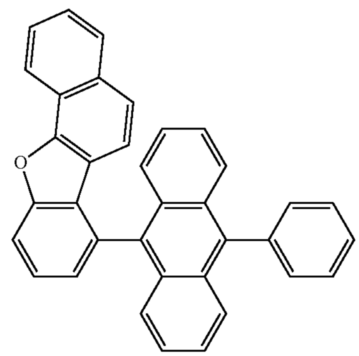
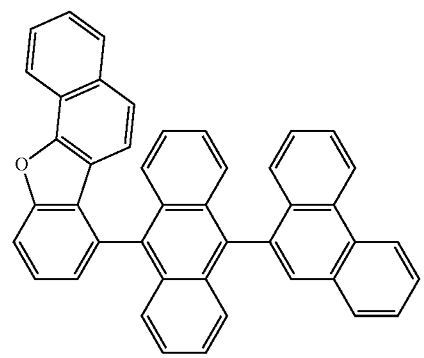
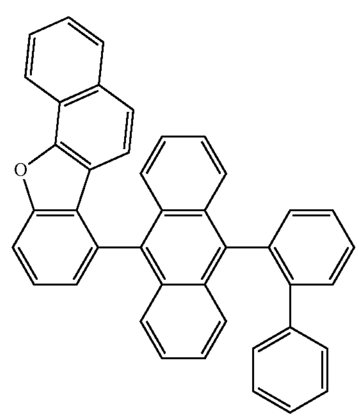

-continued
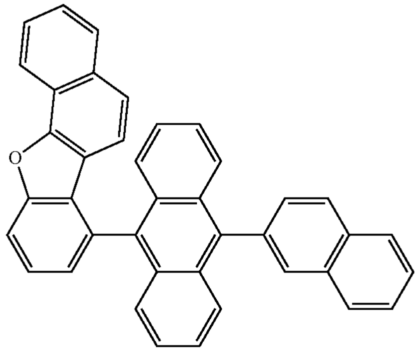
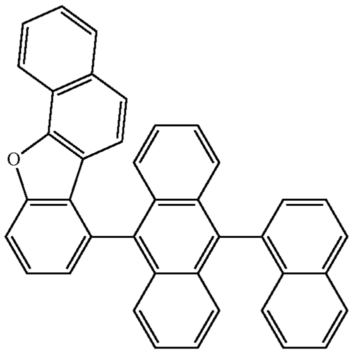
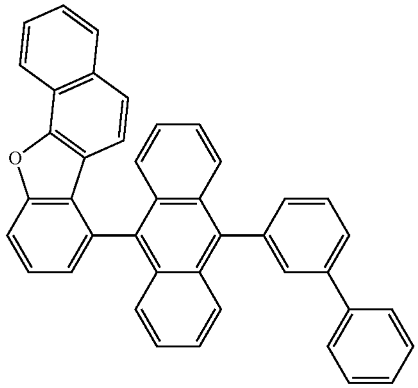
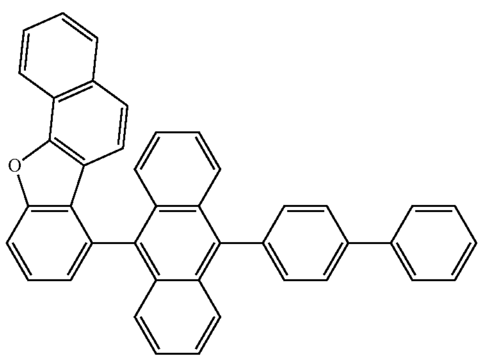
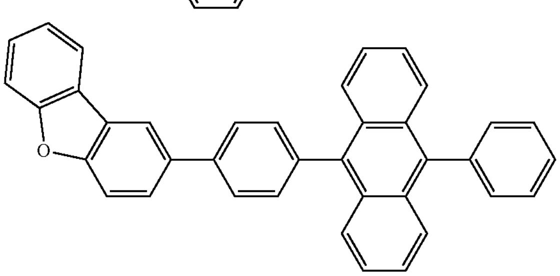
-continued
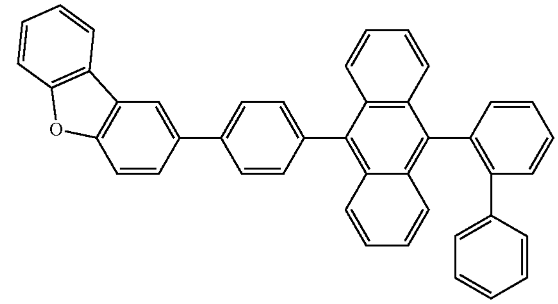
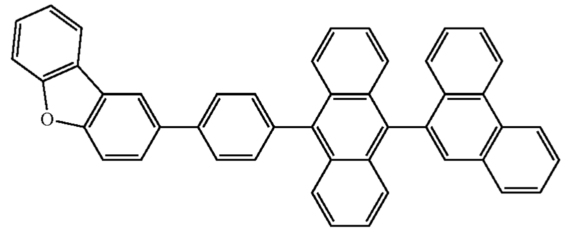
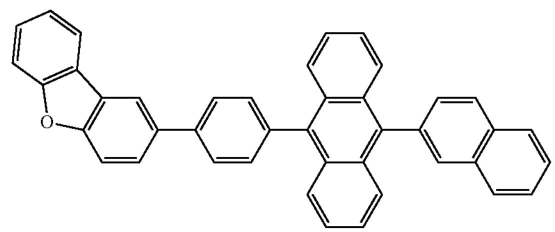
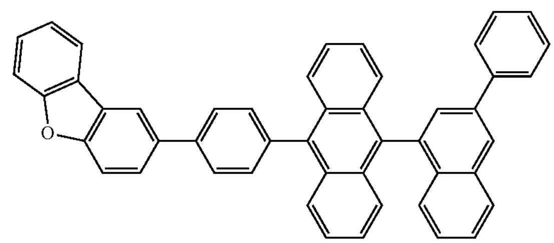
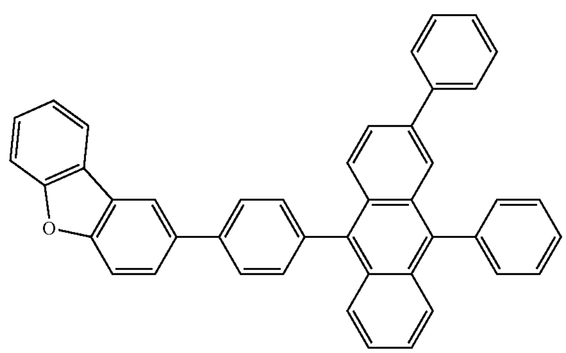
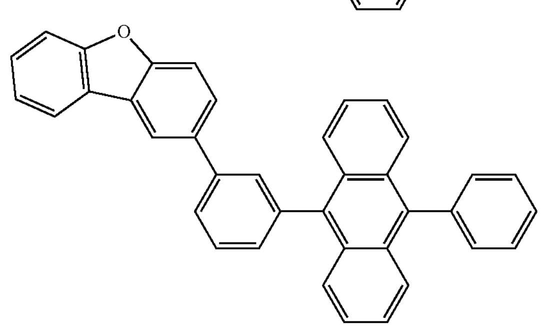

-continued
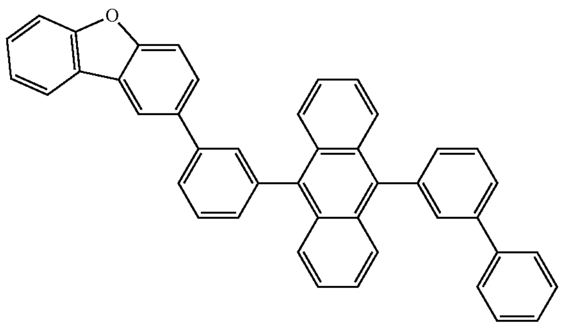
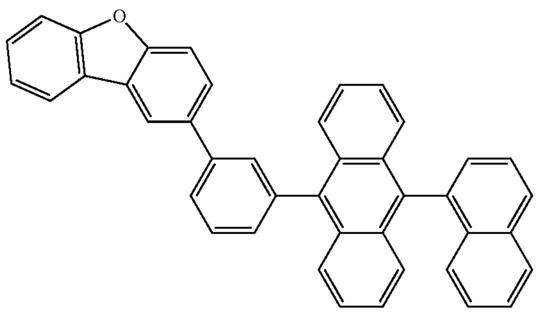
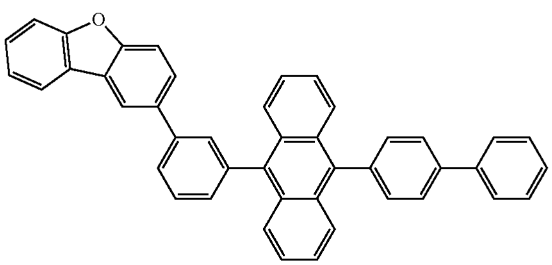
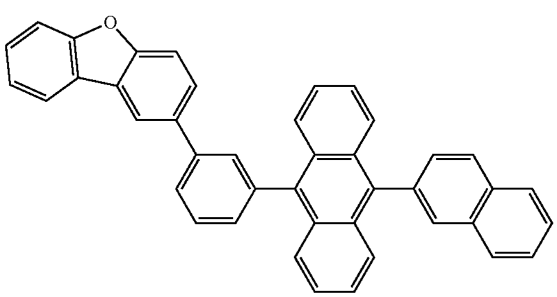
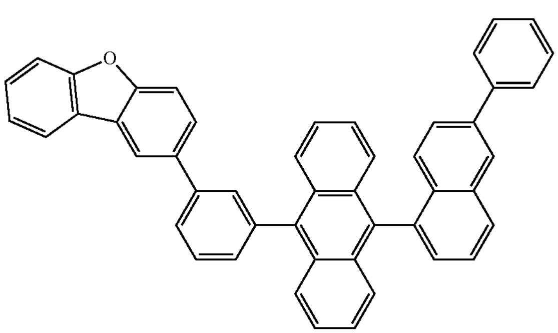
-continued
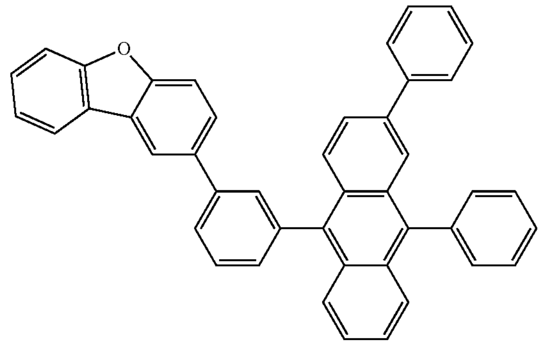
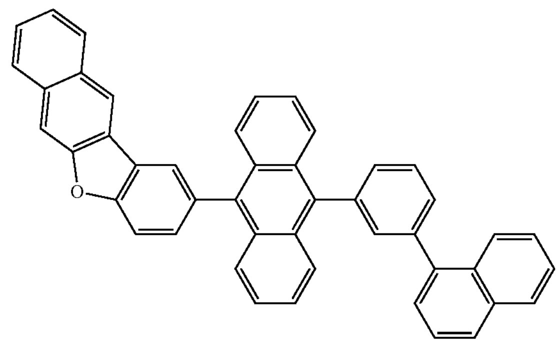
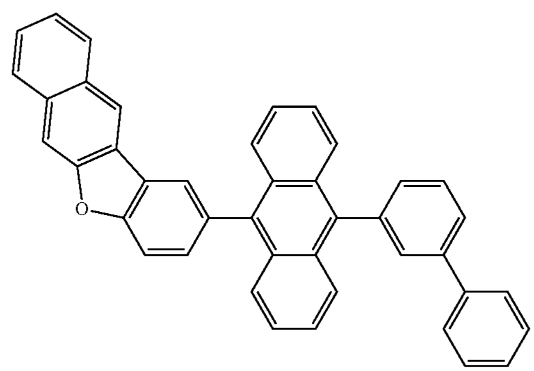
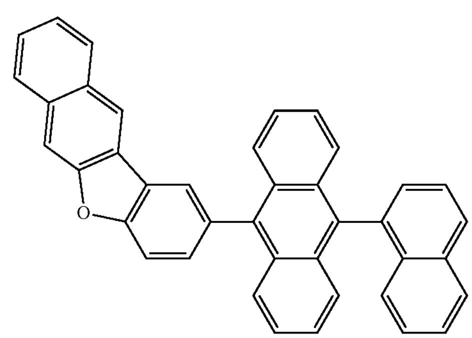

-continued
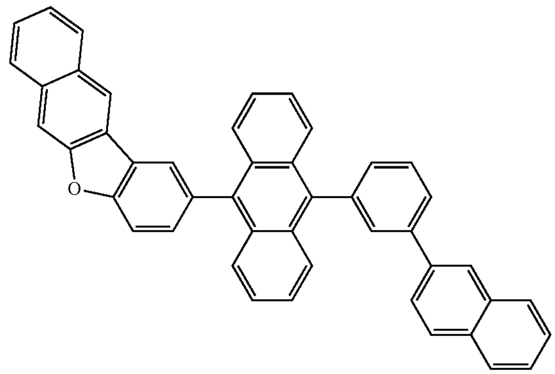
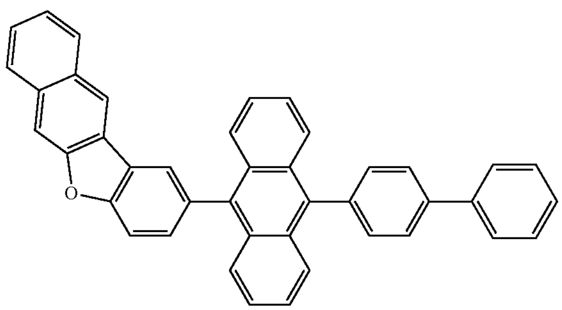
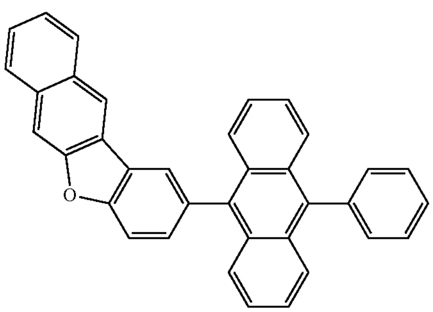
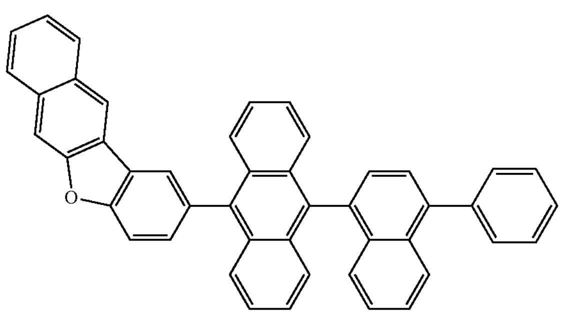
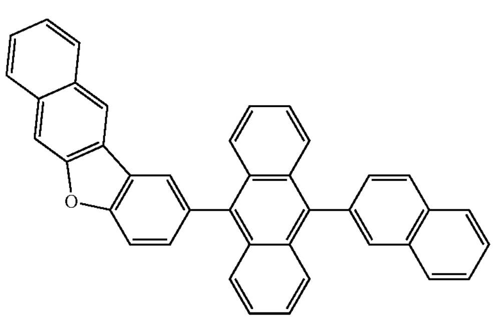
-continued
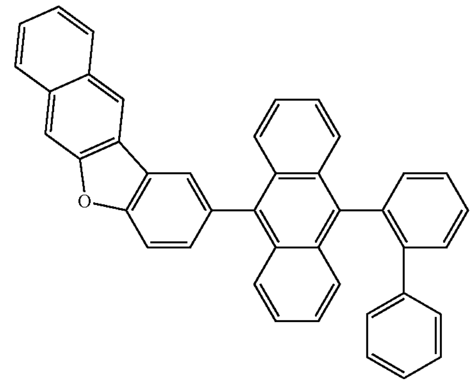
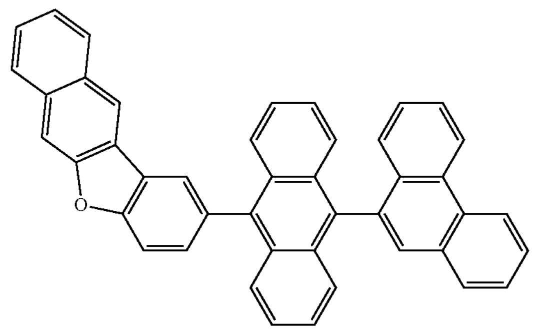
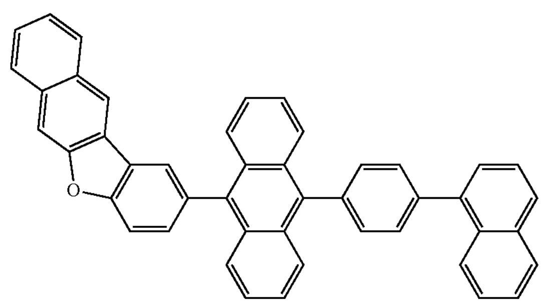
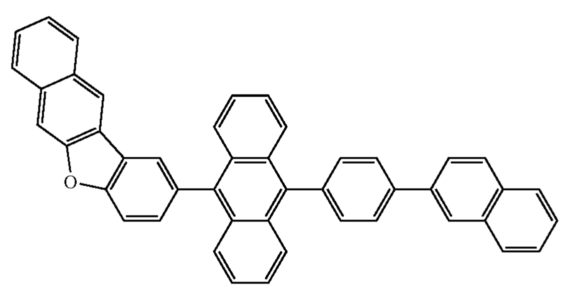
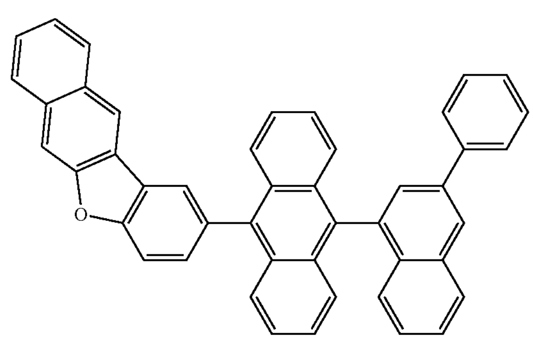

-continued
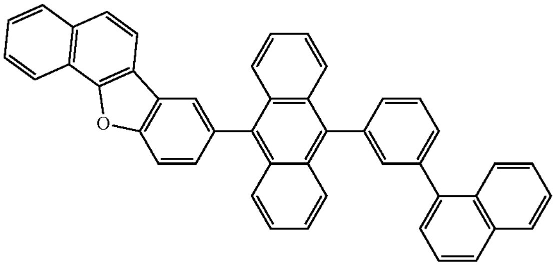
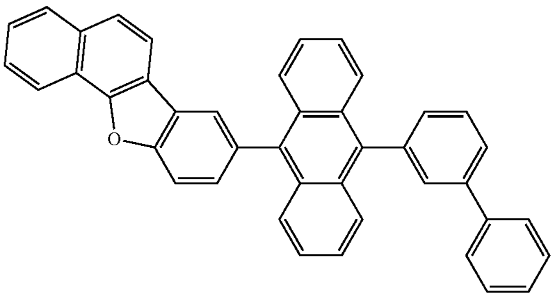
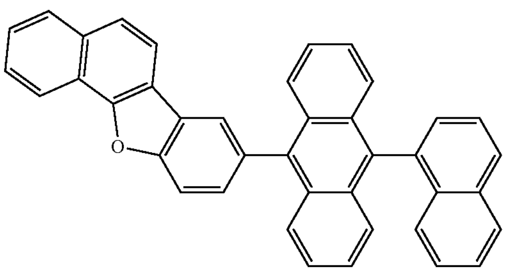
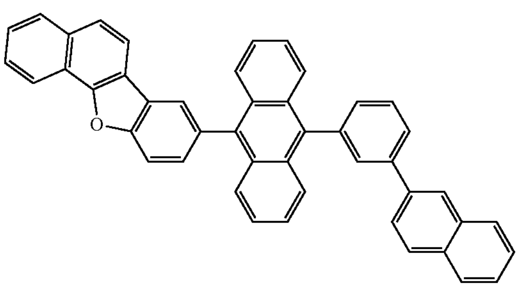
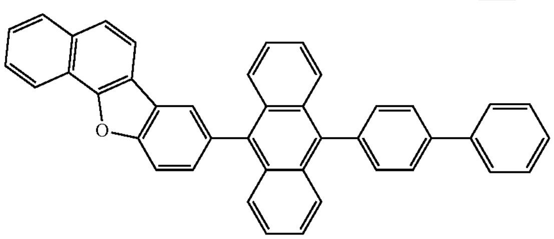
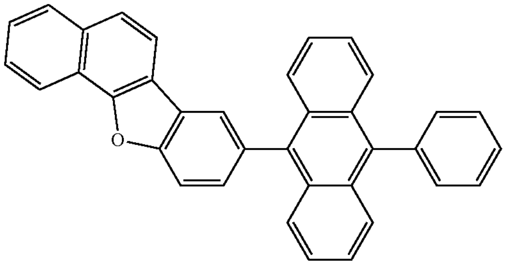
-continued
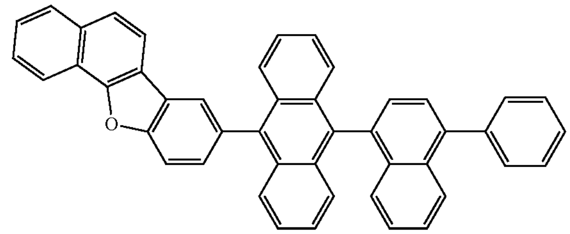
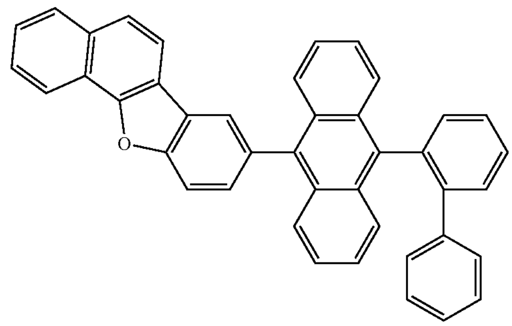
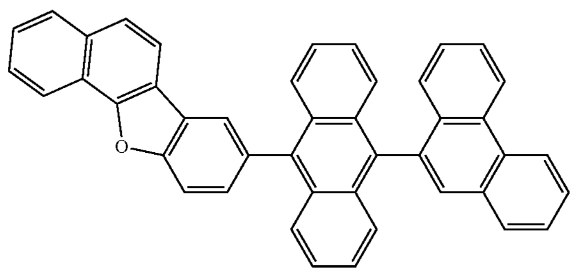
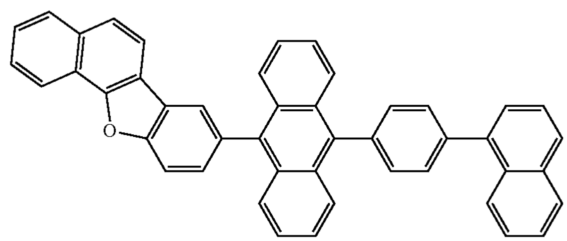
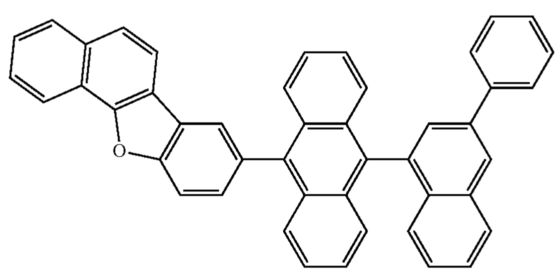
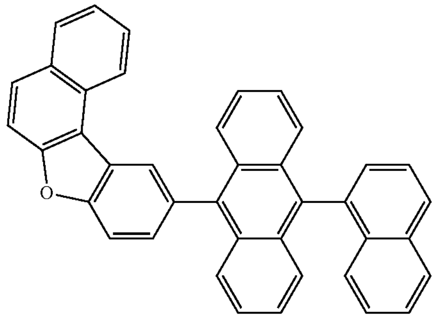

-continued
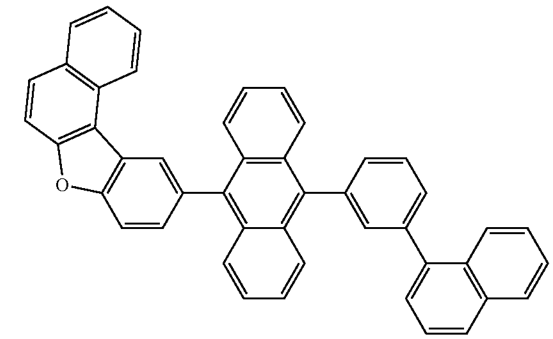
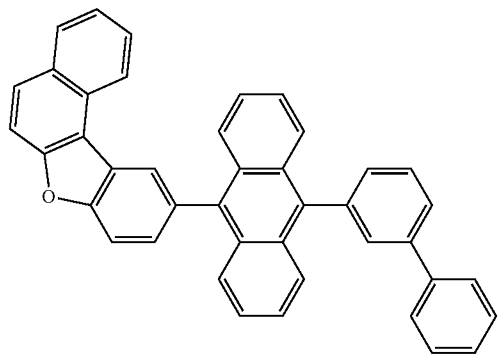
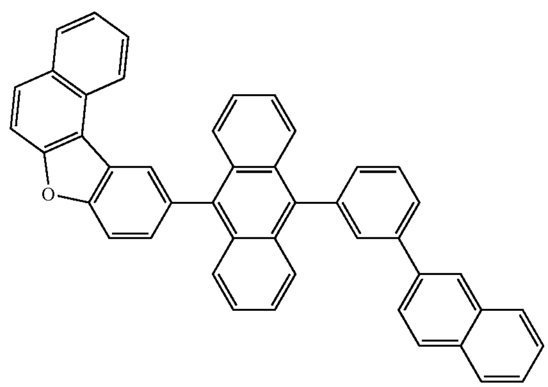
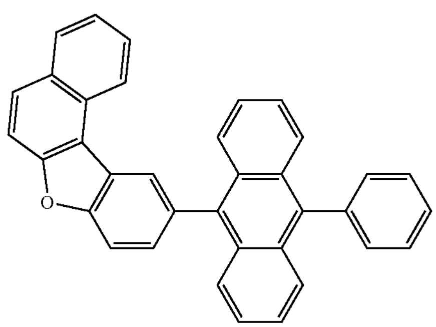
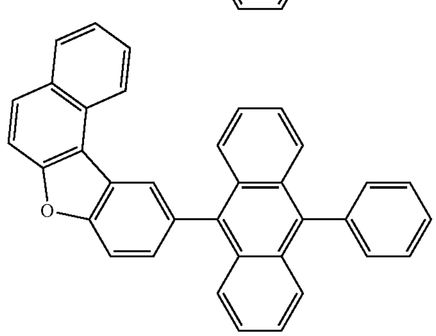
-continued
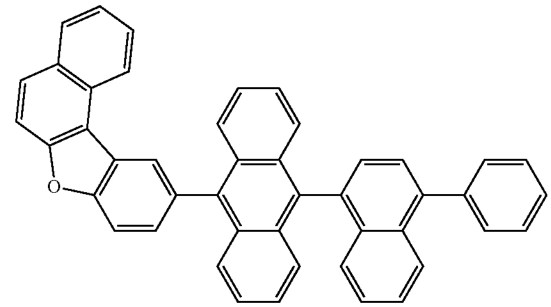
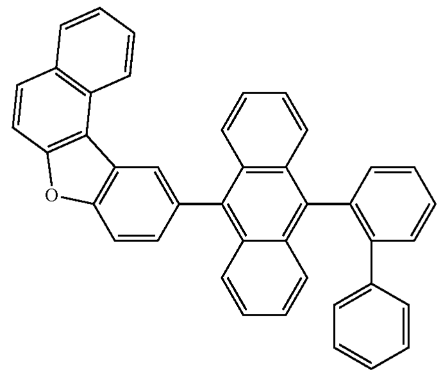
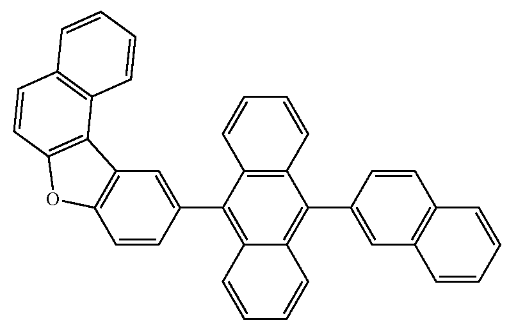
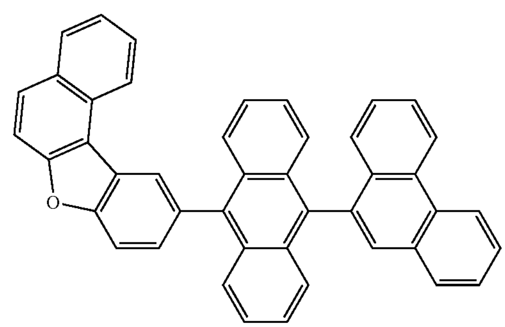
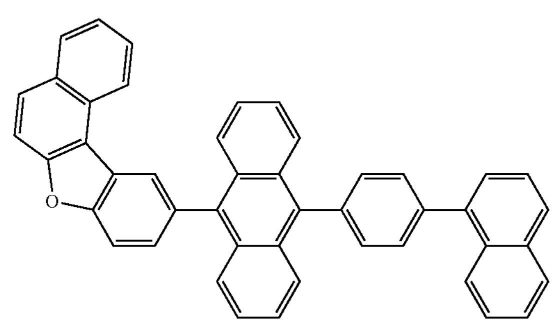

-continued
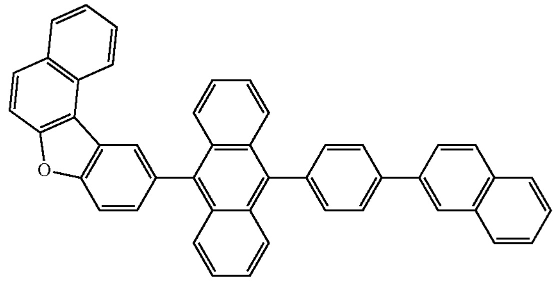
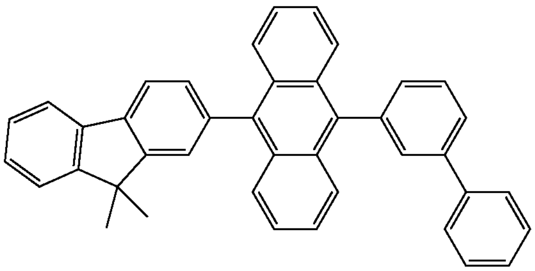
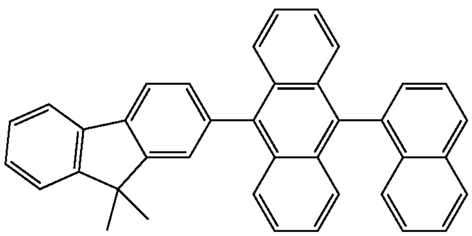
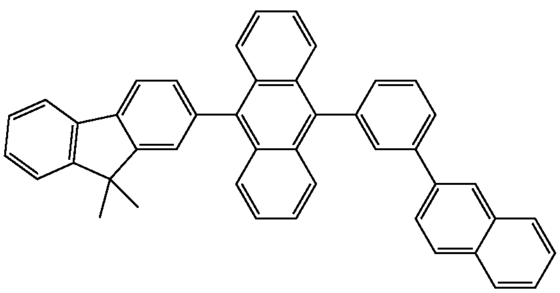
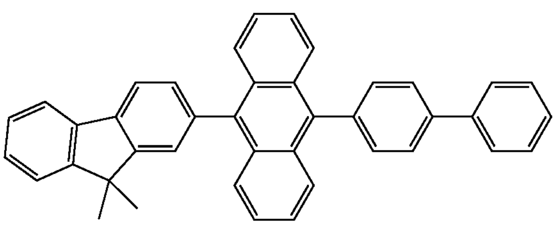
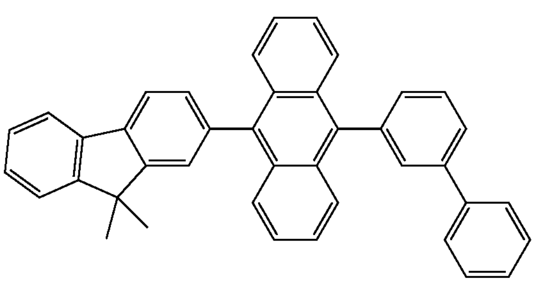
-continued
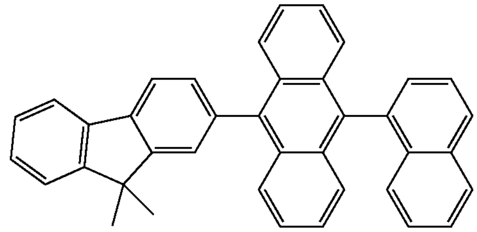
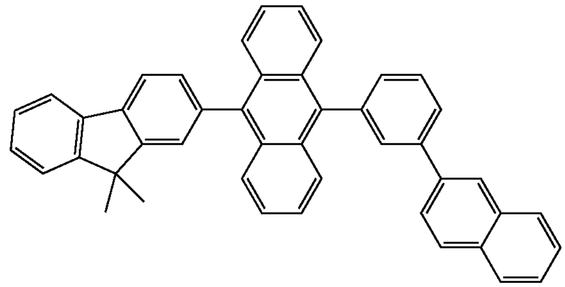
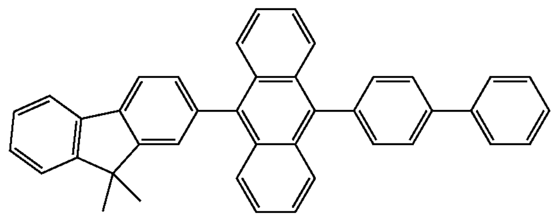
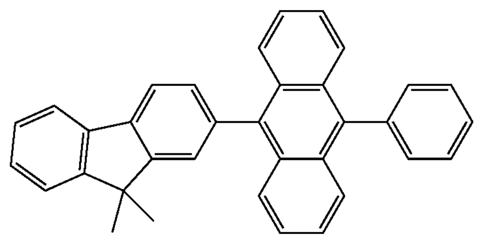
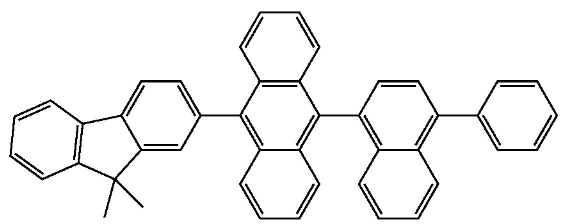
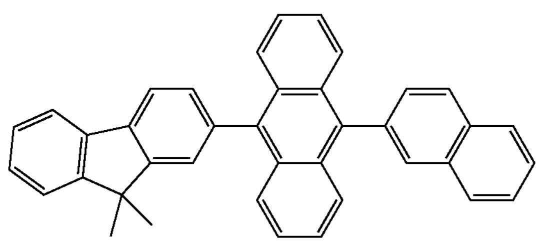
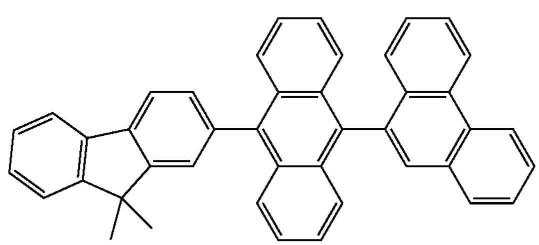

-continued
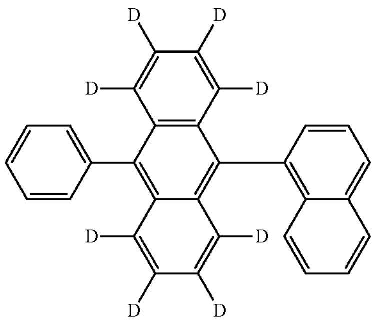
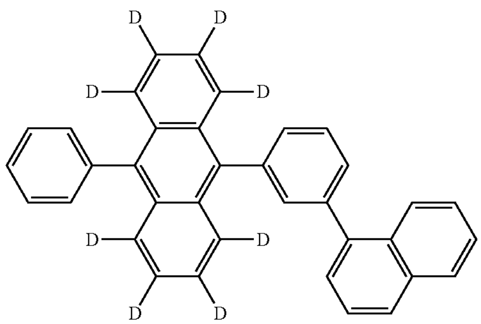
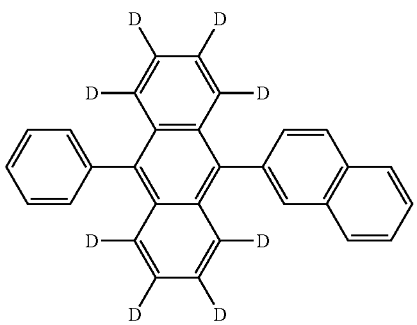
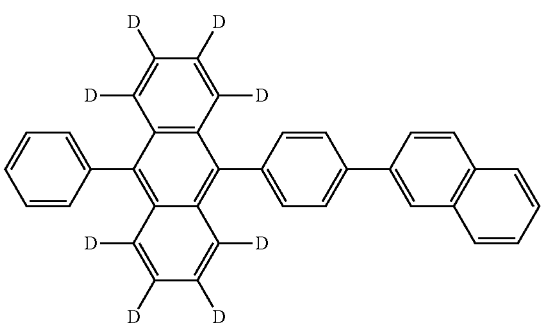
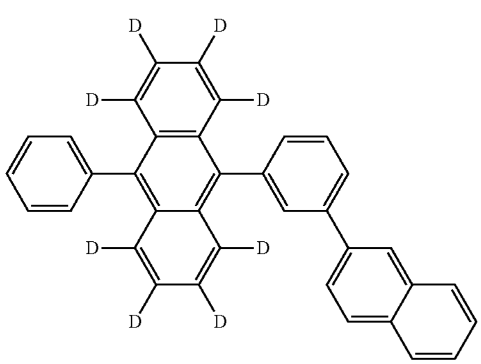
-continued
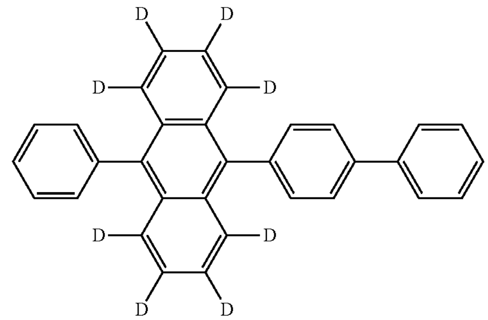
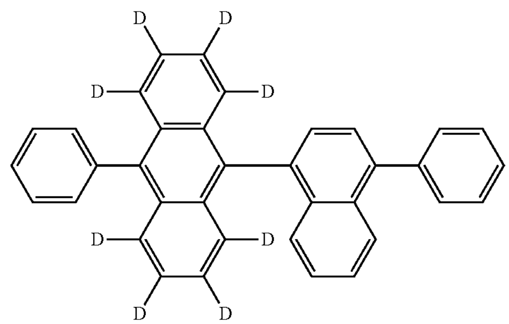
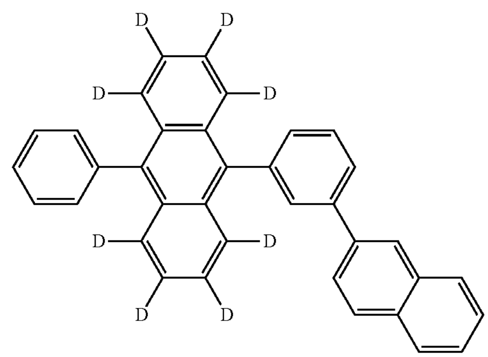
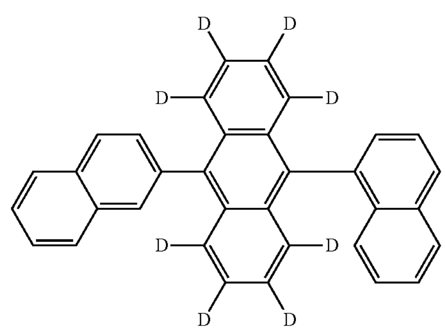
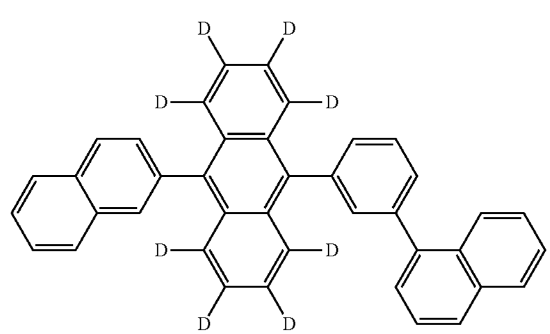

-continued
-continued
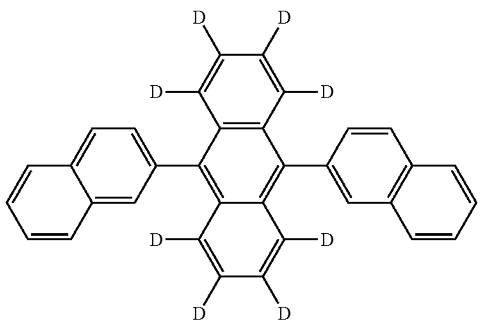
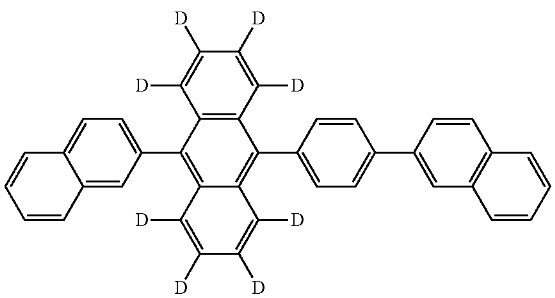
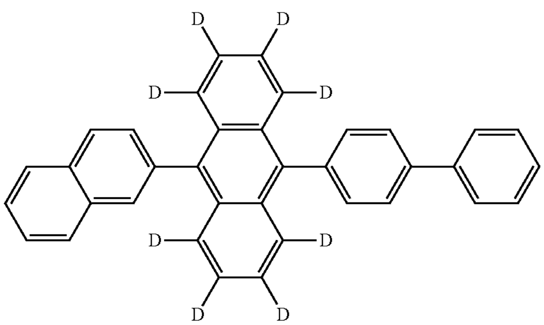
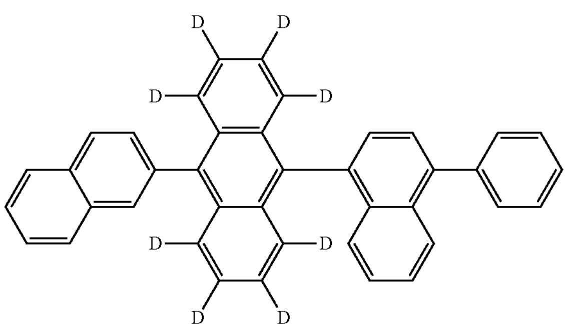
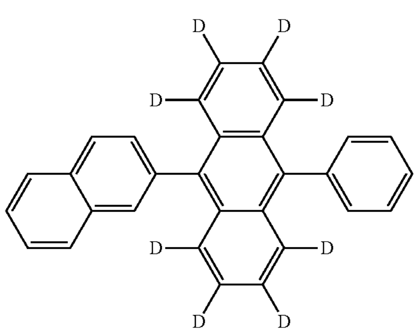
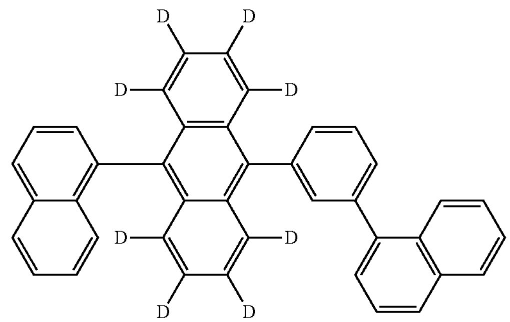
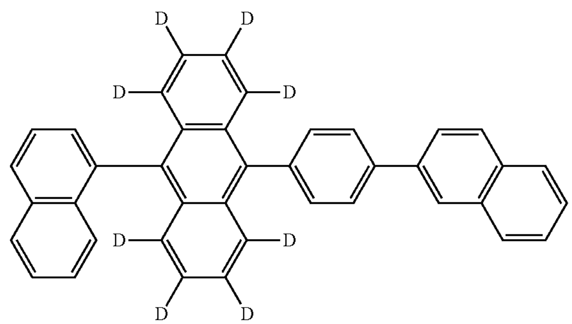
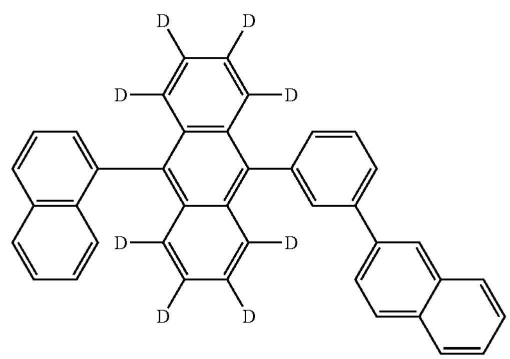
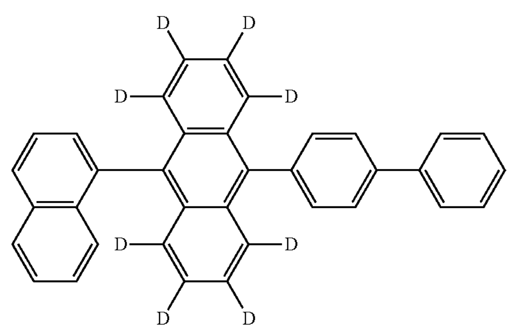
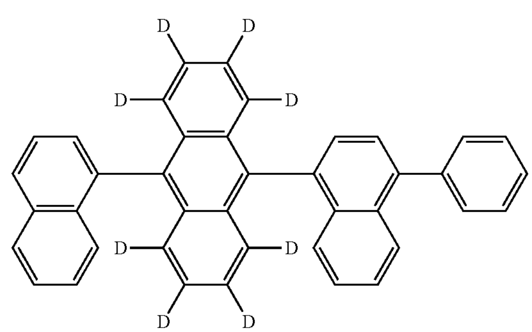

-continued
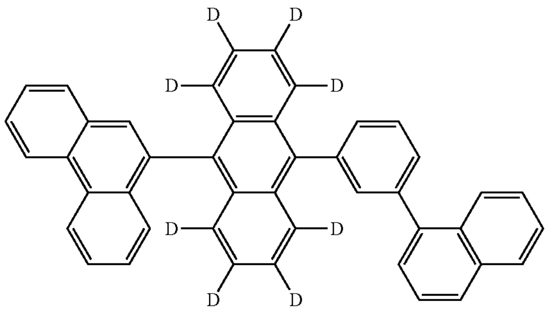
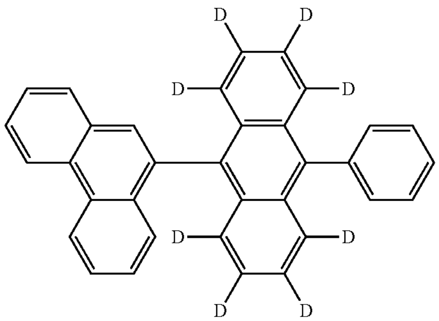
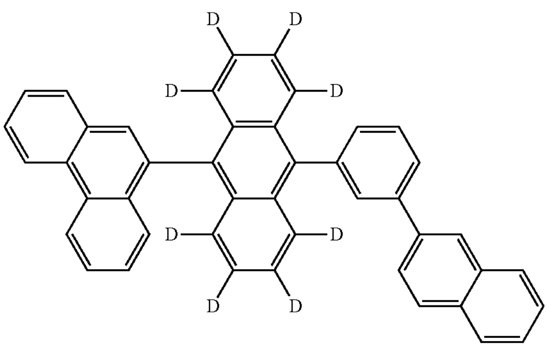
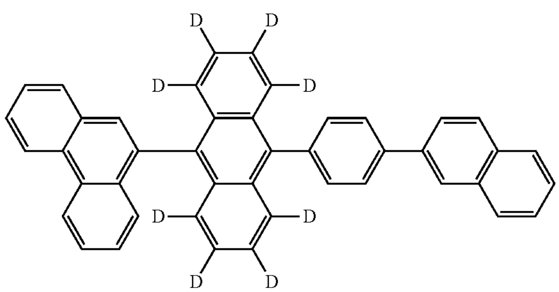
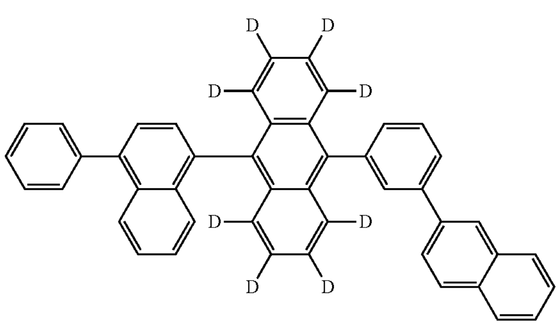
-continued
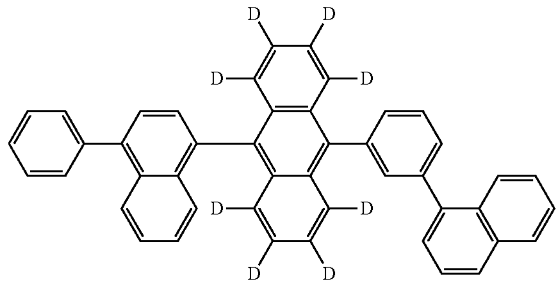
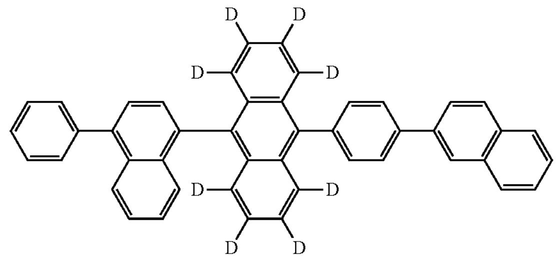
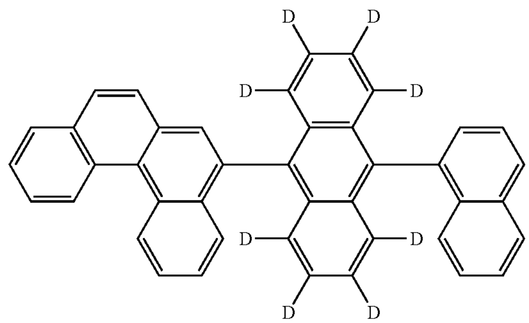
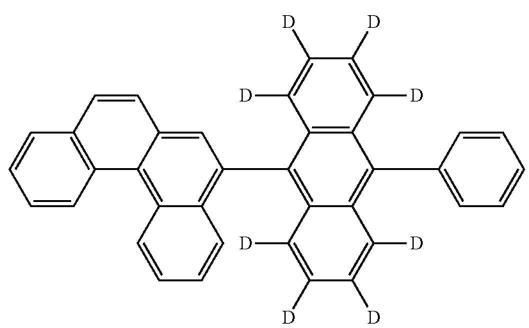
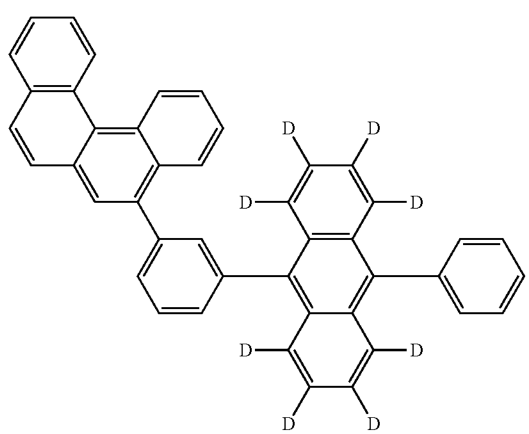

-continued
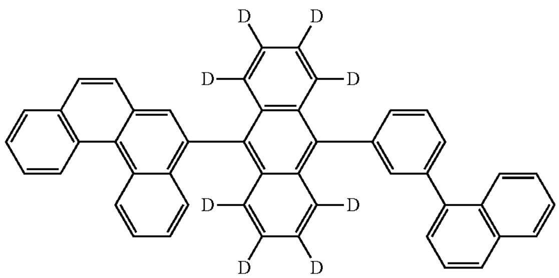
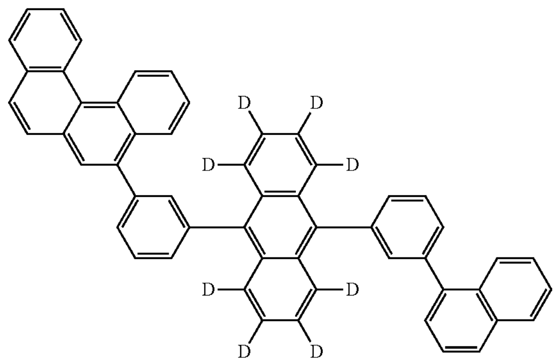
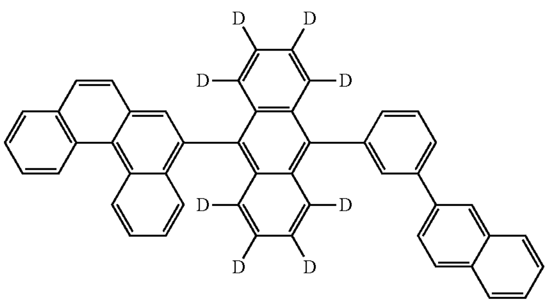
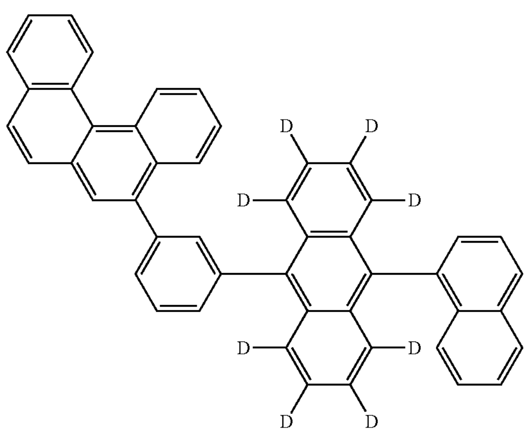
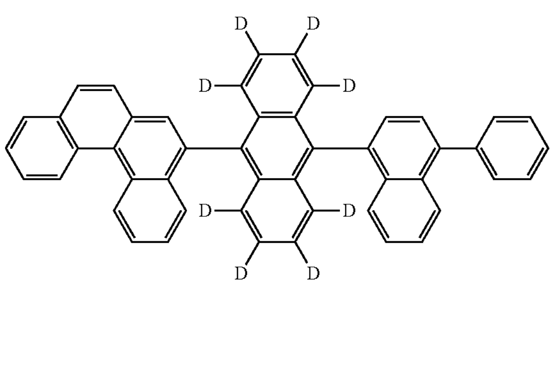
-continued
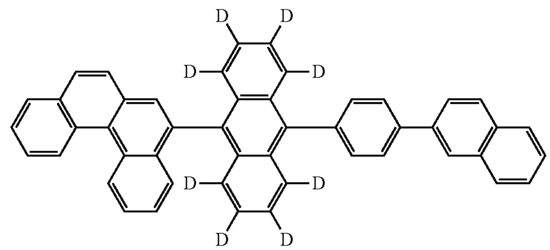
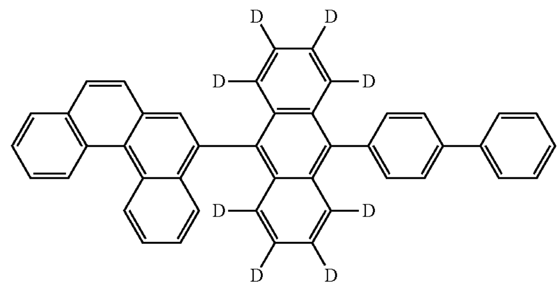
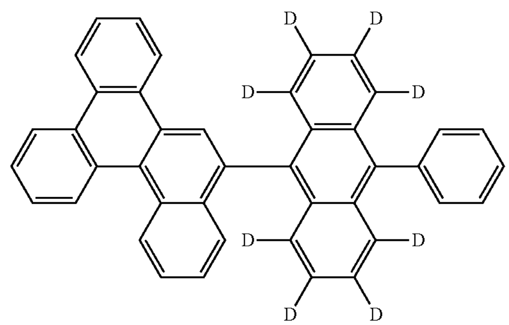
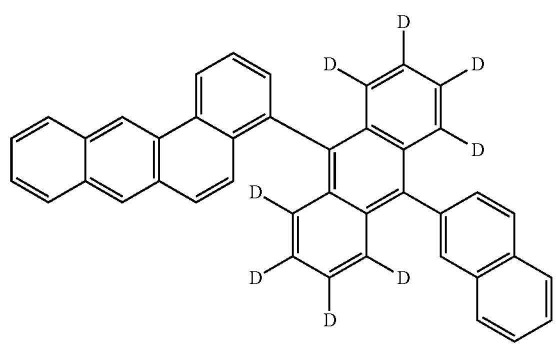
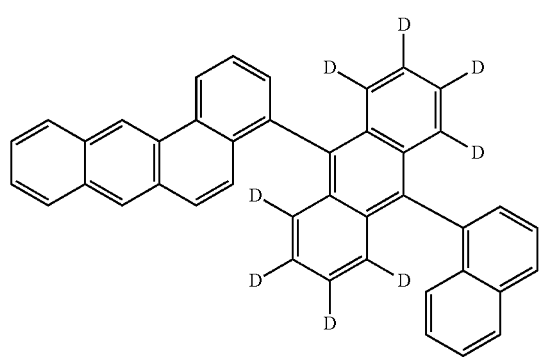

-continued
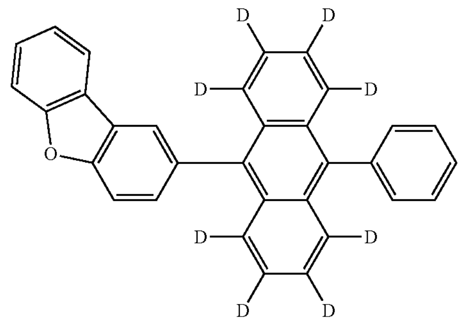
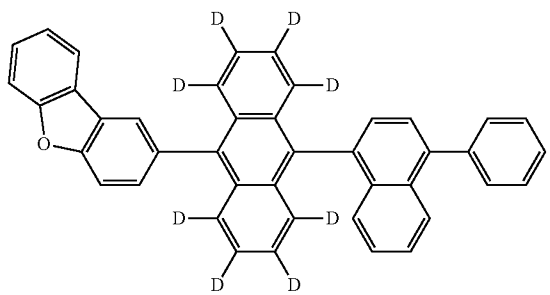
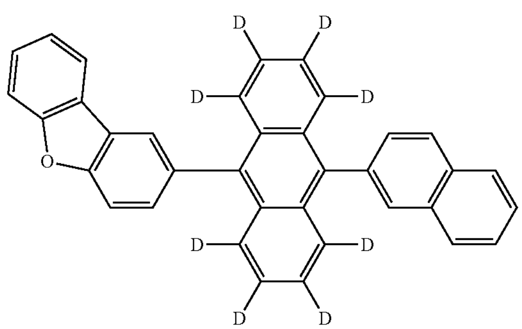
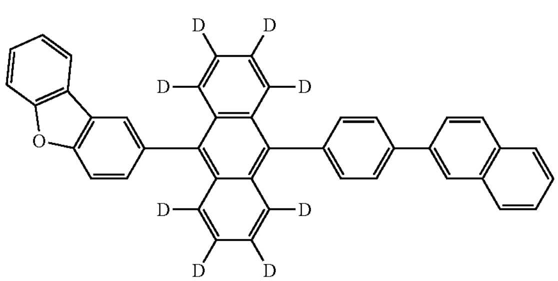
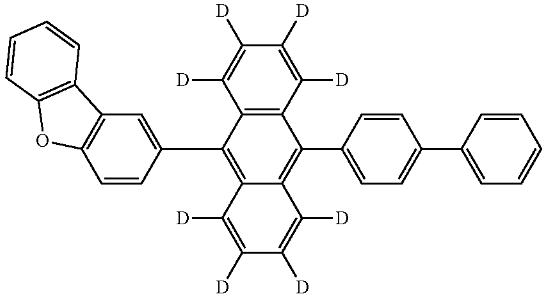
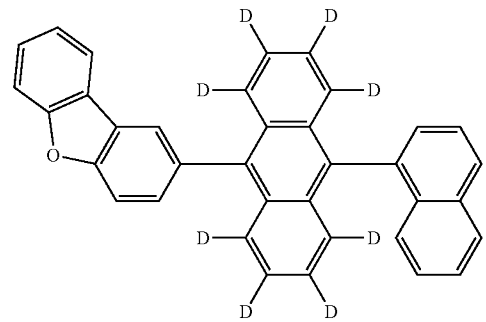
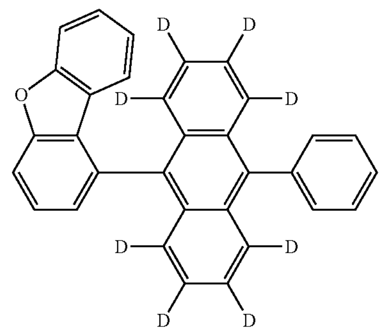
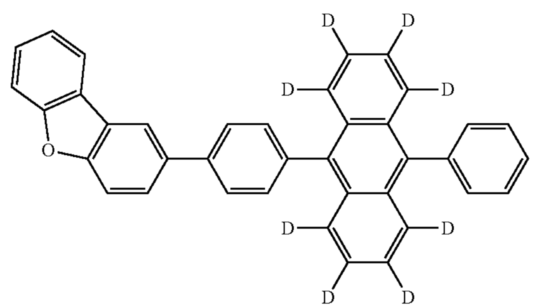
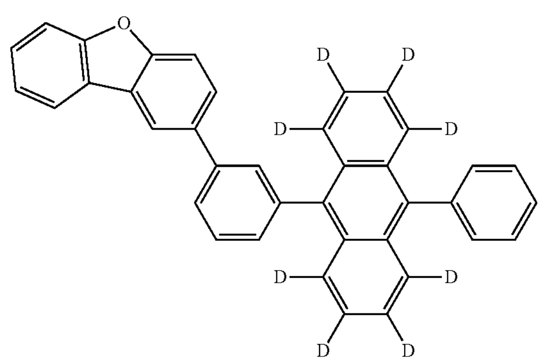
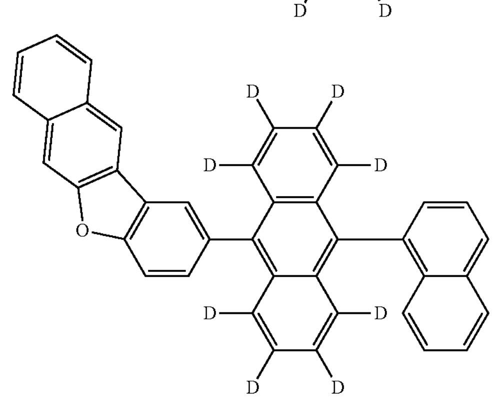

-continued
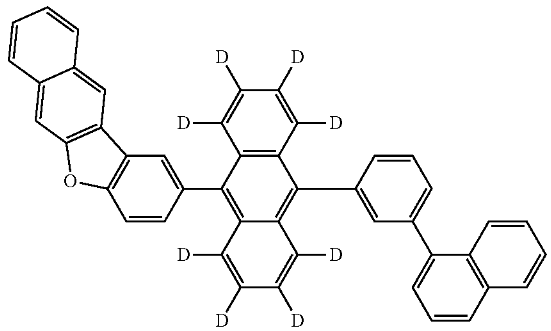
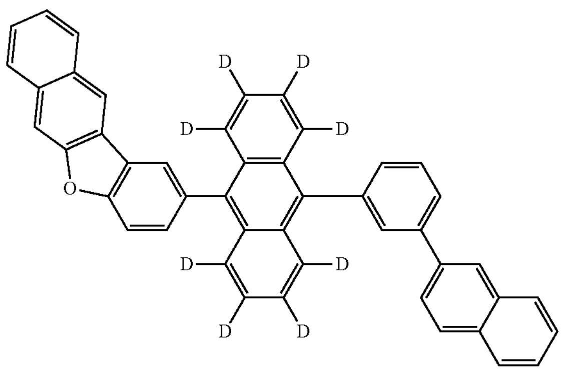
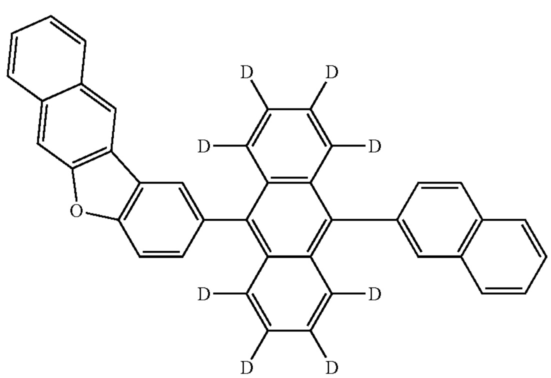
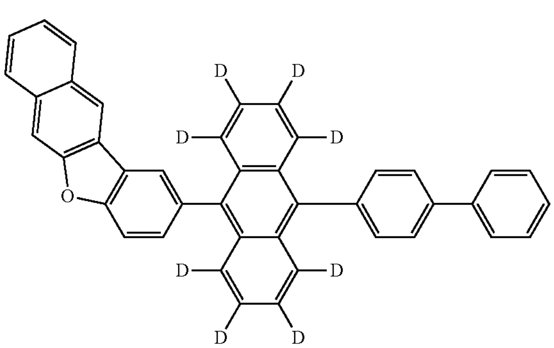
-continued
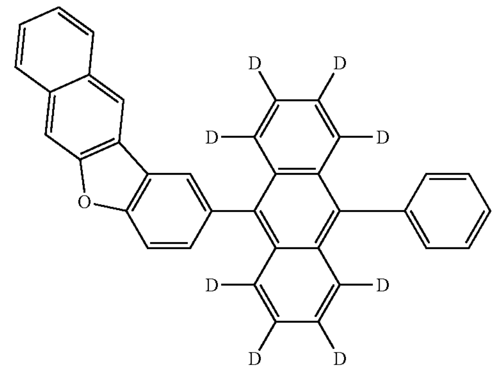
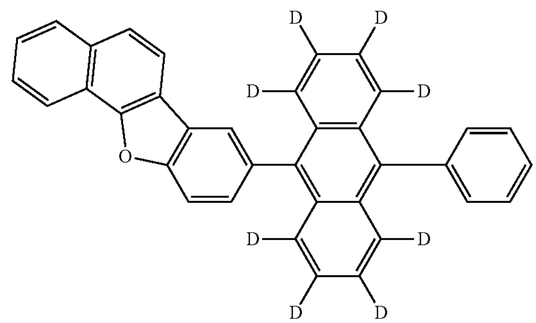
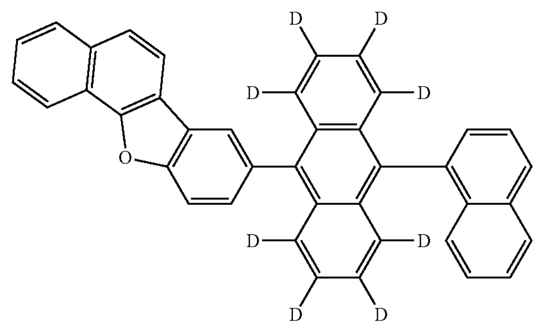
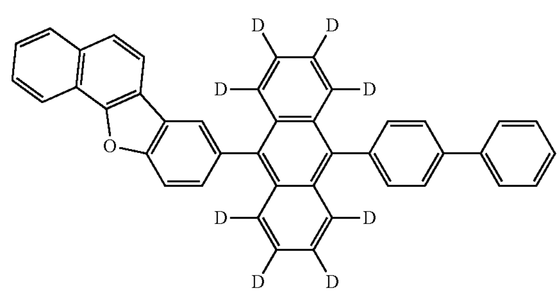
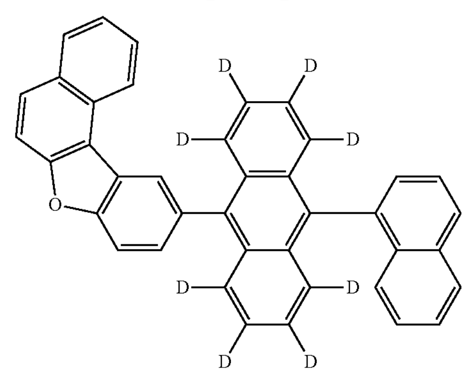

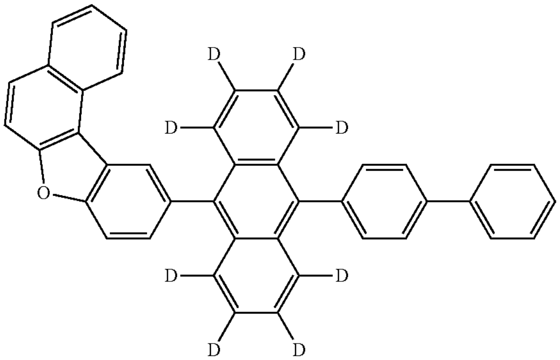
D
D
D
D
O
D
D
D
D
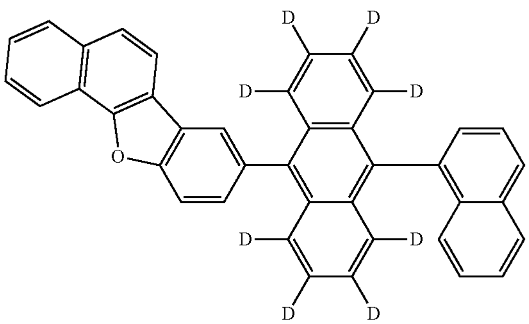
D
D
D
D
O
D
D
D
D
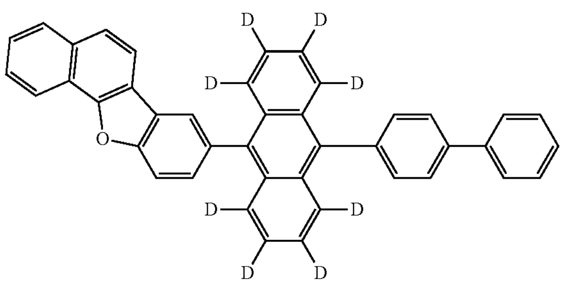
D
D
D
D
O
D
D
D
D
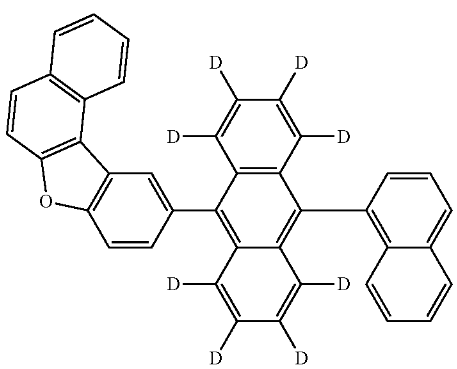
D
D
D
D
O
D
D
D
D
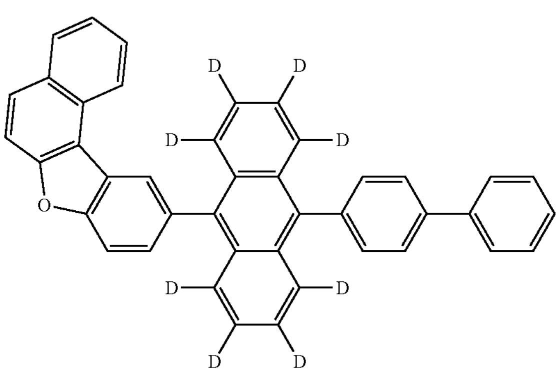
D
D
D
D
O
D
D
D
D
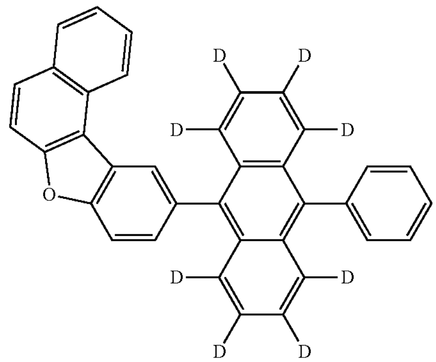
D
D
D
D
O
D
D
D
D
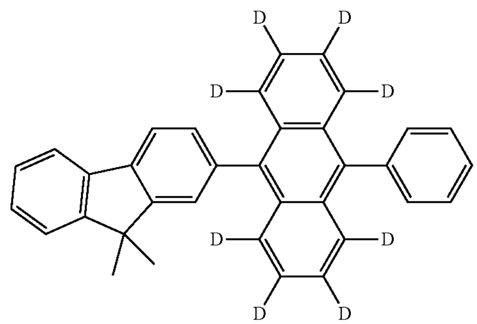
D
D
D
D
D
D
D
D
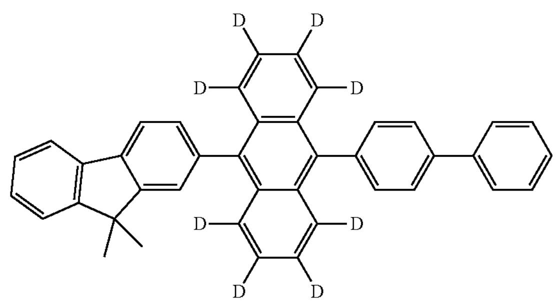
D
D
D
D
D
D
D
D
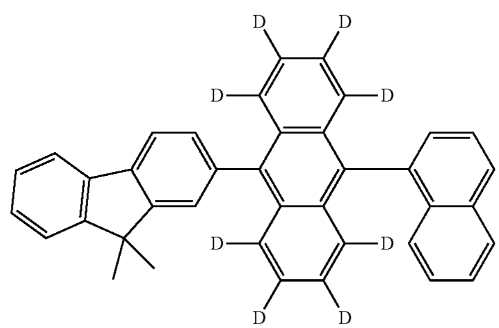
D
D
D
D
D
D
D
D
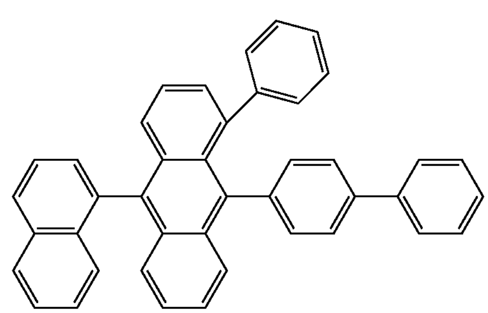

-continued
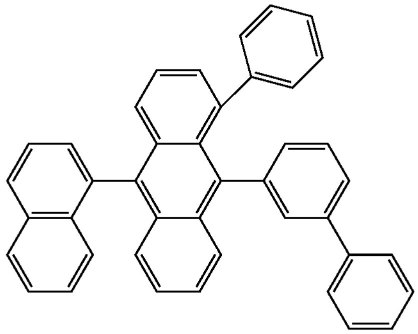
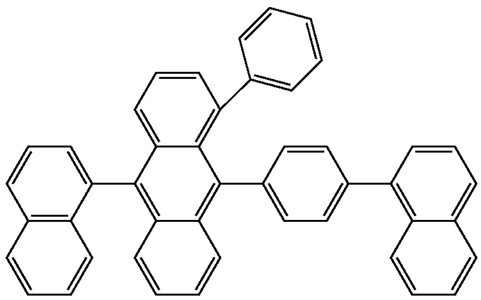
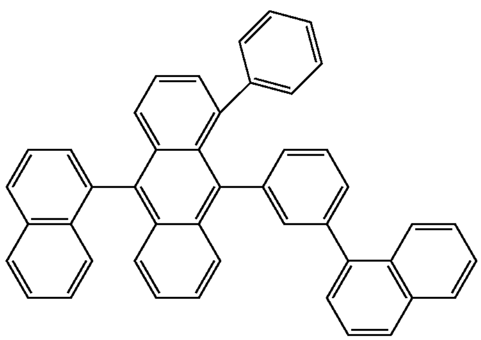
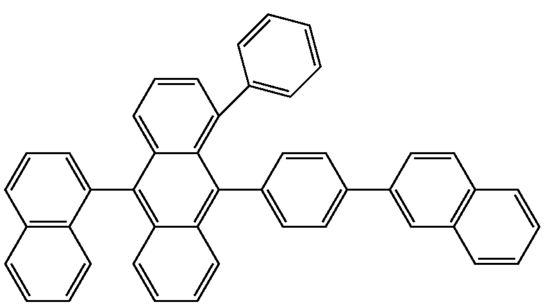
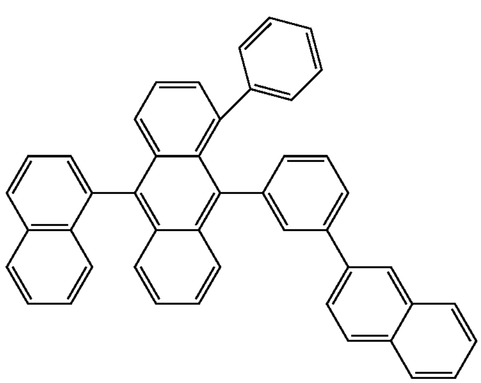
-continued
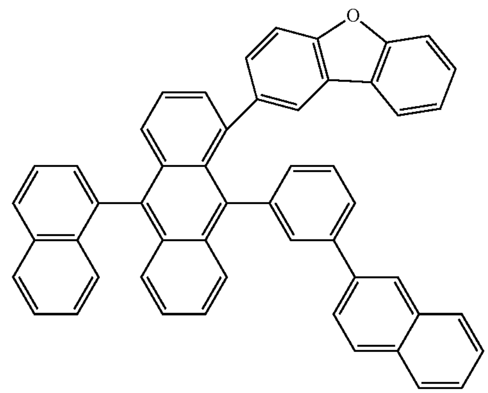
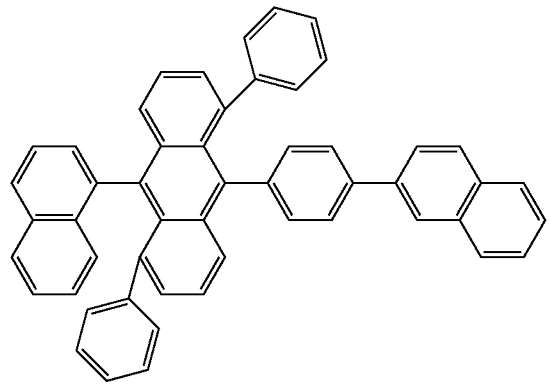
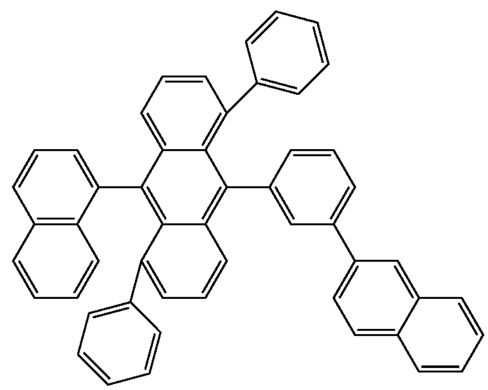
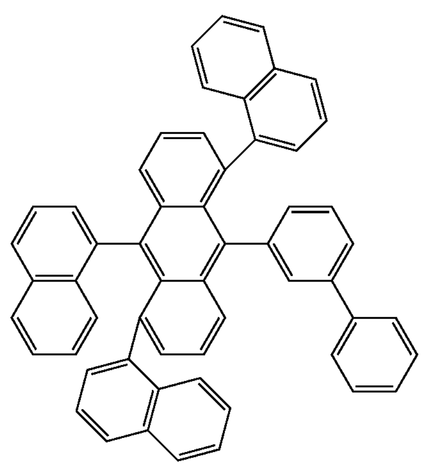

-continued
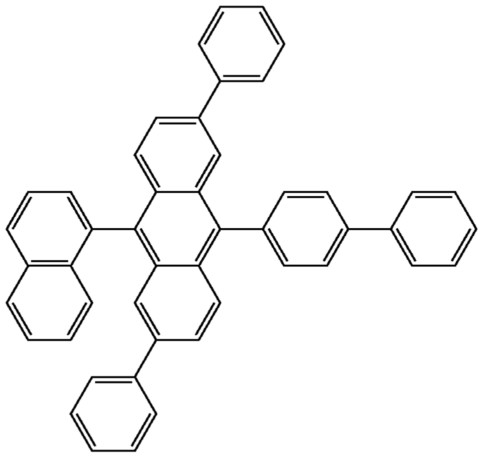
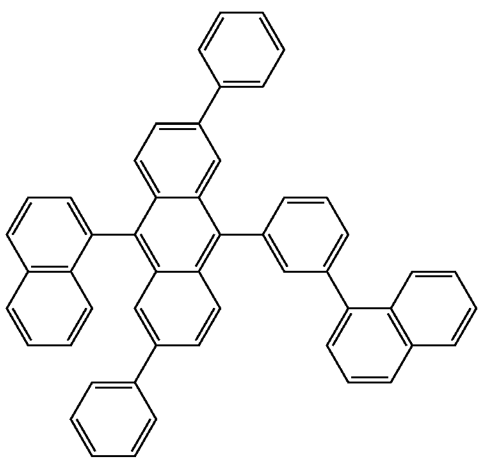
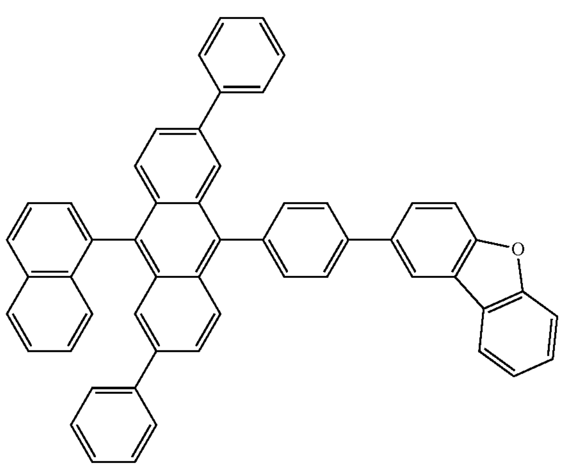
-continued
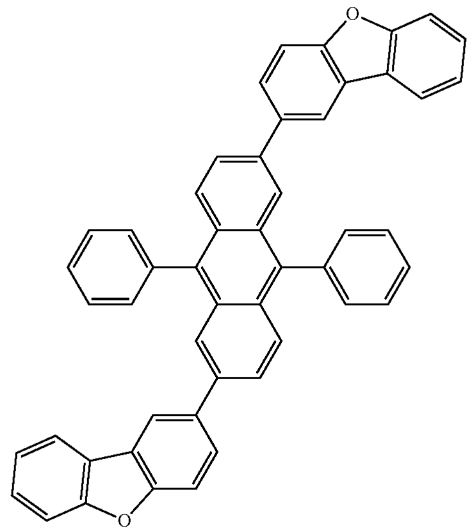
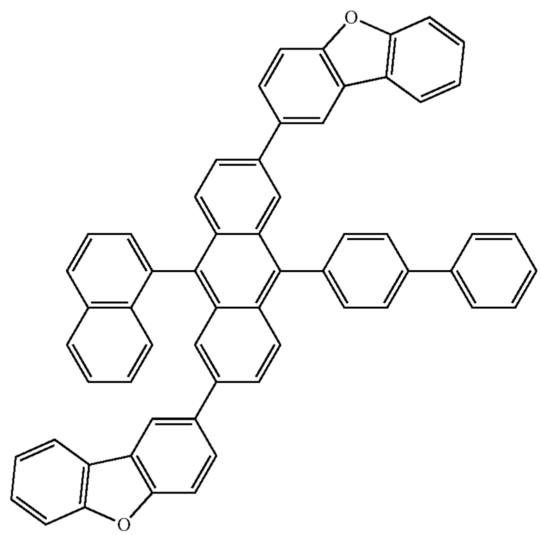
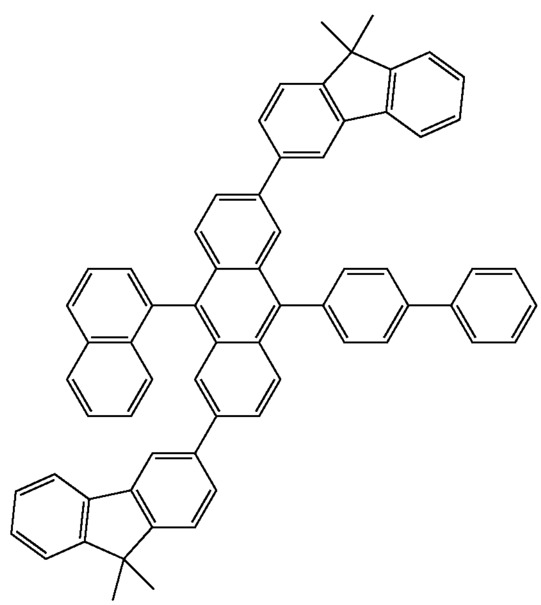

-continued
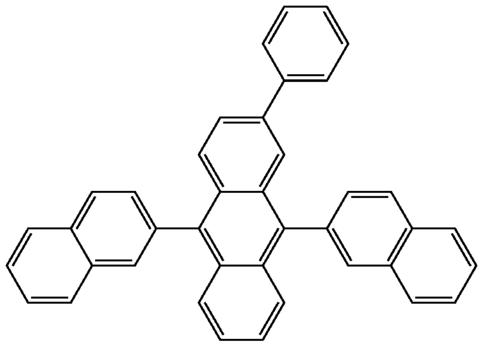
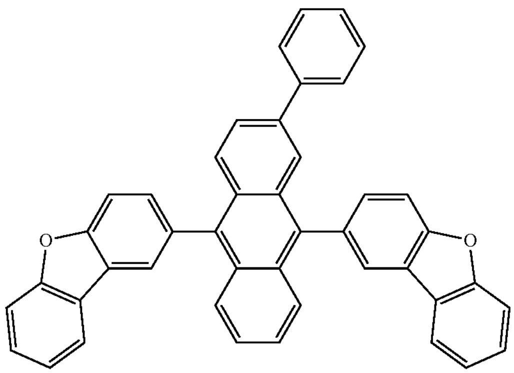
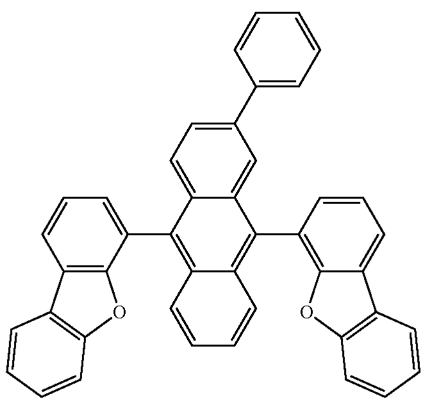
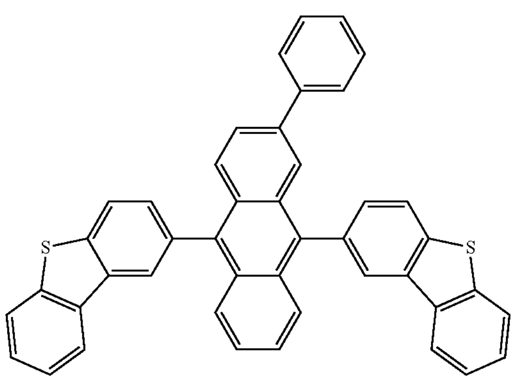
-continued
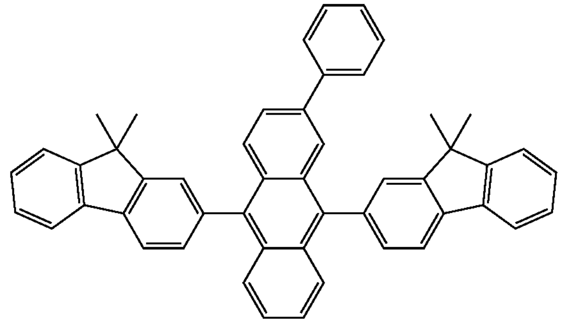
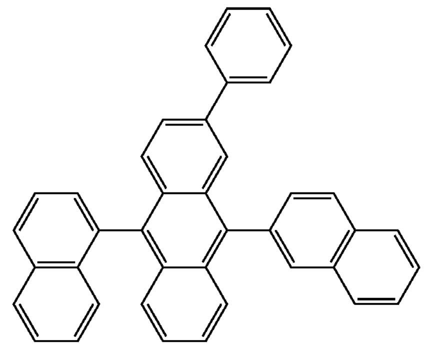
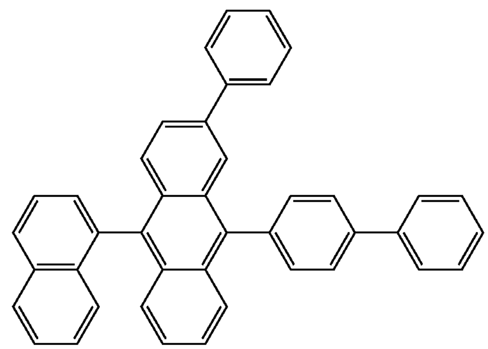
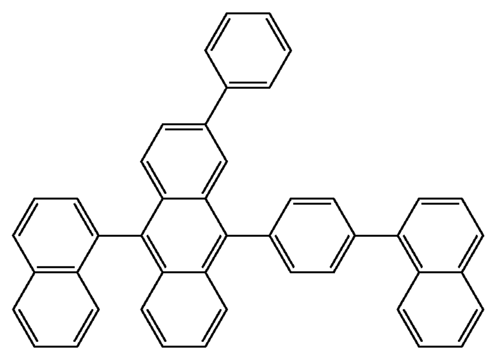
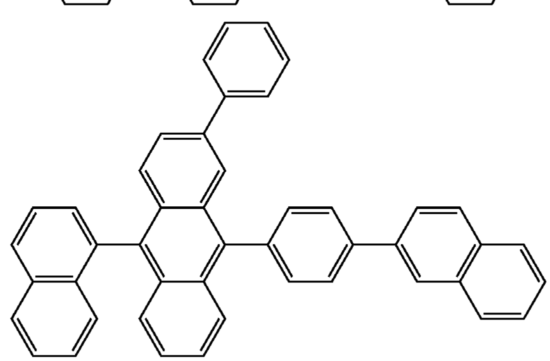

-continued
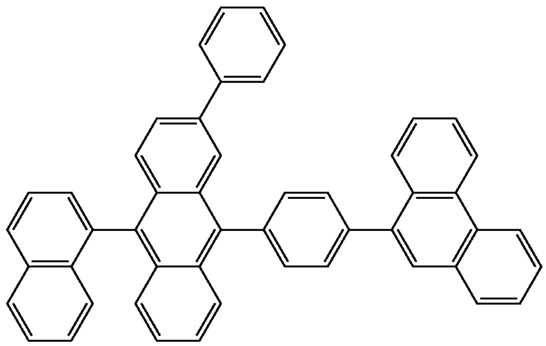
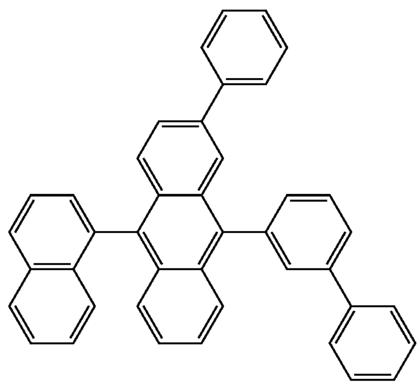
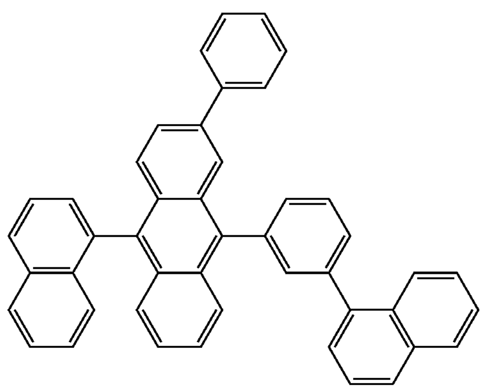
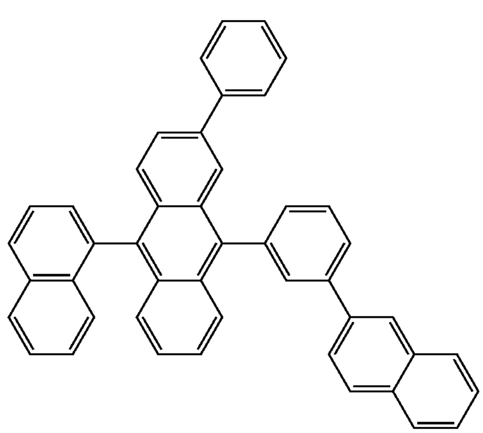
-continued
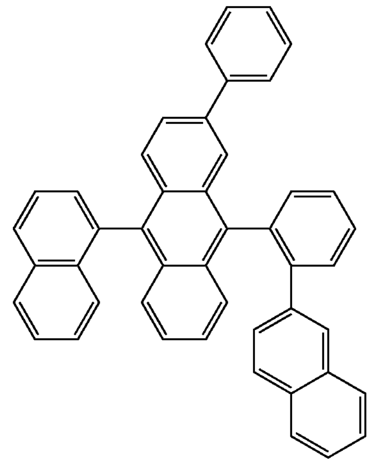
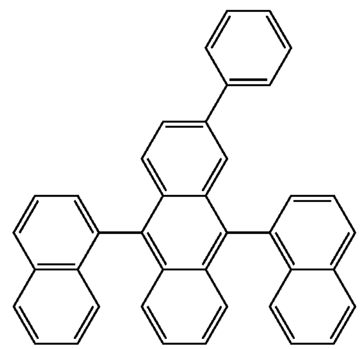
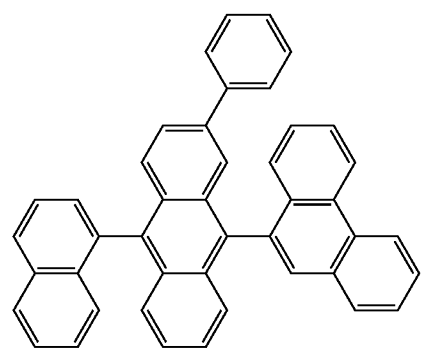
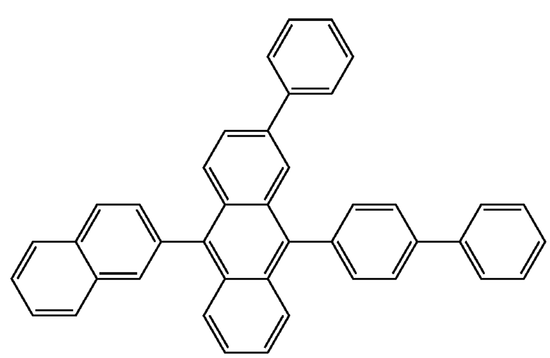

-continued
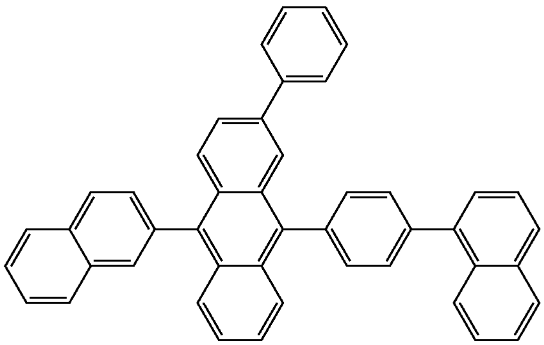
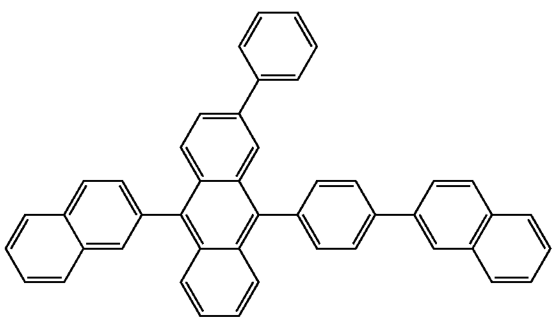
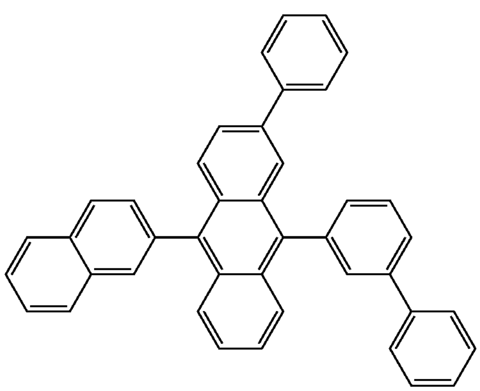
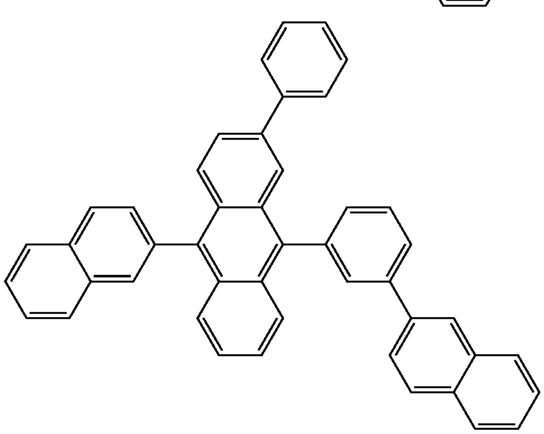
-continued
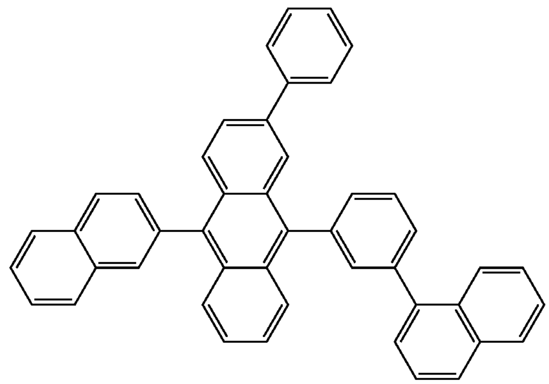
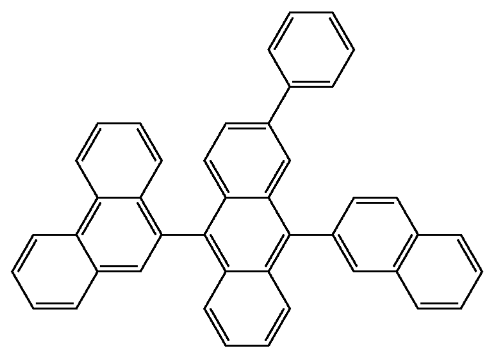
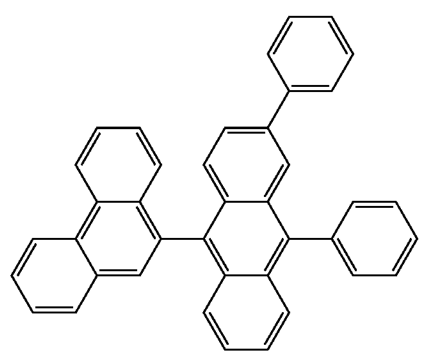
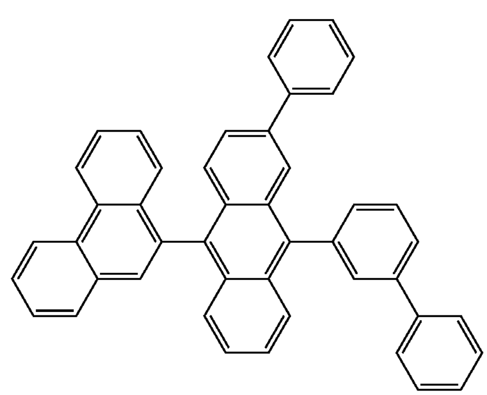

-continued
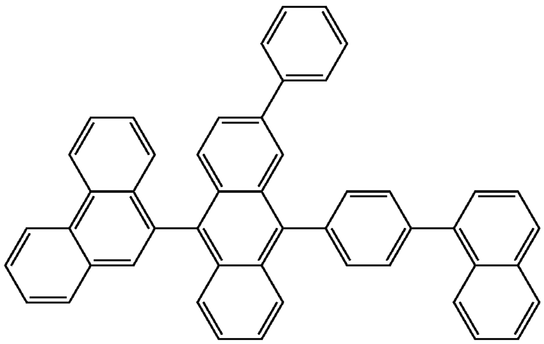
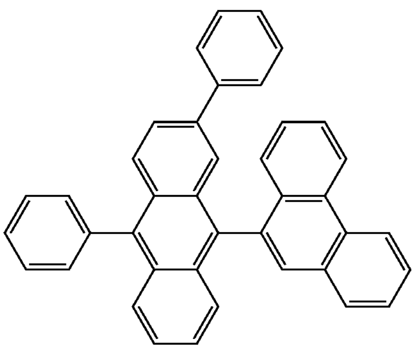
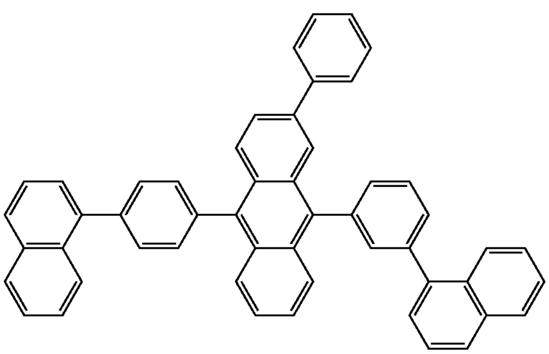
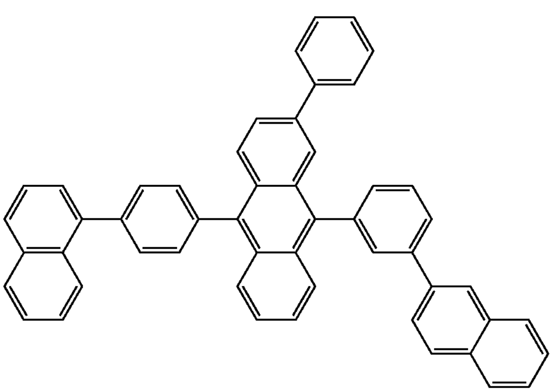
-continued
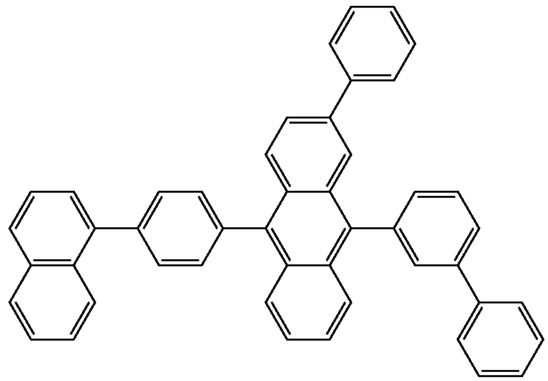
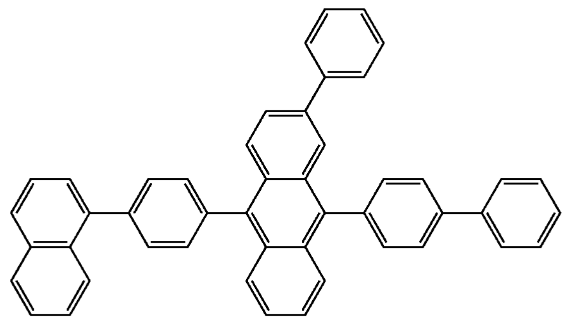
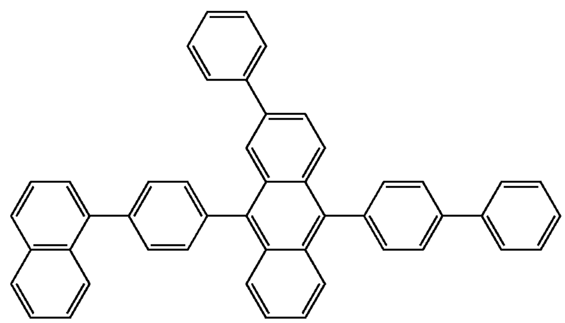
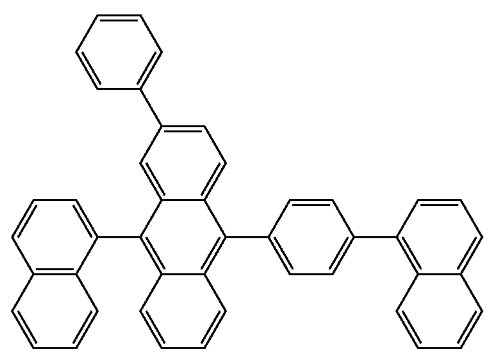
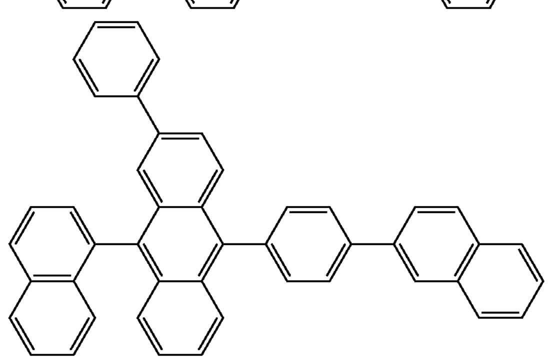

-continued
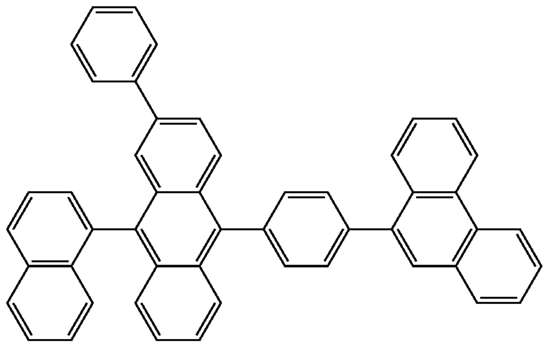
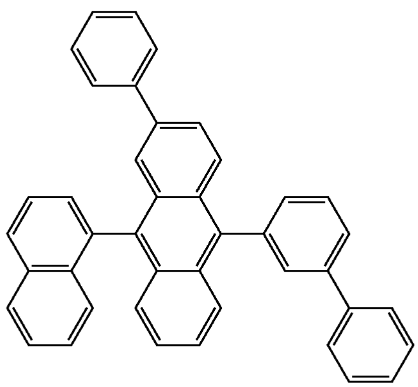
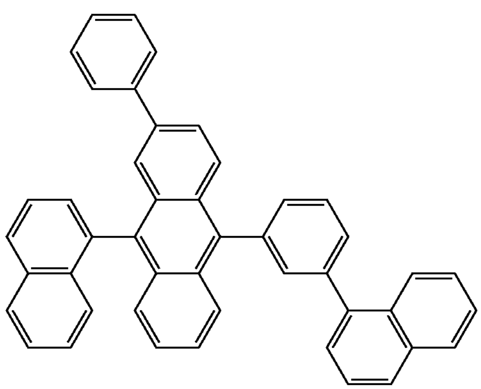
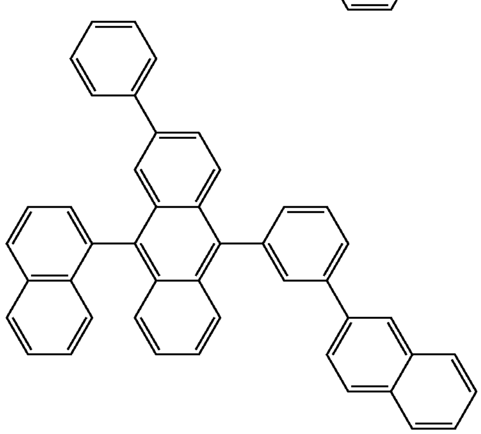
-continued
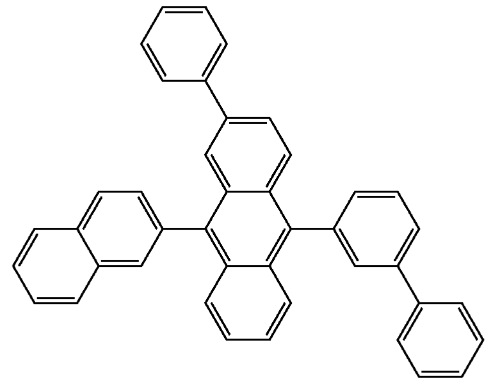
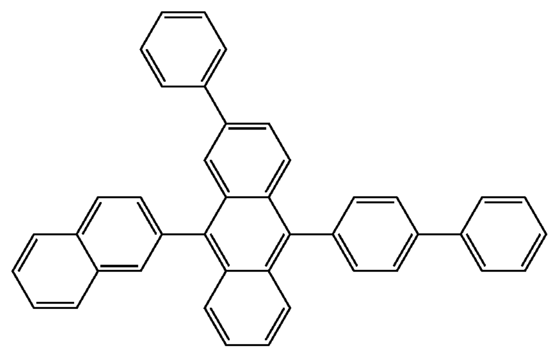
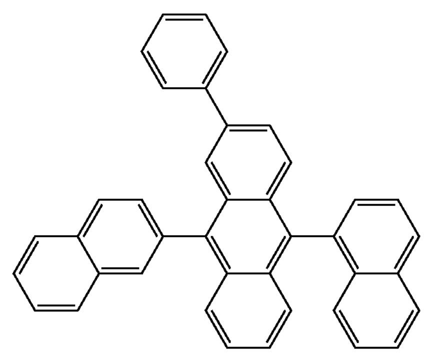
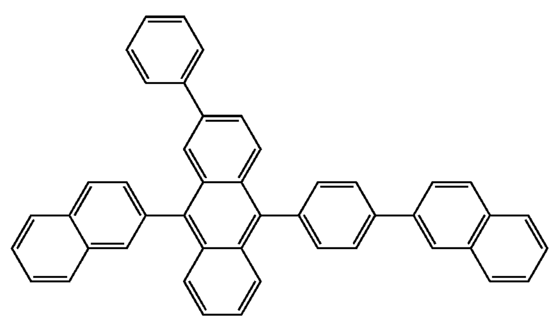

-continued
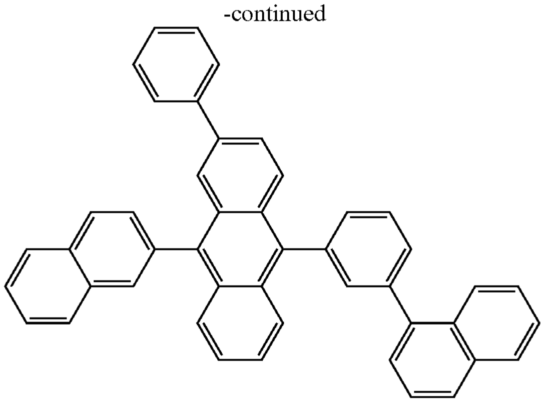
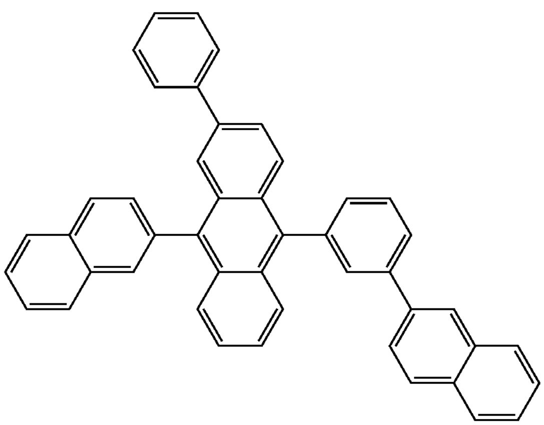
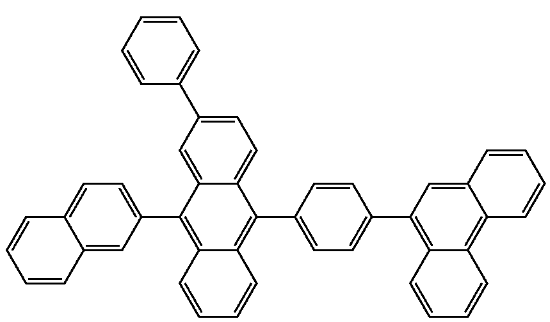
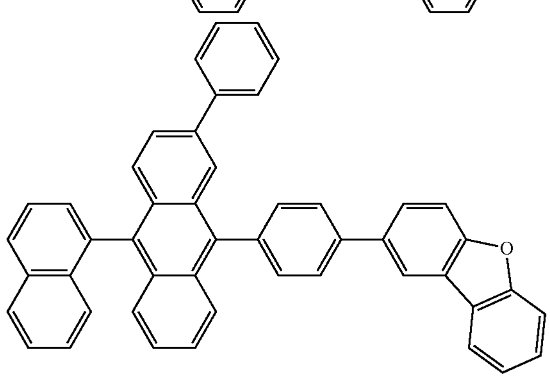
-continued
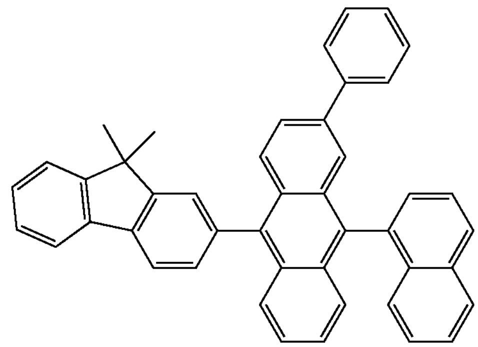
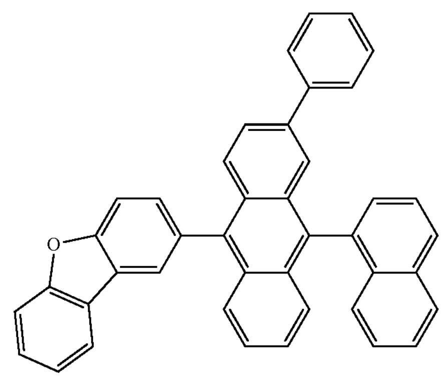
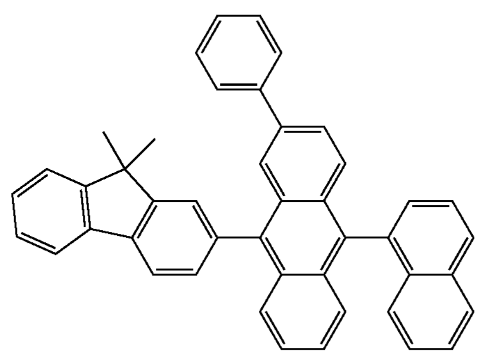
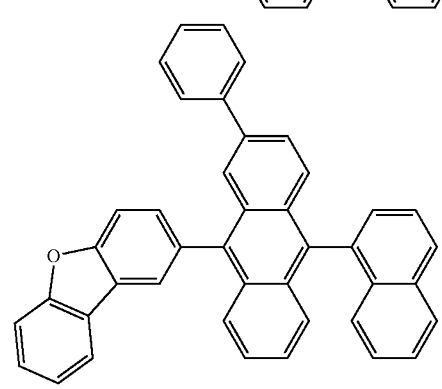

-continued
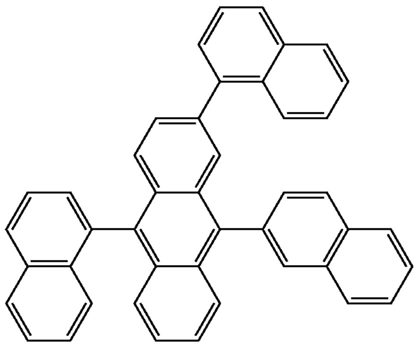
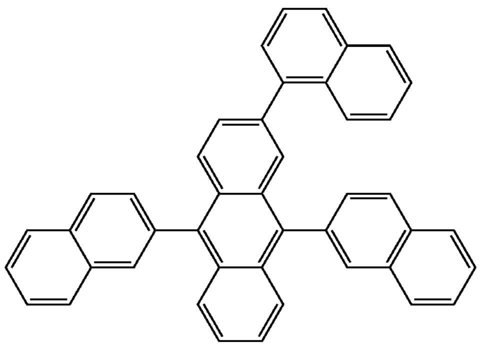
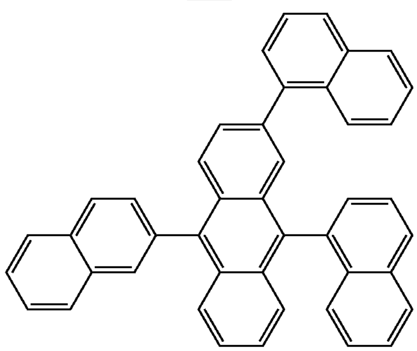
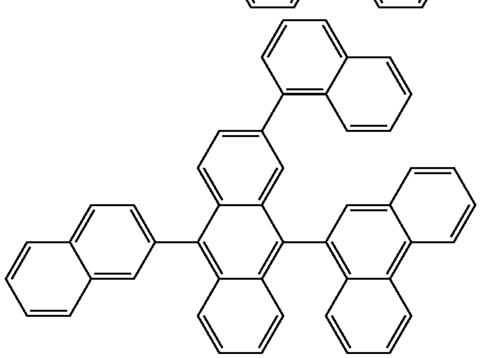
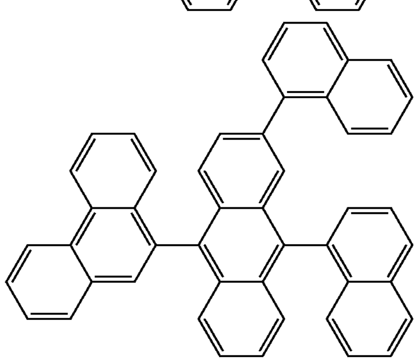
-continued
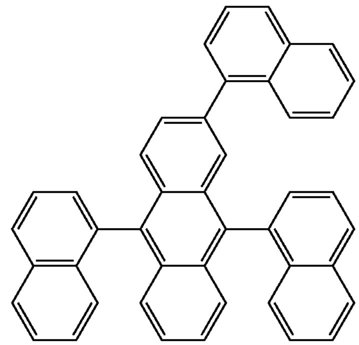
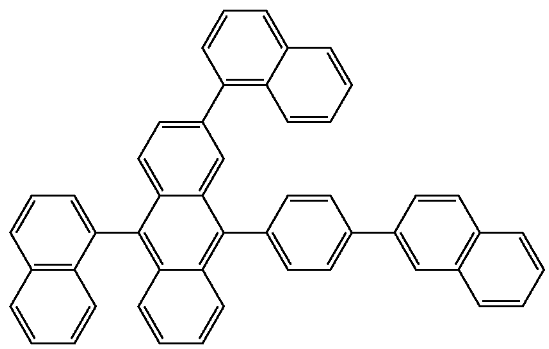
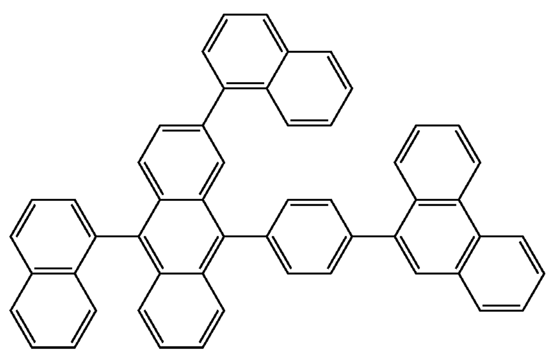
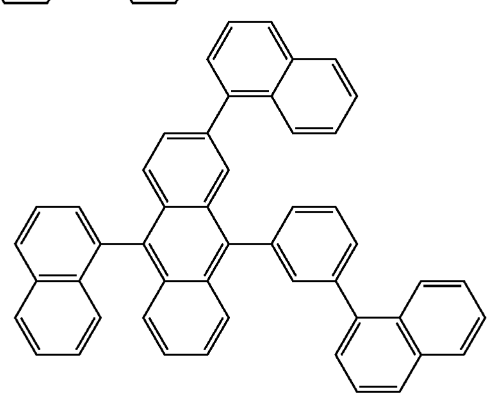

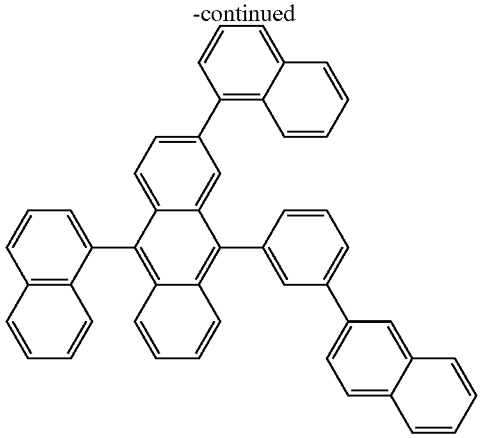
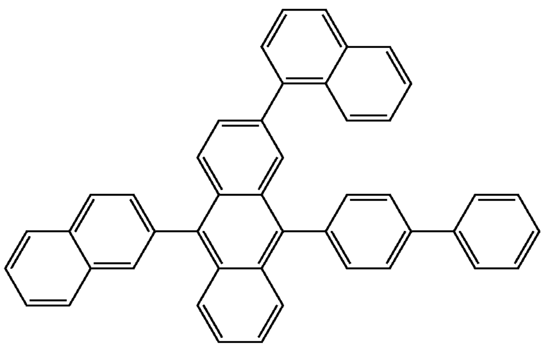
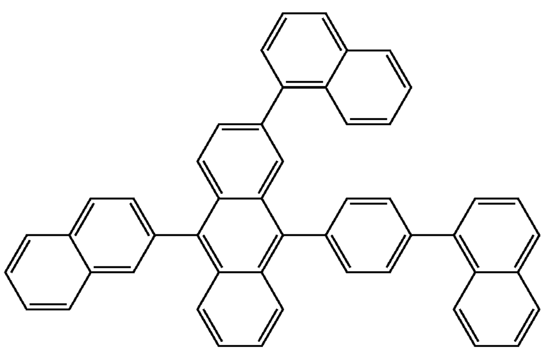
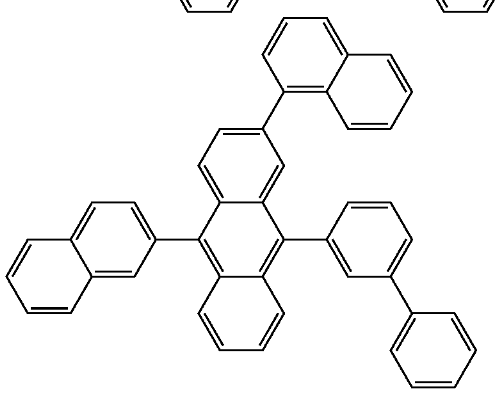
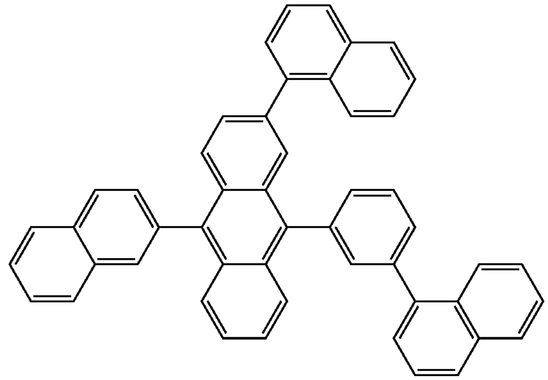
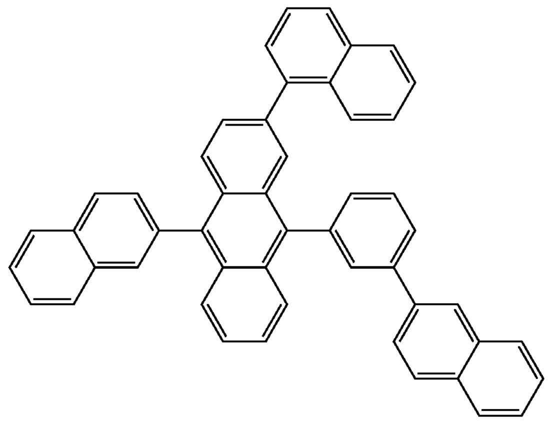
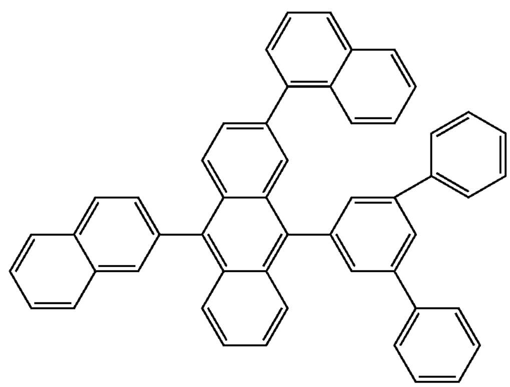
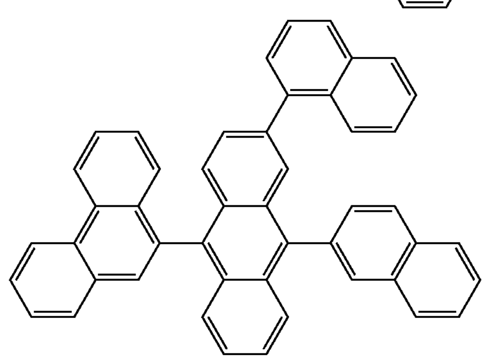

-continued
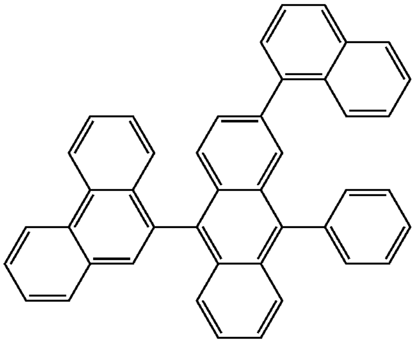
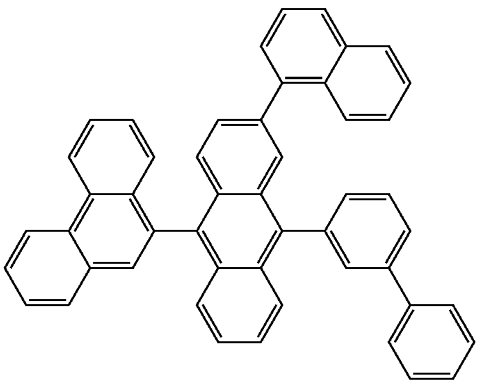
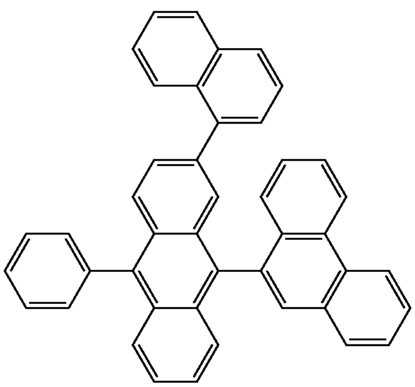
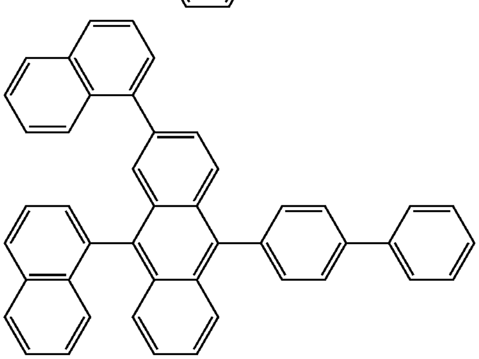
-continued
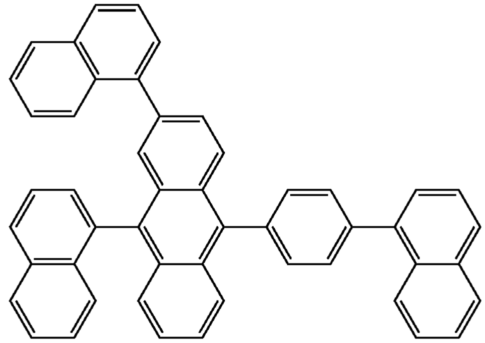
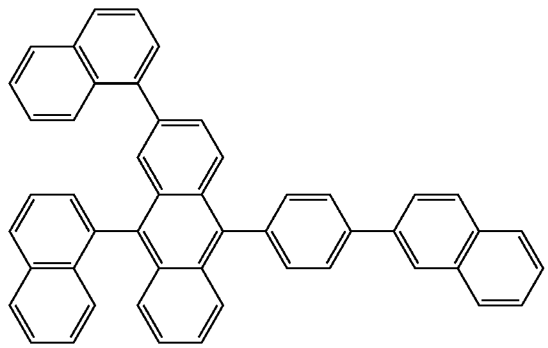
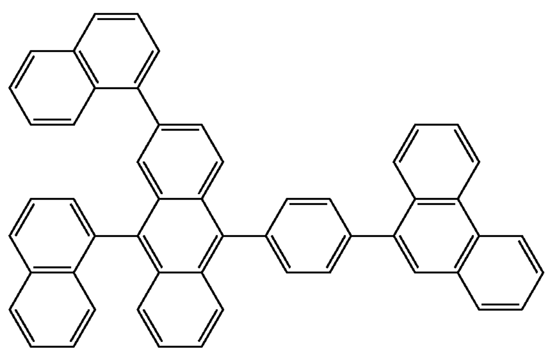
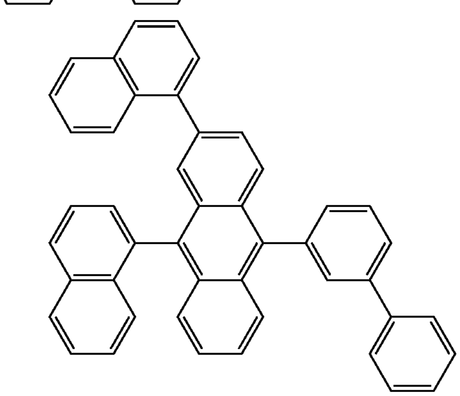

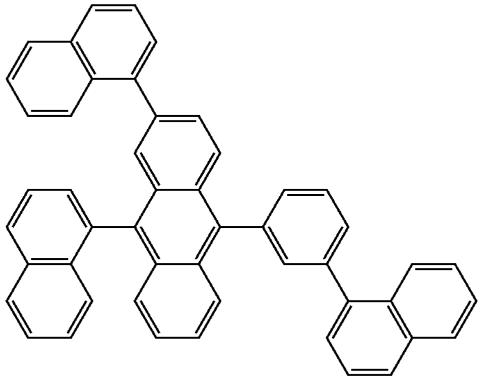
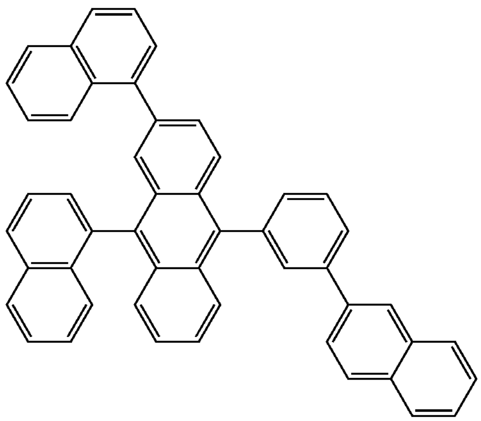
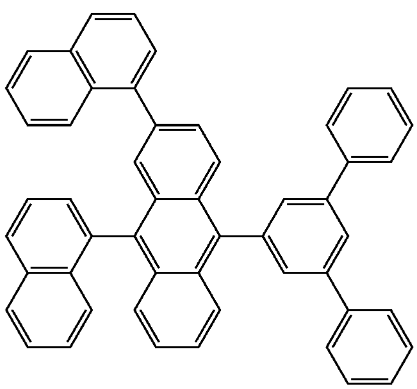
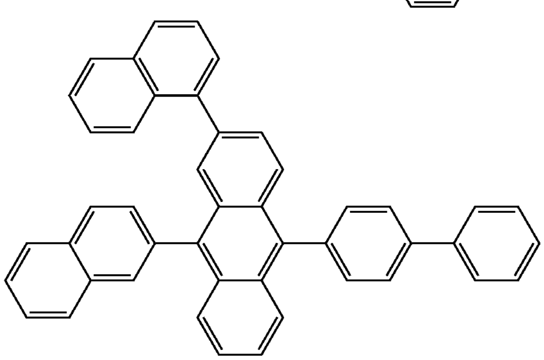
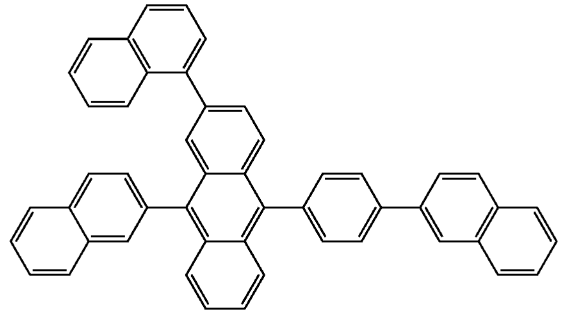
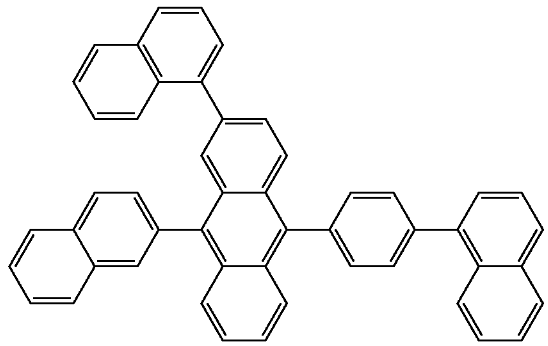
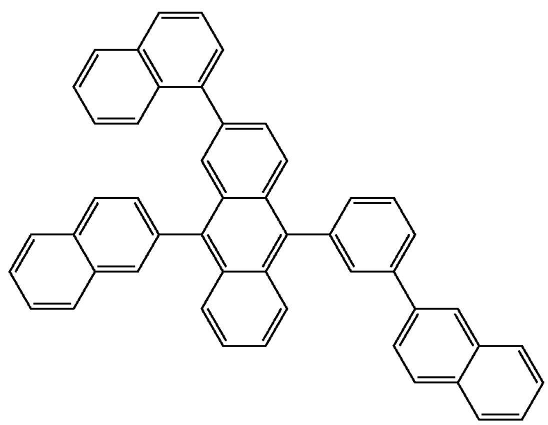
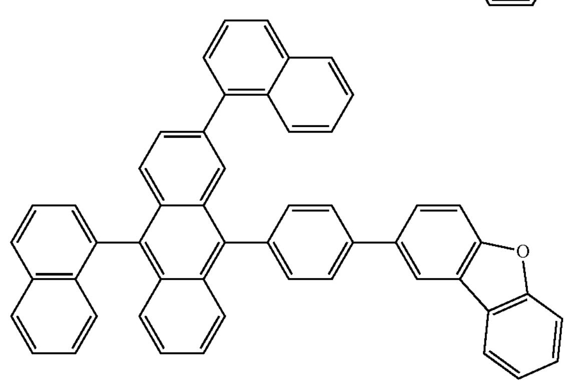
O -continued
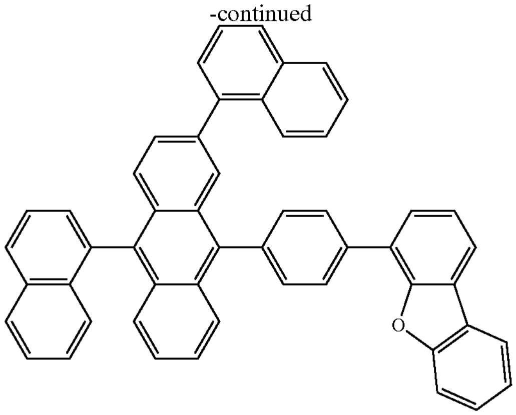
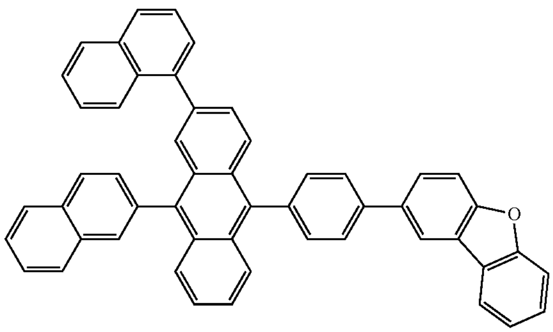
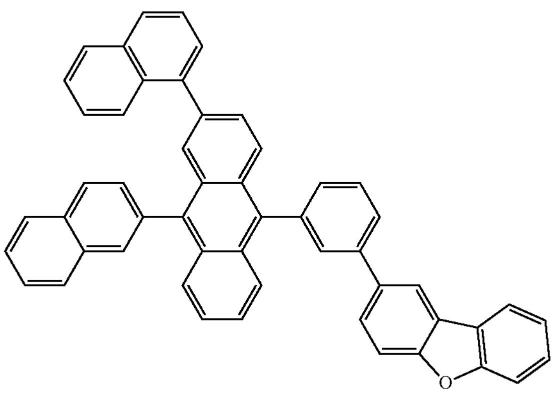
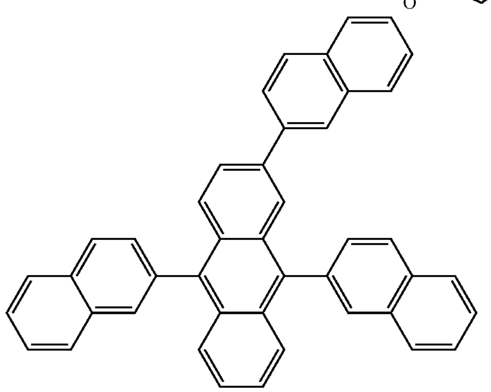
-continued
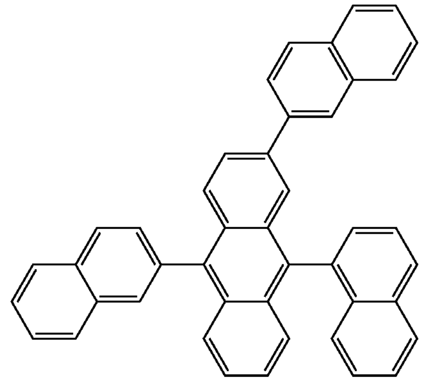
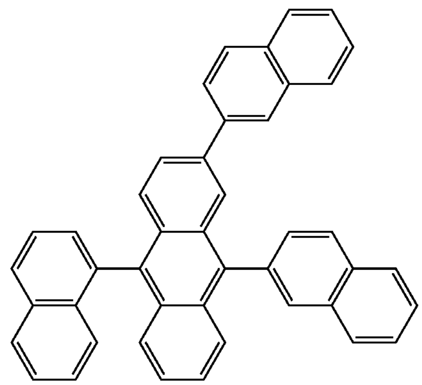
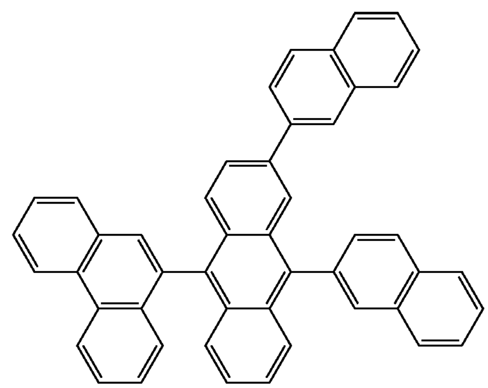
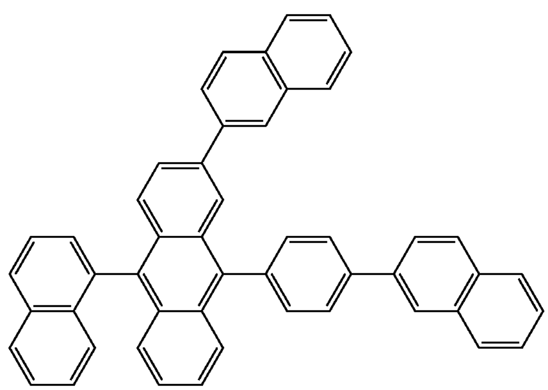

-continued
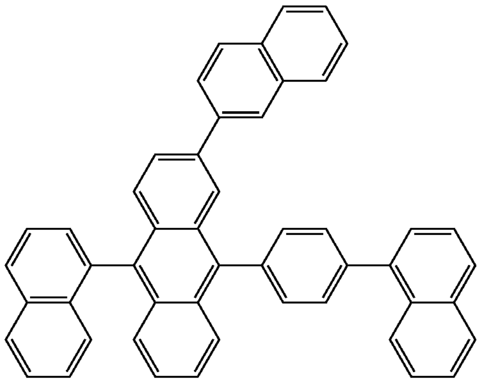
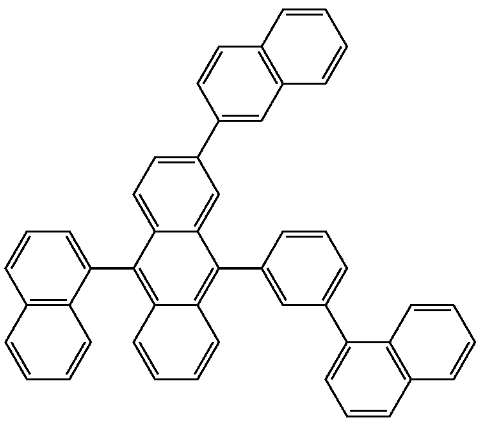
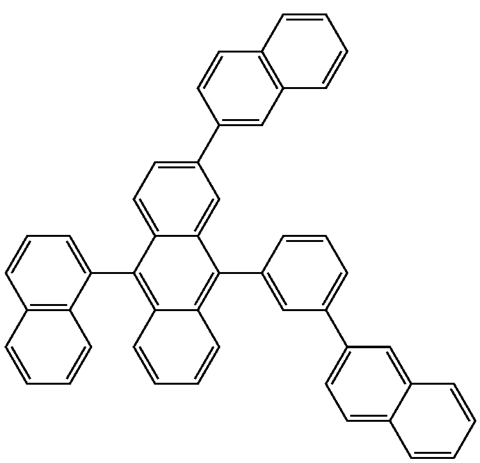
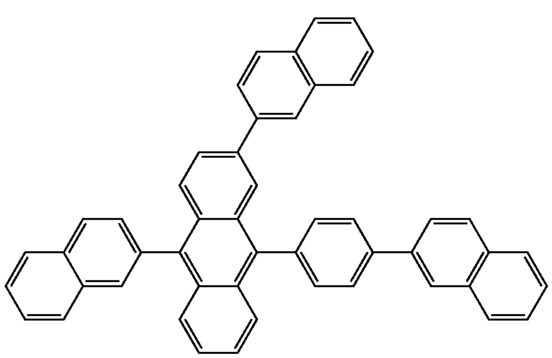
-continued
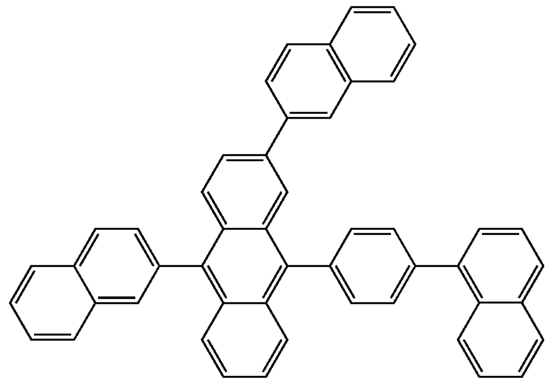
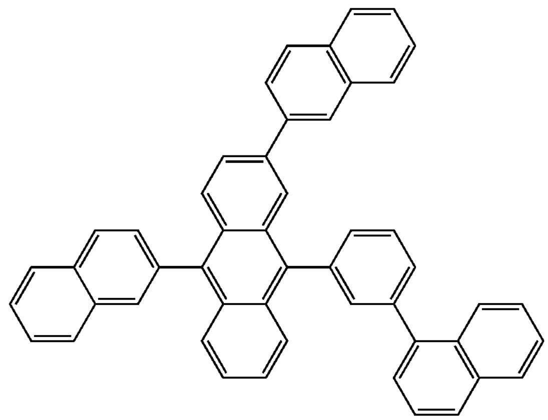
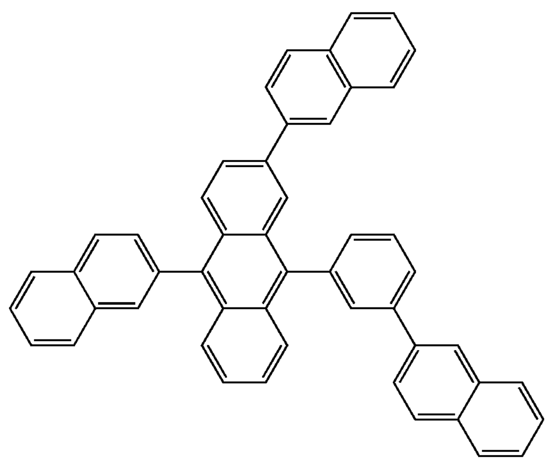
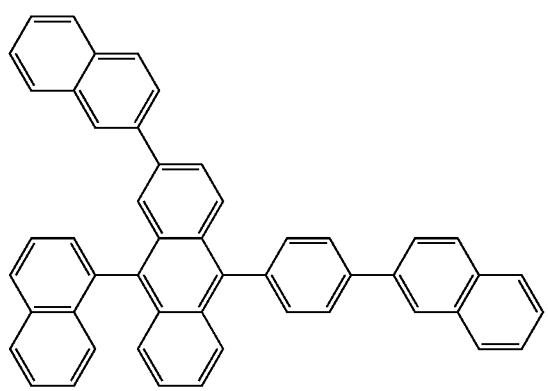

-continued
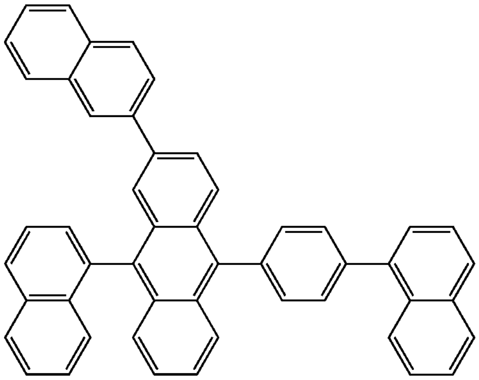
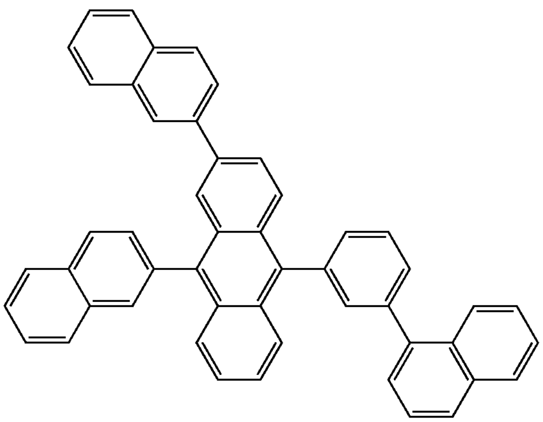
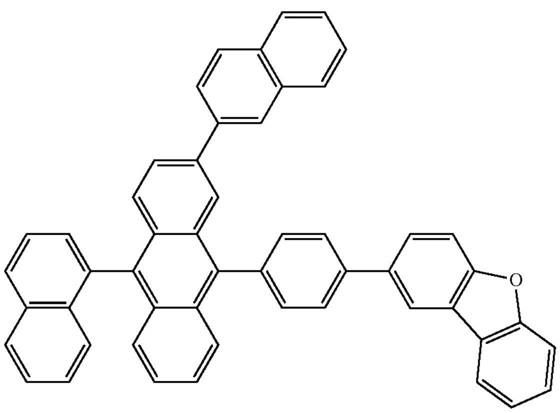
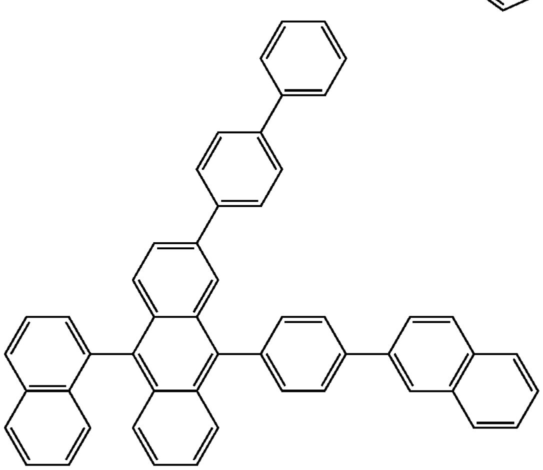
-continued
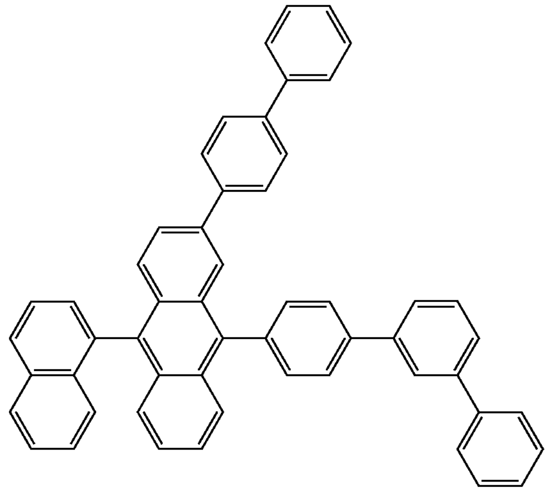
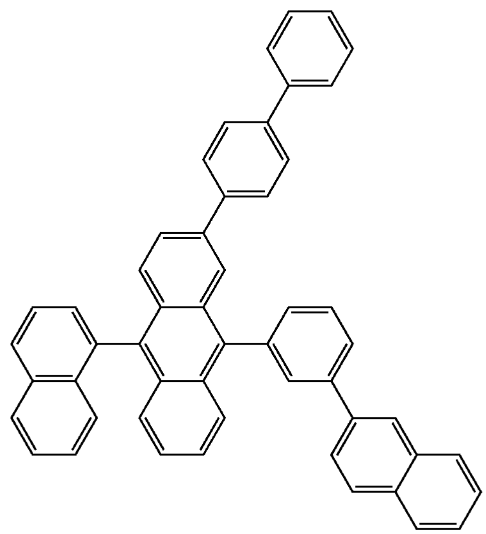
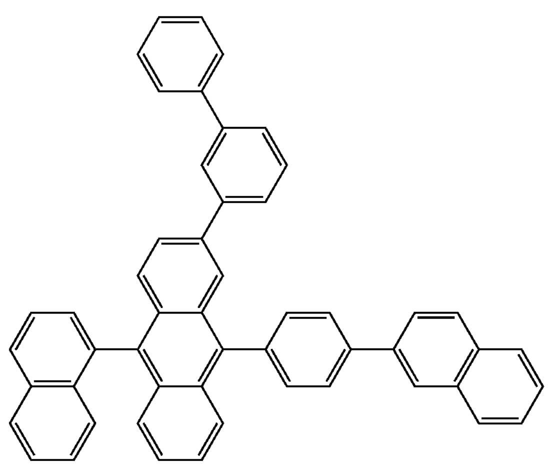

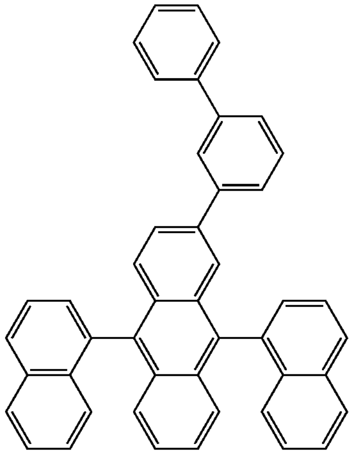
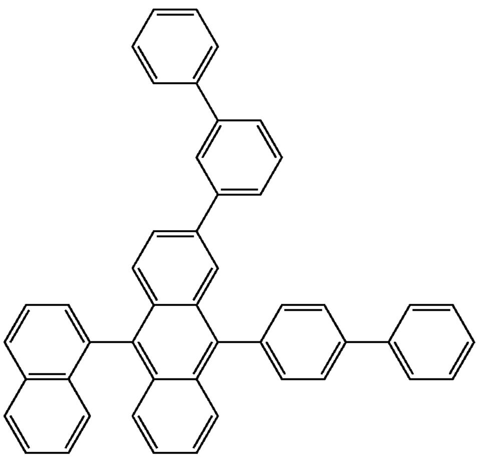
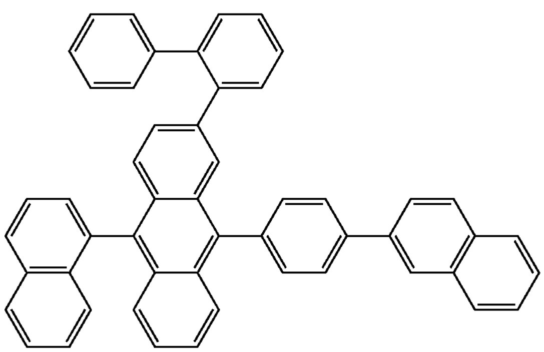
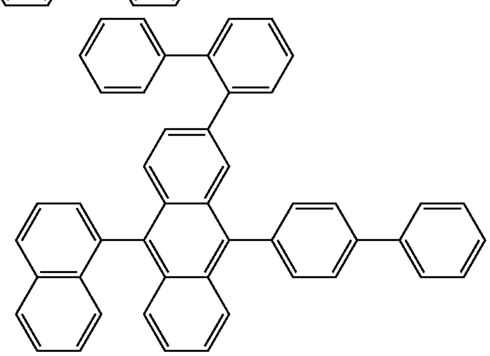
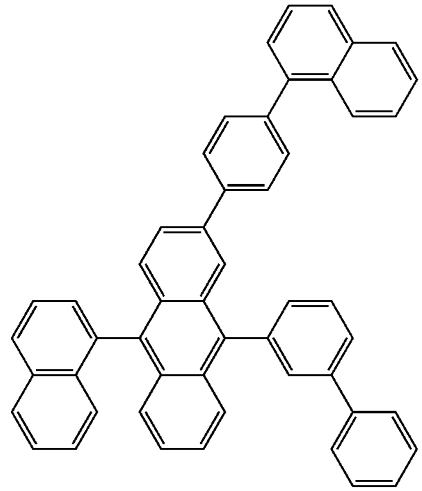
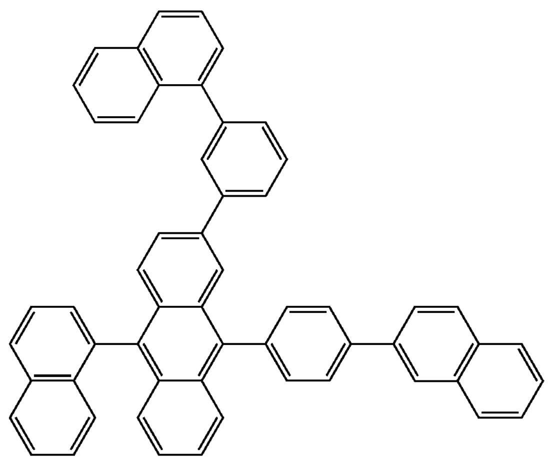
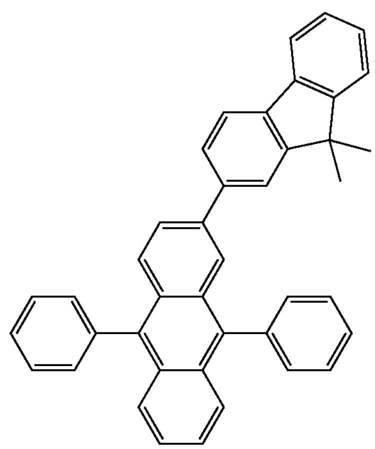

-continued
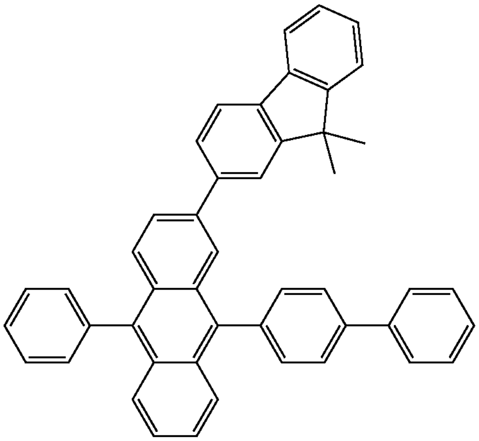
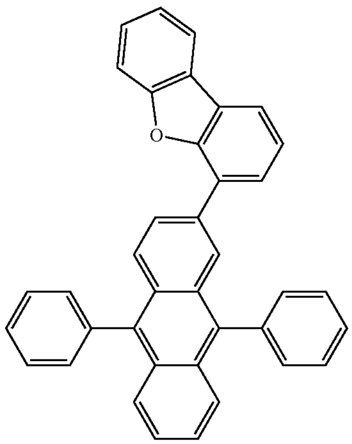
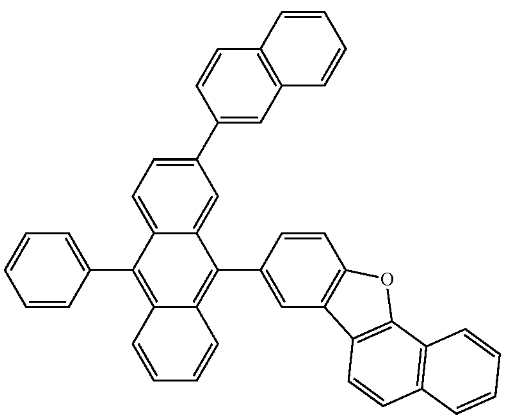
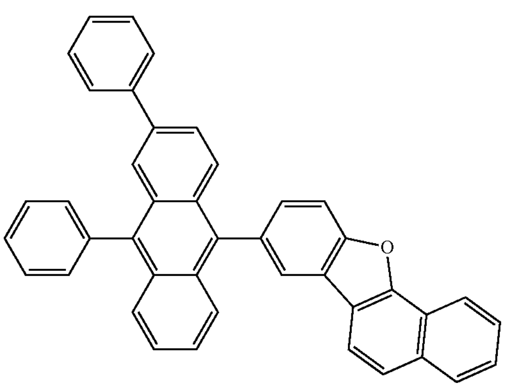
-continued
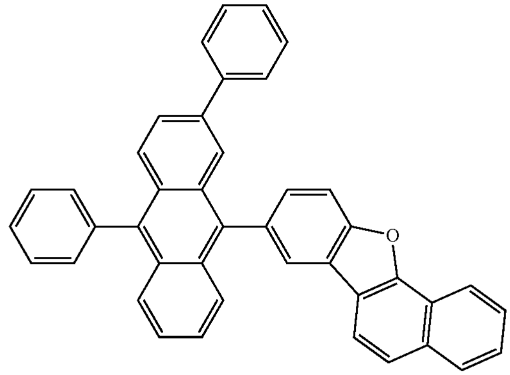
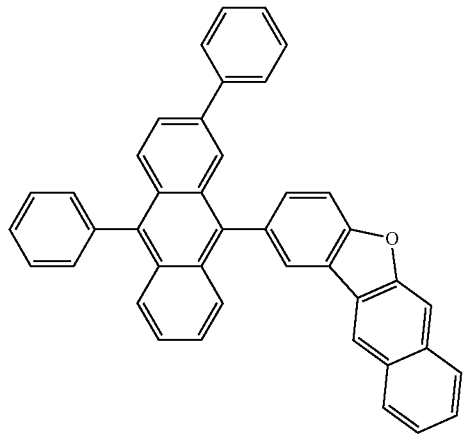
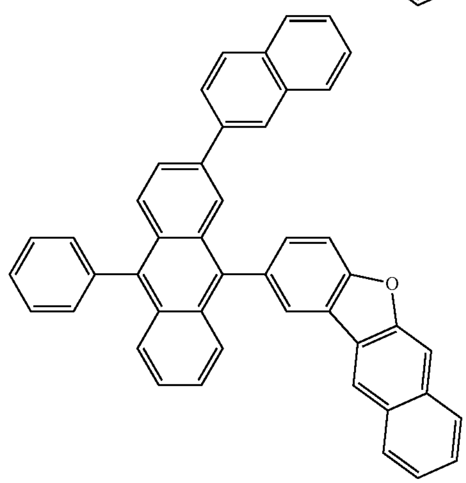
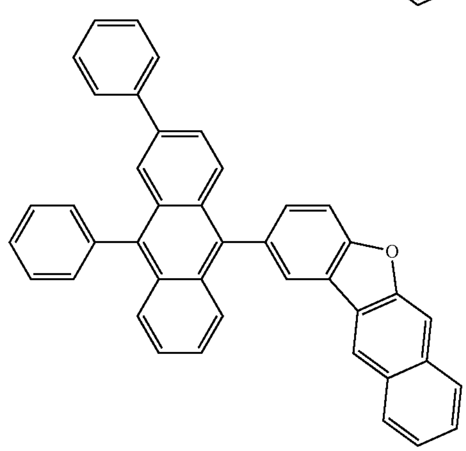

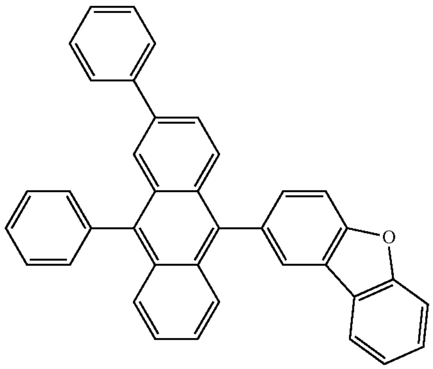
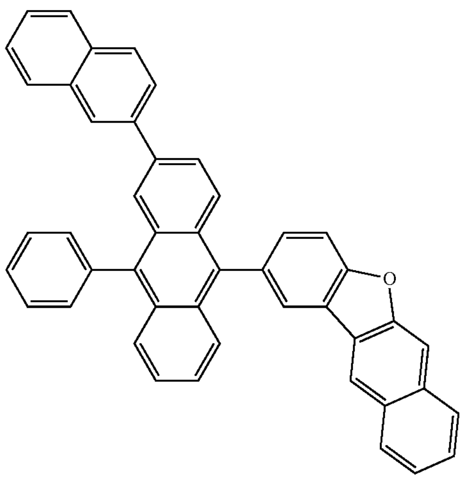
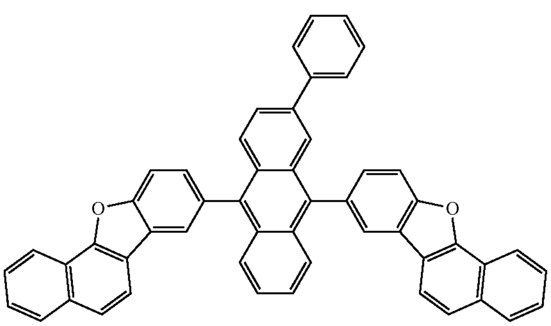
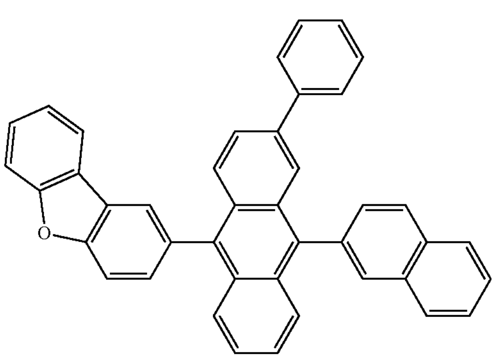
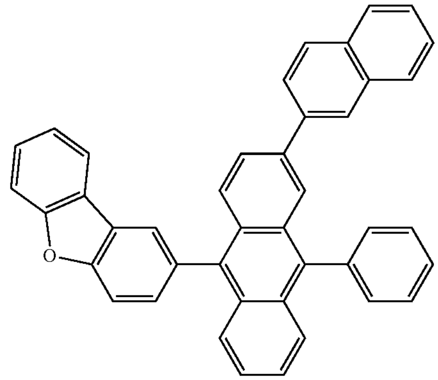
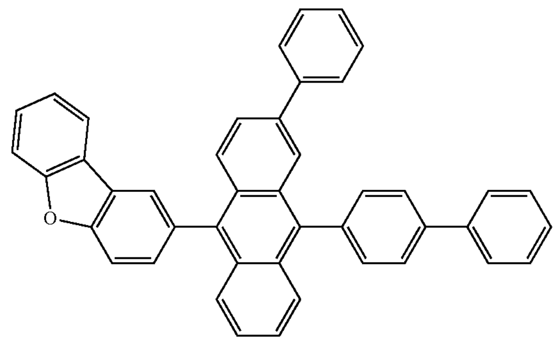
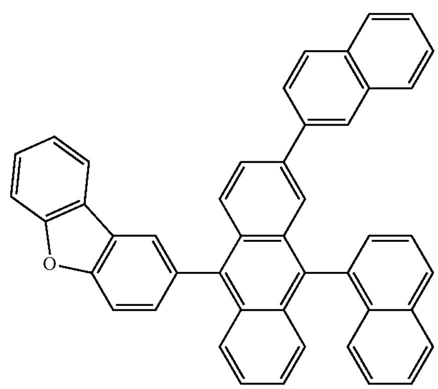
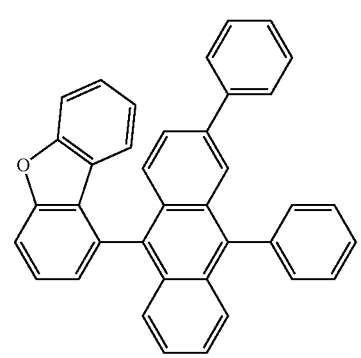
O -continued
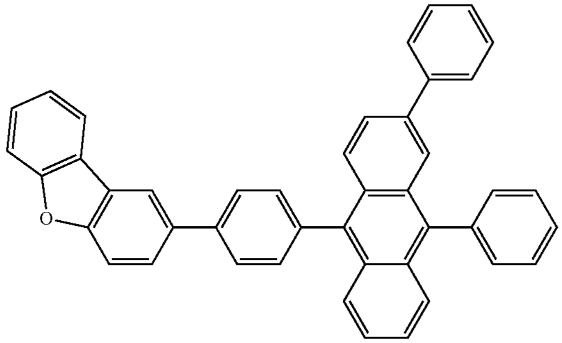
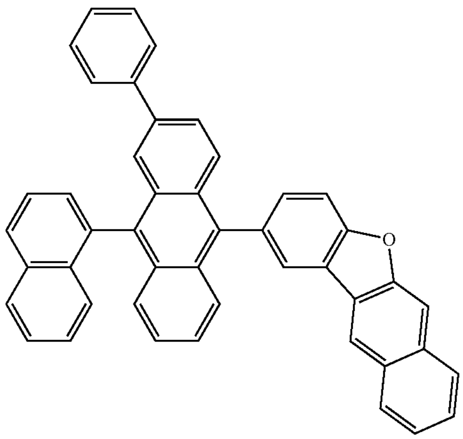
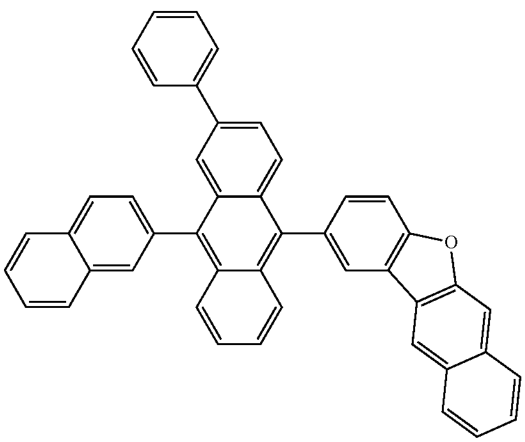
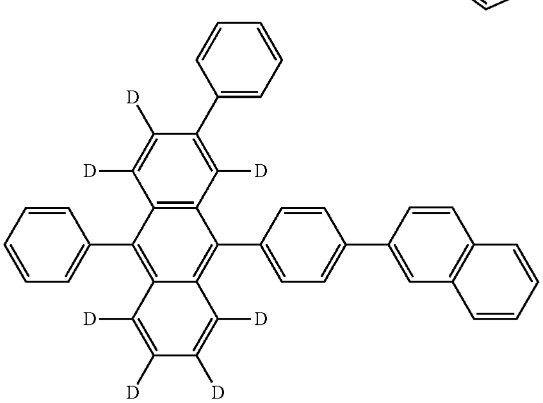
-continued
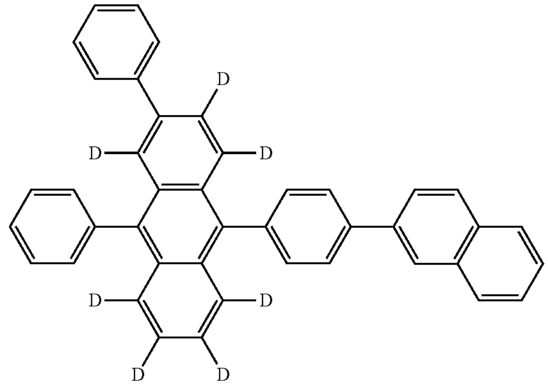
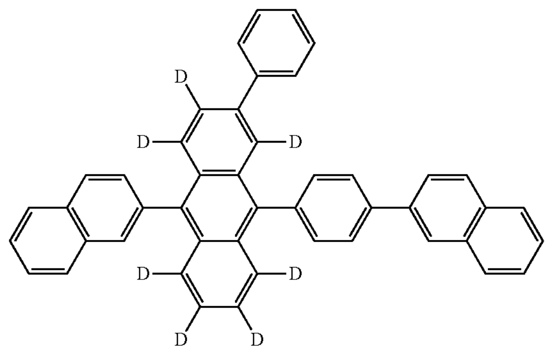
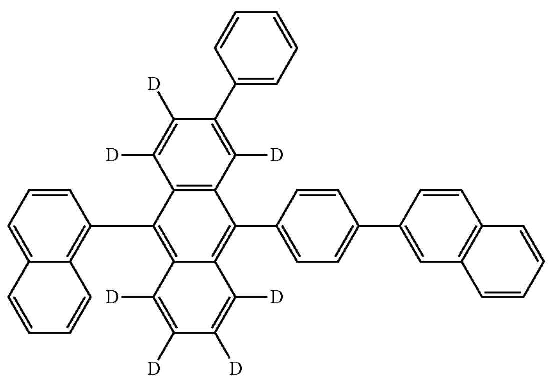
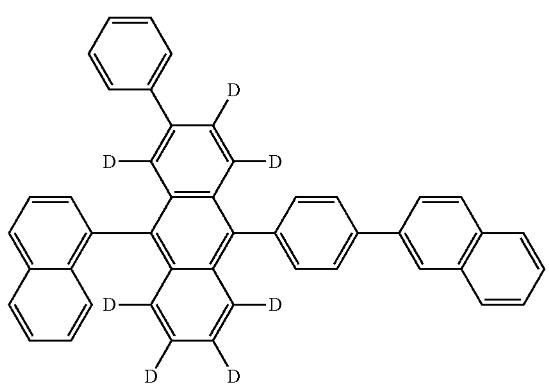

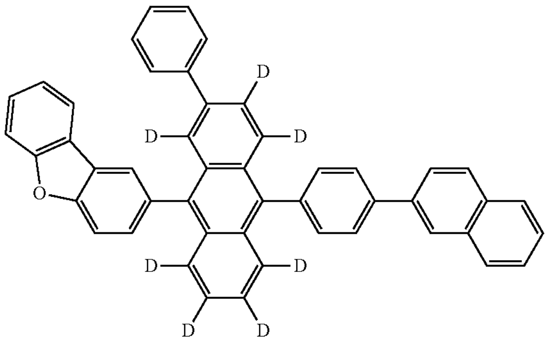
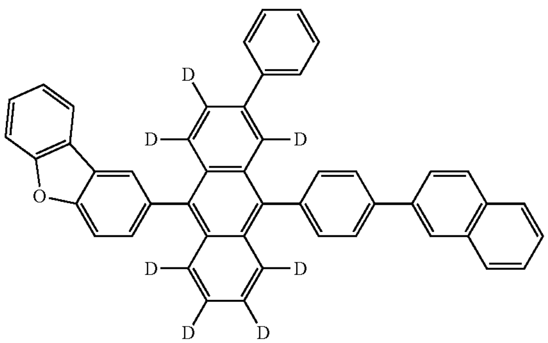
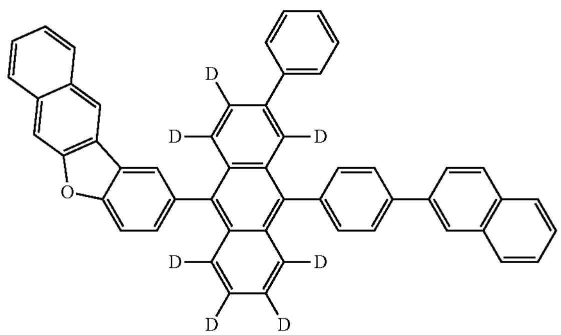
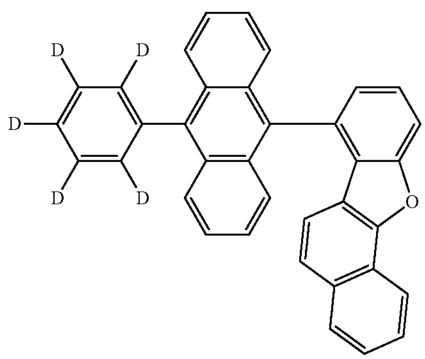
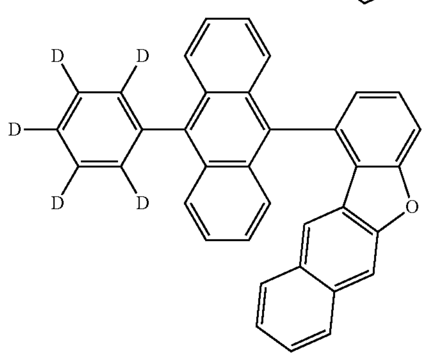
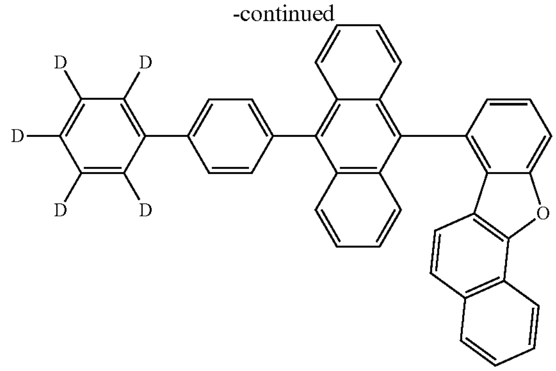
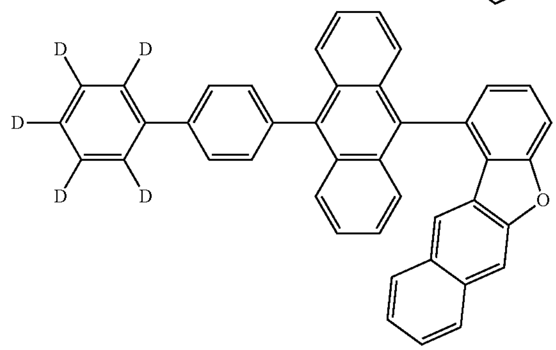
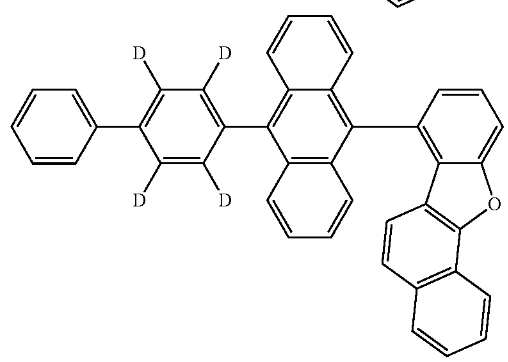
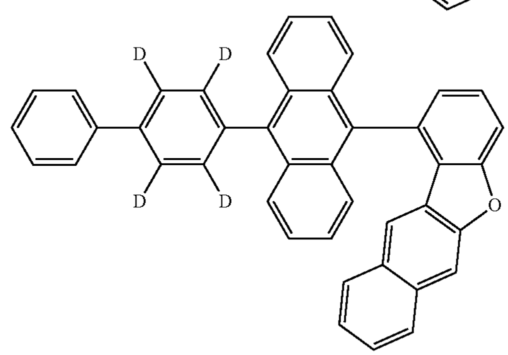
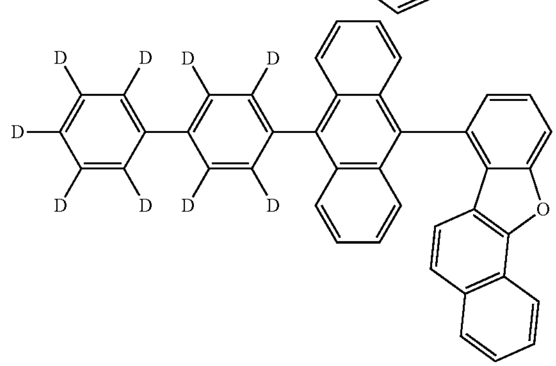

-continued
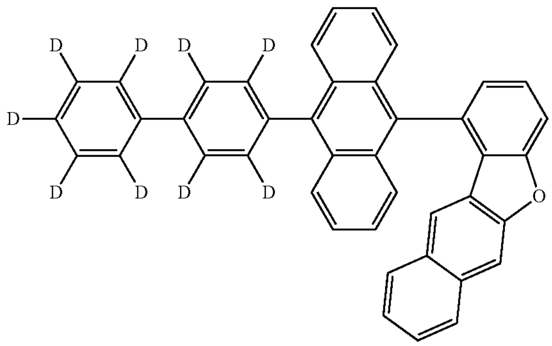
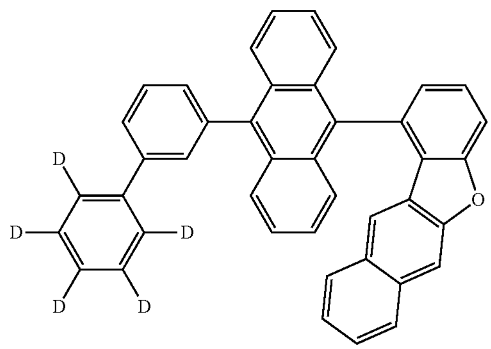
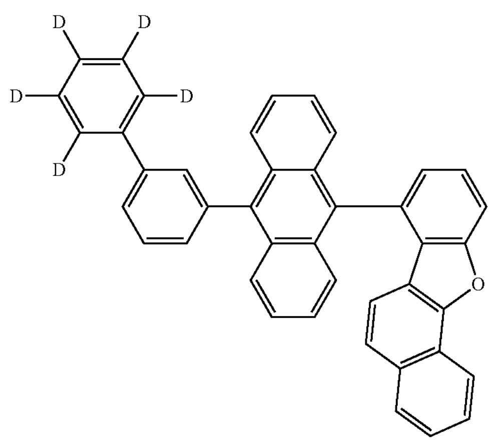
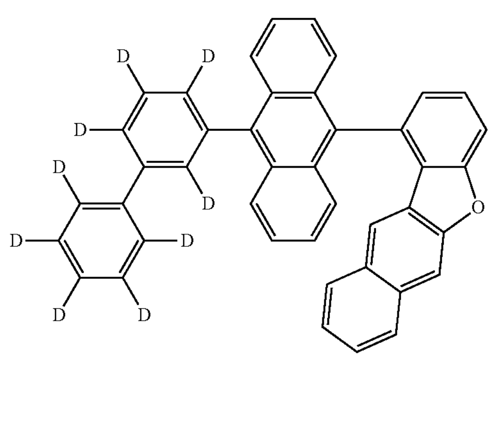
-continued
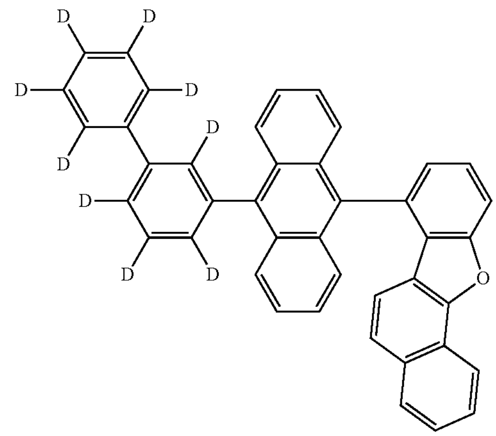
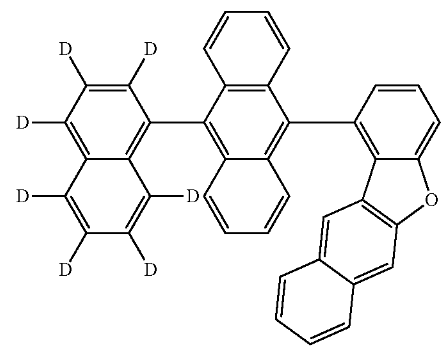
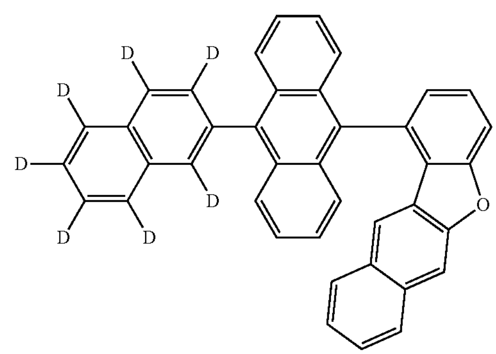
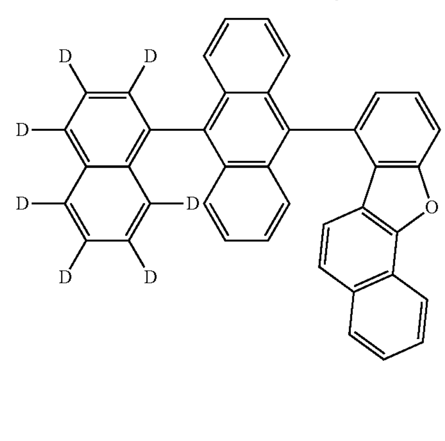

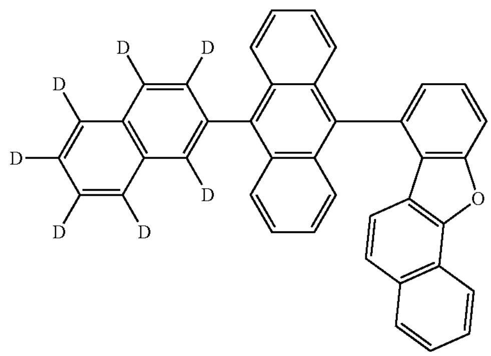
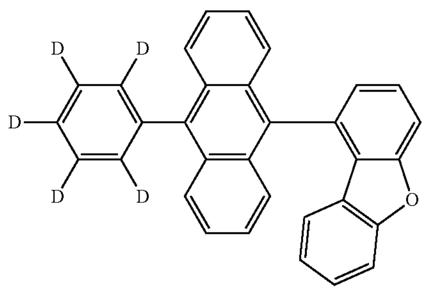
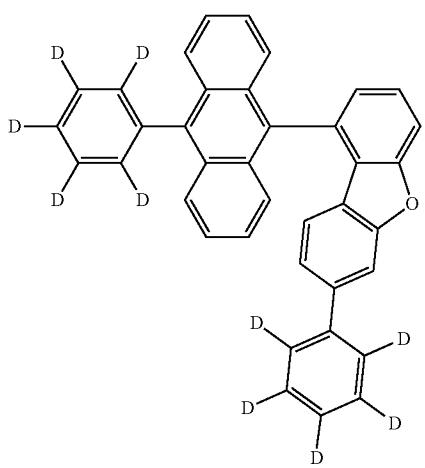
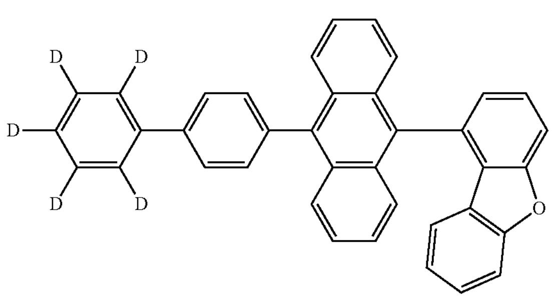
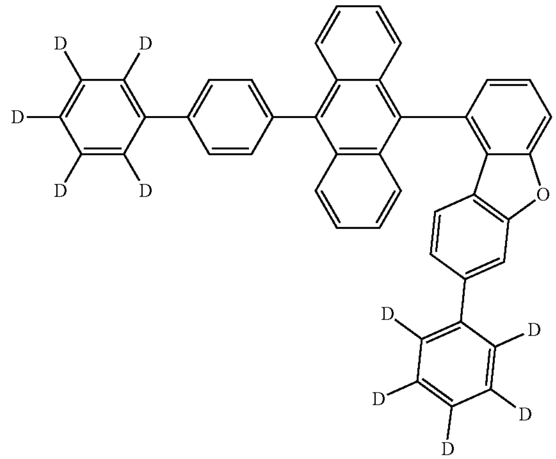
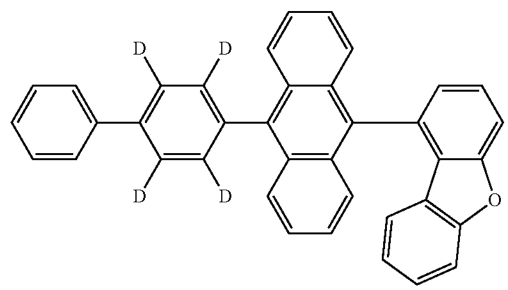
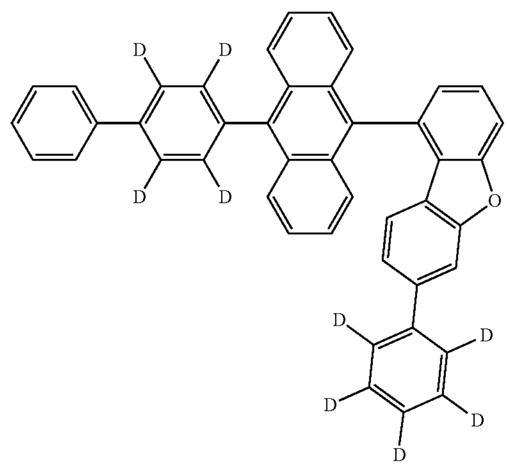
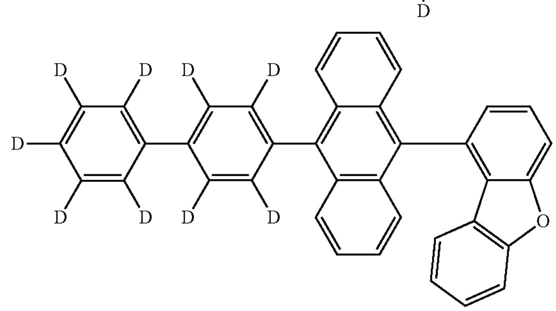

-continued
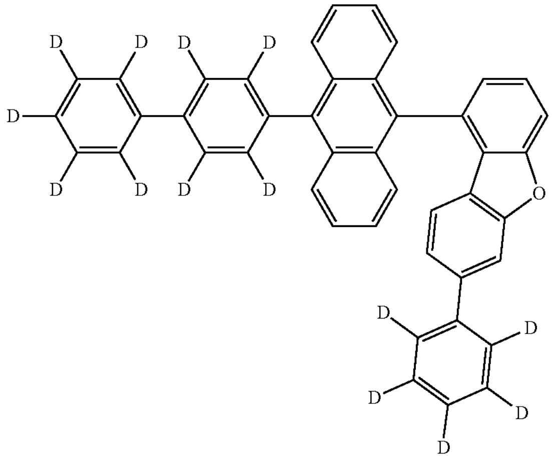
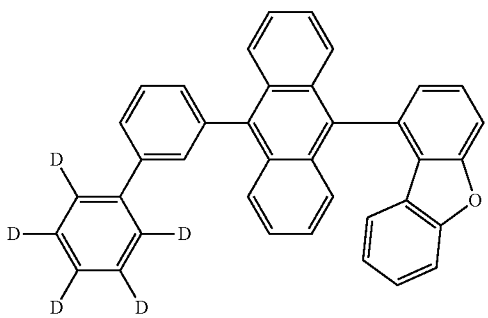
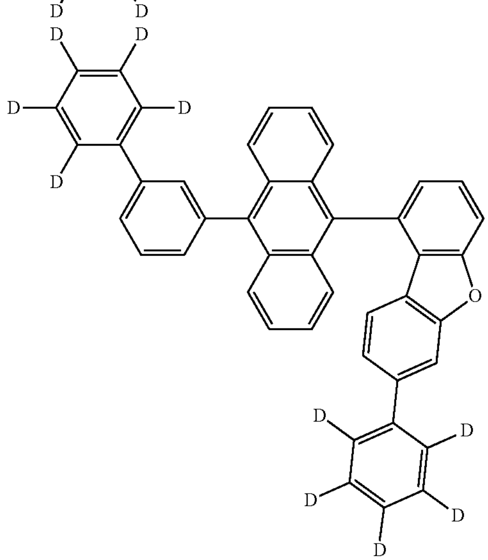
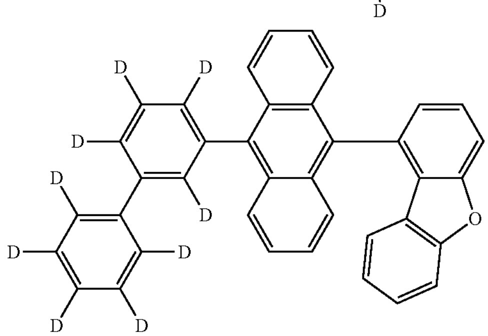
-continued
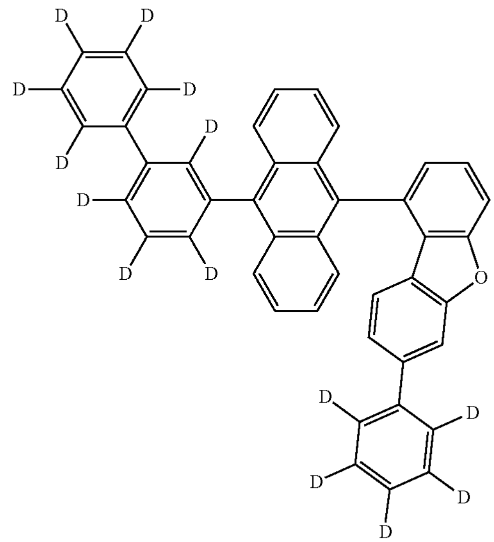
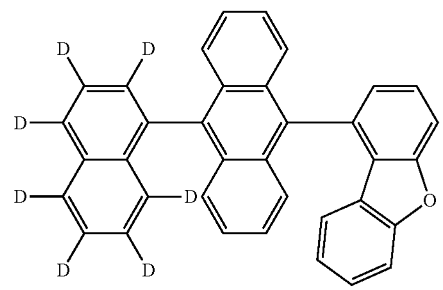
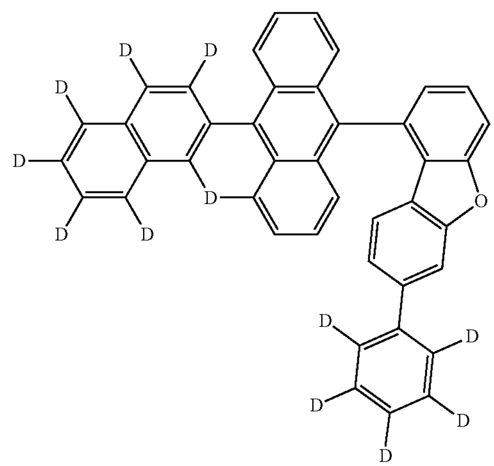
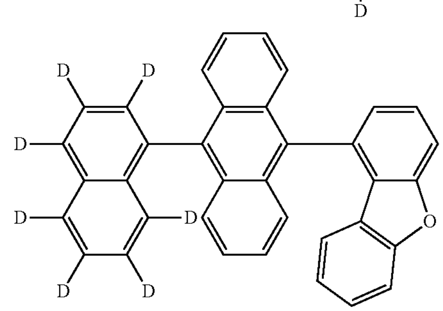

-continued
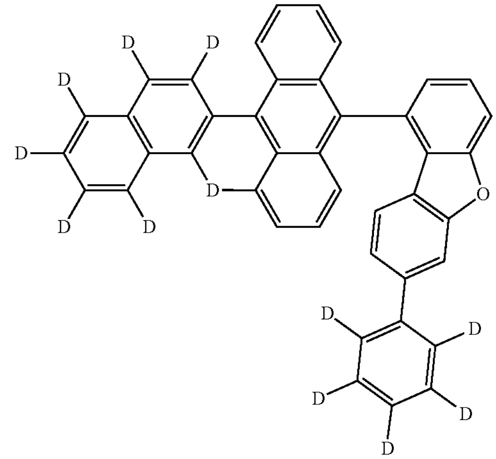
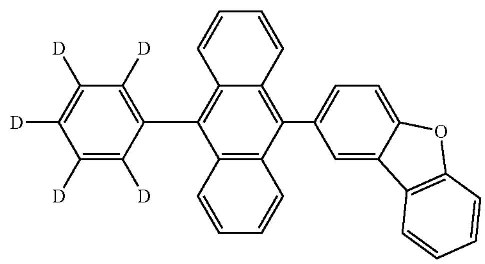
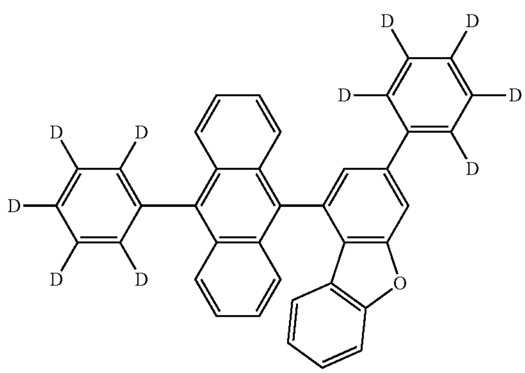
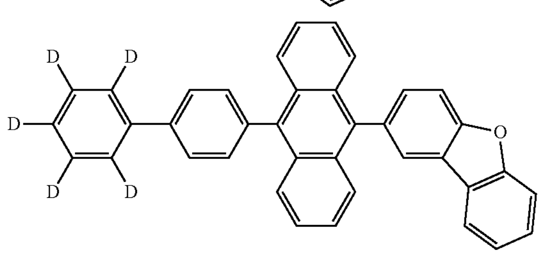
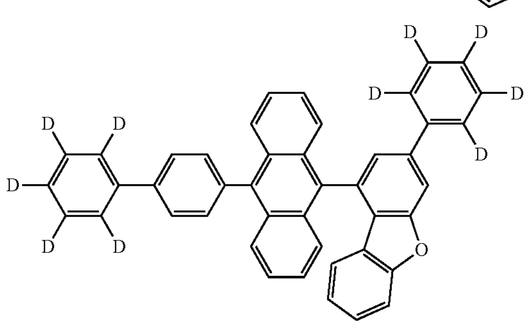
-continued
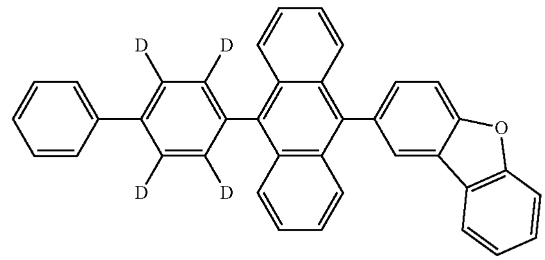
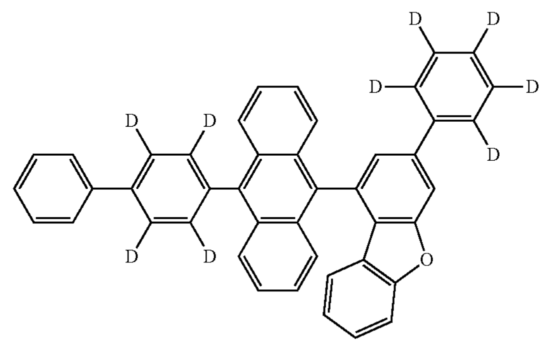
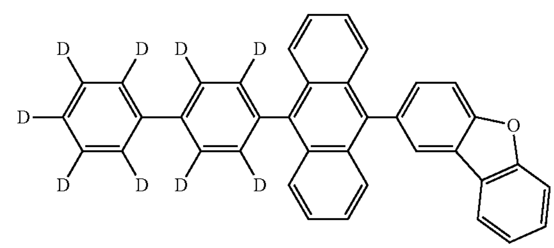
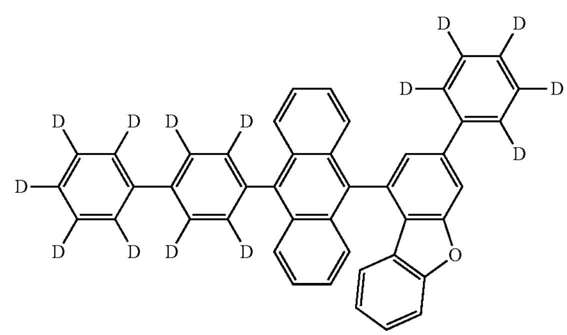
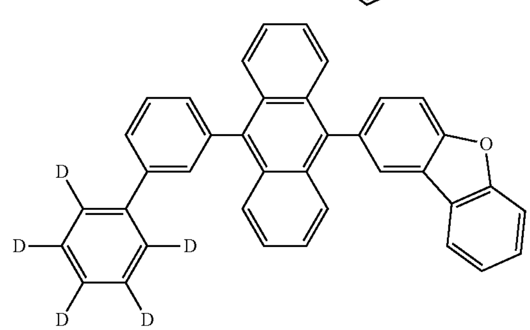

-continued
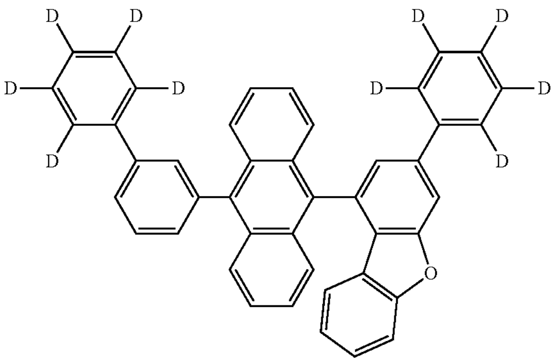
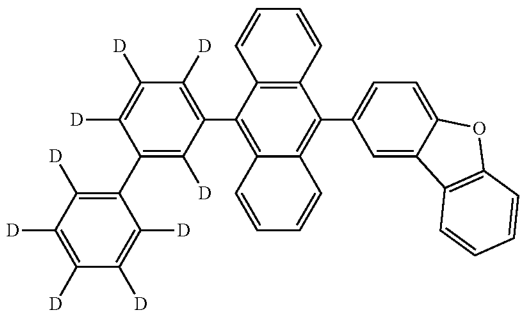
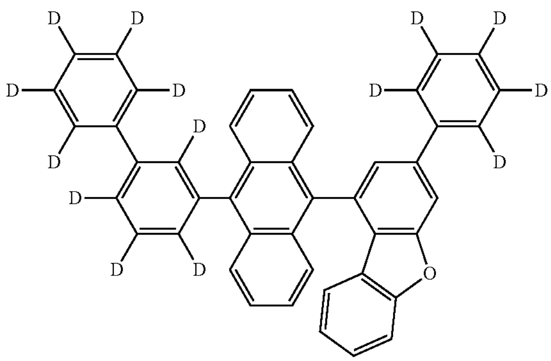
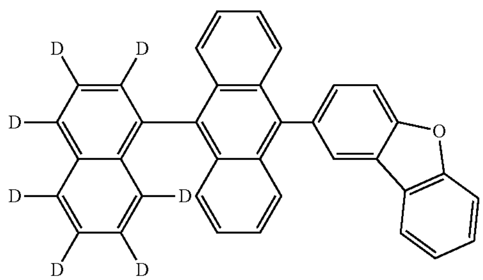
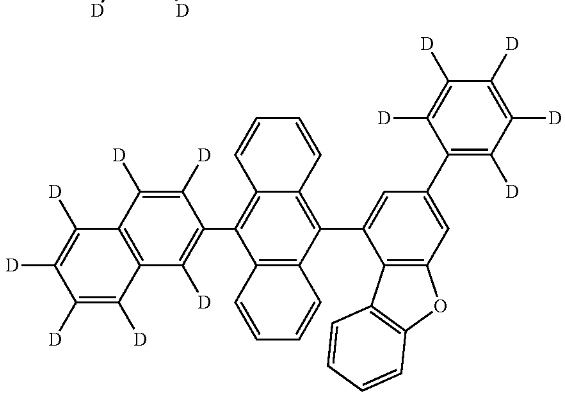
-continued
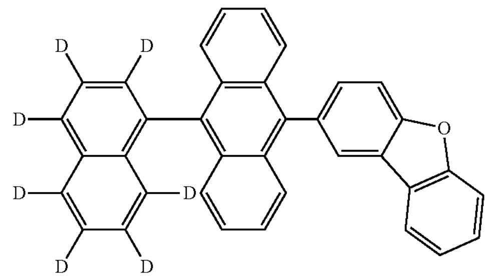
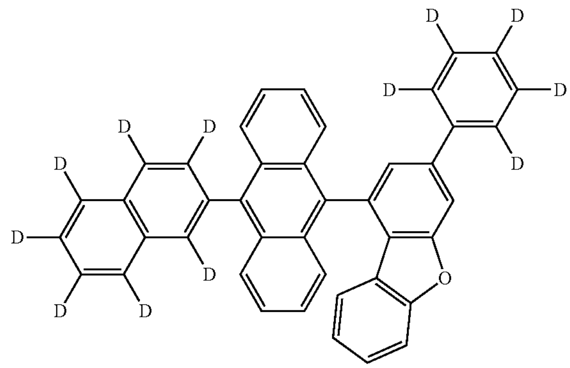
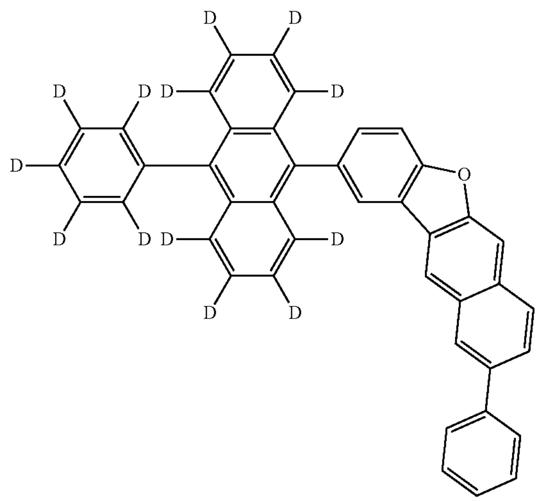
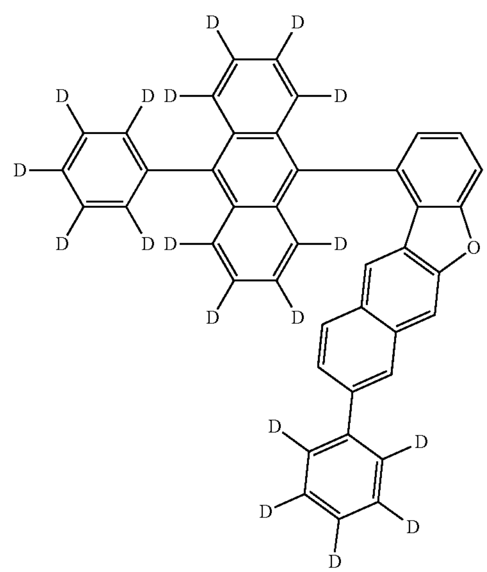

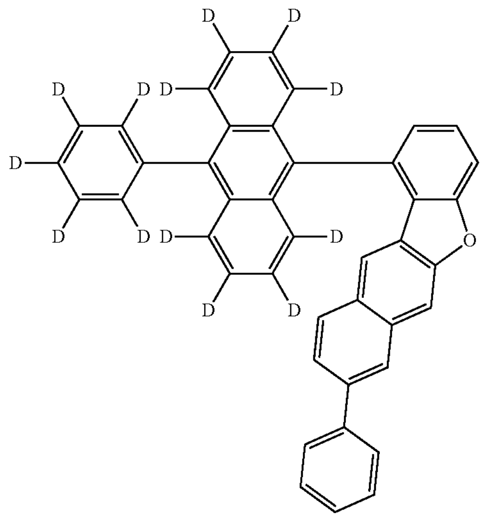
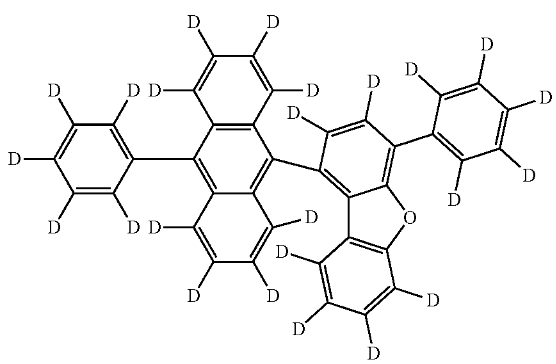
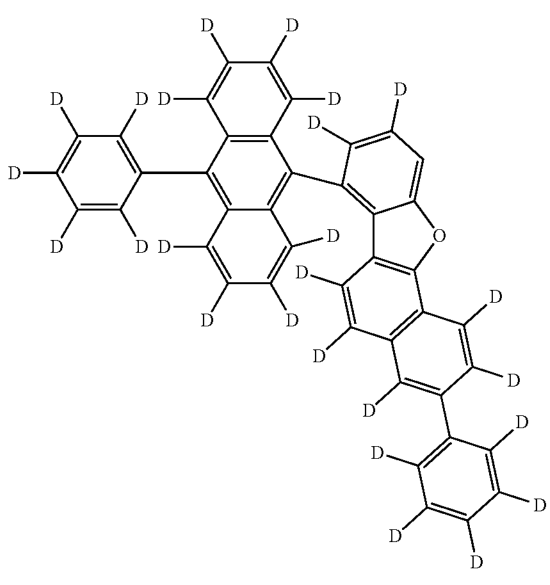
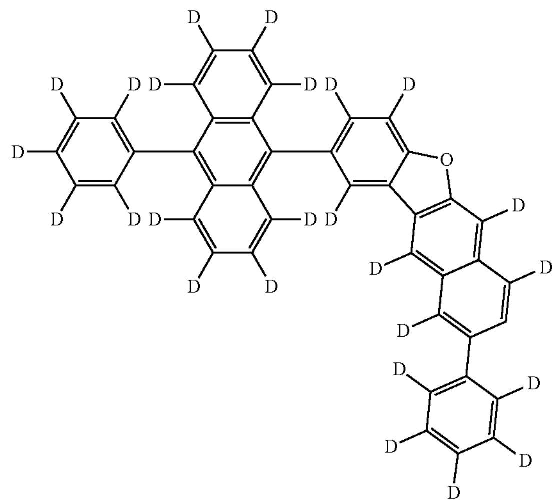
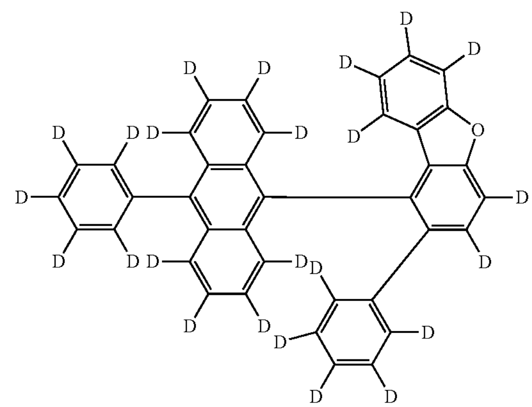
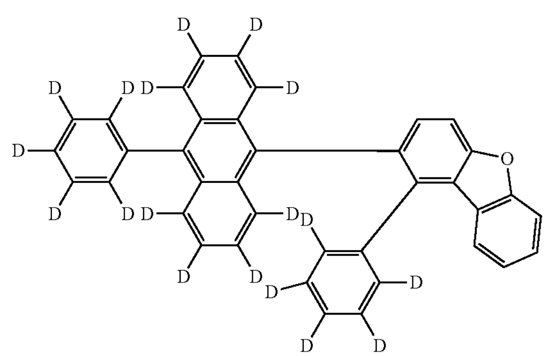
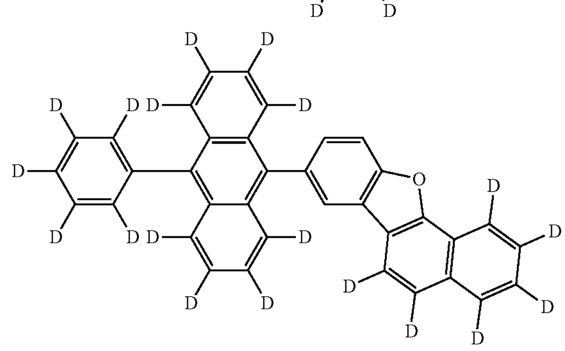

-continued
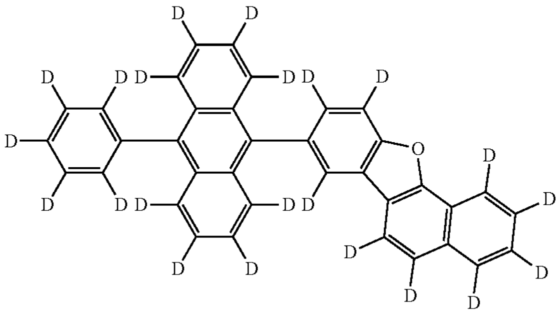
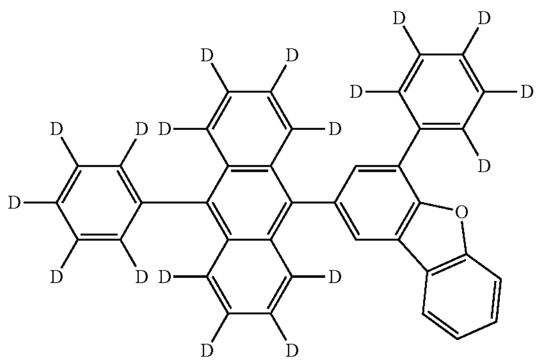
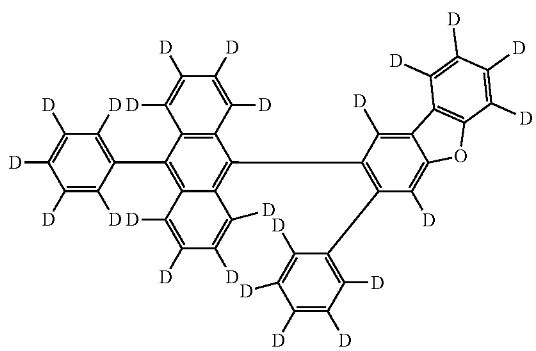
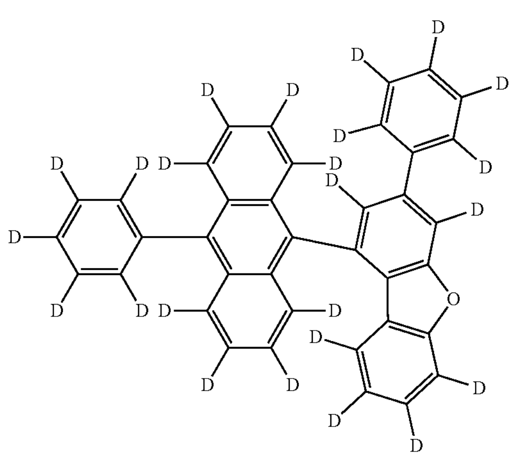
-continued
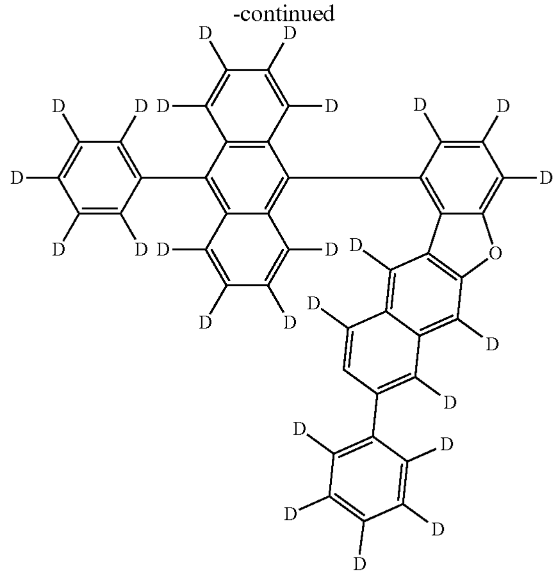
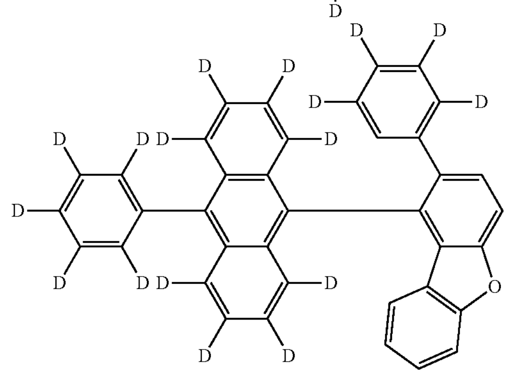
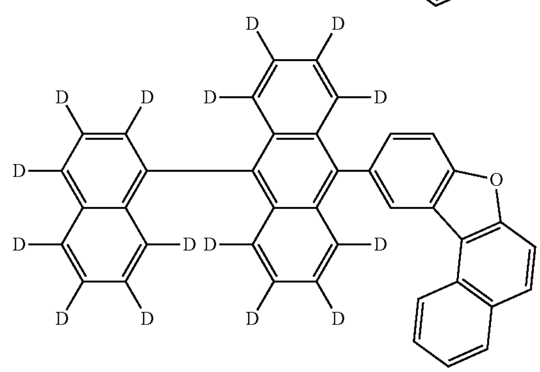
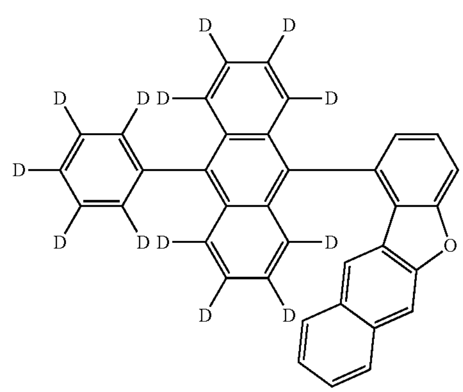

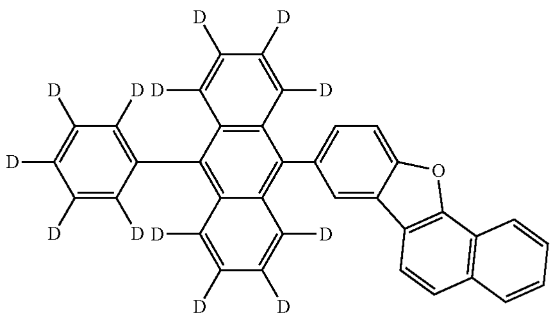
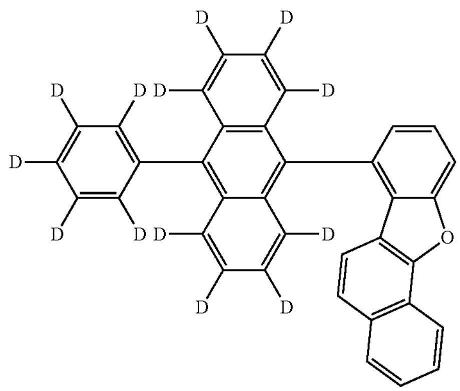
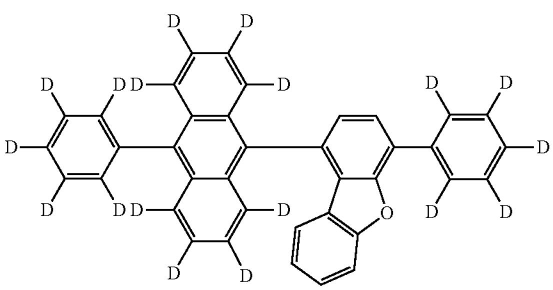
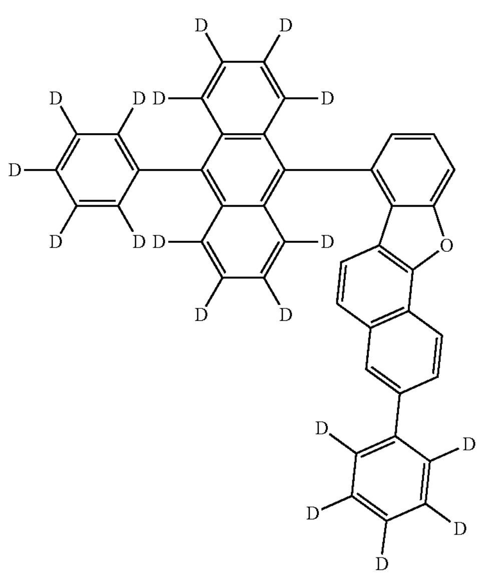
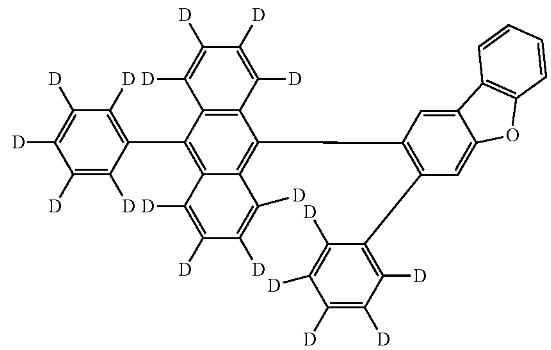
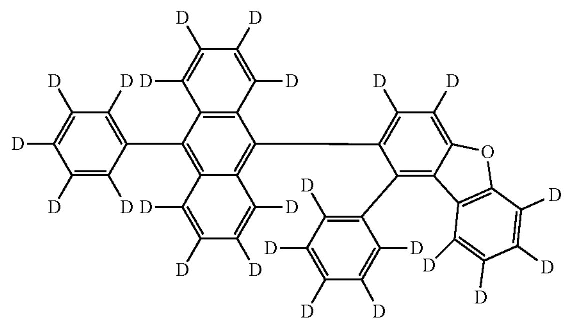
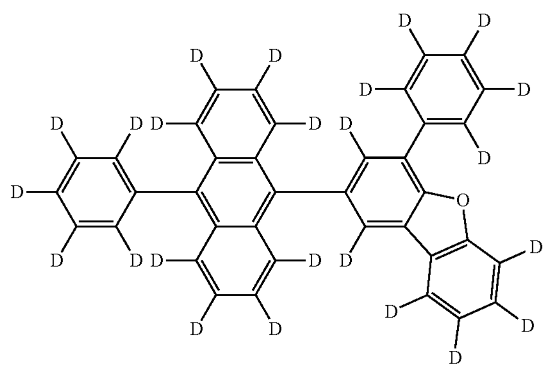
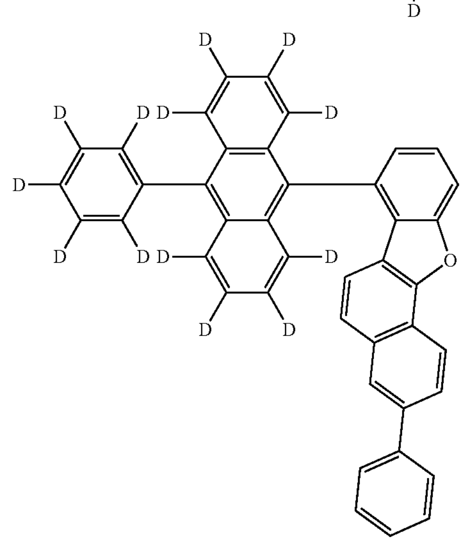

-continued

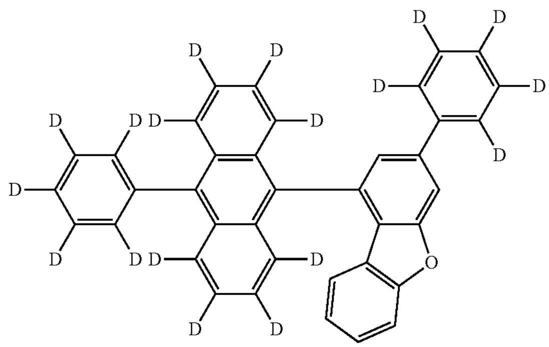

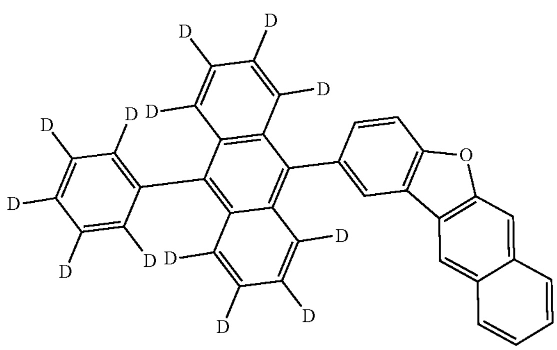

Emitting Compound

In the organic EL device according to the exemplary embodiment, the emitting compound such as the first emitting compound, the second emitting compound and the third emitting compound is not particularly limited. For instance, the emitting compound is also preferably each independently at least one compound selected from the group consisting of a compound represented by a formula (4) below, a compound represented by a formula (5) below, and a compound represented by a formula (6) below.

Compound Represented by Formula (4)

The compound represented by the formula (4) will be described.

(4)

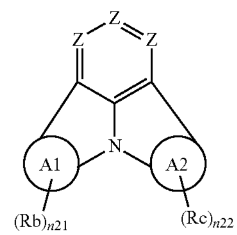

In the formula (4):

Z is each independently CRa or a nitrogen atom;

A1 ring and A2 ring are each independently a substituted or unsubstituted aromatic hydrocarbon ring having 6 to 50 ring carbon atoms, or a substituted or unsubstituted heterocycle having 5 to 50 ring atoms;

when a plurality of Ra are present, at least one combination of adjacent two or more of the plurality of Ra are mutually bonded to form a substituted or unsubstituted monocyclic ring, mutually bonded to form a substituted or unsubstituted fused ring, or not mutually bonded;

n21 and n22 are each independently 0, 1, 2, 3, or 4;

when a plurality of Rb are present, at least one combination of adjacent two or more of the plurality of Rb are mutually bonded to form a substituted or unsubstituted monocyclic ring, mutually bonded to form a substituted or unsubstituted fused ring, or not mutually bonded;

when a plurality of Rc are present, at least one combination of adjacent two or more of the plurality of Rc are mutually bonded to form a substituted or unsubstituted monocyclic ring, mutually bonded to form a substituted or unsubstituted fused ring, or not mutually bonded; and Ra, Rb and Rc not forming the substituted or unsubstituted monocyclic ring and not forming the substituted or unsubstituted fused ring are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

Specific Examples of Compound Represented by Formula (4)

Specific examples of the compound represented by the formula (4) include compounds shown below. In the specific examples below, Ph represents a phenyl group, and D represents a deutrium atom.

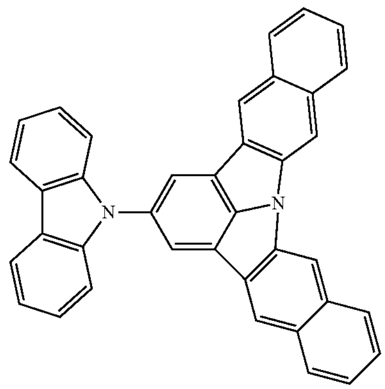
N
N
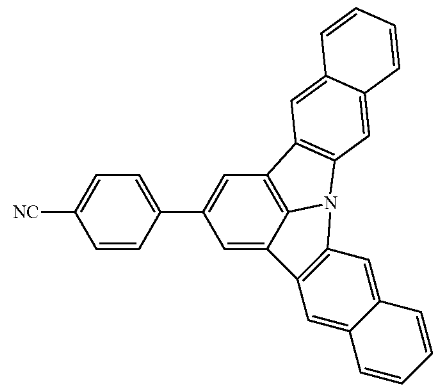
NC
N
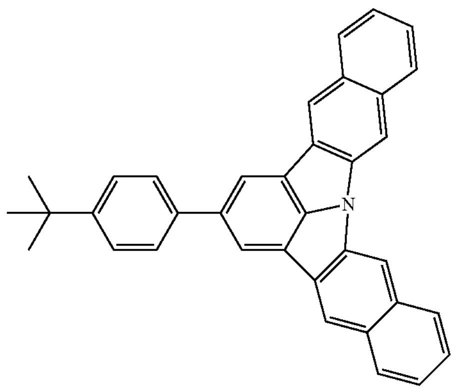
N
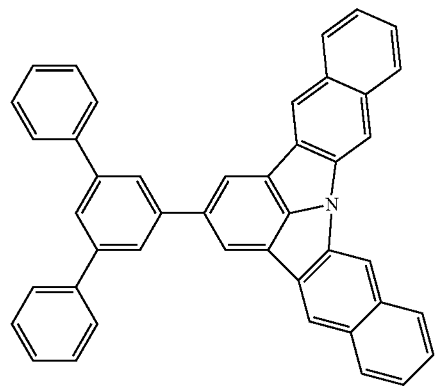
N
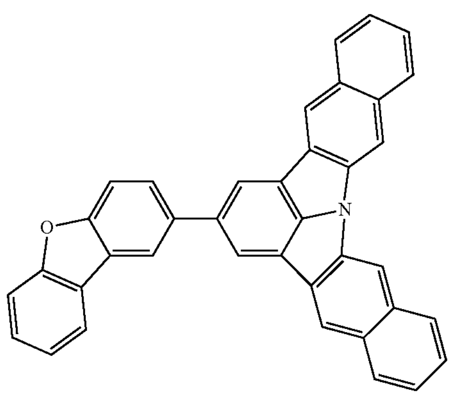
O
N
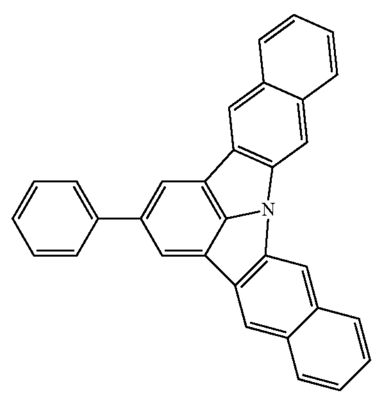
N
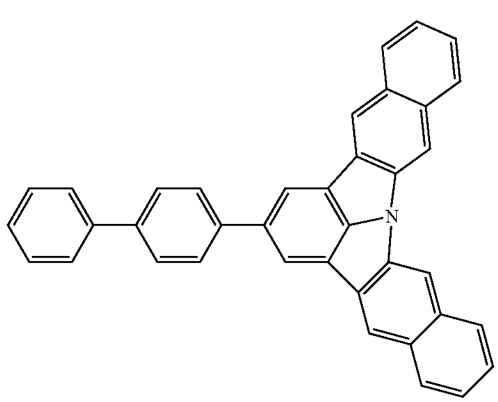
N
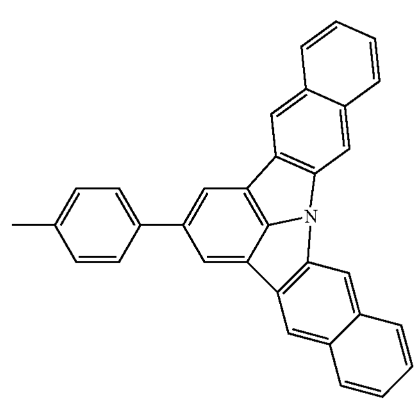
N -continued
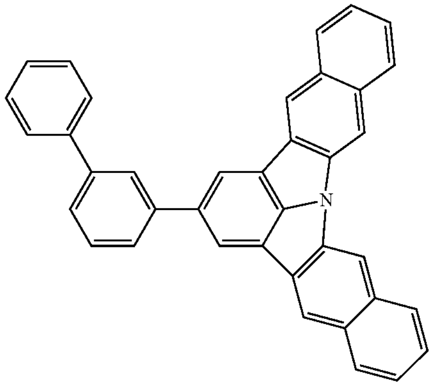
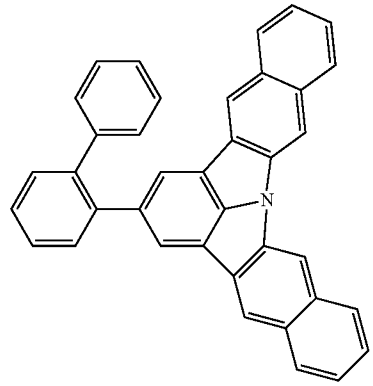
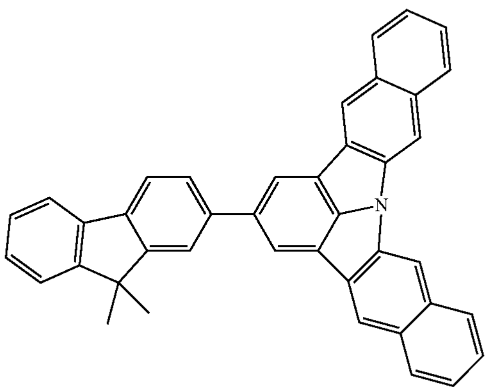
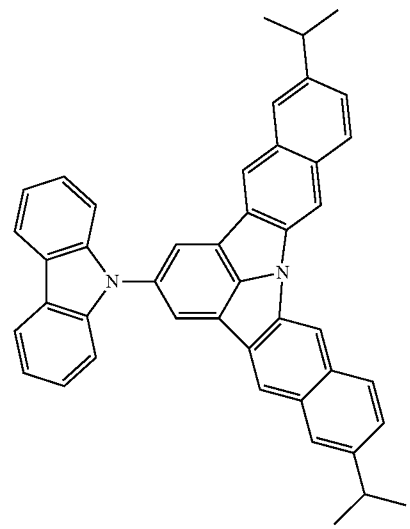
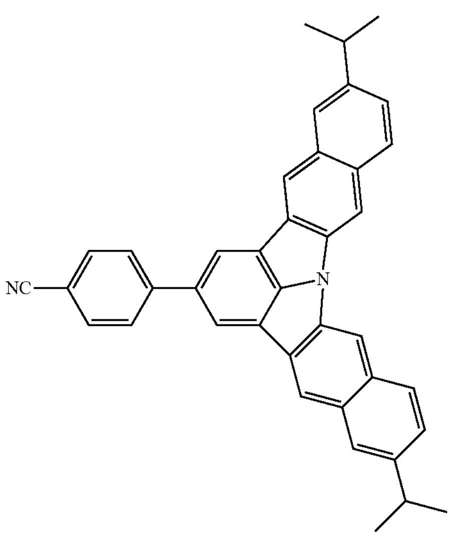
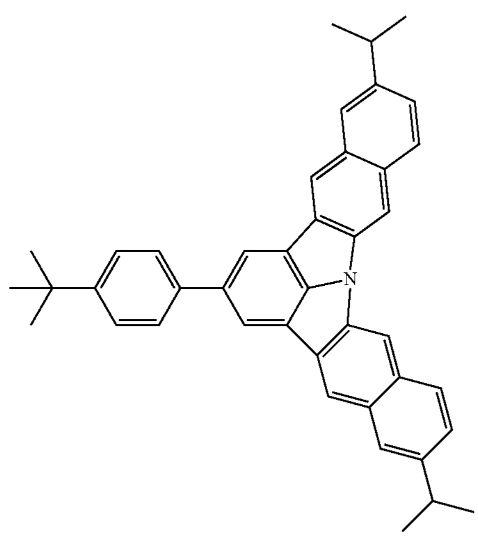

-continued
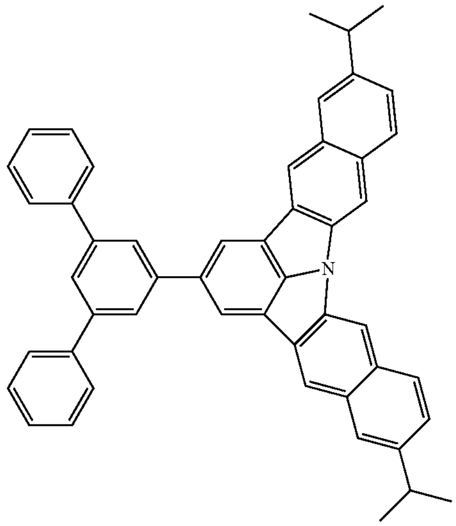
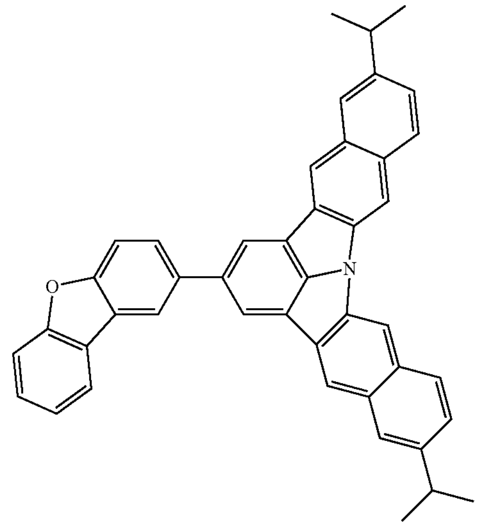
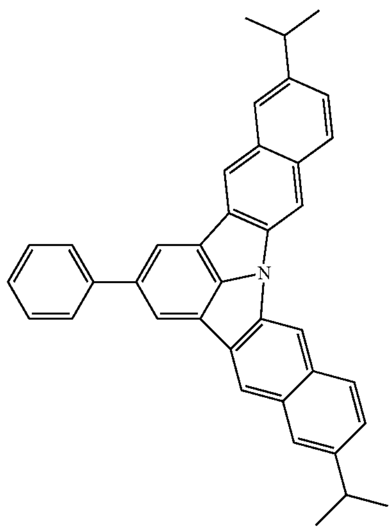
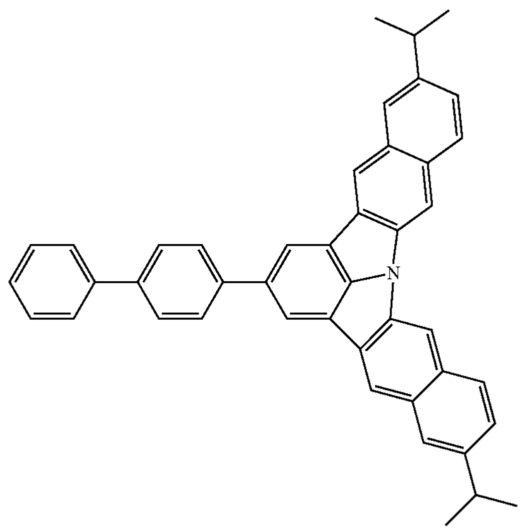
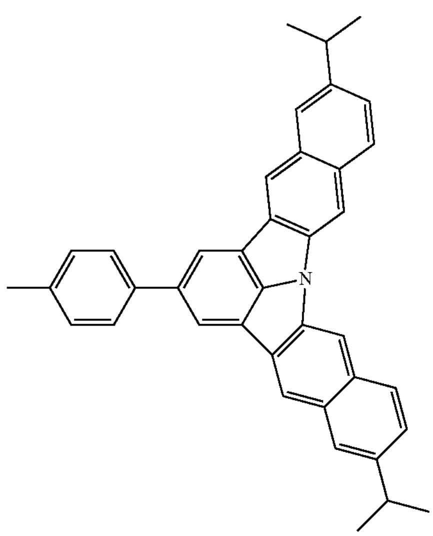
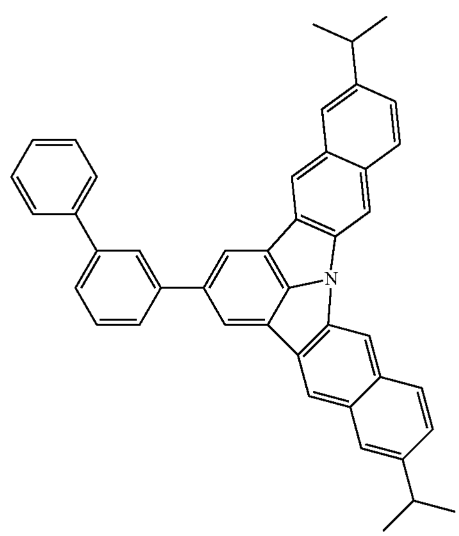

-continued
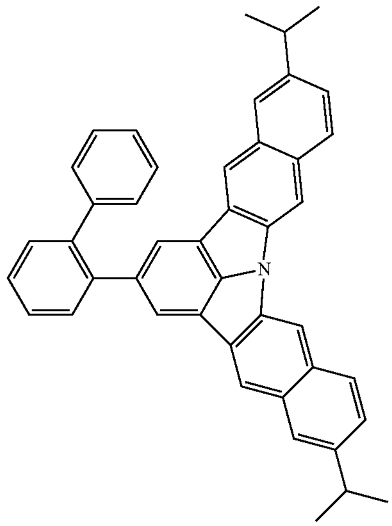
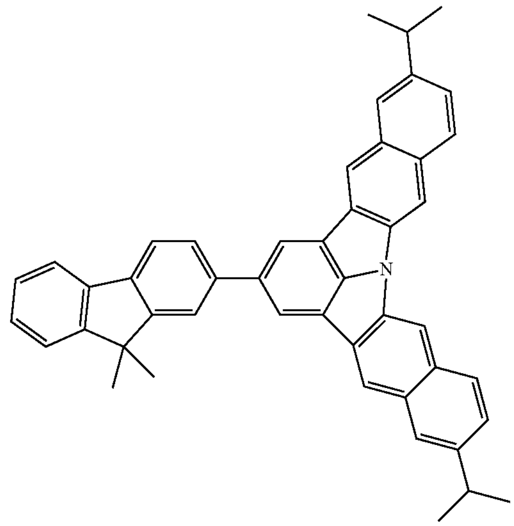
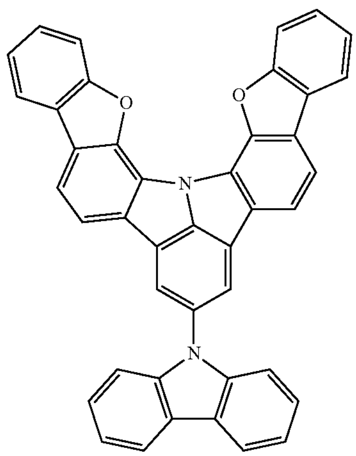
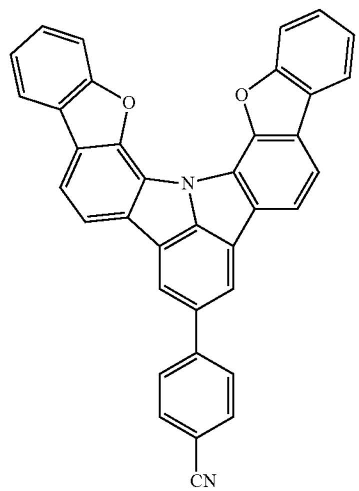
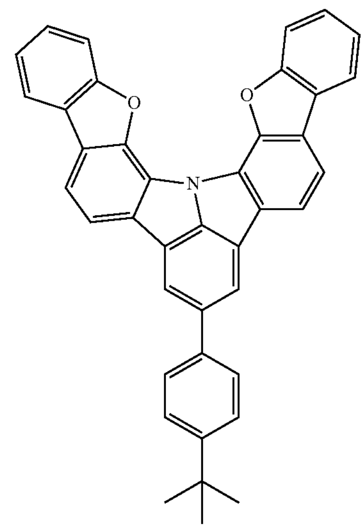
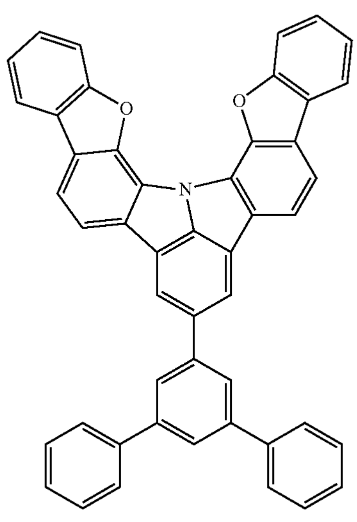
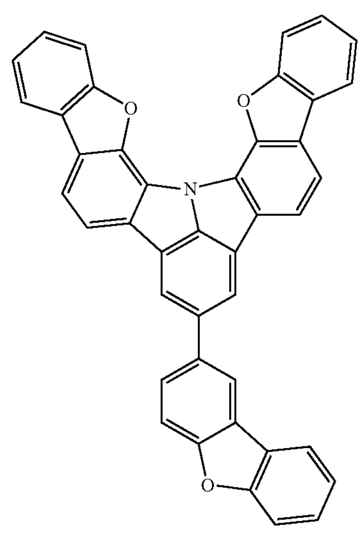
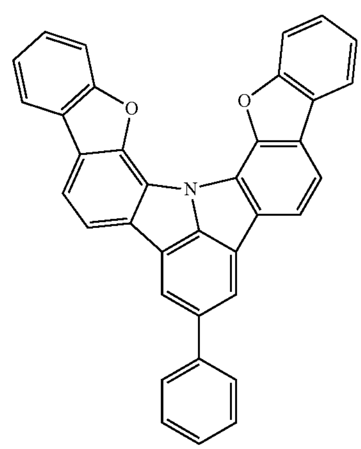

-continued
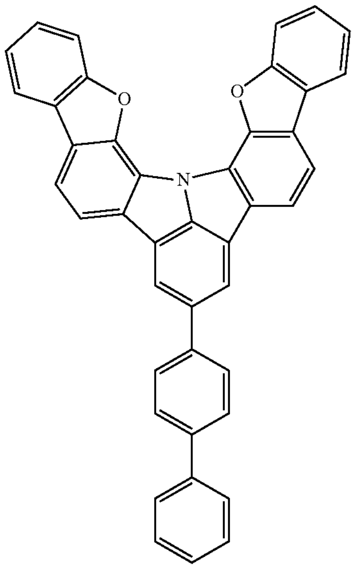
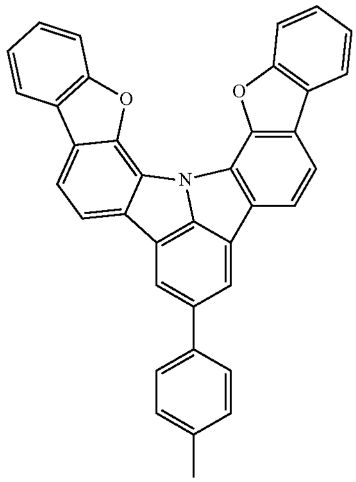
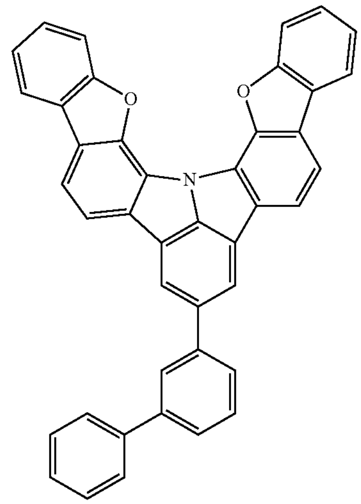
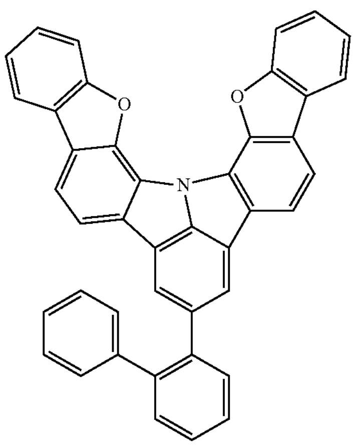
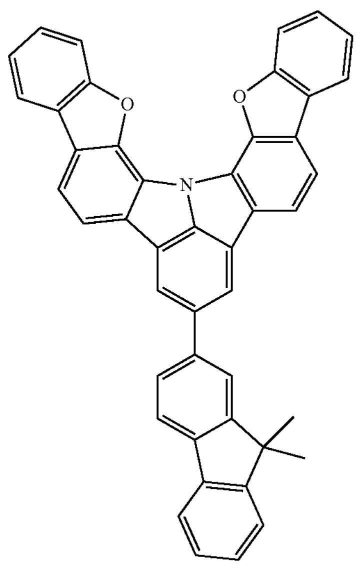
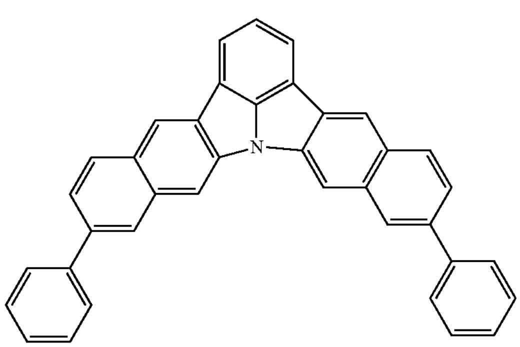
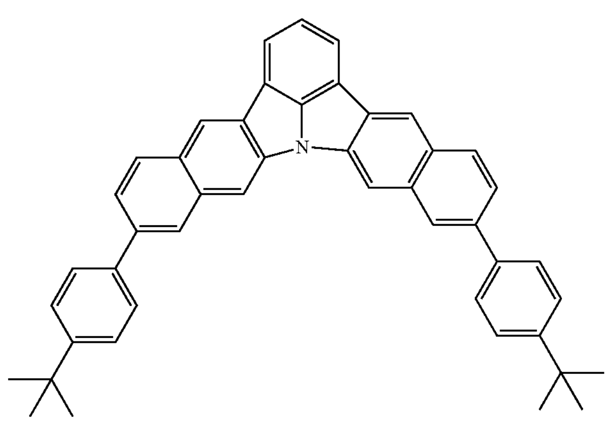

-continued
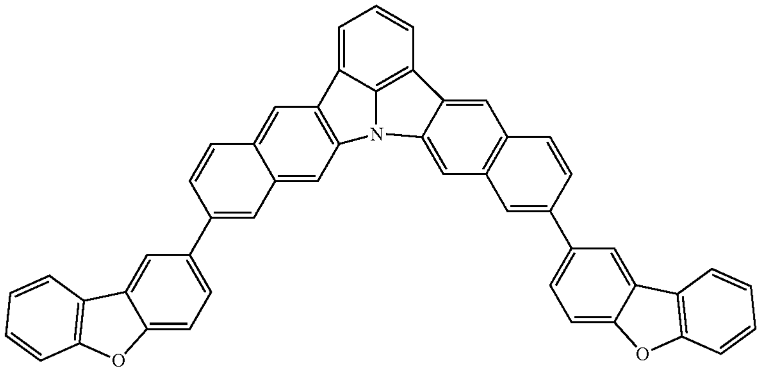
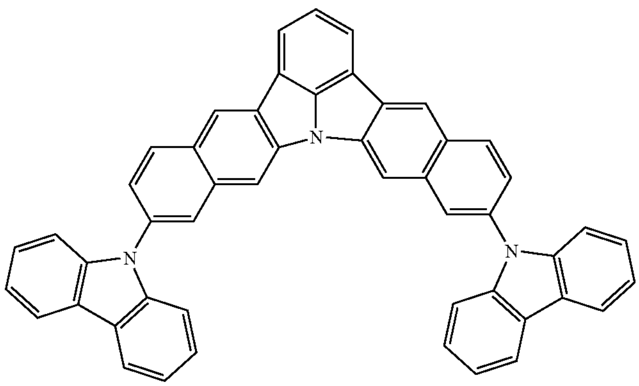
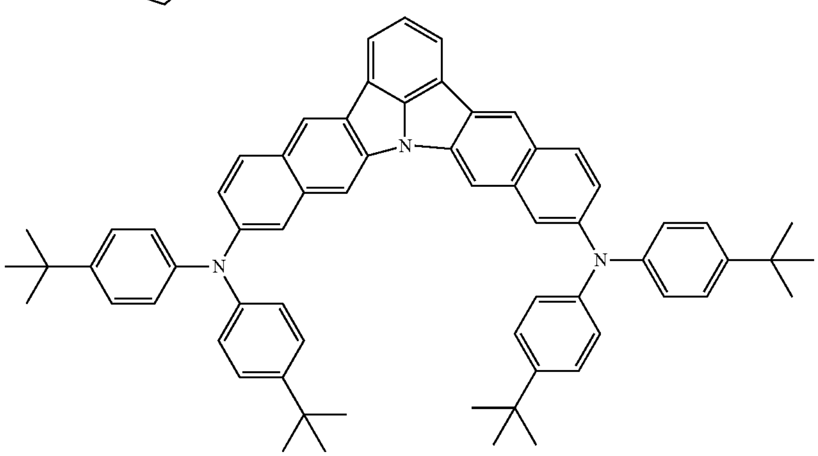
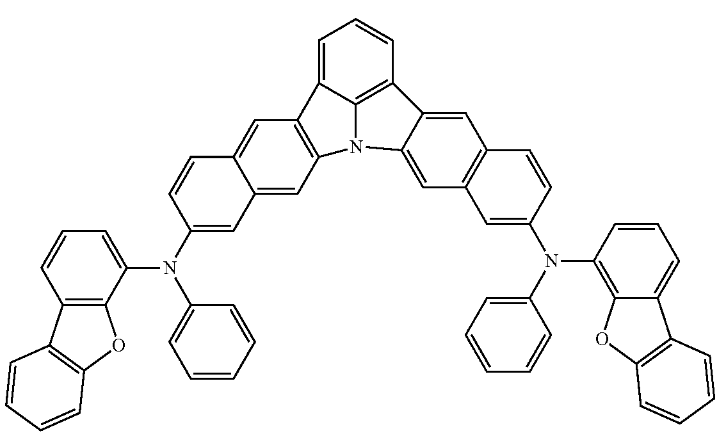

-continued
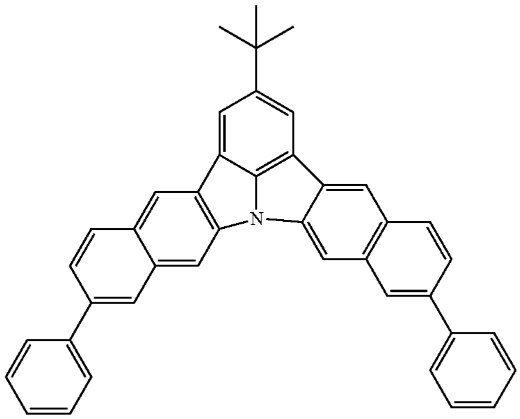
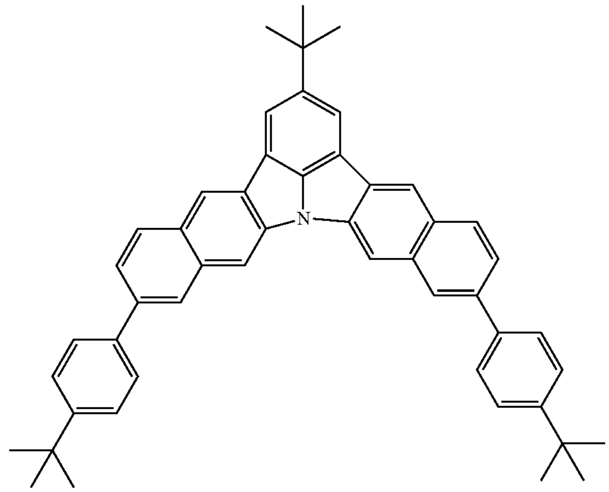
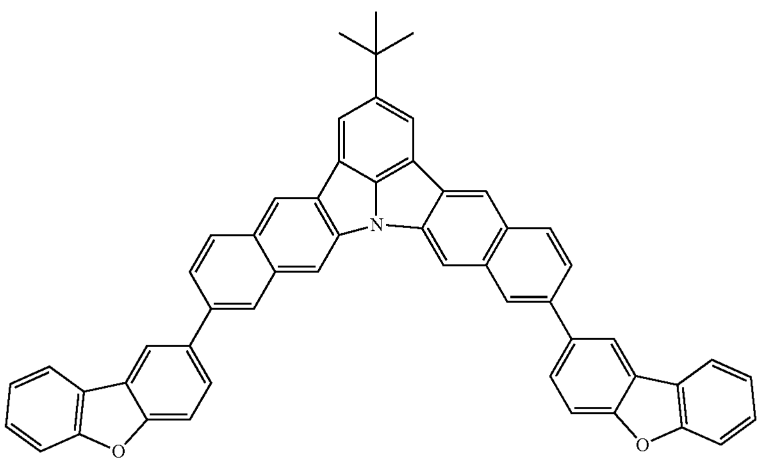
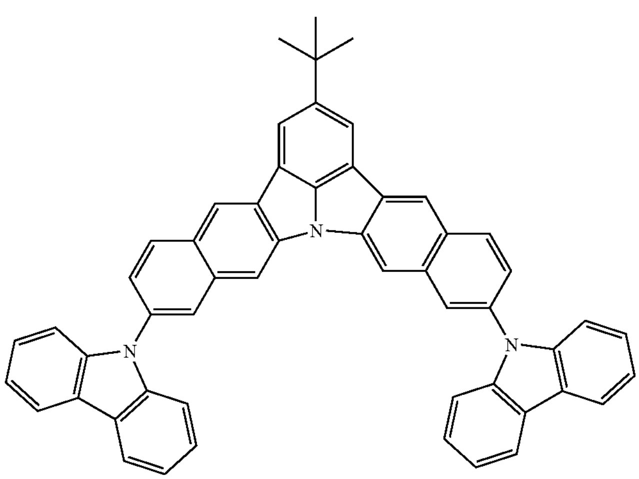

-continued
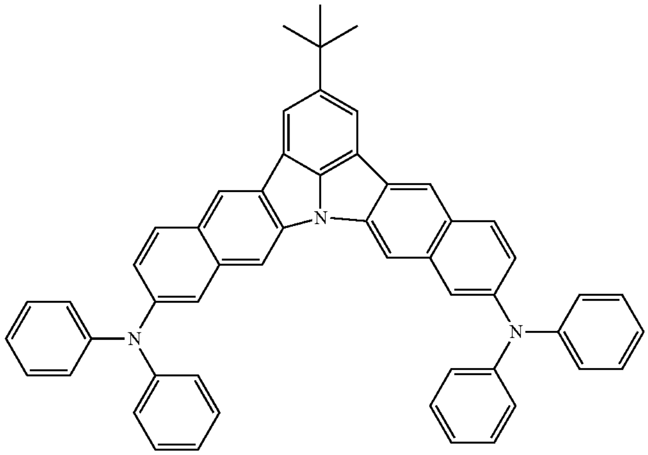
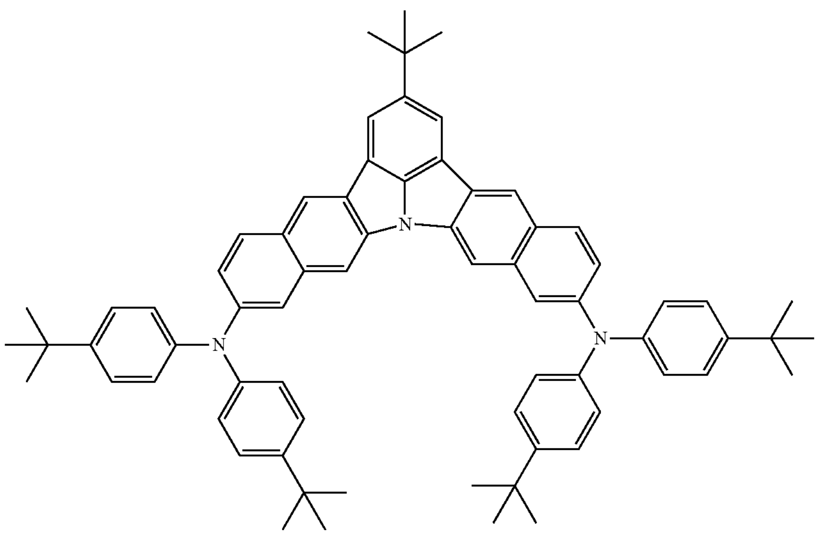
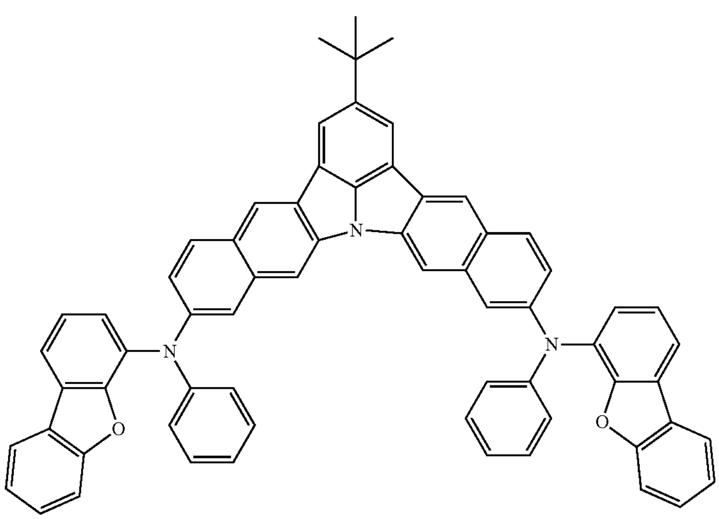

-continued
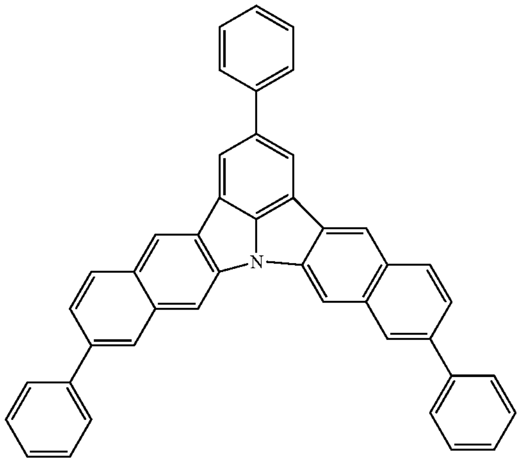
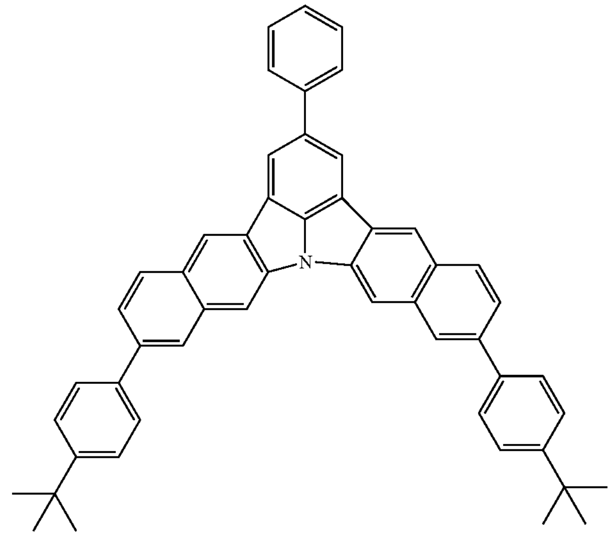
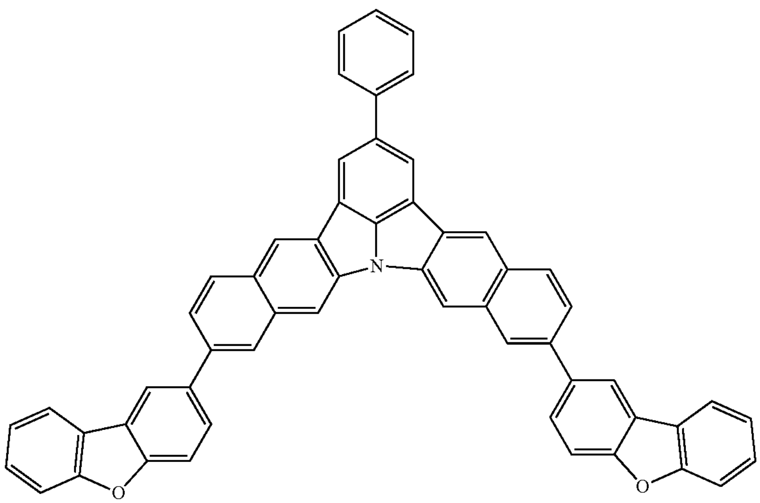
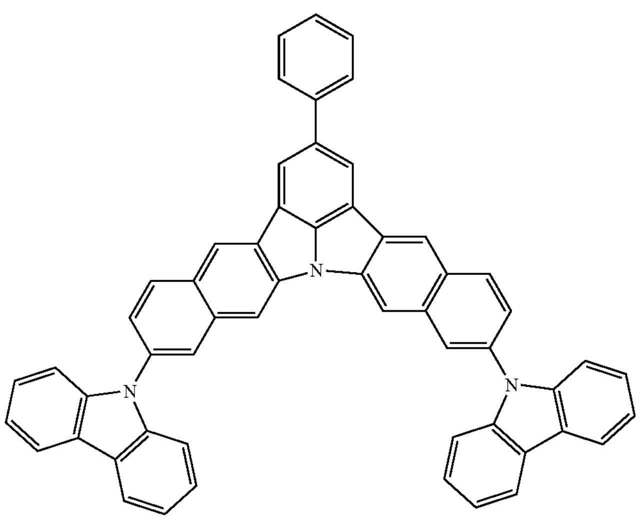

-continued
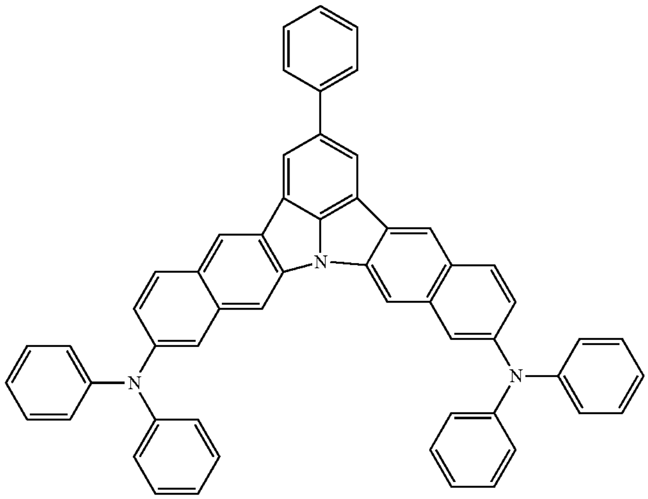
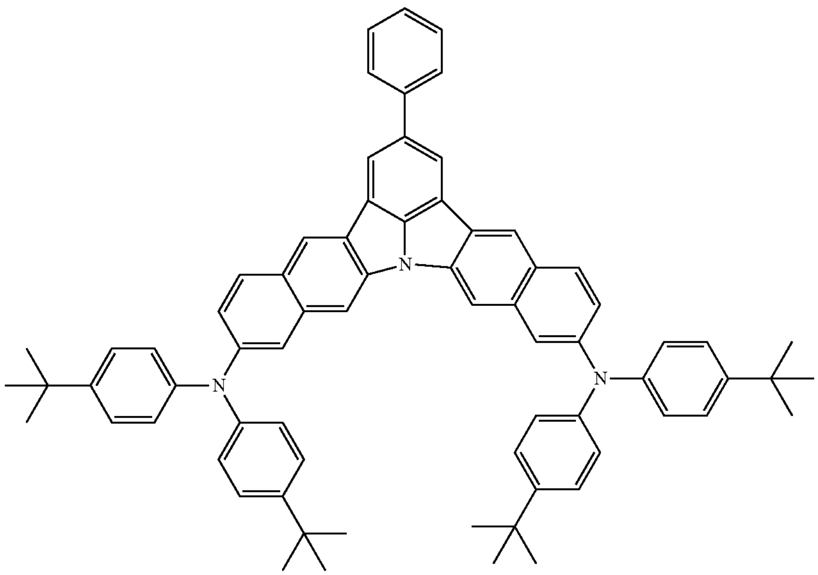
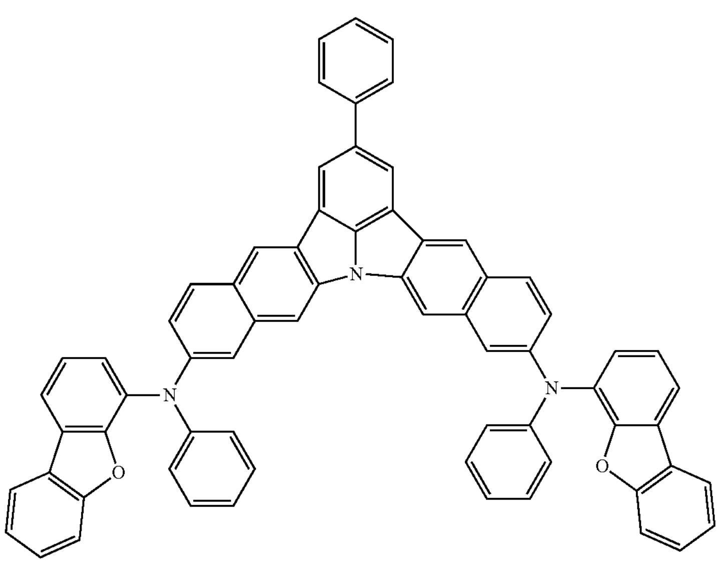

-continued
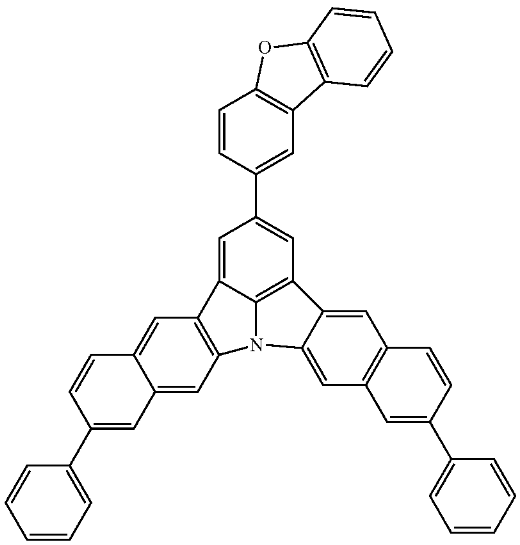
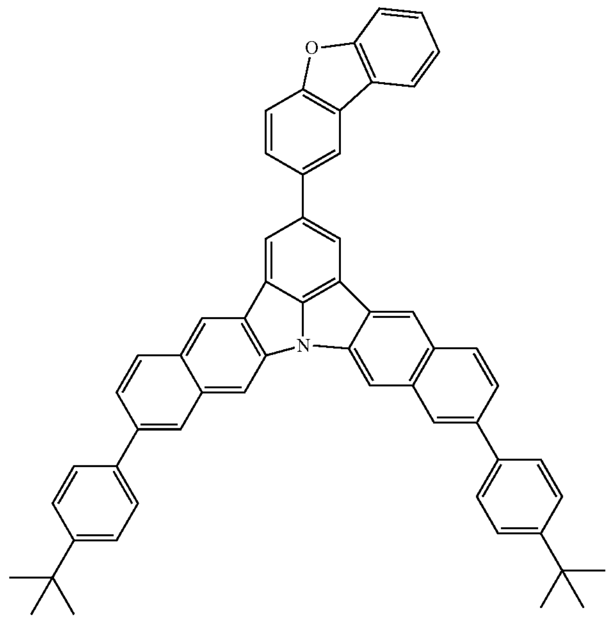
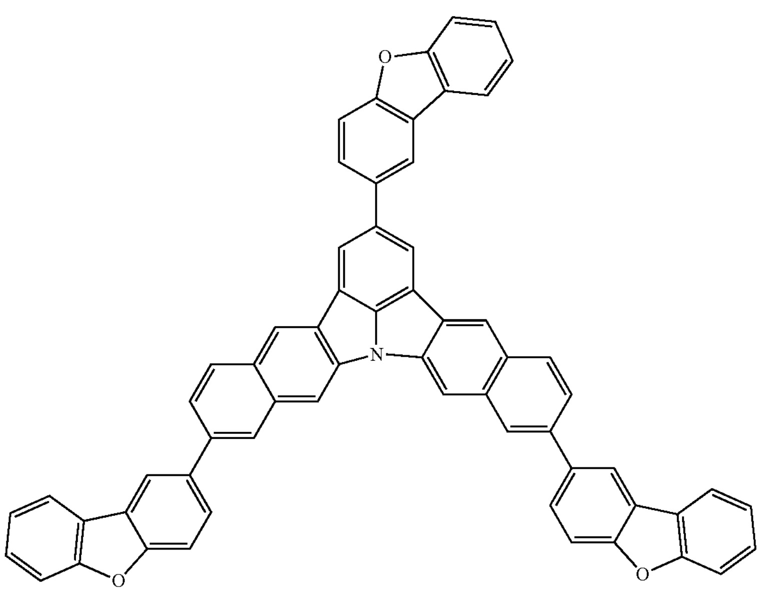

-continued
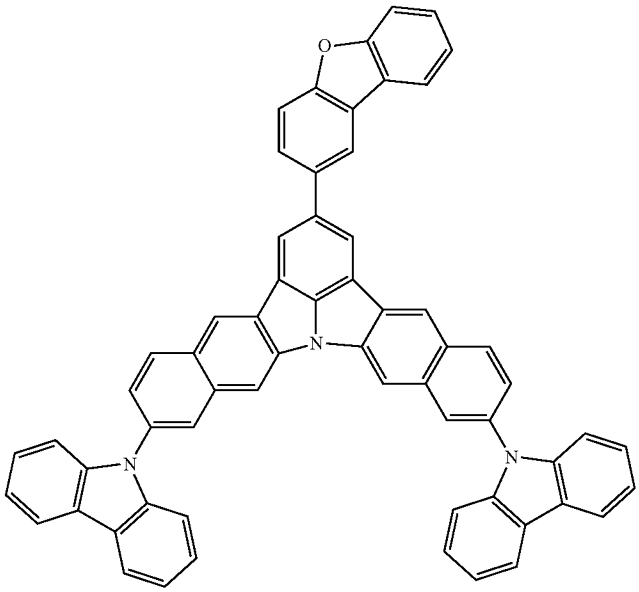
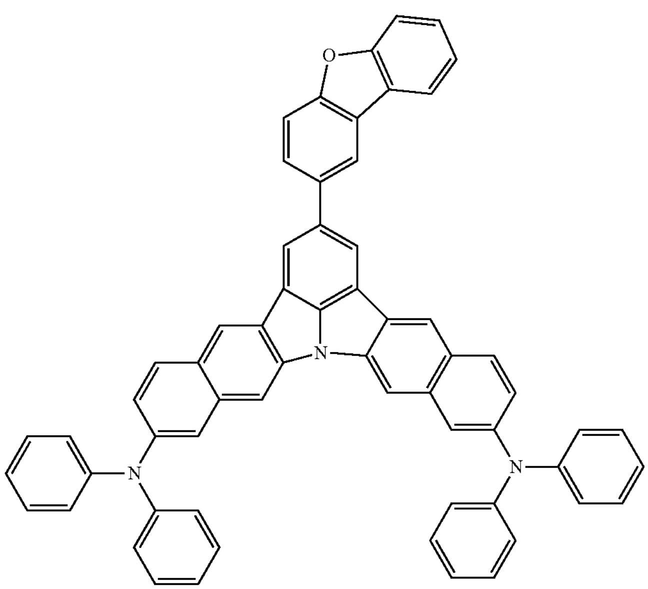

-continued
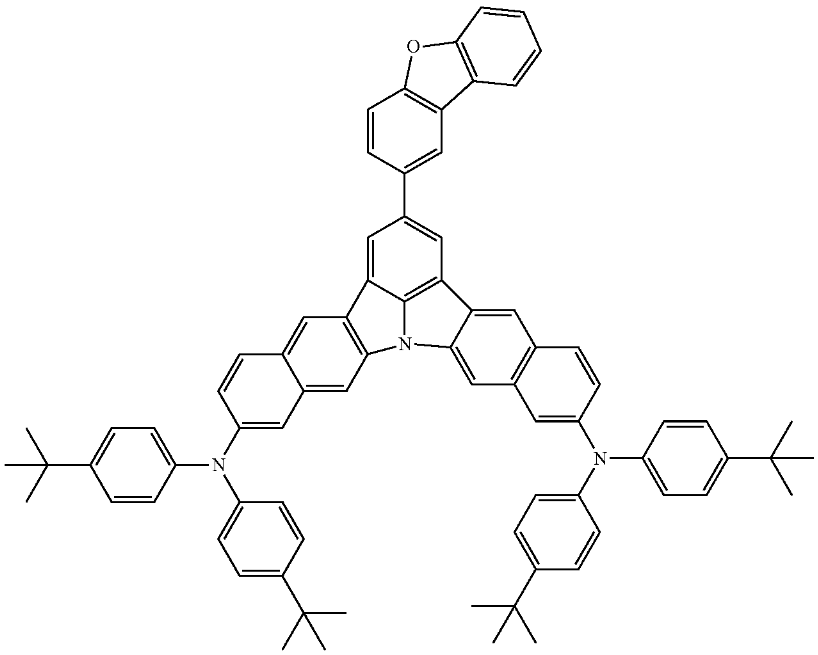
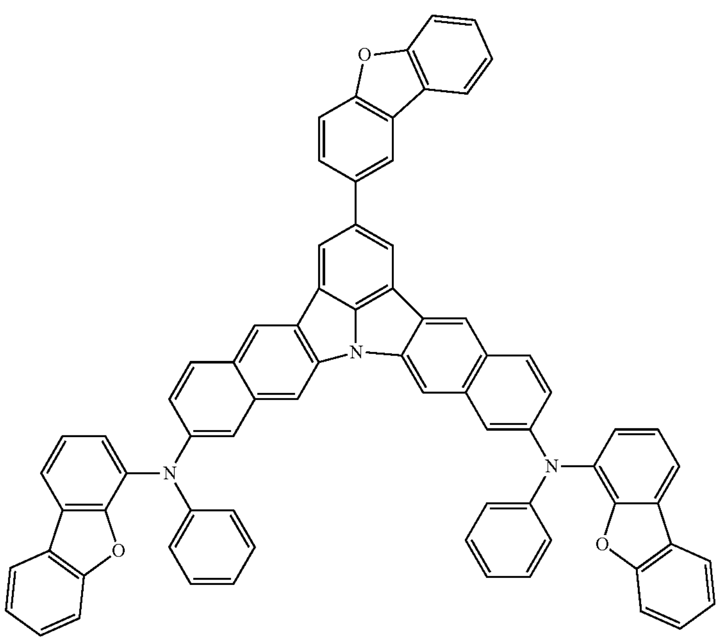

-continued
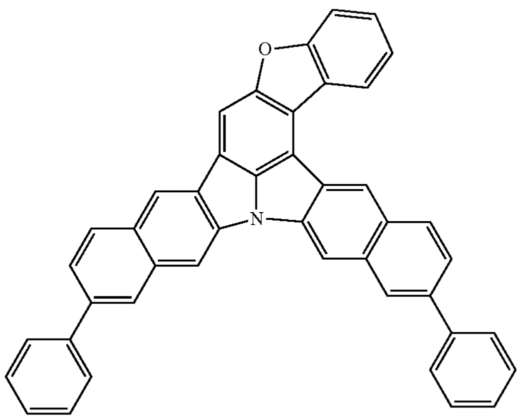
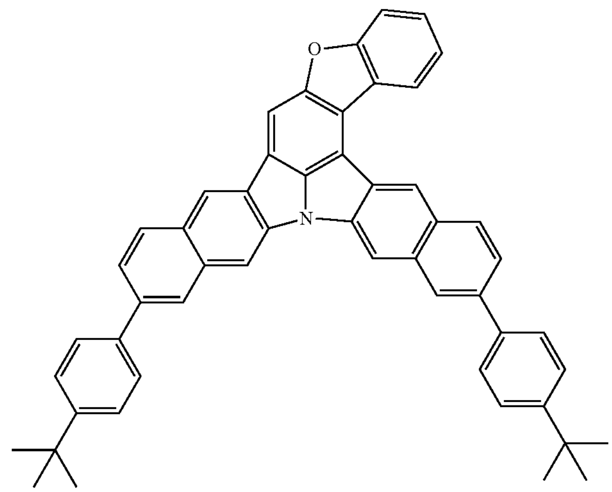
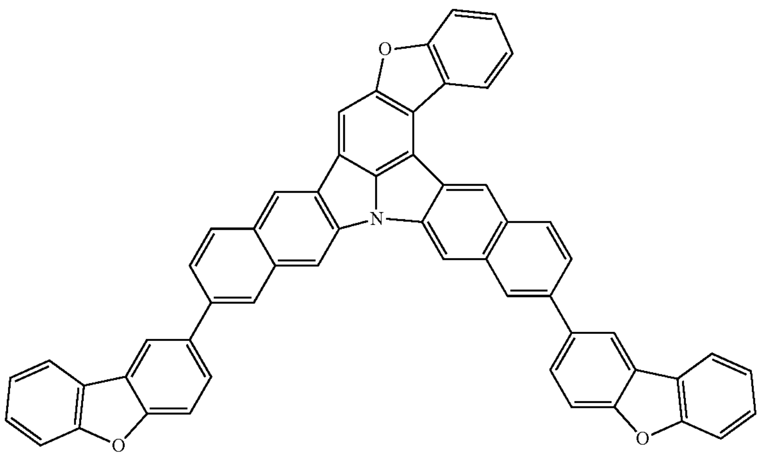
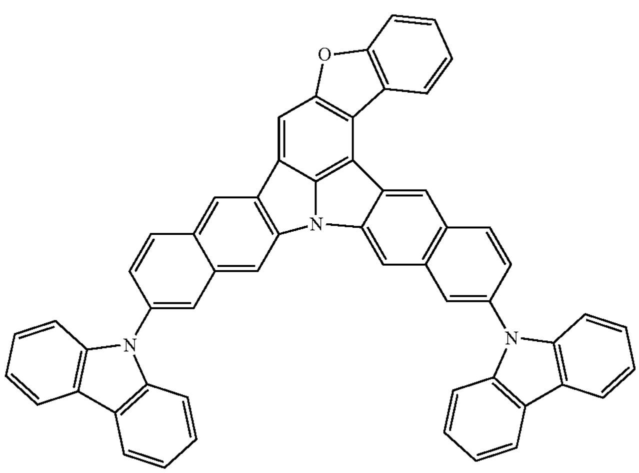

-continued
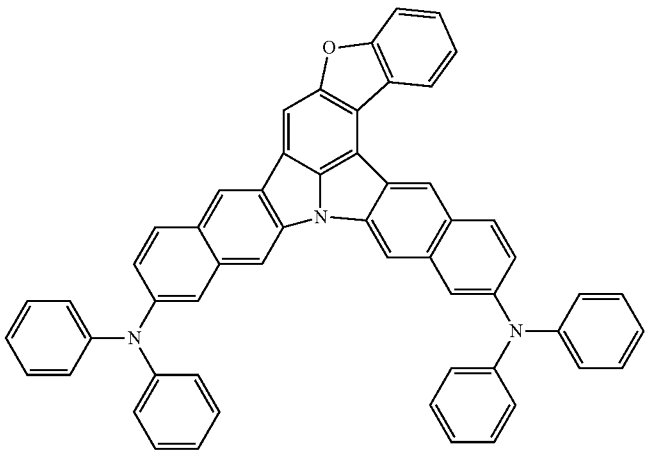
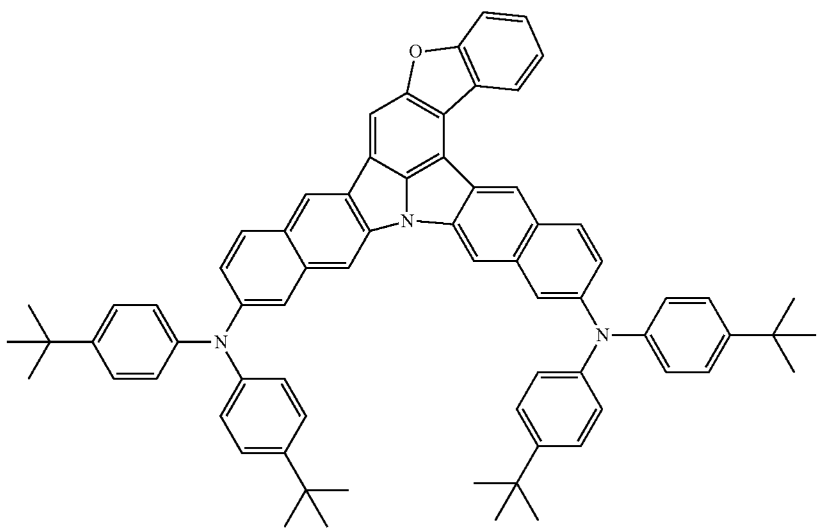
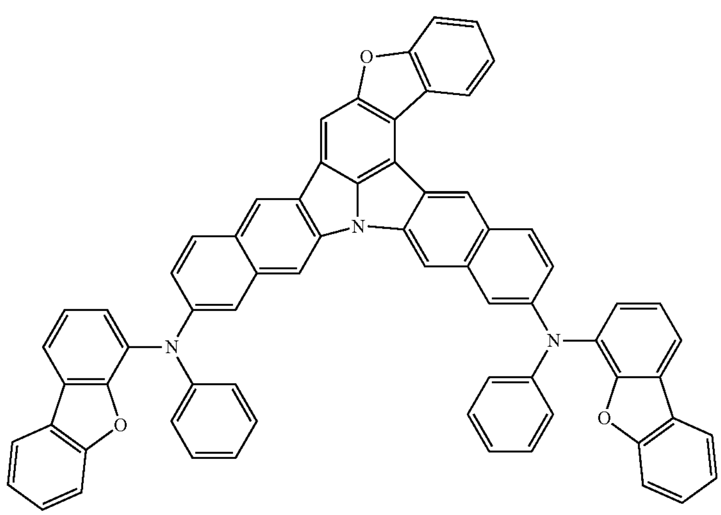

-continued
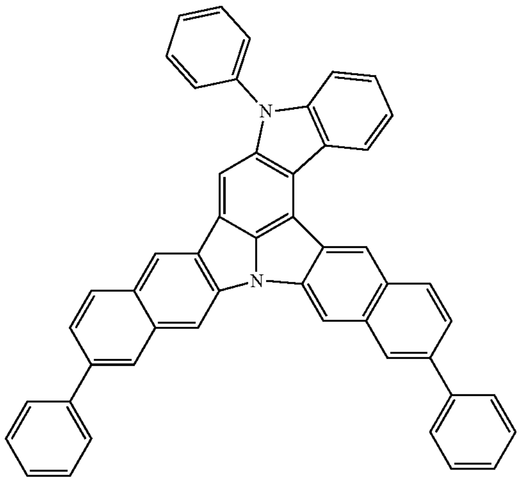
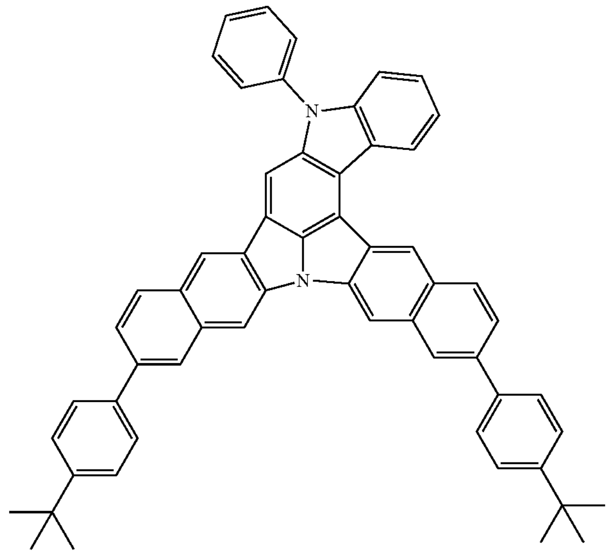
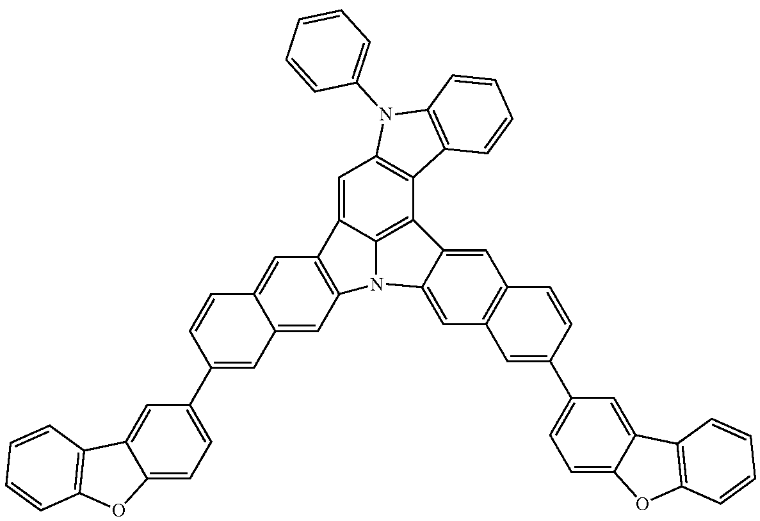
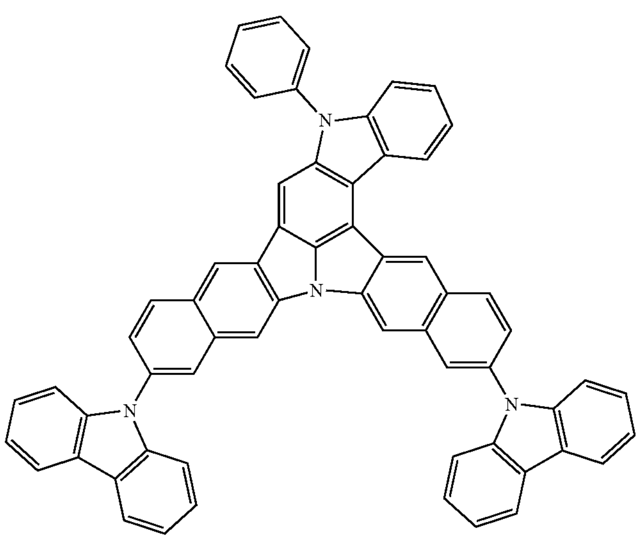

-continued
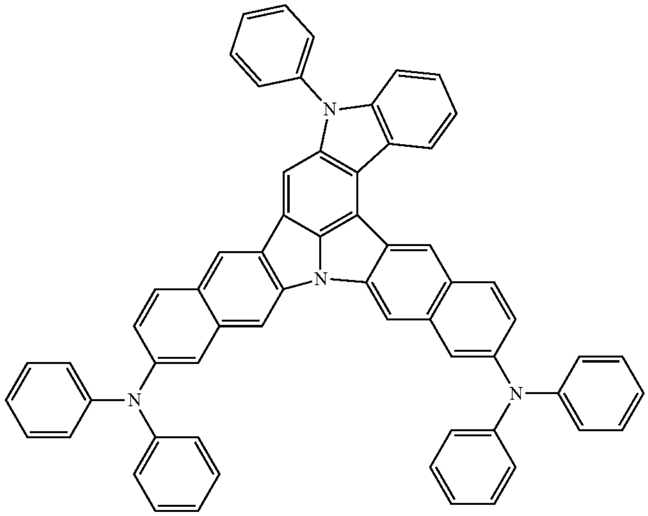
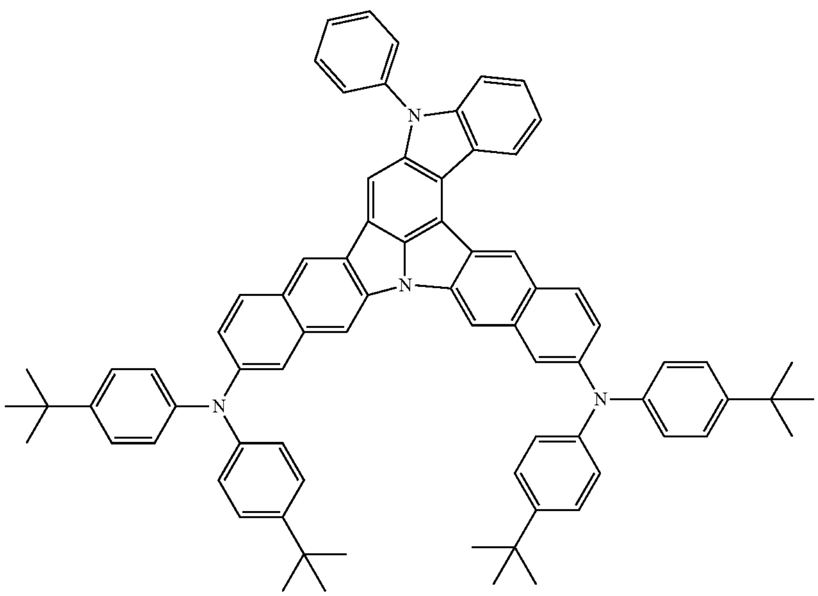
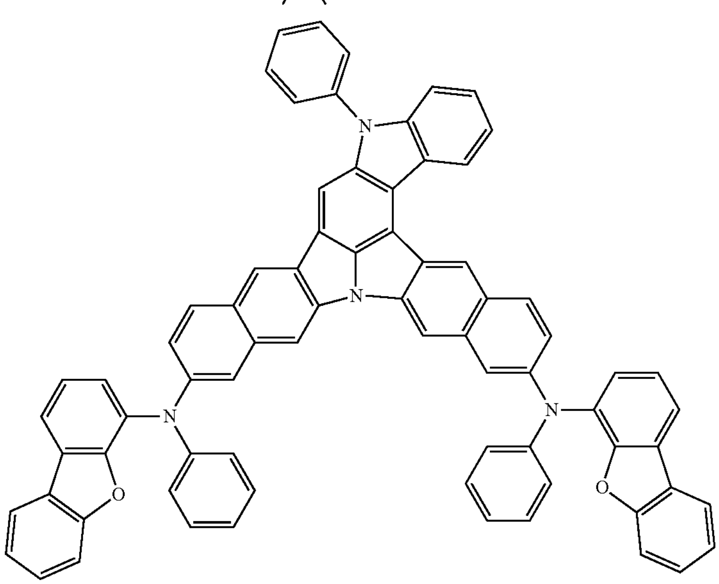

-continued
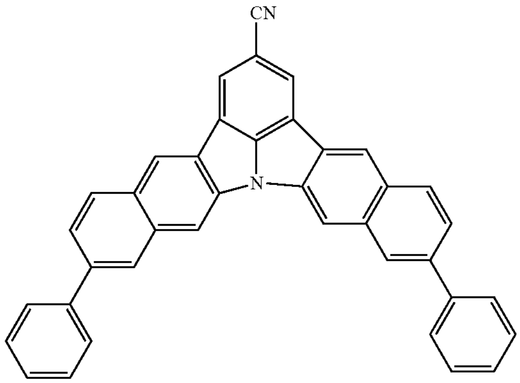
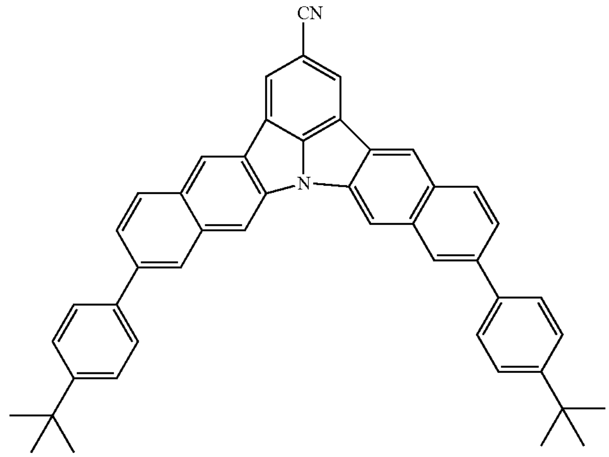
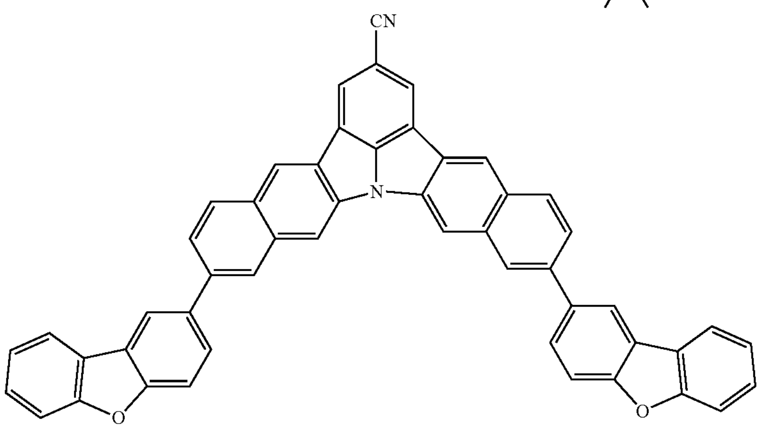
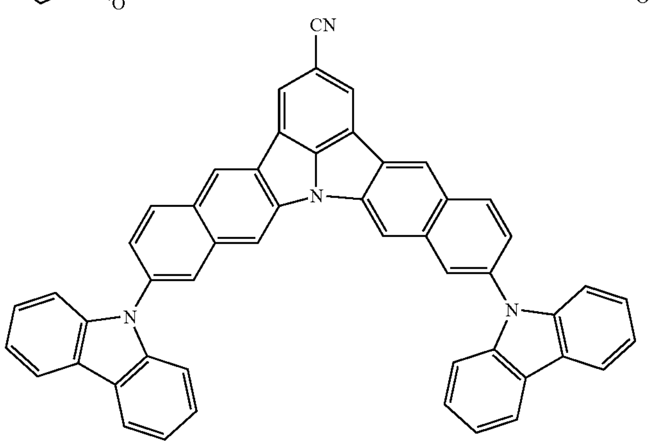
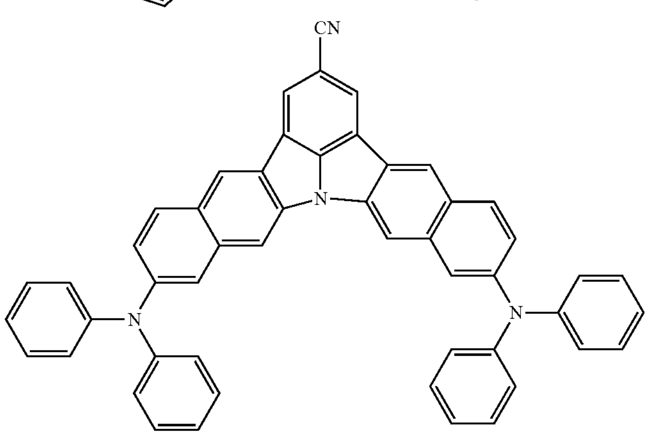

-continued
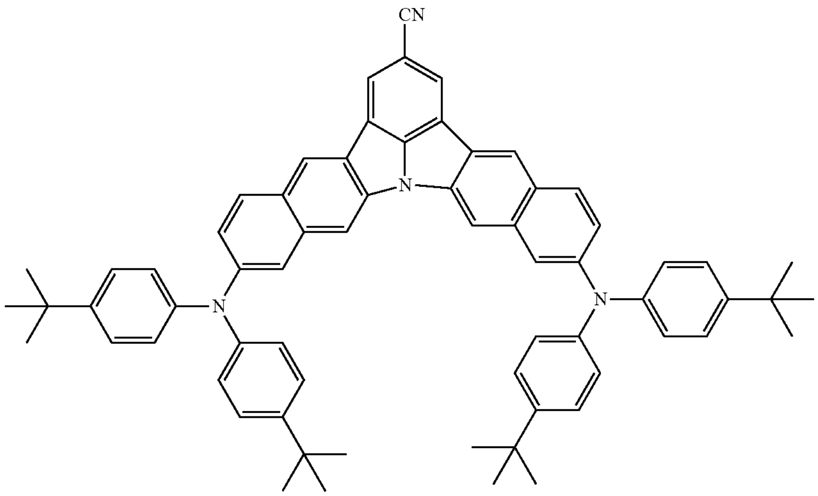
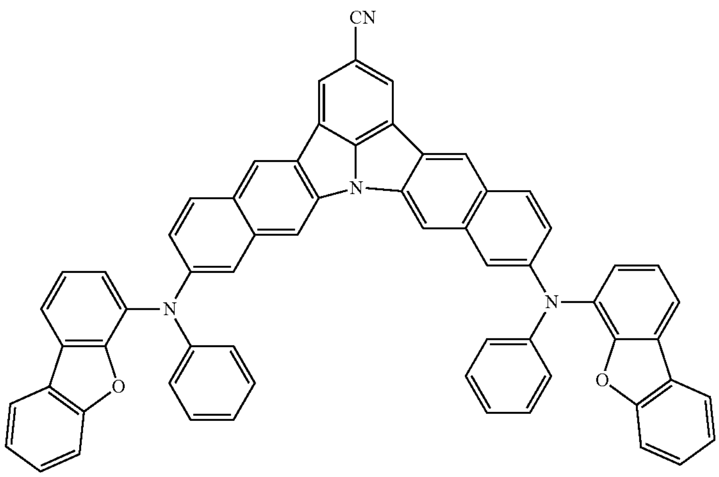
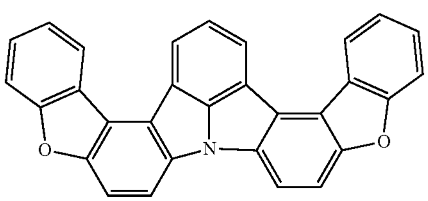
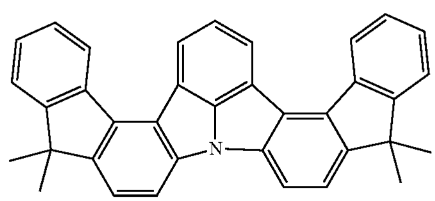
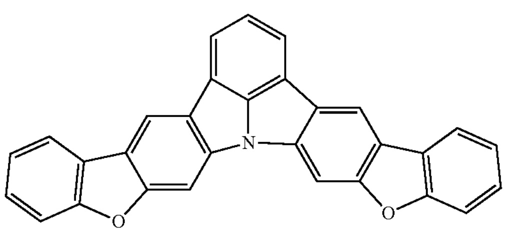
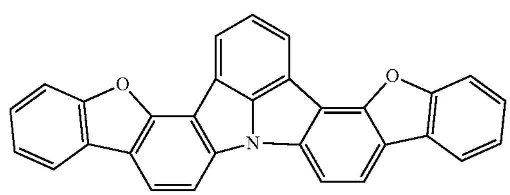
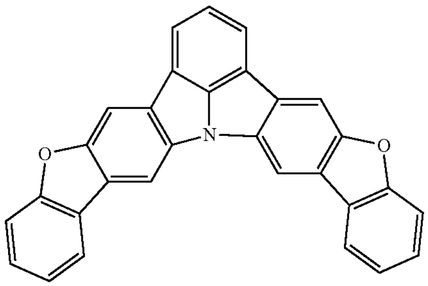
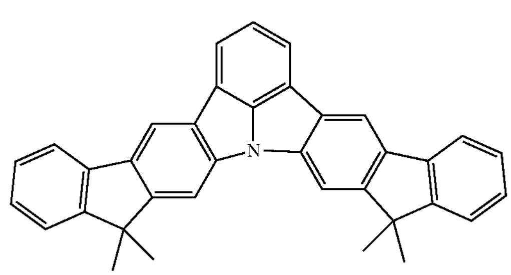

-continued
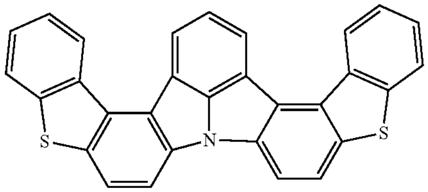
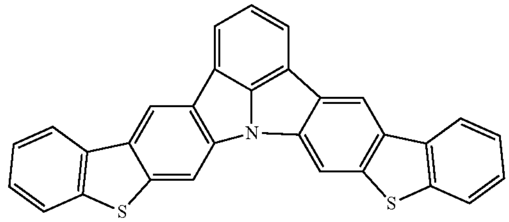
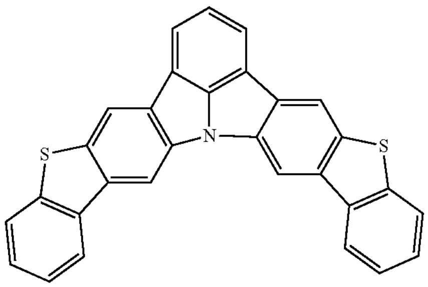
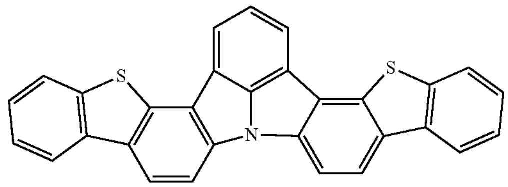
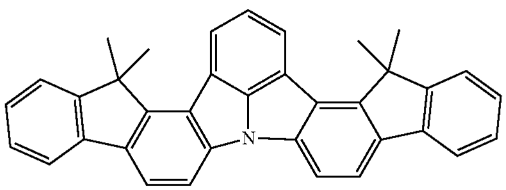
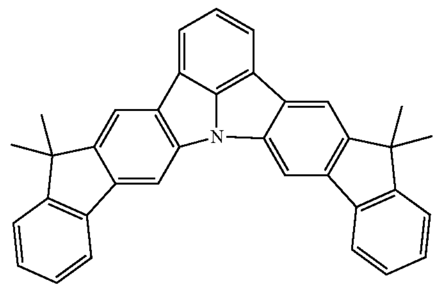
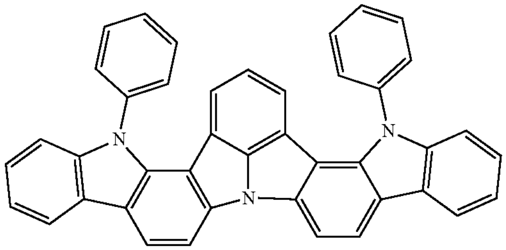
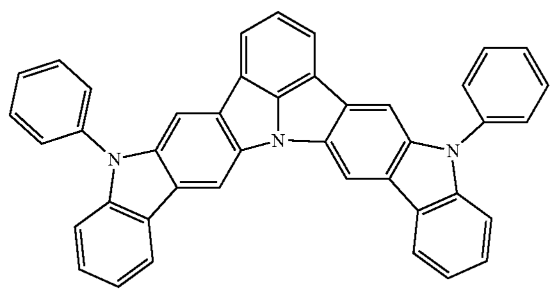
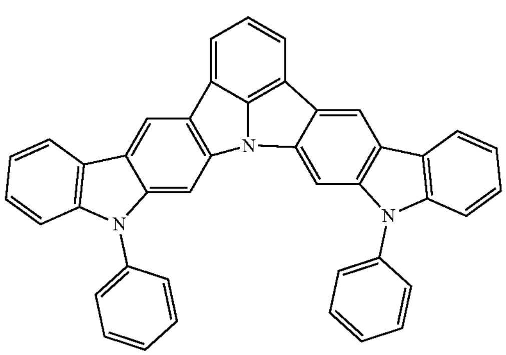
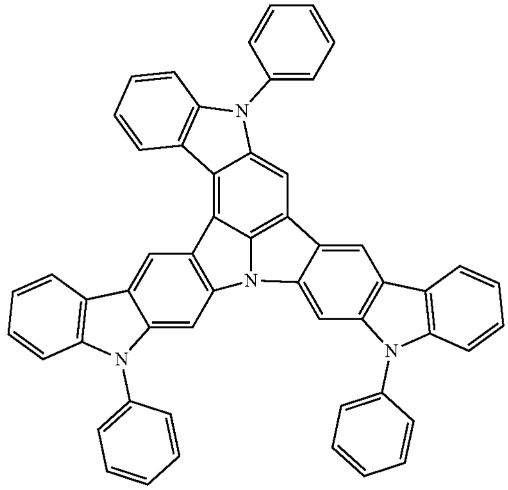

-continued
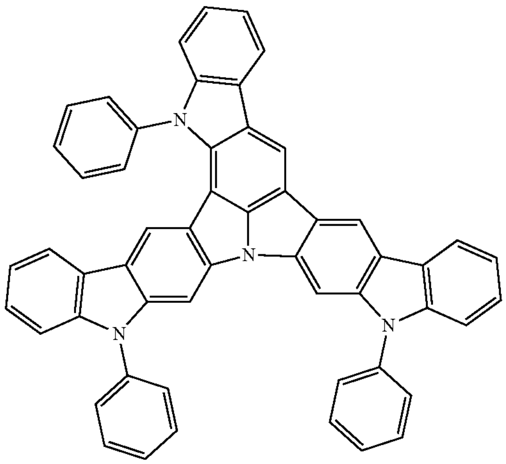
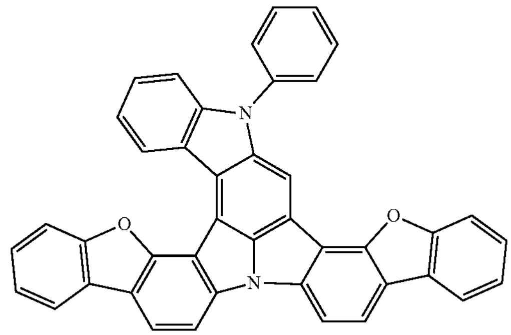
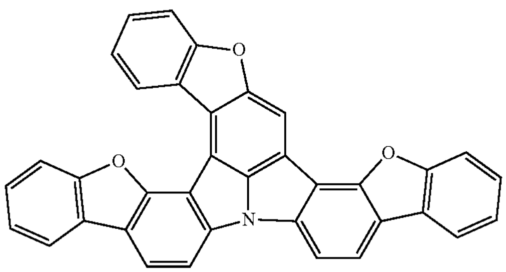
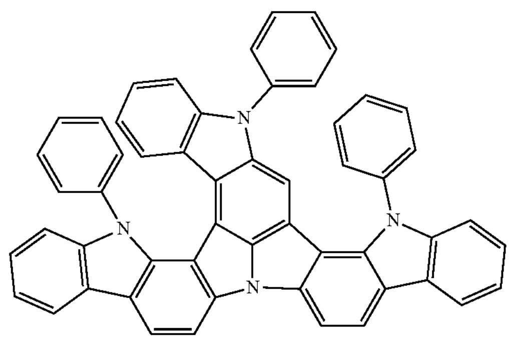
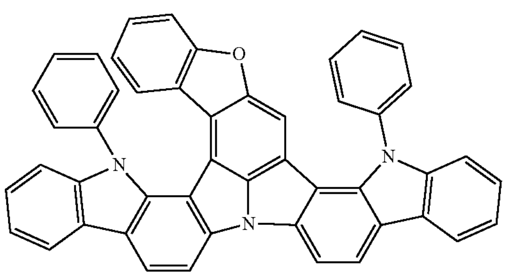
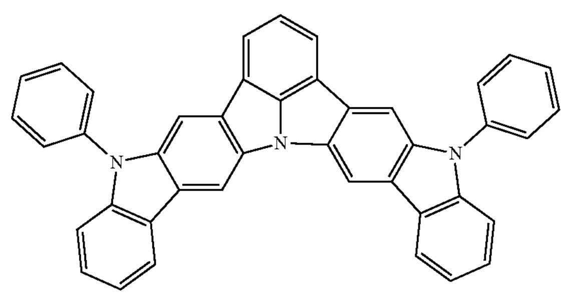
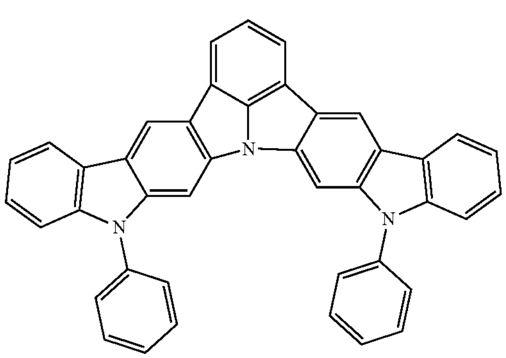
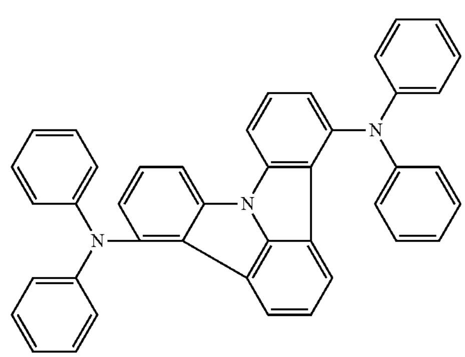

-continued
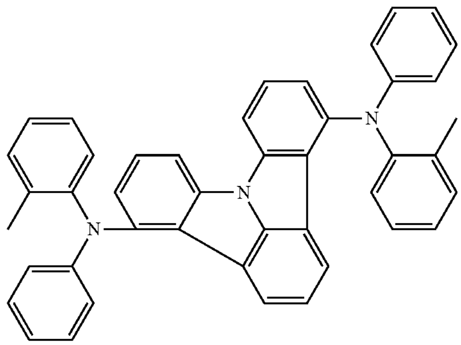
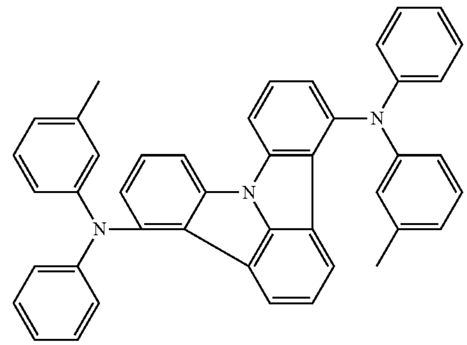
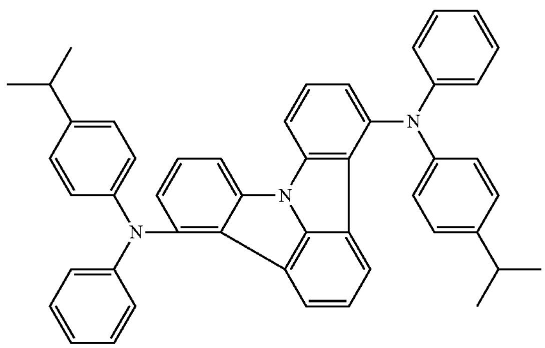
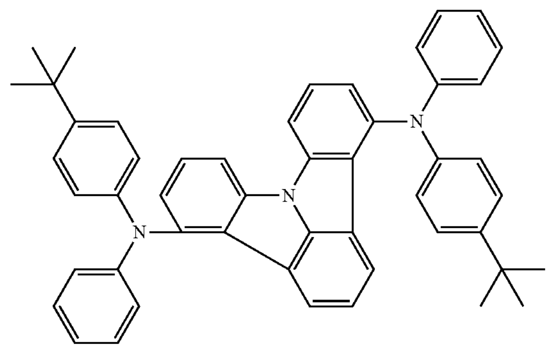
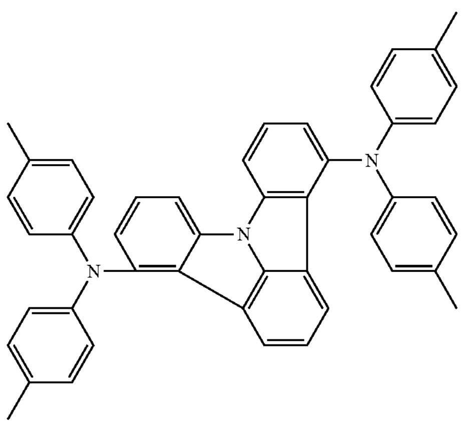
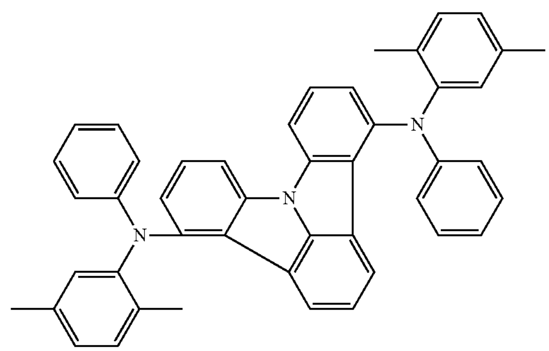
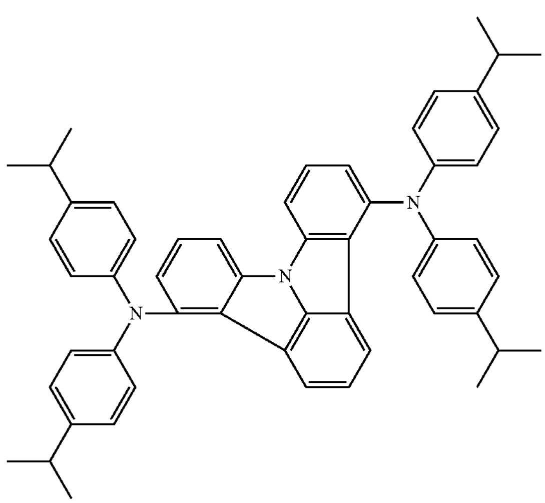
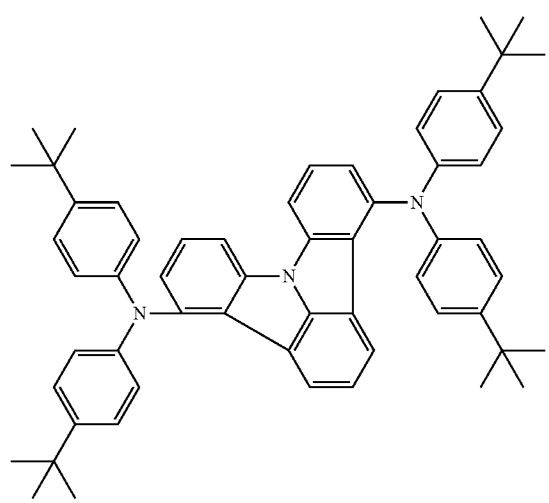

-continued
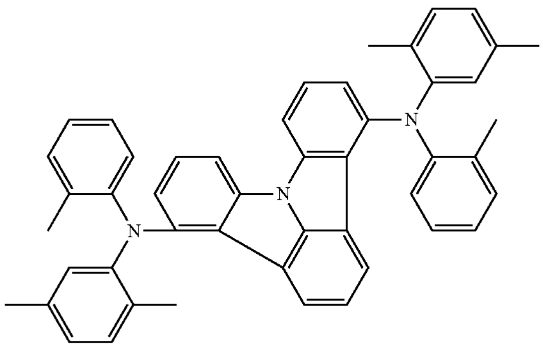
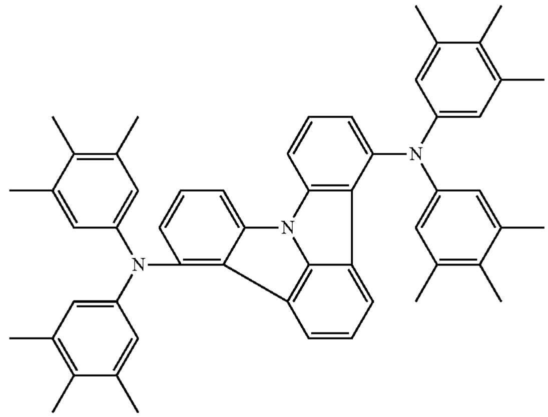
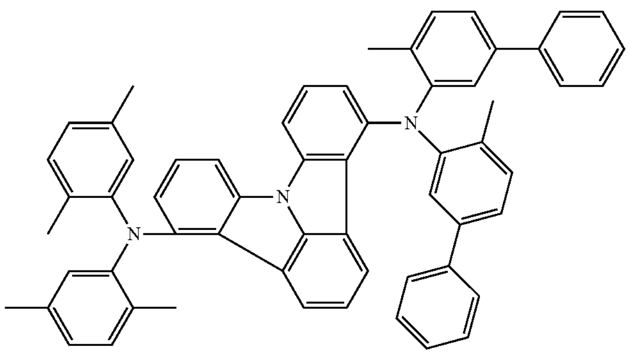
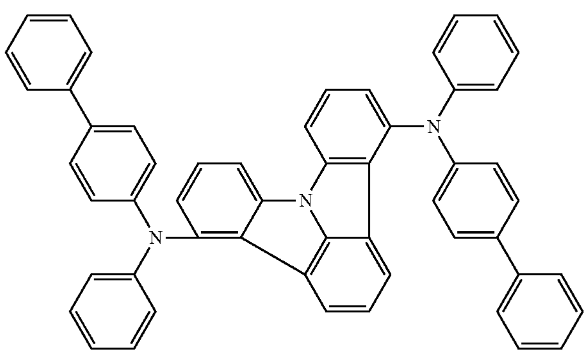
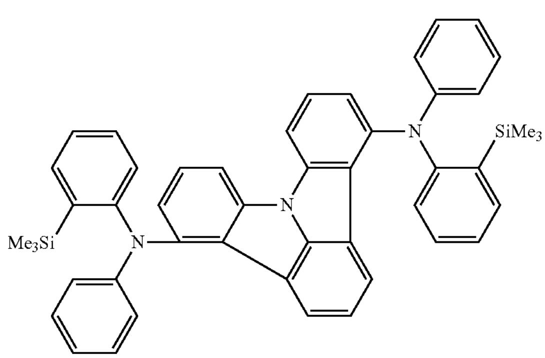
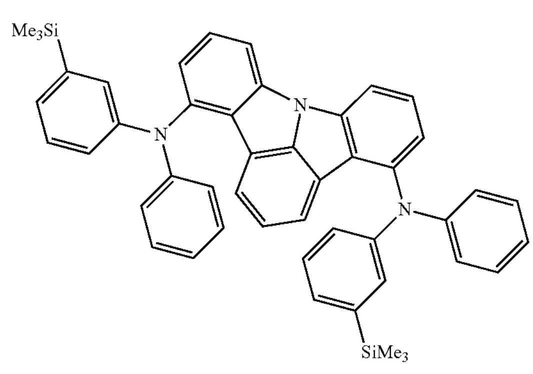

-continued
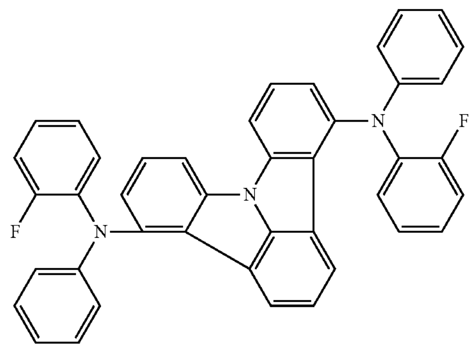
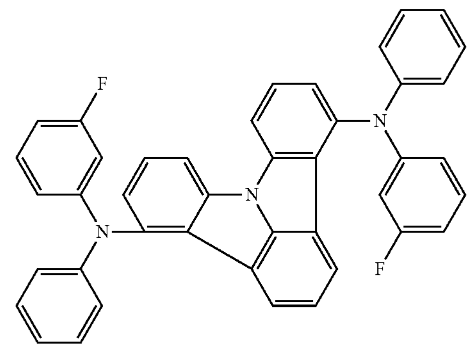
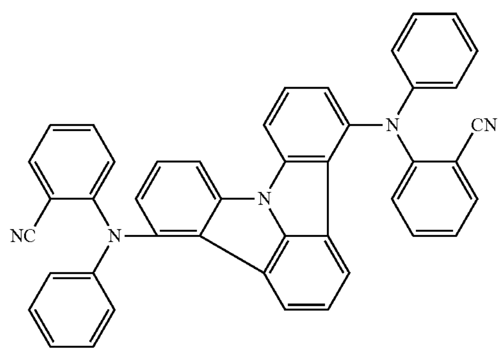
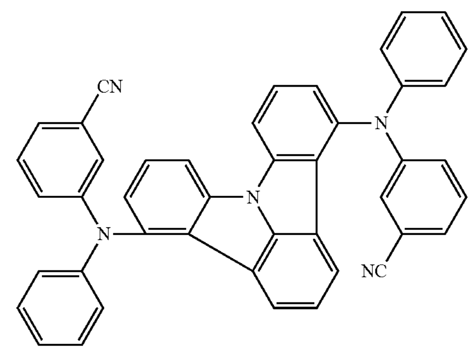
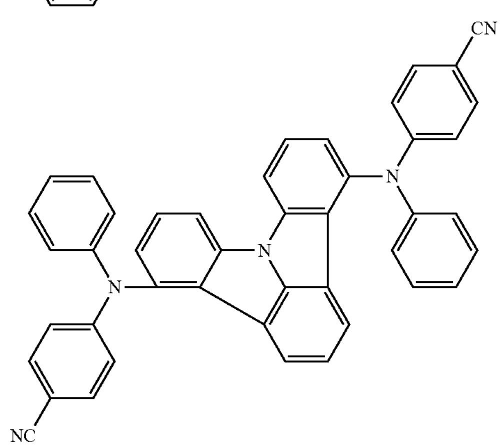
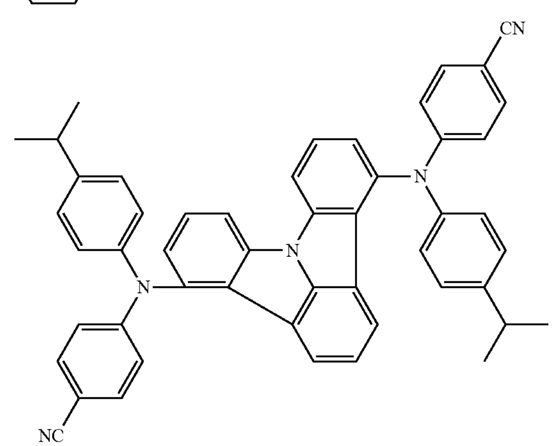
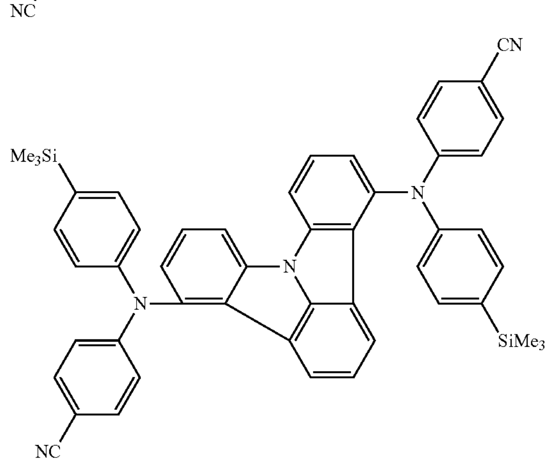

-continued
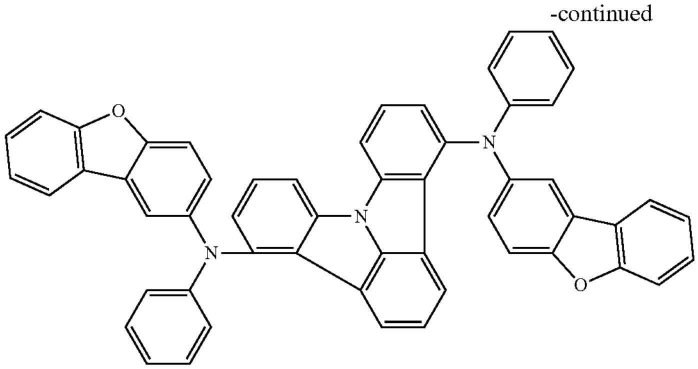
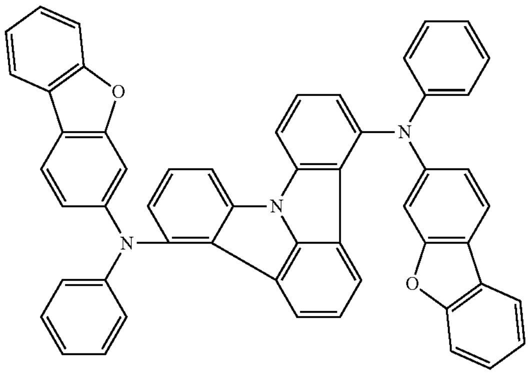
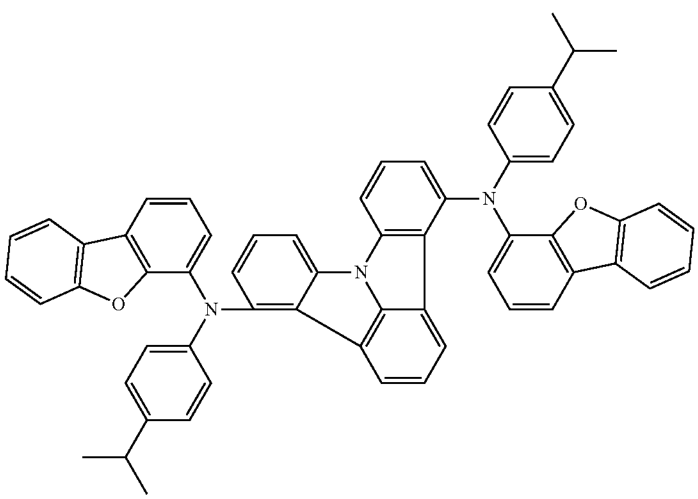
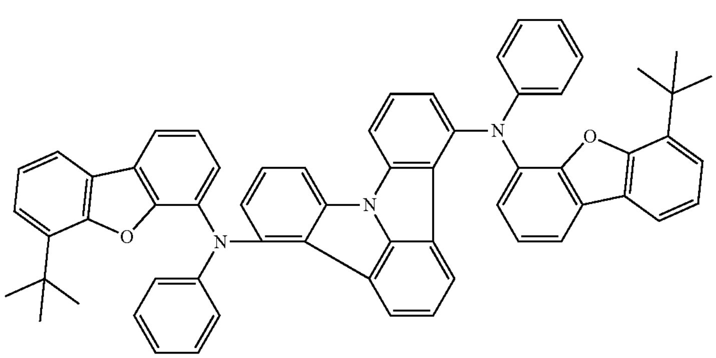

-continued
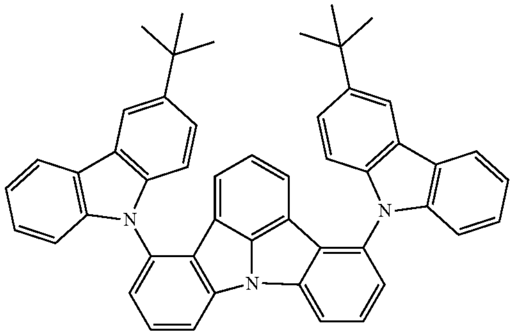
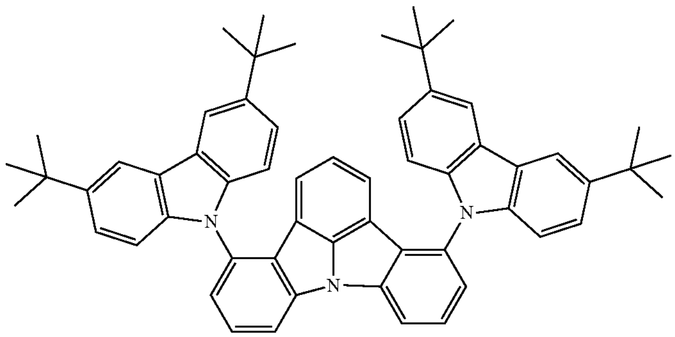
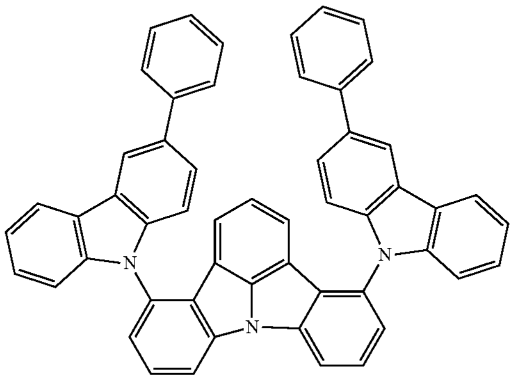
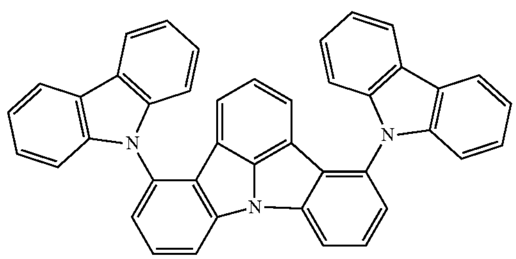
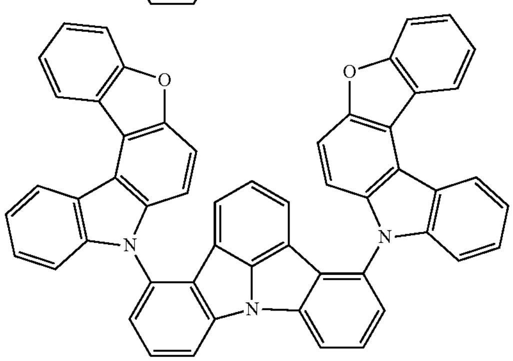
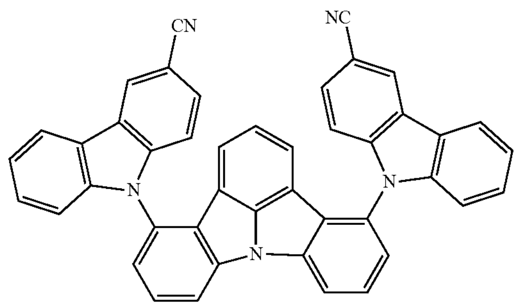
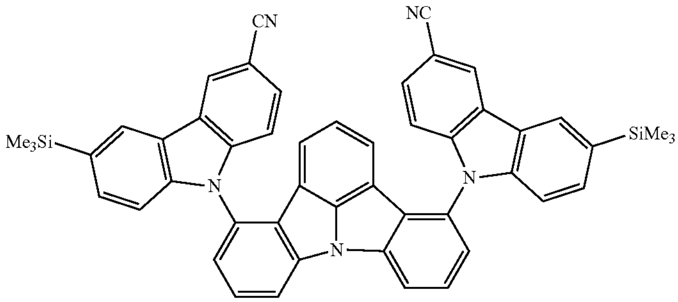
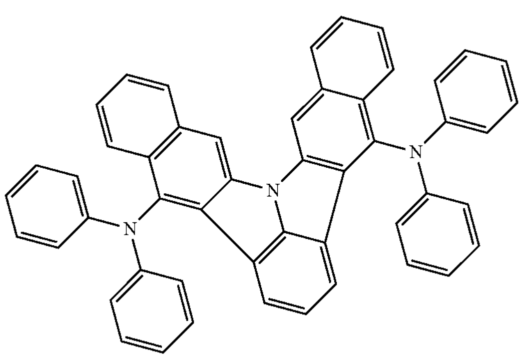
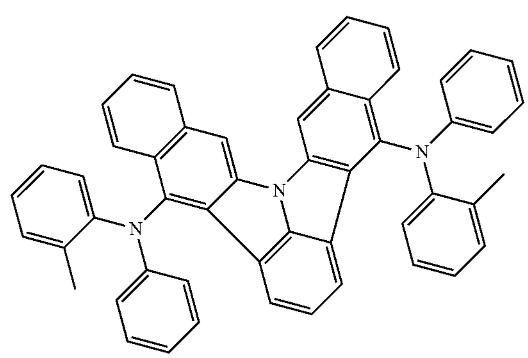

-continued
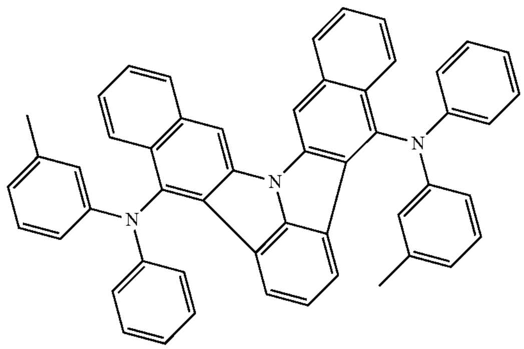
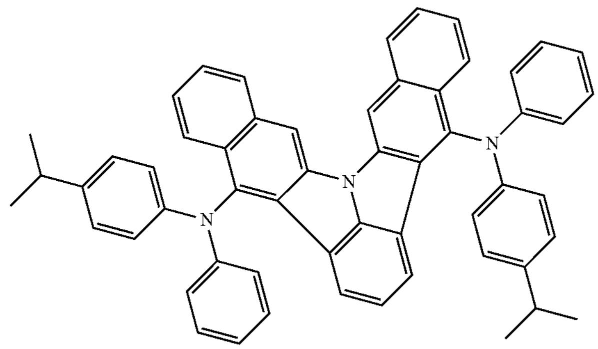
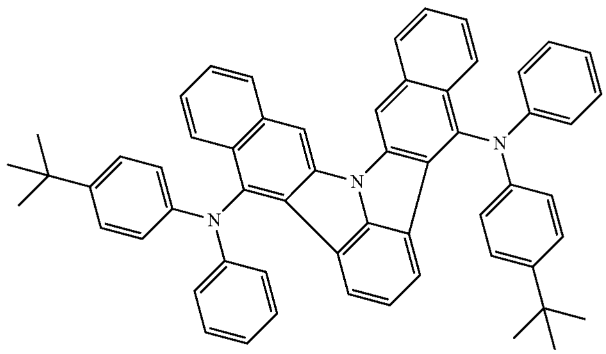
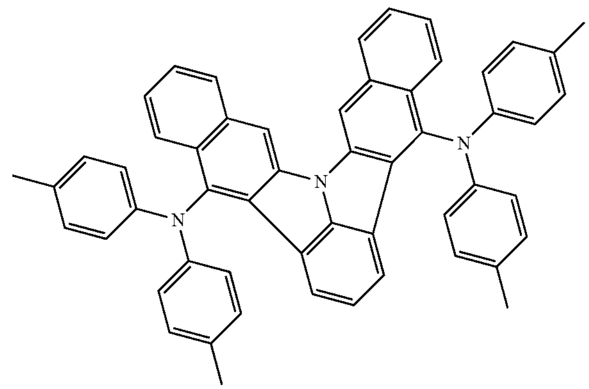
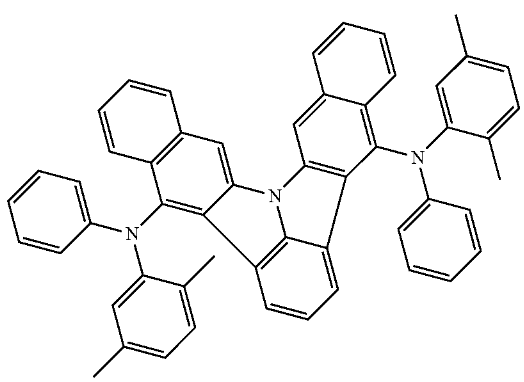
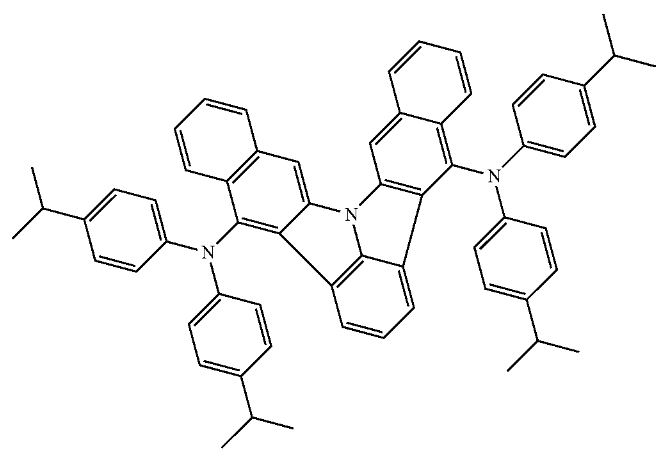
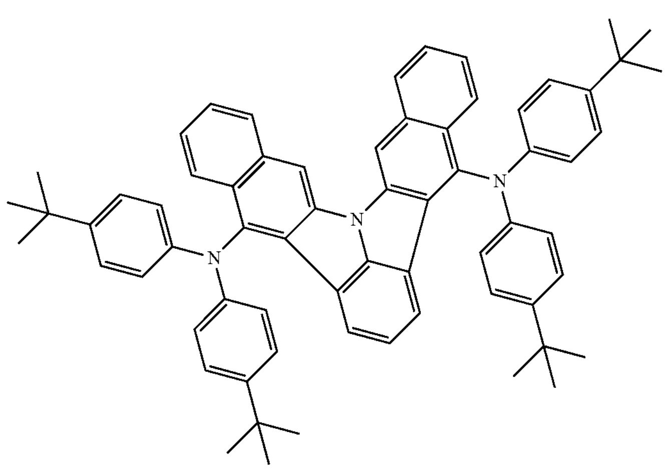
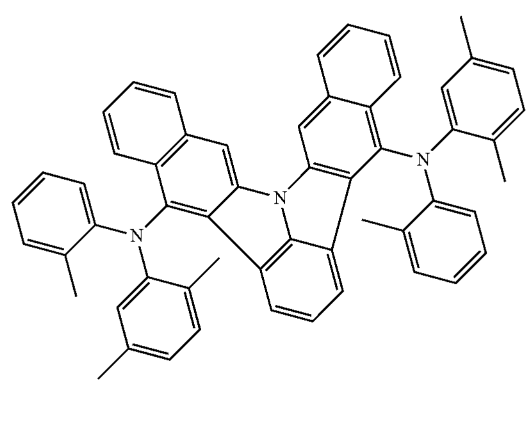

-continued
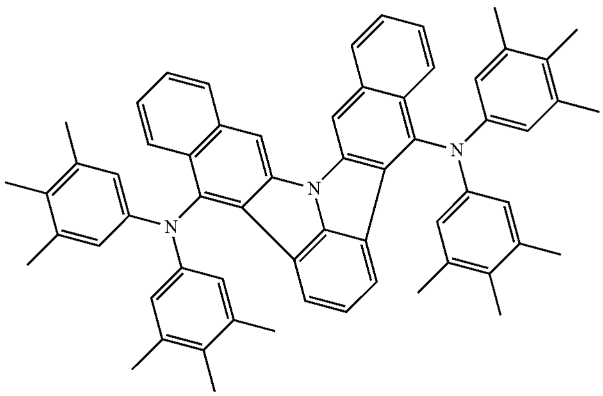
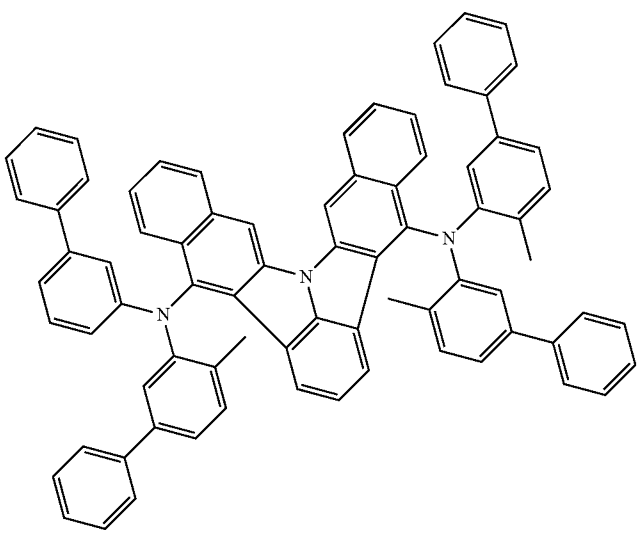
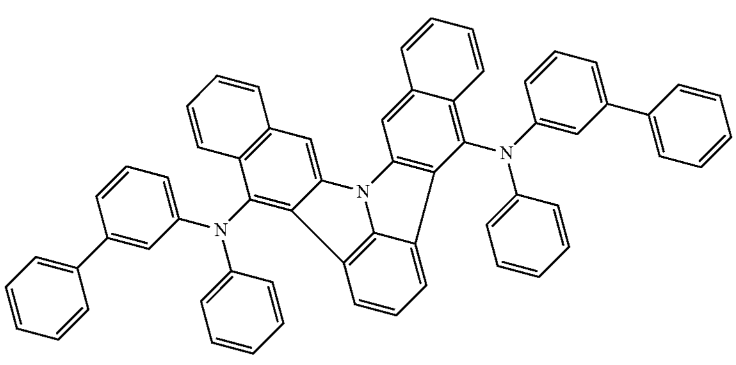

-continued
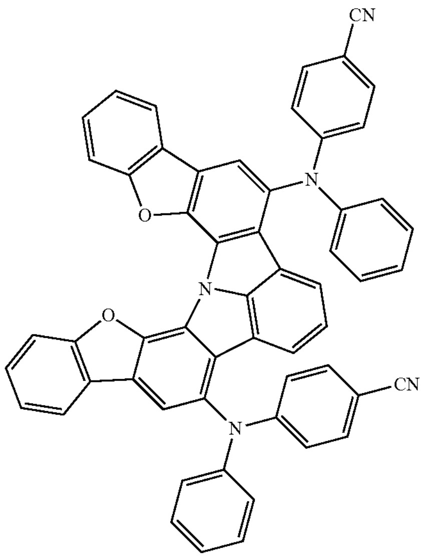
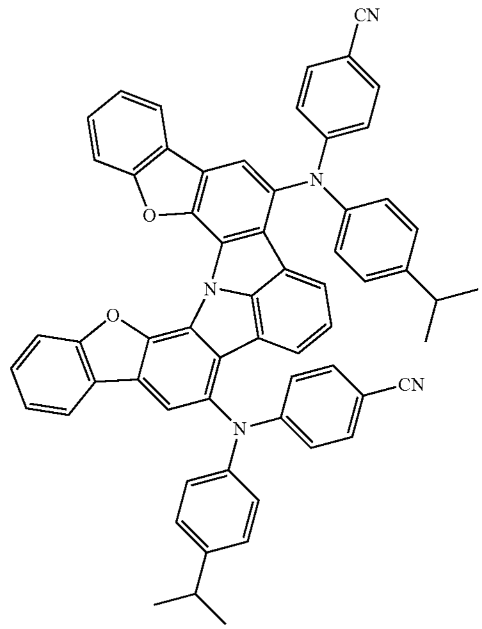
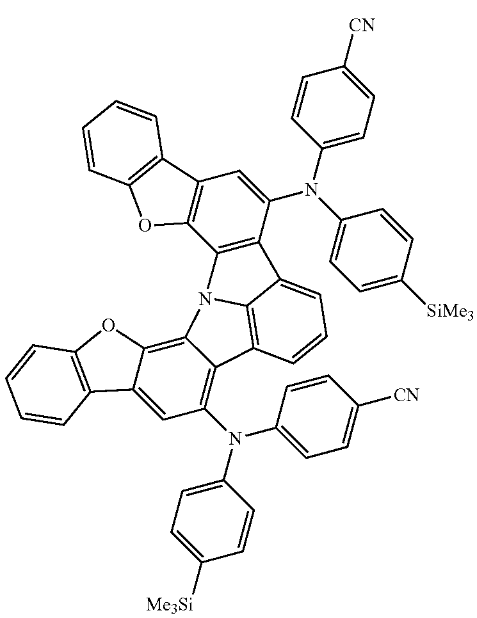
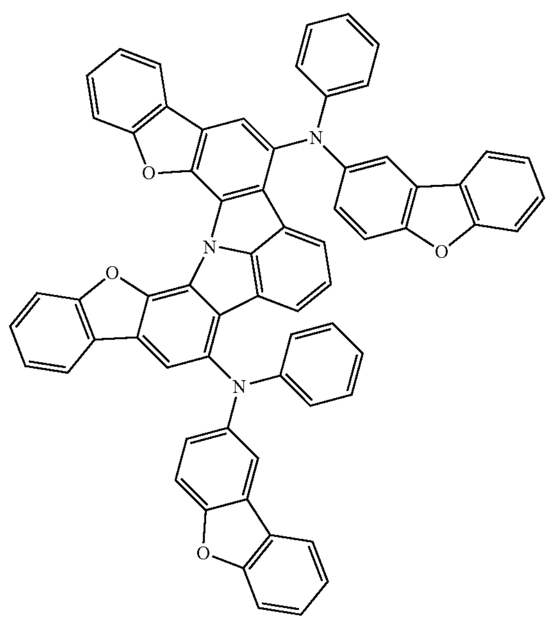

-continued
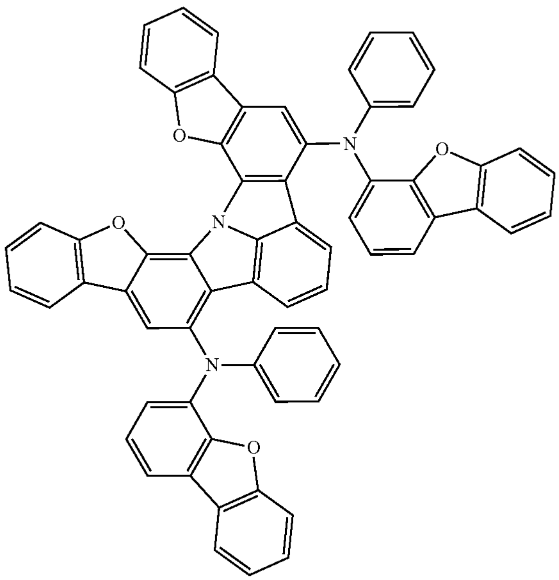
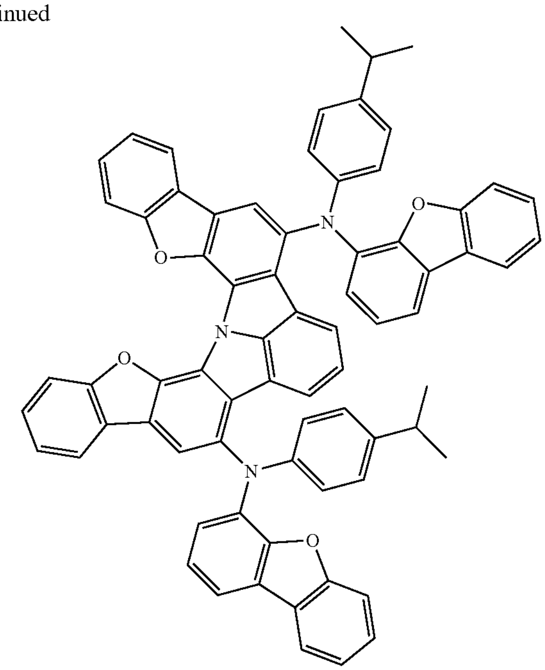
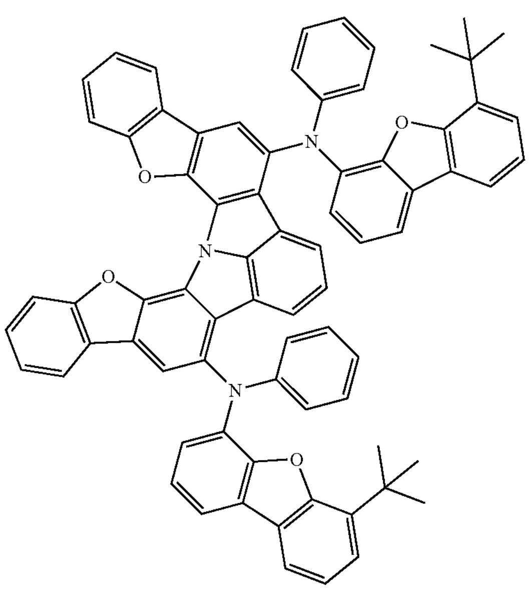
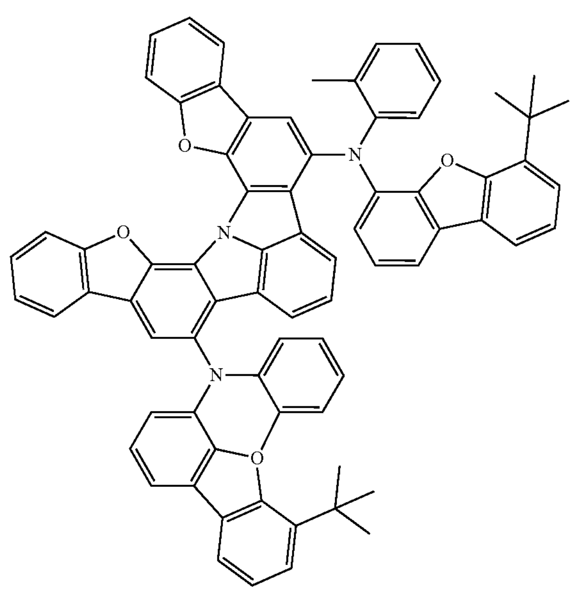

-continued
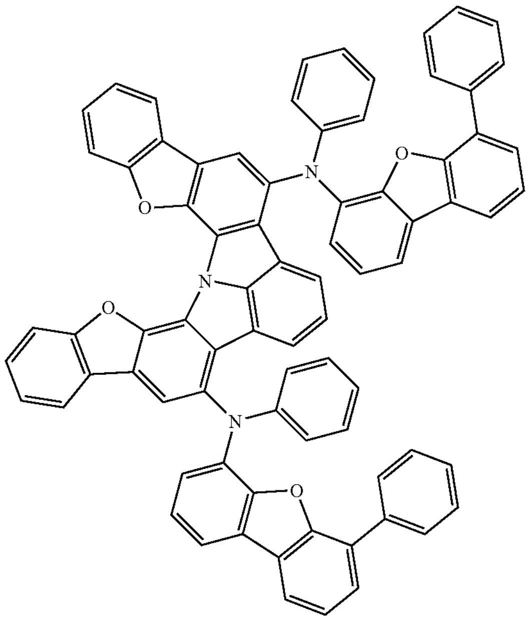
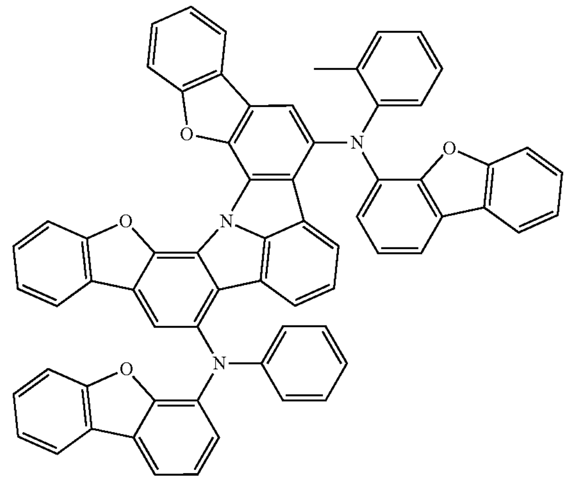
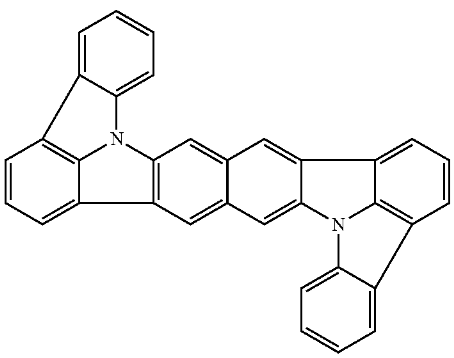
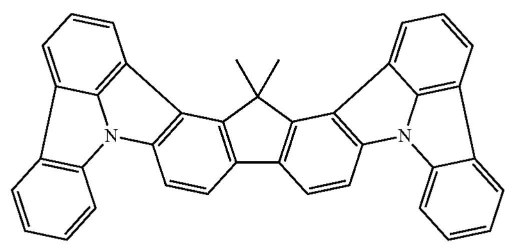
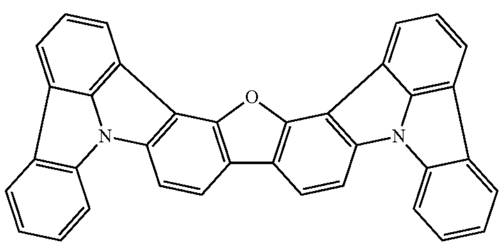
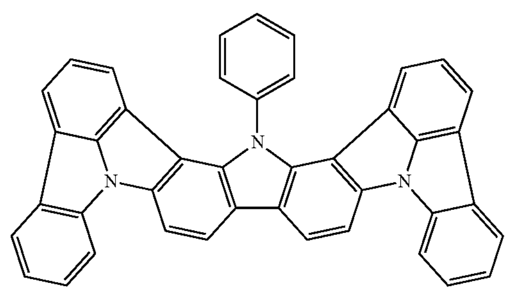
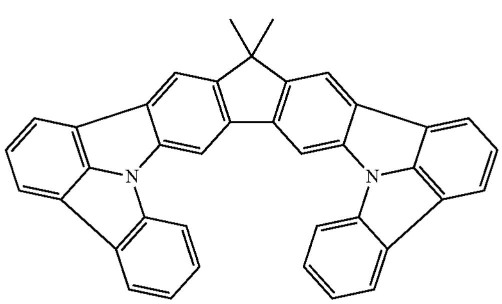
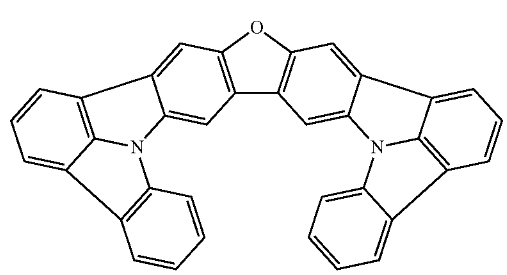

-continued

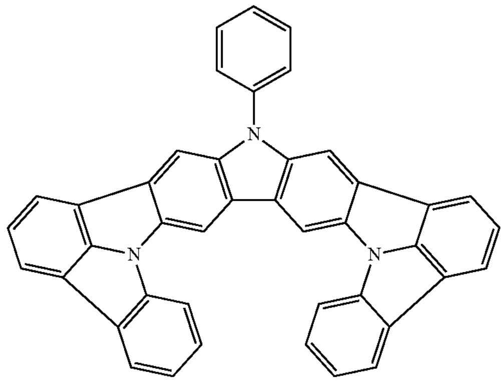

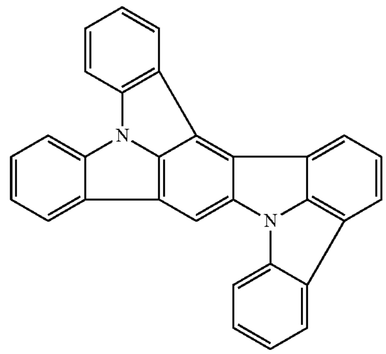

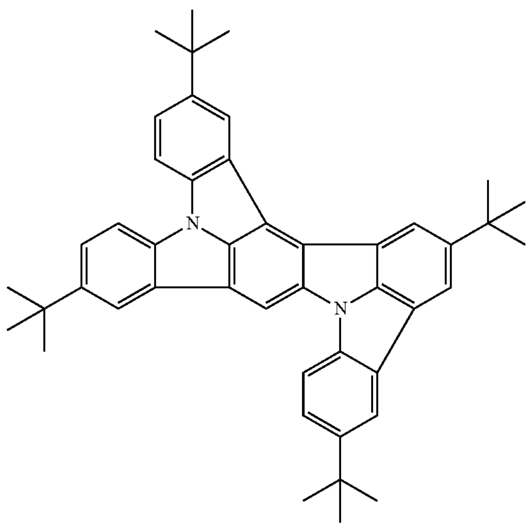

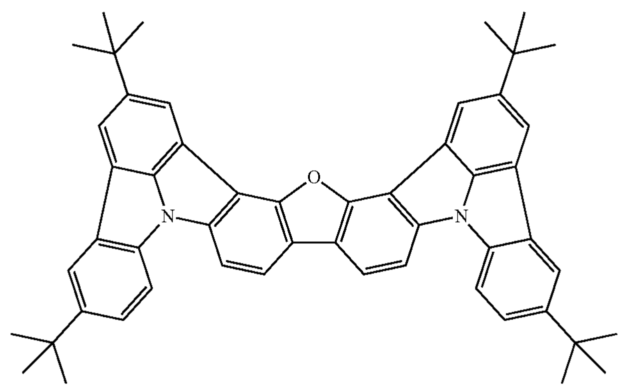

Compound Represented by (5)

The compound represented by the formula (5) will be described.

(5)

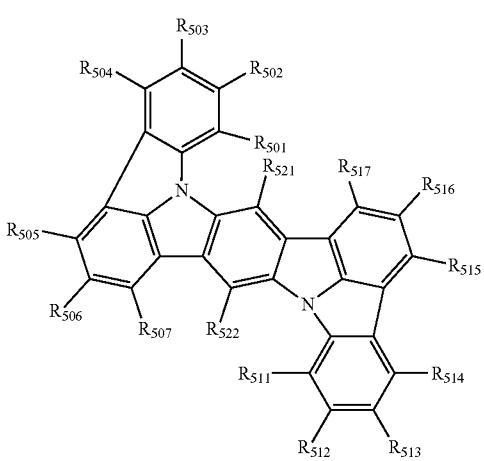

In the formula (5):

at least one combination of adjacent two or more of $R_{501}$ to $R_{507}$ and $R_{511}$ to $R_{517}$ are mutually bonded to form a substituted or unsubstituted monocyclic ring, mutually bonded to form a substituted or unsubstituted fused ring, or not mutually bonded; and $R_{521}$, $R_{522}$, and $R_{501}$ to $R_{507}$ and $R_{511}$ to $R_{517}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms.

Specific Examples of Compound Represented by Formula (5)

Specific examples of the compound represented by the formula (5) include compounds shown below.

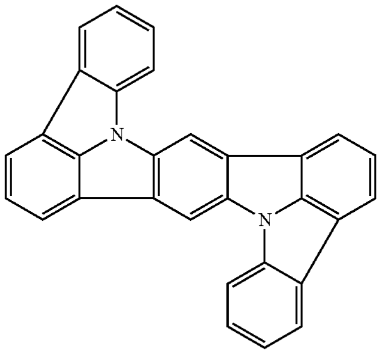
N
N
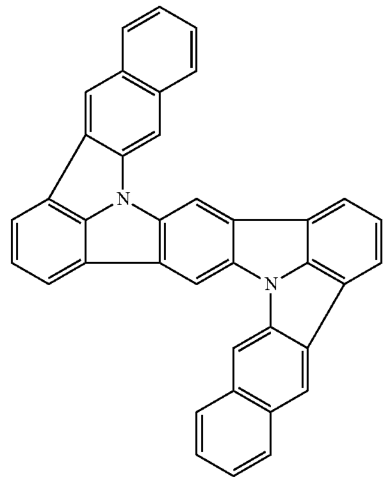
N
N
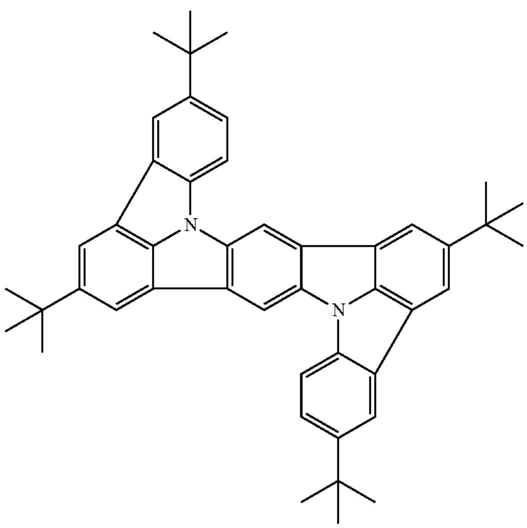
N
N
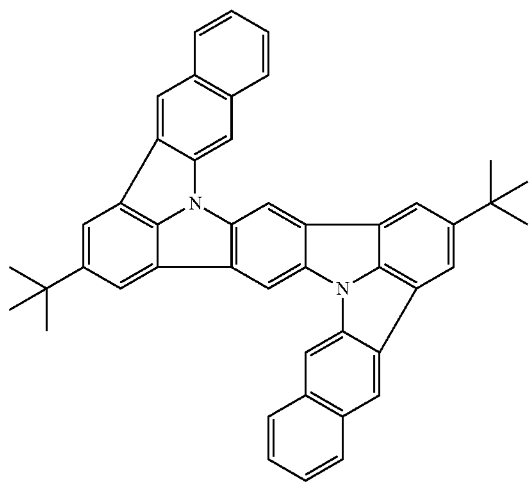
N
N
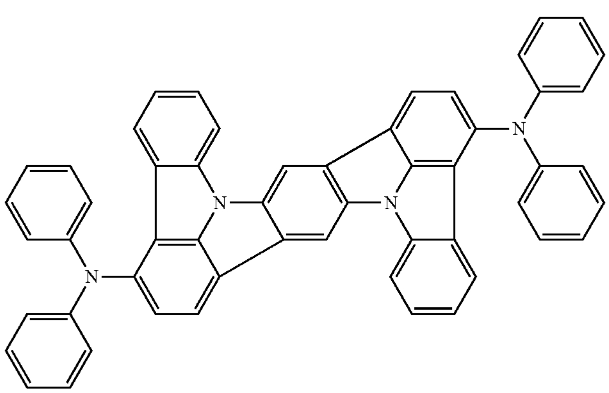
N
N
N
N -continued
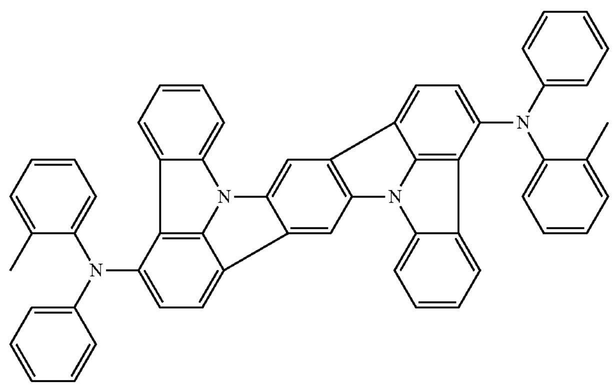
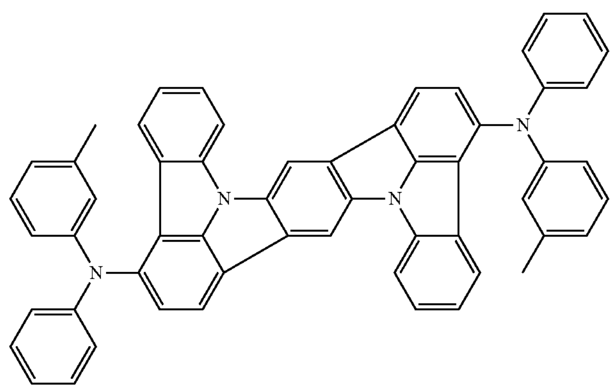
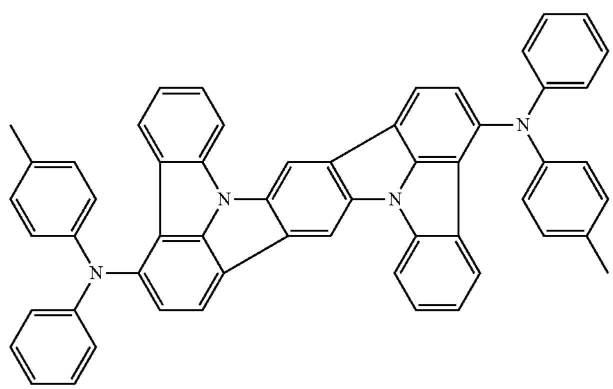
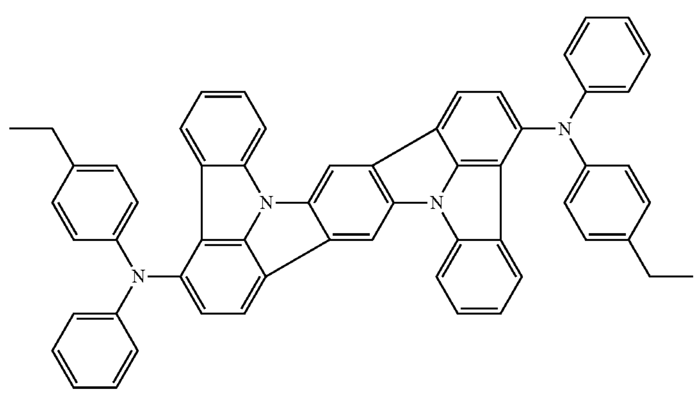

-continued
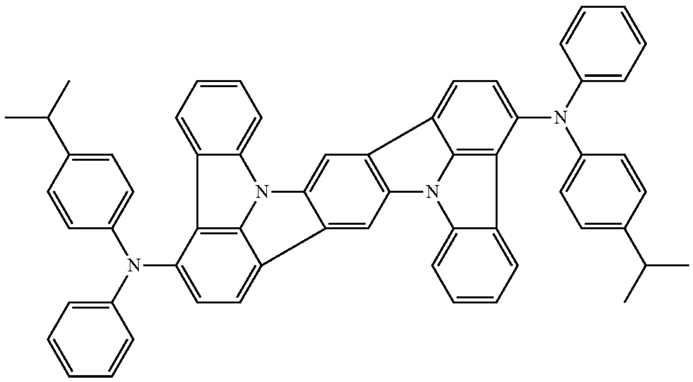
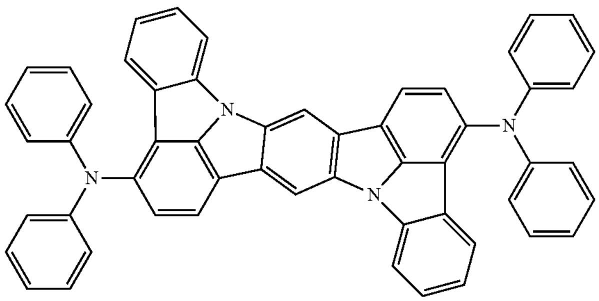
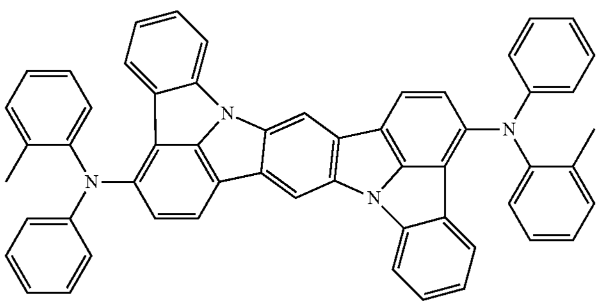
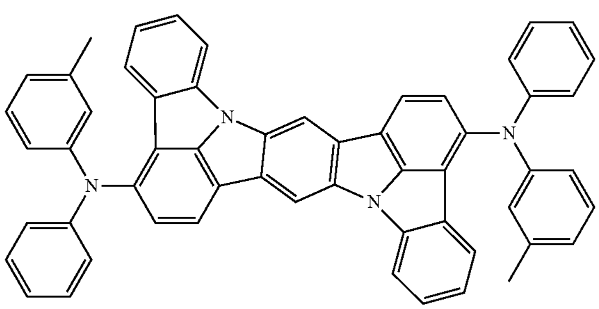
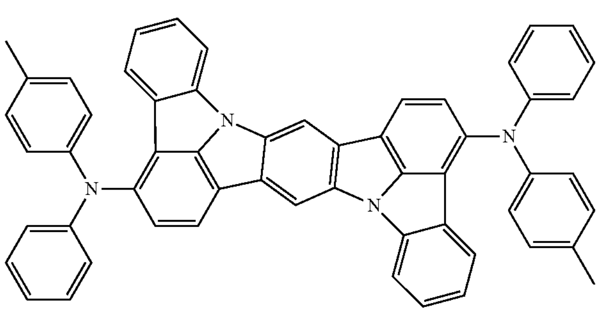

-continued
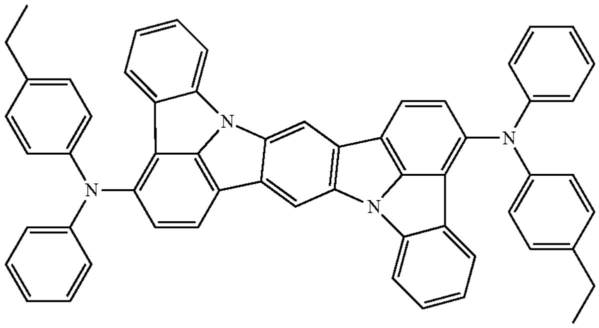
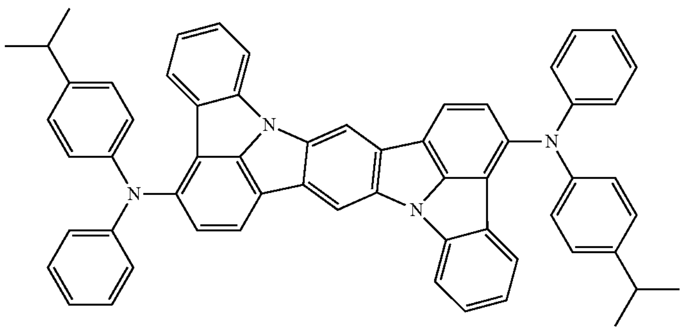
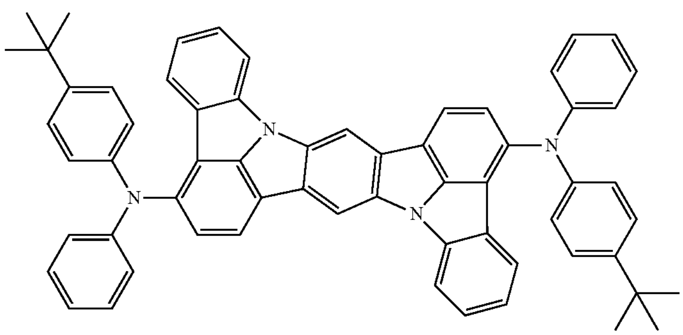
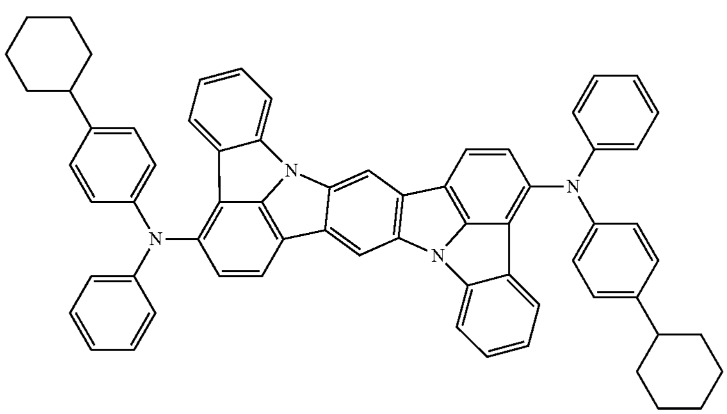

-continued
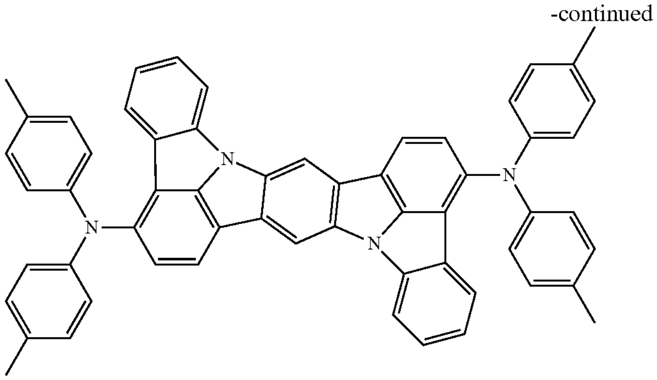
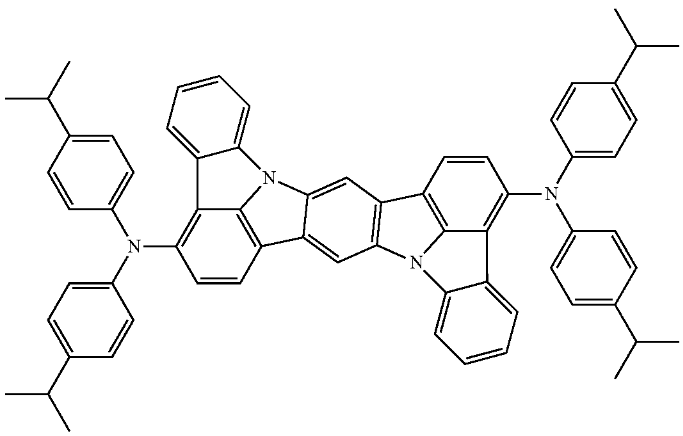
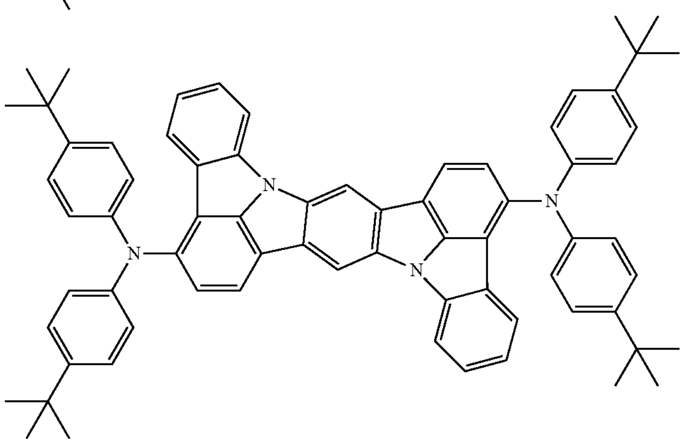
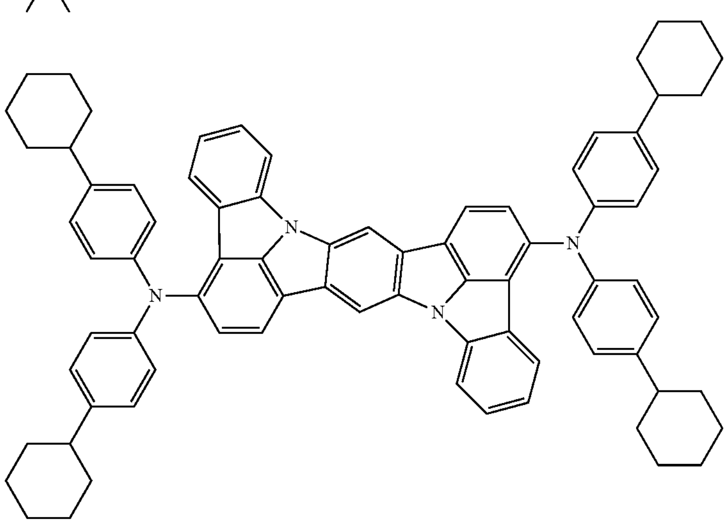

-continued
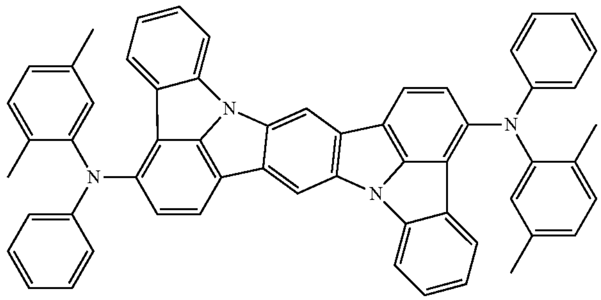
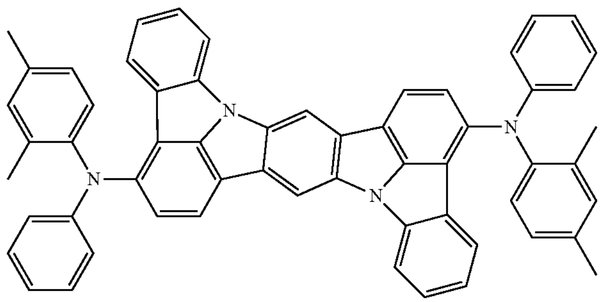
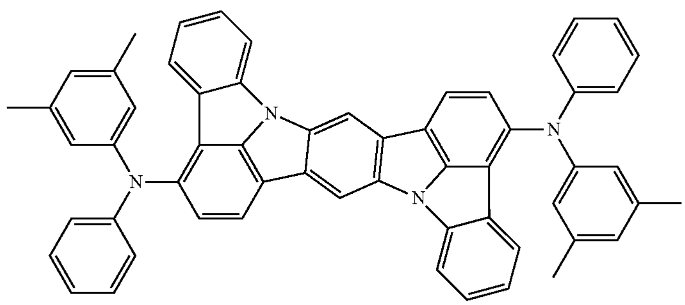
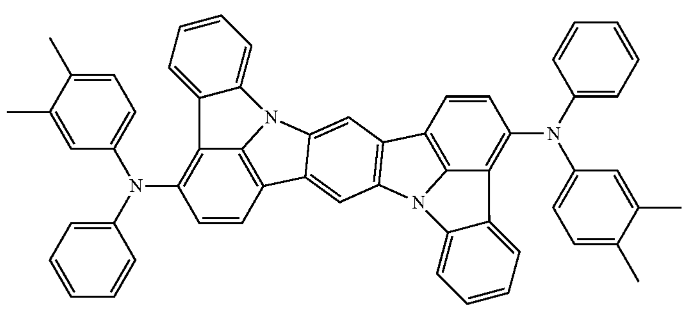
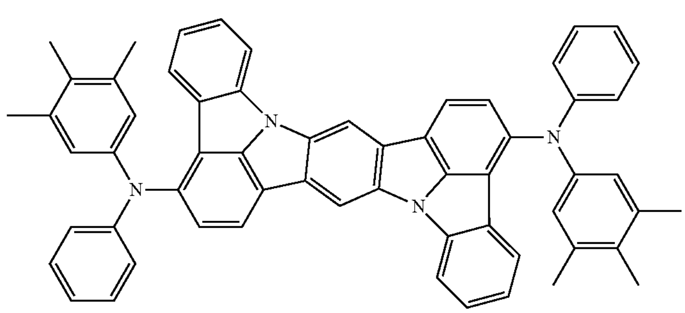

-continued
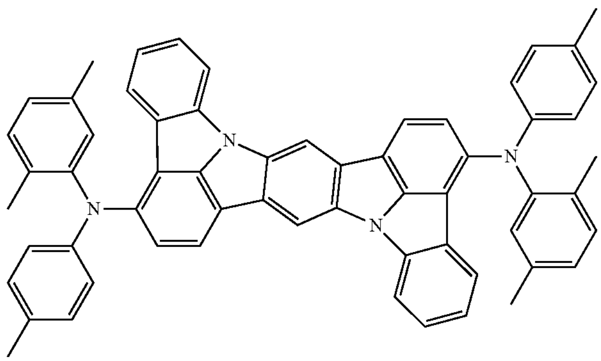
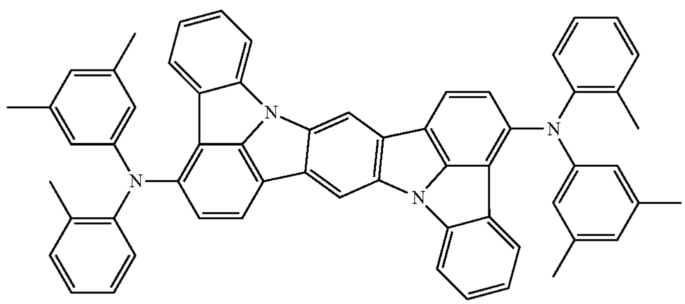
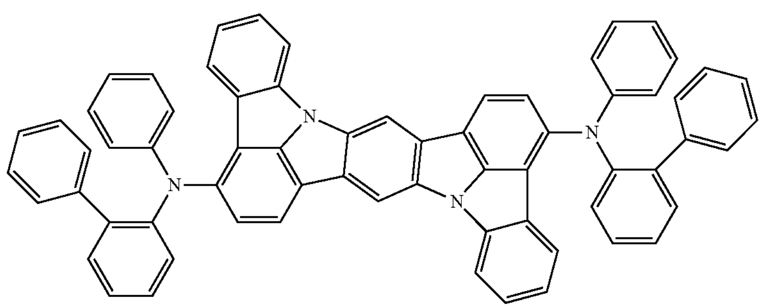
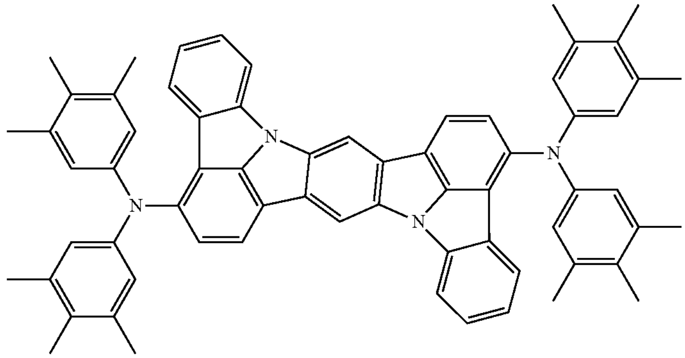

-continued
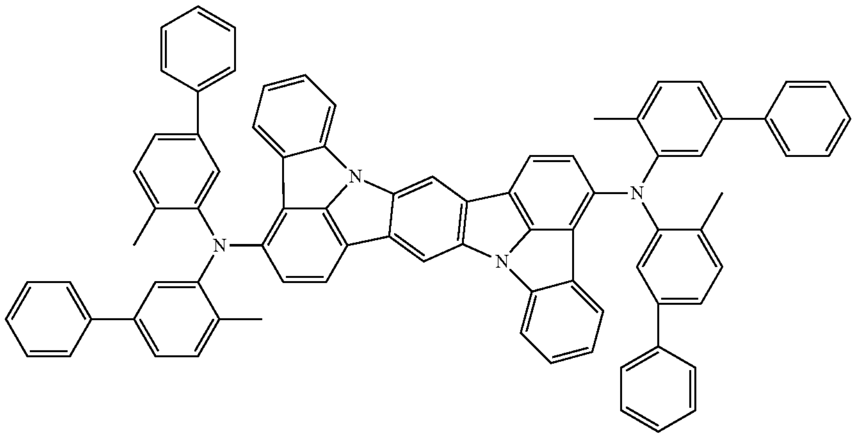
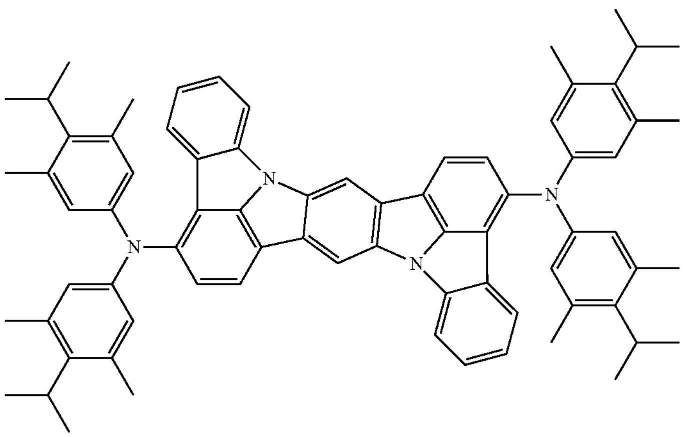
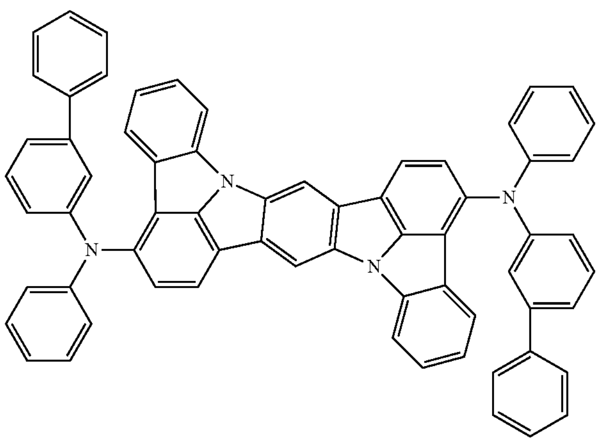
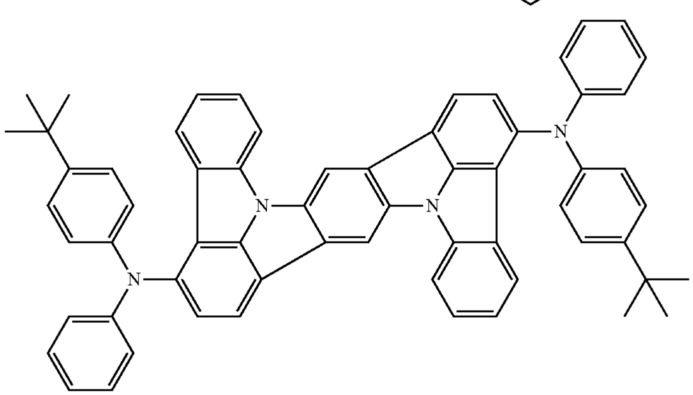

-continued
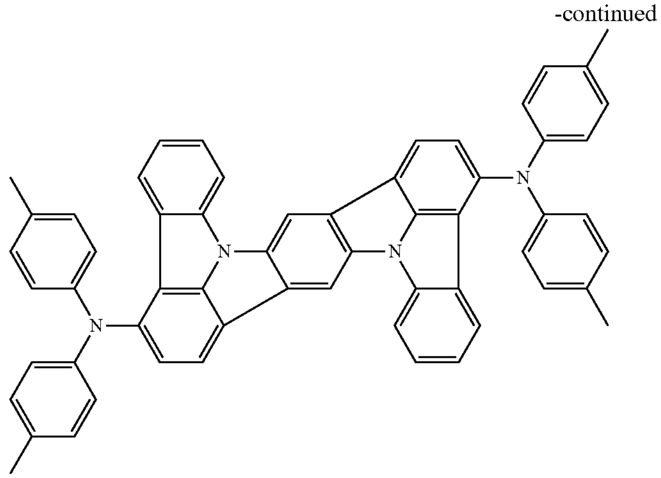
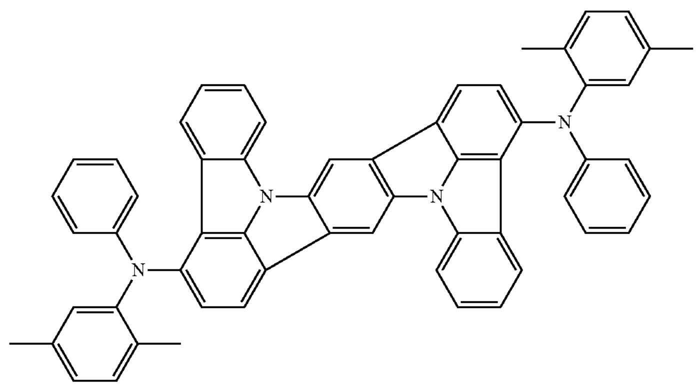
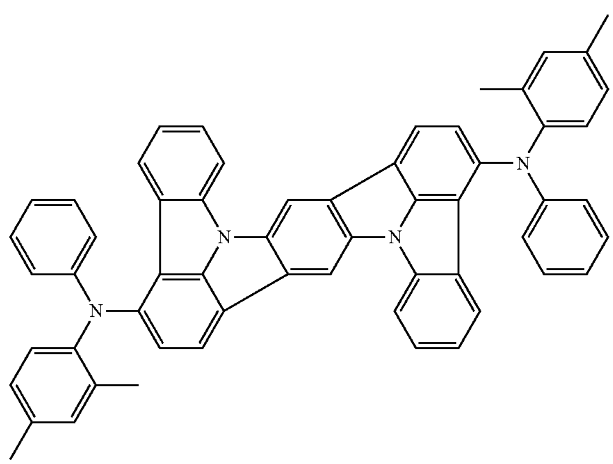

-continued
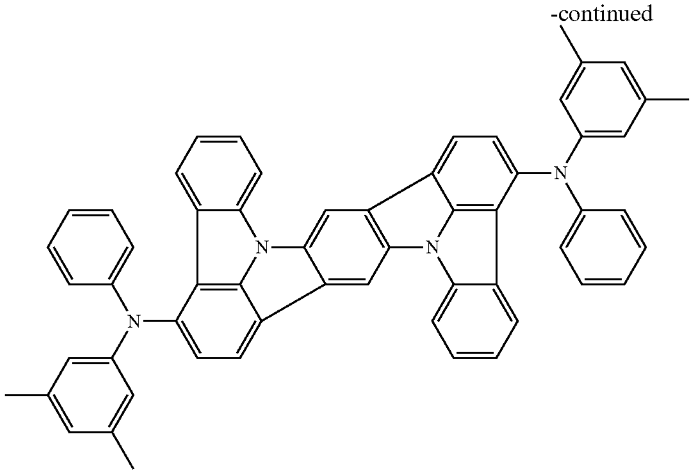
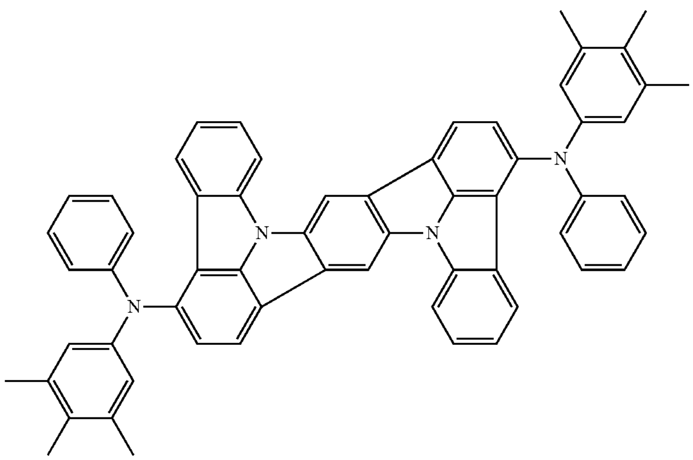
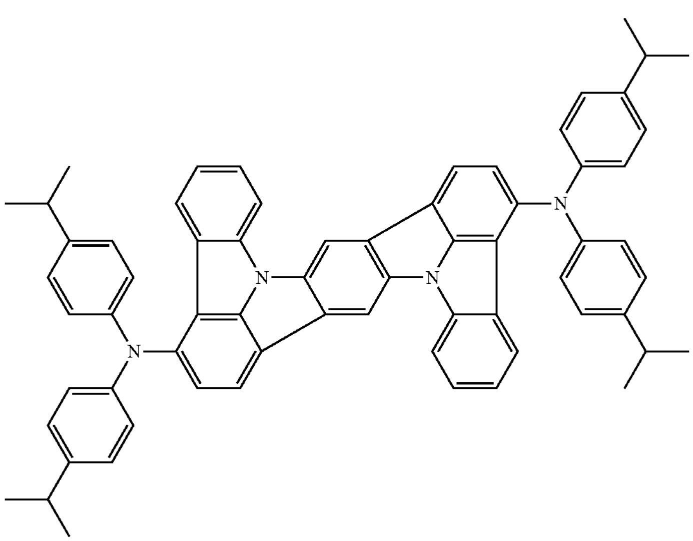

-continued
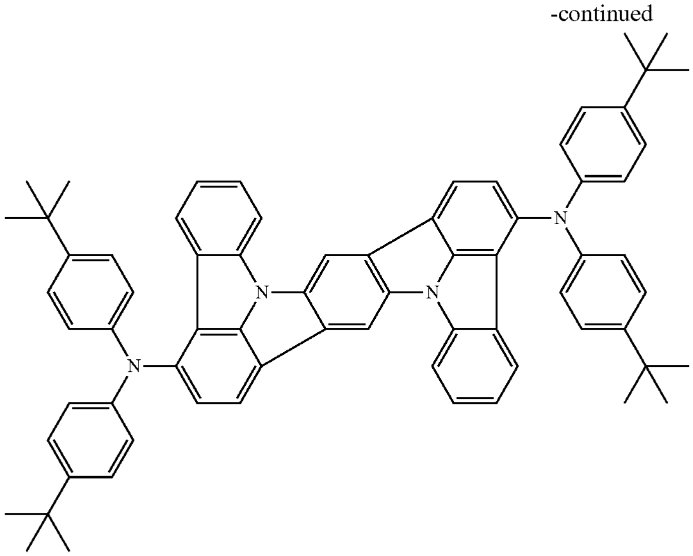
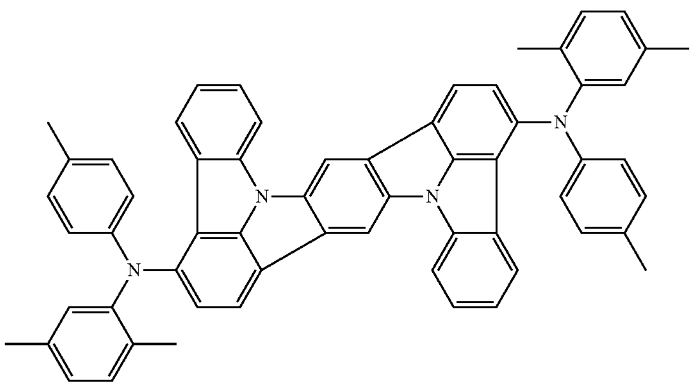
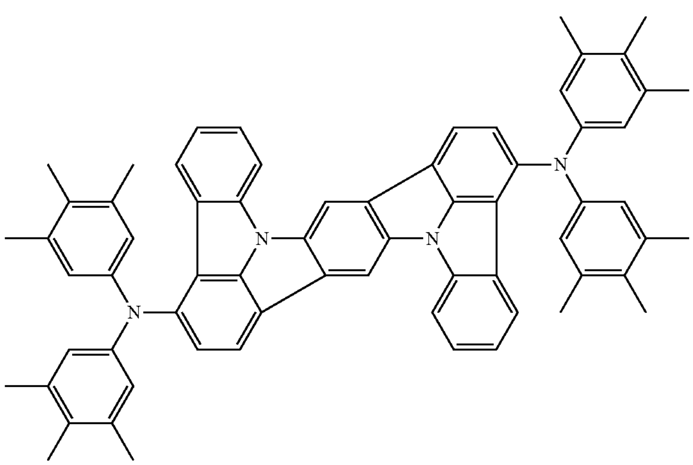

-continued
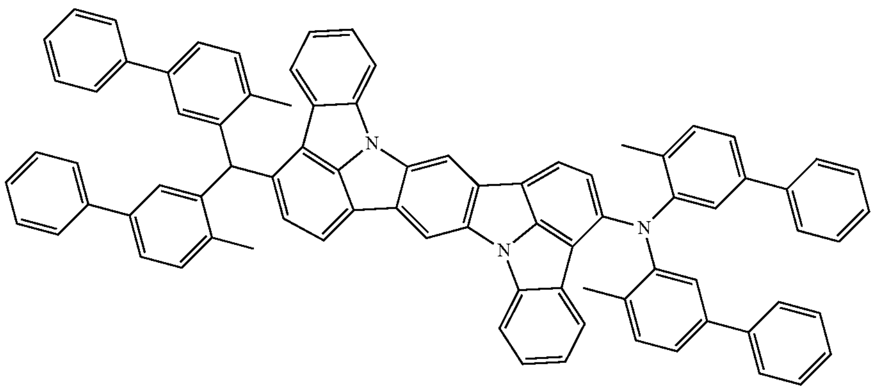
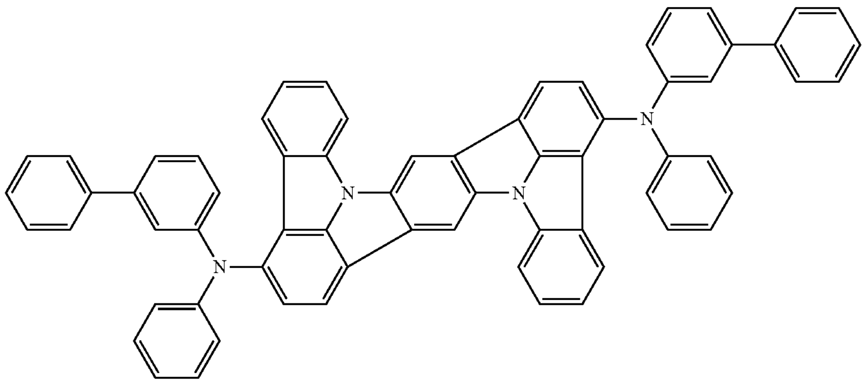
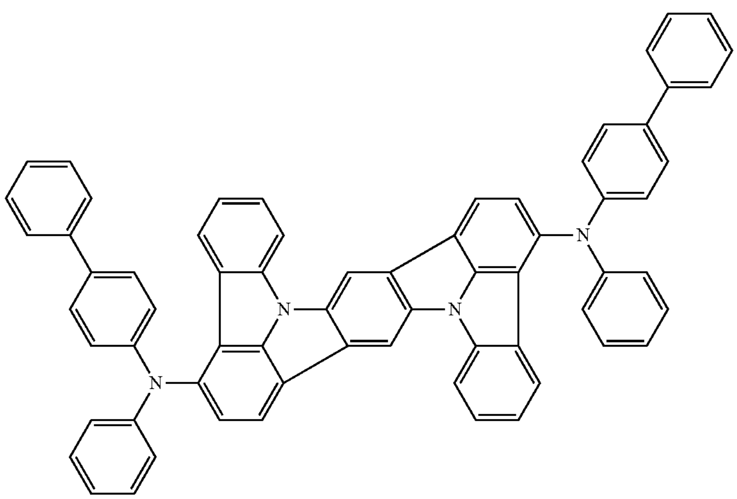
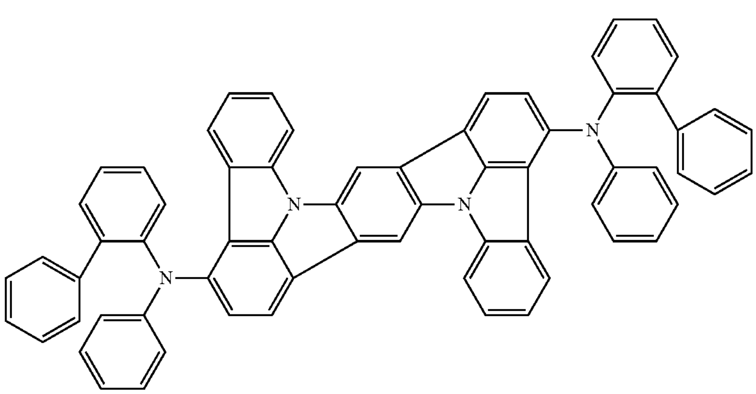

-continued
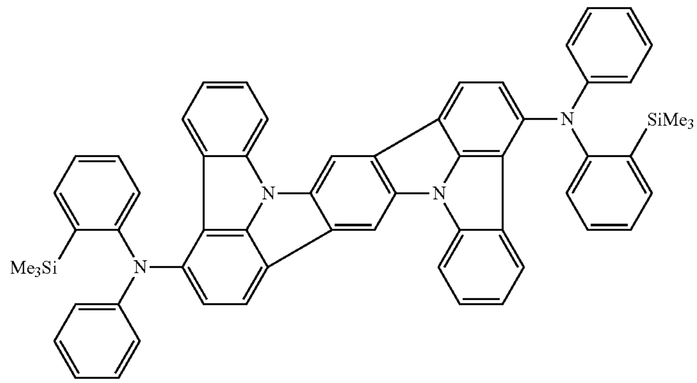
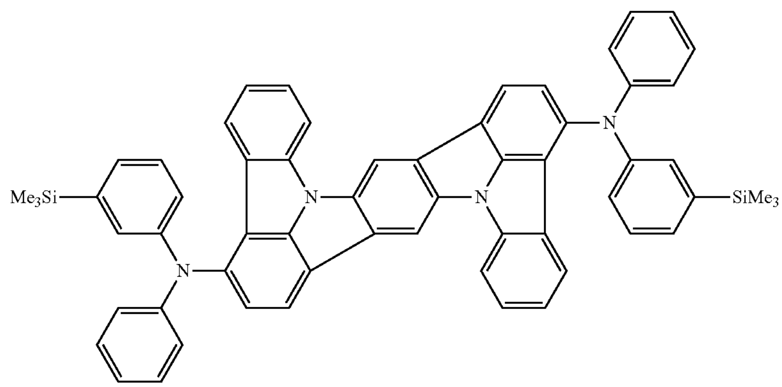
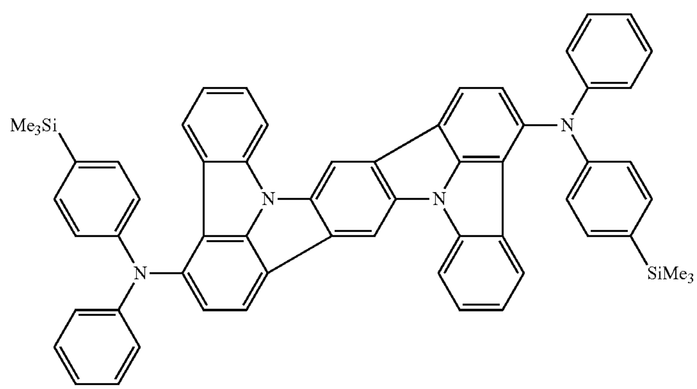
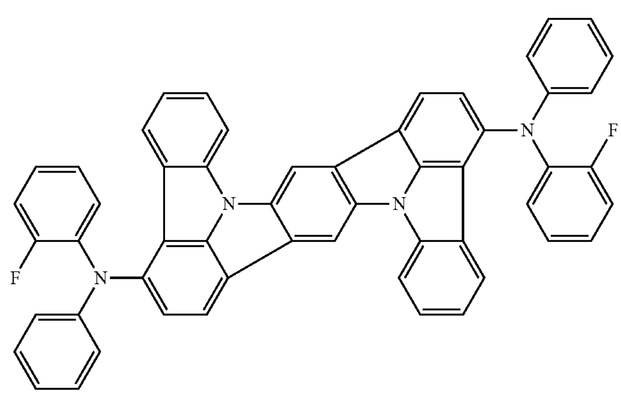

-continued
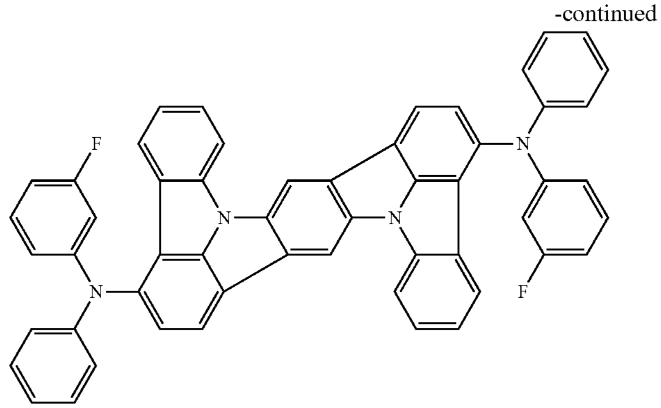
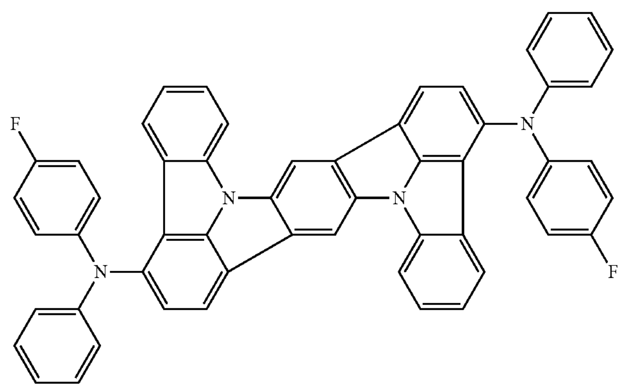
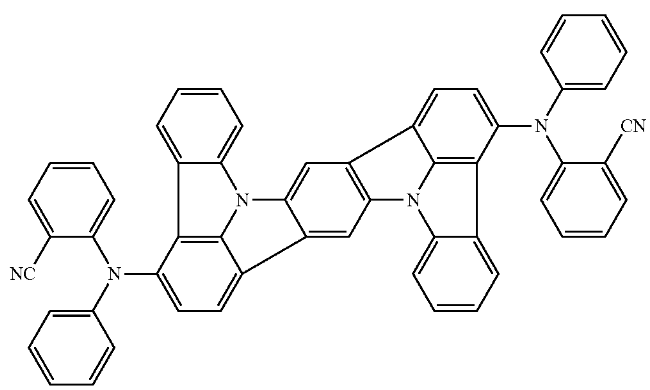
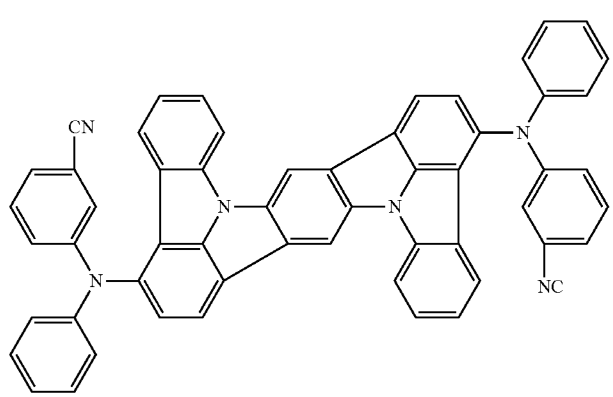

-continued
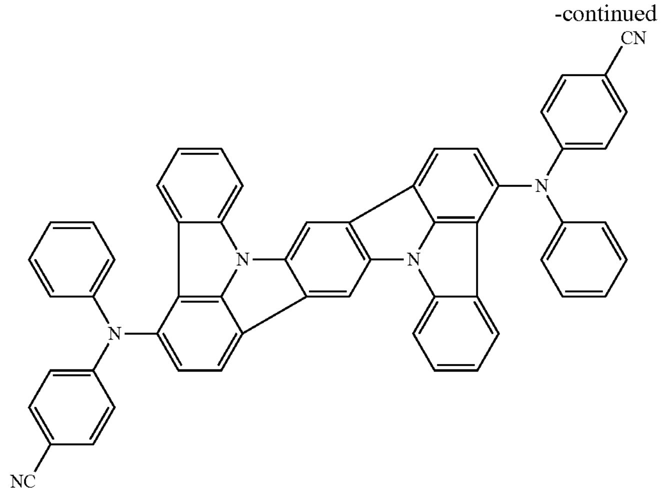
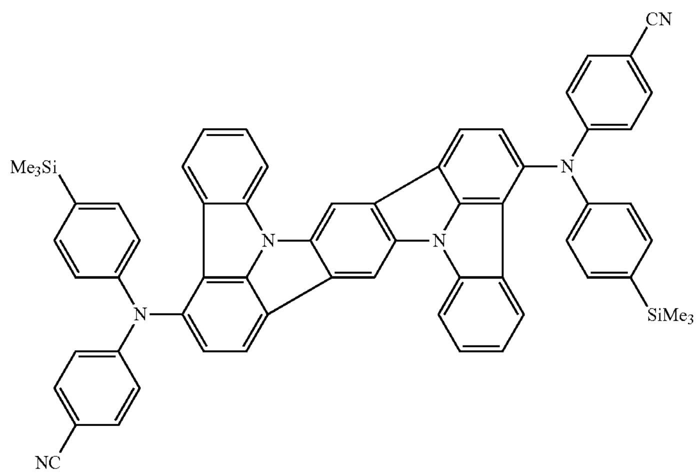
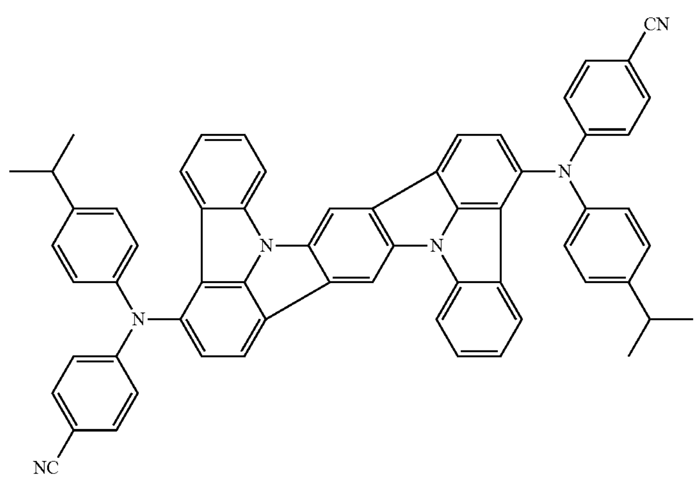

-continued
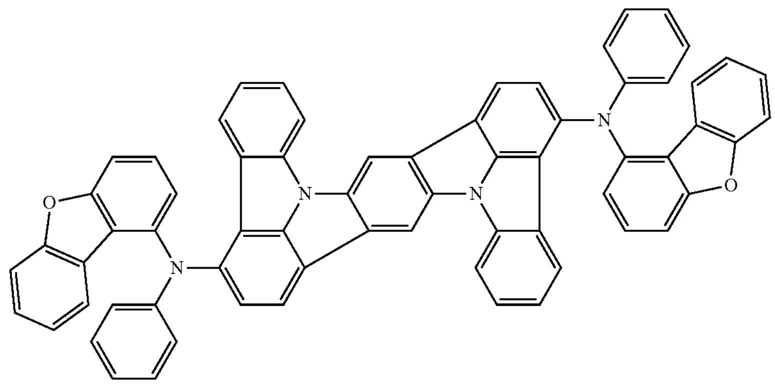
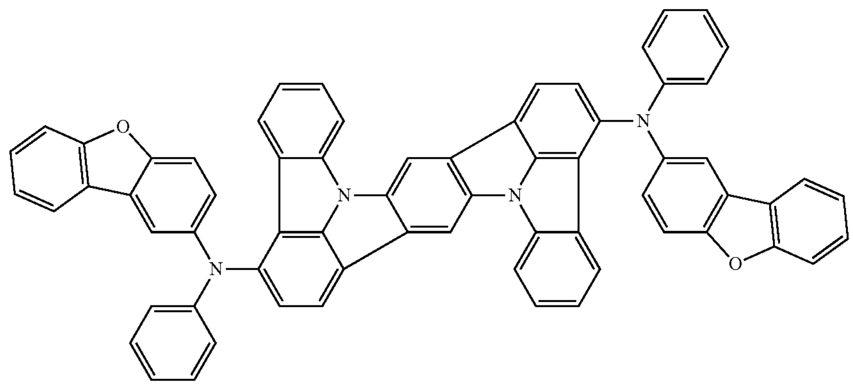
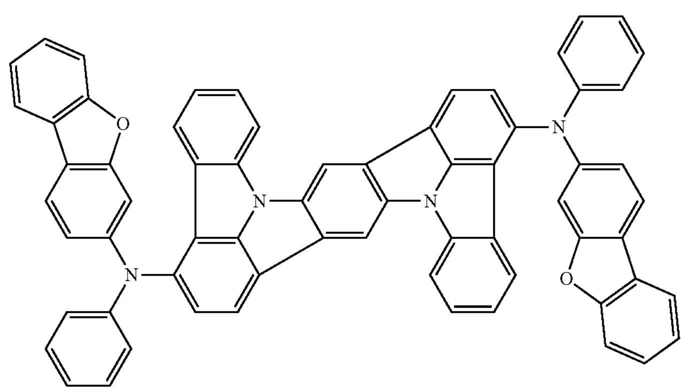
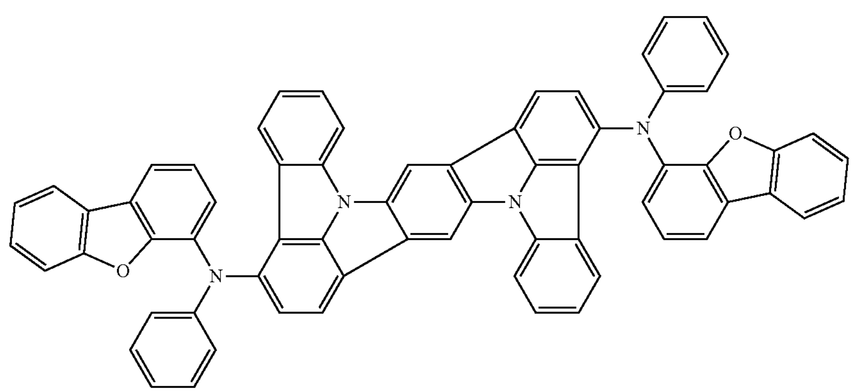

-continued
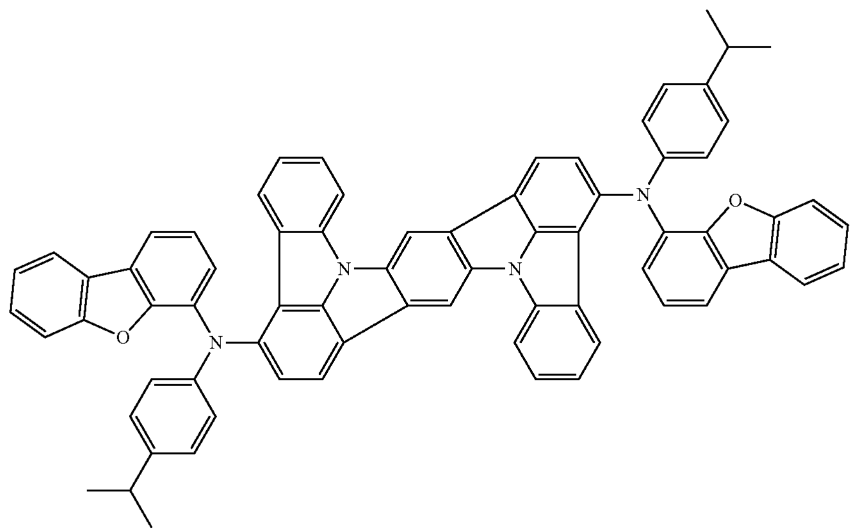
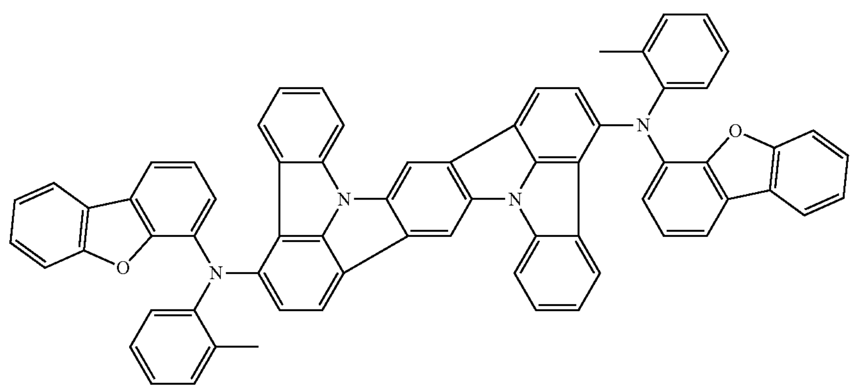
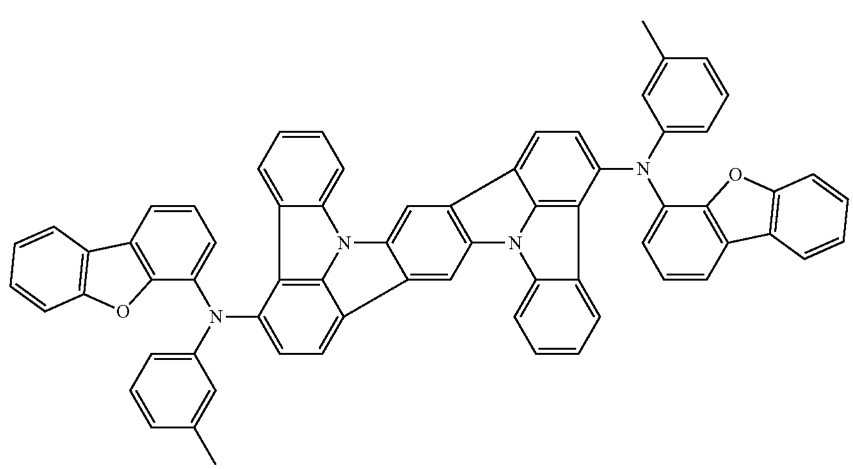

-continued
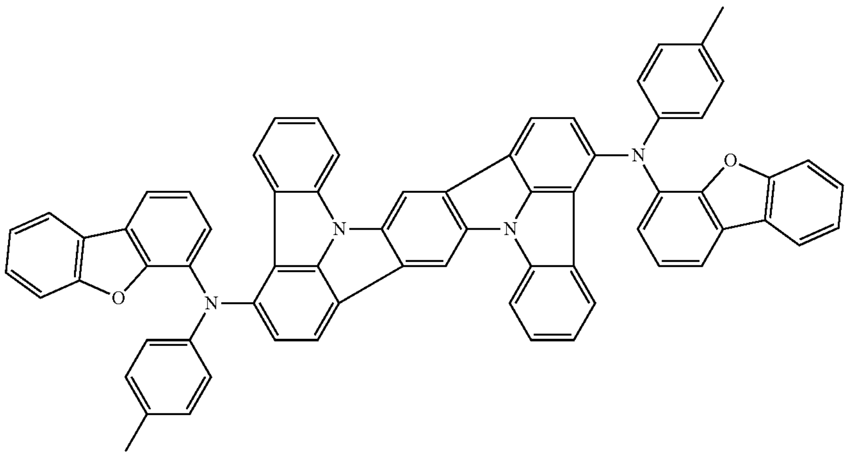
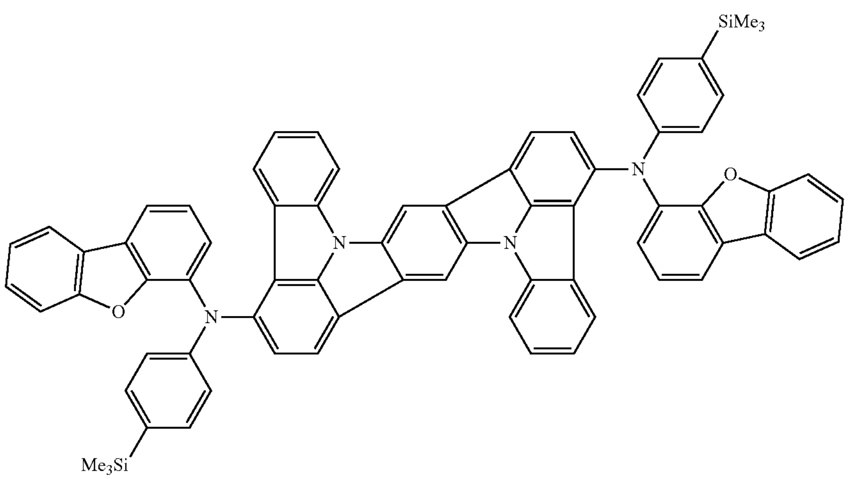
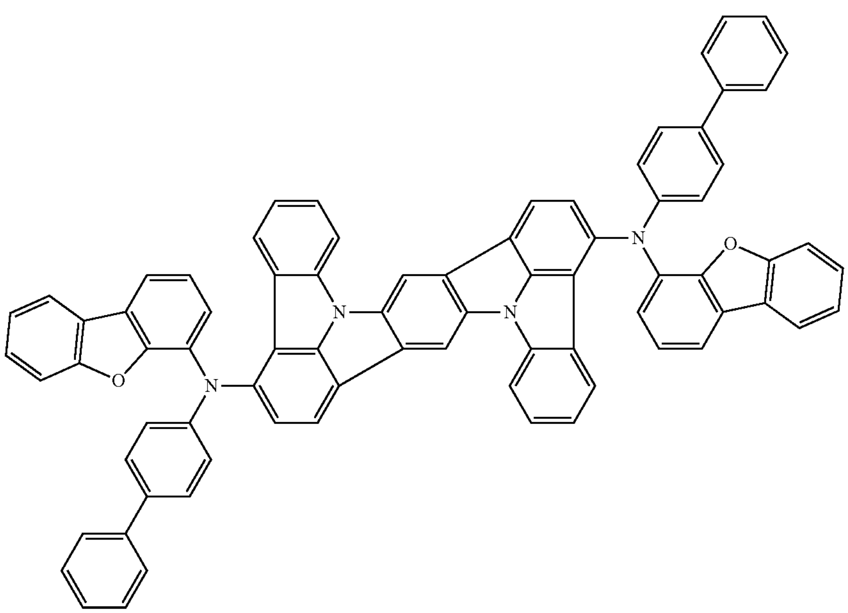

-continued
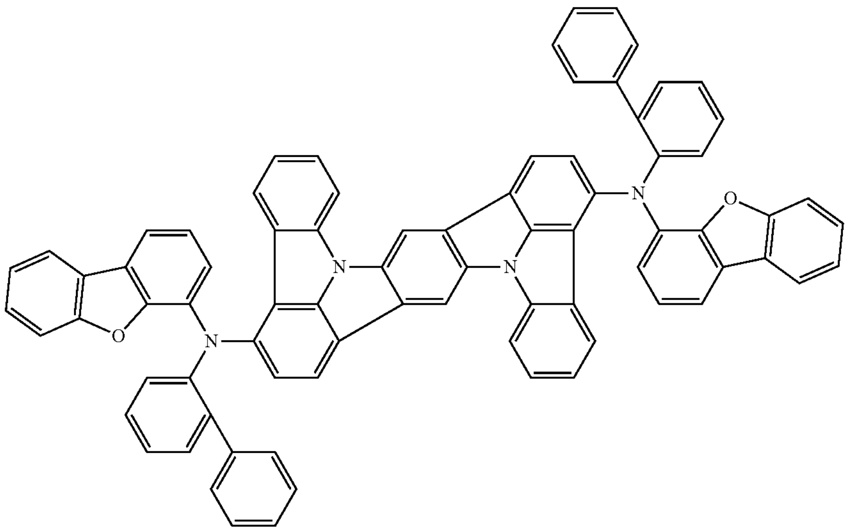
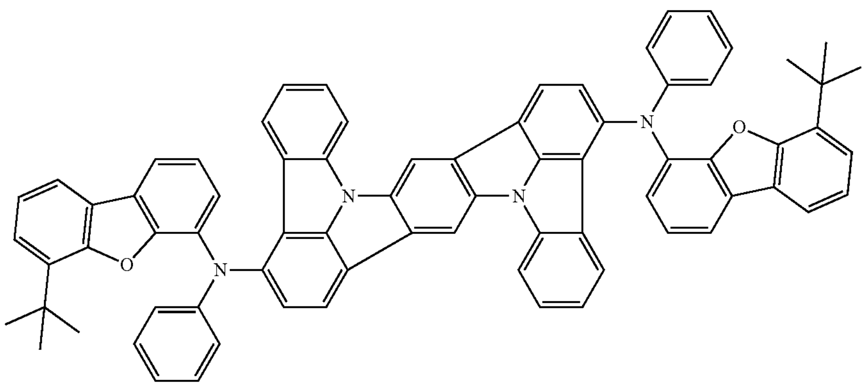
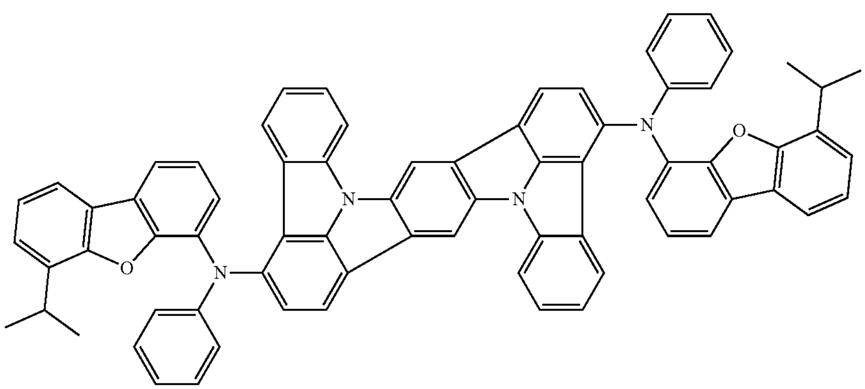
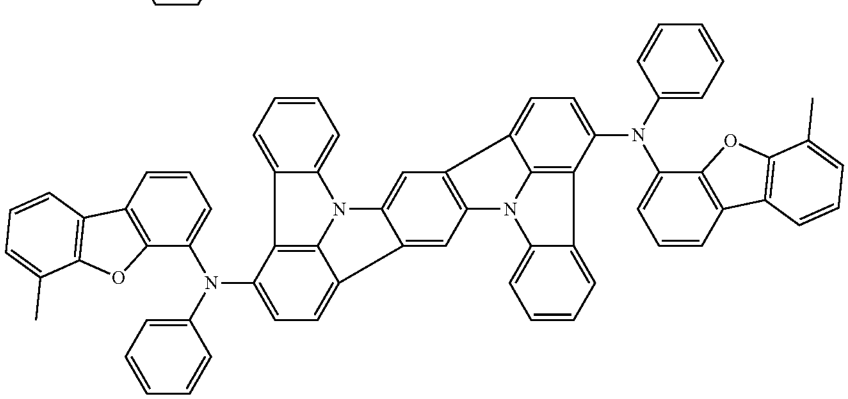

-continued
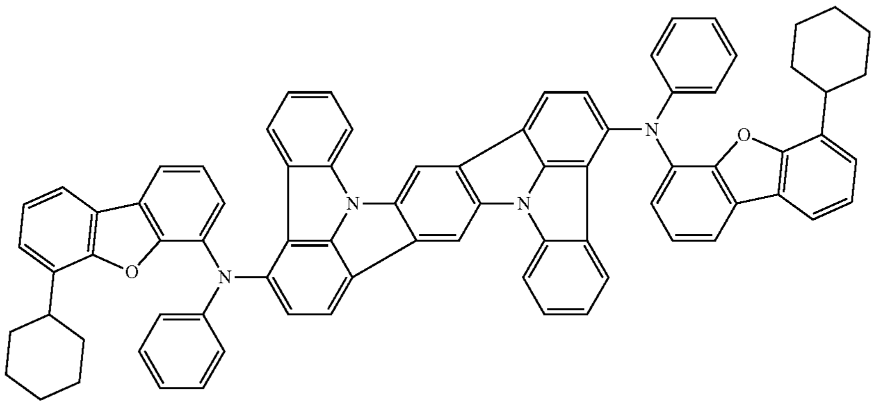
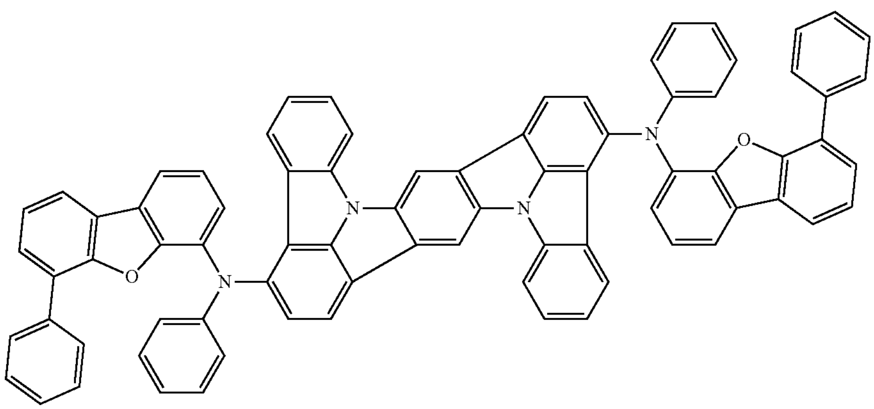
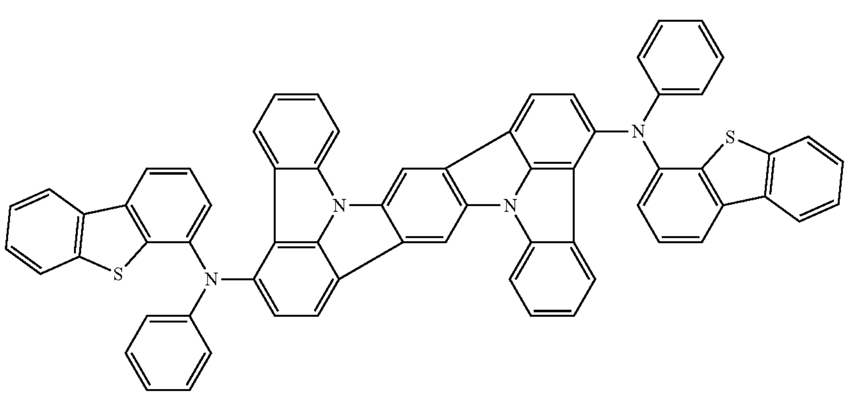

-continued
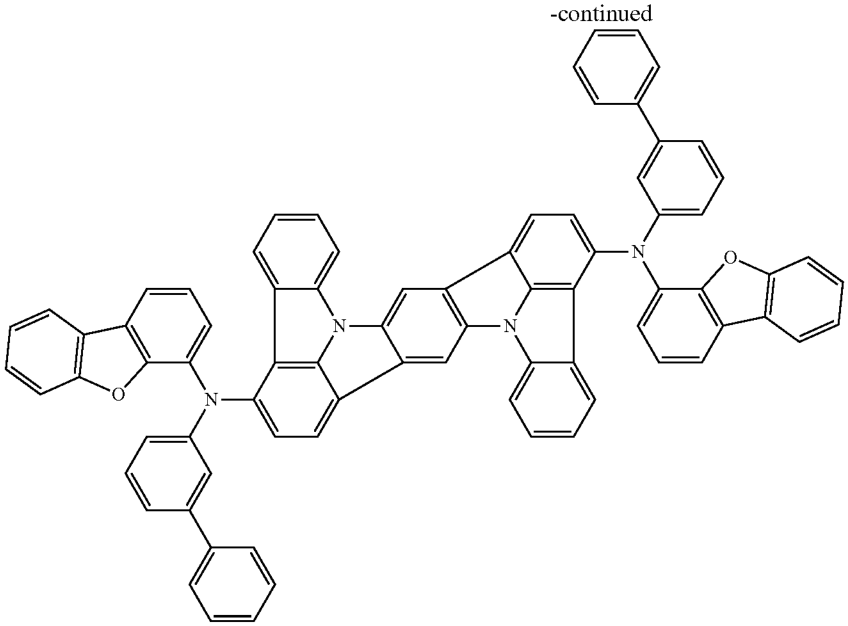
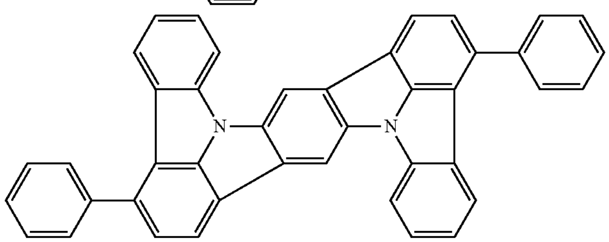
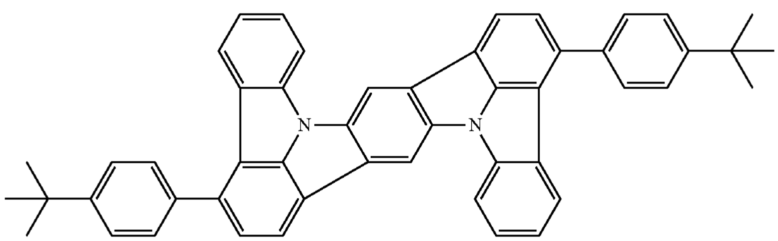
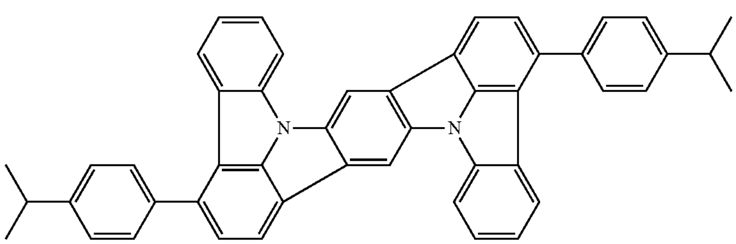
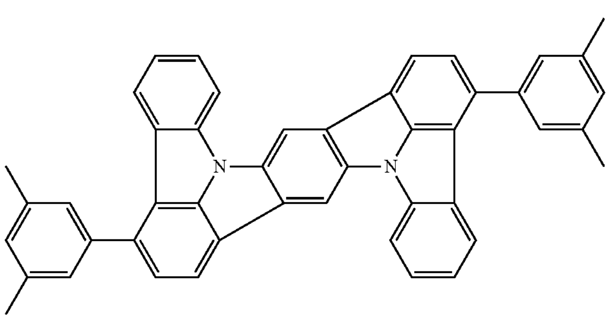

-continued
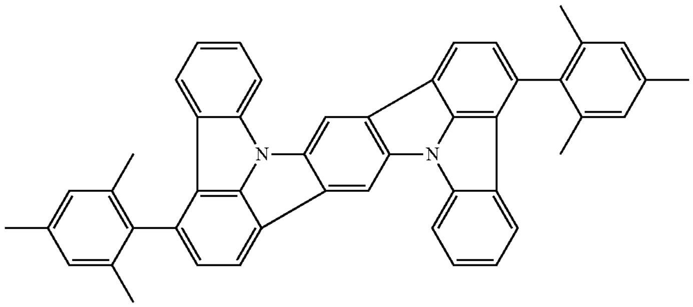
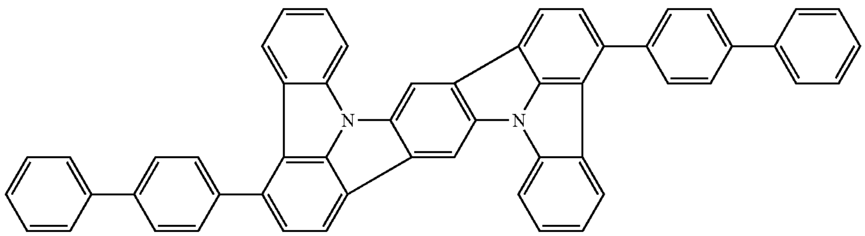
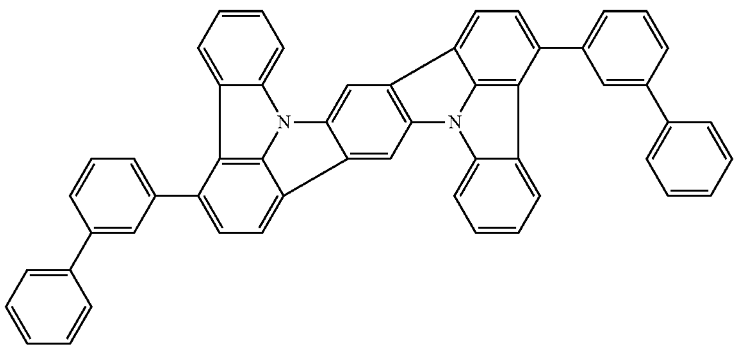
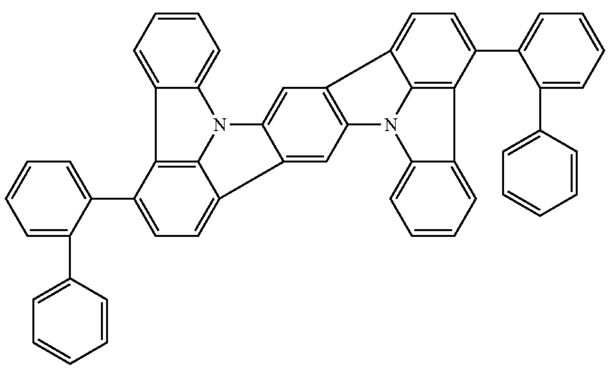
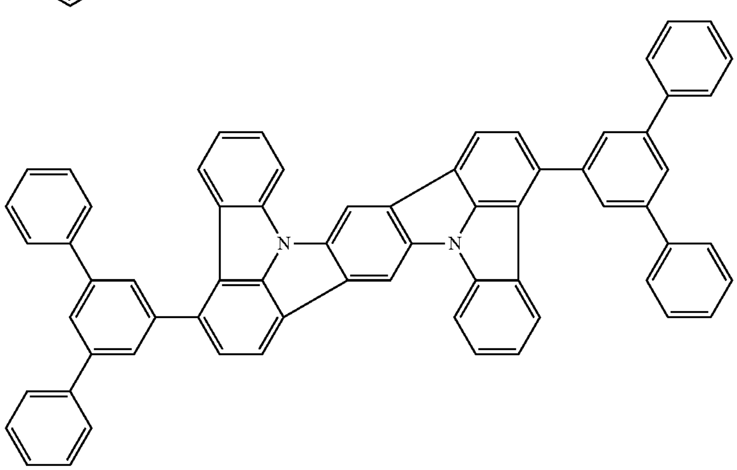

-continued
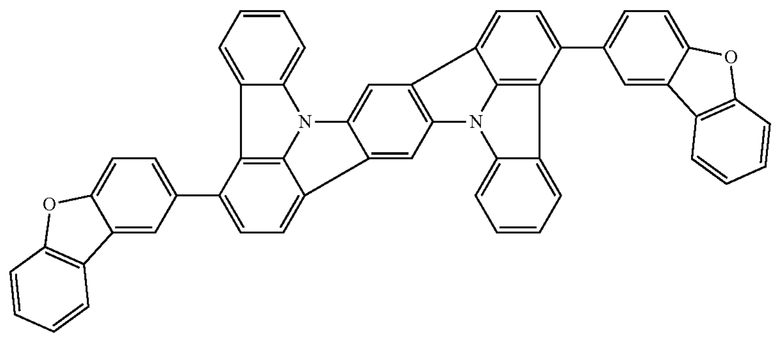
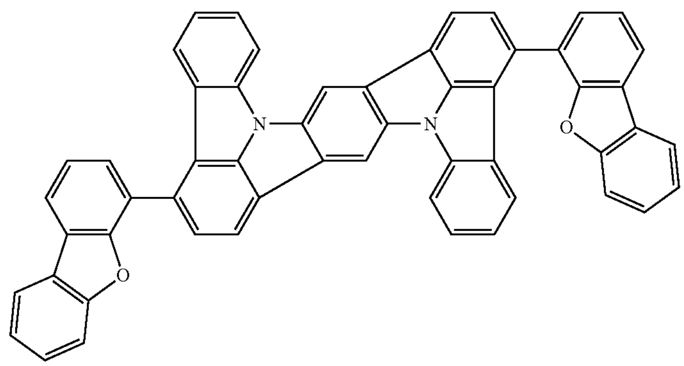
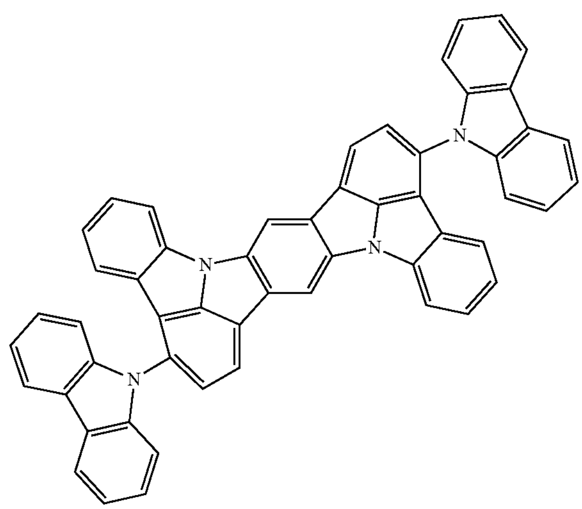
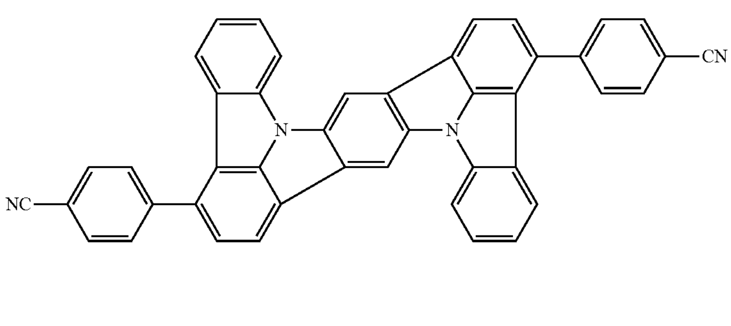

-continued
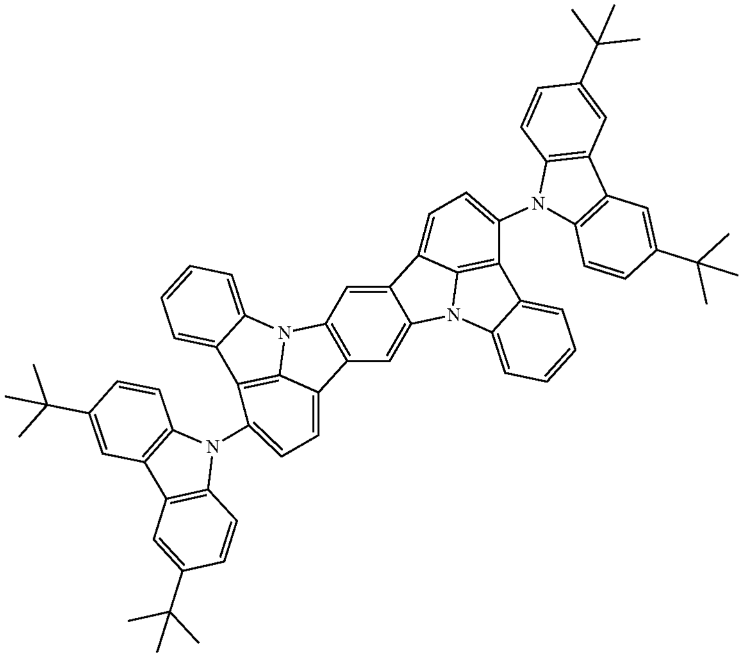
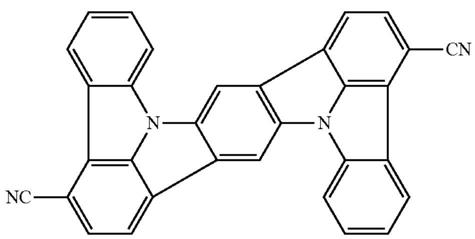
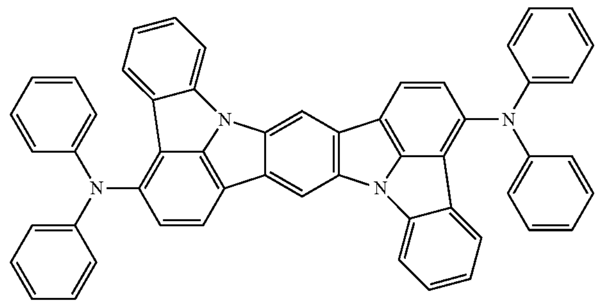
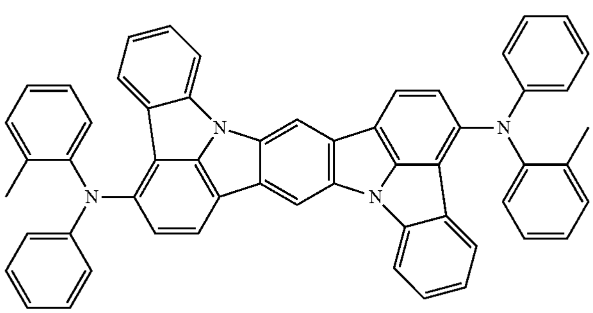
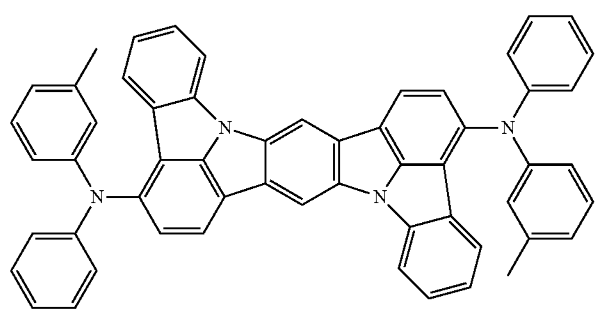
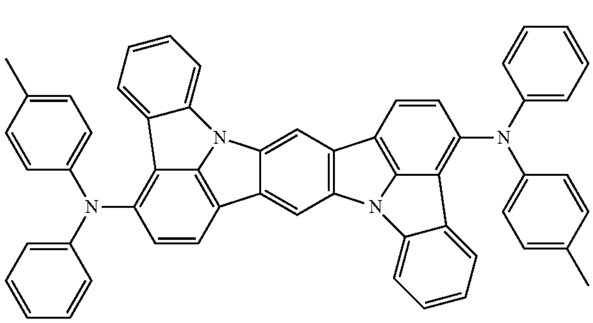
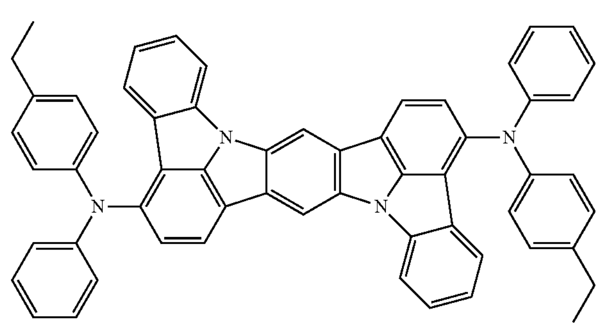

-continued
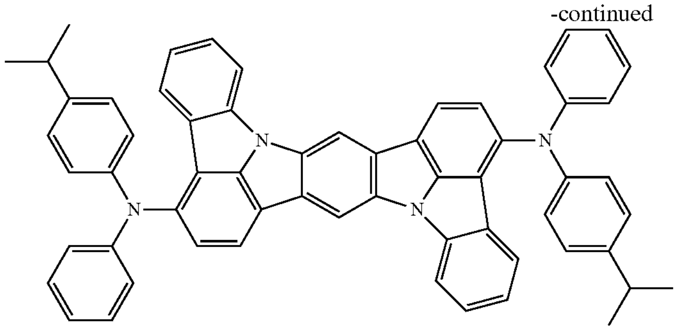
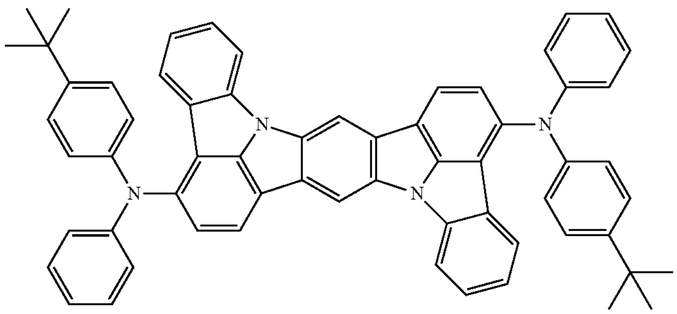
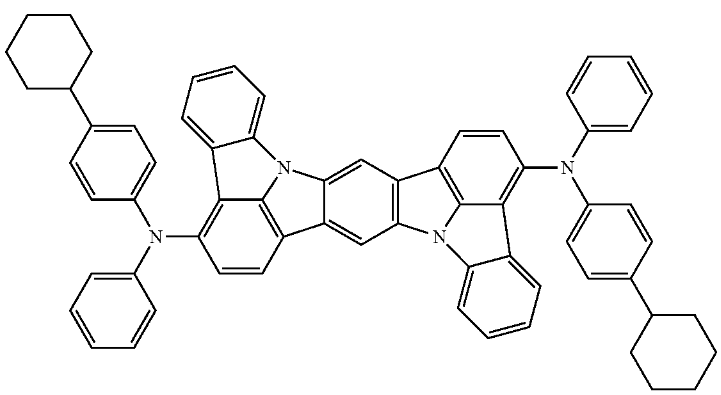
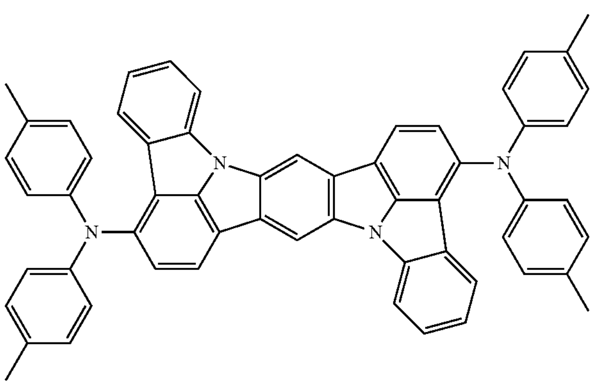

-continued
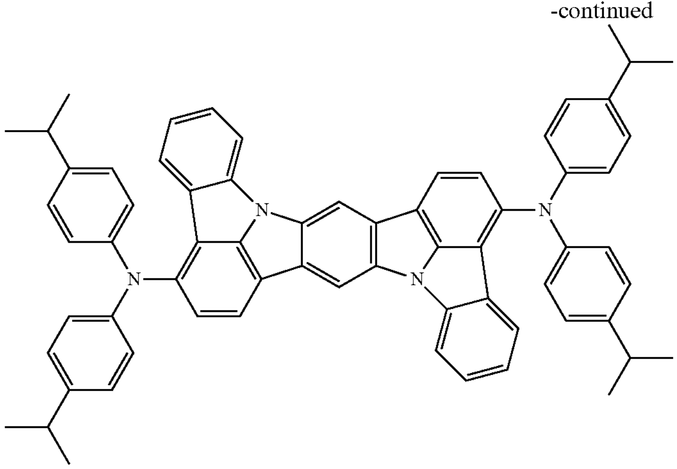
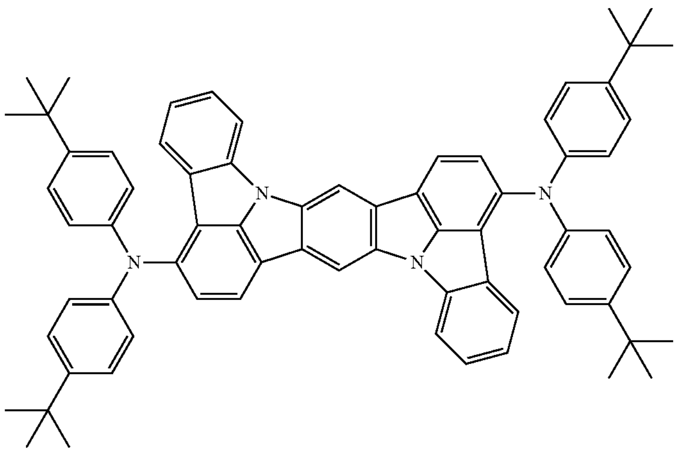
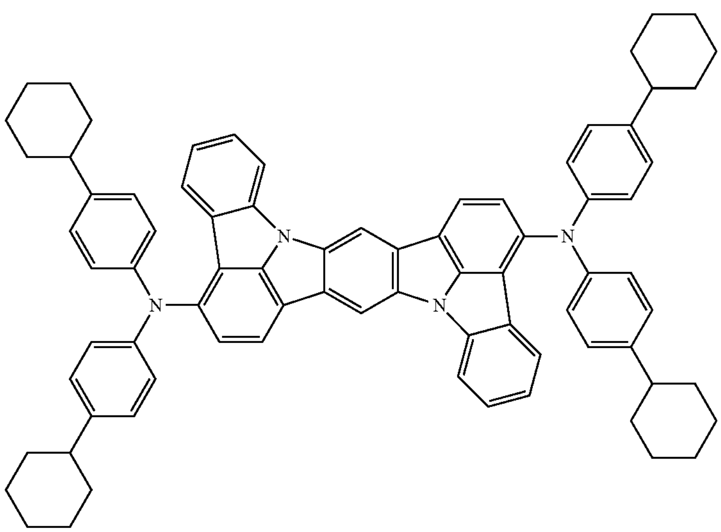
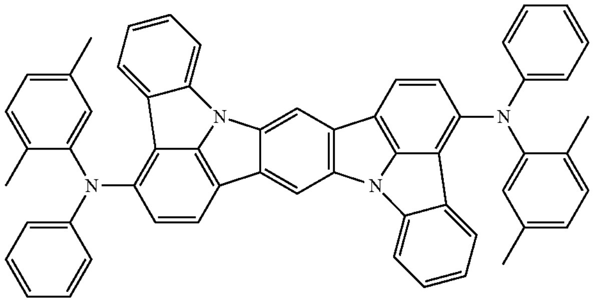
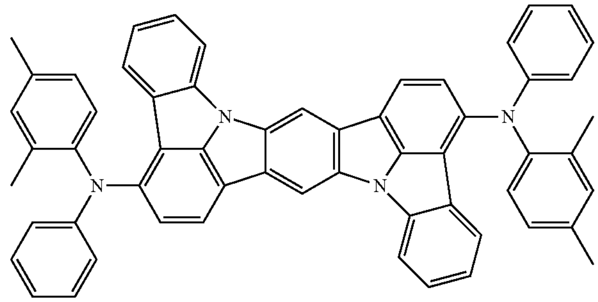

-continued
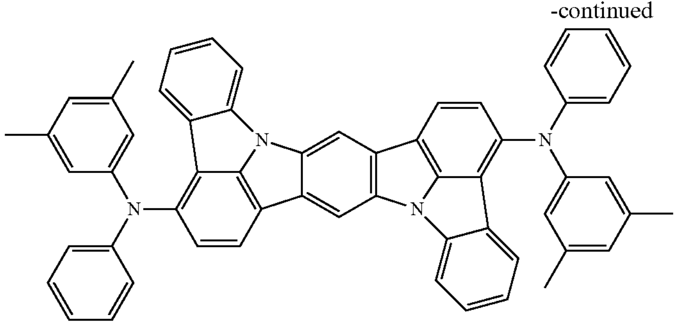
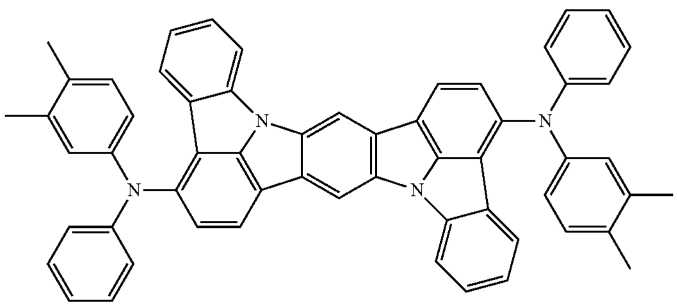
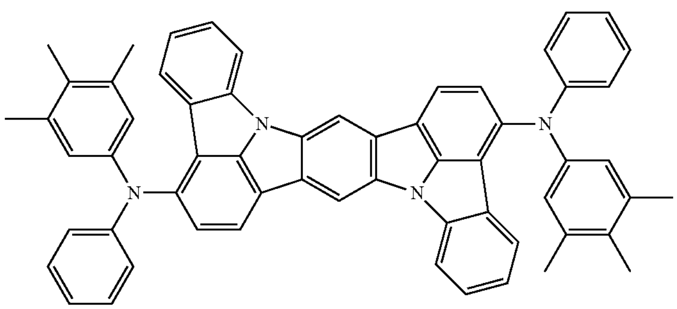
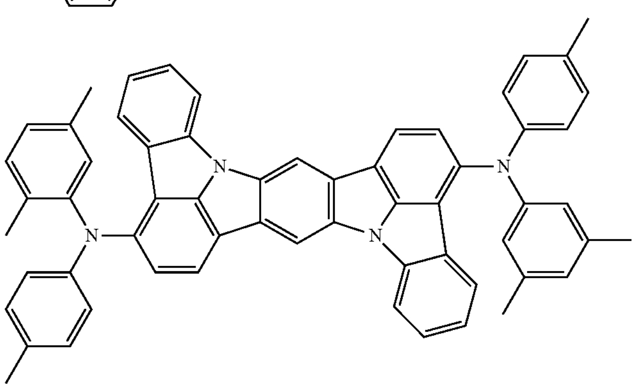
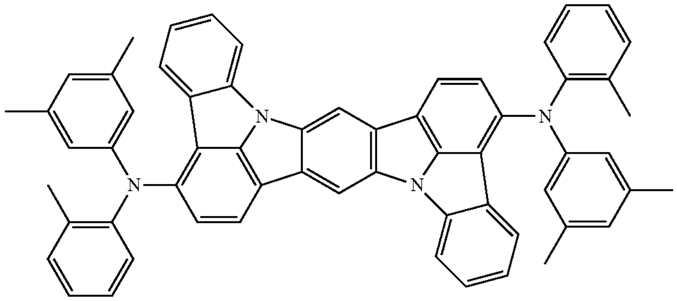

-continued
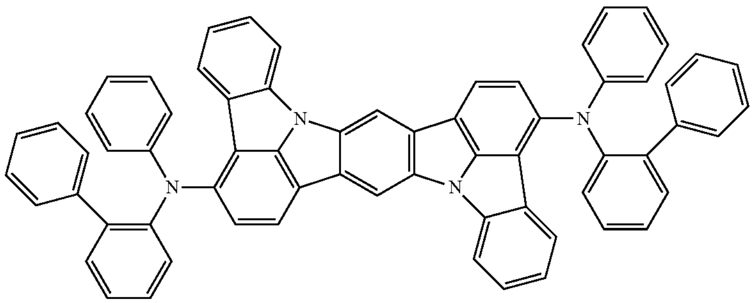
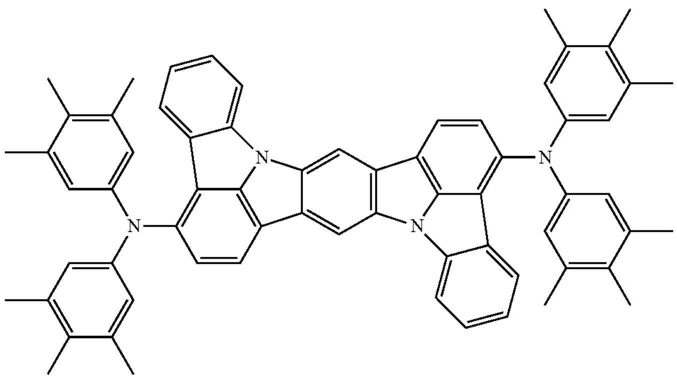
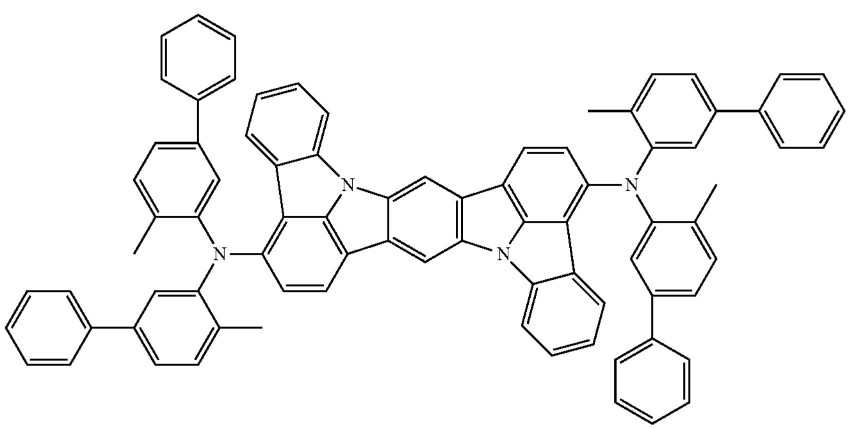
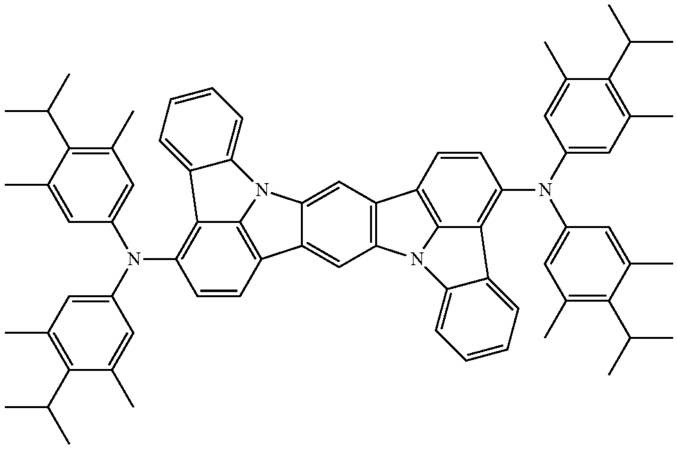

-continued
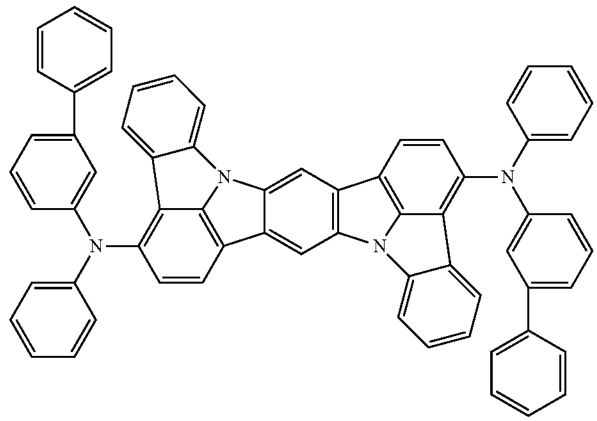
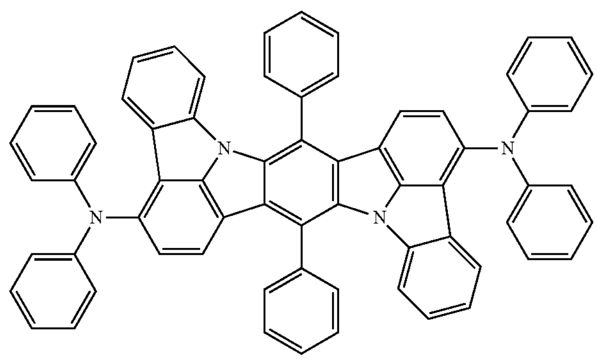
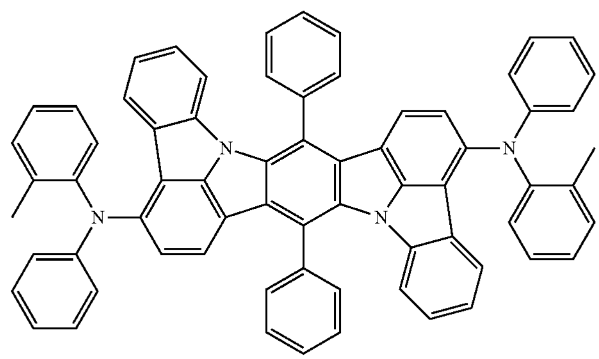
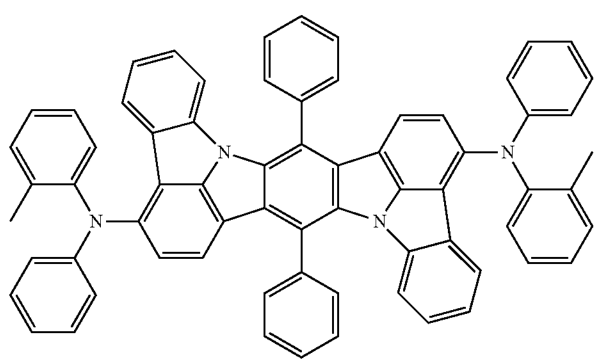
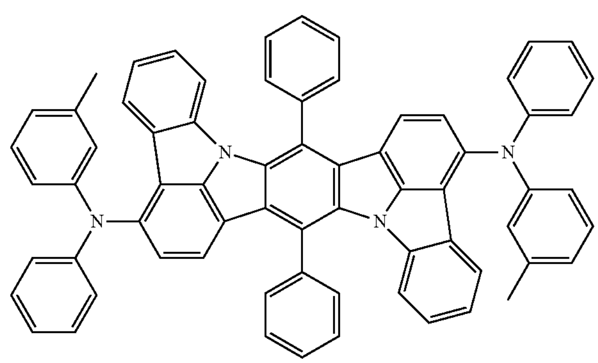
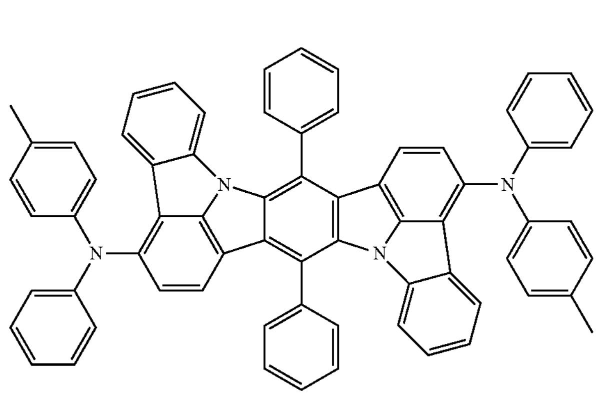
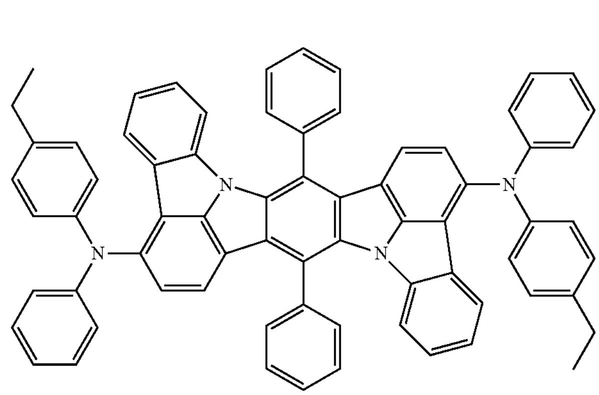

-continued
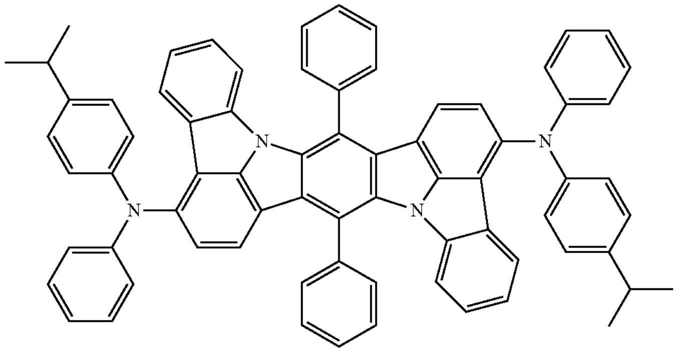
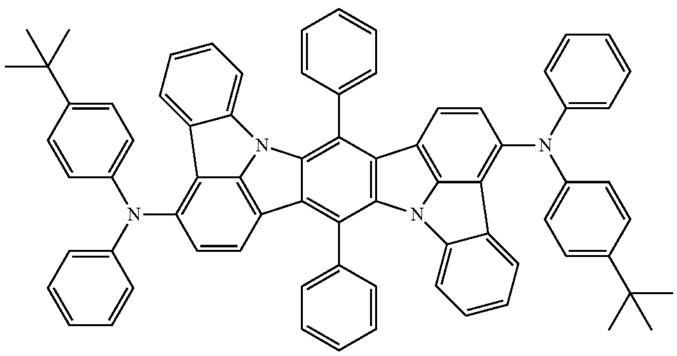
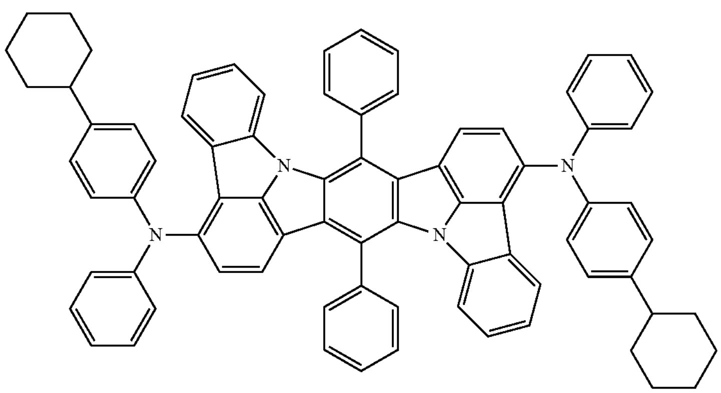
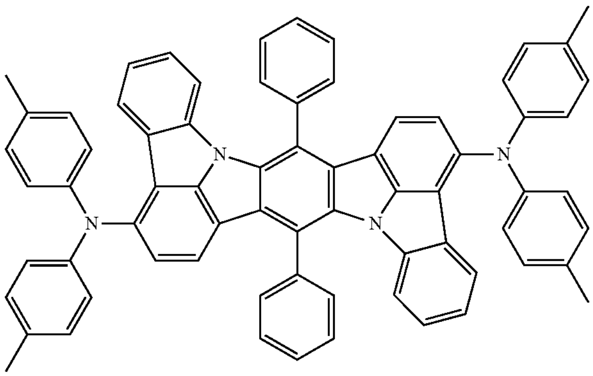

-continued
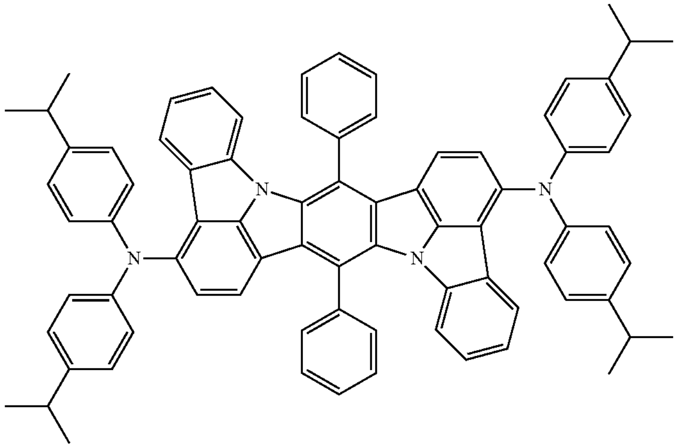
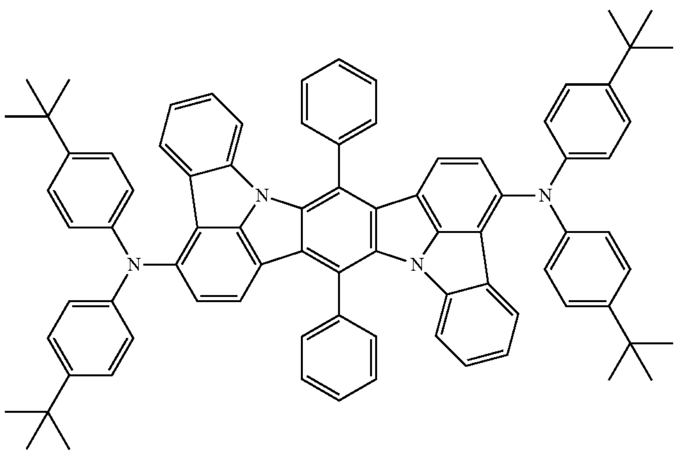
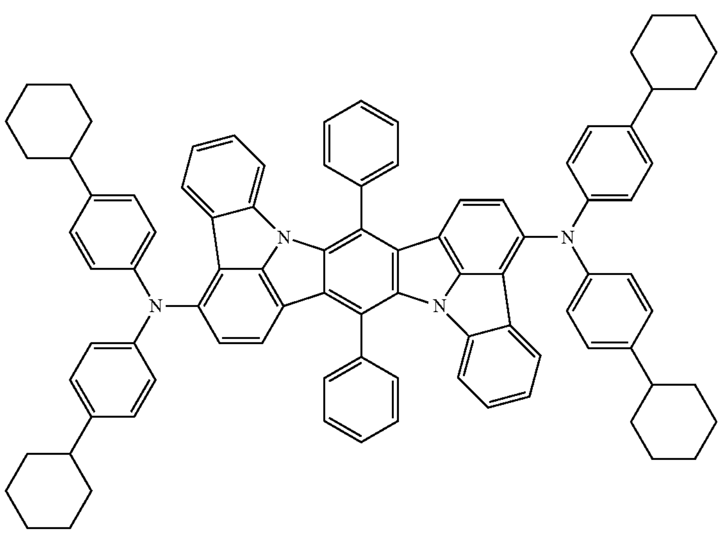

-continued
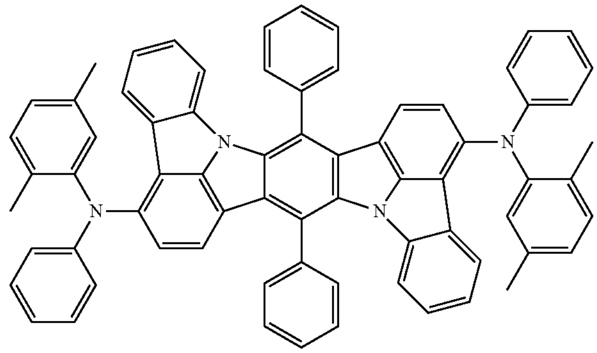
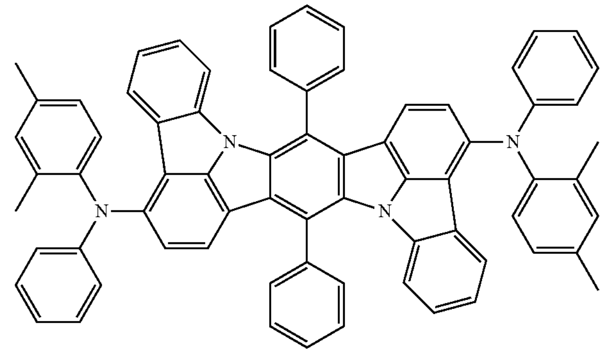
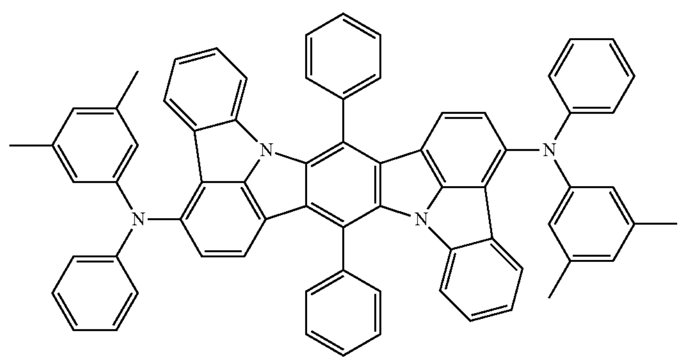
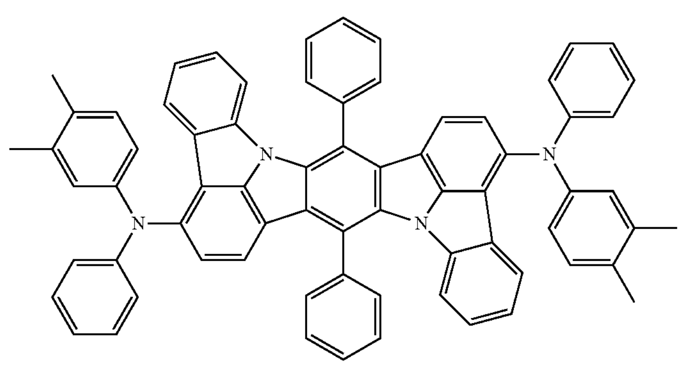
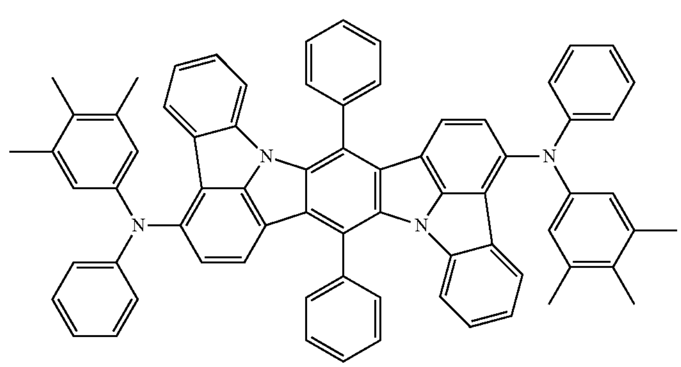

-continued
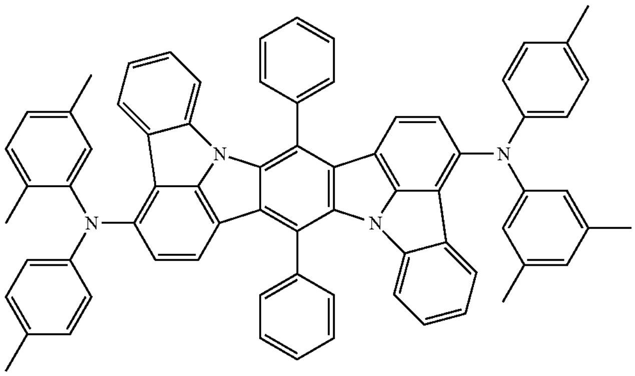
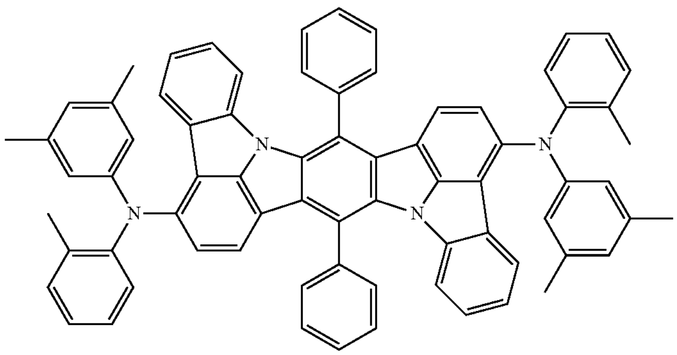
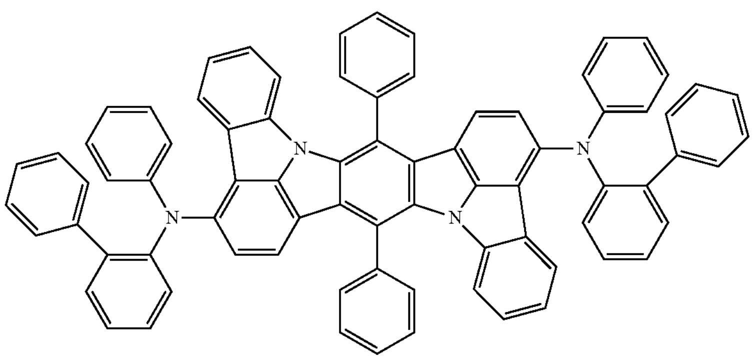
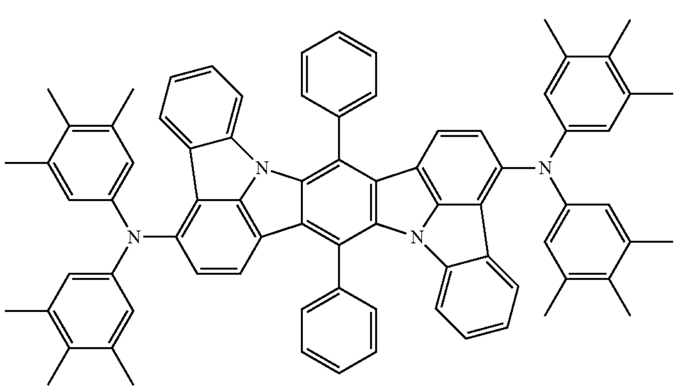

-continued
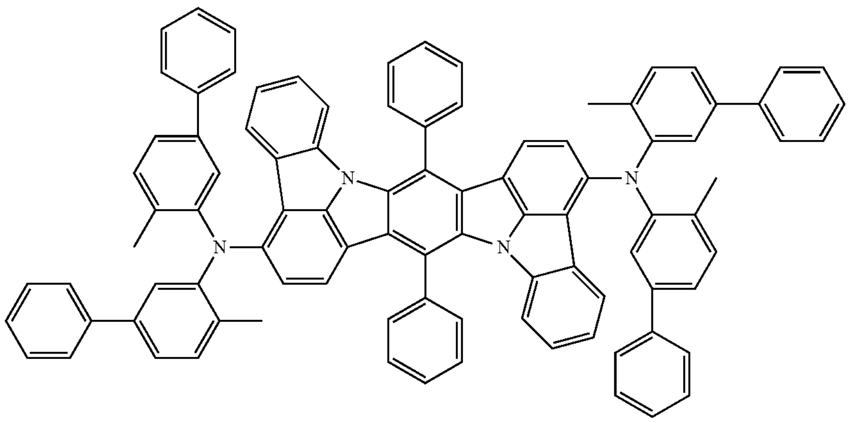
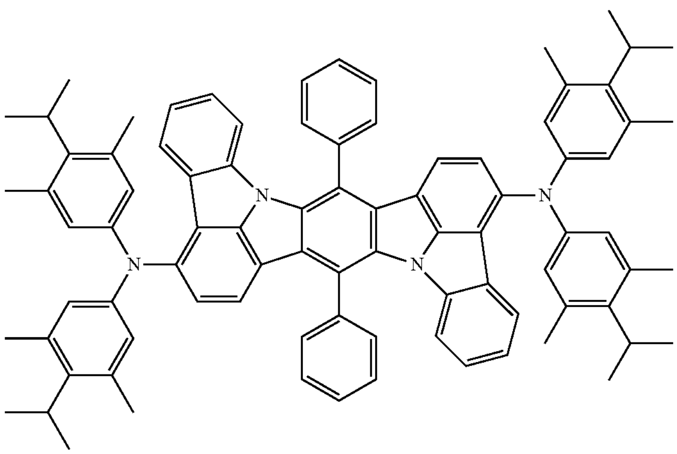
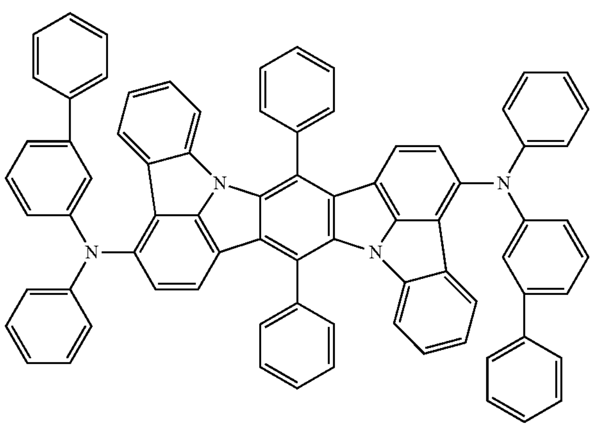
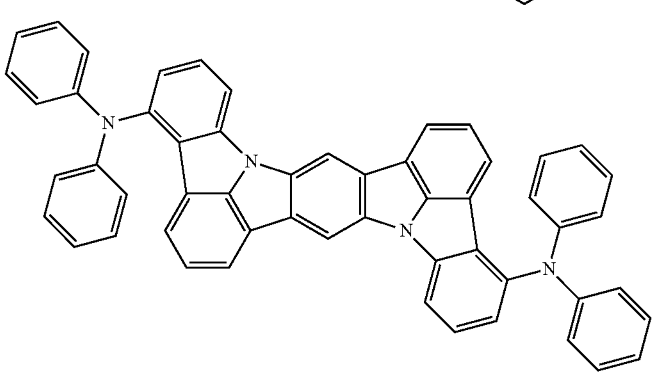

-continued
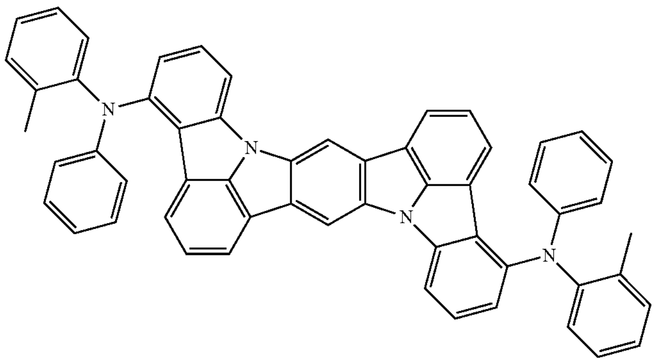
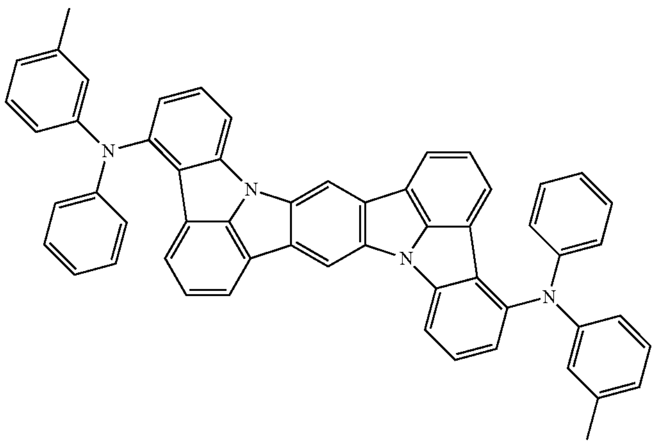
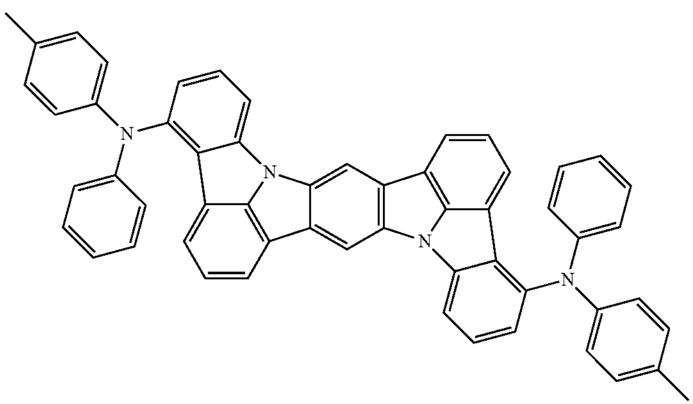
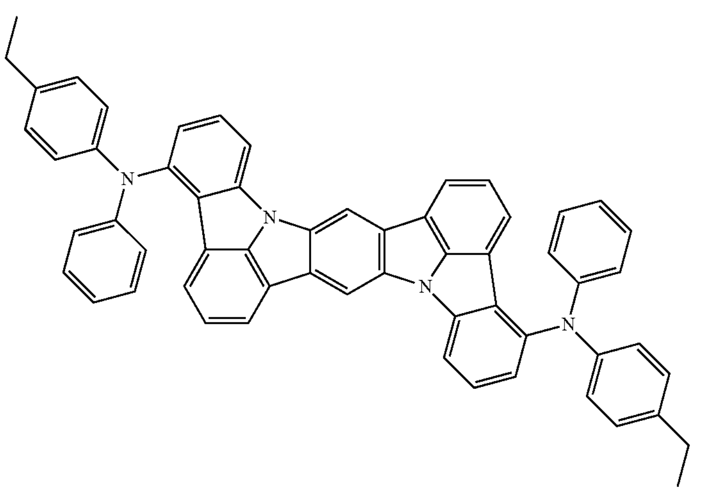

-continued
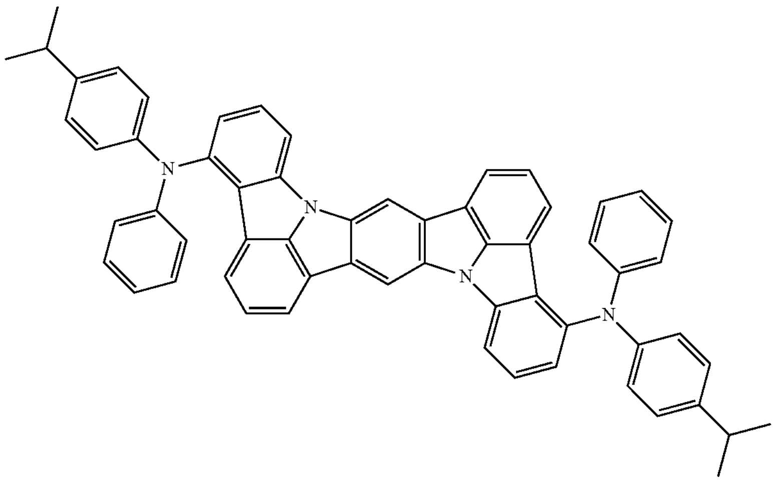
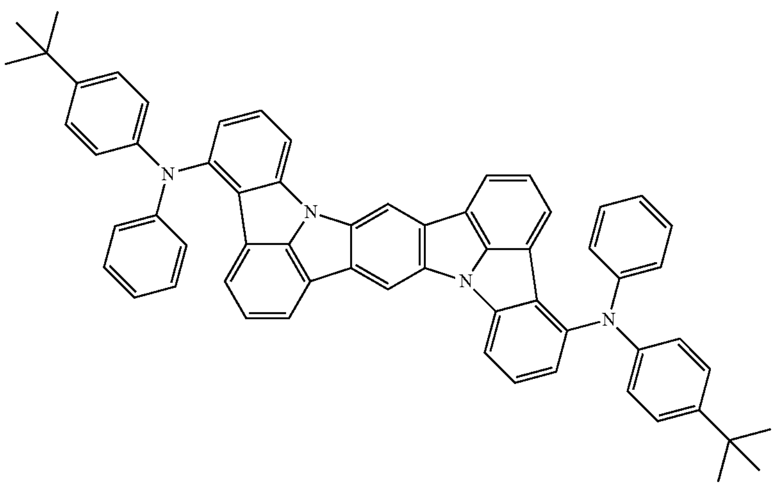
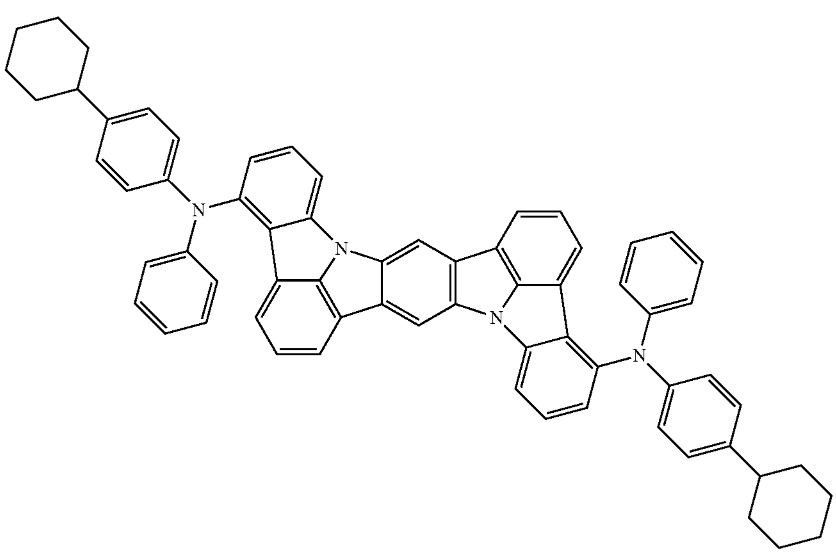

-continued
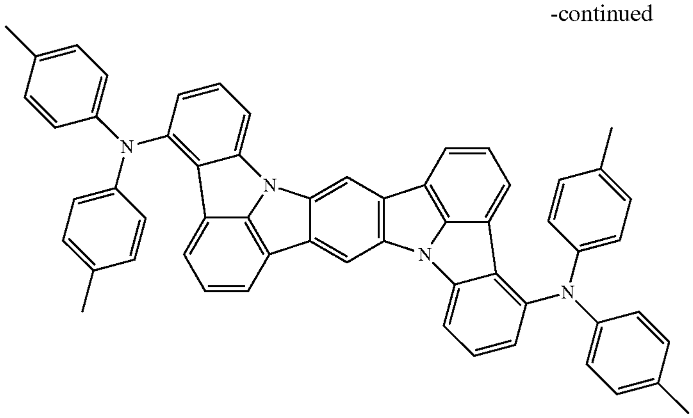
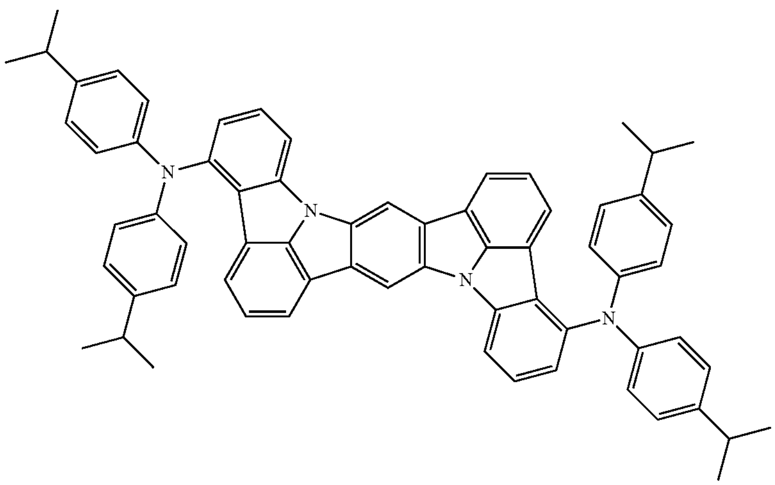
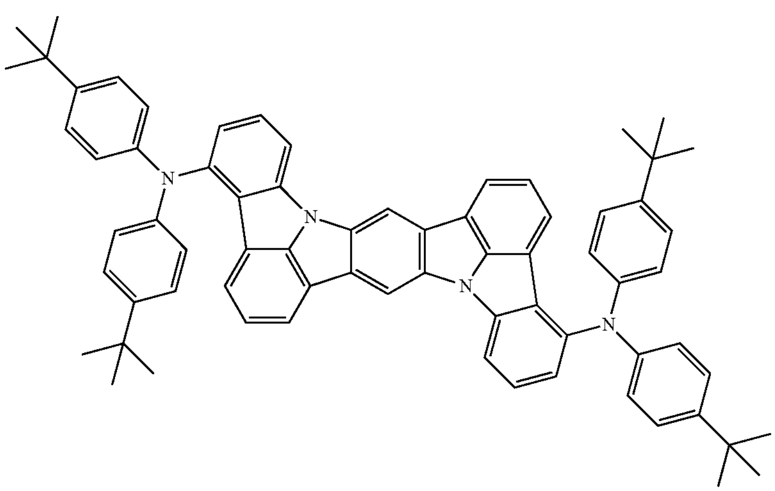

-continued
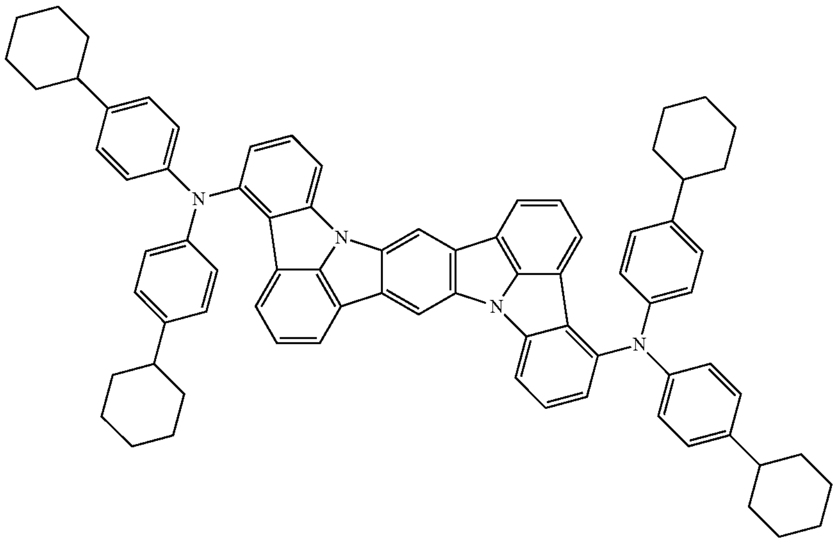
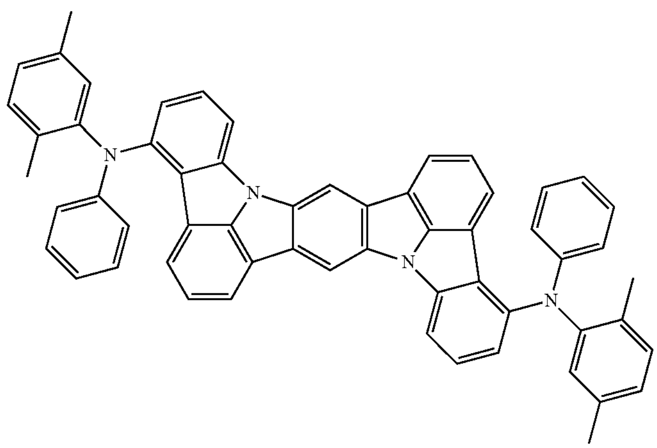
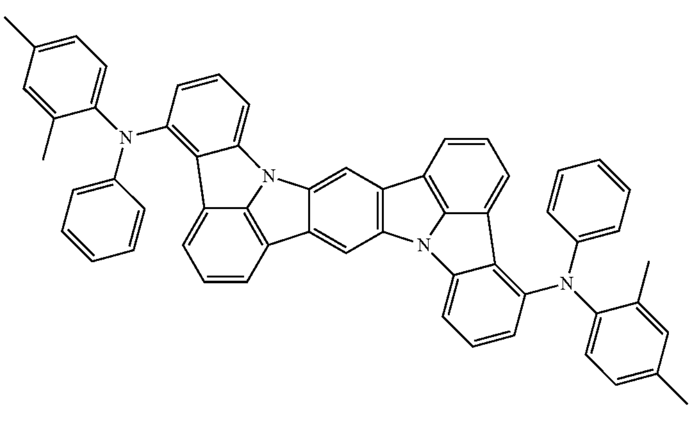

-continued
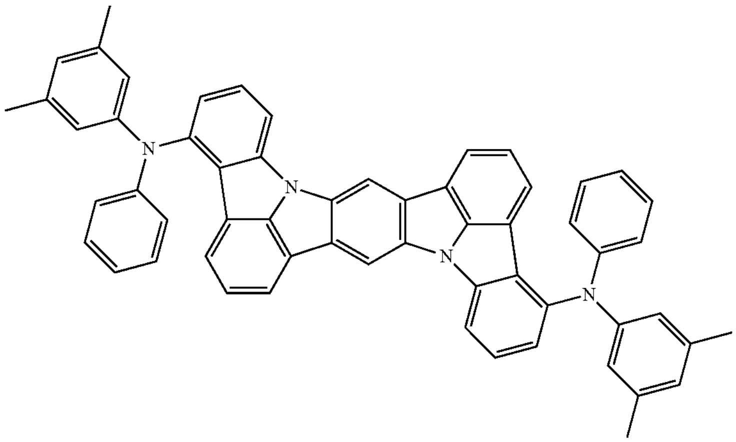
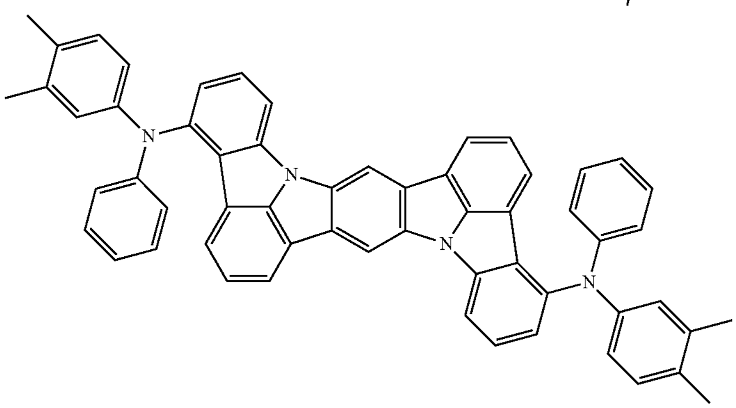
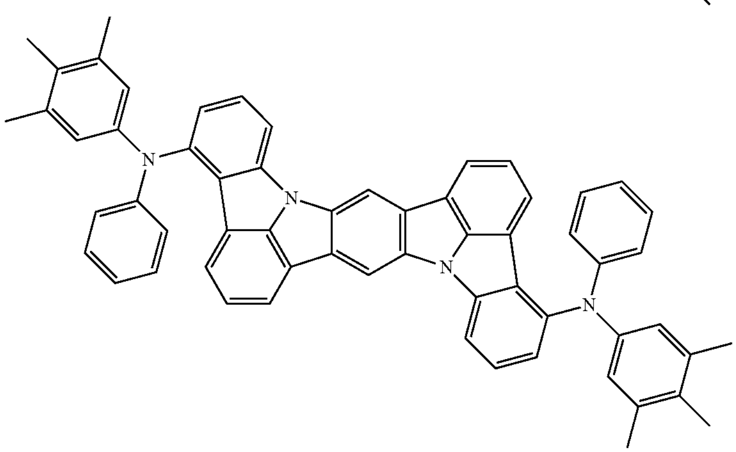
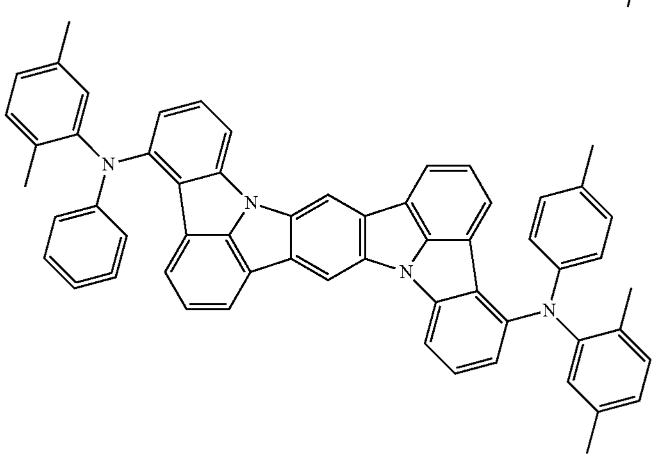

-continued
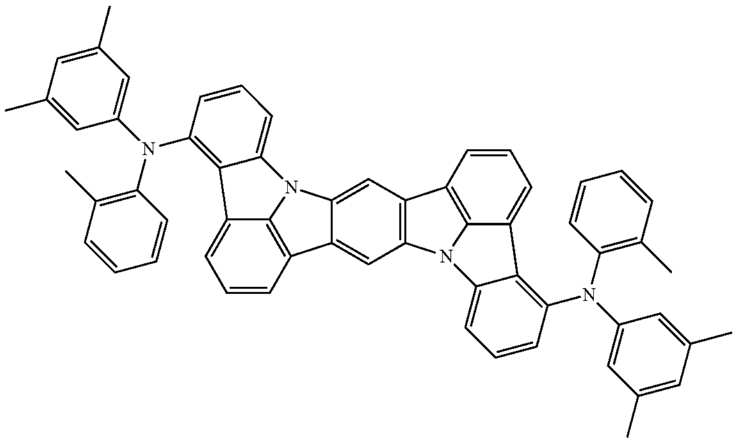
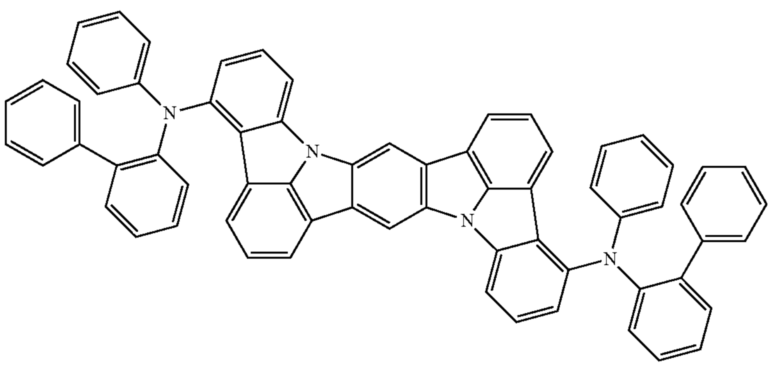
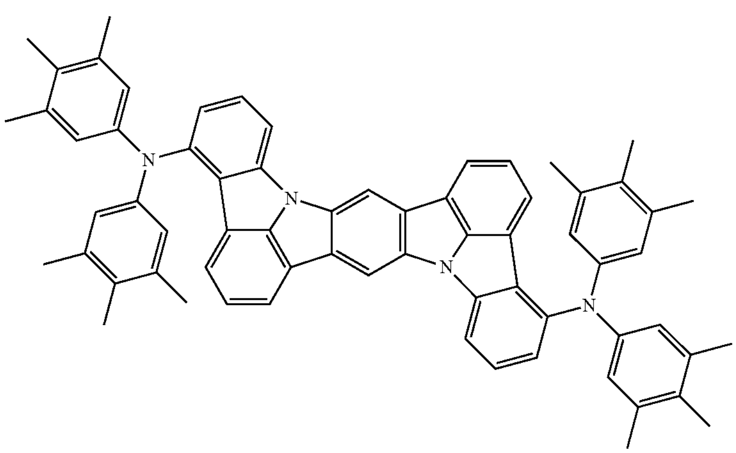

-continued
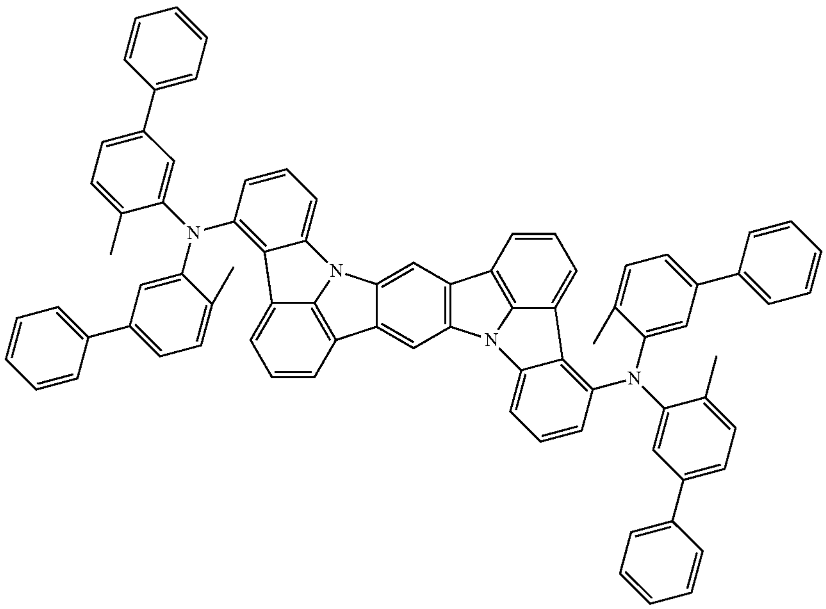
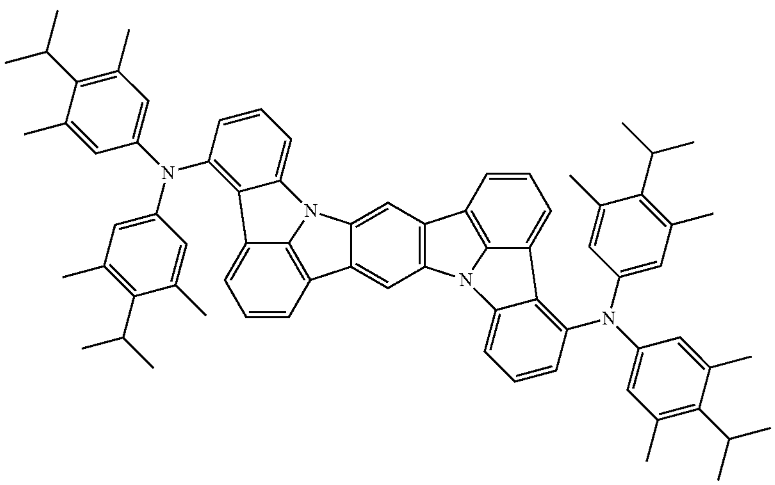
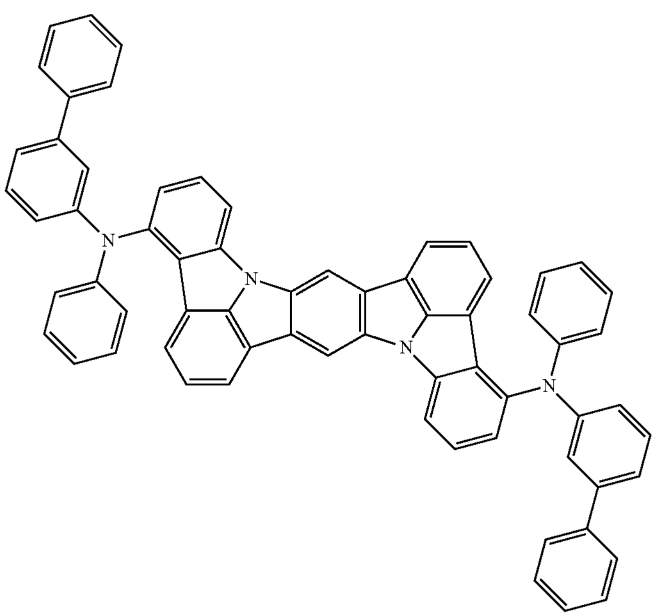

-continued
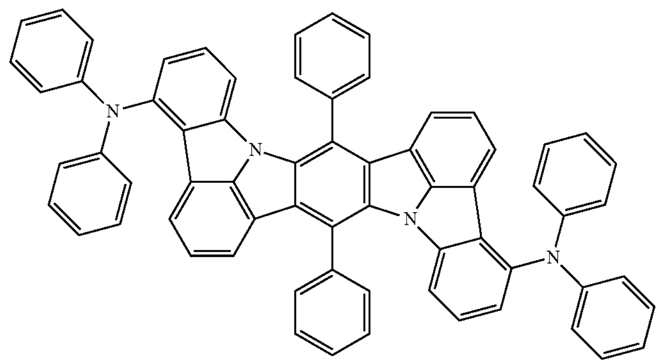
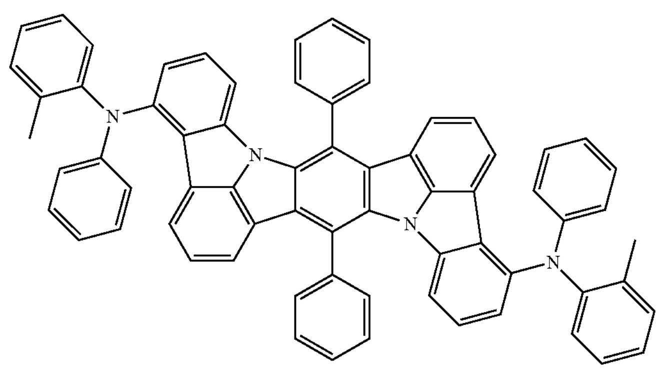
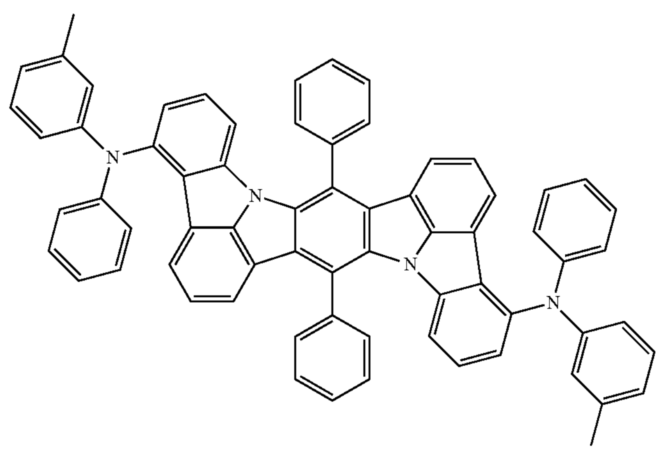
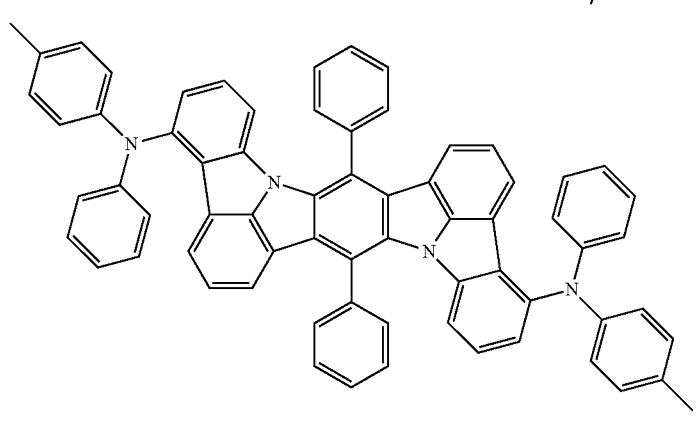

-continued
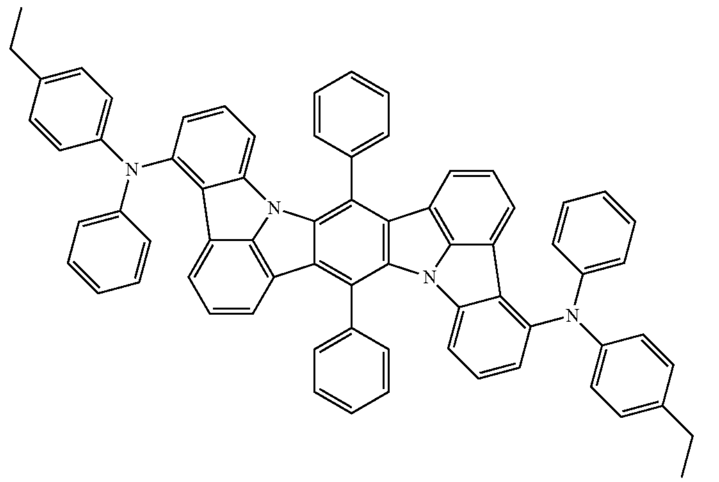
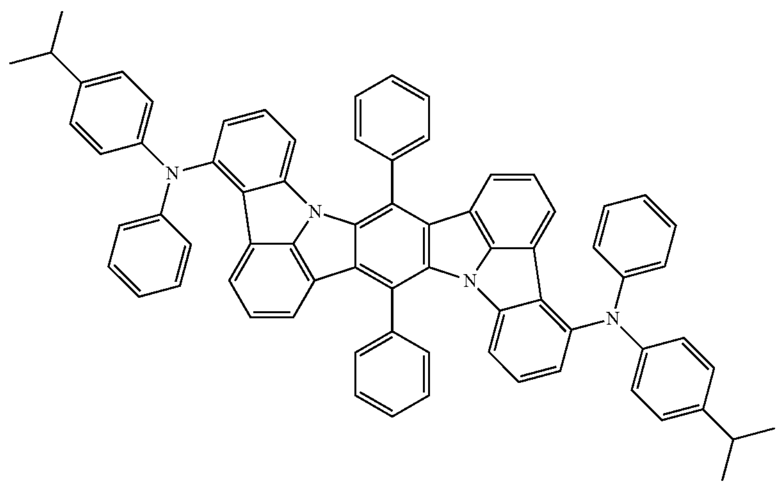
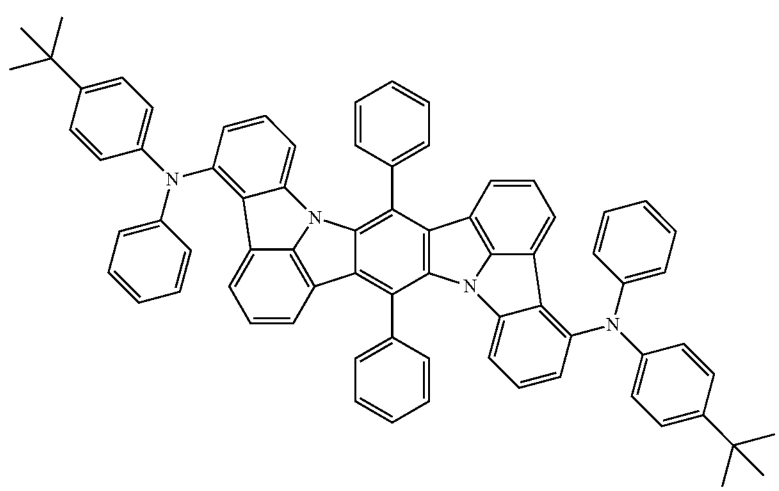

-continued
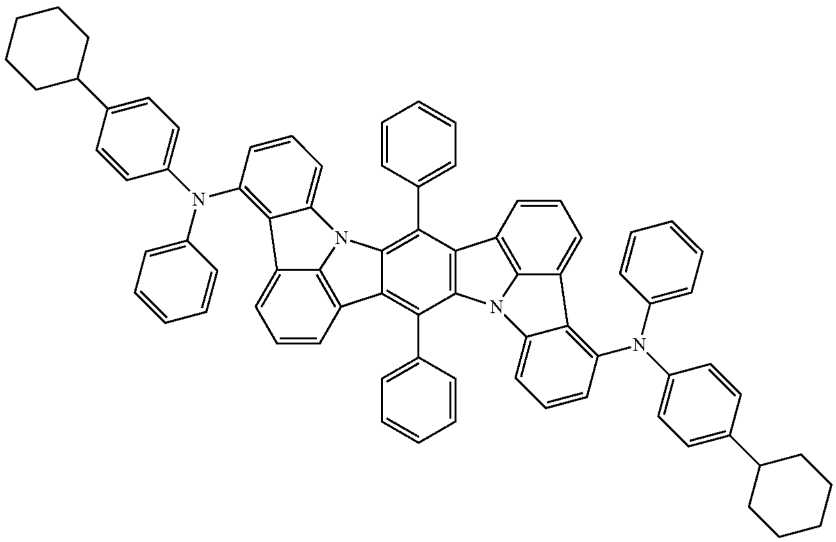
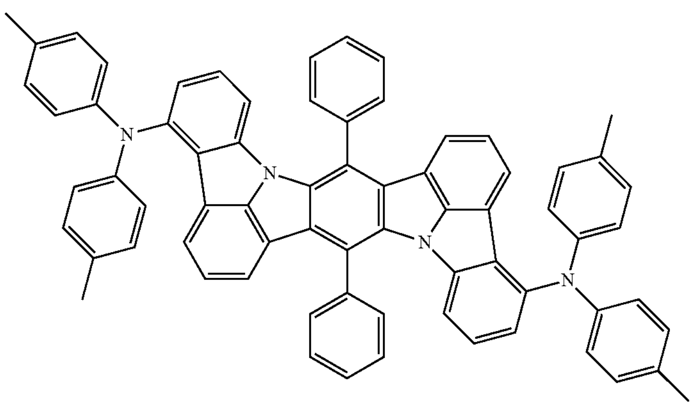
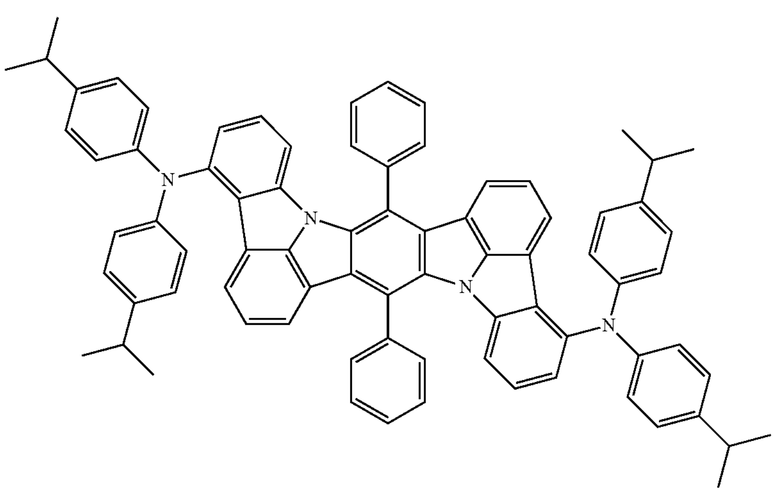

-continued
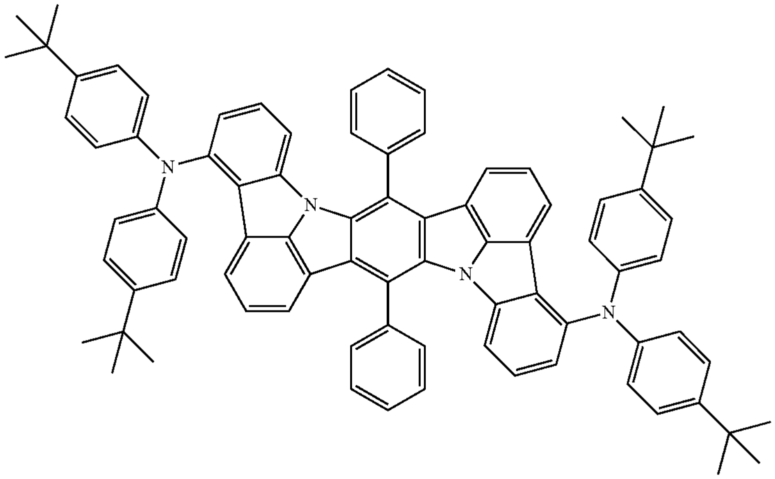
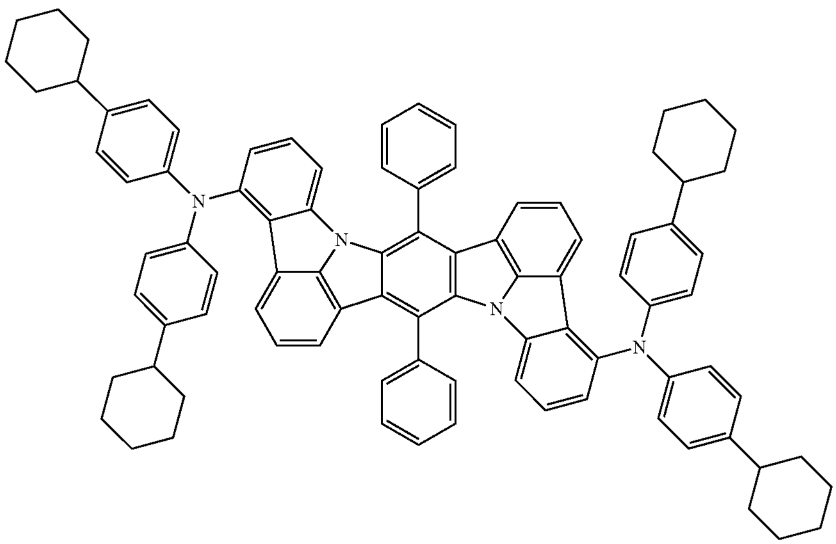
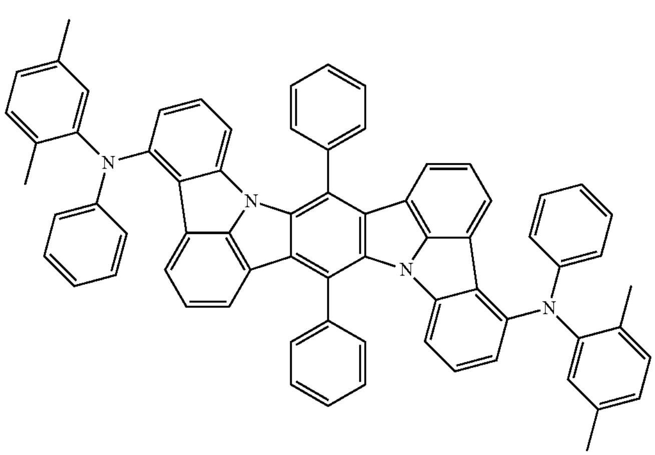

-continued
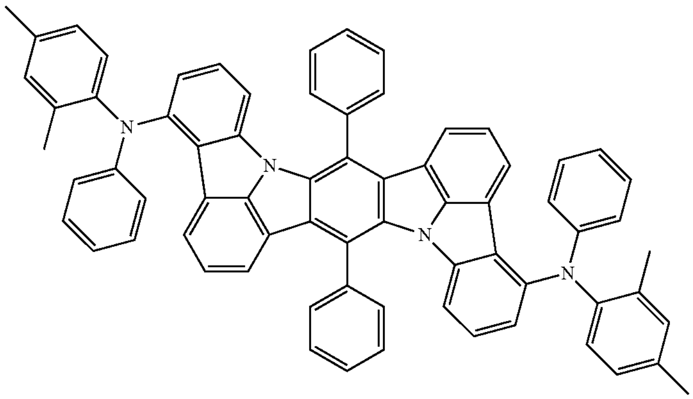
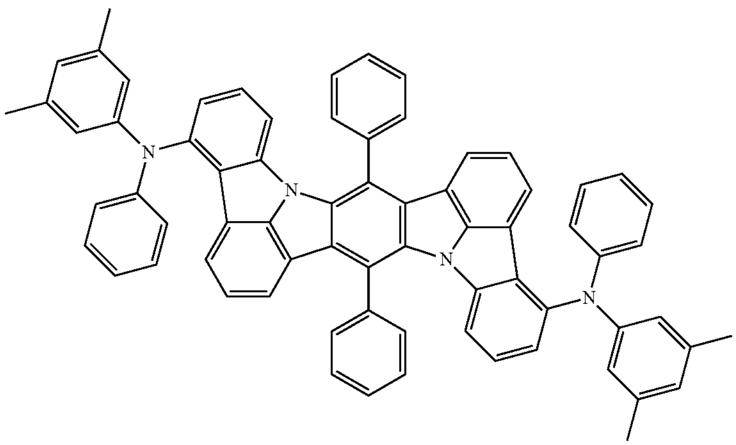
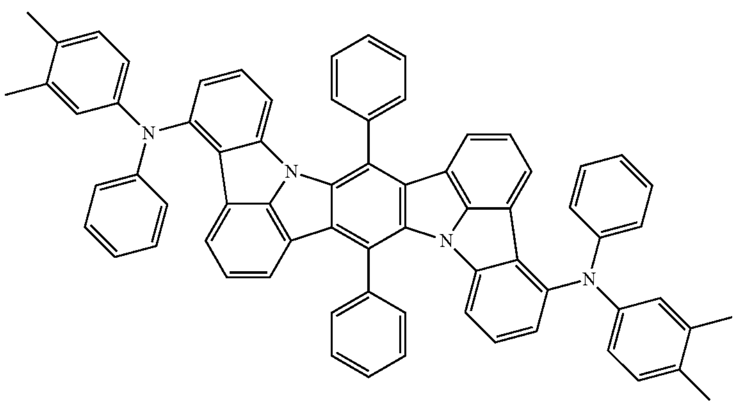
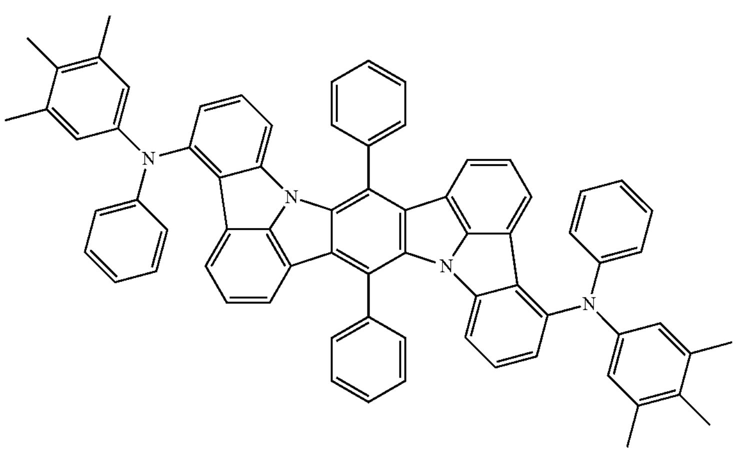

-continued
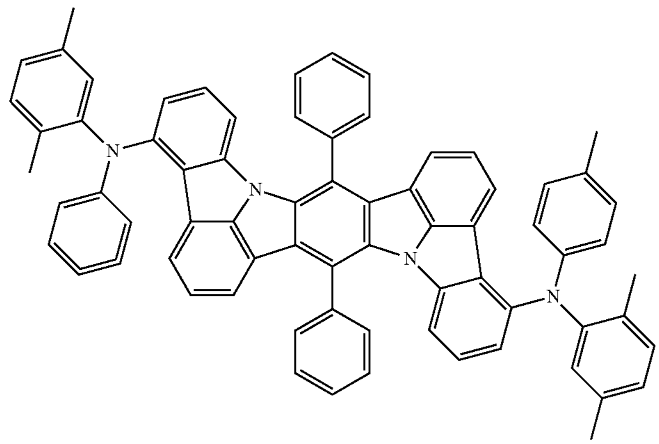
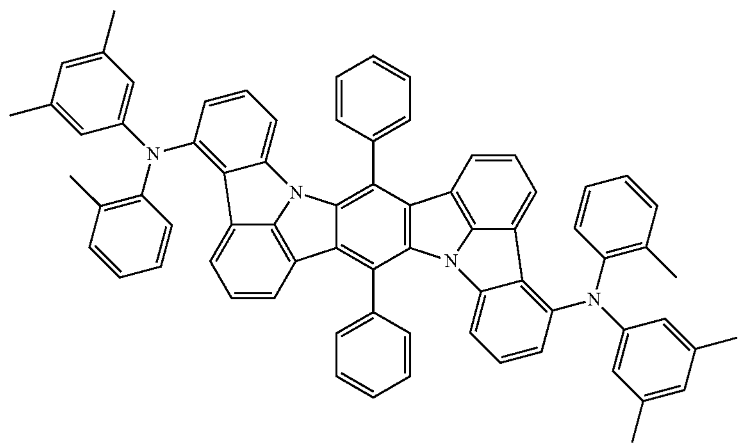
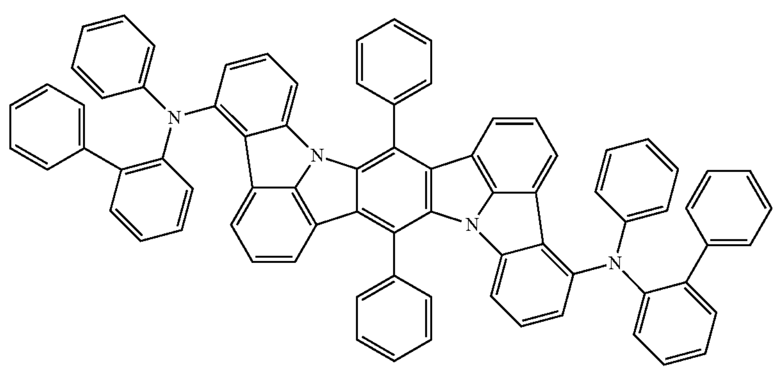
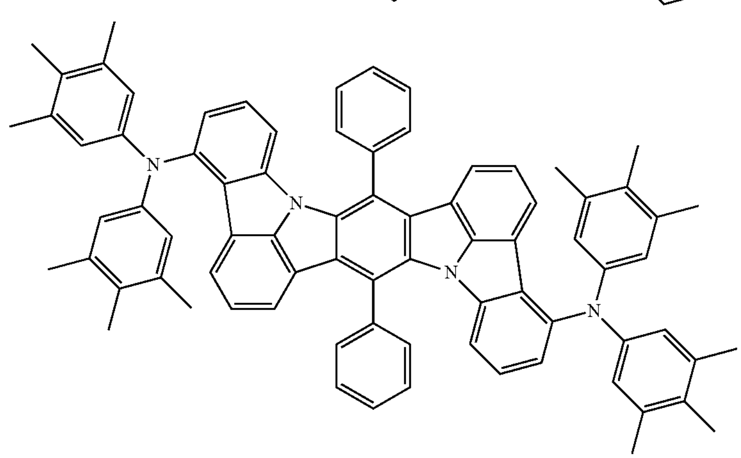

-continued
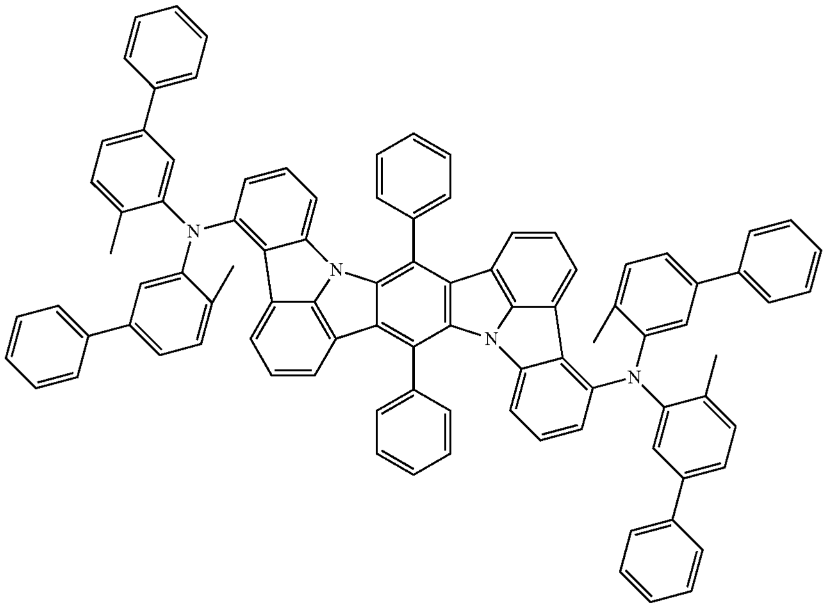
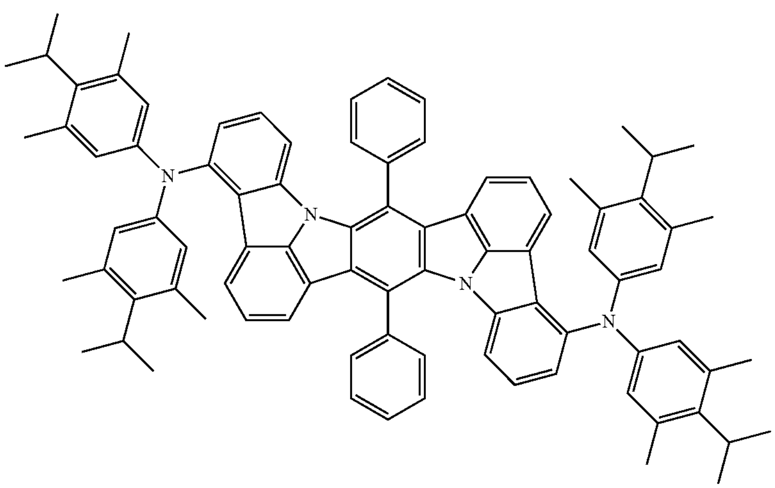
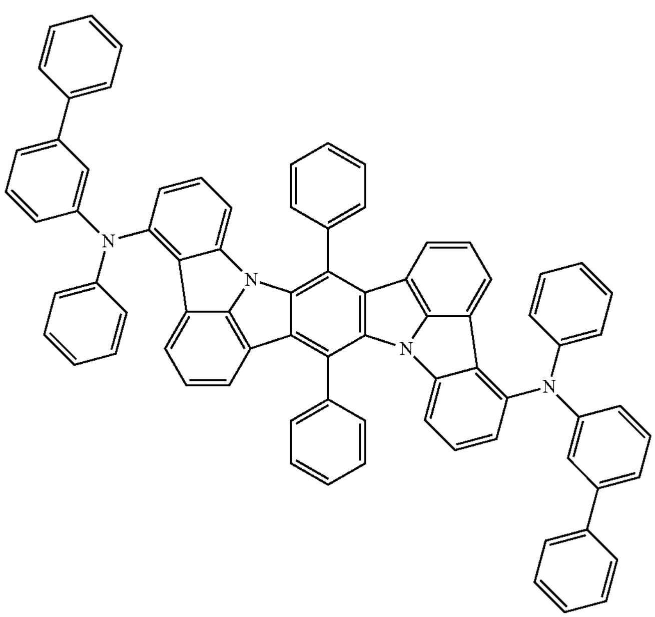

-continued
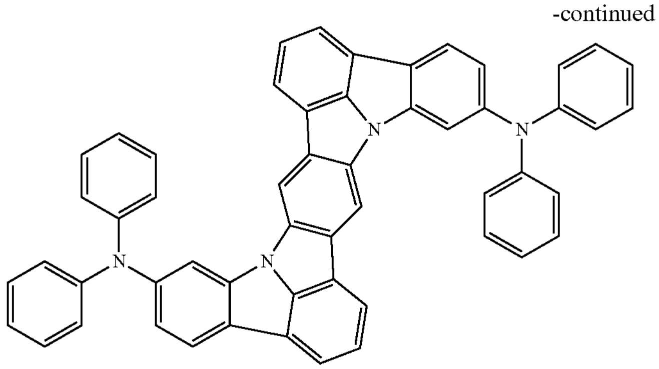
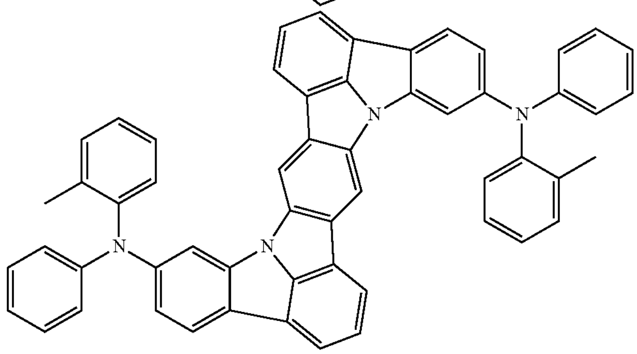
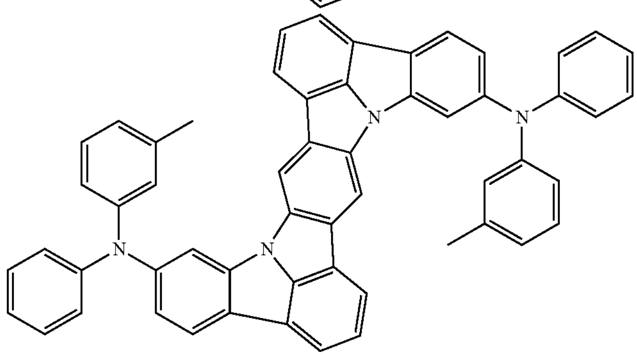
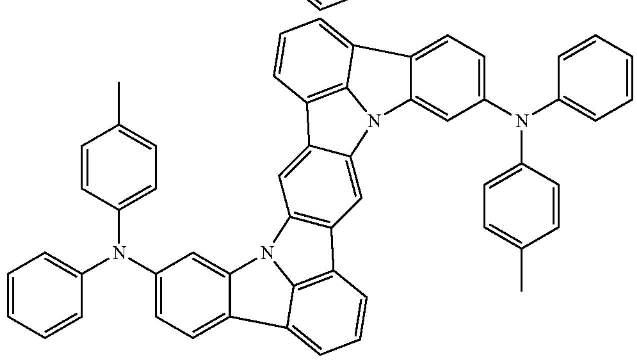
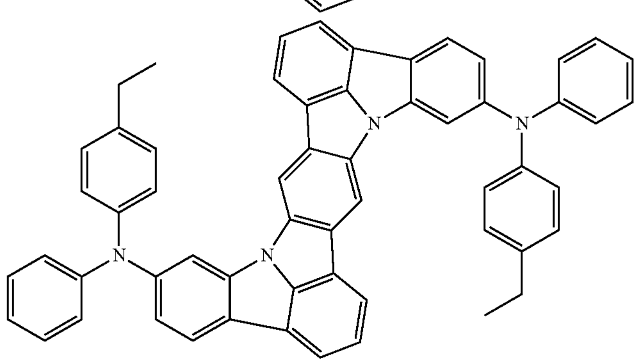

-continued
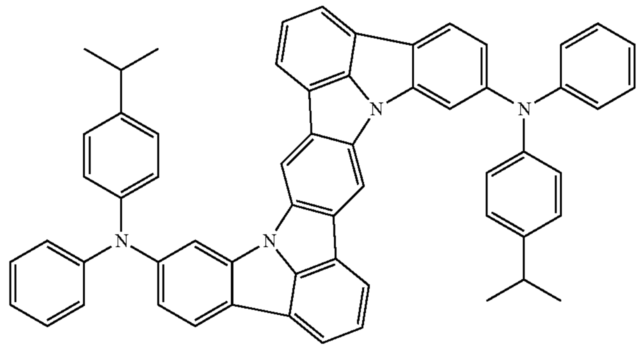
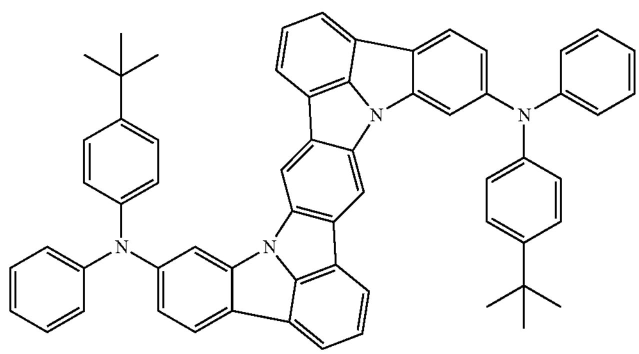
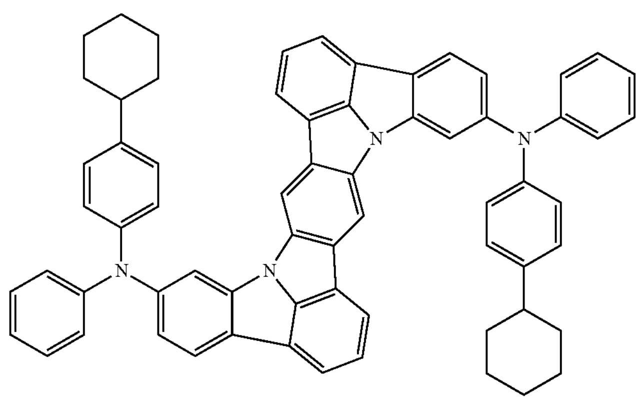
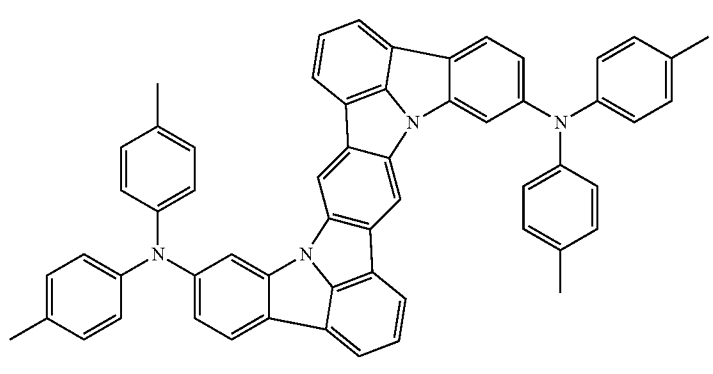

-continued
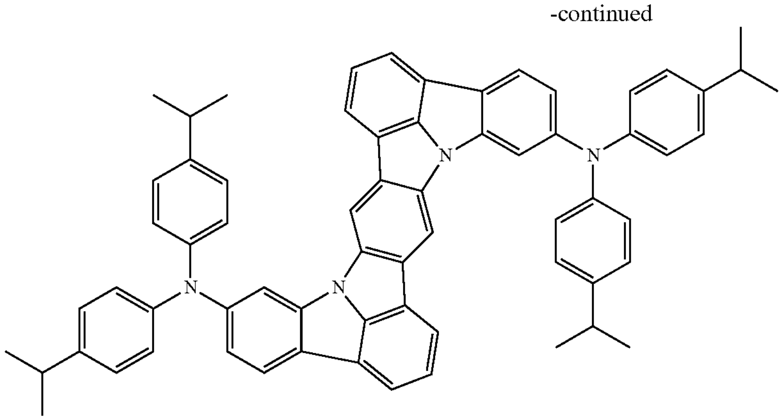
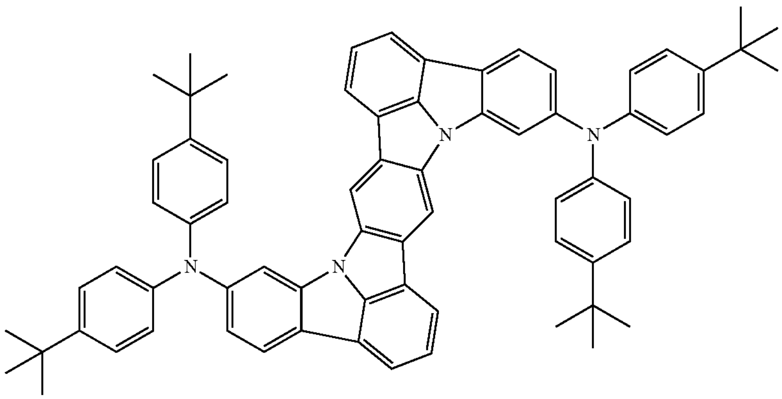
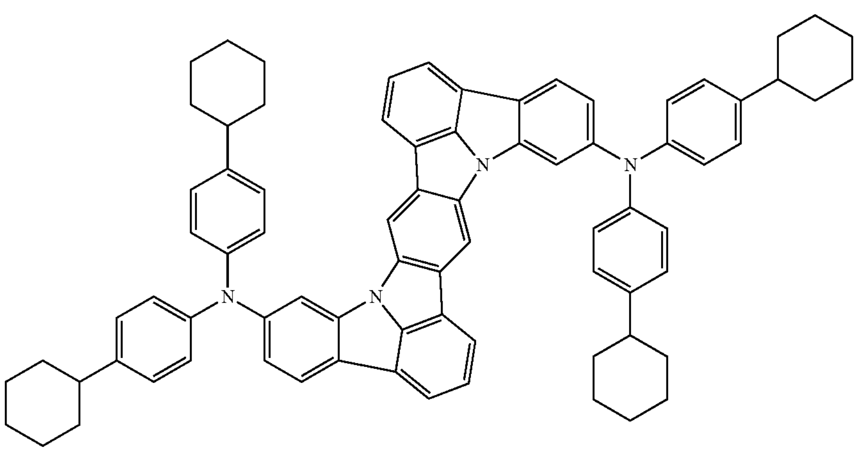
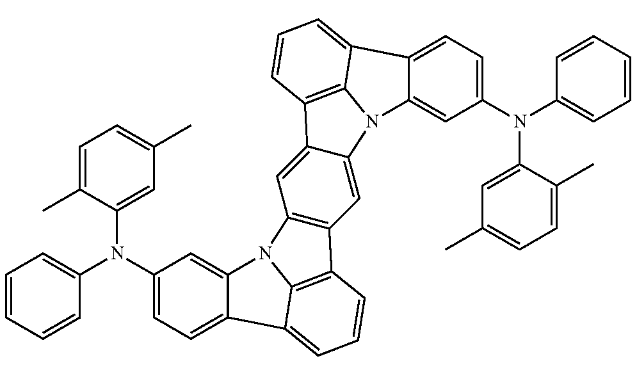

-continued
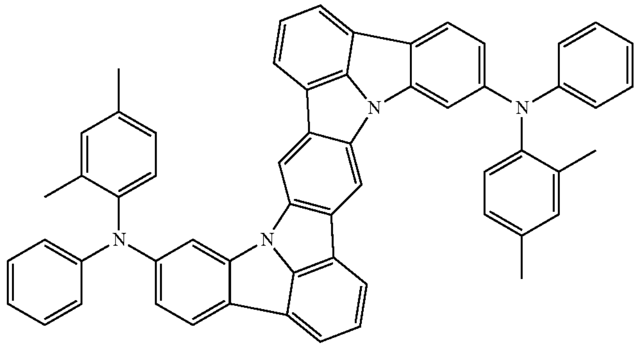
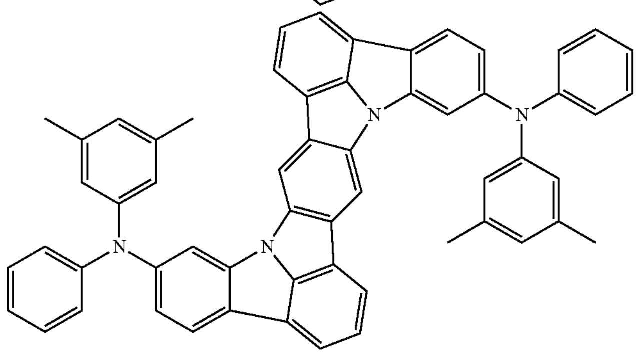
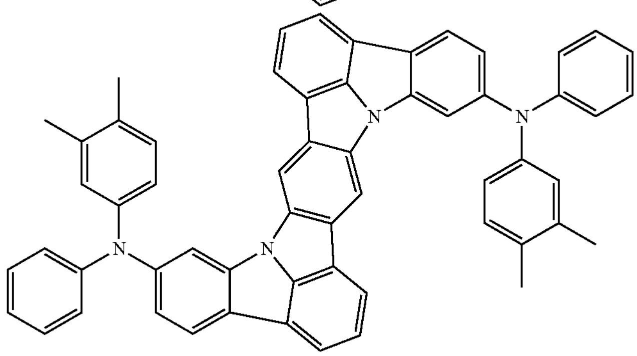
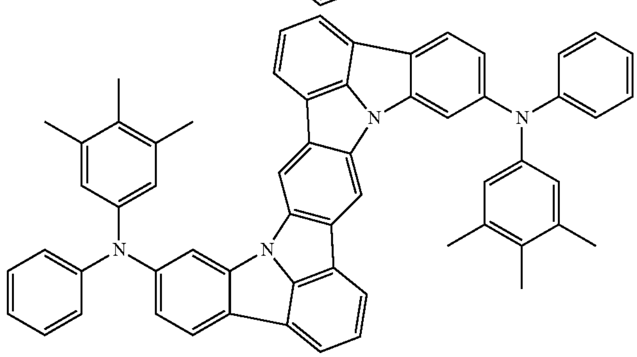
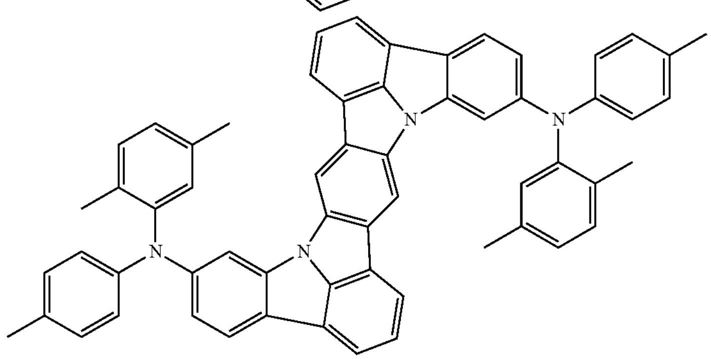

-continued
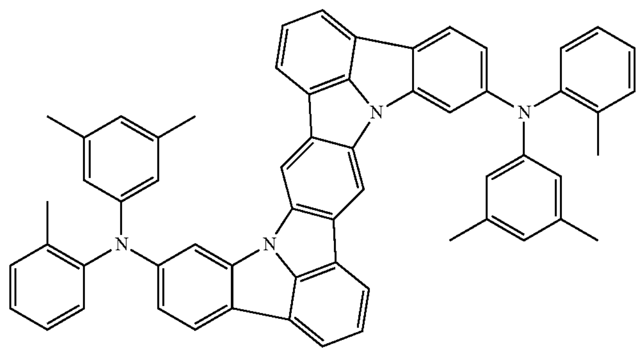
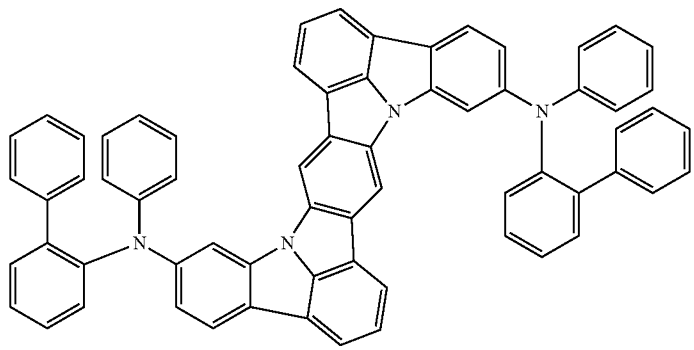
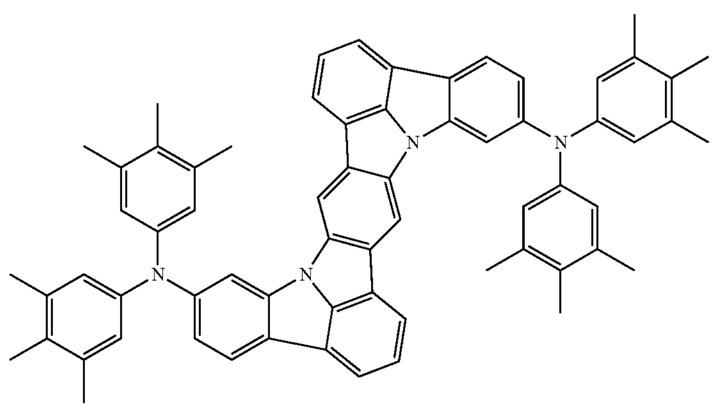
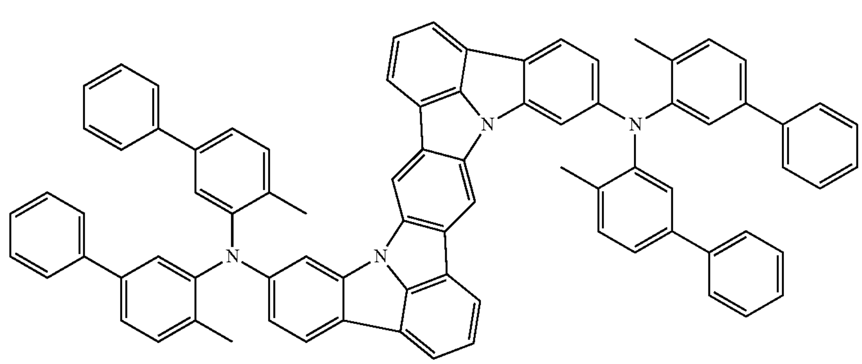

-continued
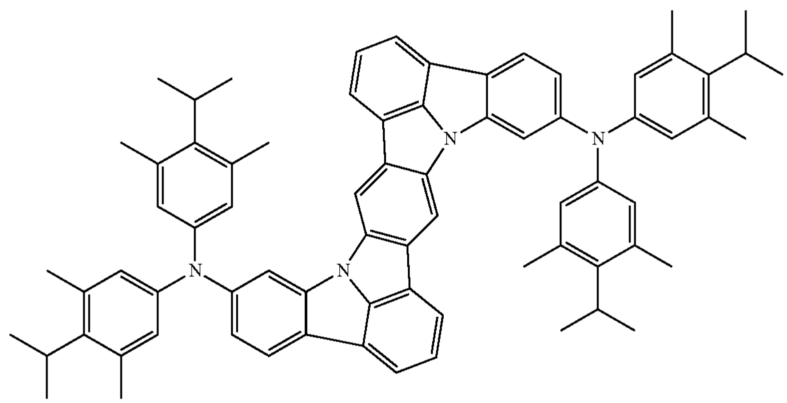
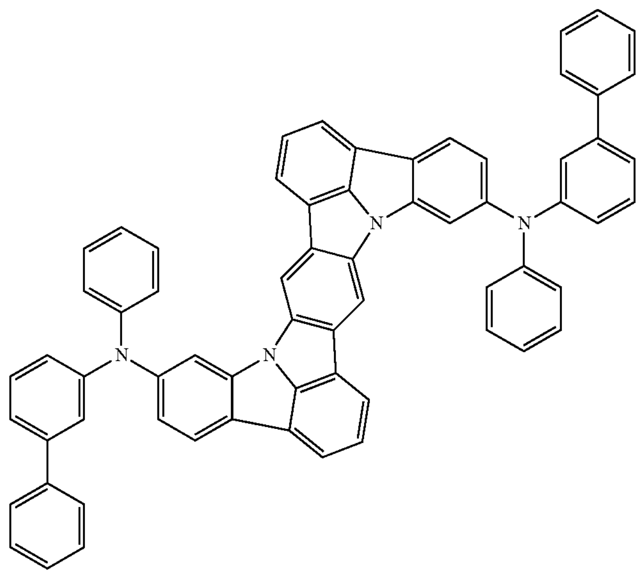
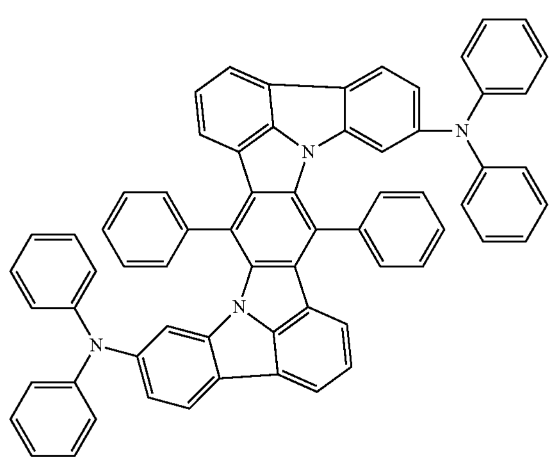

-continued
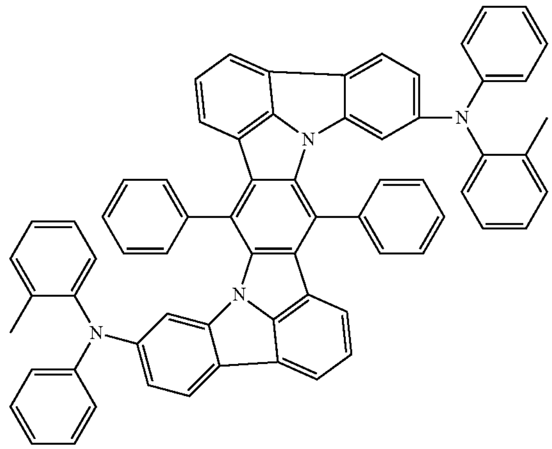
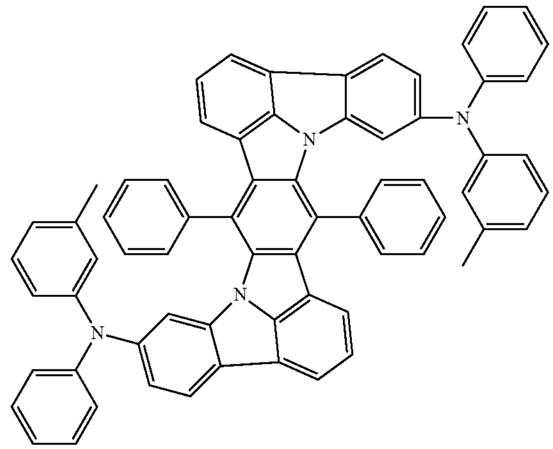
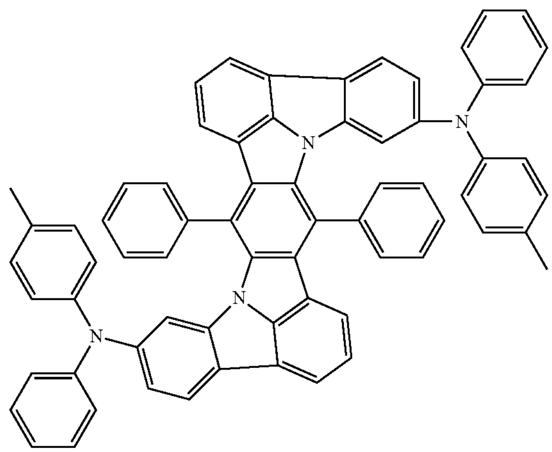
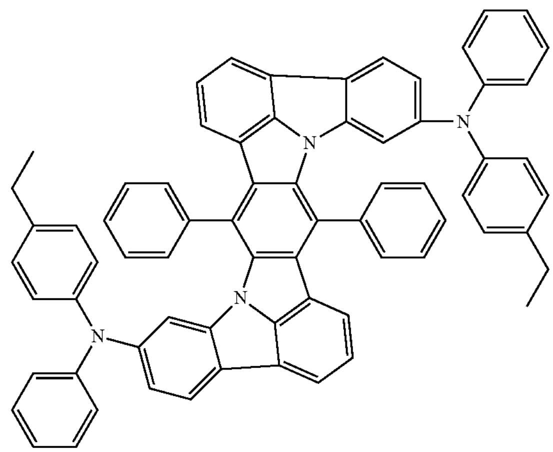
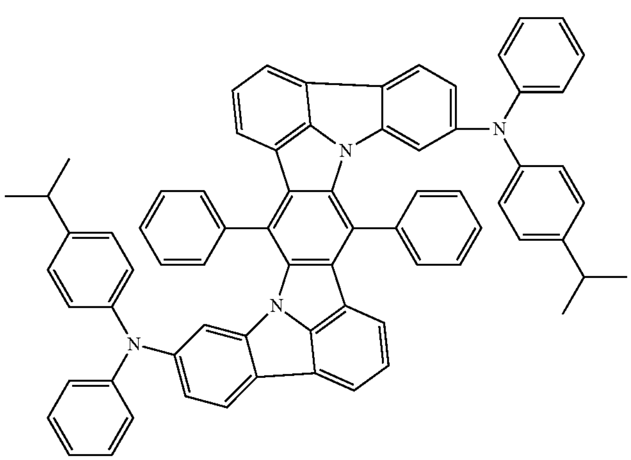

-continued
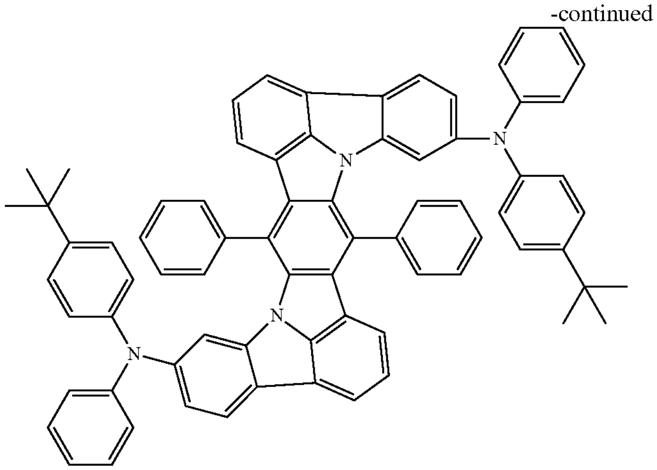
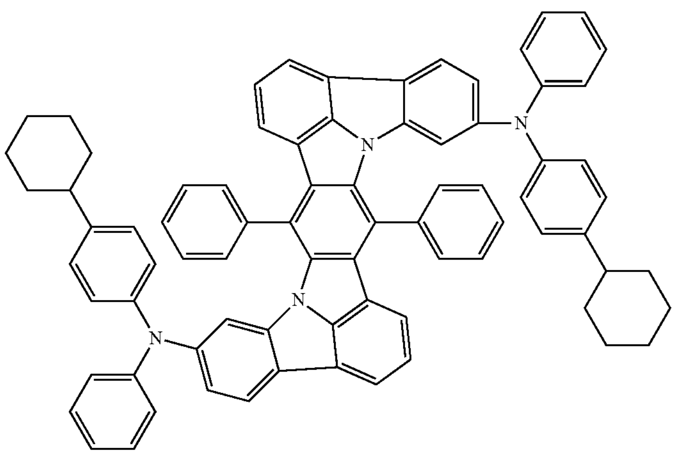
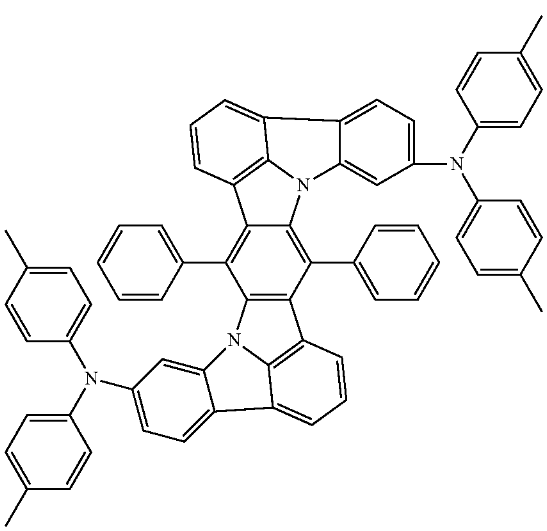

-continued
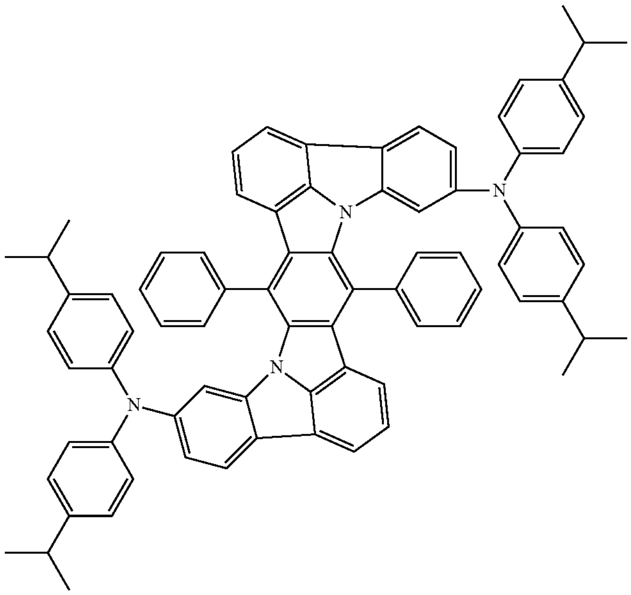
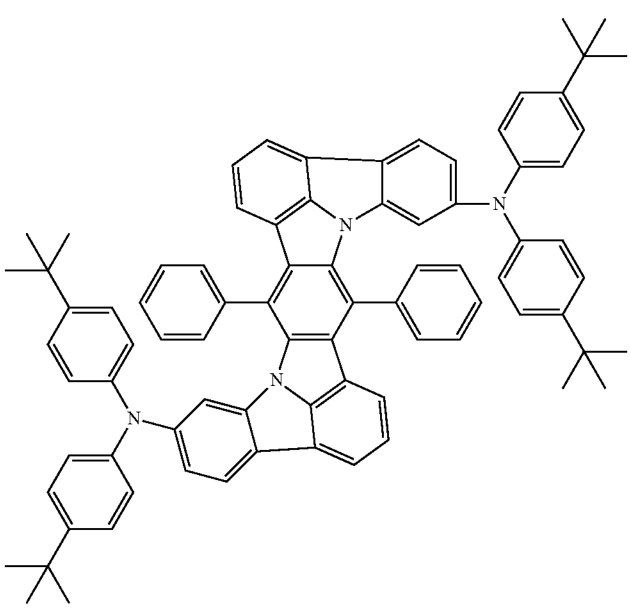

-continued
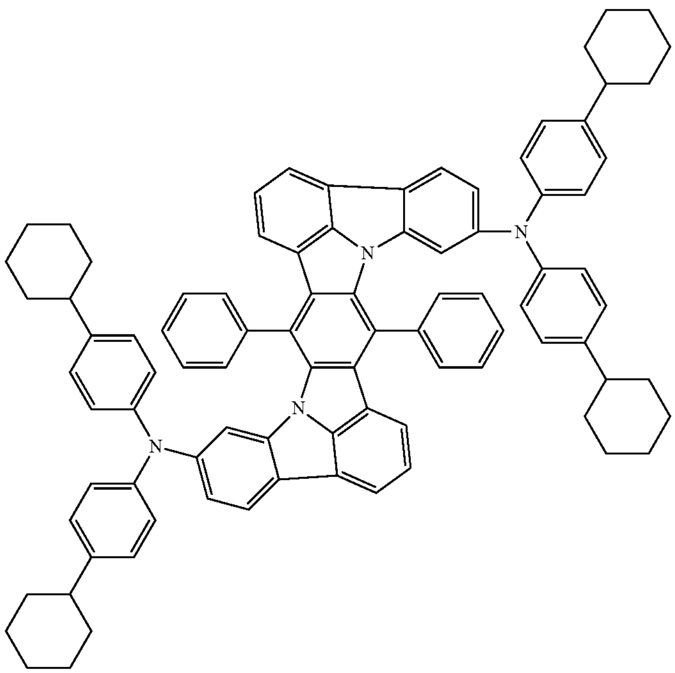
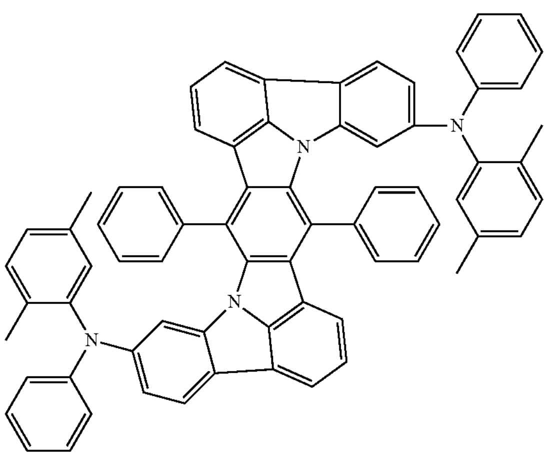
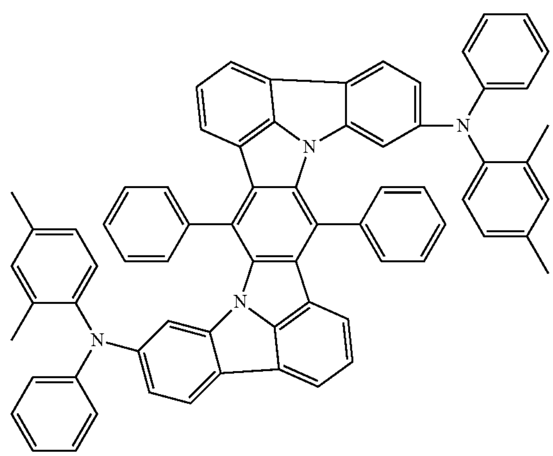
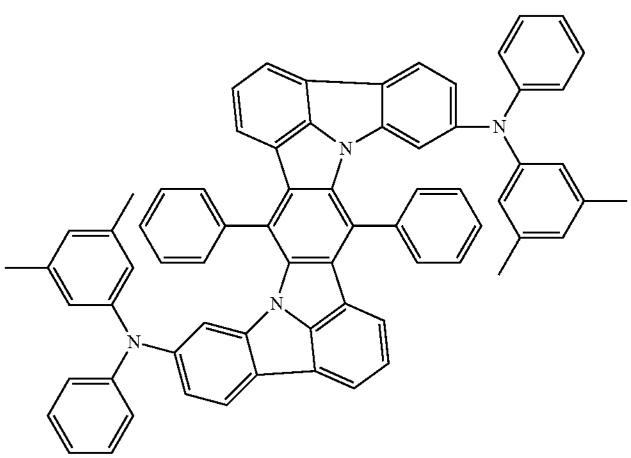

-continued
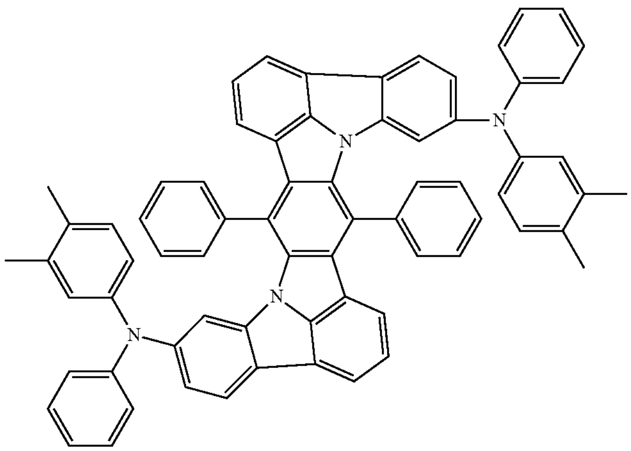
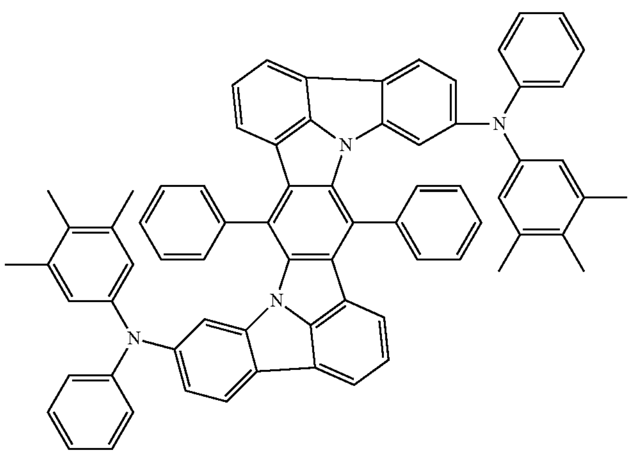
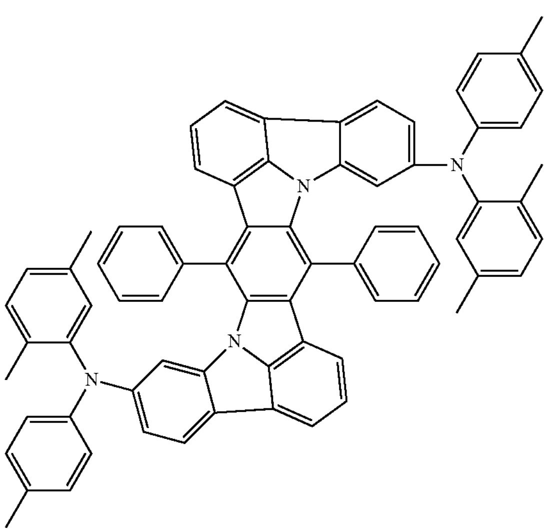

-continued
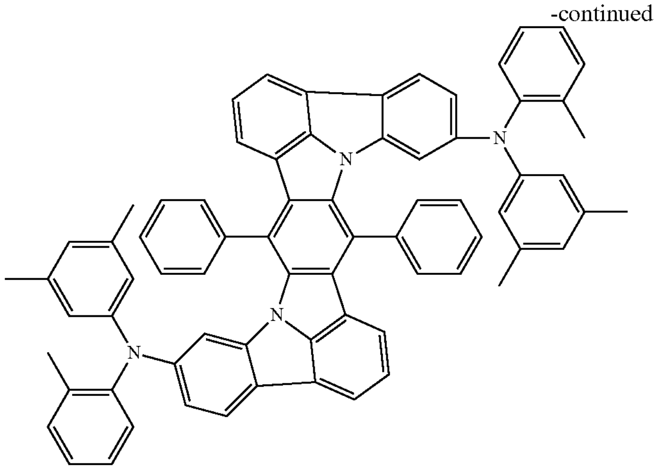
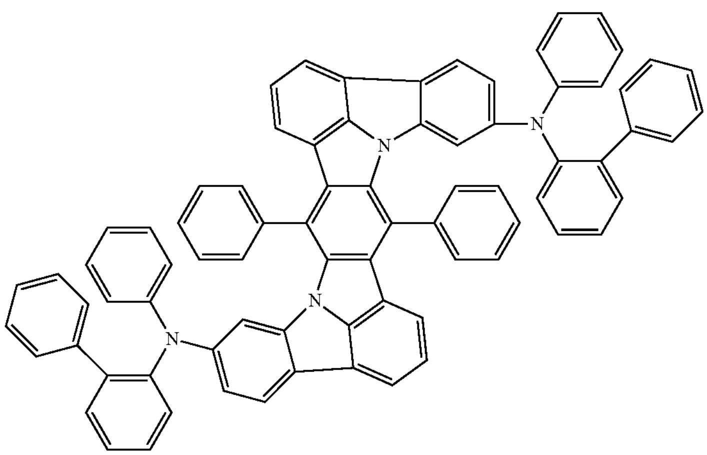
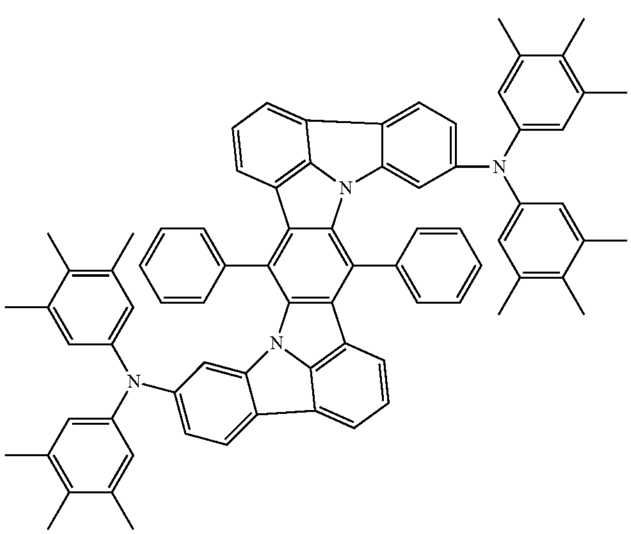

-continued
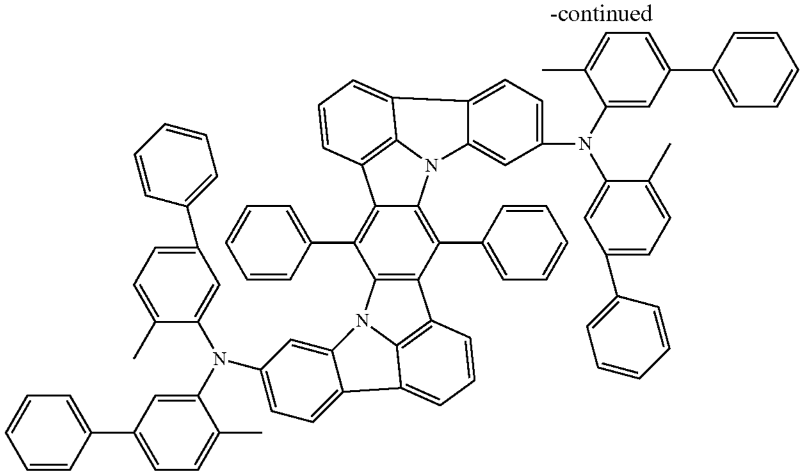
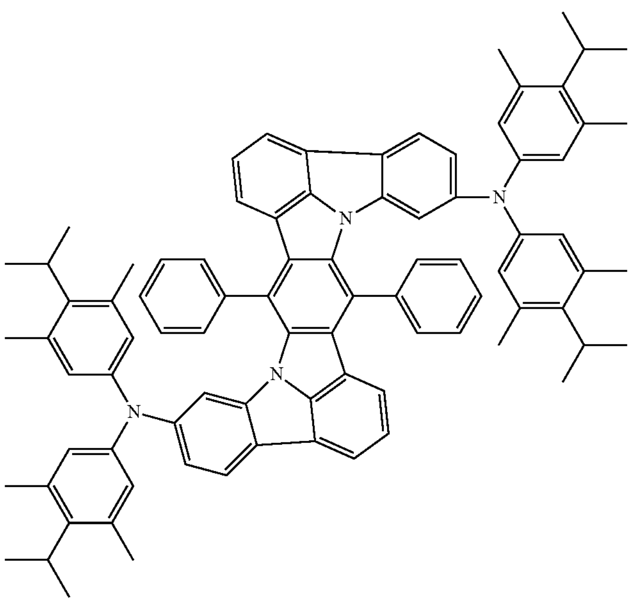
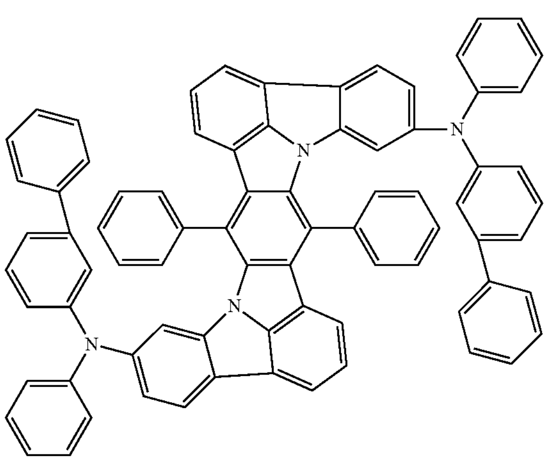

-continued
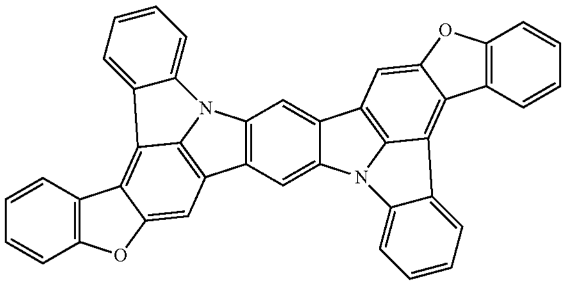
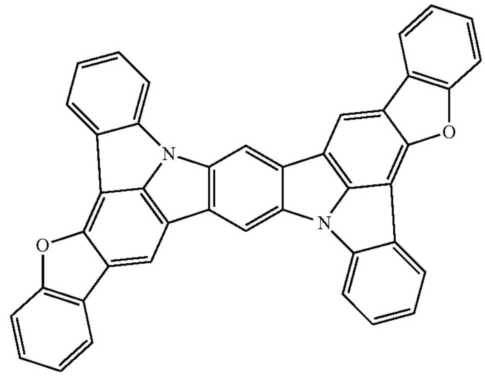
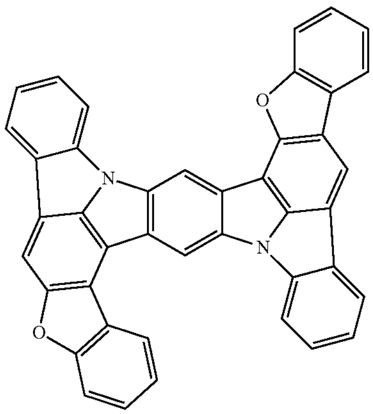
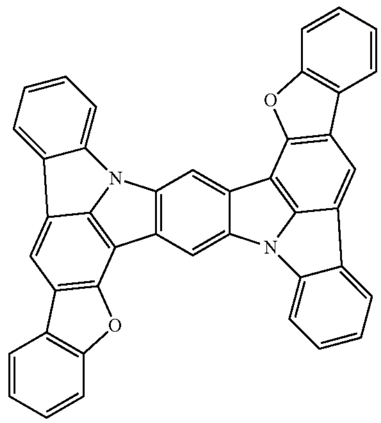
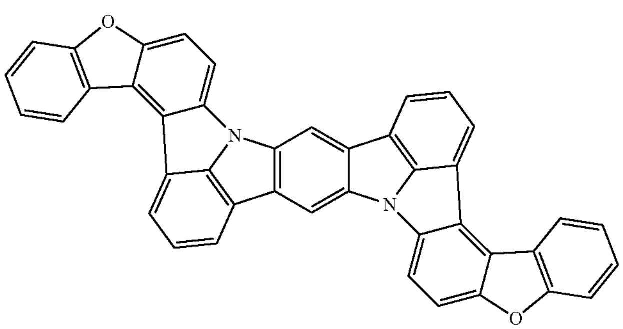
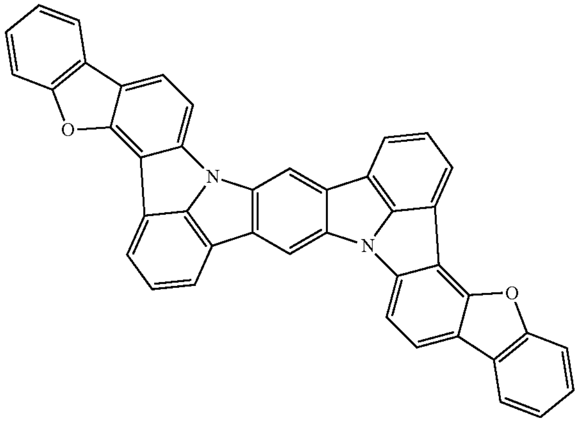

-continued
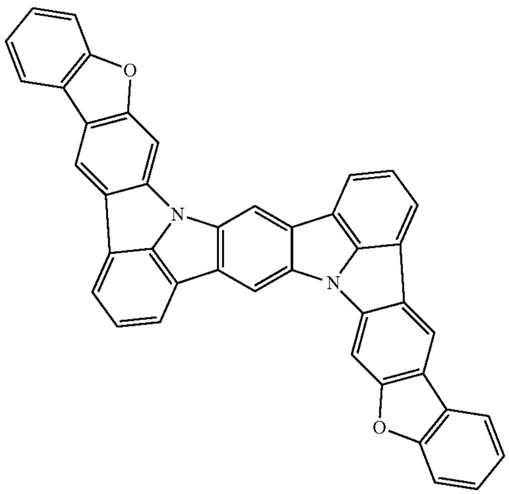
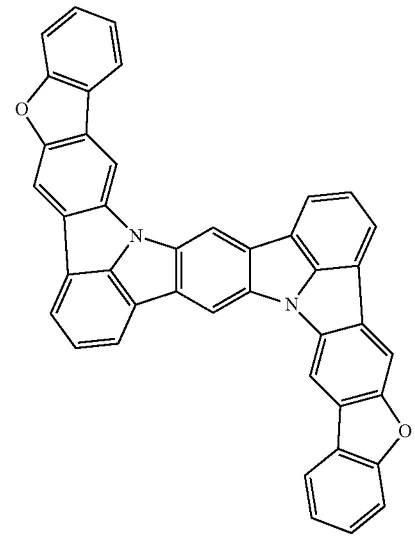
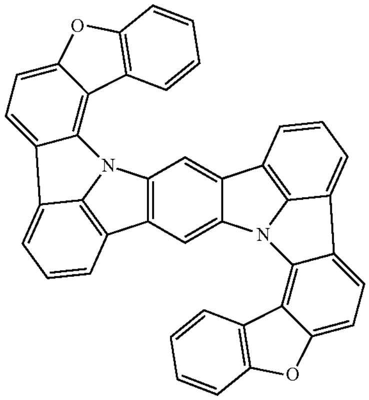
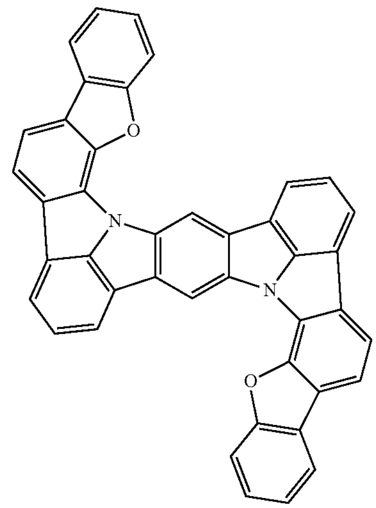
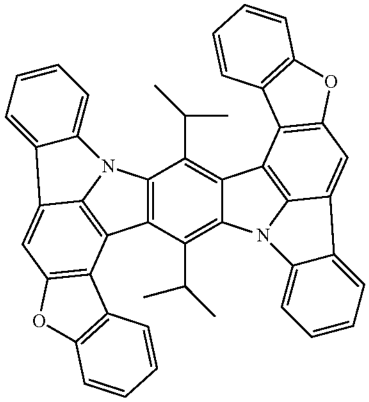
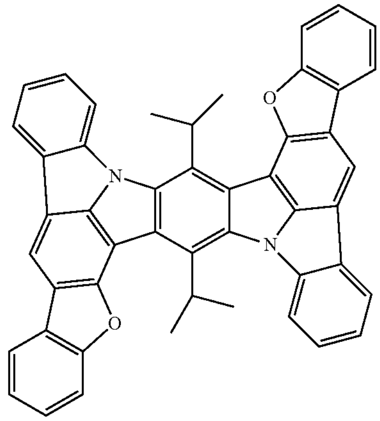

-continued
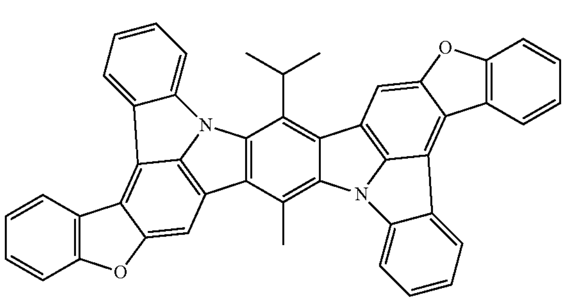
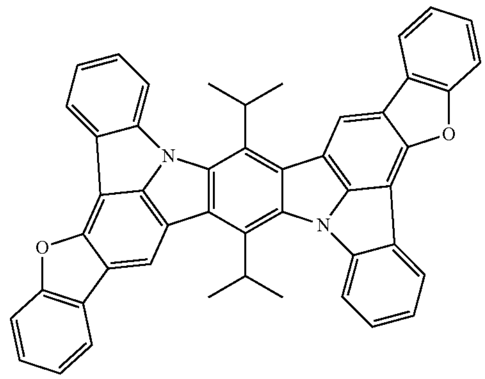
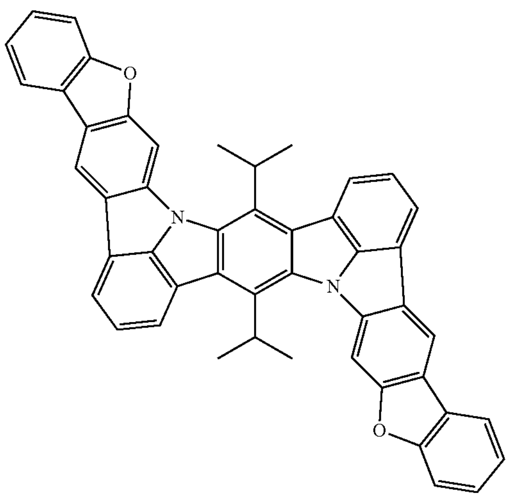
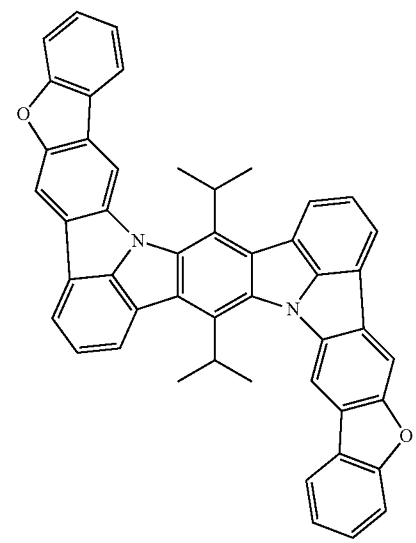
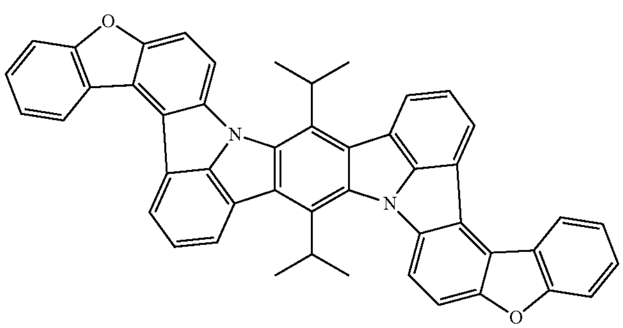
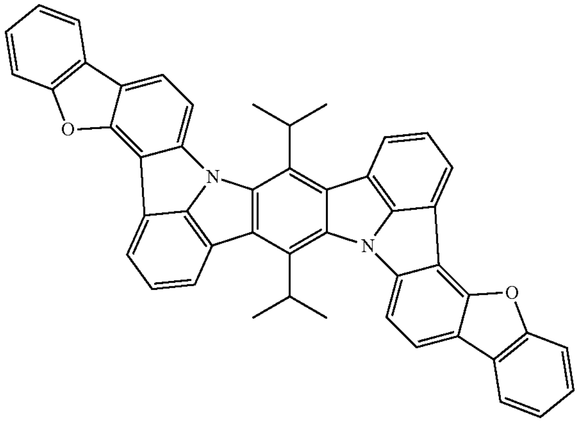

-continued
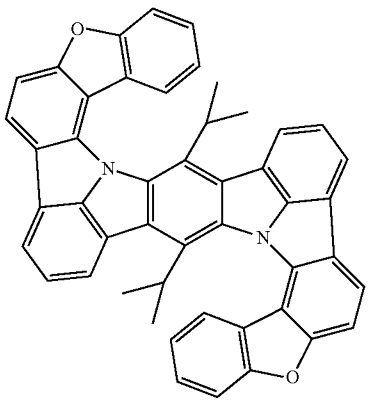
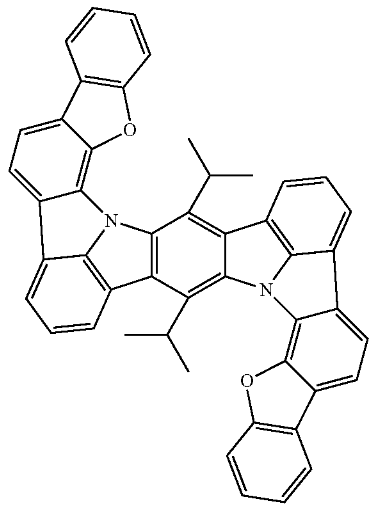
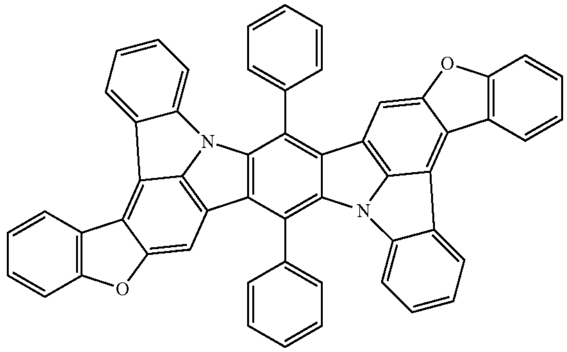
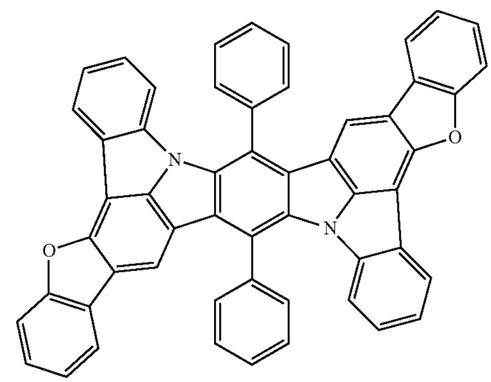
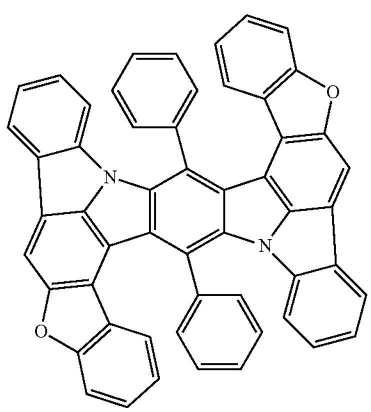
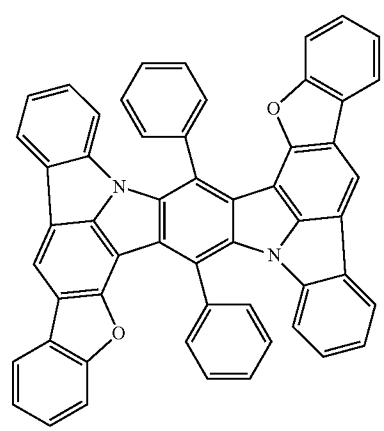
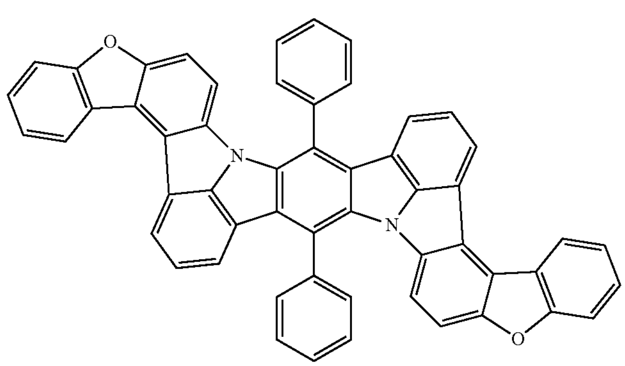

-continued
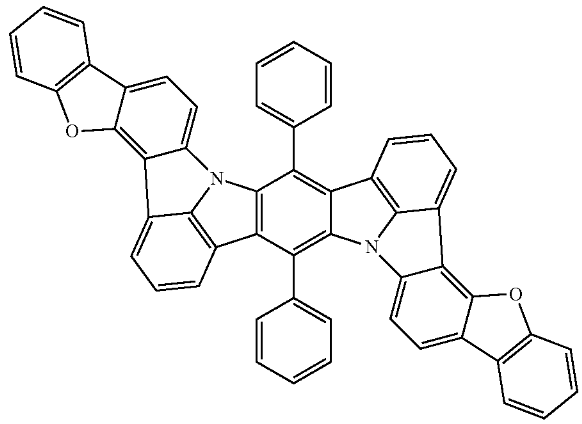
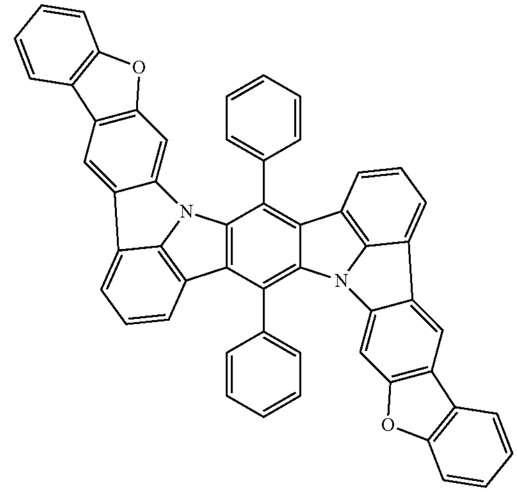
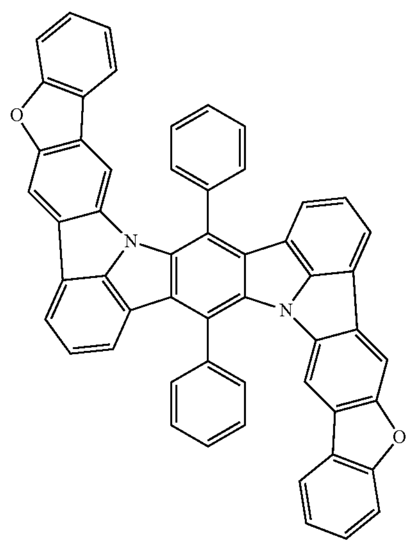
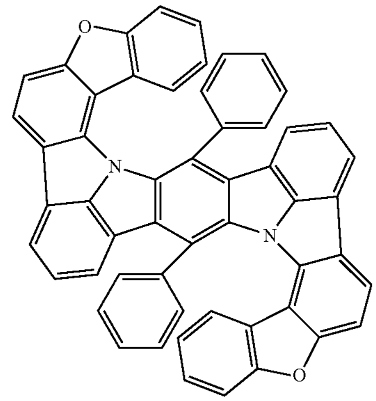
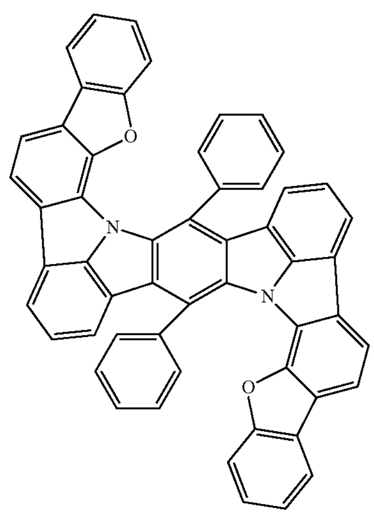
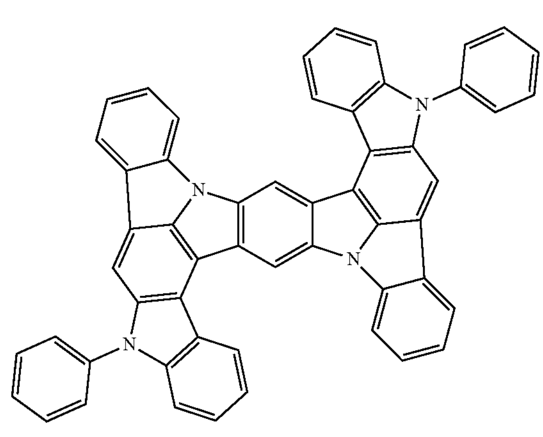

-continued
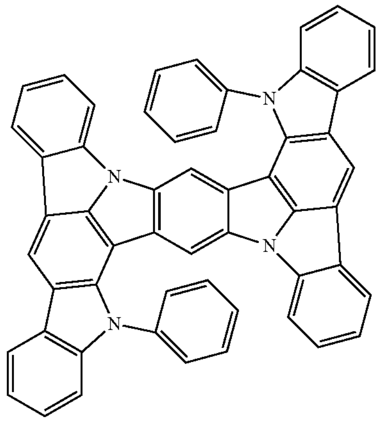
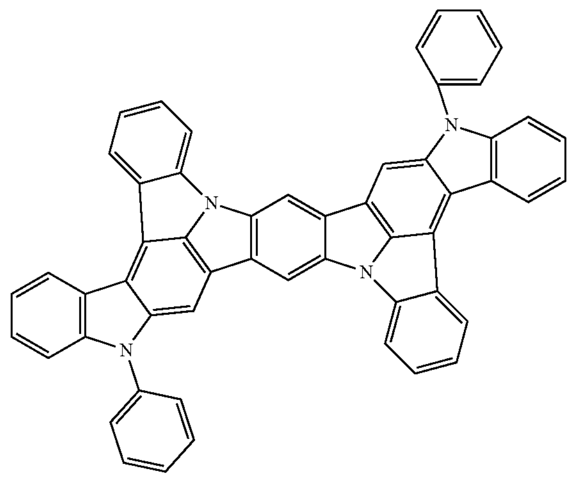
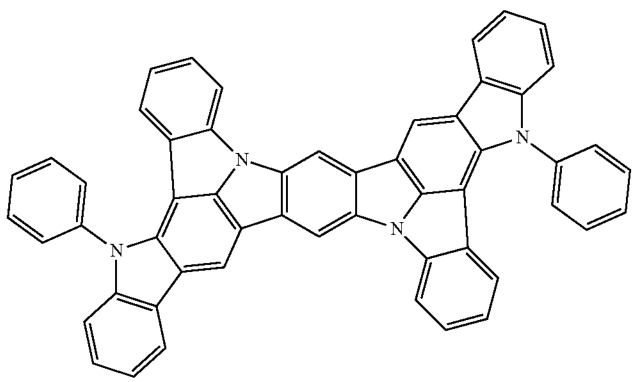
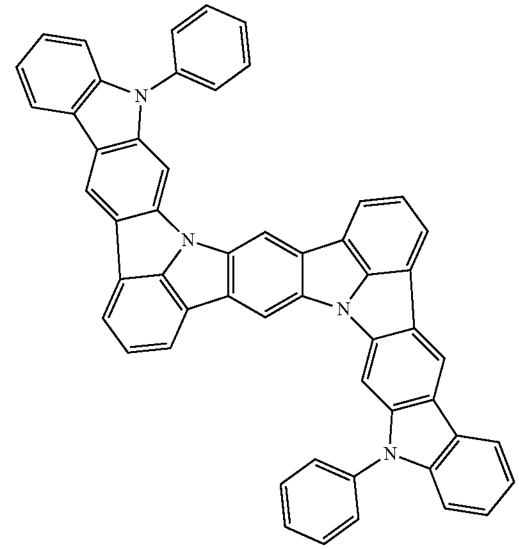
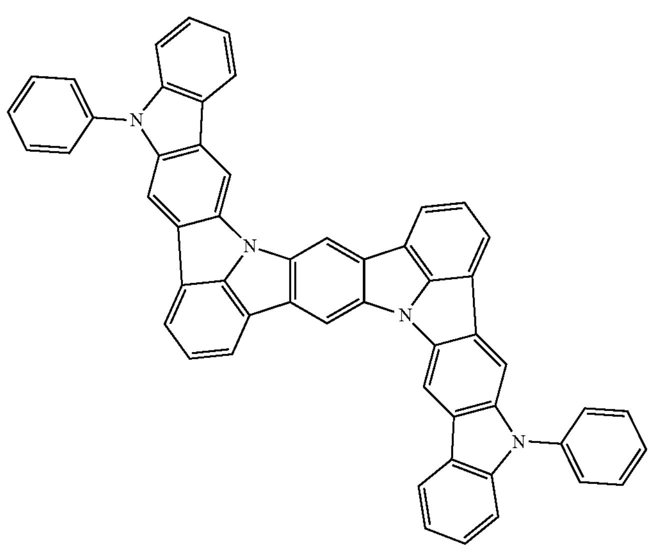

-continued
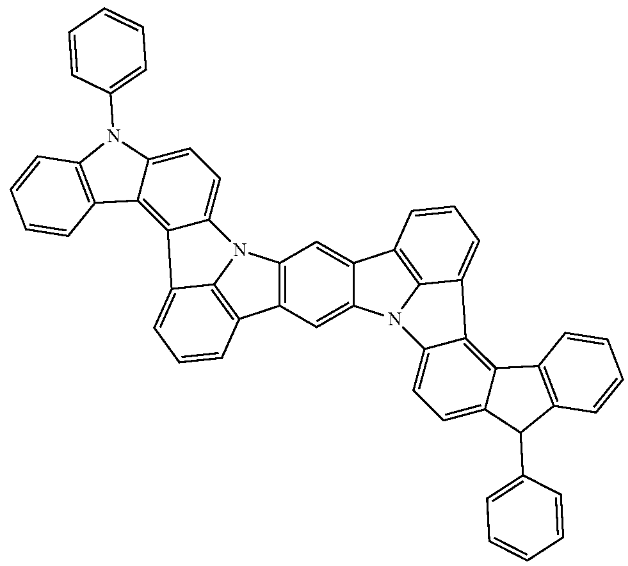
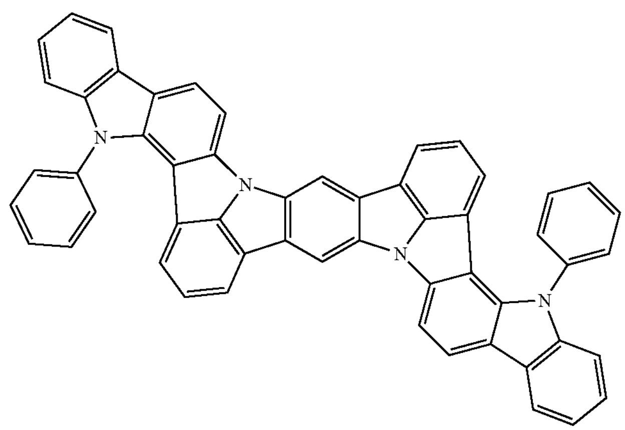
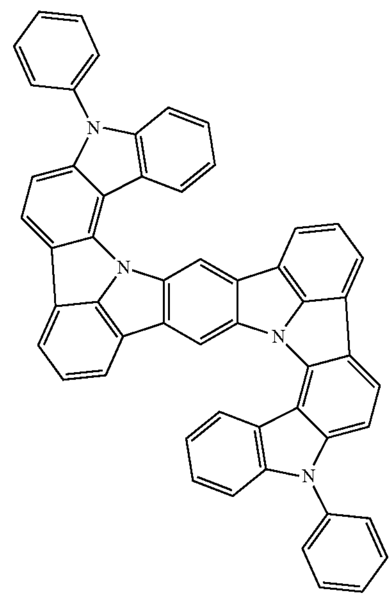
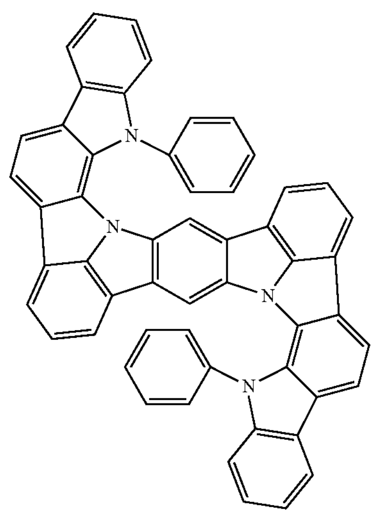
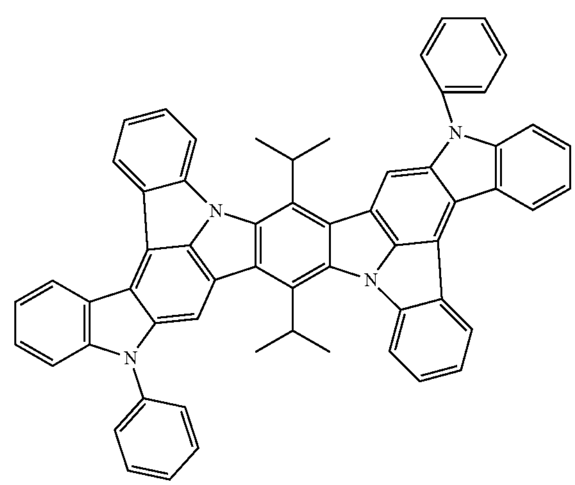

-continued
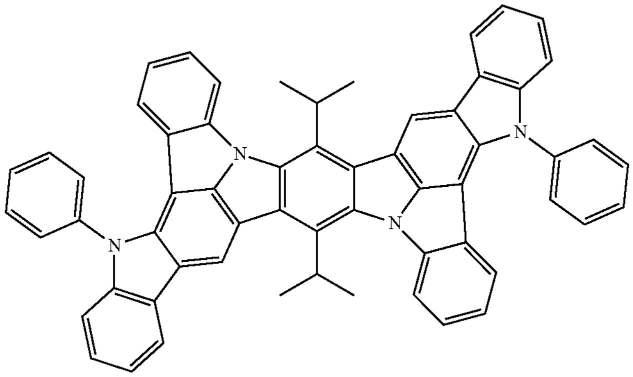
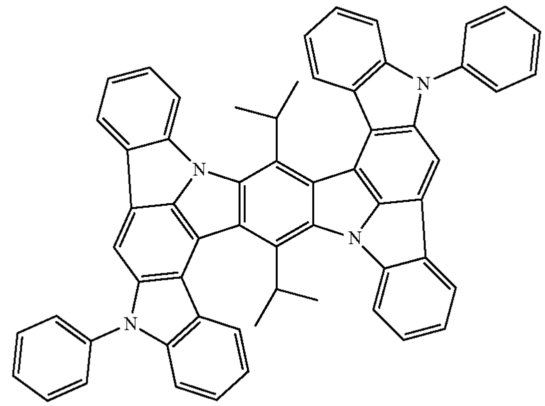
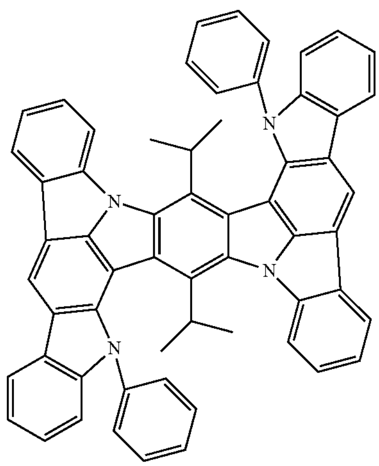
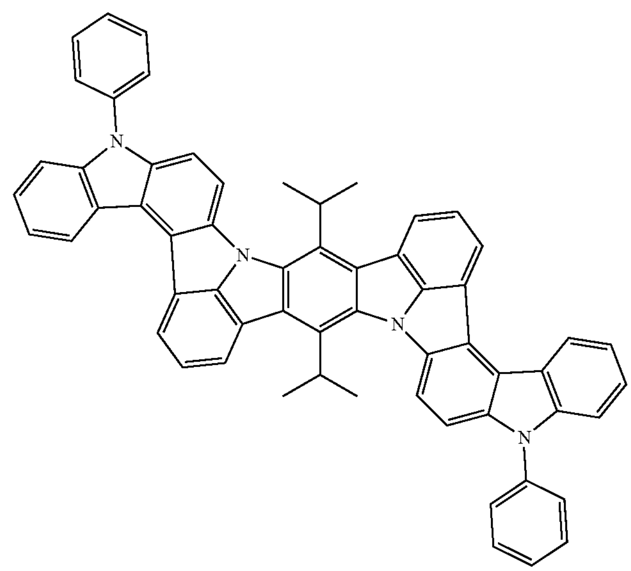
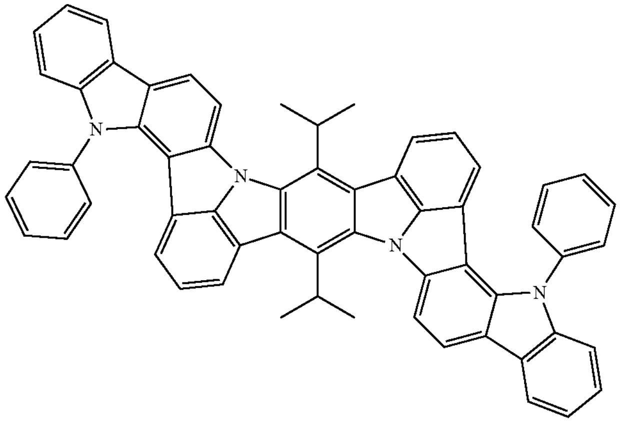

-continued
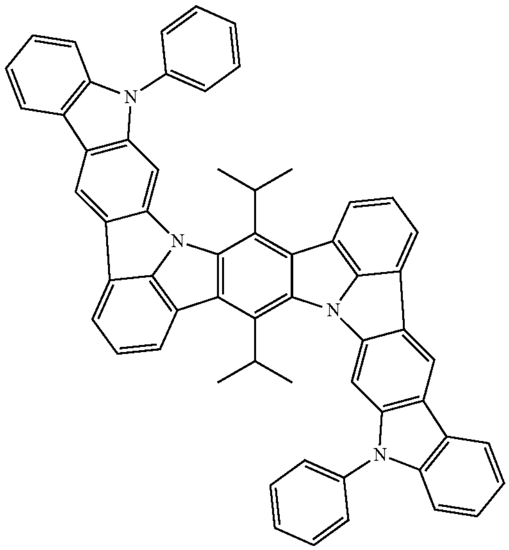
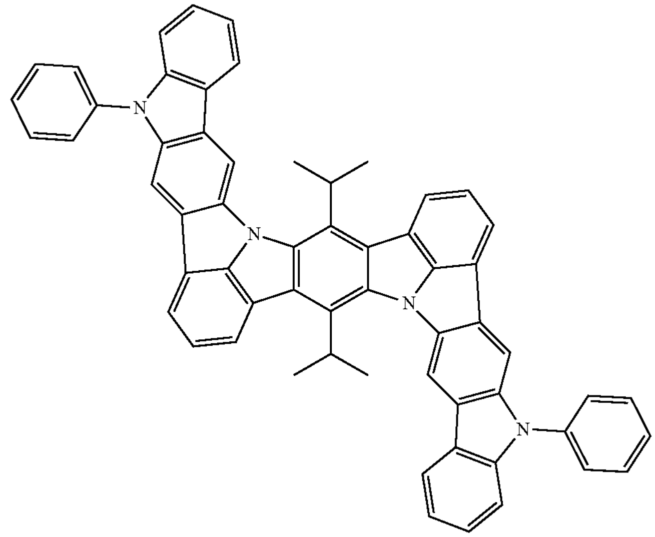
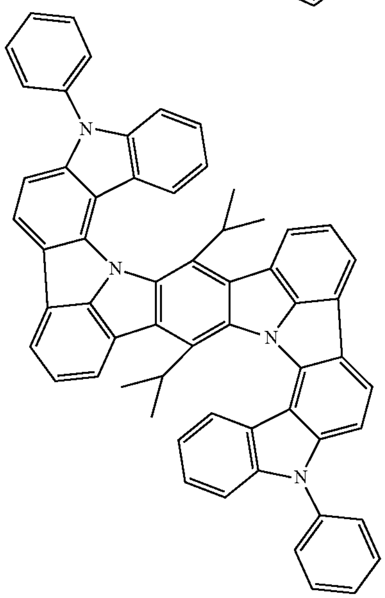
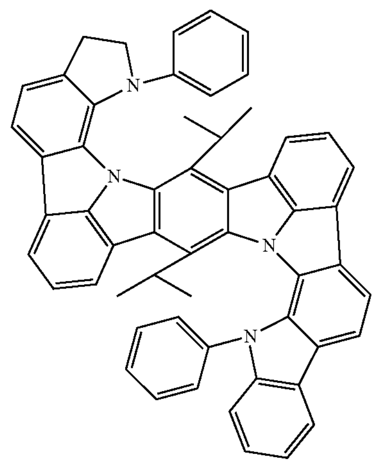
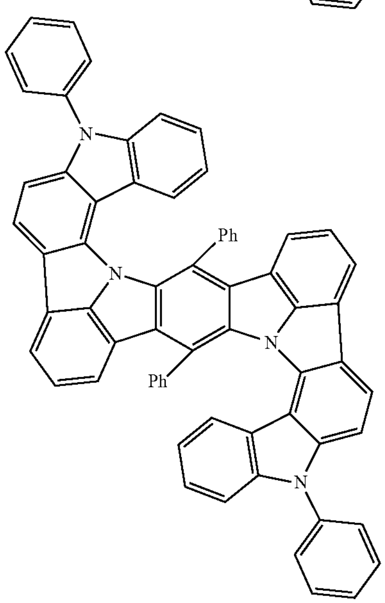
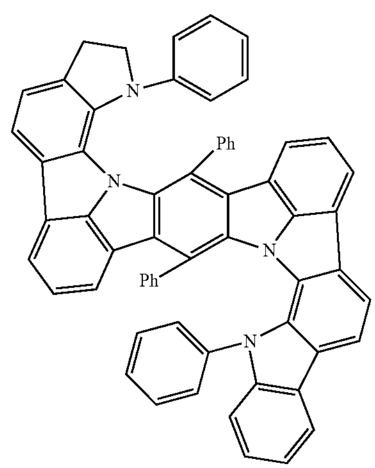

-continued
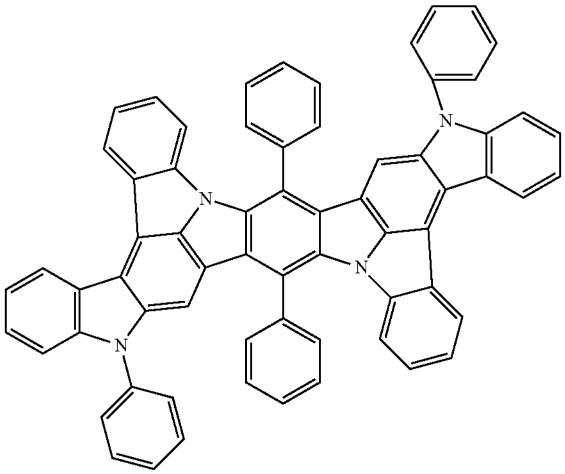
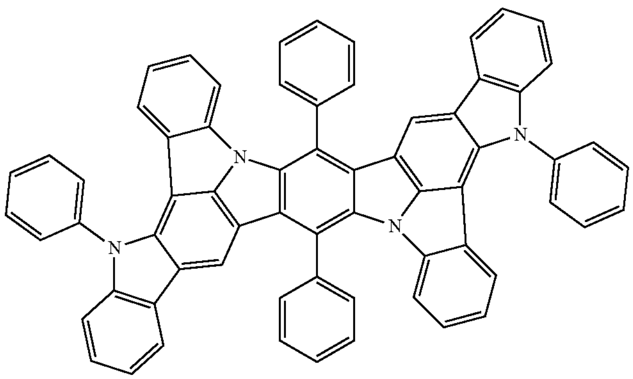
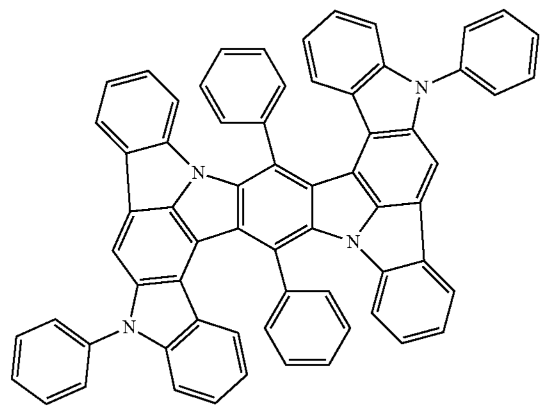
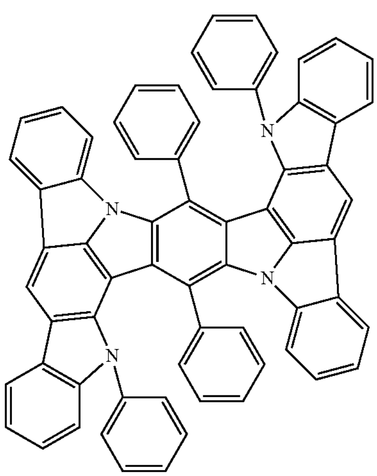
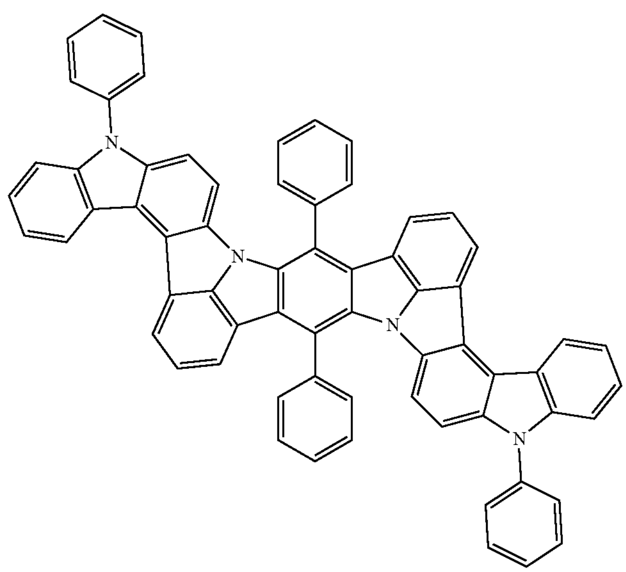

-continued
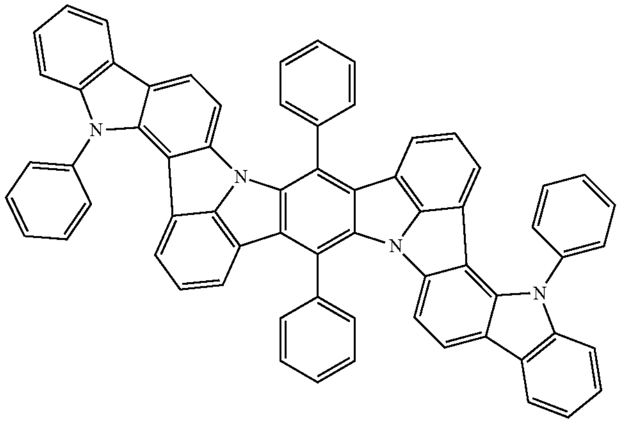
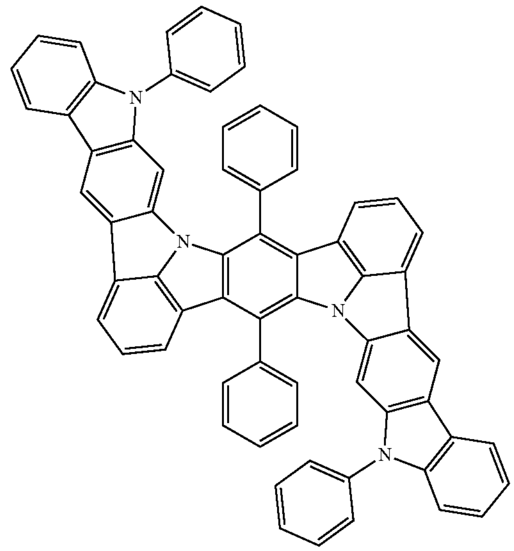
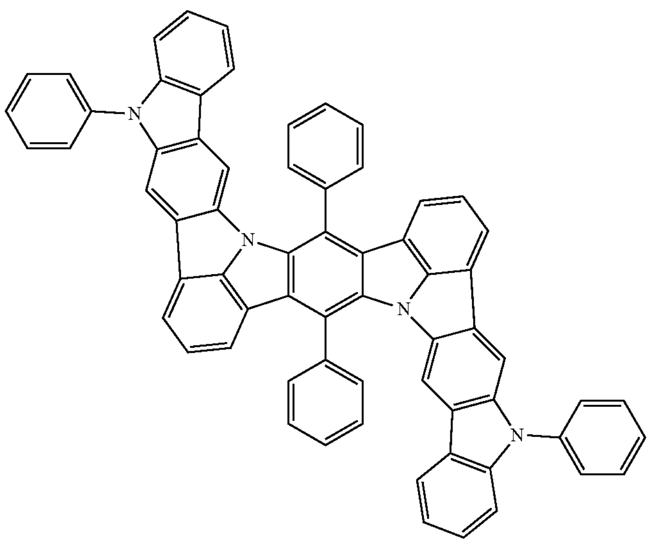
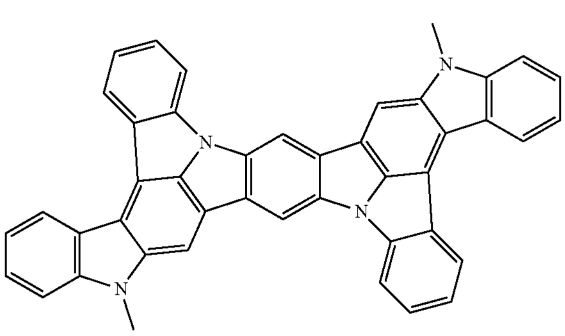
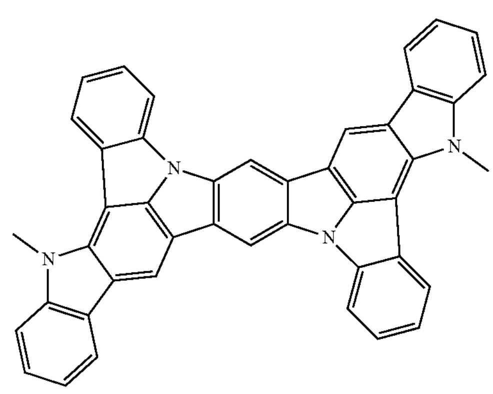

-continued
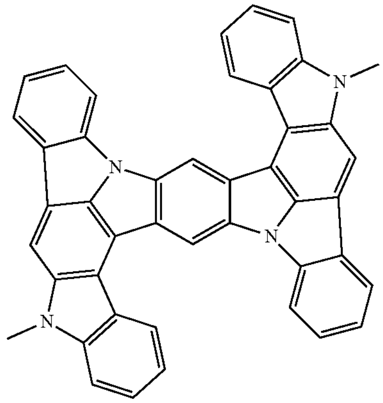
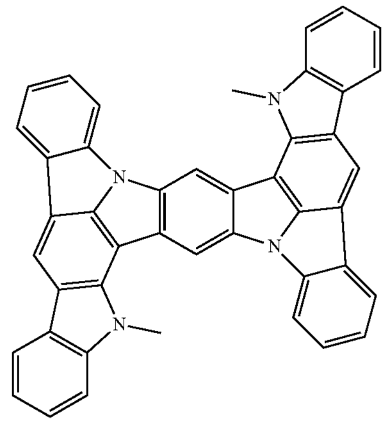
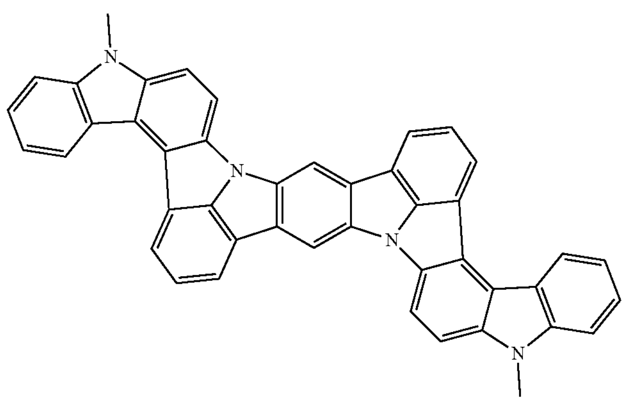
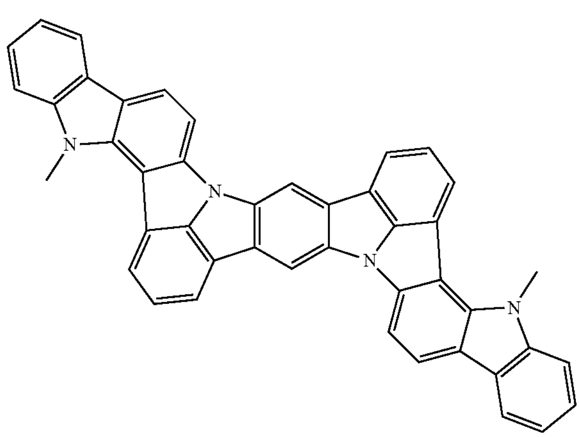
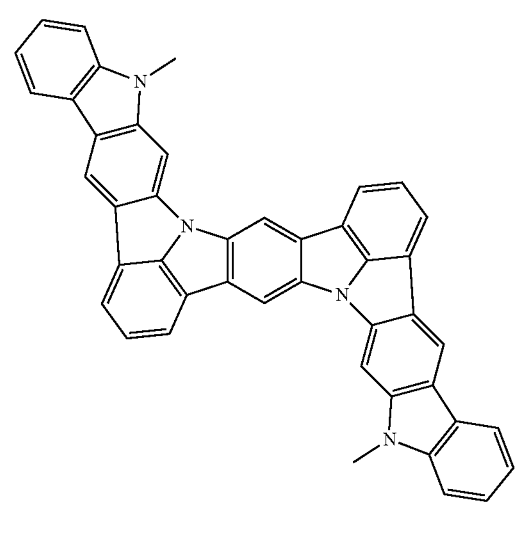

-continued
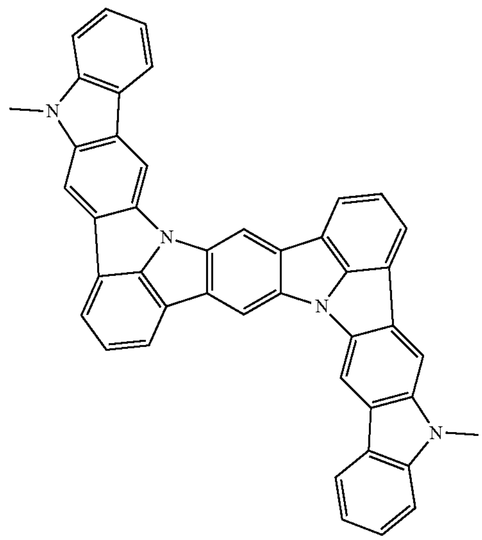
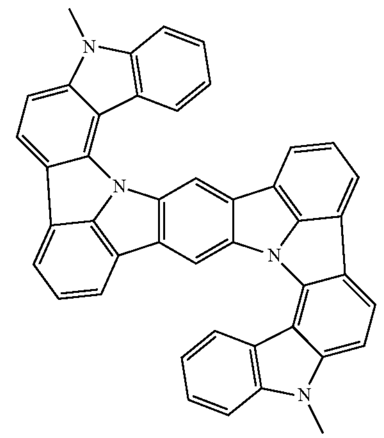
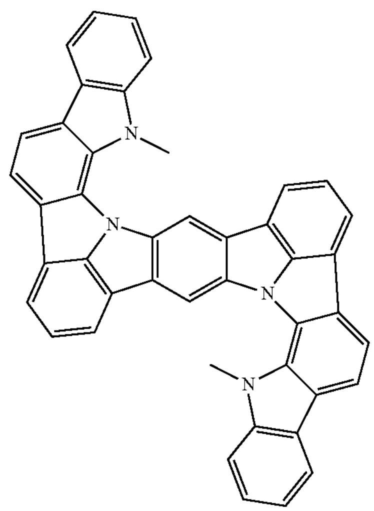
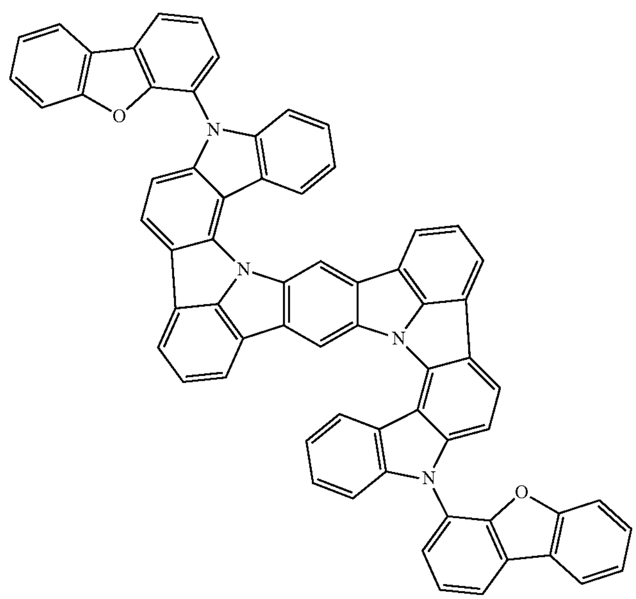
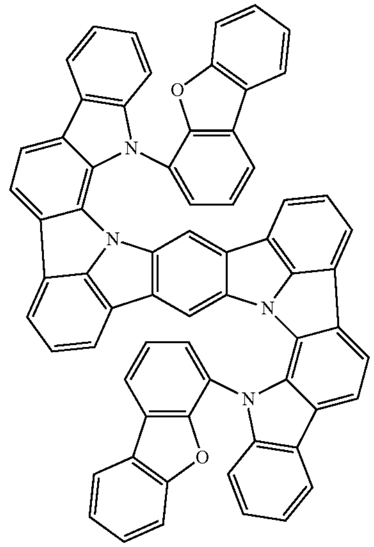
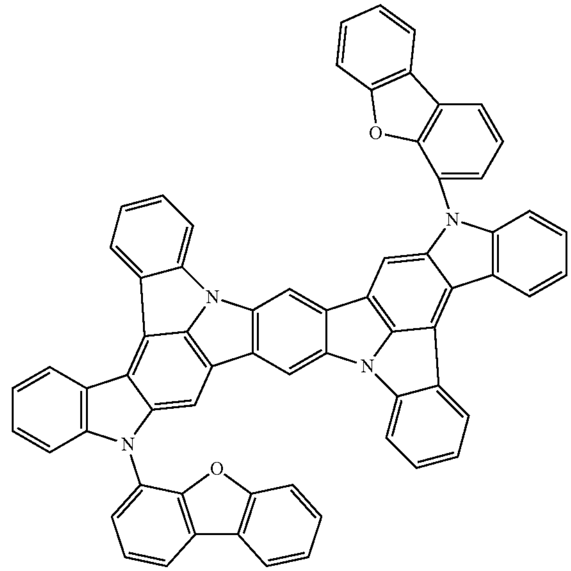

-continued
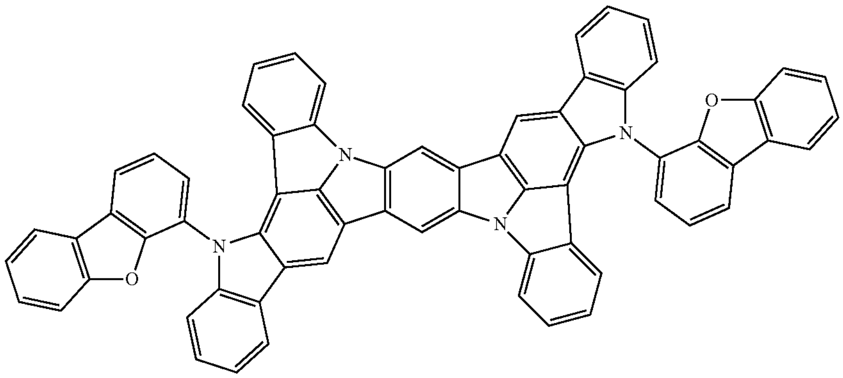
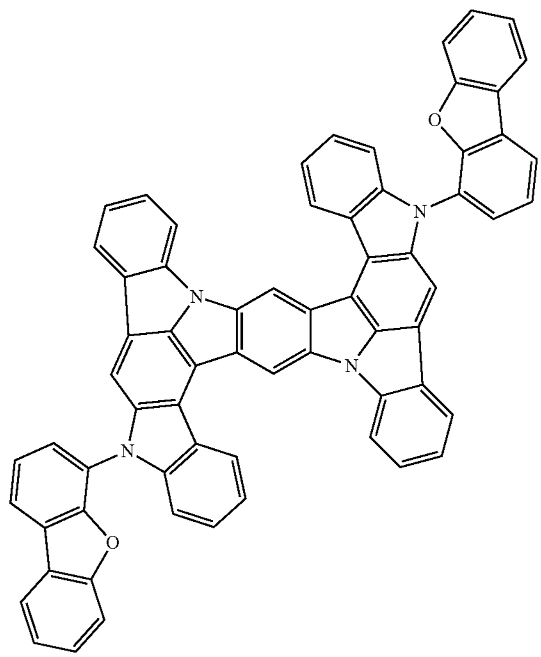
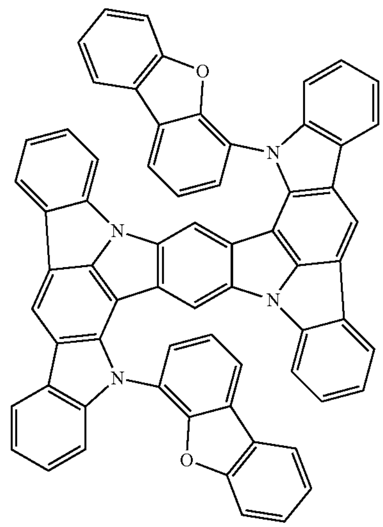
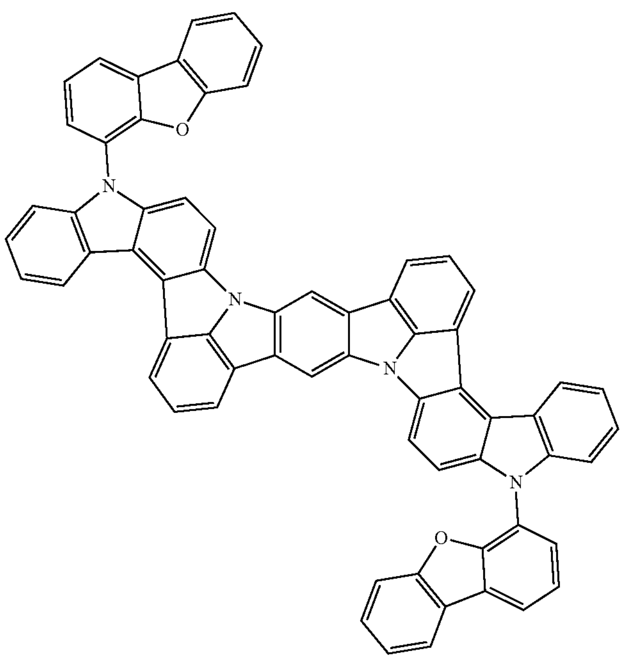

-continued
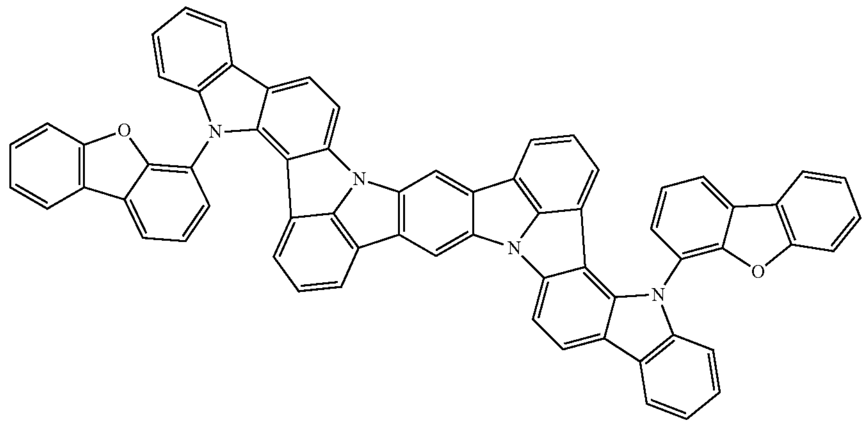
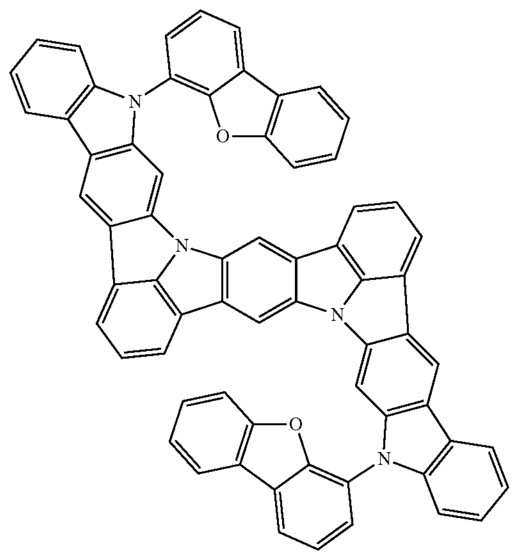
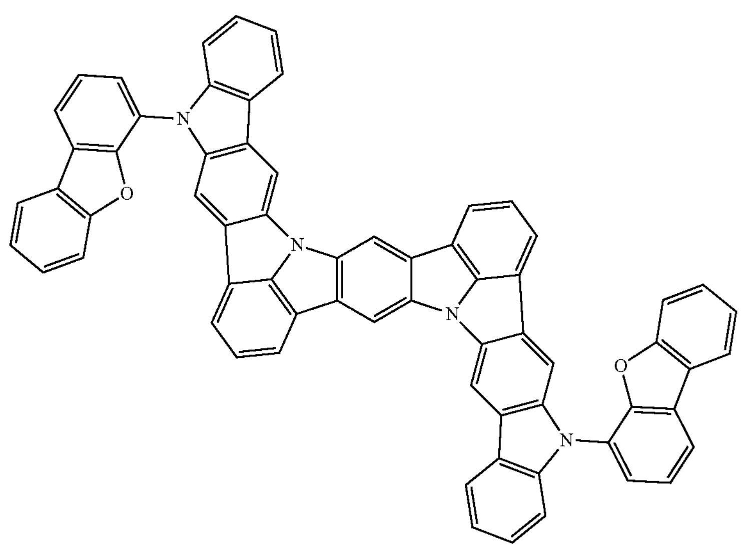

-continued
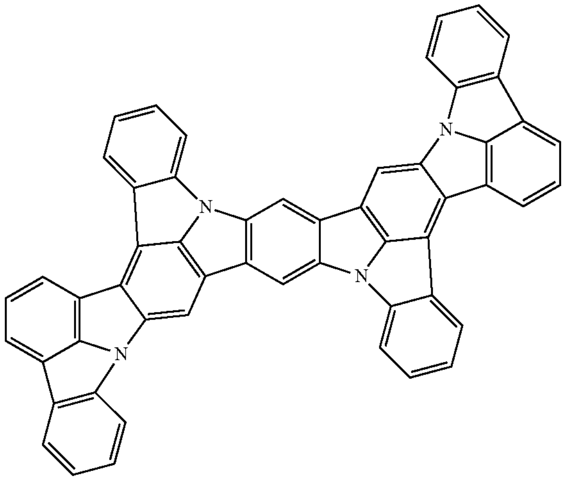
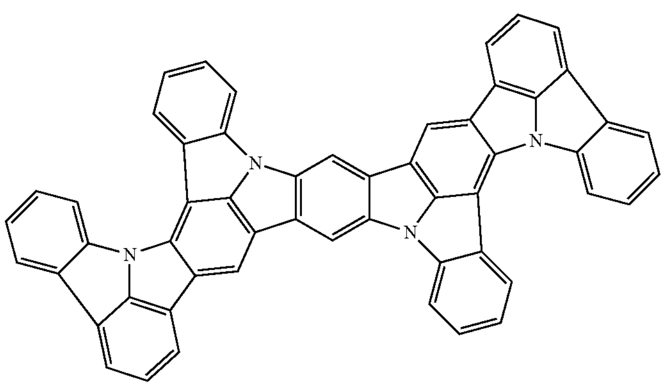
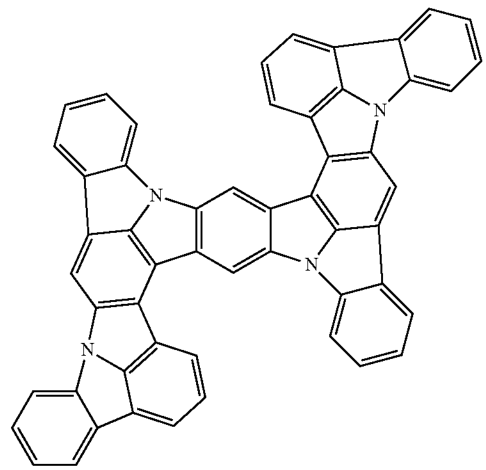
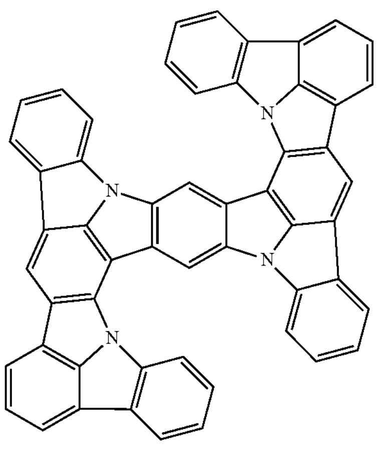
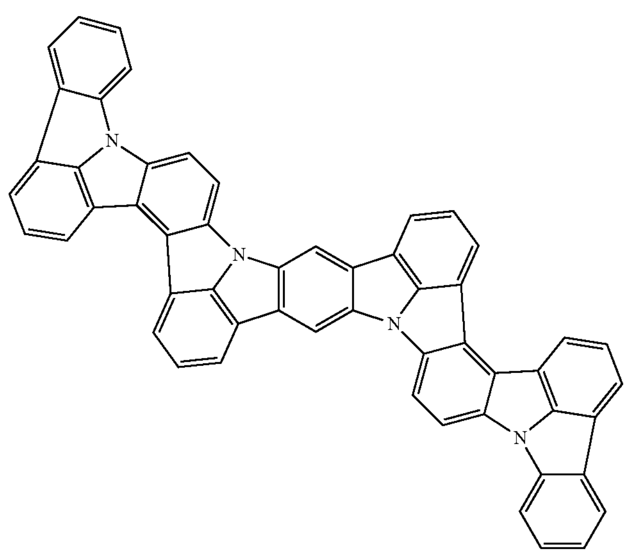

-continued
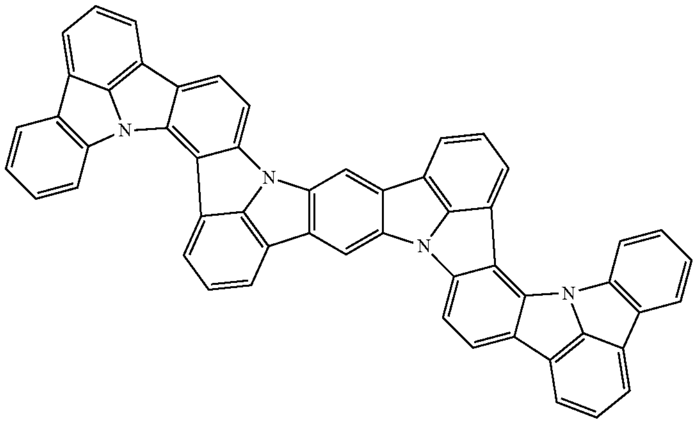
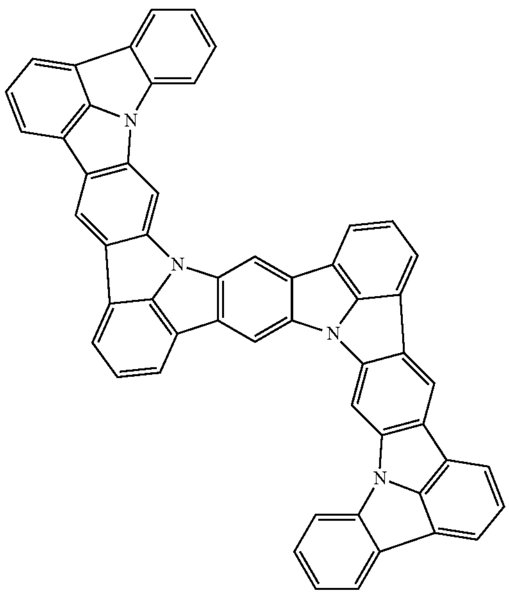
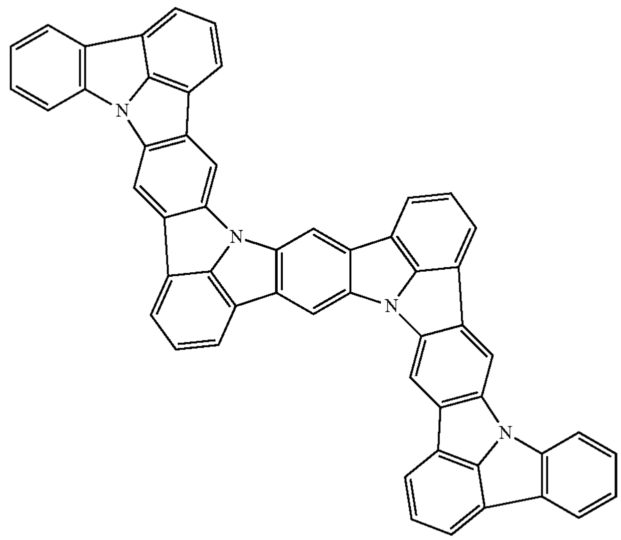
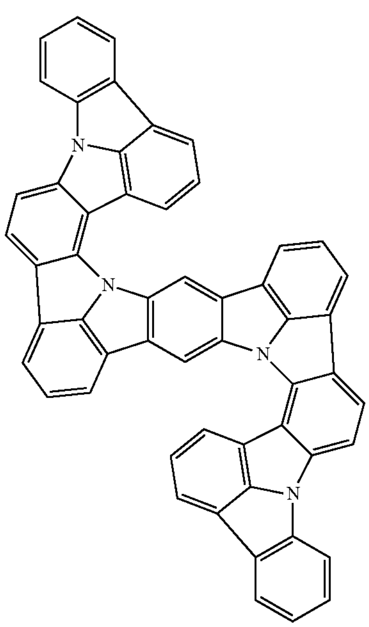
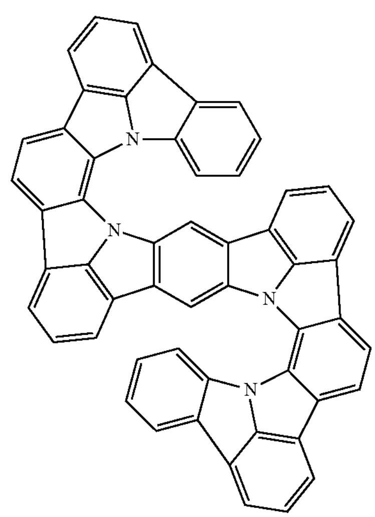

-continued
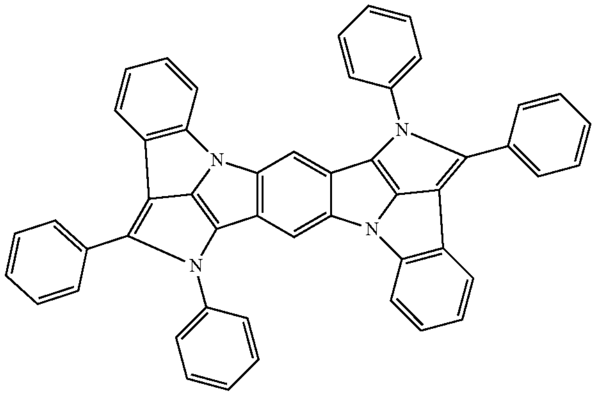
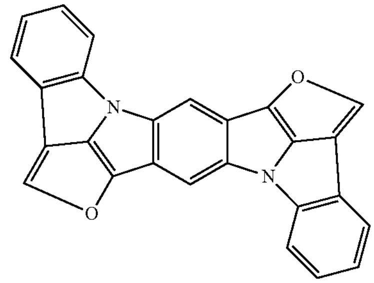
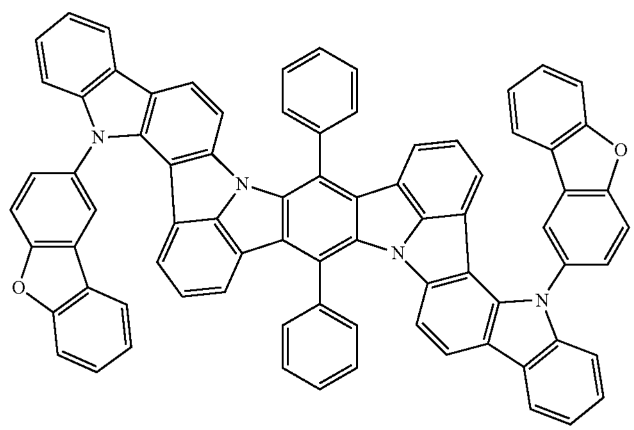
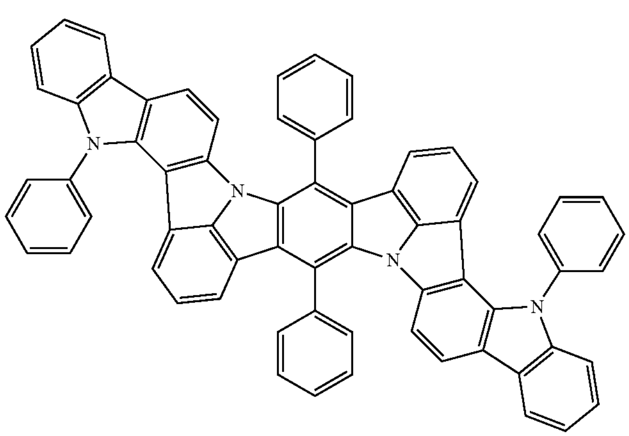
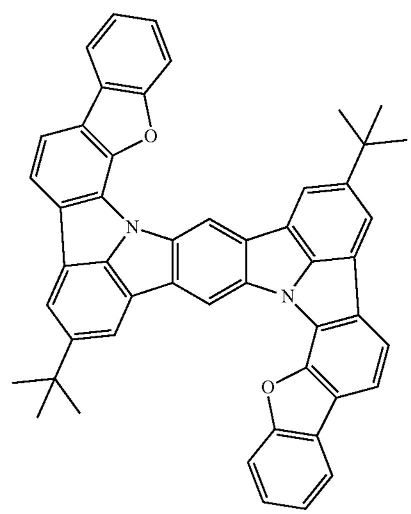

-continued

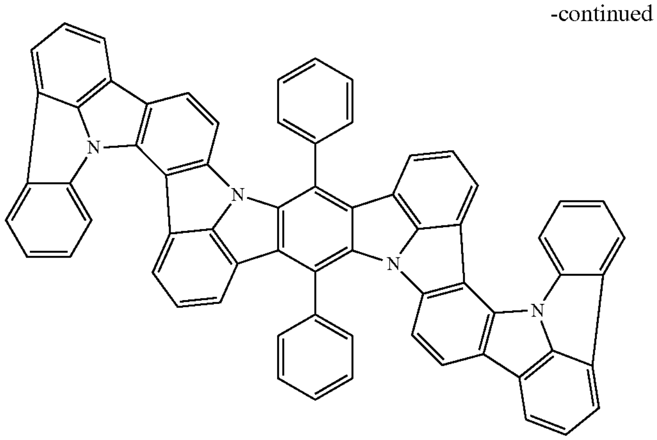

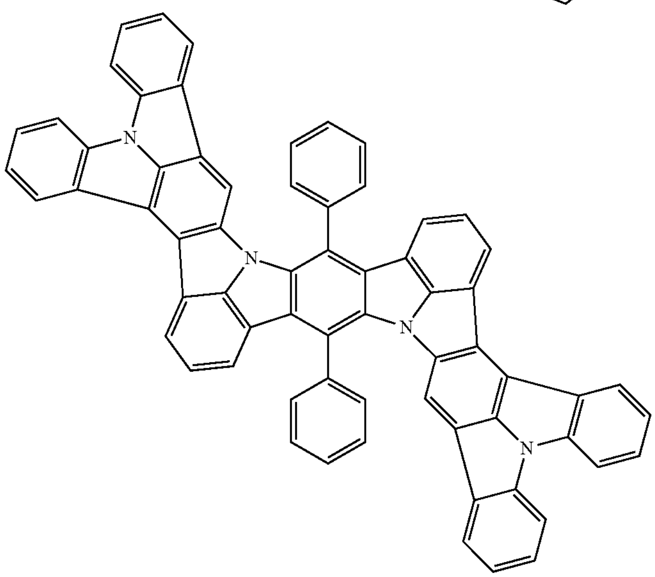

Compound Represented by Formula (6)

The compound represented by the formula (6) will be described.

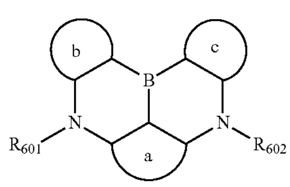

(6)

In the formula (6):

a ring, b ring and c ring are each independently a substituted or unsubstituted aromatic hydrocarbon ring having 6 to 50 ring carbon atoms, or a substituted or unsubstituted heterocycle having 5 to 50 ring atoms;

$R_{601}$ and $R_{602}$ are each independently bonded to the a ring, the b ring or the c ring to form a substituted or unsubstituted heterocycle, or not bonded to form no substituted or unsubstituted heterocycle; and $R_{601}$ and $R_{602}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

Specific Examples of Compound Represented by Formula (6)

Specific examples of the compound represented by the formula (6) are shown below. It should however be noted that these specific examples are merely exemplary and do not limit the compound represented by the formula (6).

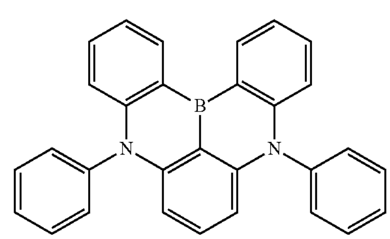

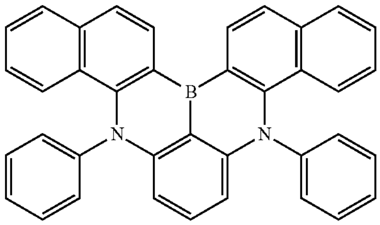
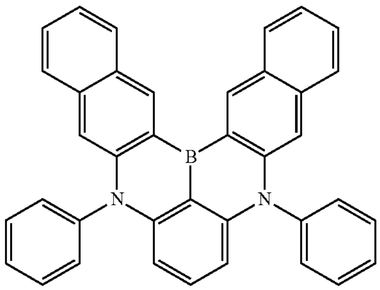
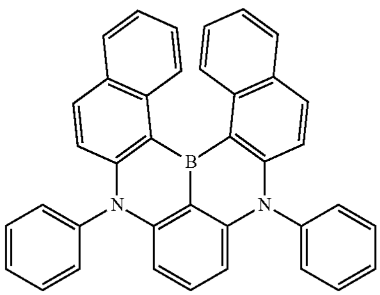
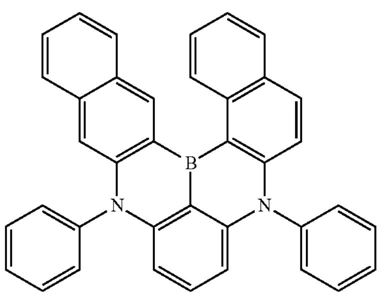
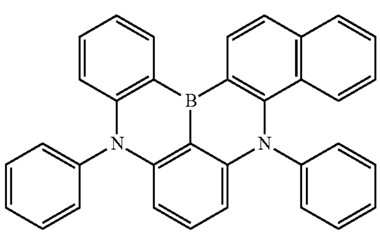
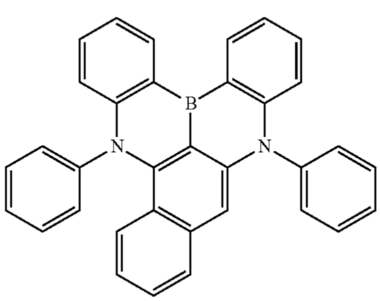
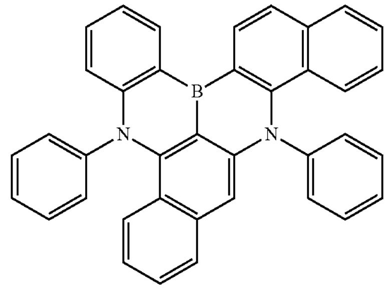
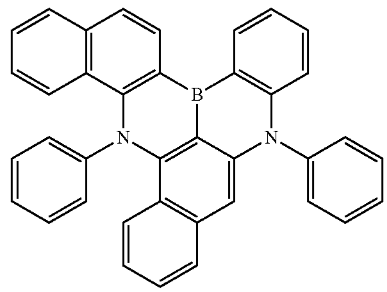
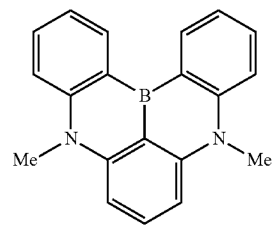
Me
Me
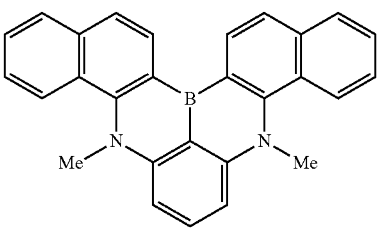
Me
Me
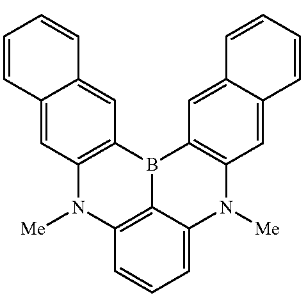
Me
Me
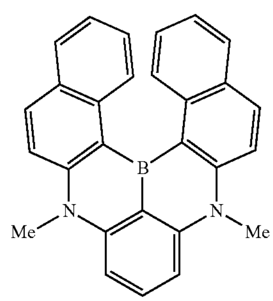
Me
Me
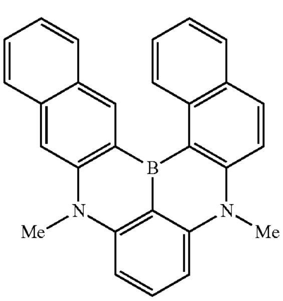
Me
Me -continued
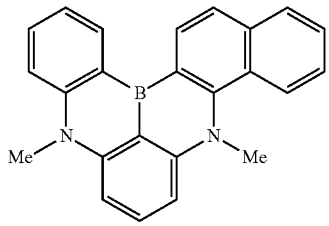
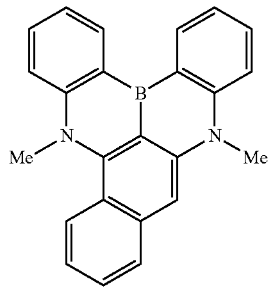
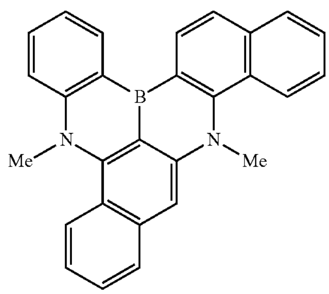
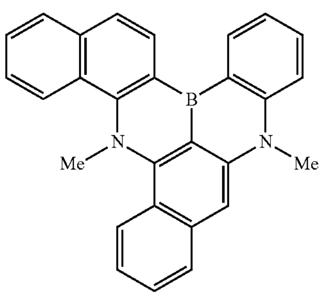
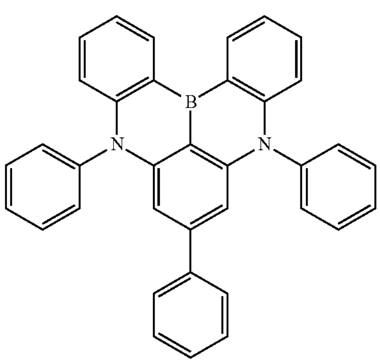
-continued
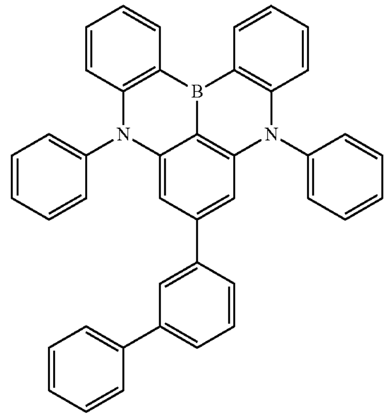
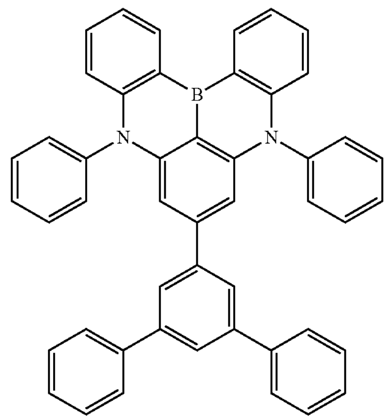
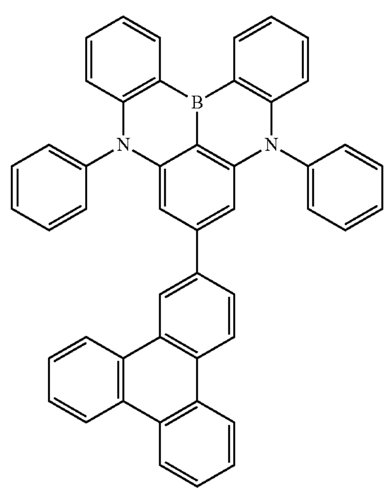

-continued
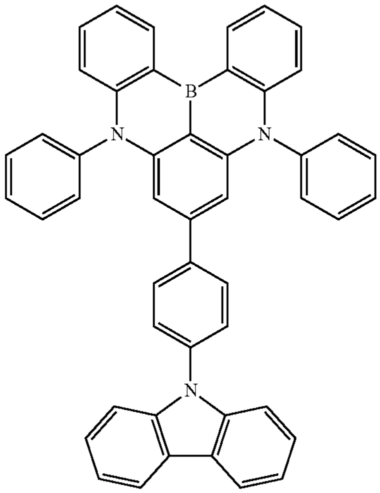
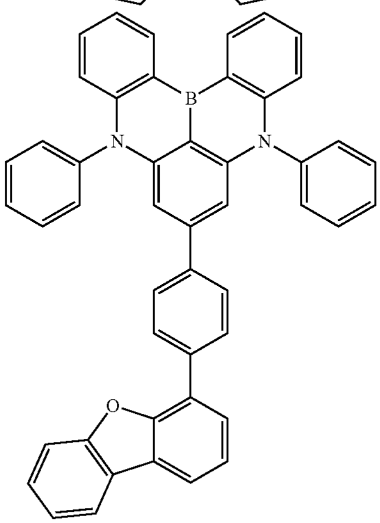
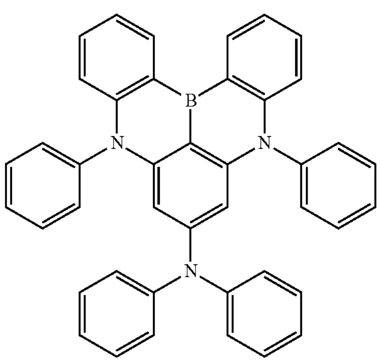
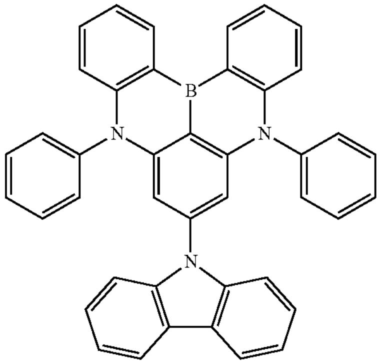
-continued
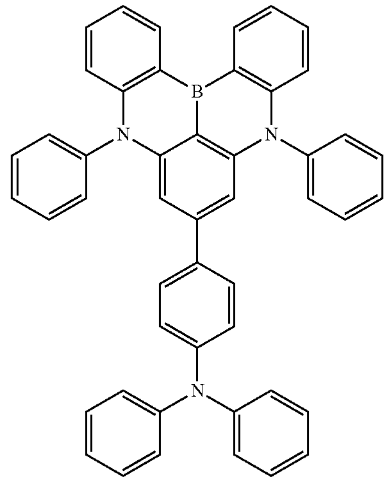
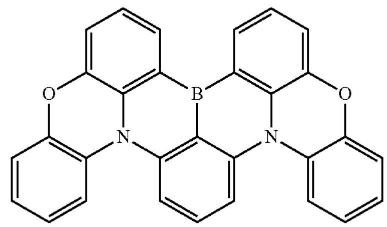
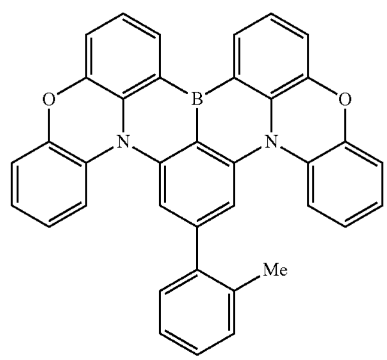
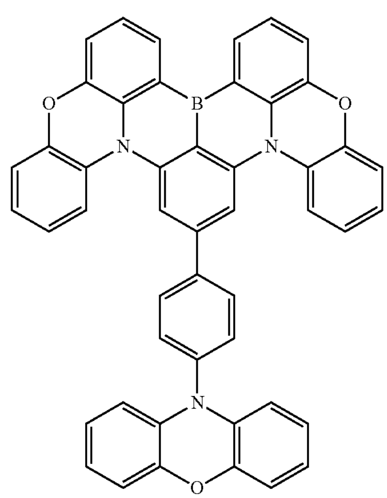

-continued
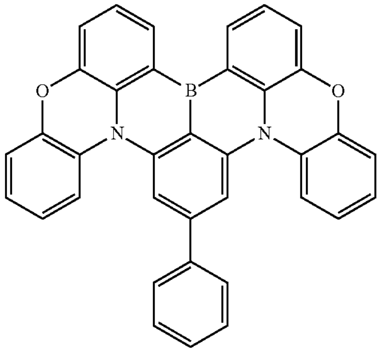
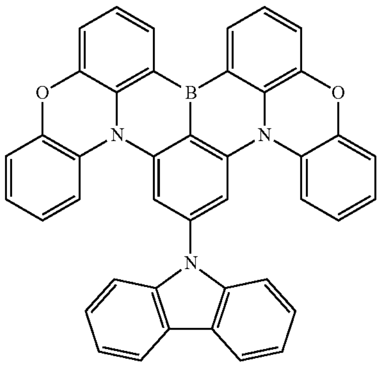
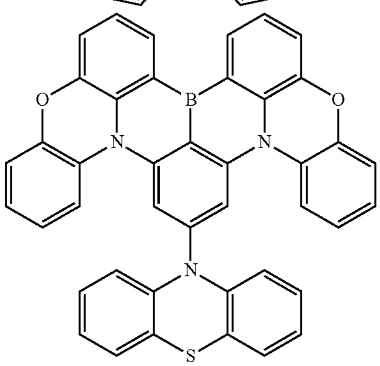
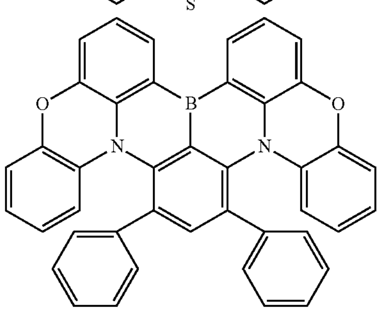
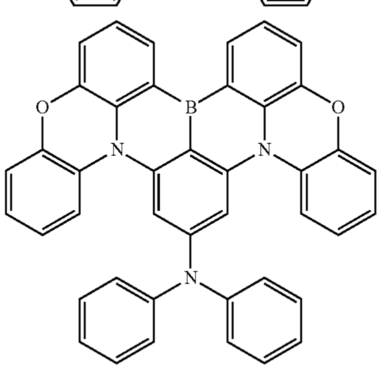
-continued
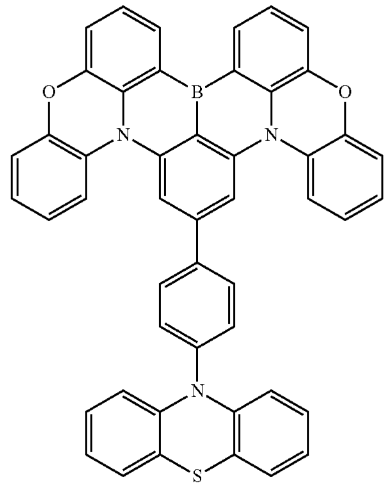
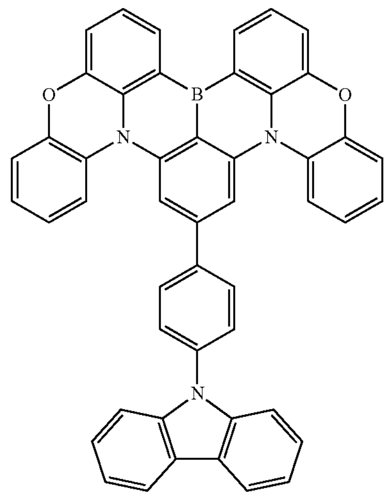
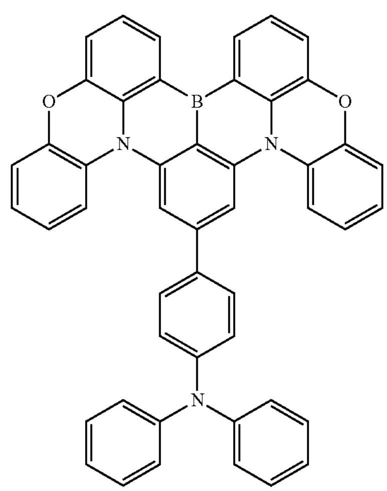

-continued
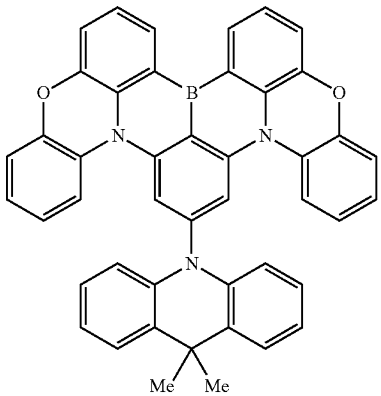
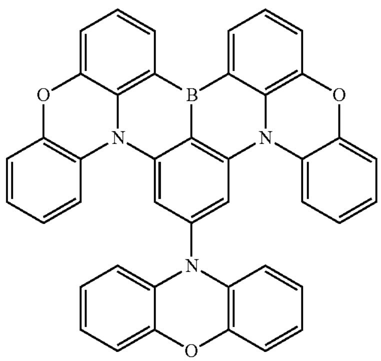
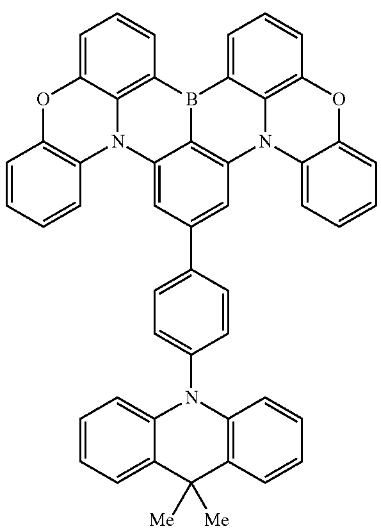
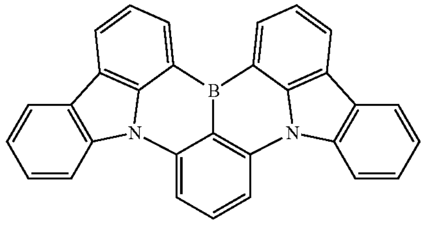
-continued
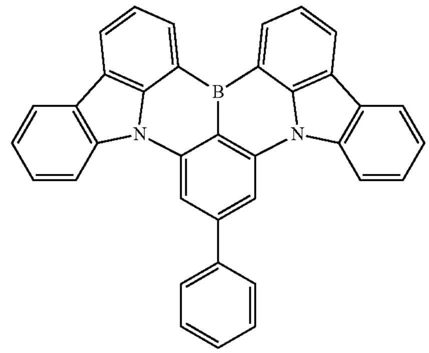
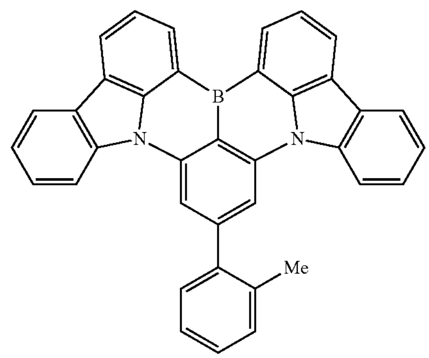
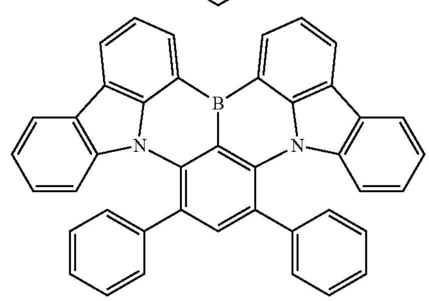
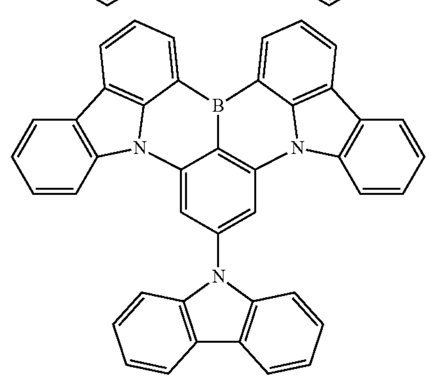
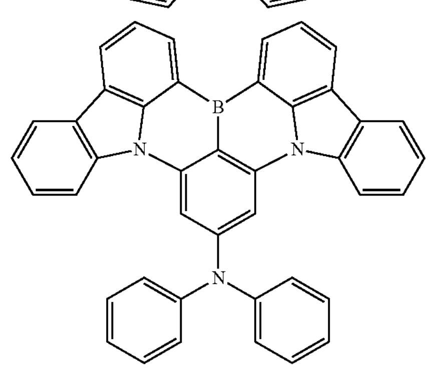

-continued
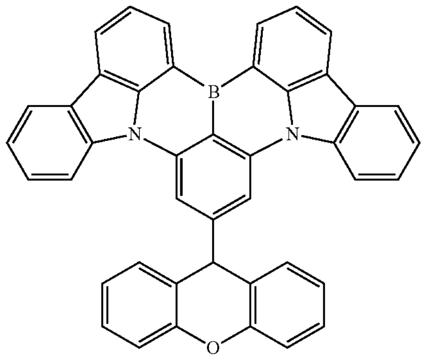
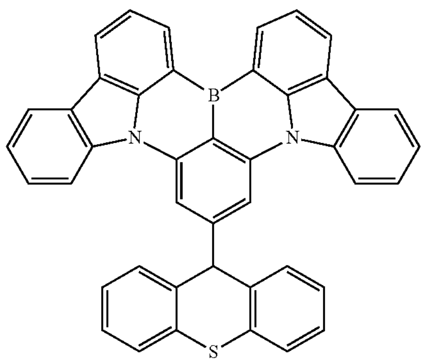
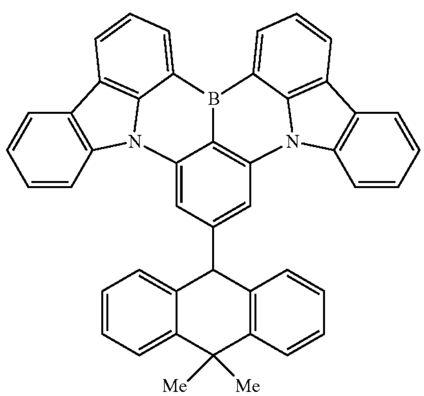
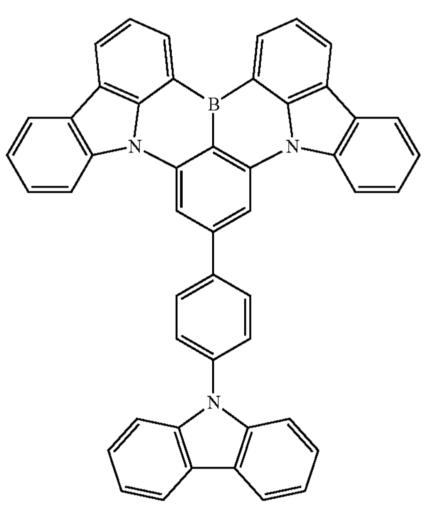
-continued
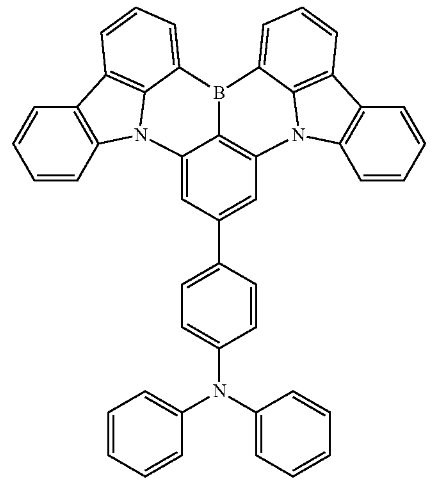
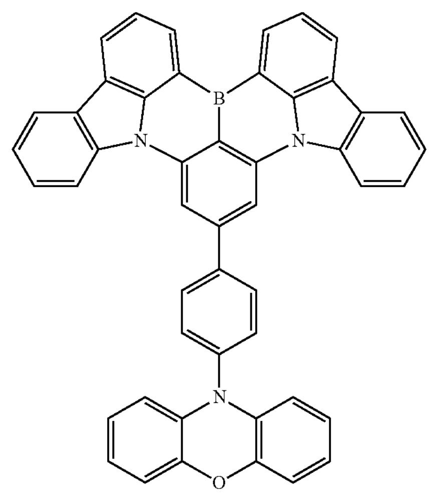
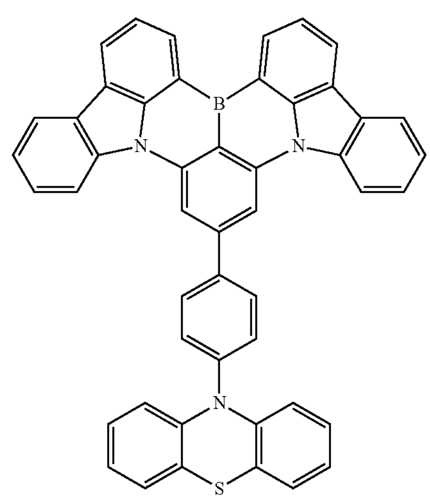

-continued
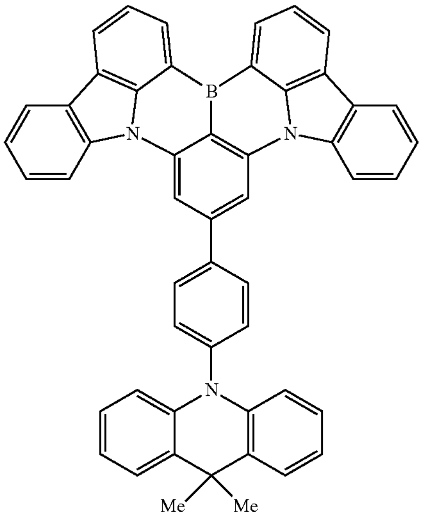
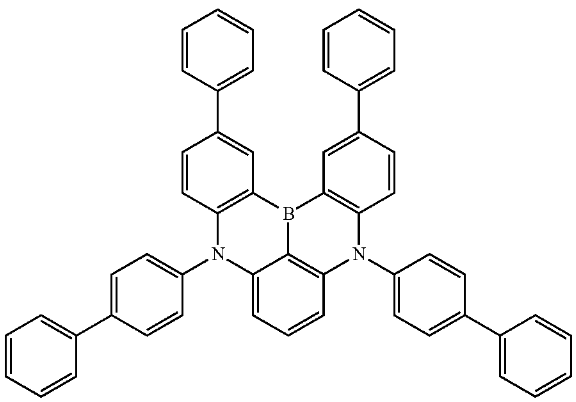
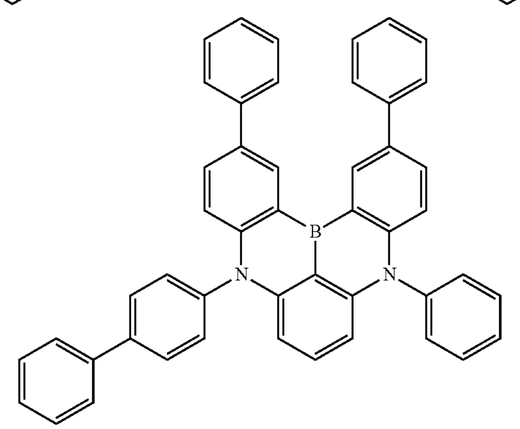
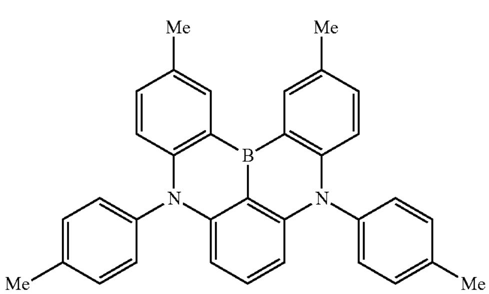
-continued
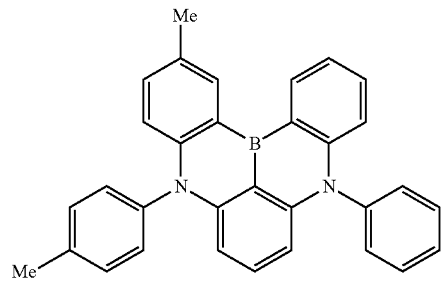
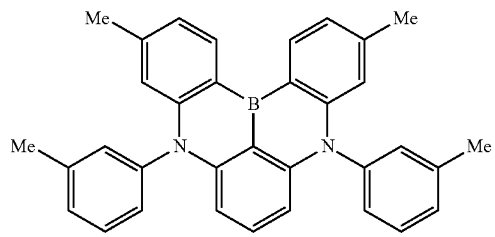
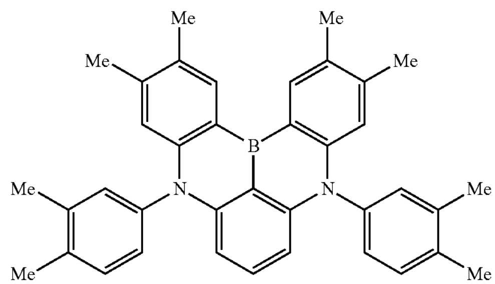
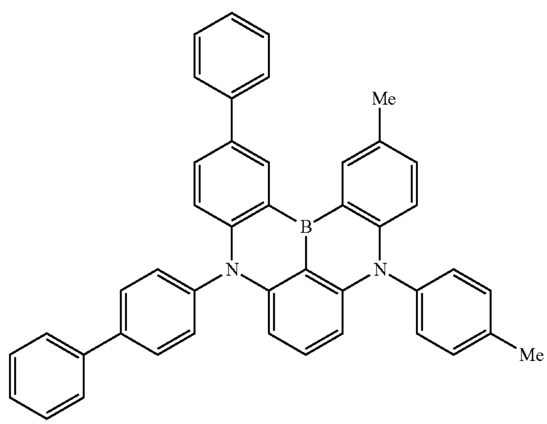
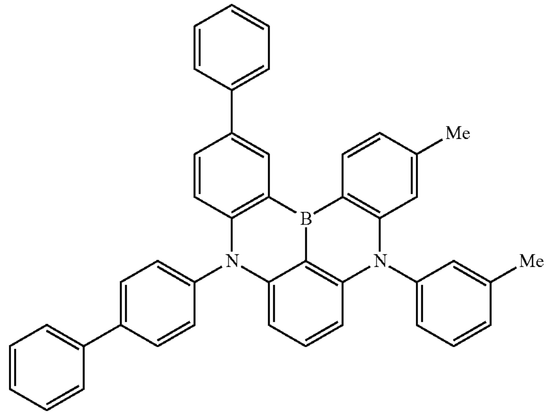

-continued
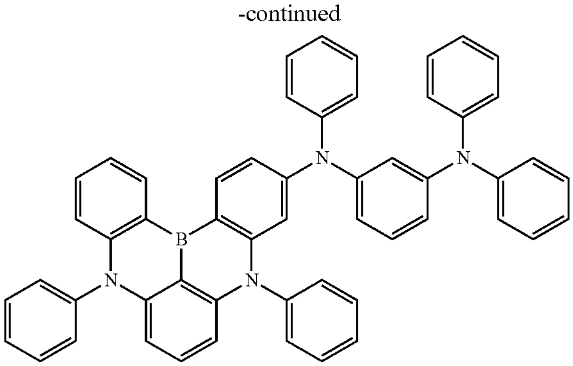
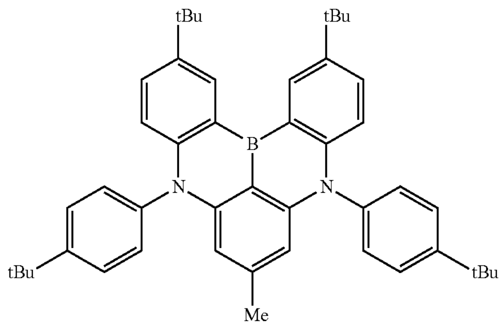
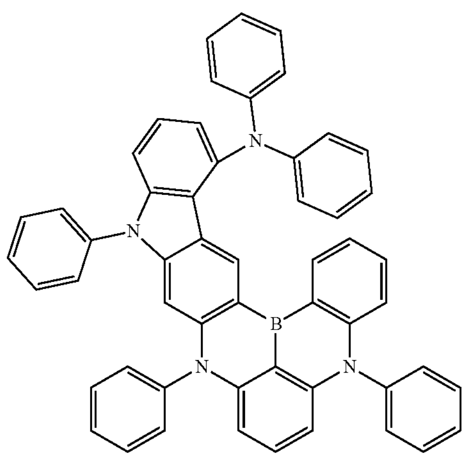
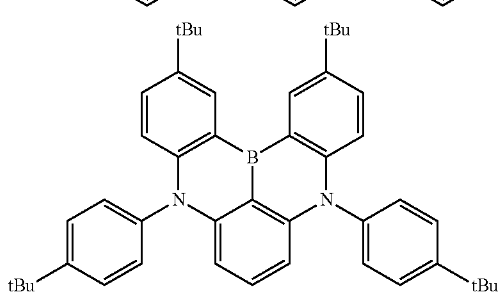
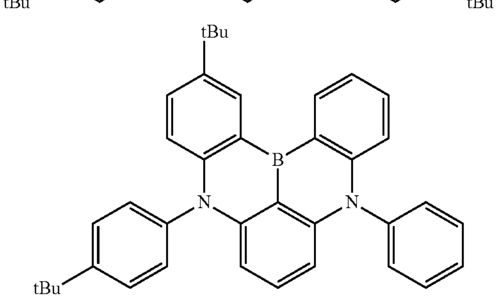
-continued
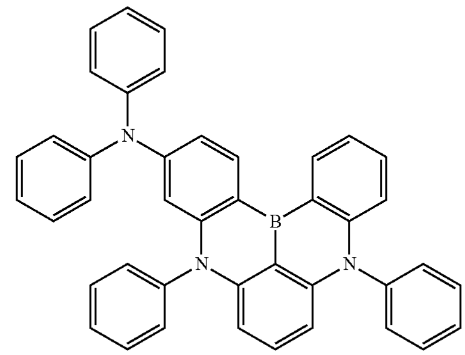
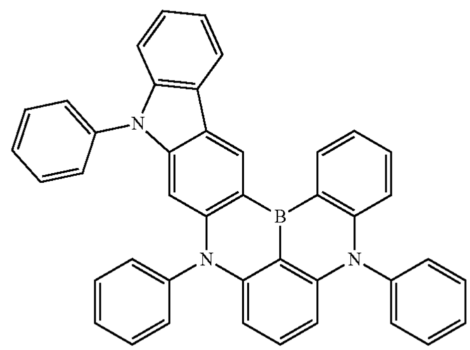
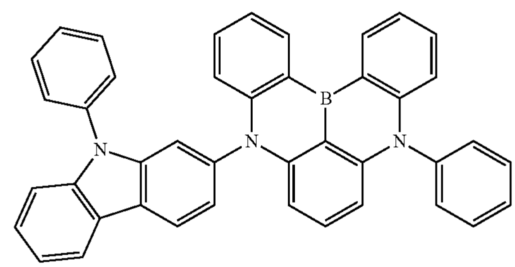
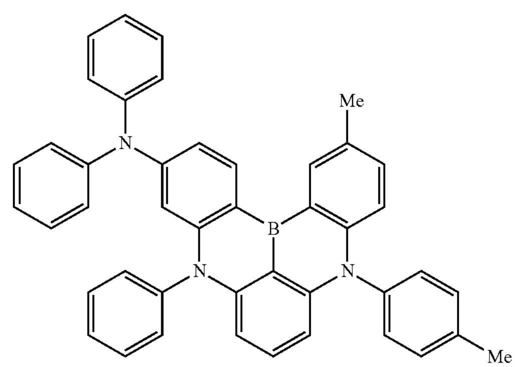
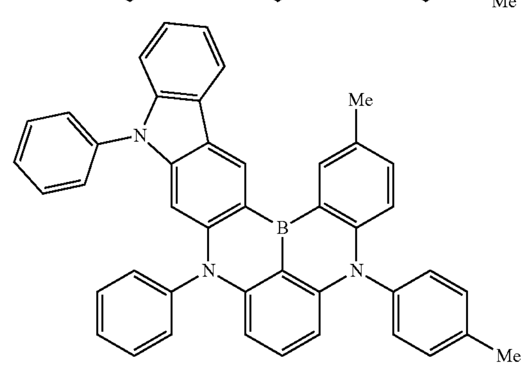

-continued
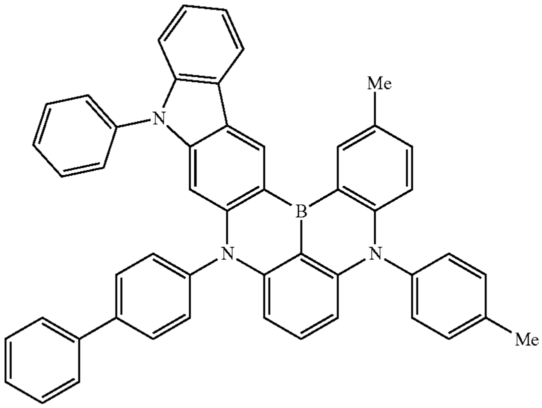
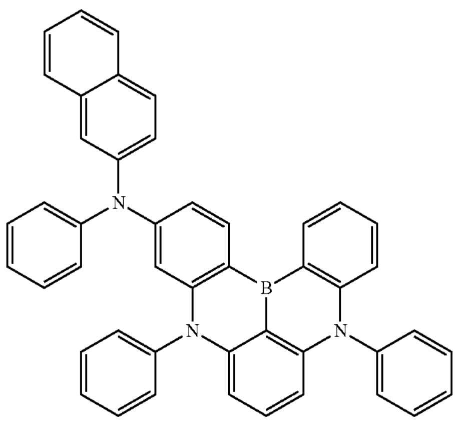
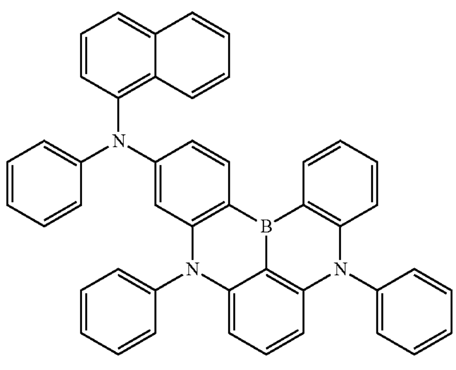
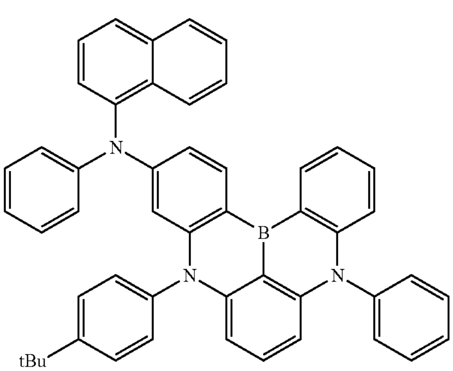
-continued
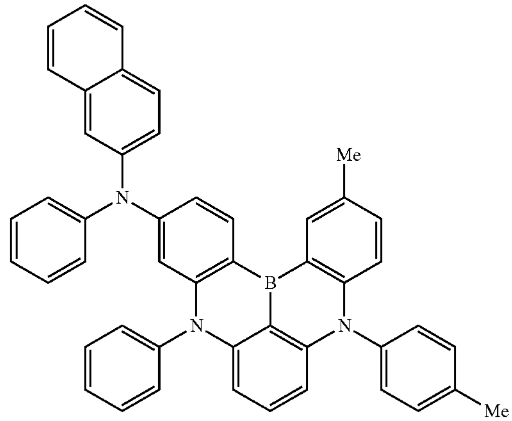
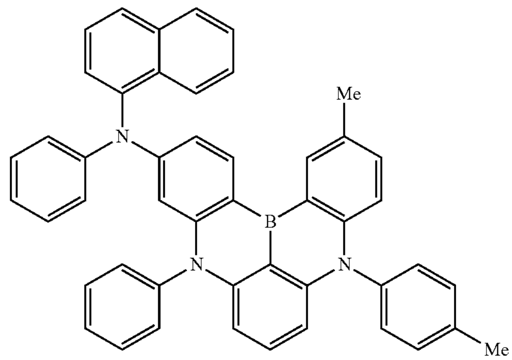
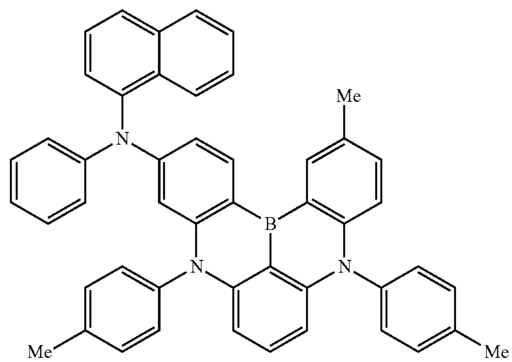
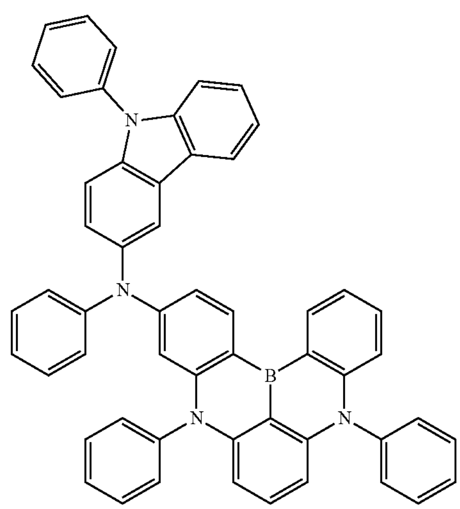

-continued
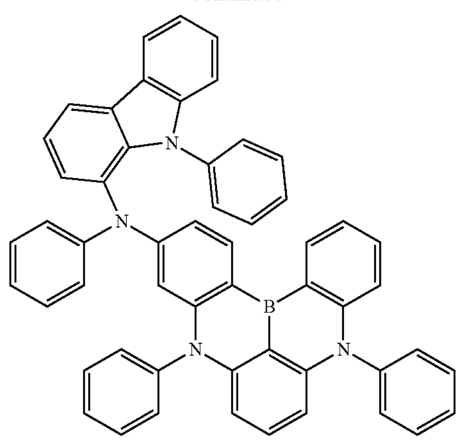
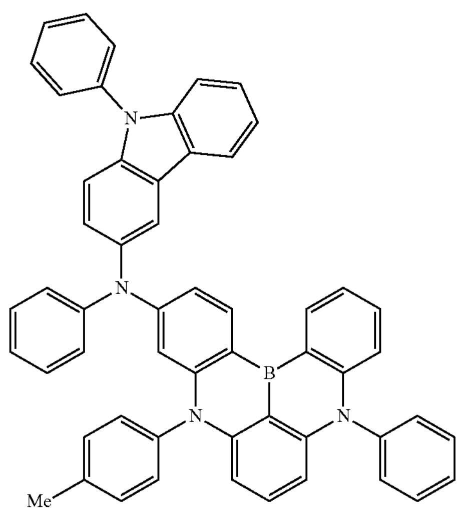
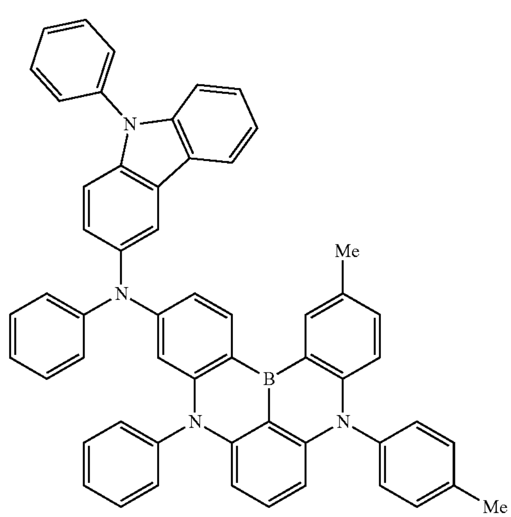
-continued
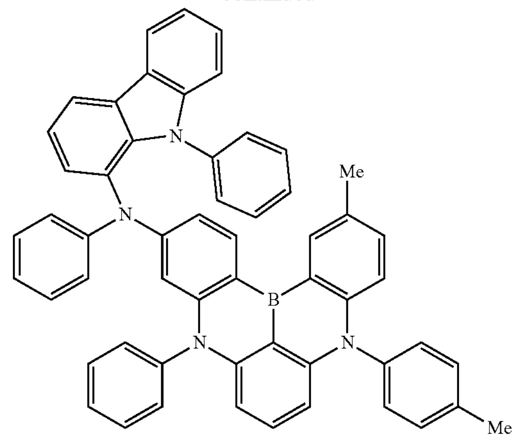
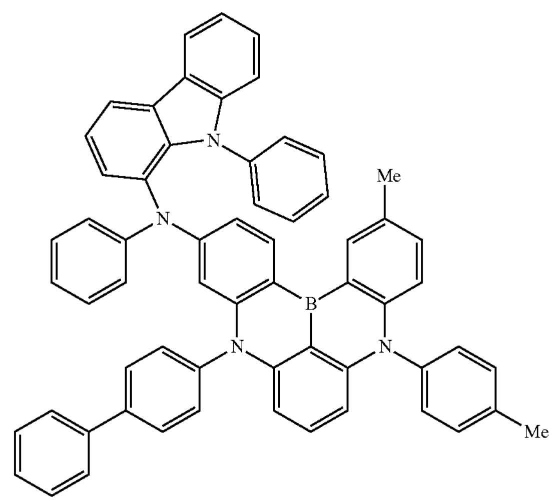
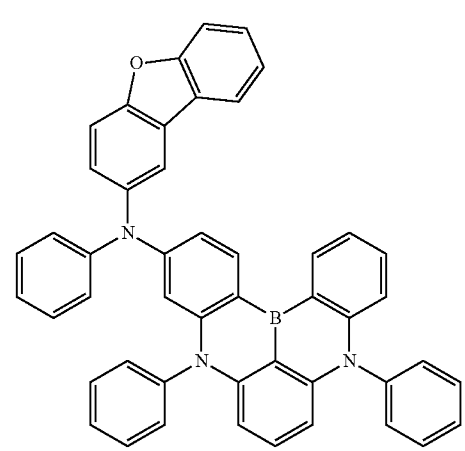

-continued
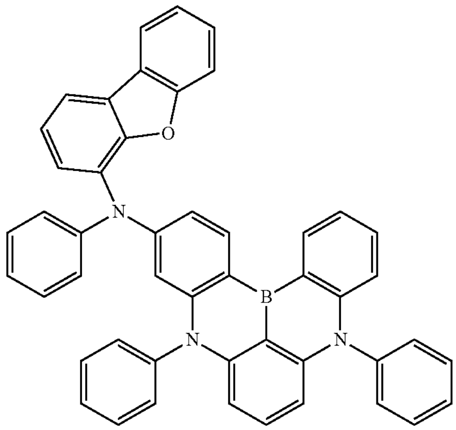
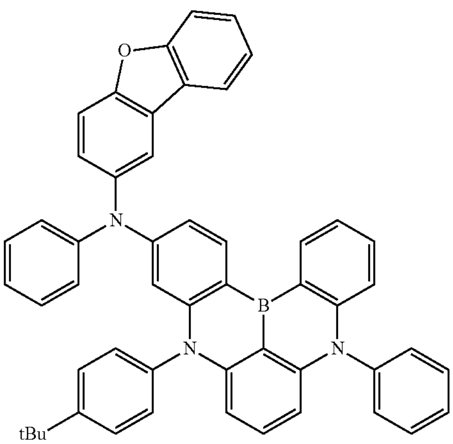
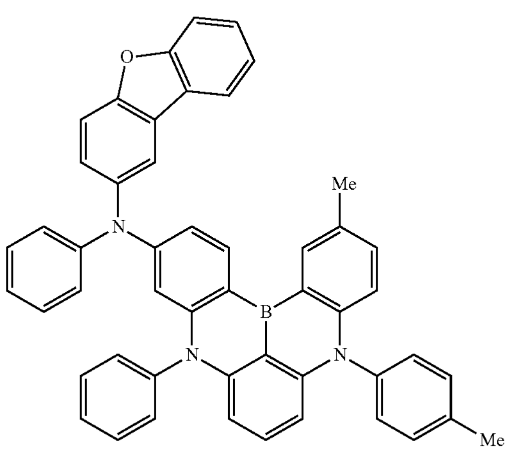
-continued
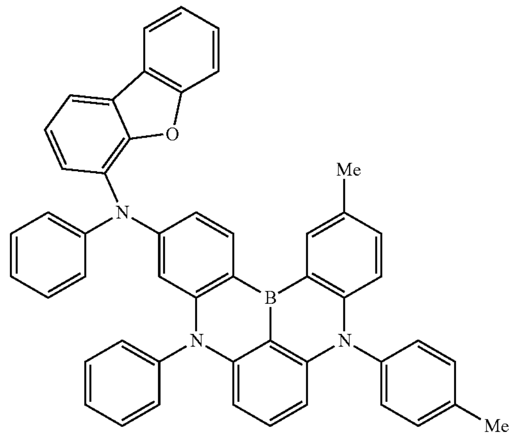
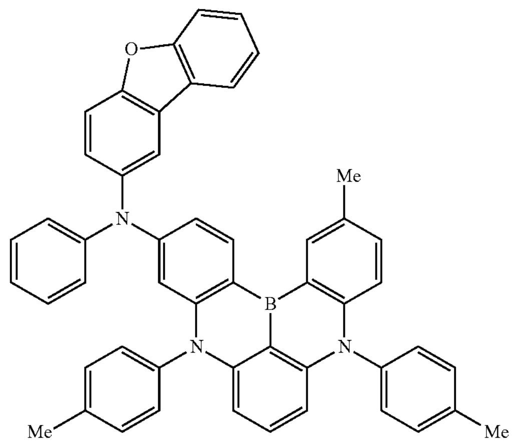
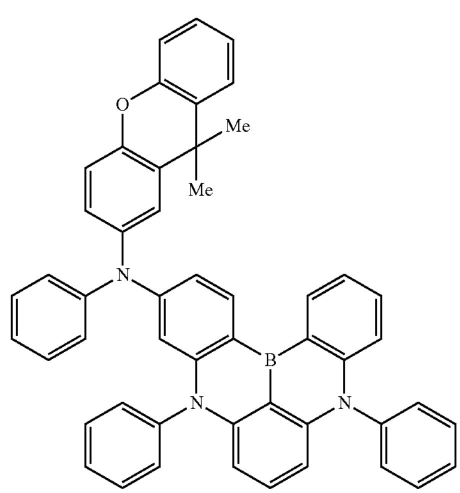

-continued
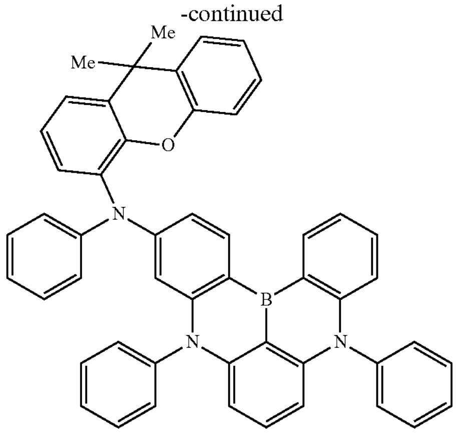
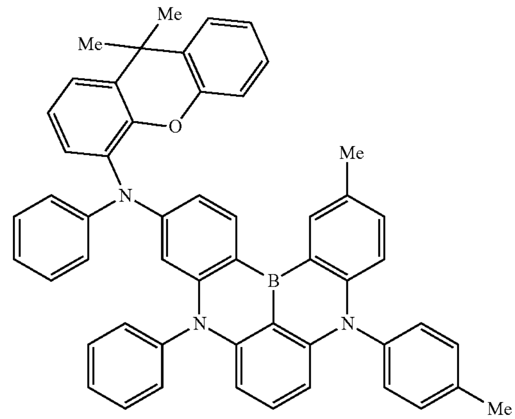
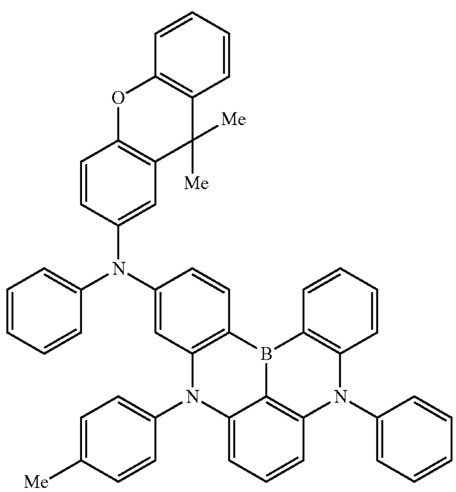
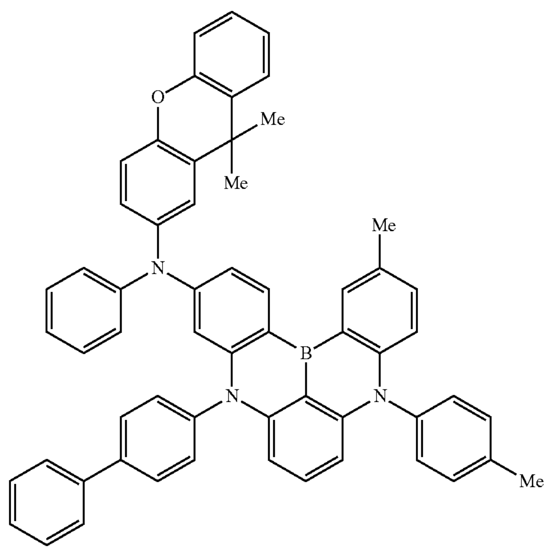
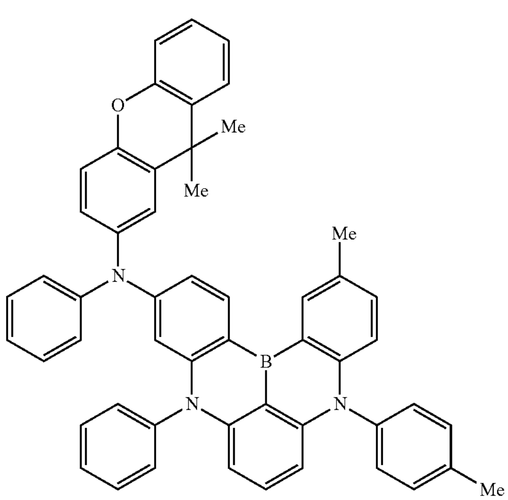
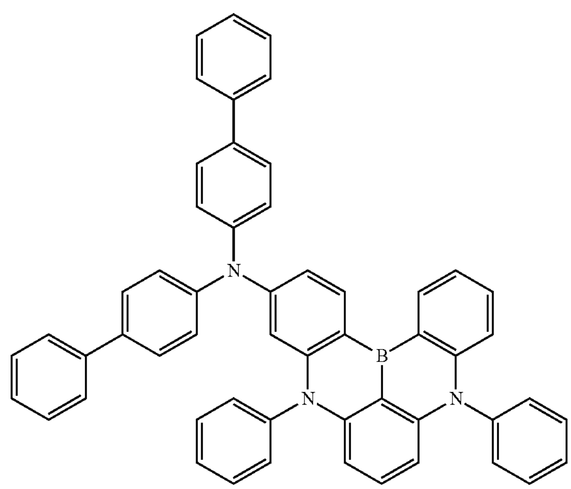

-continued
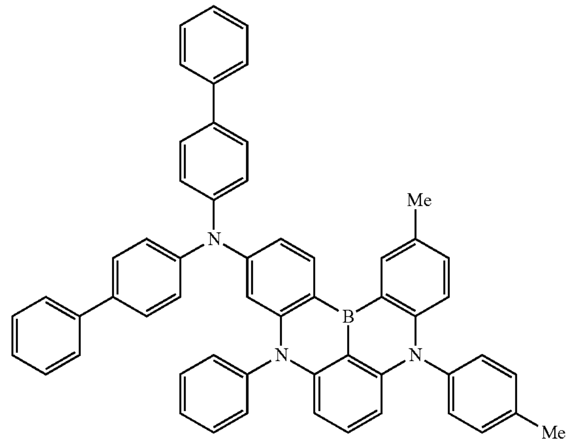
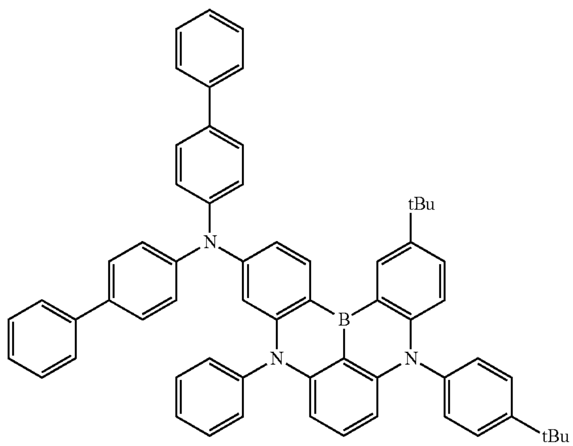
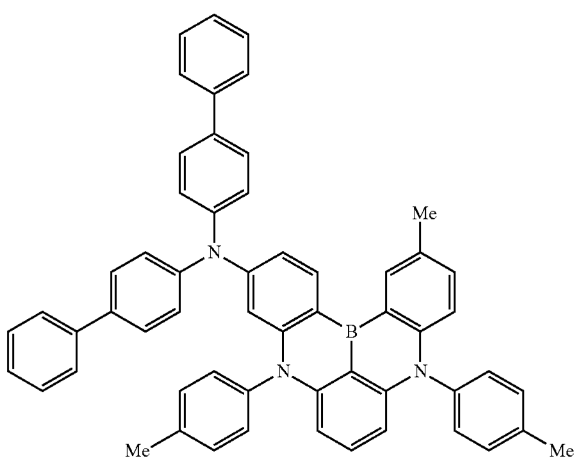
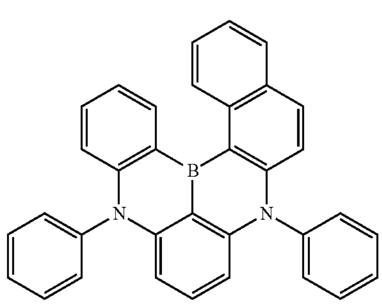
-continued
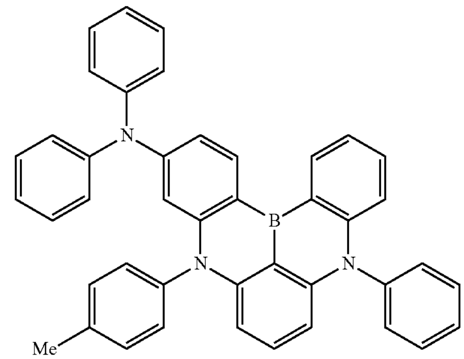
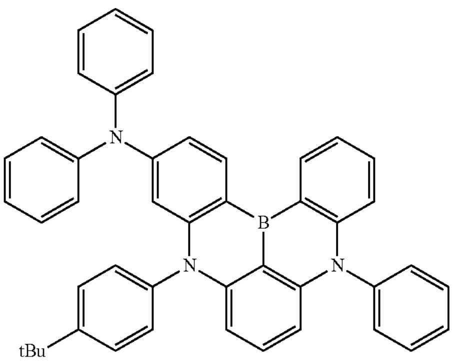
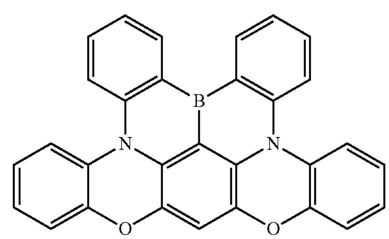
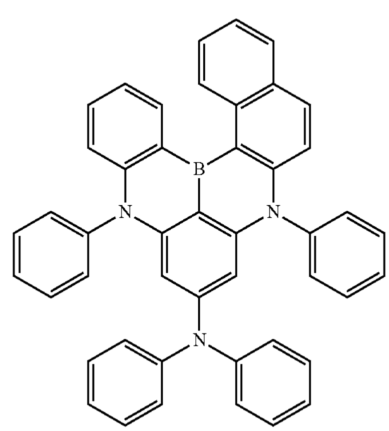

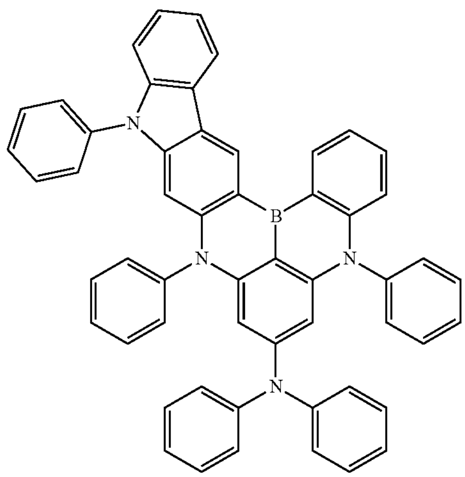
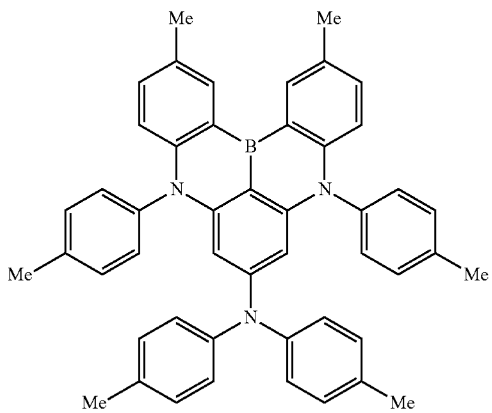
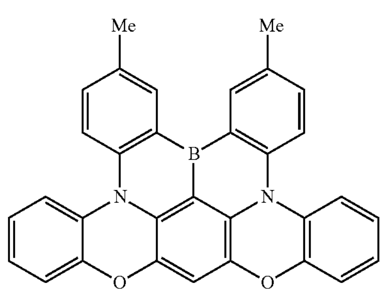
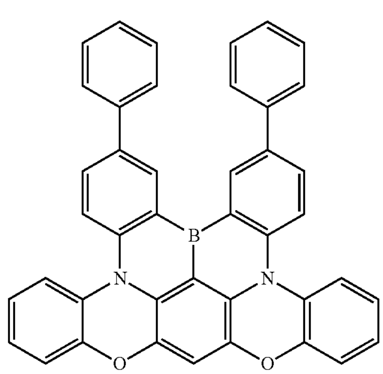
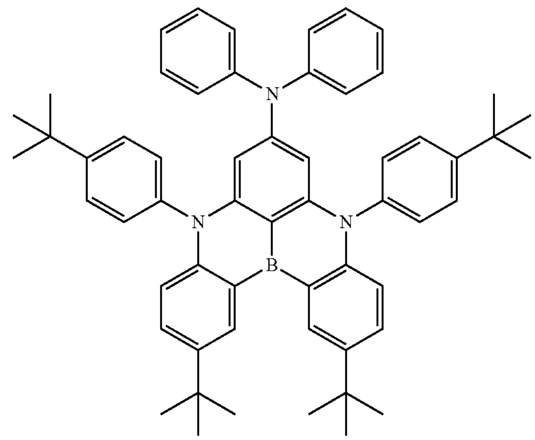
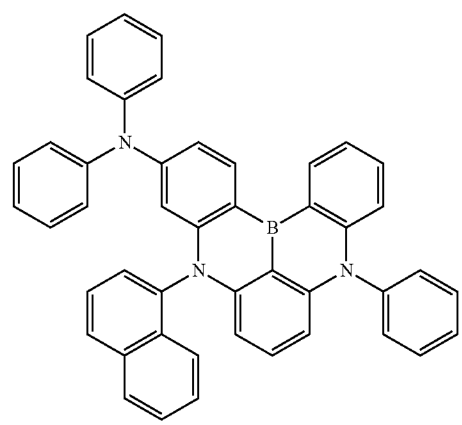
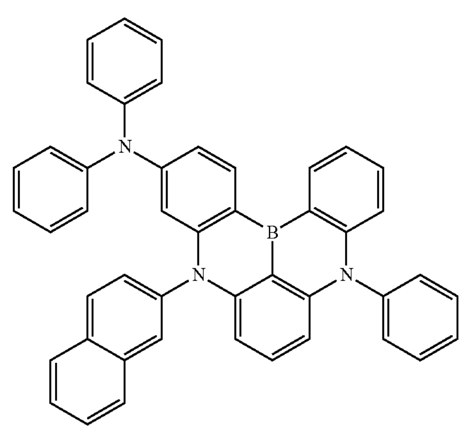

-continued
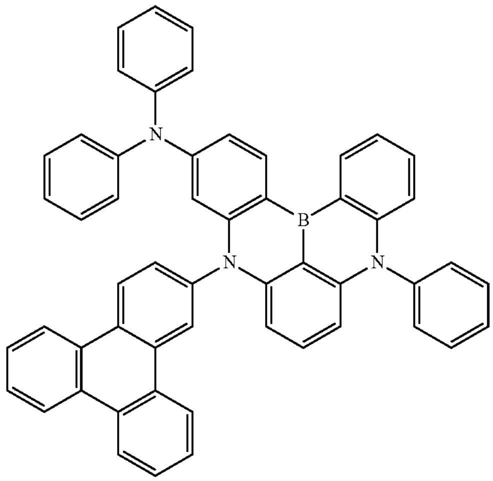
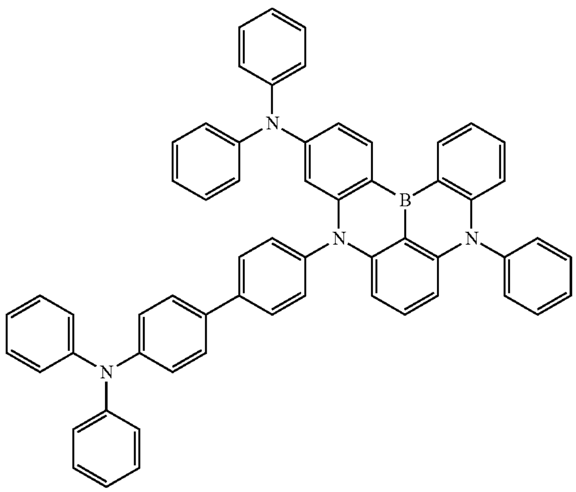
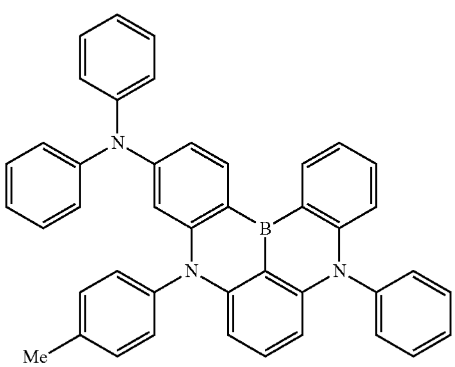
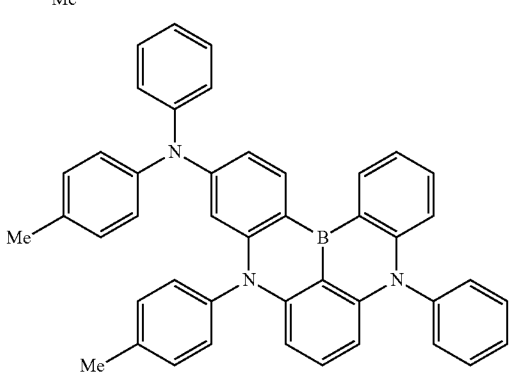
-continued
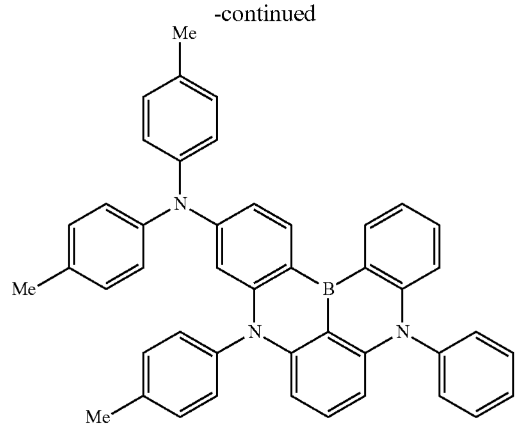
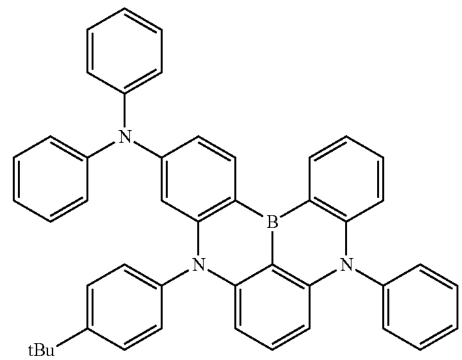
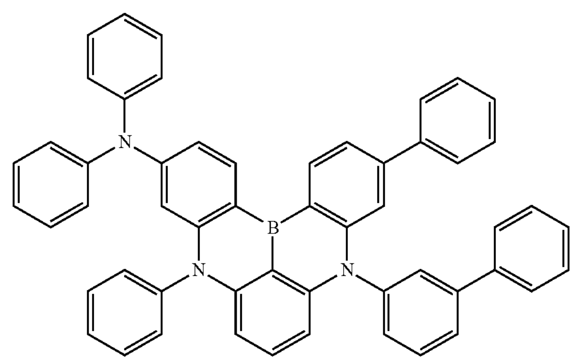
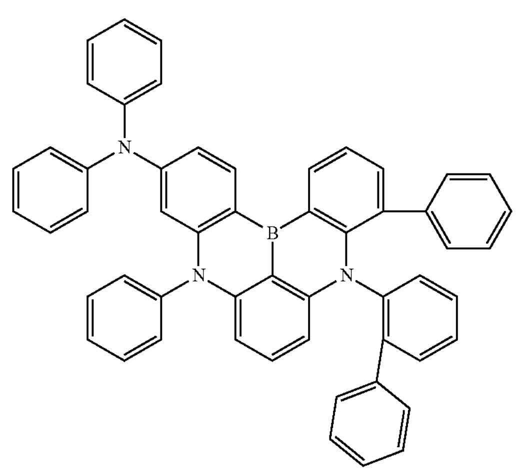

-continued
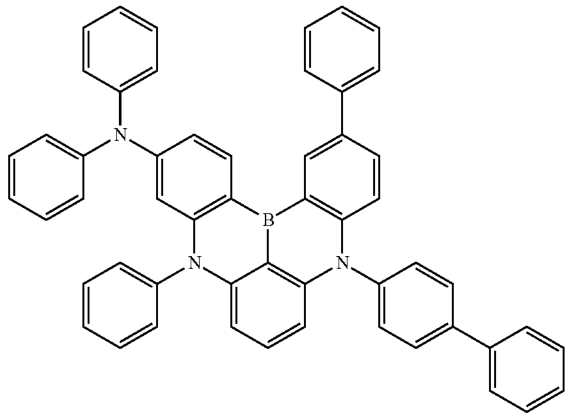
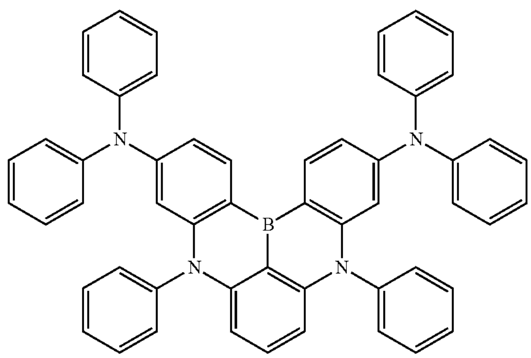
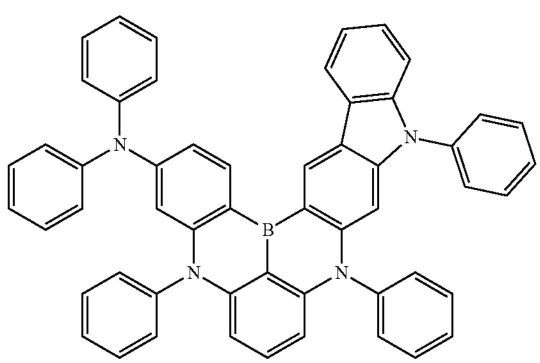
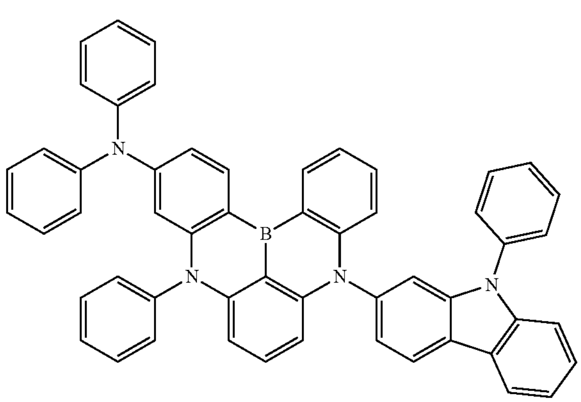
-continued
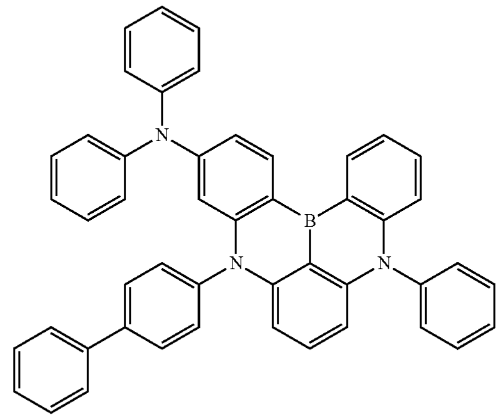
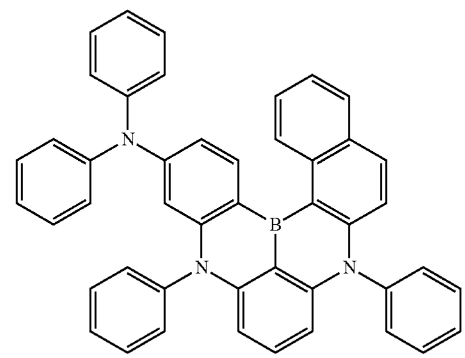
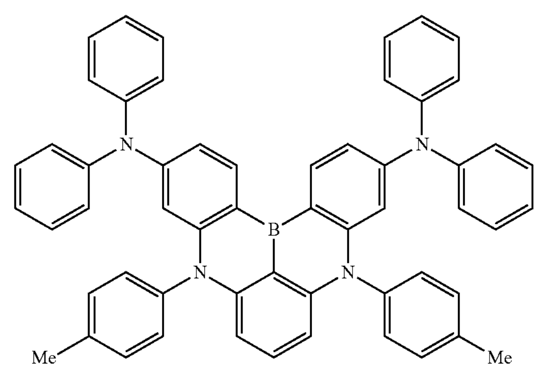
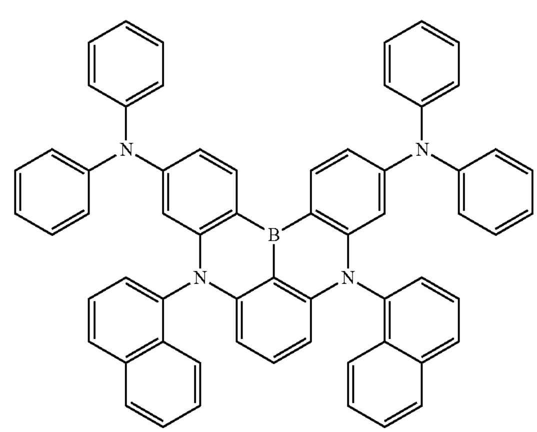

-continued
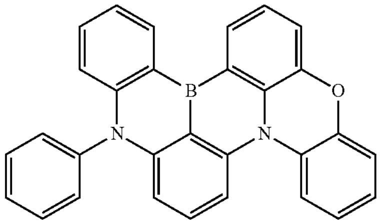
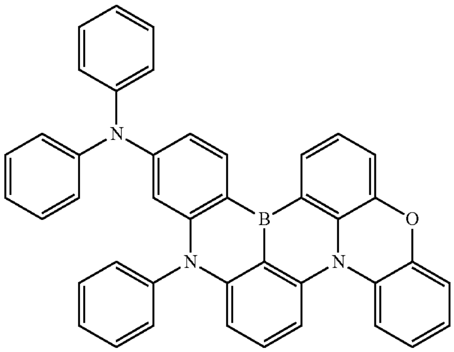
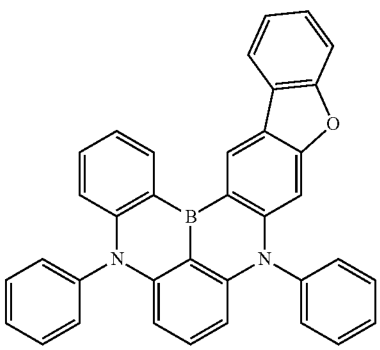
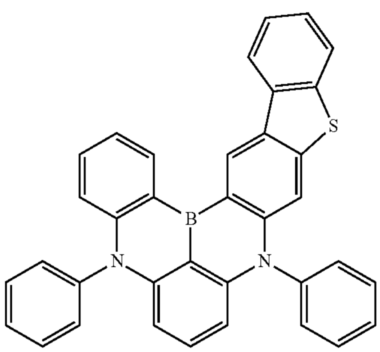
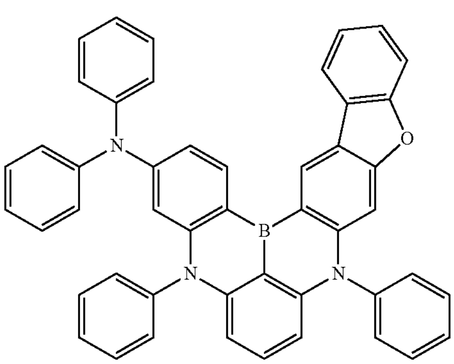
-continued
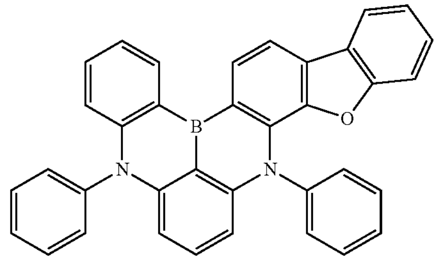
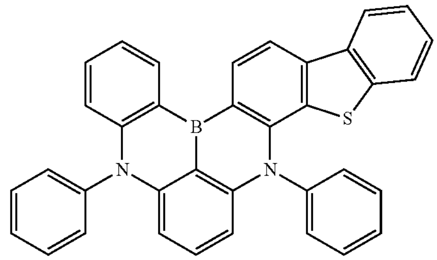
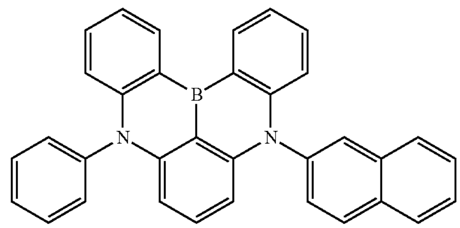
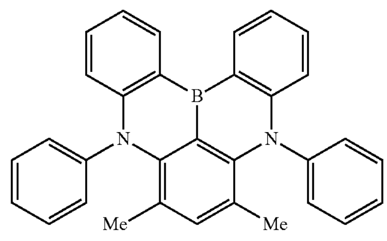
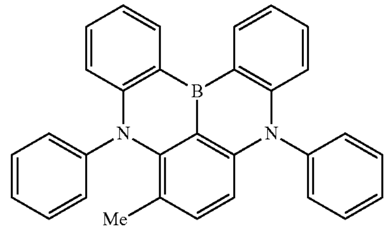
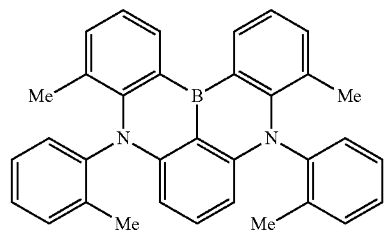
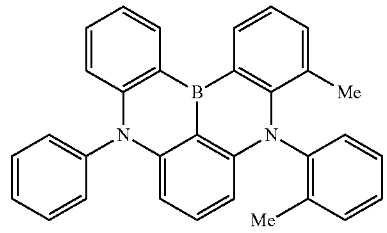

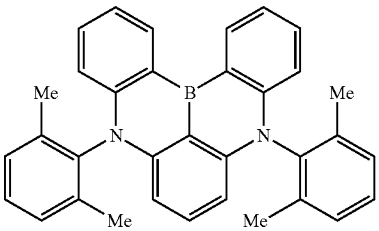
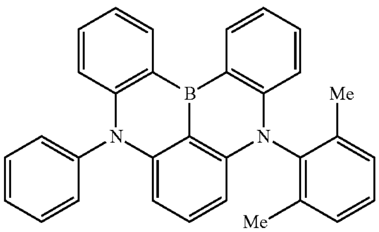
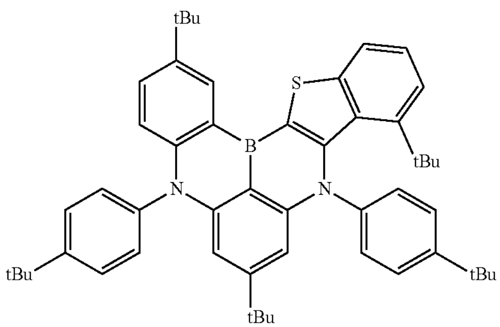
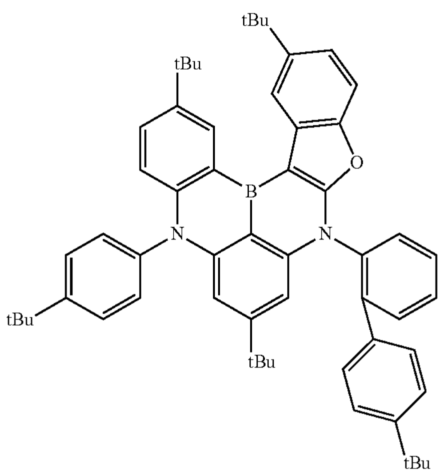
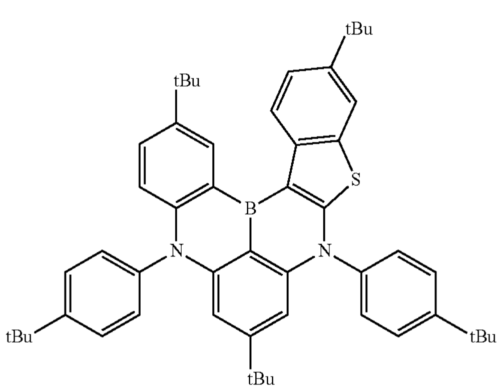
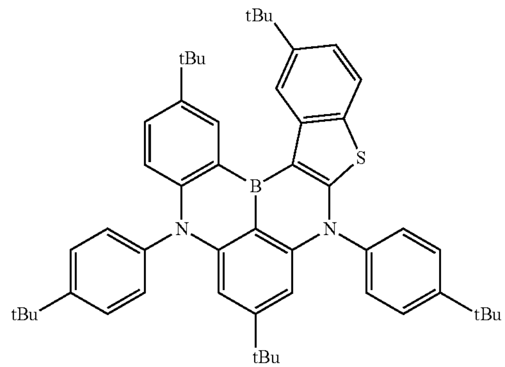
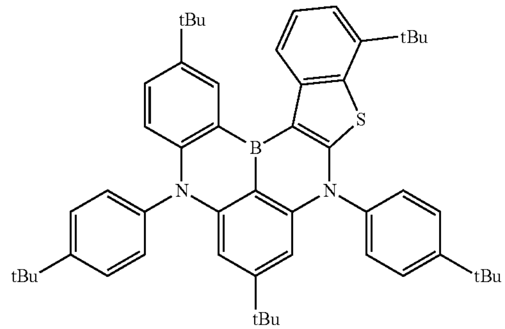
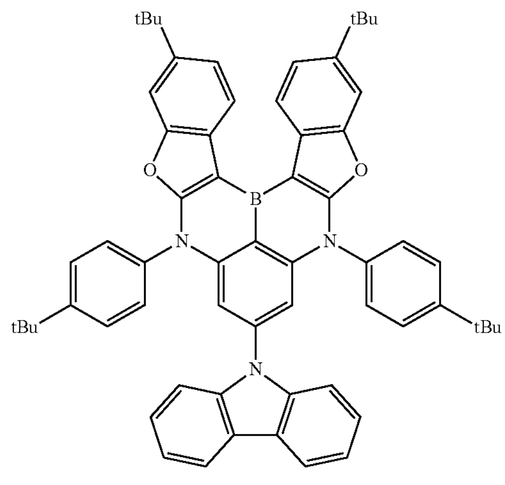
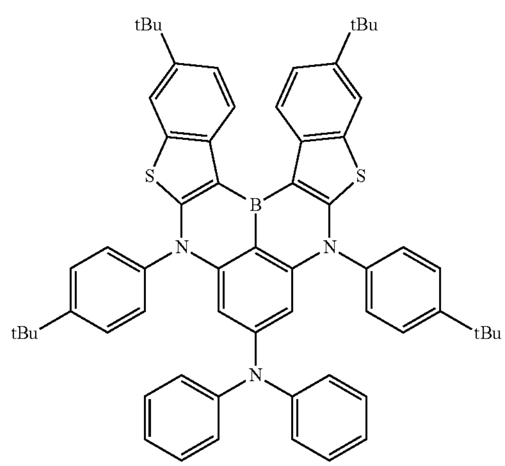

-continued
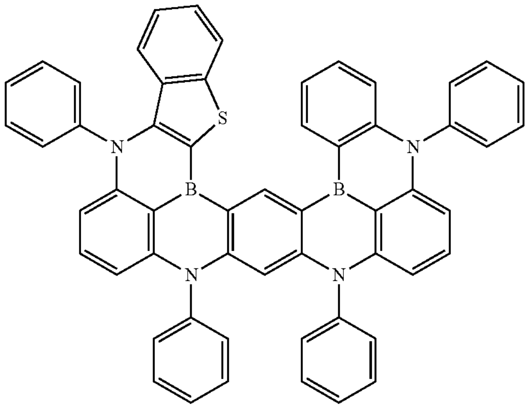
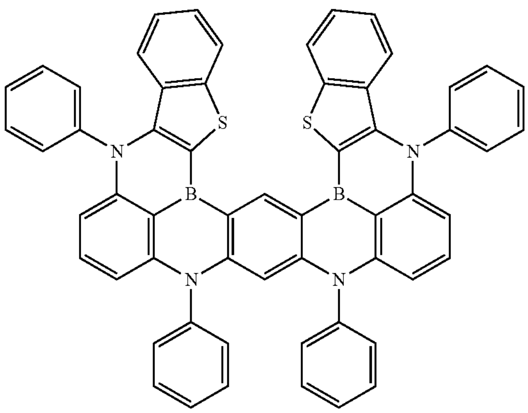
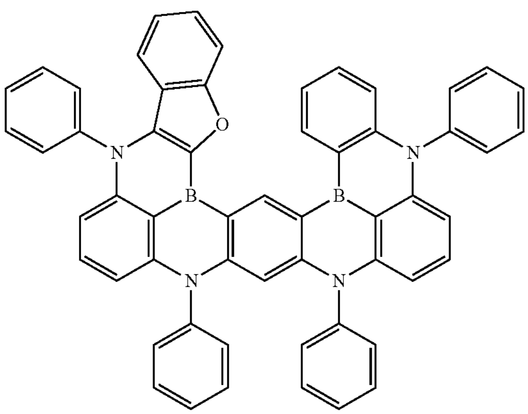
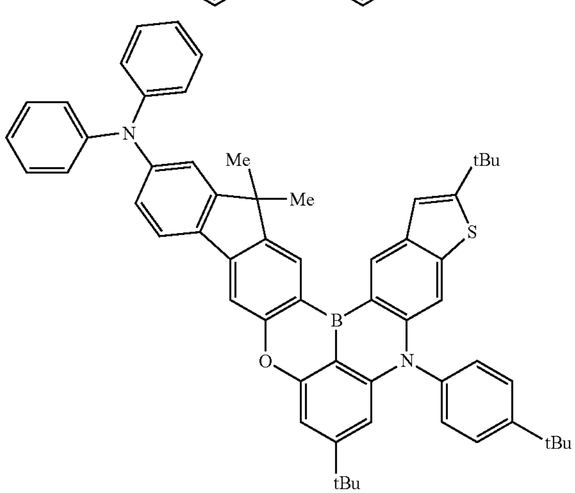
-continued
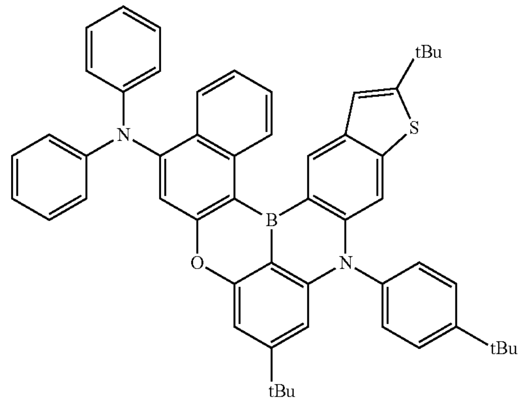
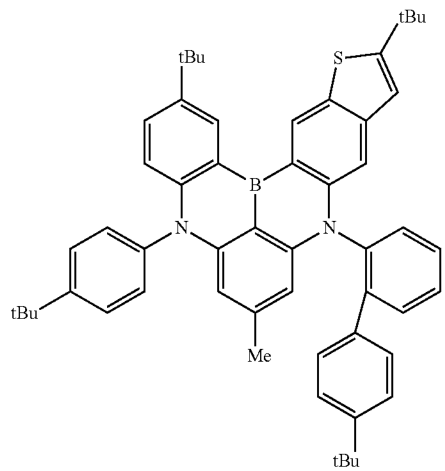
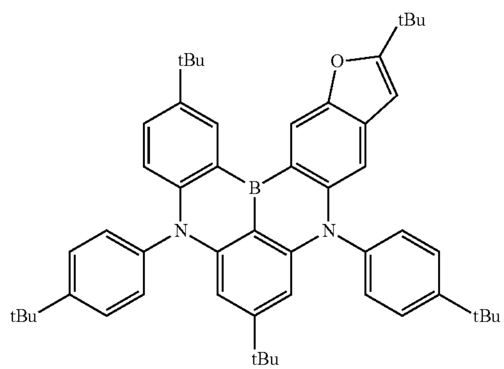
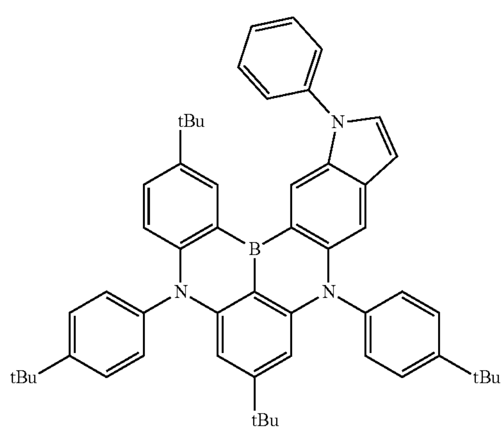

-continued
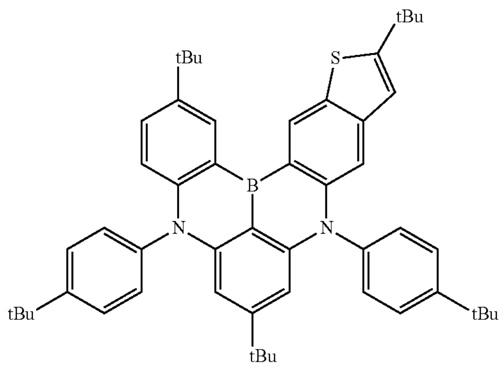
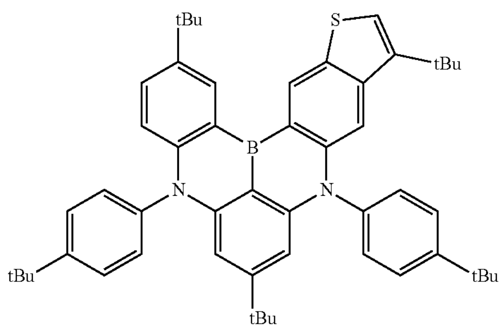
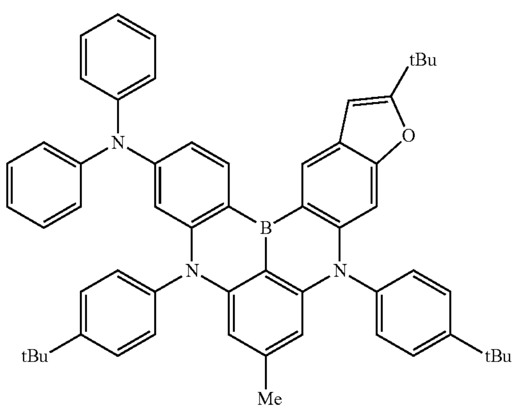
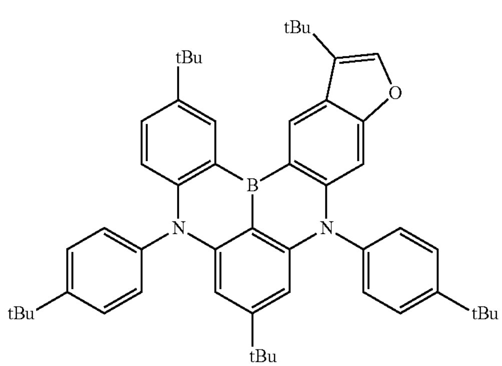
-continued
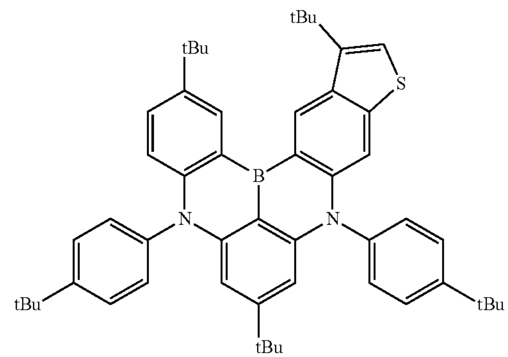
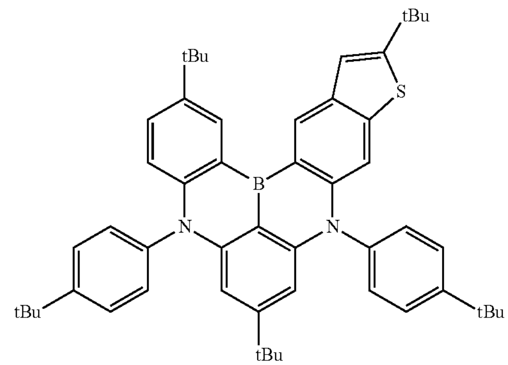
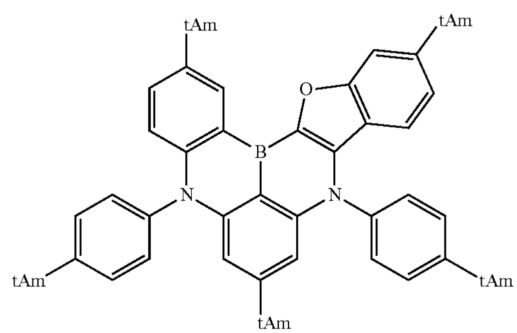
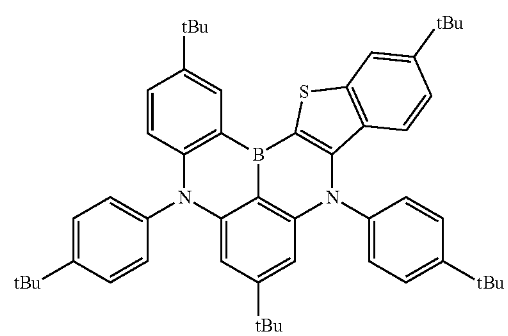
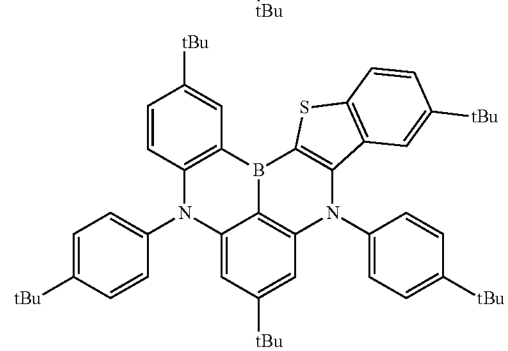

-continued

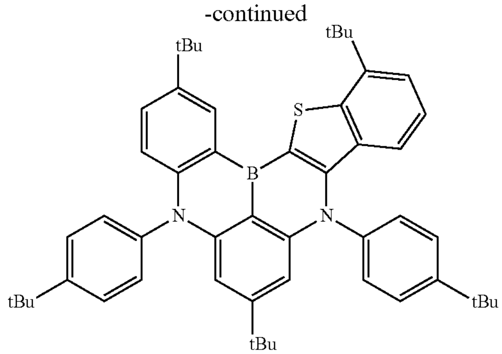

In the emitting compound such as the first emitting compound, the second emitting compound and the third emitting compound:

$R_{901}$, $R_{902}$, $R_{903}$, $R_{904}$, $R_{905}$, $R_{906}$ and $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

a substituted or unsubstituted alkyl group having 1 to 50 carbon atoms, or a substituted or unsubstituted aryl group having 6 to 50 ring carbon atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

In the organic EL device according to the exemplary embodiment, the first emitting compound is preferably the compound represented by the formula (5) or the compound represented by the formula (6).

In the organic EL device according to the exemplary embodiment, the second emitting compound is preferably the compound represented by the formula (5) or the compound represented by the formula (6).

Emission Wavelength of Organic EL Device

The organic electroluminescence device according to the exemplary embodiment preferably emits light having a maximum peak wavelength of 500 nm or less, more preferably emits light having a maximum peak wavelength of 480 nm or less, when the organic electroluminescence device is driven.

The organic electroluminescence device according to the exemplary embodiment more preferably emits light having a maximum peak wavelength in a range from 430 nm to 480 nm when the organic electroluminescence device is driven.

The maximum peak wavelength of the light emitted from the organic EL device when being driven is measured as follows. Voltage is applied on the organic EL devices such that a current density becomes 10 $mA/cm^2$, where spectral radiance spectrum is measured by a spectroradiometer CS-2000 (manufactured by Konica Minolta, Inc.). A peak wavelength of an emission spectrum, at which the luminous intensity of the obtained spectral radiance spectrum is at the maximum, is measured and defined as a maximum peak wavelength (unit: nm).

Second Exemplary Embodiment

Compound

A compound according to a second exemplary embodiment is a compound represented by a formula (1A) below. The compound according to the second exemplary embodiment is a compound that may also correspond to an exemplary arrangement of the first compound serving as the first host material in the first exemplary embodiment. The compound according to the second exemplary embodiment is also usable as the first host material.

(1A)

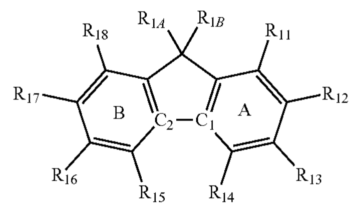

(10A)

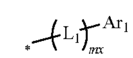

In the formula (1A):

$R_{1A}$ and $R_{1B}$ are each independently a substituted or unsubstituted alkyl group having 1 to 15 carbon atoms, a substituted or unsubstituted aryl group having 6 to 17 ring carbon atoms, or a substituted or unsubstituted heterocyclic group having 5 to 17 ring atoms;

at least one of $R_{1A}$ or $R_{1B}$ is a substituted or unsubstituted alkyl group having 1 to 15 carbon atoms;

at least one combination of a combination of $R_{11}$ and $R_{12}$, a combination of $R_{12}$ and $R_{13}$, a combination of $R_{16}$ and $R_{17}$, and a combination of $R_{17}$ and $R_1$, are mutually bonded to form a substituted or unsubstituted monocyclic ring, or mutually bonded to form a substituted or unsubstituted fused ring;

when the combination of $R_{11}$ and $R_{12}$ or the combination of $R_{12}$ and $R_{13}$ are mutually bonded to form a substituted or unsubstituted monocyclic ring or a substituted or unsubstituted fused ring with a ring A, a group represented by the formula (10A) is bonded to a carbon atom, among carbon atoms forming the substituted or unsubstituted monocyclic ring or the substituted or unsubstituted fused ring, at a position farthest from a carbon atom $C_1$ of the ring A bonded by a single bond to a carbon atom $C_2$ of a ring B;

$R_{12}$ not forming the substituted or unsubstituted monocyclic ring and not forming the substituted or unsubstituted fused ring is the group represented by the formula (10A); and $R_{11}$, $R_{13}$, $R_{14}$ and $R_{15}$ to $R_{18}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a substituted or unsubstituted aralkyl group having 7 to 50 carbon atoms, a group represented by —$C(=O)R_{801}$, a group represented by —$COOR_{802}$, a halogen atom, a cyano group, a nitro group, a substituted or unsubstituted aryl group having 6 to 17 ring carbon atoms, or a substituted or unsubstituted heterocyclic group having 5 to 17 ring atoms, and in the formula (10A):

$Ar_1$ is a substituted or unsubstituted aryl group having four or more fused rings, or a substituted or unsubstituted heterocyclic group having four or more fused rings;

$L_1$ is a single bond, a substituted or unsubstituted arylene group having 6 to 17 ring carbon atoms, or a substituted or unsubstituted divalent heterocyclic group having 5 to 17 ring atoms;

mx is 0, 1, or 2;

* represents a bonding position to an atom forming a ring of the formula (1A); and the compound represented by the formula (1A) does not contain, in a molecule of the compound, three or more of: a substituted or unsubstituted aryl group having four or more fused rings; and a substituted or unsubstituted heterocyclic group having four or more fused rings.

In the compound represented by the formula (1A):

$R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 17 ring carbon atoms, or a substituted or unsubstituted heterocyclic group having 5 to 17 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

In the compound according to the second exemplary embodiment, the substituted or unsubstituted aryl group having 6 to 17 ring carbon atoms is preferably a substituted or unsubstituted aryl group having 6 to 14 ring carbon atoms.

In the compound according to the second exemplary embodiment, the substituted or unsubstituted heterocyclic group having 5 to 17 ring atoms is preferably a substituted or unsubstituted heterocyclic group having 5 to 14 ring atoms.

In the compound according to the second exemplary embodiment, the substituted or unsubstituted arylene group having 6 to 17 ring carbon atoms is preferably a substituted or unsubstituted arylene group having 6 to 14 ring carbon atoms.

In the compound according to the second exemplary embodiment, the substituted or unsubstituted divalent heterocyclic group having 5 to 17 ring atoms is preferably a substituted or unsubstituted divalent heterocyclic group having 5 to 14 ring atoms.

In the compound according to the second exemplary embodiment, $R_{1A}$ and $R_{1B}$ are preferably each independently a substituted or unsubstituted alkyl group having 1 to 15 carbon atoms, or a substituted or unsubstituted aryl group having 6 to 17 ring carbon atoms.

In the compound according to the second exemplary embodiment, $R_{1A}$ and $R_{1B}$ are preferably each independently a substituted or unsubstituted alkyl group having 1 to 15 carbon atoms. $R_{1A}$ and $R_{1B}$ being a substituted or unsubstituted alkyl group having 1 to 15 carbon atoms are likely to decrease a drive voltage.

In the compound according to the second exemplary embodiment, $R_{1A}$ and $R_{1B}$ are preferably each independently a substituted or unsubstituted alkyl group having 1 to 10 carbon atoms.

In the second exemplary embodiment, the compound represented by the formula (1A) is preferably a compound represented by a formula (101) below.

(101)

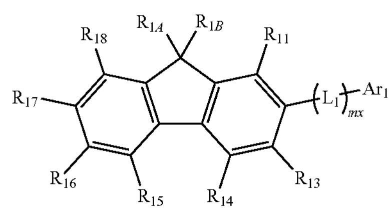

In the formula (101):

a combination of $R_{16}$ and $R_{17}$ or a combination of $R_{17}$ and $R_{18}$ are mutually bonded to form a substituted or unsubstituted monocyclic ring, or mutually bonded to form a substituted or unsubstituted fused ring;

$R_{1A}$, $R_{1B}$, $R_{11}$, $R_{13}$, $R_{14}$ and $R_{15}$ respectively represent the same as $R_{1A}$, $R_{1B}$, $R_{11}$, $R_{13}$, $R_{14}$ and $R_{15}$ in the formula (1A);

$R_{16}$, $R_{17}$ and $R_{18}$ not forming the substituted or unsubstituted monocyclic ring and not forming the substituted or unsubstituted fused ring respectively represent the same as $R_{16}$, $R_{17}$ and $R_{18}$ not forming the substituted or unsubstituted monocyclic ring and not forming the substituted or unsubstituted fused ring in the formula (1A); and $Ar_1$, $L_1$ and mx respectively represent the same as $Ar_1$, $L_1$ and mx in the formula (10A).

In the compound according to the second exemplary embodiment, when at least one combination of a combination of $R_{11}$ and $R_{12}$, a combination of $R_{12}$ and $R_{13}$, a combination of $R_{16}$ and $R_{17}$, and a combination of $R_{17}$ and $R_{18}$ are mutually bonded to form a substituted or unsubstituted monocyclic ring or mutually bonded to form a substituted or unsubstituted fused ring, it is preferable that the substituted or unsubstituted monocyclic ring is the ring represented by the formula (11) and the substituted or unsubstituted fused ring is the ring represented by the formula (12).

In the compound according to the second exemplary embodiment, when $X_1$ is $C(R_{115})(R_{116})$, $R_{115}$ and $R_{116}$ are each independently preferably a substituted or unsubstituted alkyl group having 1 to 15 carbon atoms, or a substituted or unsubstituted aryl group having 6 to 17 ring carbon atoms, more preferably a substituted or unsubstituted alkyl group having 1 to 15 carbon atoms.

In the compound according to the second exemplary embodiment, it is preferable that the combination of $R_{16}$ and $R_{17}$ are mutually bonded to form a substituted or unsubstituted monocyclic ring, or the combination of $R_{17}$ and $R_{18}$ are mutually bonded to form a substituted or unsubstituted monocyclic ring.

In the second exemplary embodiment, the compound represented by the formula (1A) is preferably a compound represented by a formula (102) or (102A) below.

(102)

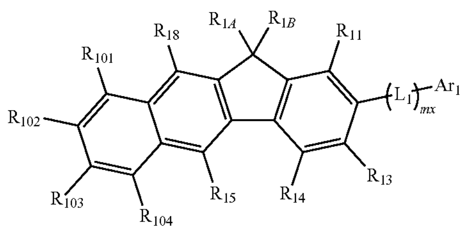

(102A)

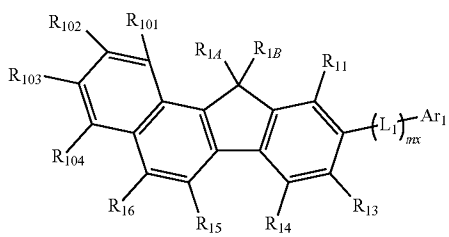

In the formulae (102) and (102A):

$R_{1A}$, $R_{1B}$, $R_{11}$, $R_{13}$, $R_{14}$, $R_{15}$, $R_{16}$ and $R_{18}$ respectively represent the same as $R_{1A}$, $R_{1B}$, $R_{11}$, $R_{13}$, $R_{14}$, $R_{15}$, $R_{16}$ and $R_{18}$ in the formula (1A);

$Ar_1$, $L_1$ and mx respectively represent the same as $Ar_1$, $L_1$ and mx in the formula (10A);

none of a combination of adjacent two or more of $R_{101}$ to $R_{104}$ are mutually bonded; and $R_{101}$ to $R_{104}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

In the compound according to the second exemplary embodiment, mx is preferably 0.

In the compound according to the second exemplary embodiment, $L_1$ is preferably a single bond or a substituted or unsubstituted arylene group having 6 to 17 ring carbon atoms, or preferably a single bond or a substituted or unsubstituted phenylene group.

In the second exemplary embodiment, the compound represented by the formula (1A) is preferably a compound represented by a formula (103) or (103A) below.

(103)

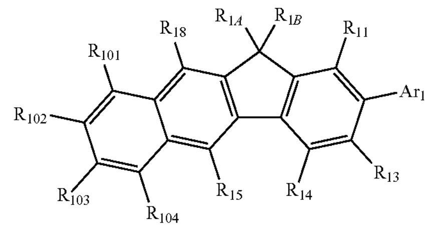

(103A)

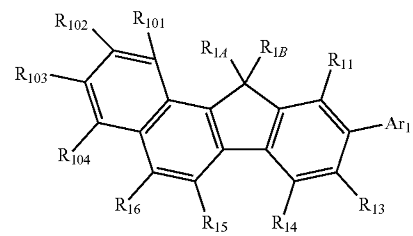

In the formulae (103) and (103A):

$R_{1A}$, $R_{1B}$, $R_{11}$, $R_{13}$, $R_{14}$, $R_{15}$, $R_{16}$ and $R_{18}$ respectively represent the same as $R_{1A}$, $R_{1B}$, $R_{11}$, $R_{13}$, $R_{14}$, $R_{15}$, $R_{16}$ and $R_{18}$ in the formula (1A);

$R_{101}$ to $R_{104}$ respectively represent the same as $R_{101}$ to $R_{104}$ in the formulae (102) and (102A); and $Ar_1$ represents the same as $Ar_1$ in the formula (10A).

In the compound according to the second exemplary embodiment, $R_{12}$ not bonded with the group represented by the formula (10A) and $R_{11}$, $R_{13}$, $R_{14}$ and $R_{15}$ to $R_{18}$ not forming the substituted or unsubstituted monocyclic ring and not forming the substituted or unsubstituted fused ring are each independently preferably a hydrogen atom or a substituted or unsubstituted alkyl group having 1 to 15 carbon atoms, more preferably a hydrogen atom or a substituted or unsubstituted alkyl group having 1 to 10 carbon atoms, further preferably a hydrogen atom.

In the compound according to the second exemplary embodiment, $R_{101}$ to $R_{104}$ and $R_{111}$ to $R_{114}$ not forming the substituted or unsubstituted monocyclic ring and not forming the substituted or unsubstituted fused ring are each independently preferably a hydrogen atom or a substituted or unsubstituted alkyl group having 1 to 15 carbon atoms, more preferably a hydrogen atom or a substituted or unsubstituted alkyl group having 1 to 10 carbon atoms, further preferably a hydrogen atom.

In the compound according to the second exemplary embodiment, $Ar_1$ is preferably a substituted or unsubstituted aryl group having four to six fused rings, or a substituted or unsubstituted heterocyclic group having four to six fused rings, more preferably a substituted or unsubstituted aryl group having four to six fused rings.

In the compound according to the second exemplary embodiment, $Ar_1$ is also preferably a group derived from a substituted or unsubstituted fluoranthene ring, a substituted or unsubstituted benzofluoranthene ring, a substituted or unsubstituted benzanthracene ring, or a substituted or unsubstituted benzoxanthene ring.

In the compound according to the second exemplary embodiment, $Ar_1$ is also preferably the group represented by the formula (110), (114), (120), (130), (140), (150), (160), (170), (171), (180) or (190) described in the first exemplary embodiment.

In the compound according to the second exemplary embodiment, $Ar_1$ in the formula (10A) is preferably the group represented by the formula (110) or (120) described in the first exemplary embodiment.

In the compound according to the second exemplary embodiment, $Ar_1$ is also preferably the group represented by the formula (111), (112) or (113) described in the first exemplary embodiment.

In the compound according to the second exemplary embodiment, $Ar_1$ is also preferably the group represented by the formula (112) described in the first exemplary embodiment.

In the compound according to the second exemplary embodiment, it is also preferable that $Ar_1$ is the group represented by the formula (112) and mx is 0. In this case, the compound according to the second exemplary embodiment is the compound represented by the formula (103C).

In the second exemplary embodiment, the compound represented by the formula (1A) is also preferably the compound represented by the formula (103C).

(103C)

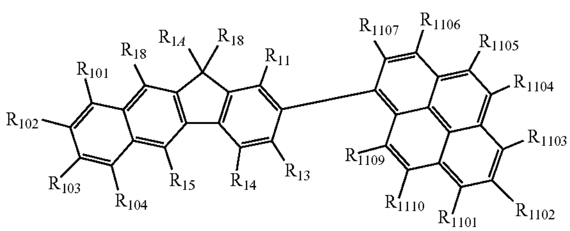

In the formula (103C):

$R_{1A}$, $R_{1B}$, $R_{11}$, $R_{13}$, $R_{14}$, $R_{15}$ and $R_{18}$ respectively represent the same as $R_{1A}$, $R_{1B}$, $R_{11}$, $R_{13}$, $R_{14}$, $R_{15}$ and $R_1$ in the formula (1A);

$R_{101}$ to $R_{104}$ respectively represent the same as $R_{101}$ to $R_{104}$ in the formula (102); and $R_{1101}$ to $R_{1107}$, $R_{1109}$ and $R_{1110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(═O)$R_{801}$, a group represented by —COO$R_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

In the compound according to the second exemplary embodiment, $R_{1101}$ to $R_{1110}$ not being a bonding position to $L_1$ are each independently preferably a hydrogen atom or a substituted or unsubstituted aryl group having 6 to 14 ring carbon atoms, more preferably a hydrogen atom or a substituted or unsubstituted phenyl group.

In the compound according to the second exemplary embodiment, $R_{1211}$ or $R_{1212}$ in the formula (120) is preferably a bonding position to $L_1$.

In the compound according to the second exemplary embodiment, $R_{1201}$ to $R_{1212}$ not being a bonding position to $L_1$ are each independently preferably a hydrogen atom or a substituted or unsubstituted aryl group having 6 to 14 ring carbon atoms, more preferably a hydrogen atom or a substituted or unsubstituted phenyl group.

In the compound according to the second exemplary embodiment, all groups described as "substituted or unsubstituted" groups are preferably "unsubstituted" groups.

Manufacturing Method of Compound According to Second Exemplary Embodiment

The compound according to the second exemplary embodiment can be manufactured by application of known substitution reactions and materials depending on a target compound, in accordance with or based on synthesis methods described later in Examples.

Specific Examples of Compound According to Second Exemplary Embodiment

Specific examples of the compound according to the second exemplary embodiment include the following compounds. It should however be noted that the invention is not limited to the specific examples of the compound. The specific examples shown below of the compound according to the second exemplary embodiment are also usable as the first host material of the organic EL device according to the first exemplary embodiment.

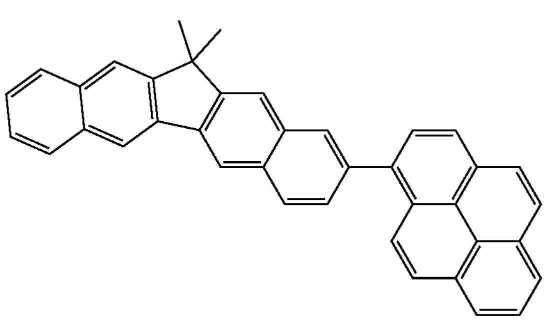

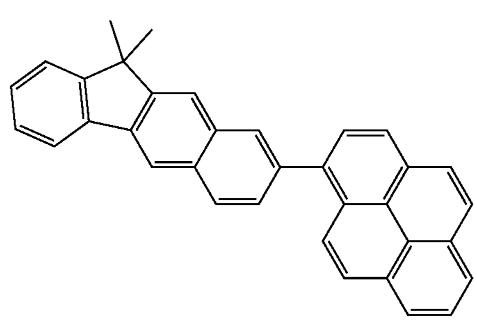

-continued
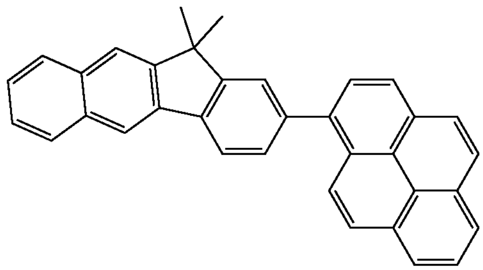
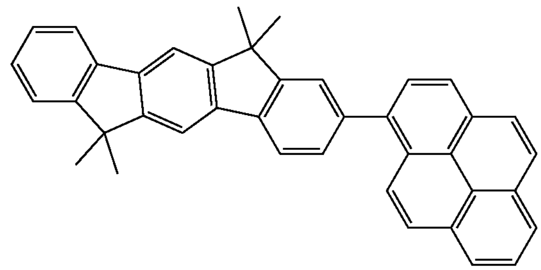
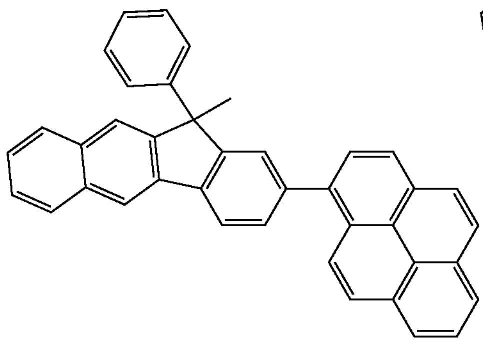
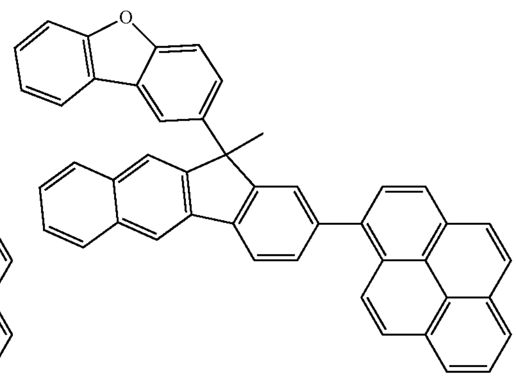
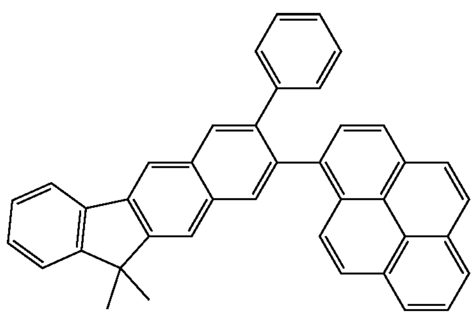
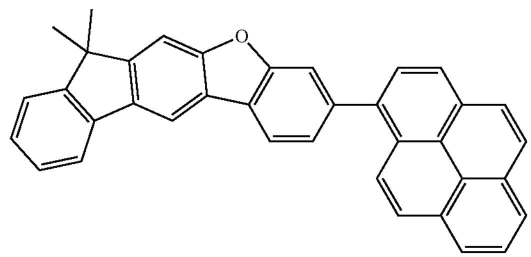
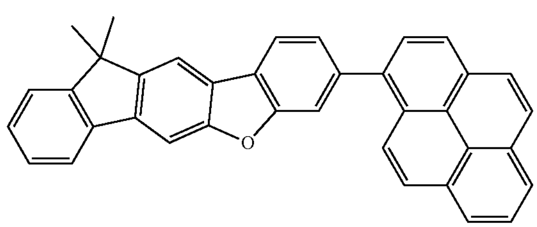
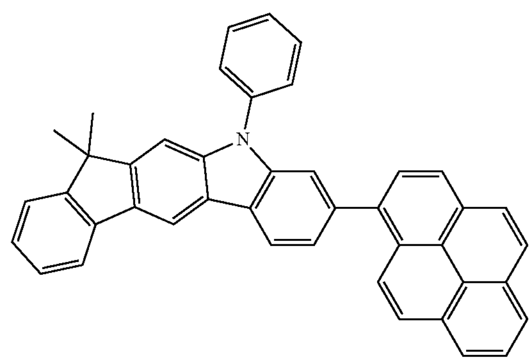
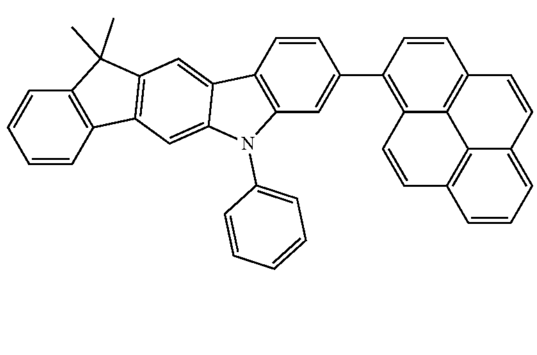
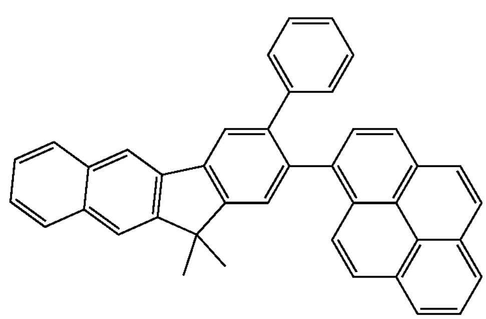

-continued
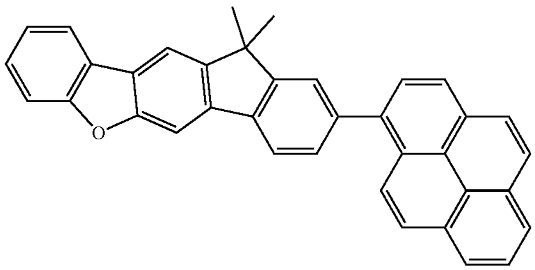
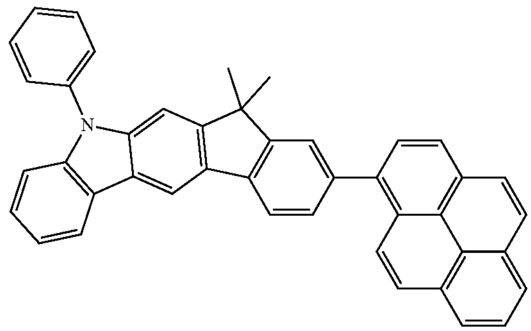
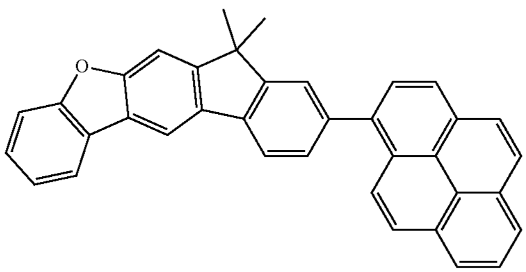
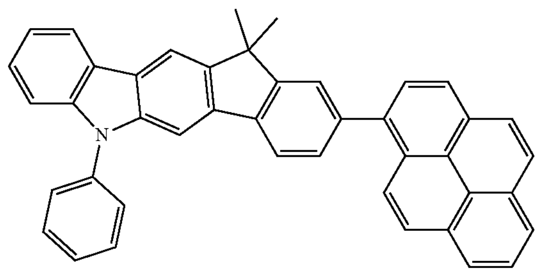
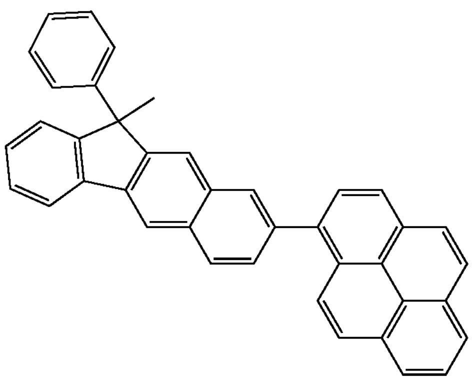
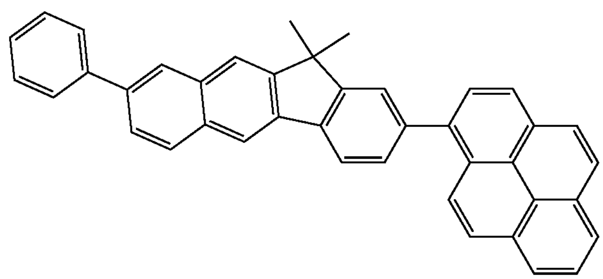
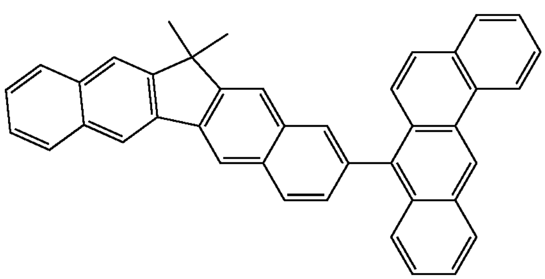
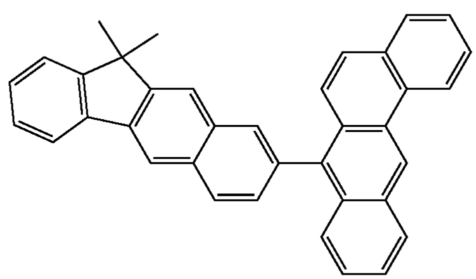
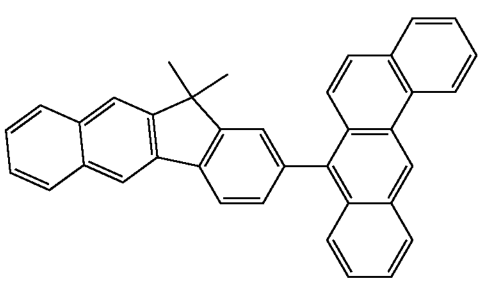
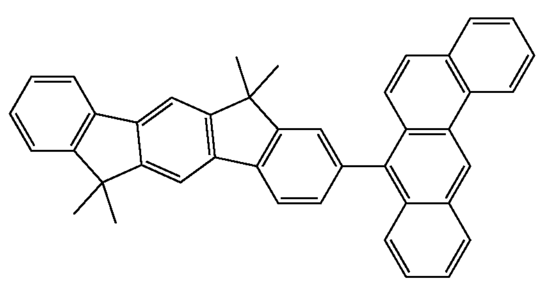

-continued
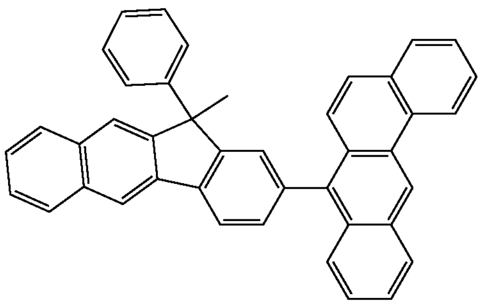
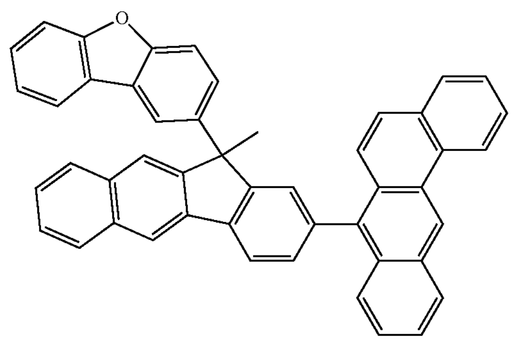
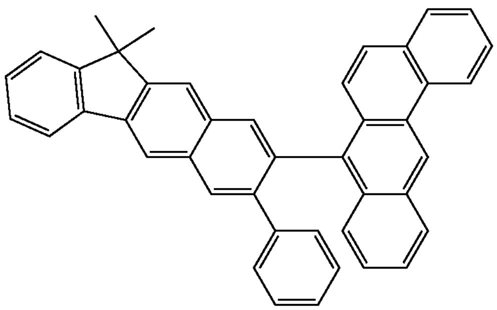
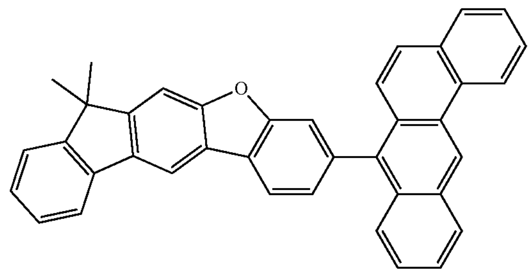
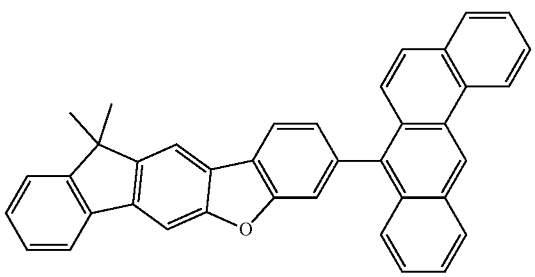
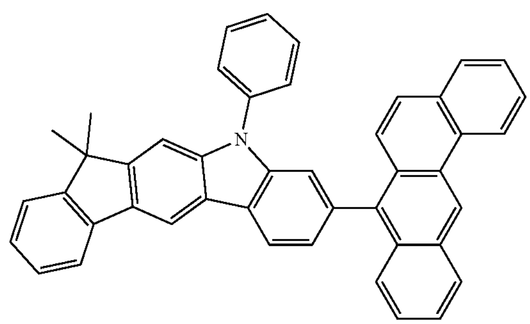
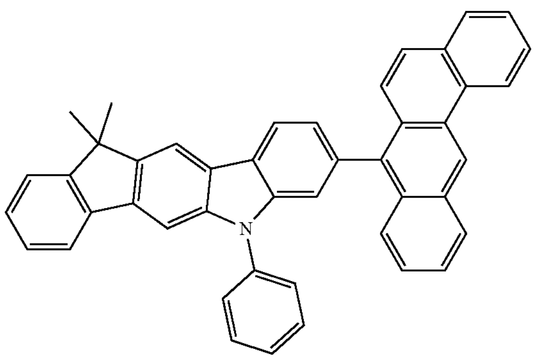
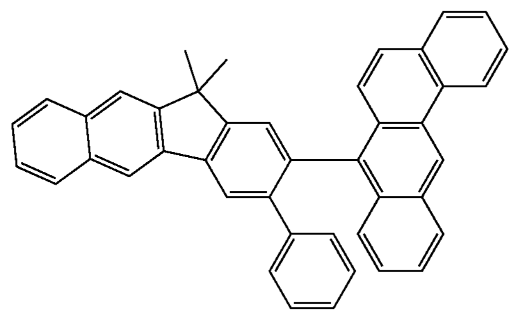
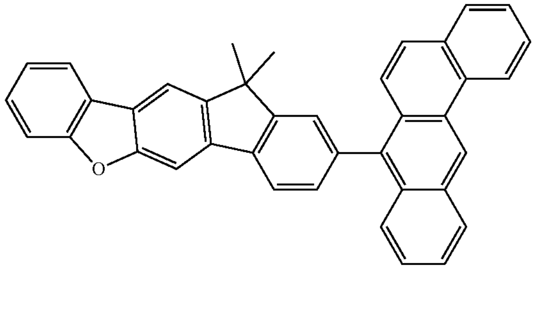
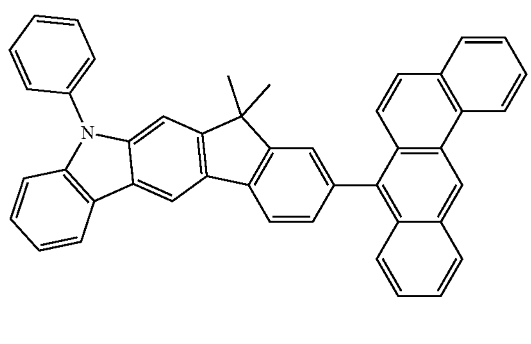

-continued
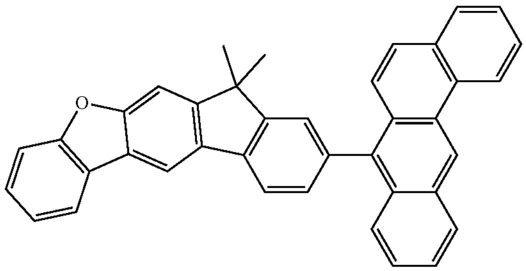
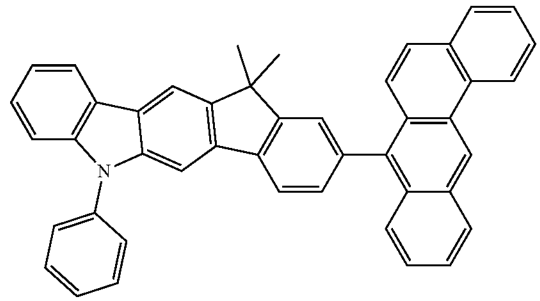
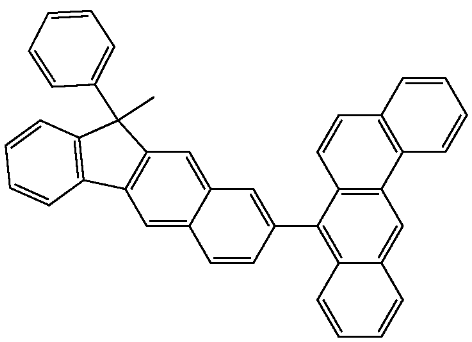
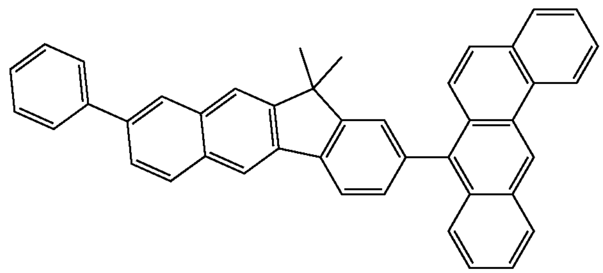
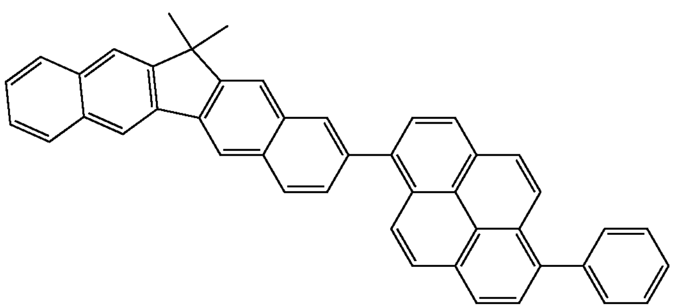
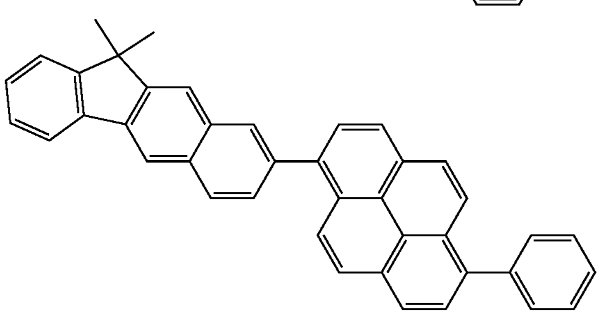
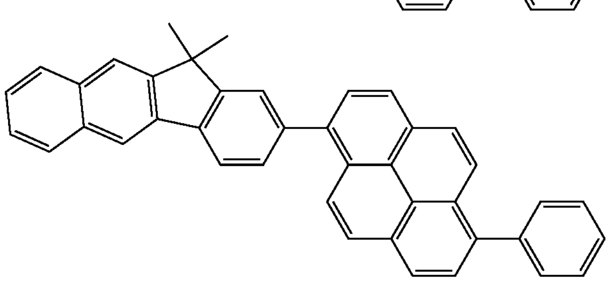

-continued
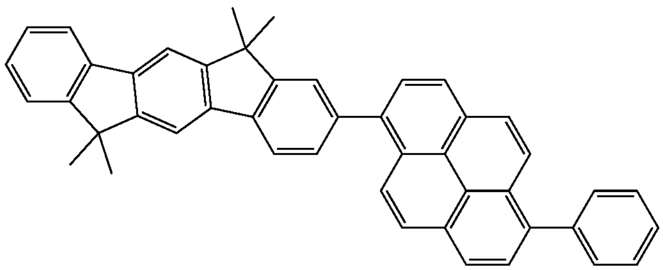
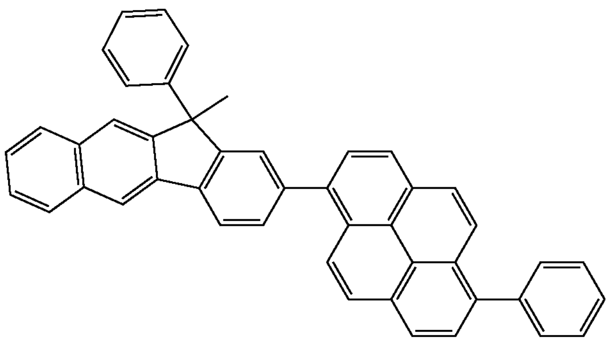
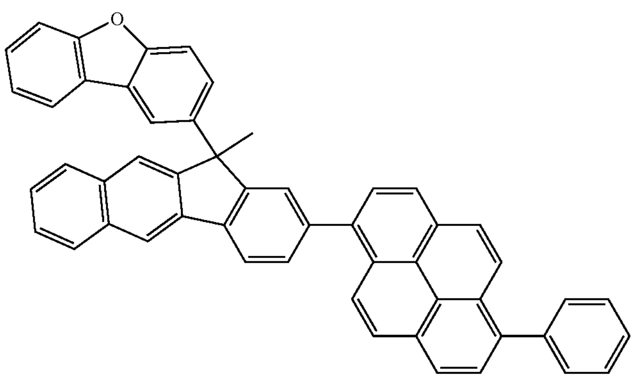
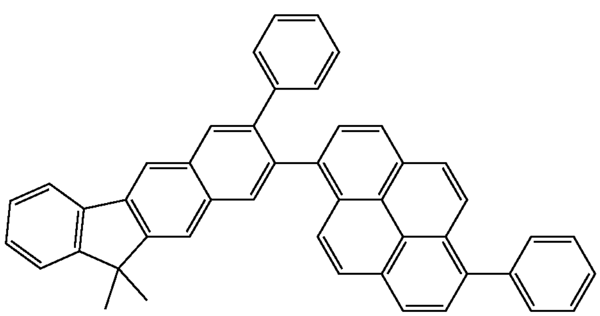
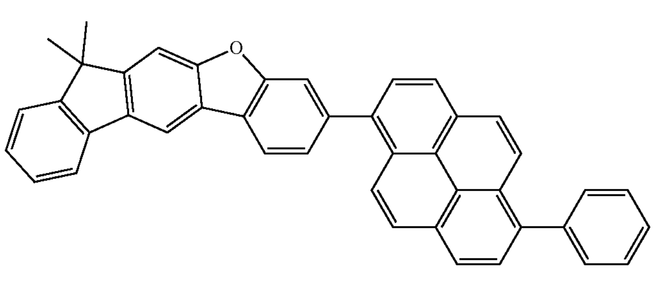

-continued
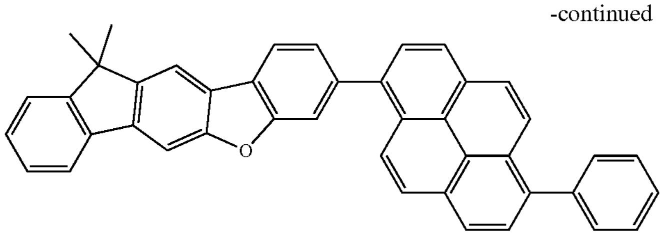
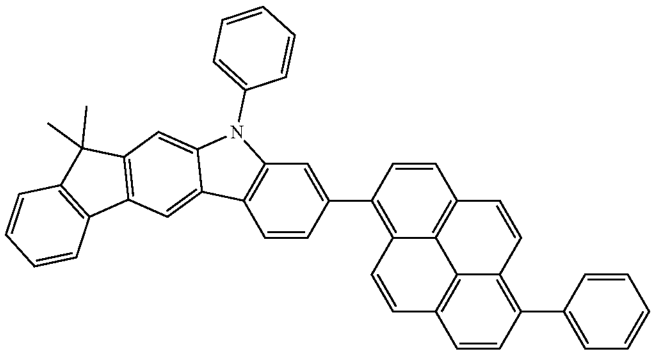
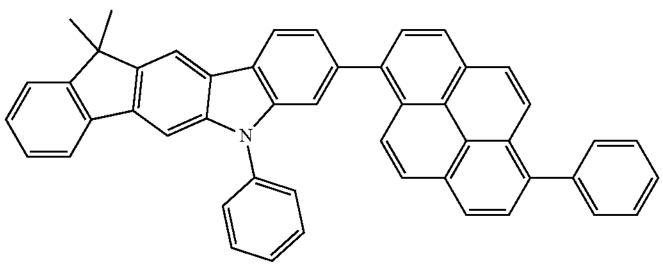
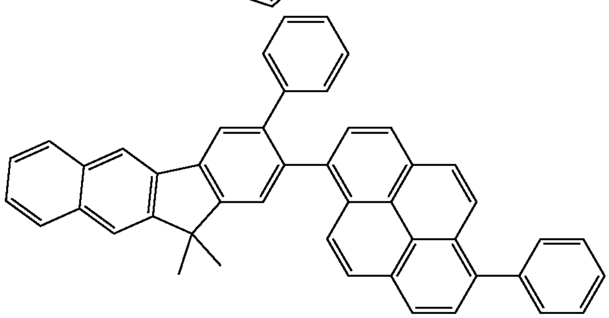
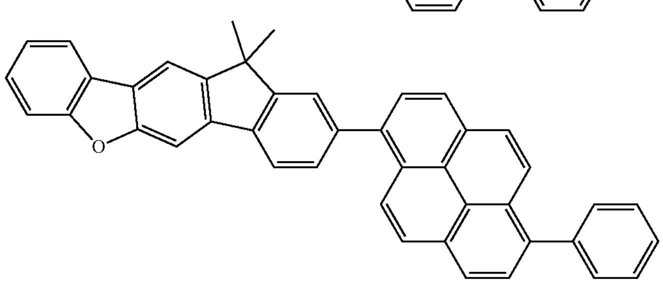
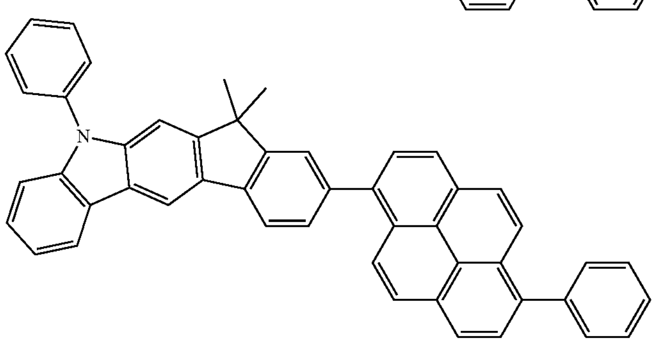

-continued
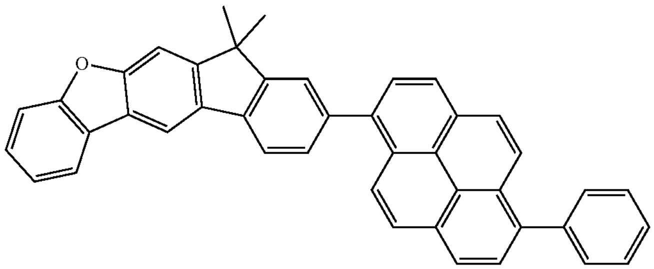
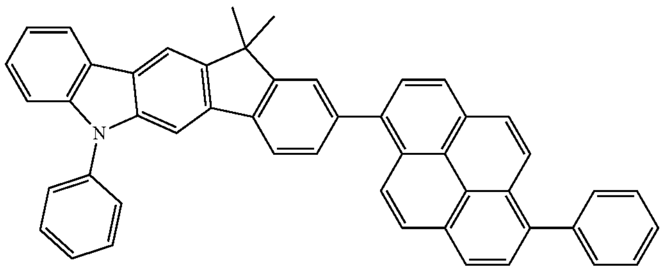
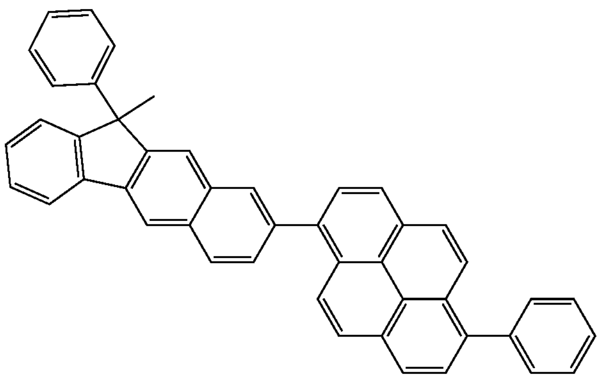
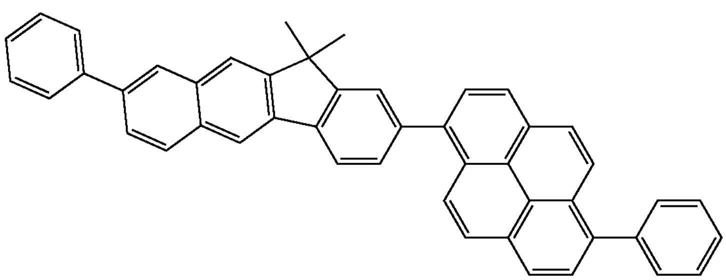
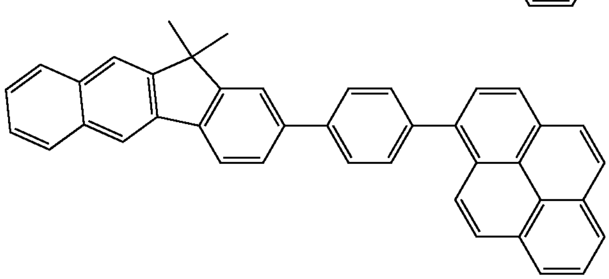
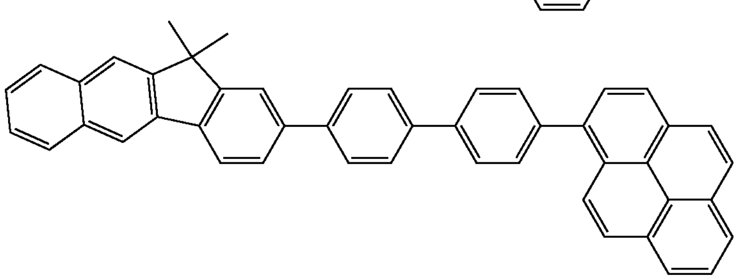

-continued
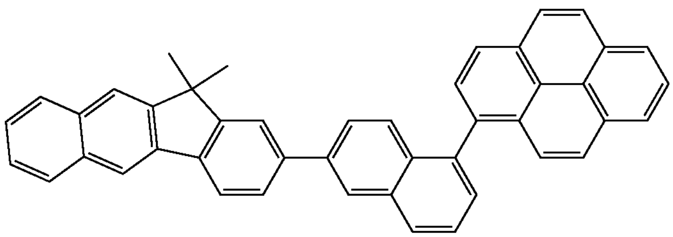
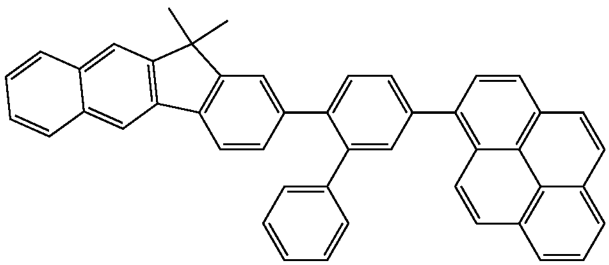
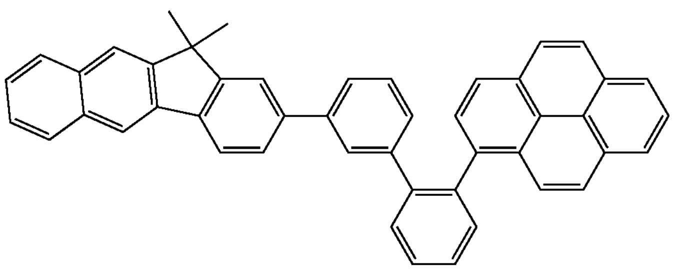
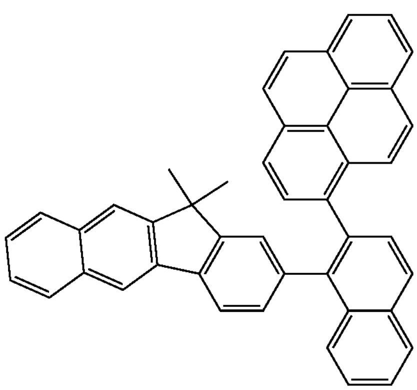
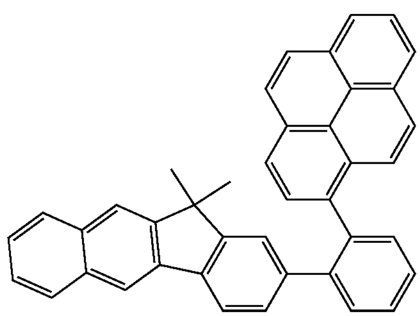
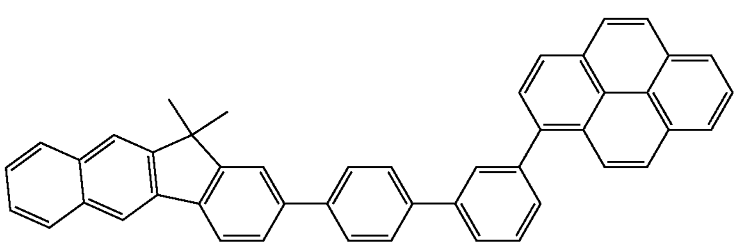

-continued
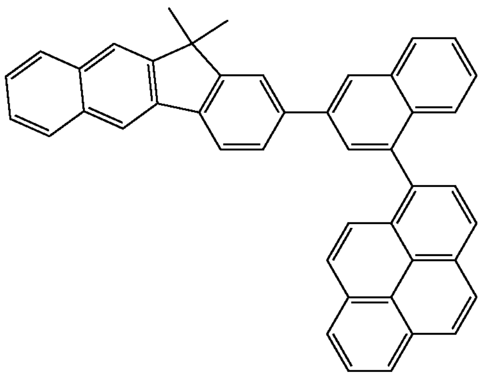
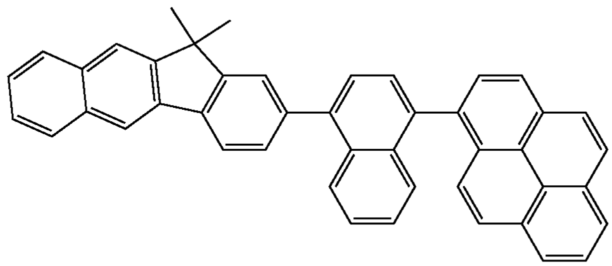
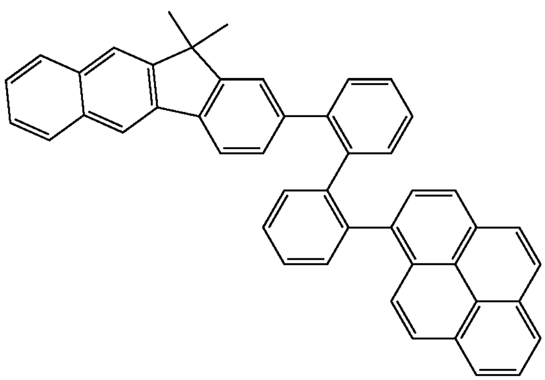
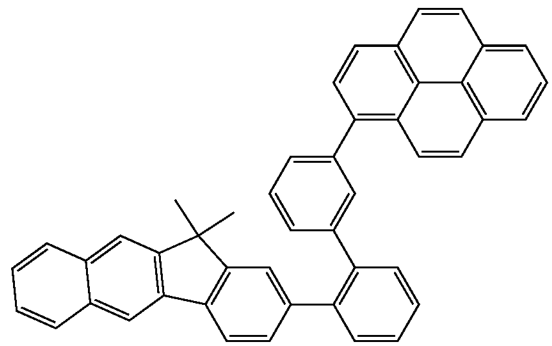
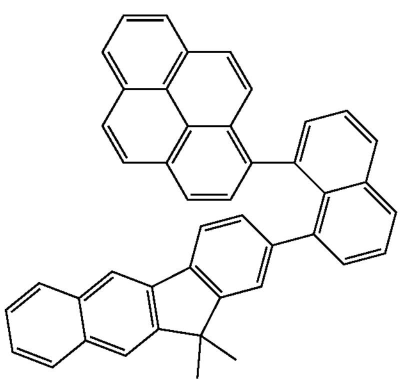
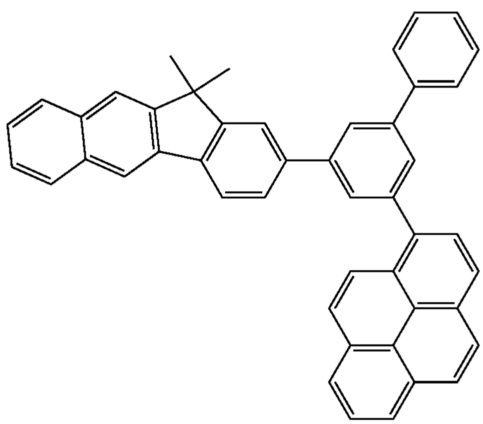
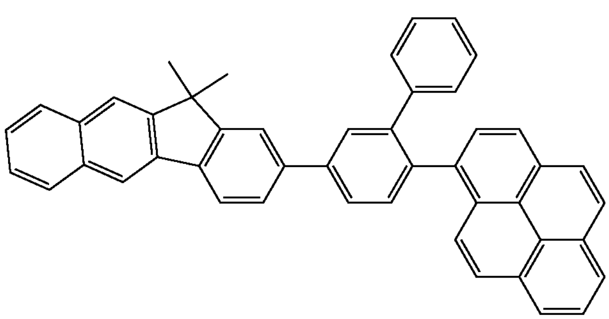

-continued
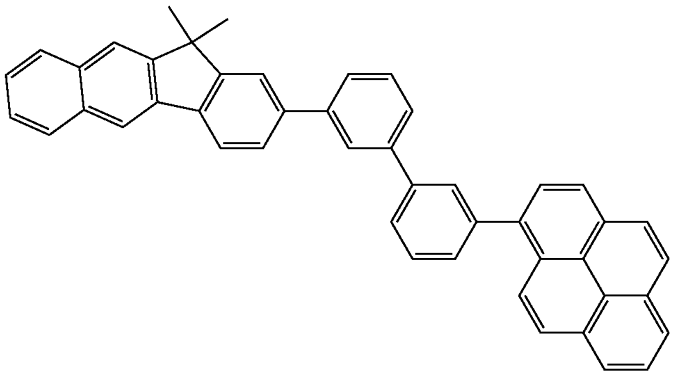
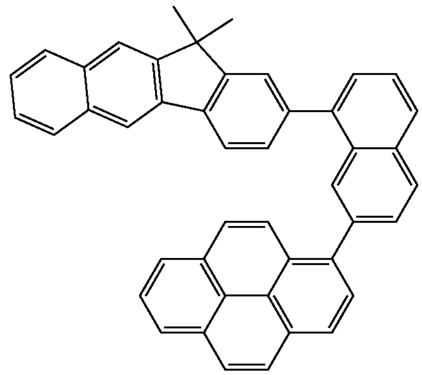
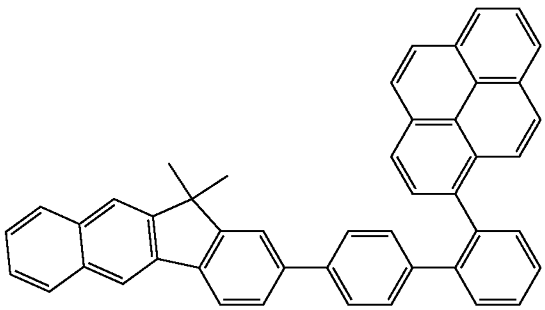
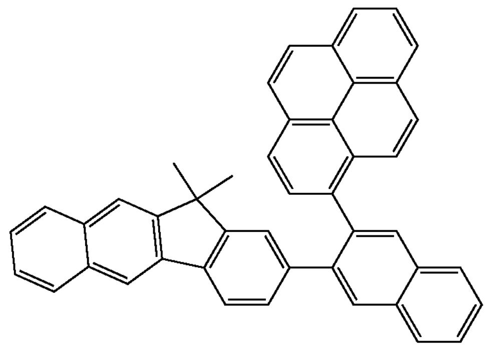
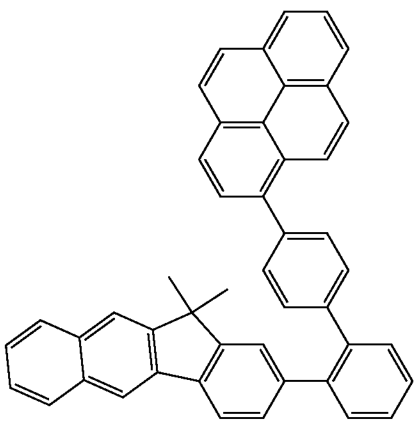
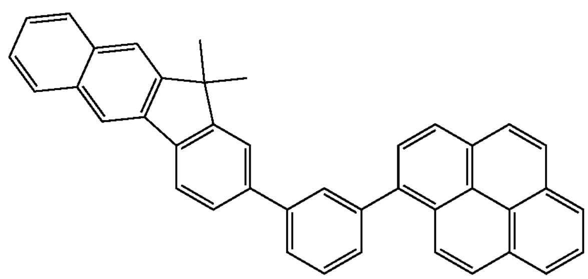
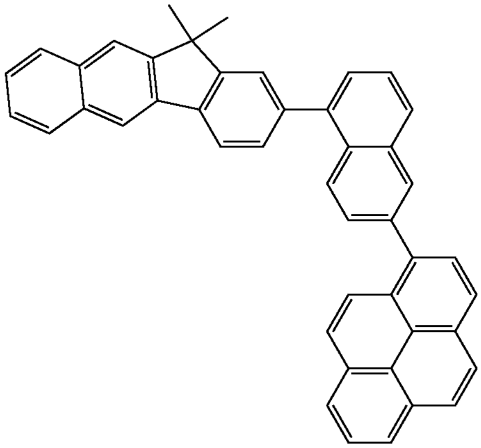
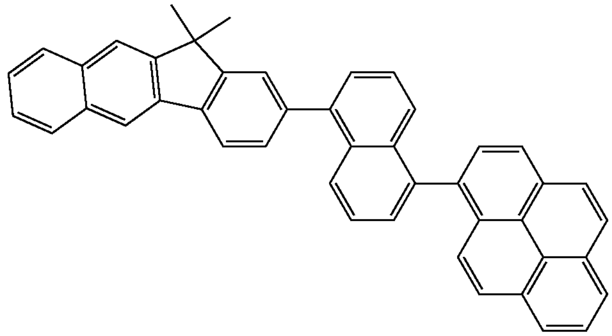

-continued
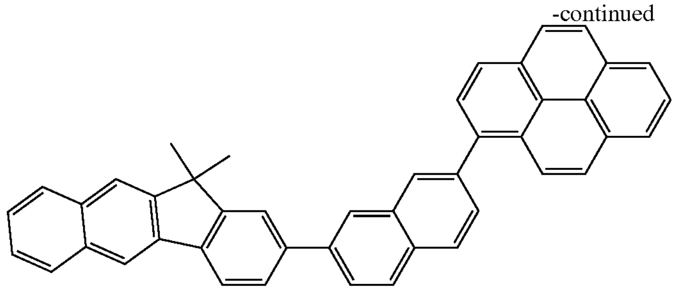
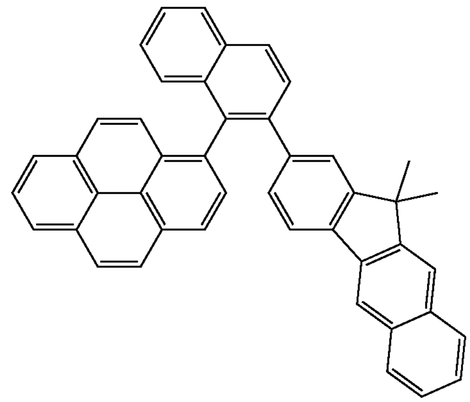
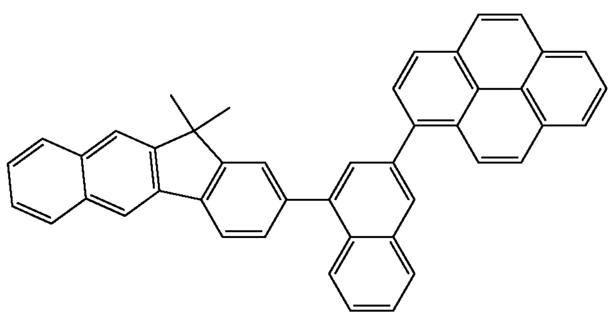
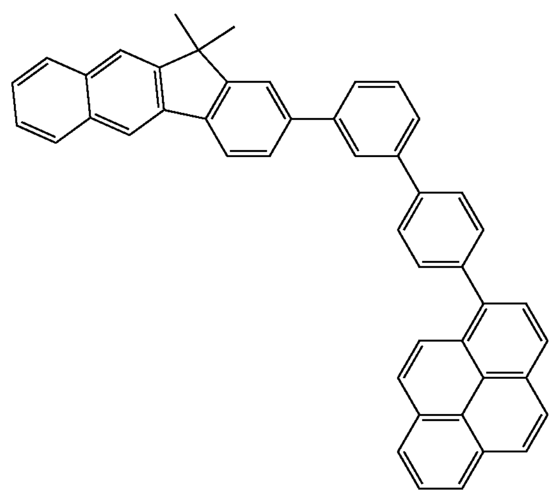
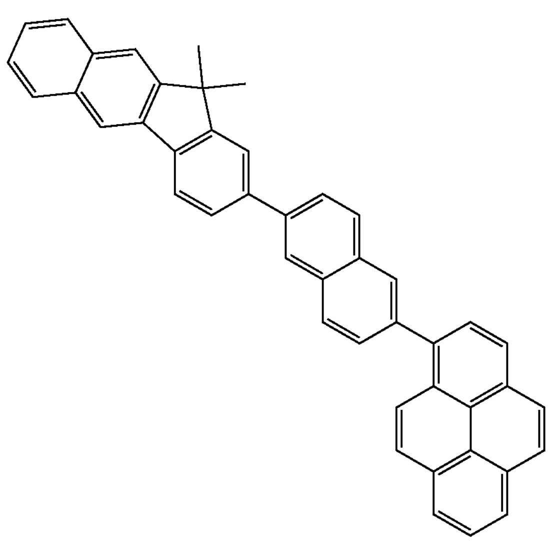
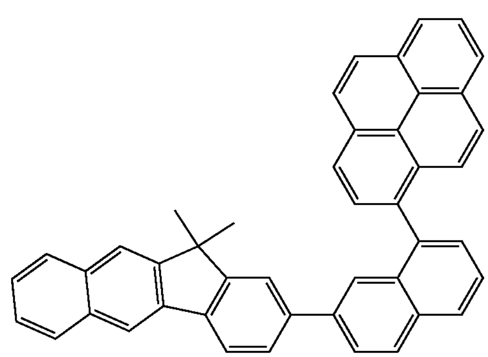

-continued
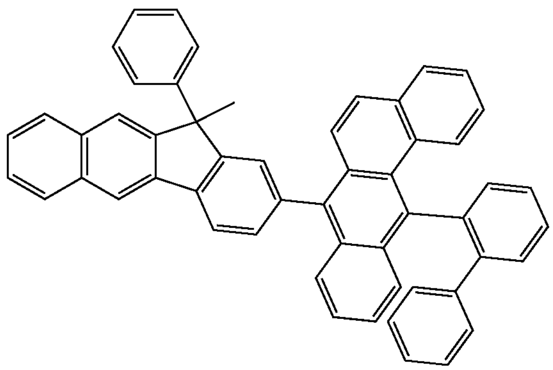
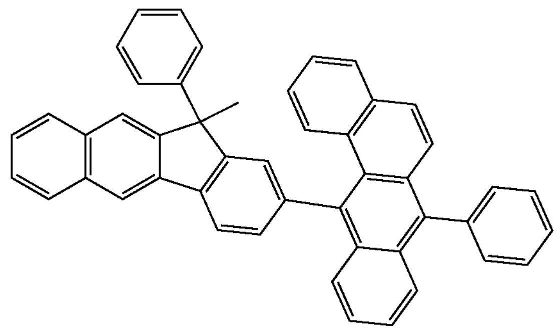
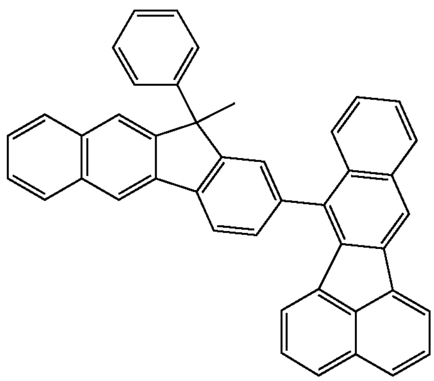
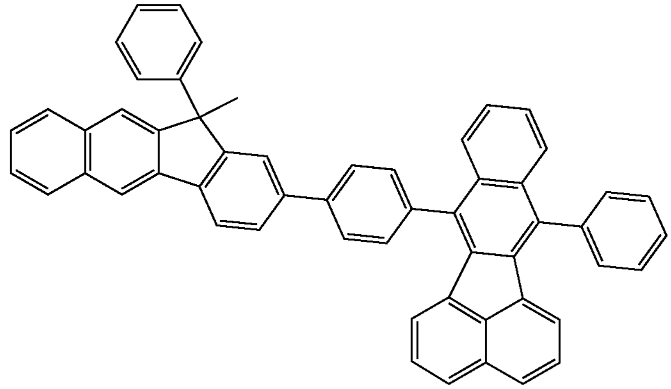
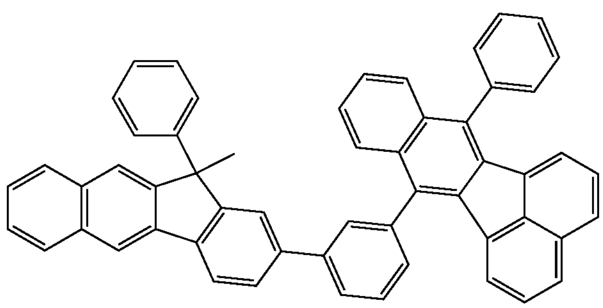
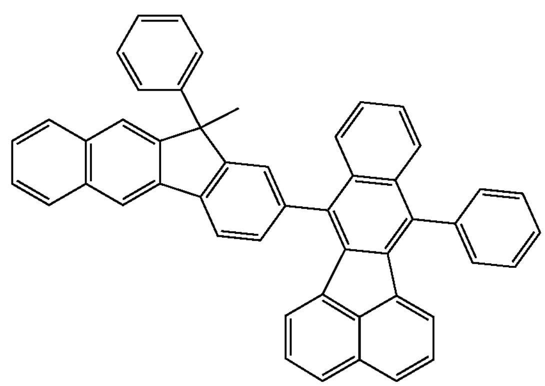
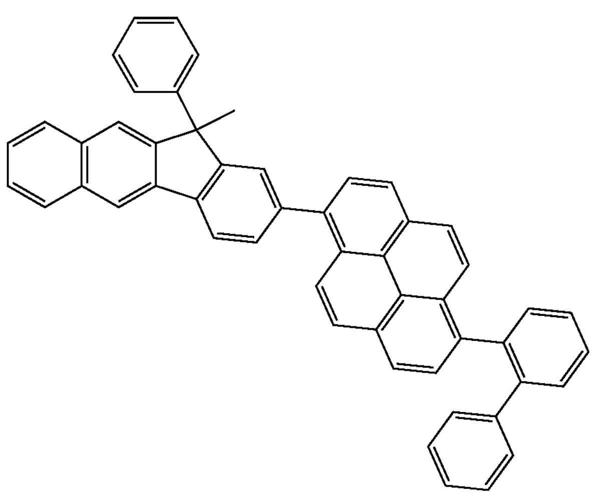
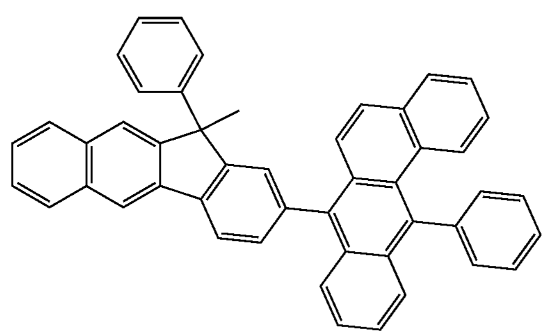

-continued
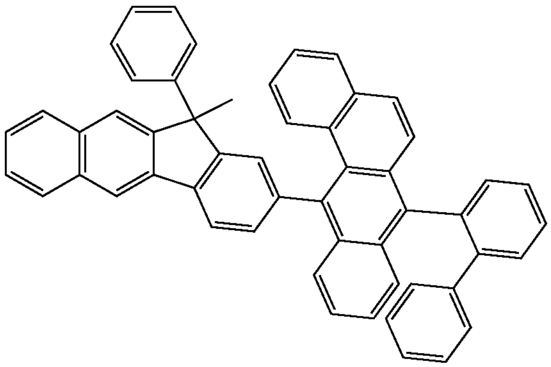
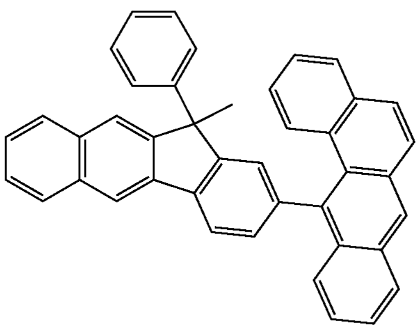
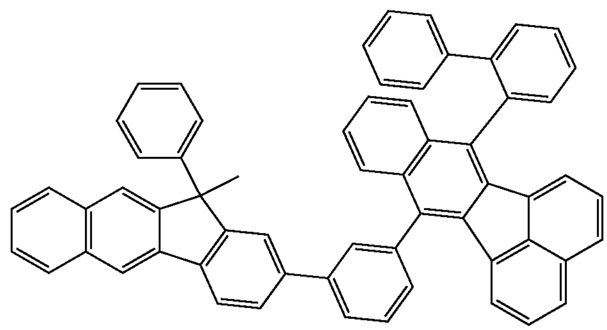
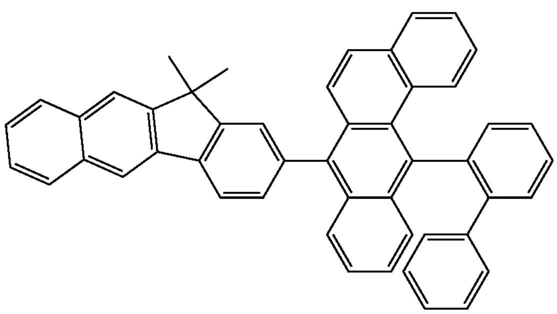
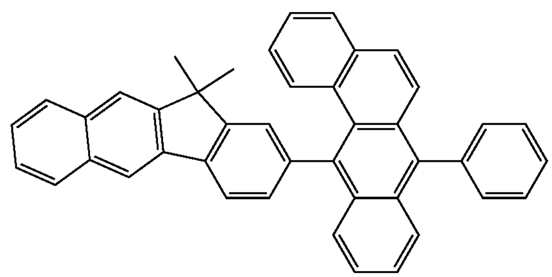
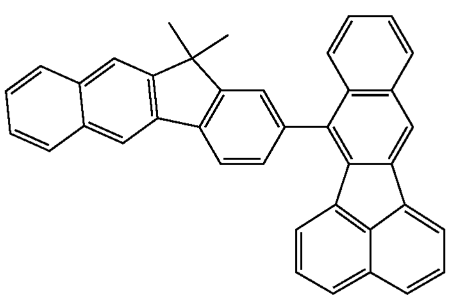
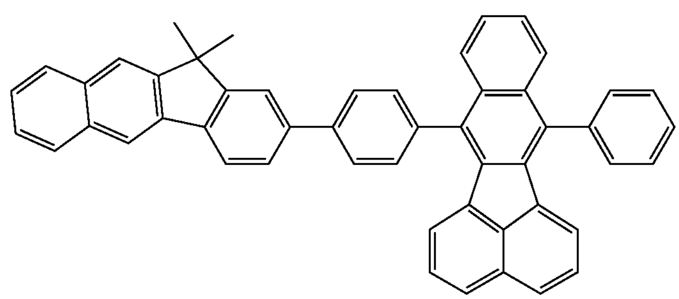
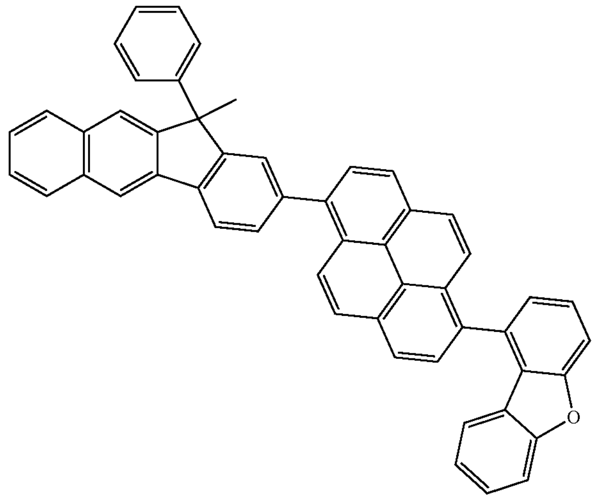

-continued
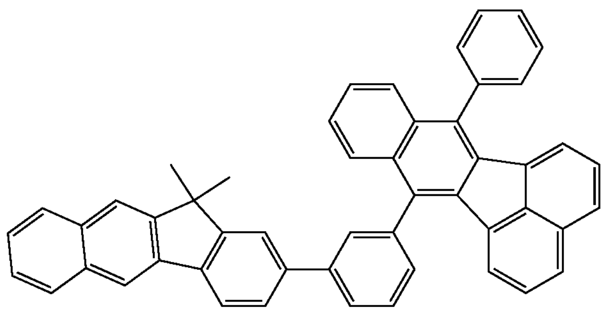
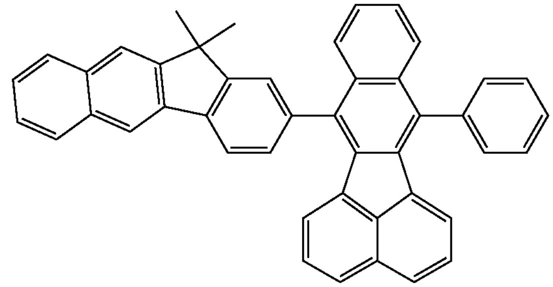
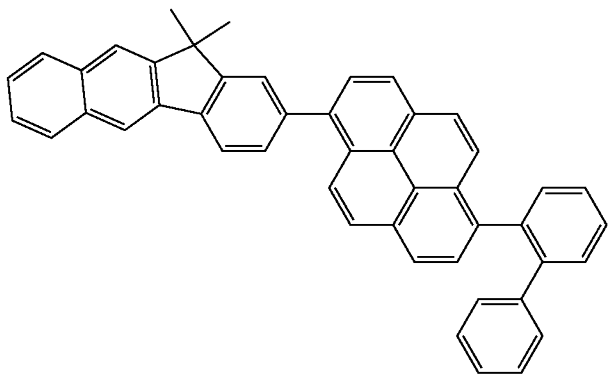
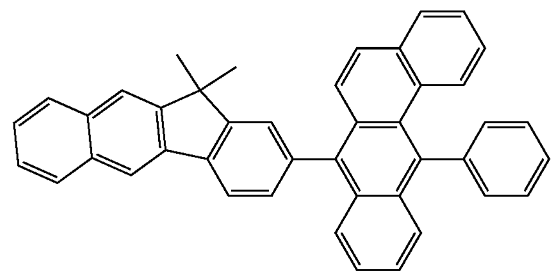
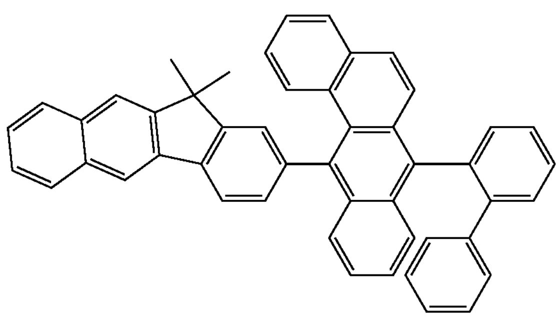
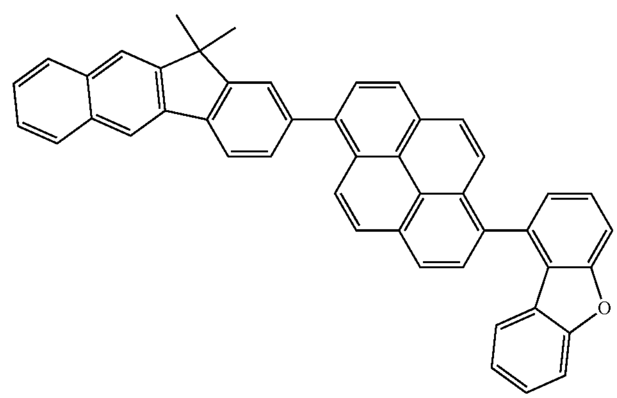
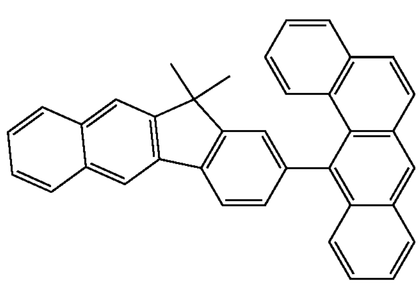
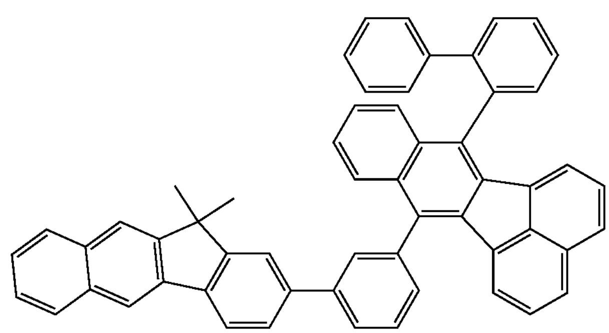

-continued
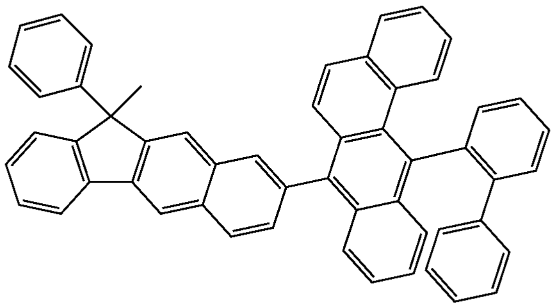
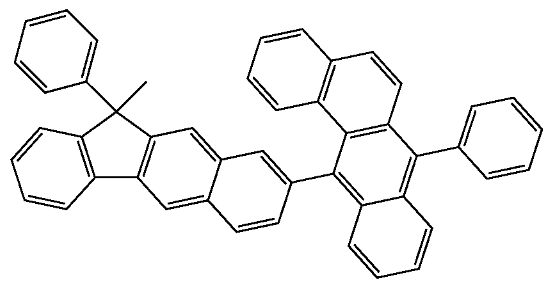
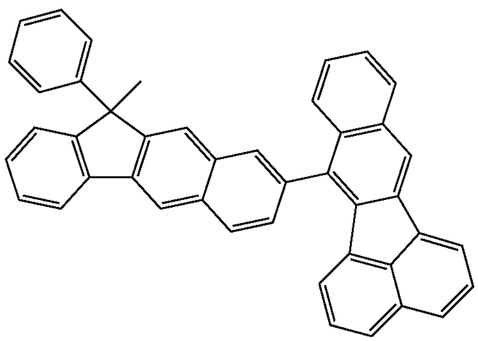
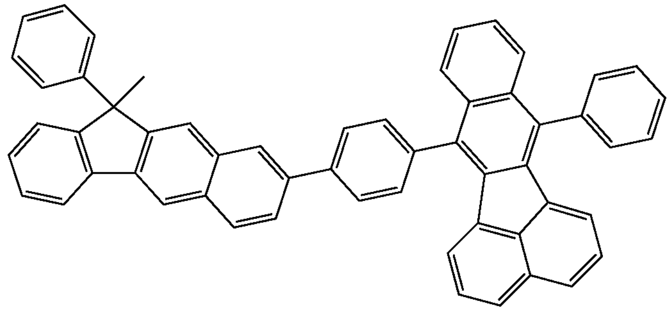
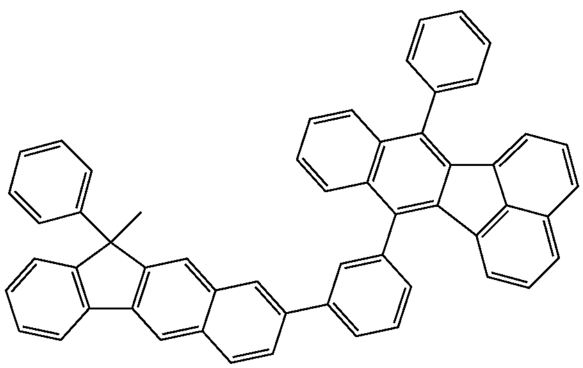
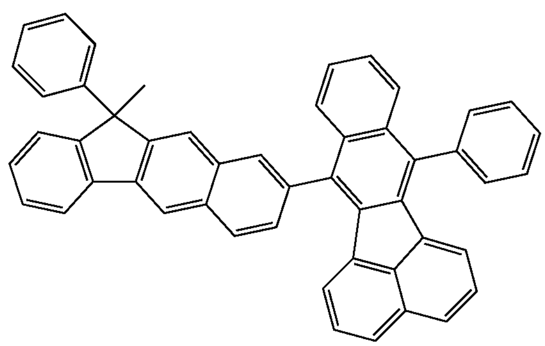
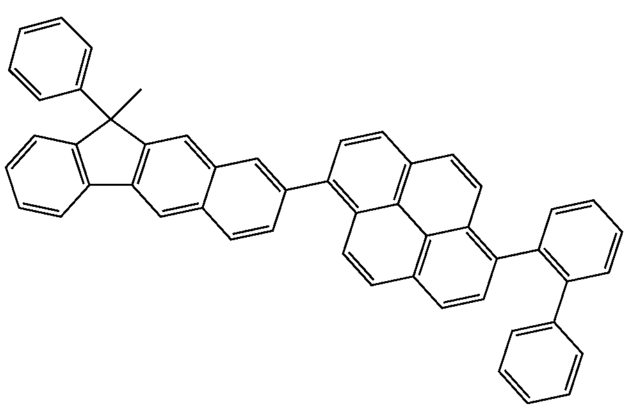
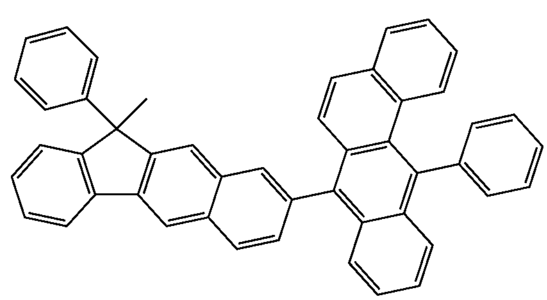

-continued
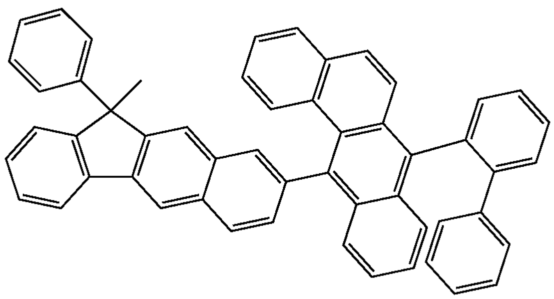
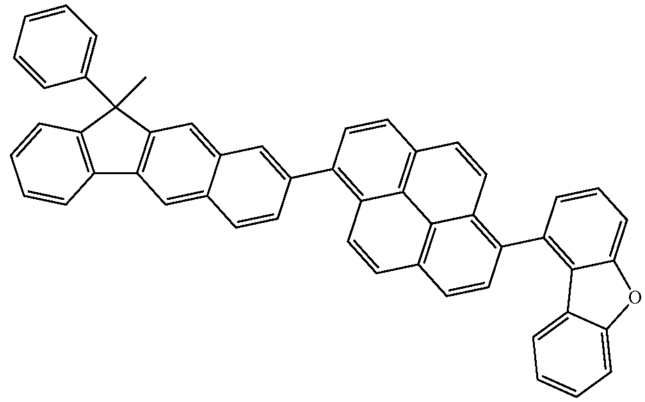
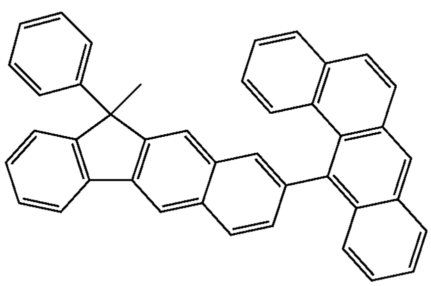
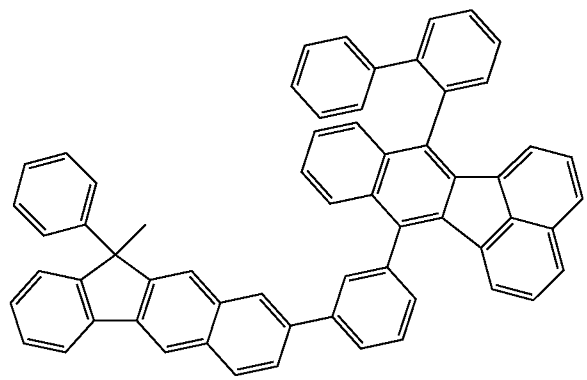
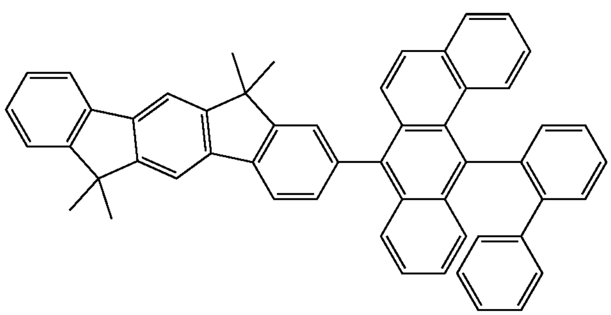
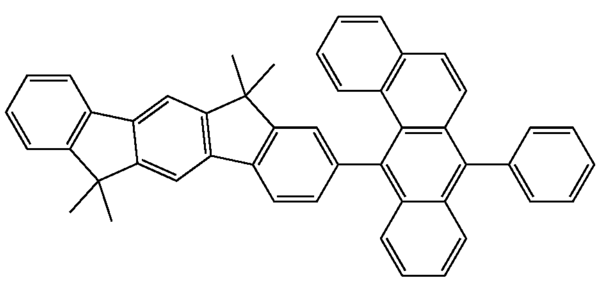
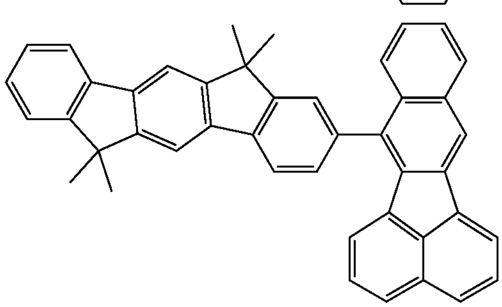

-continued
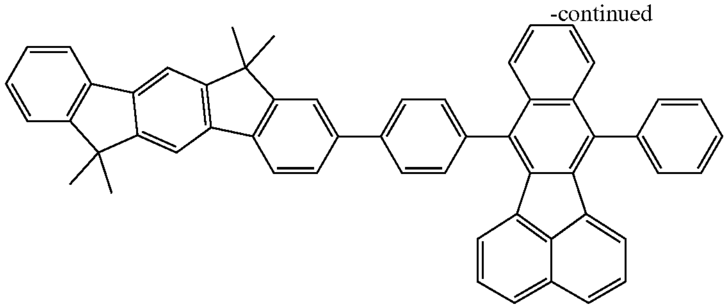
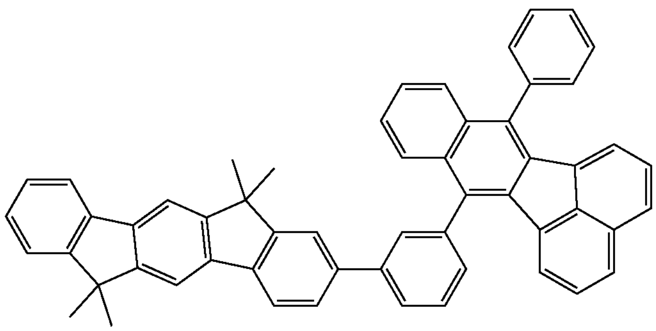
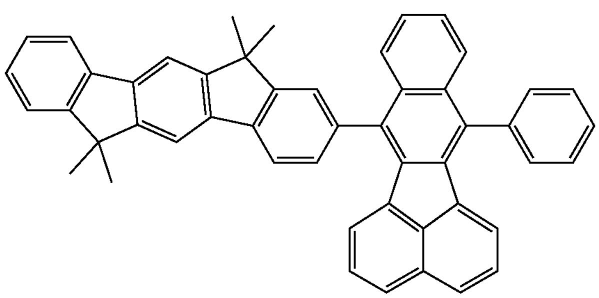
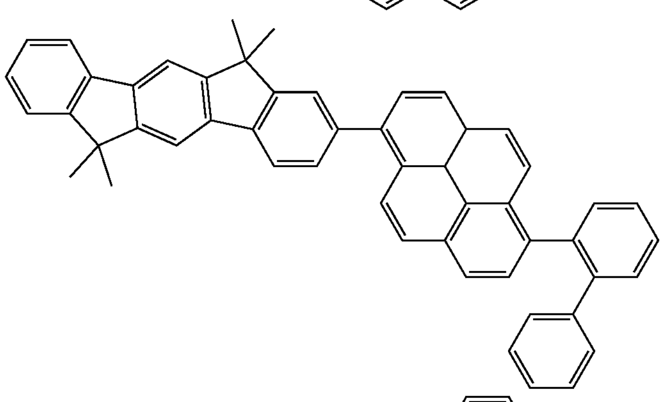
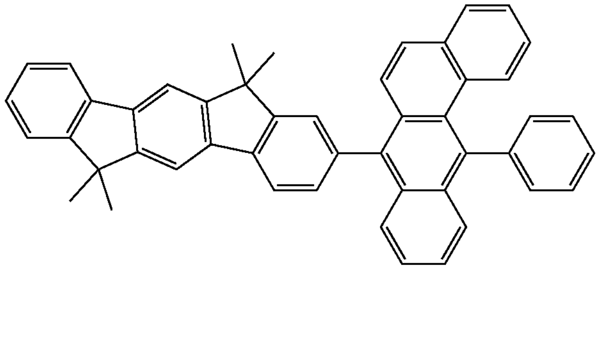

-continued
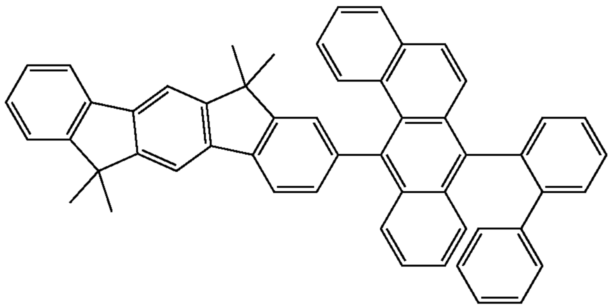
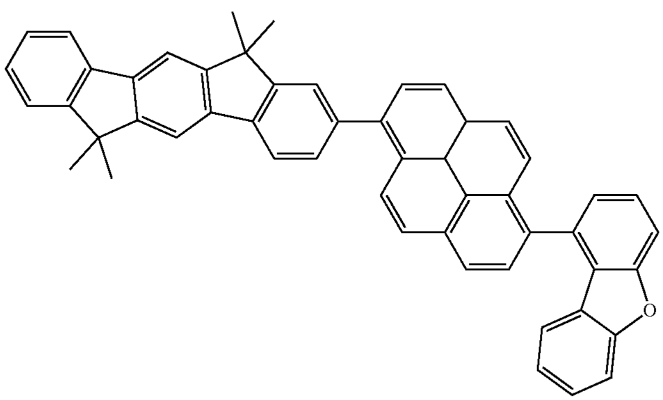
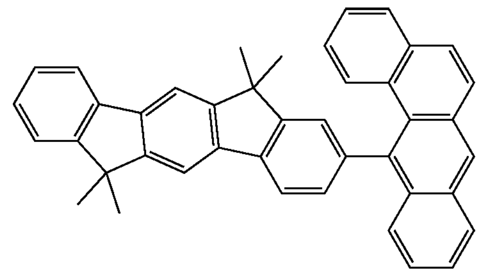
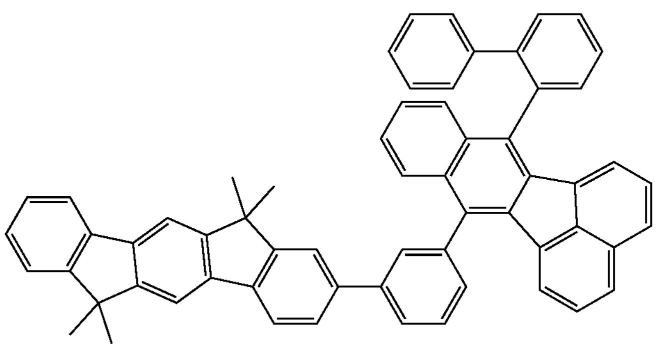
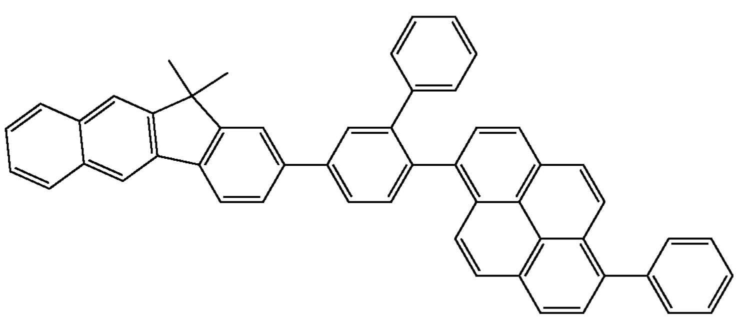
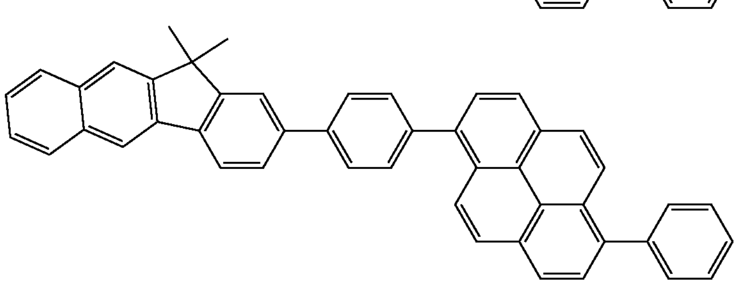

-continued
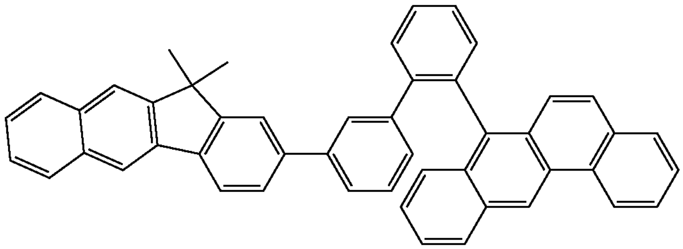
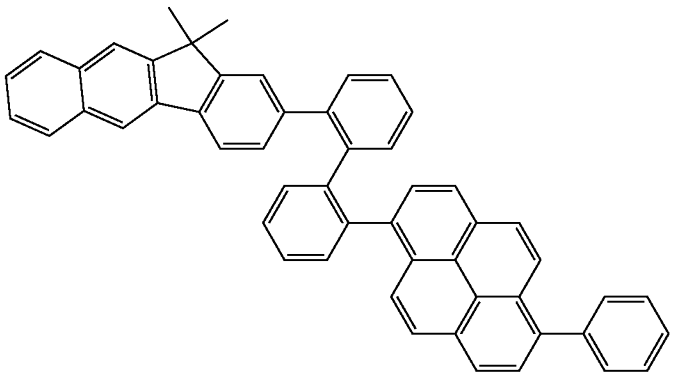
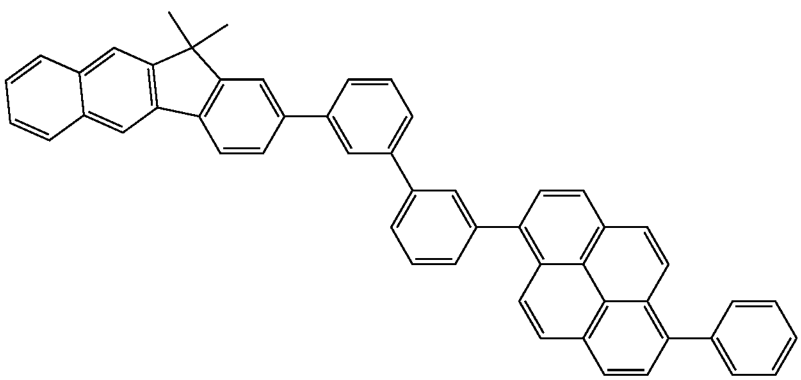
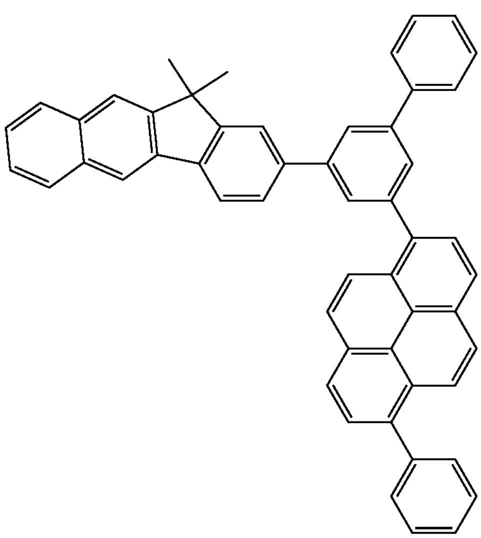
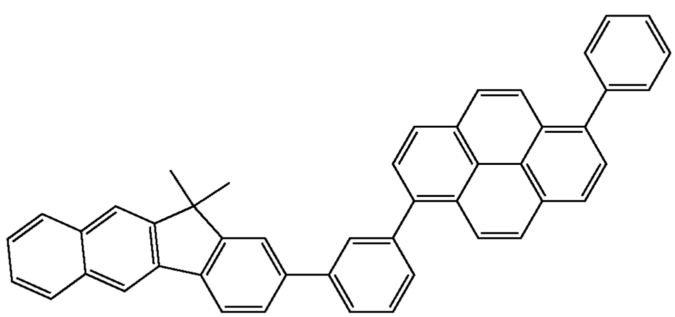

-continued
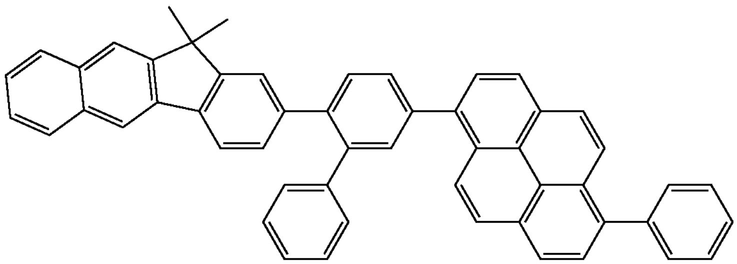
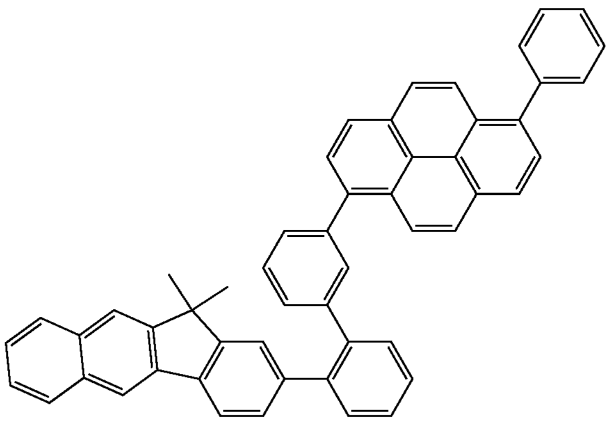
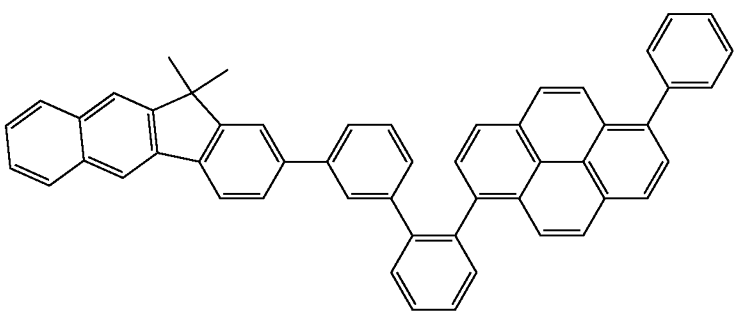
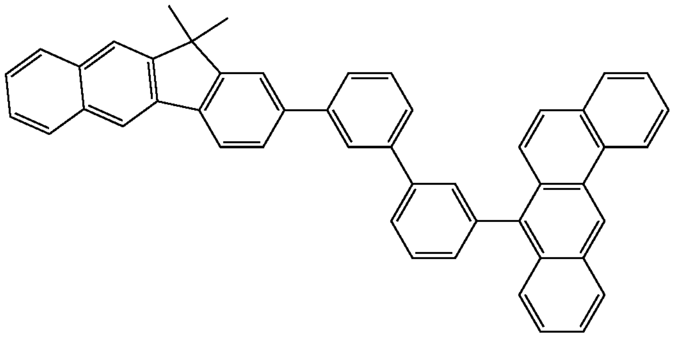

-continued
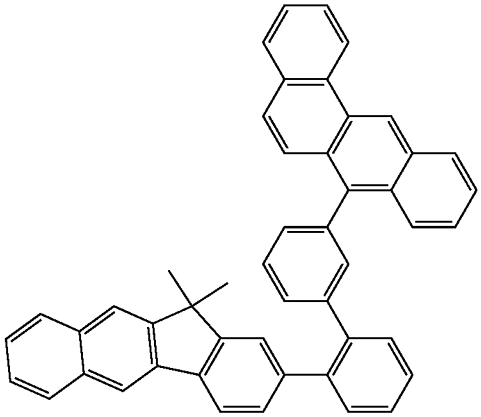
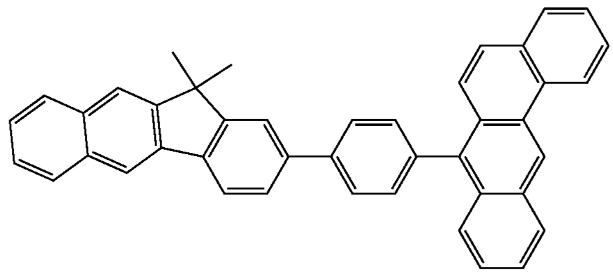
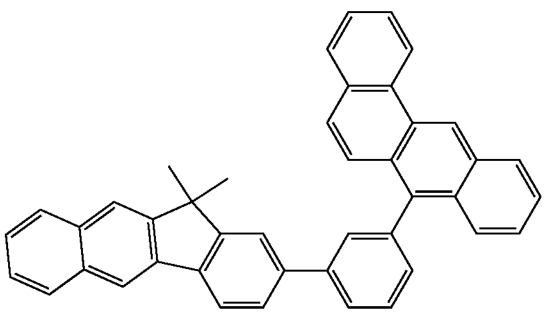
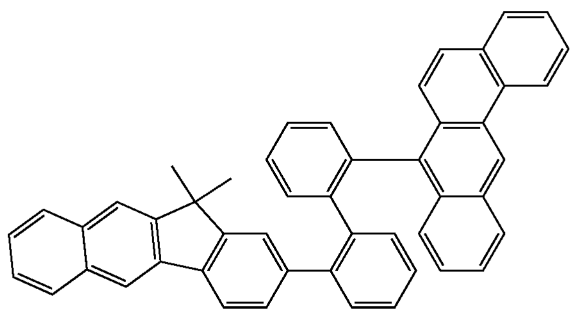
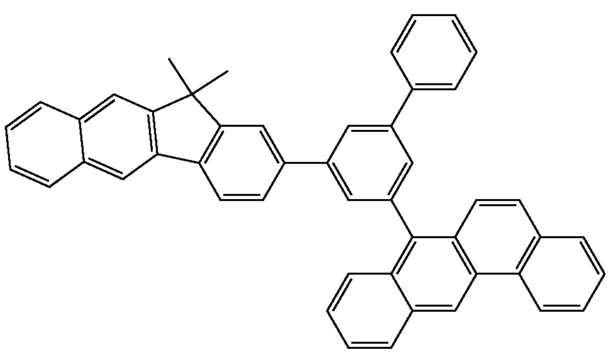
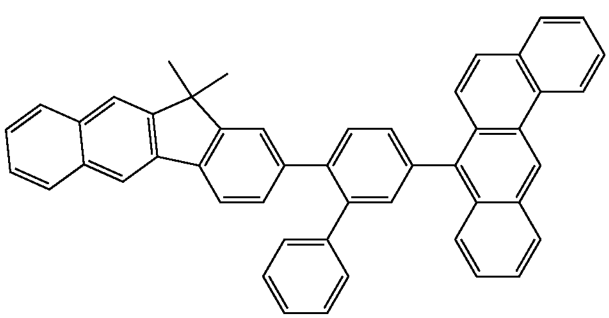

-continued
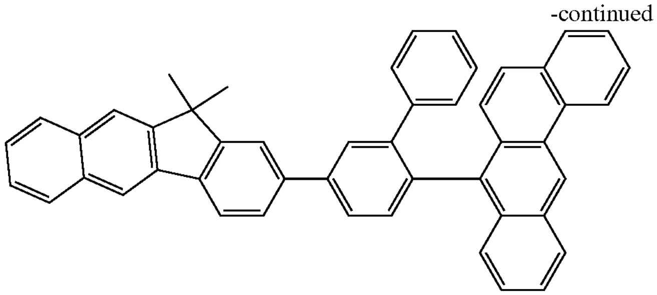
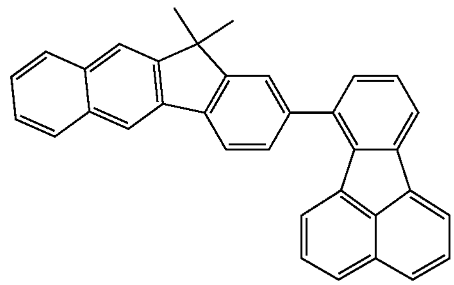
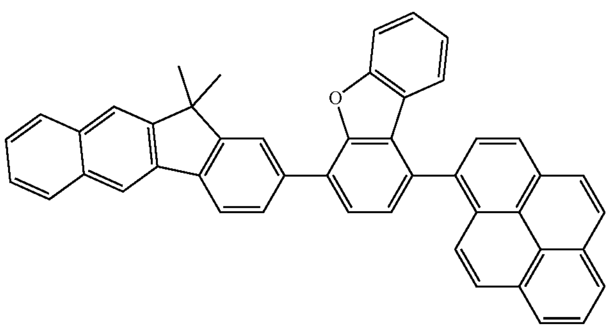
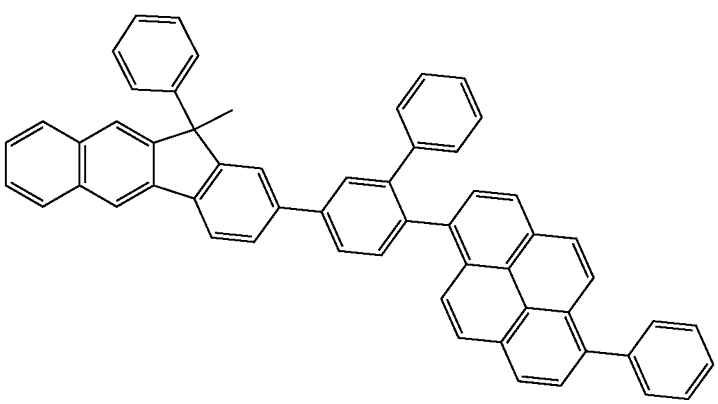
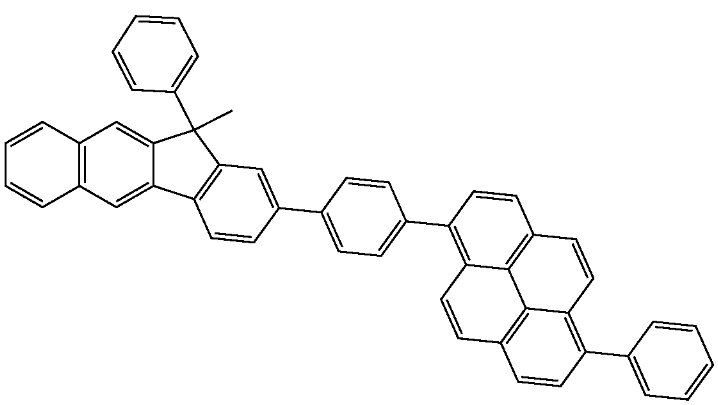

-continued
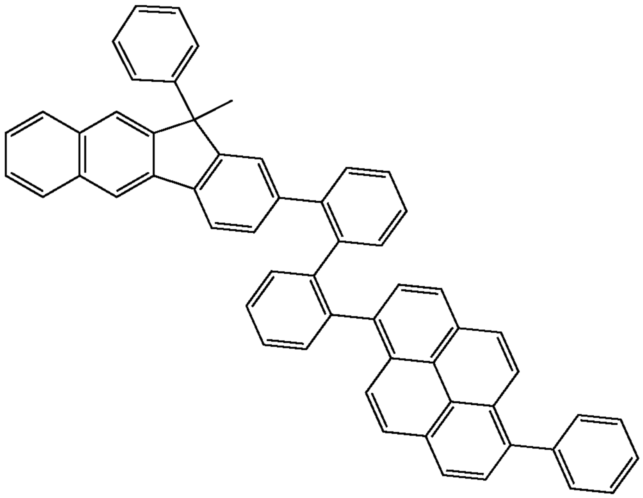
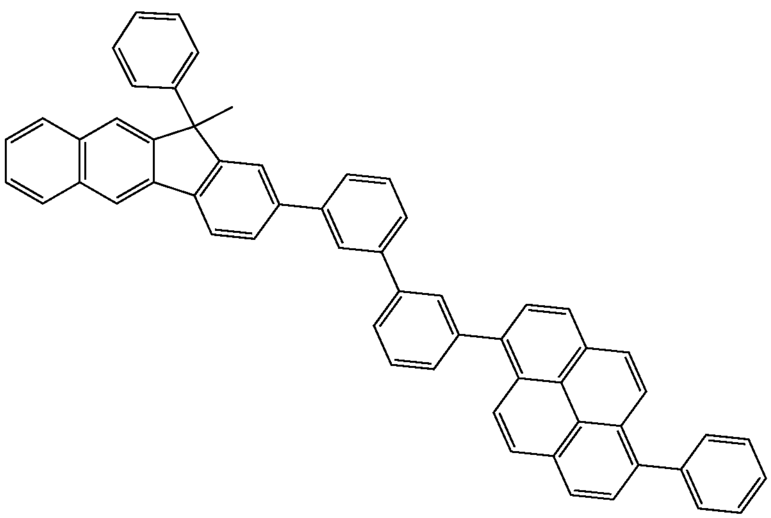
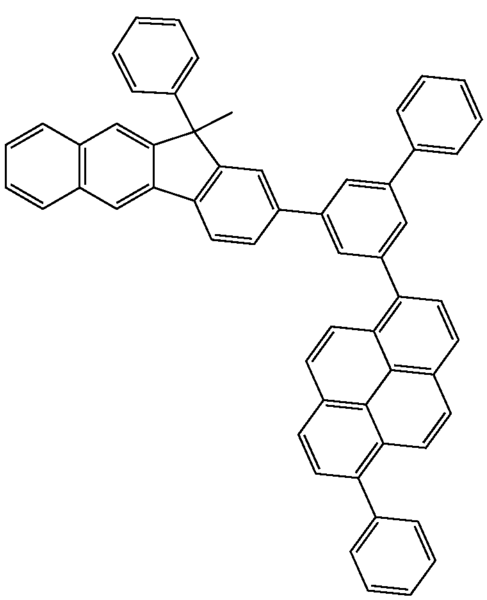
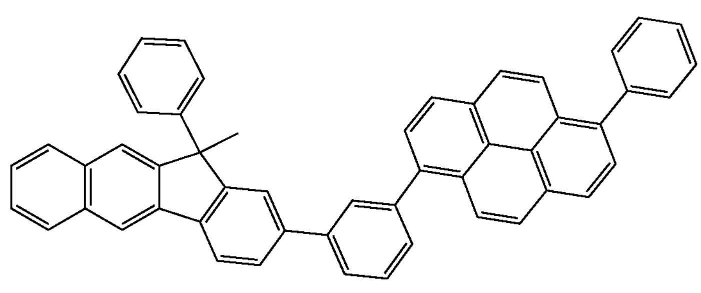

-continued
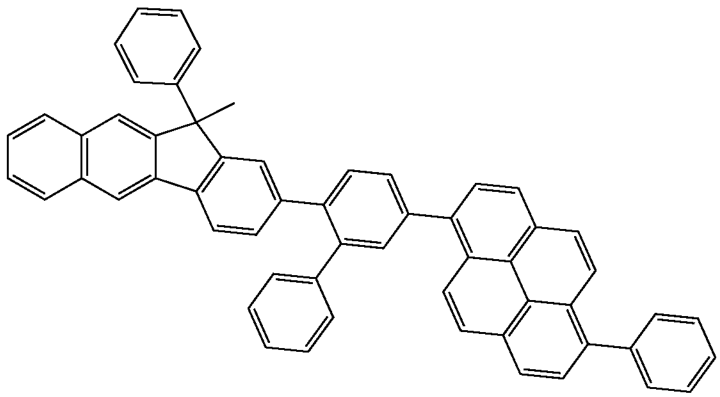
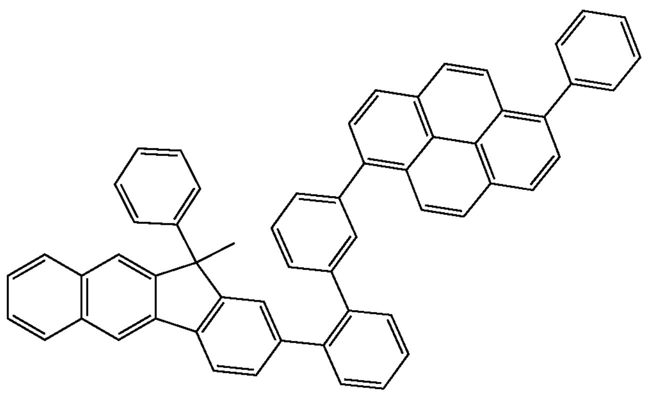
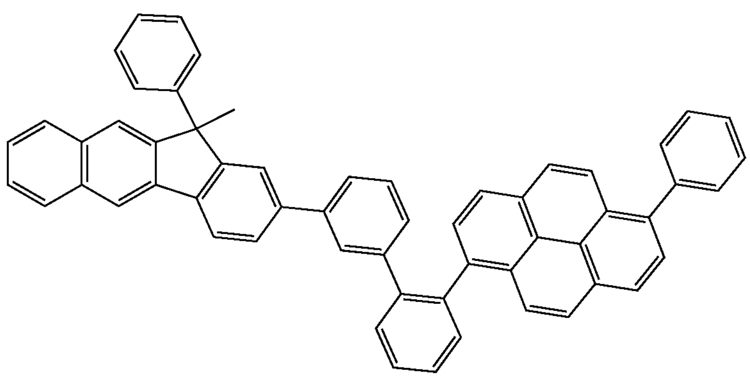
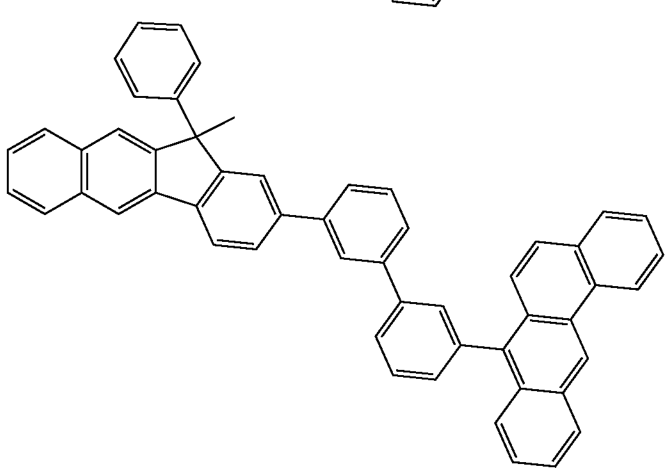
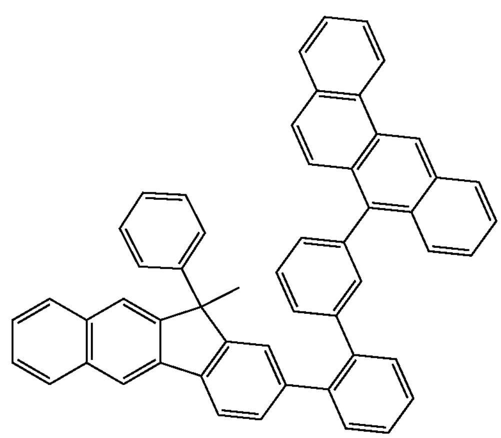

-continued
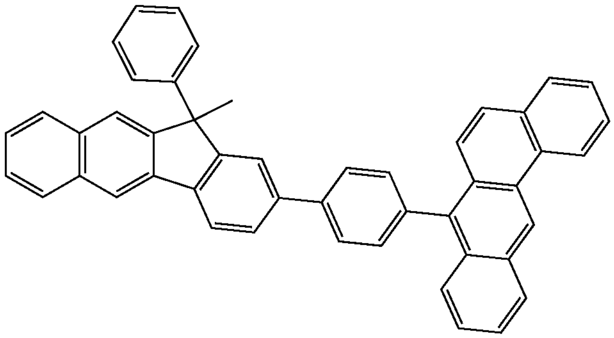
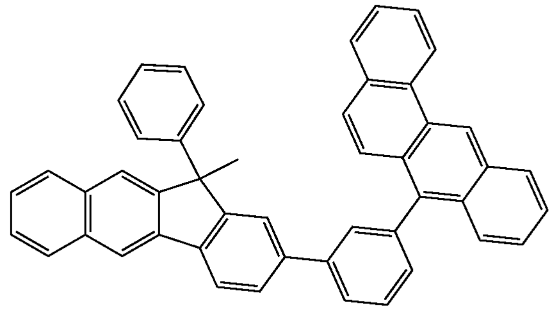
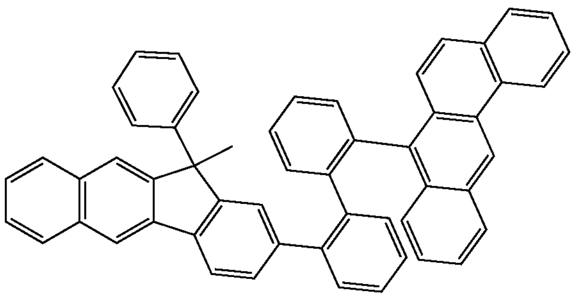
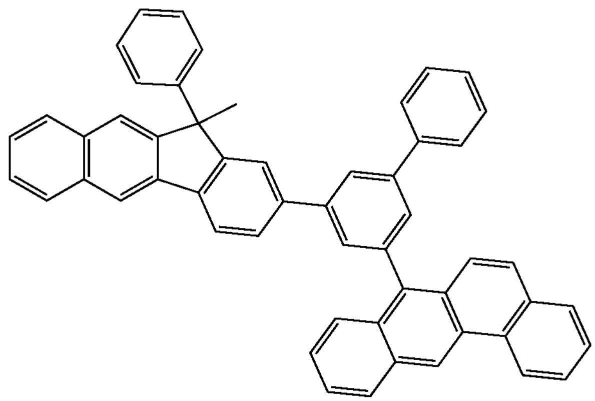
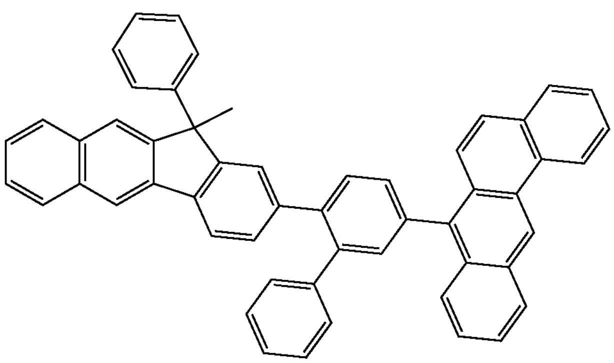
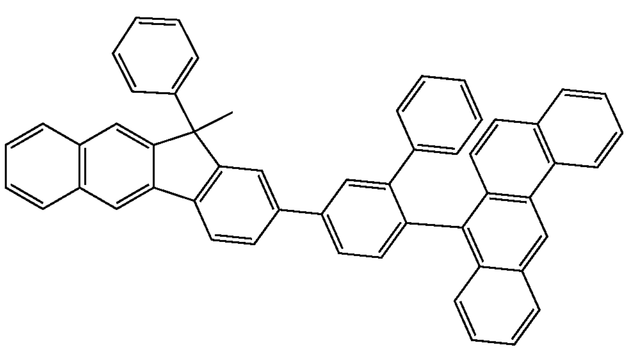

-continued
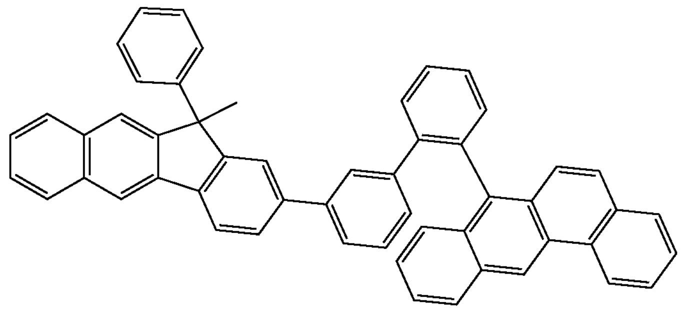
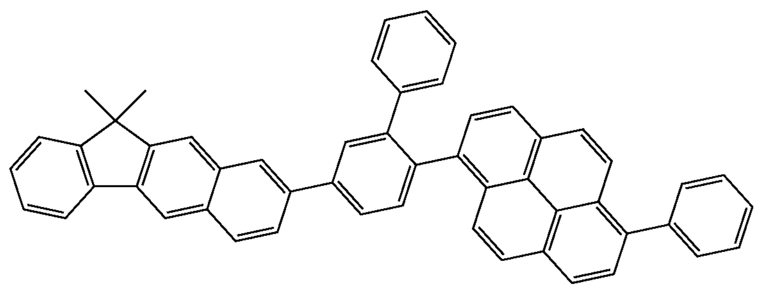
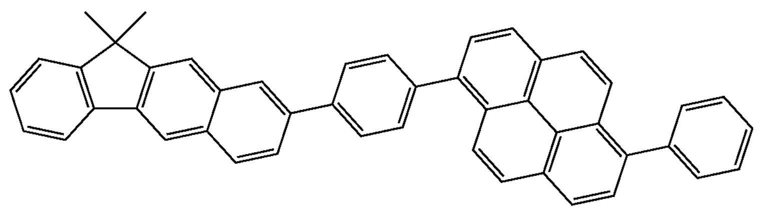
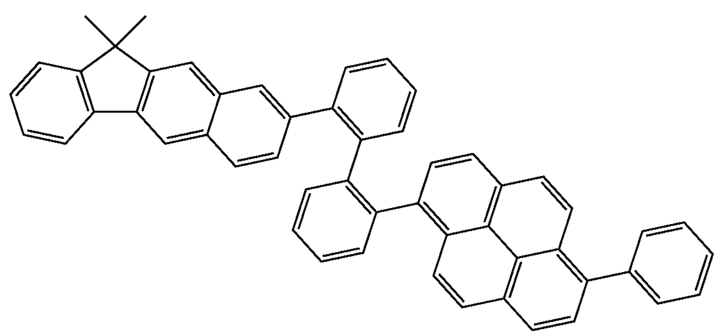
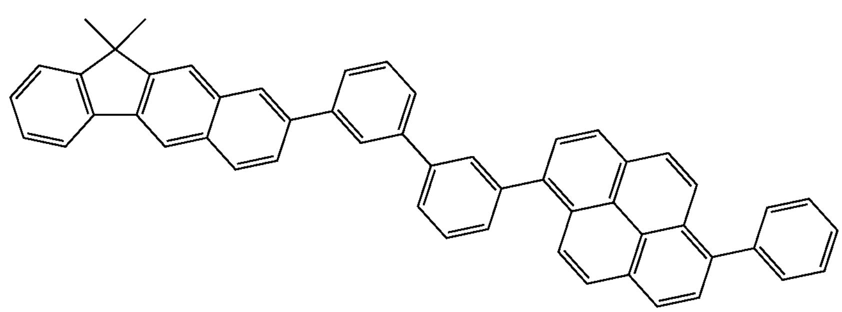

-continued
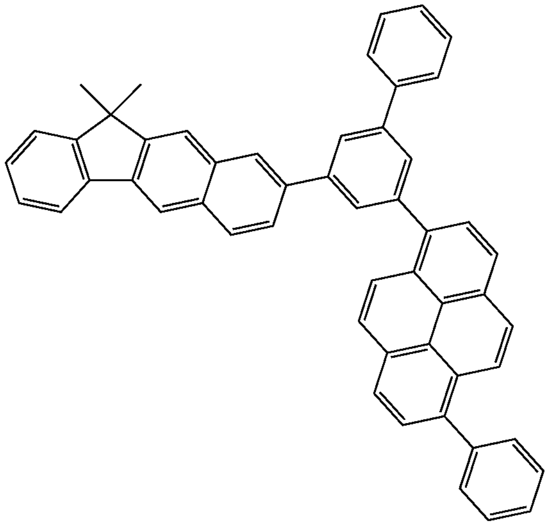
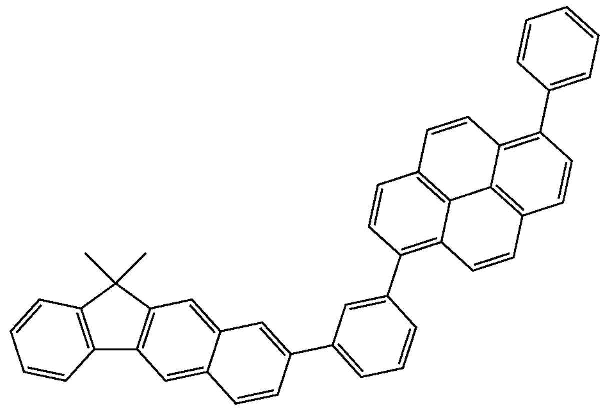
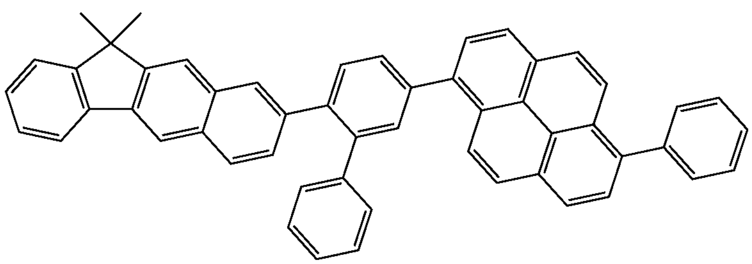
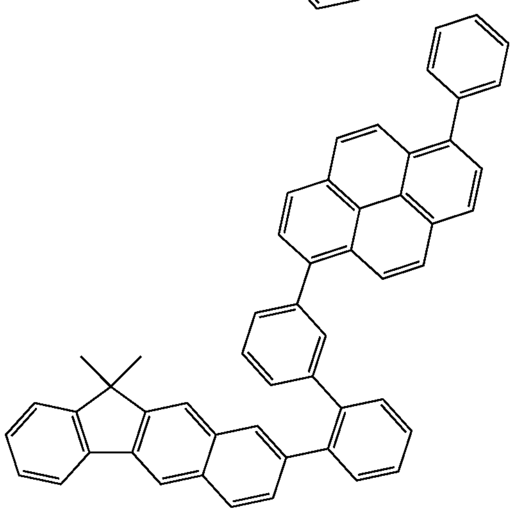
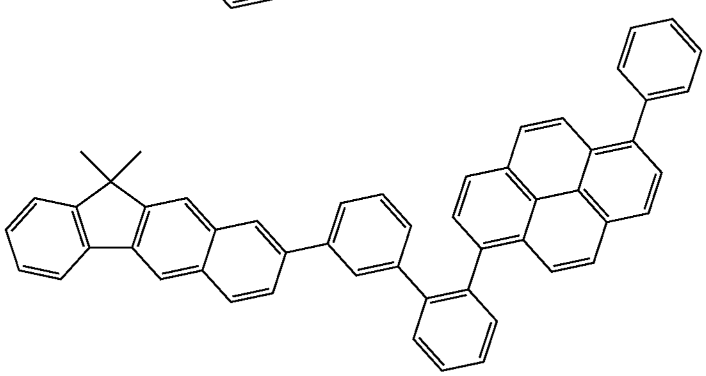

-continued
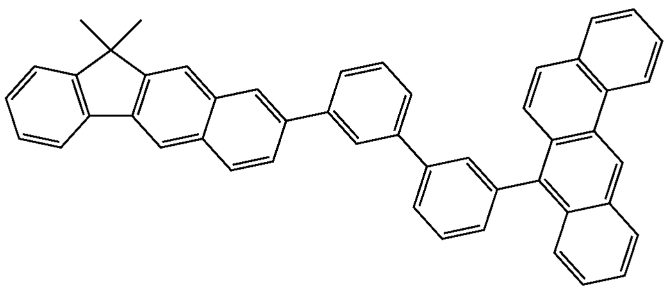
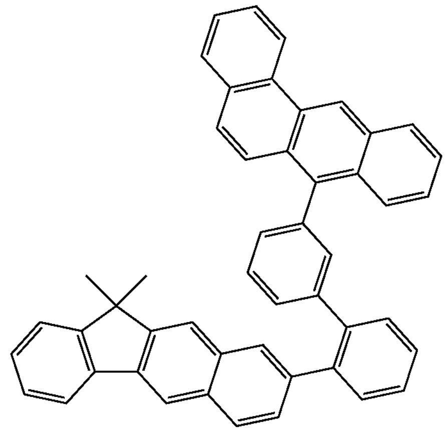
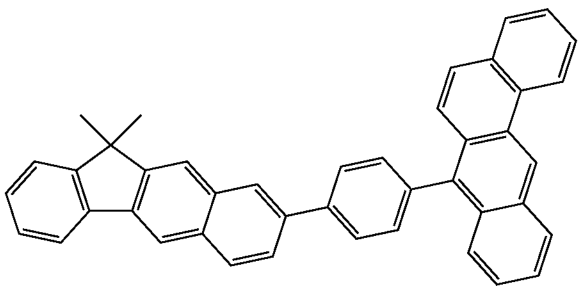
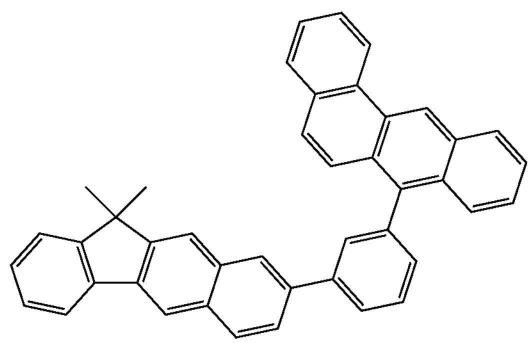
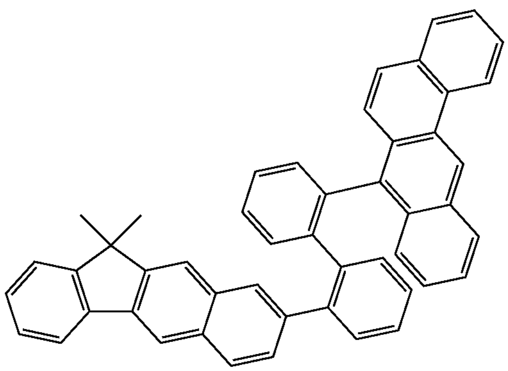
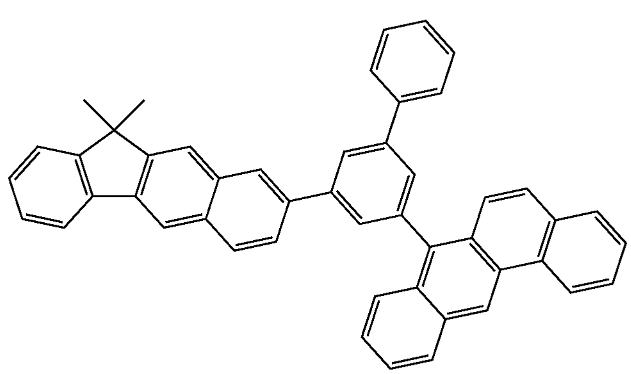

-continued
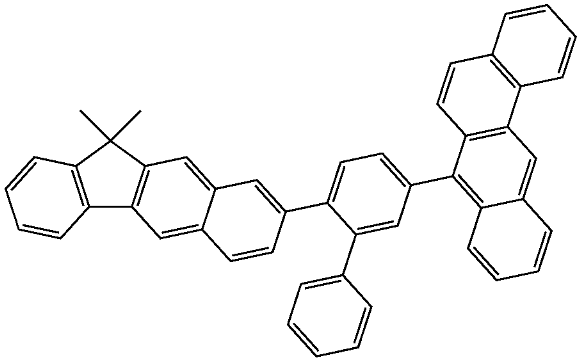
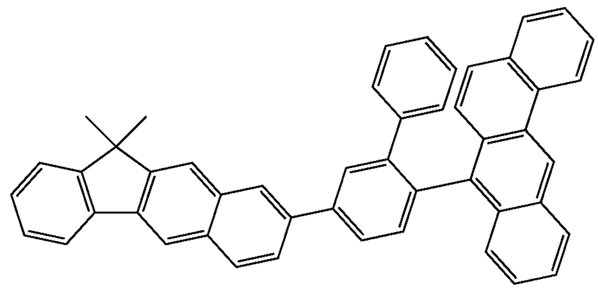
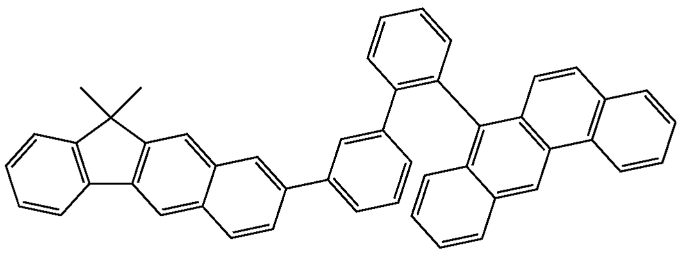
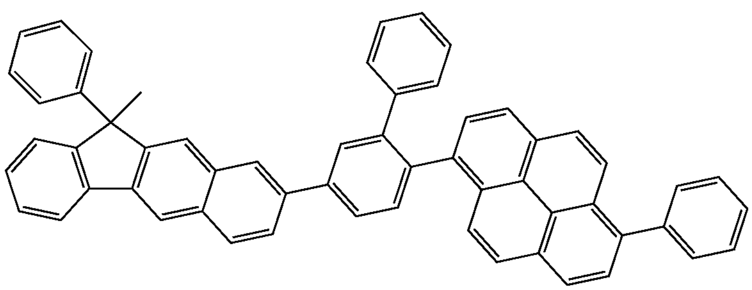
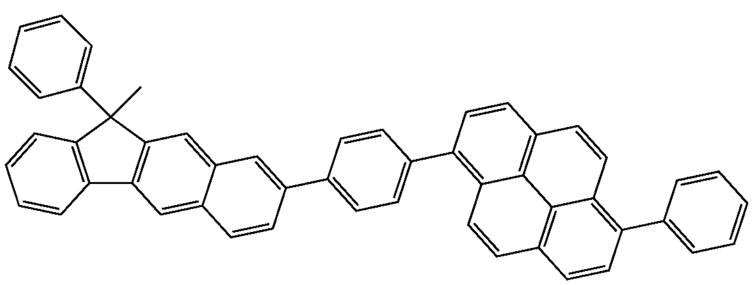
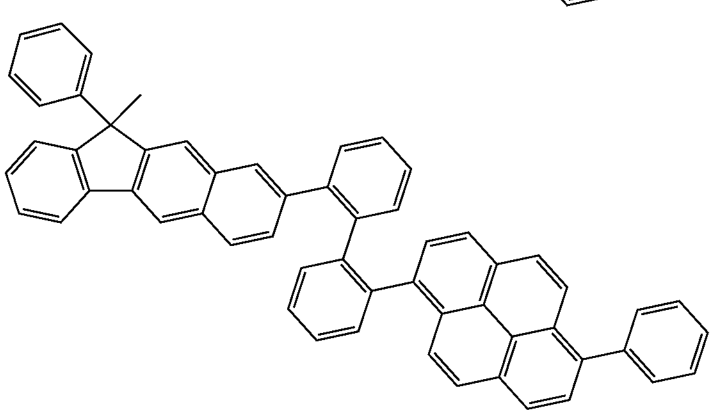

-continued
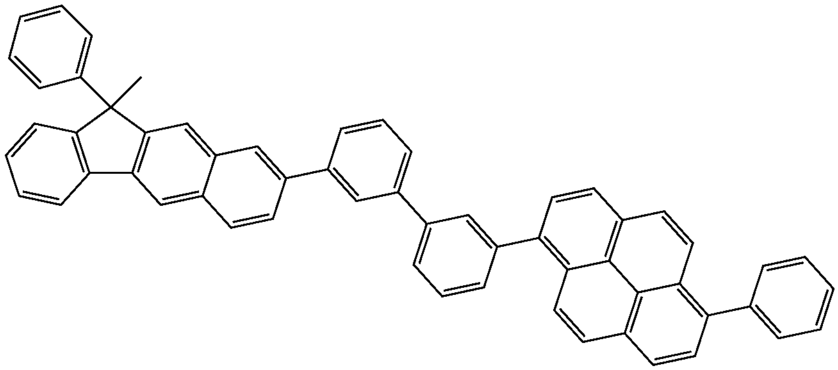
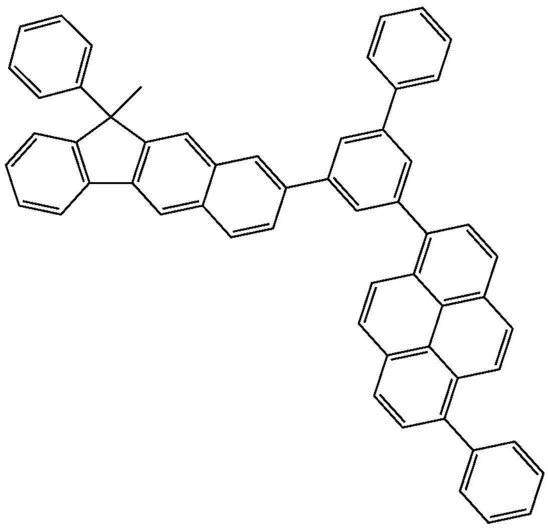
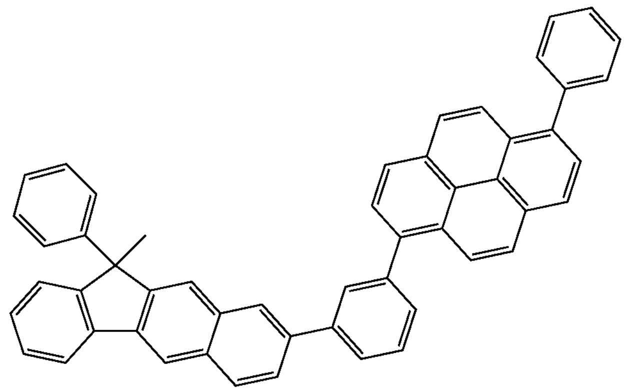
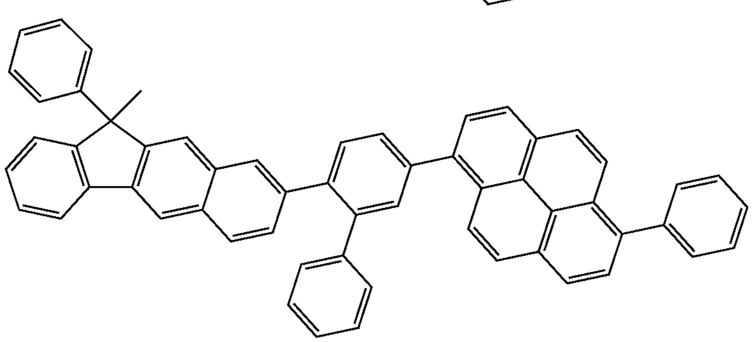
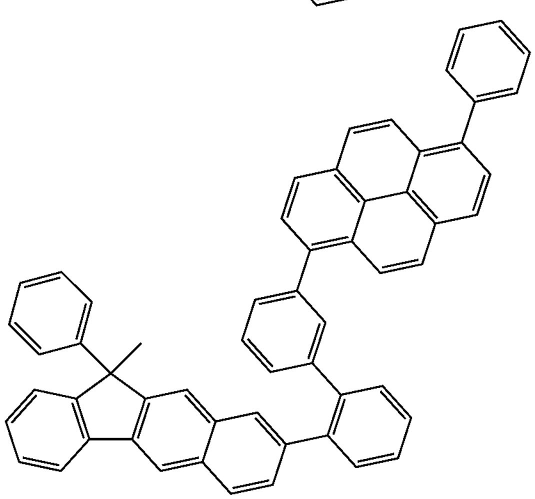

-continued
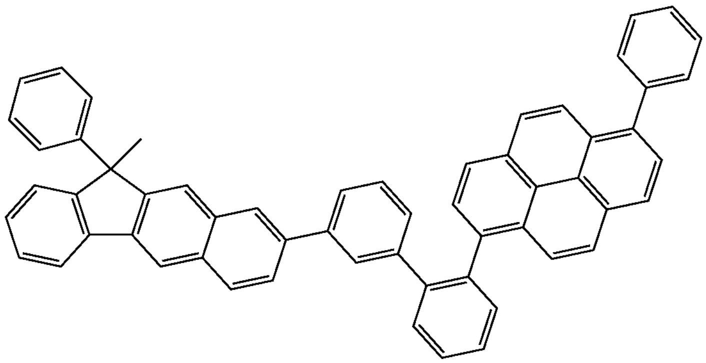
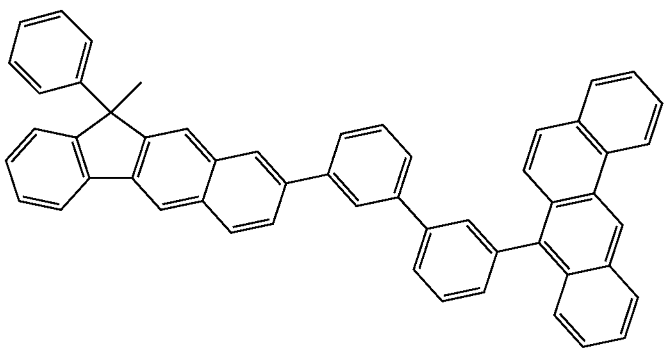 [SMILES: CC1(c2ccccc2)c2ccccc2-c2cc3ccc(-c4cccc(-c5cccc(-c6c7ccccc7cc7c6ccc6ccccc67)c5)c4)cc3cc21]
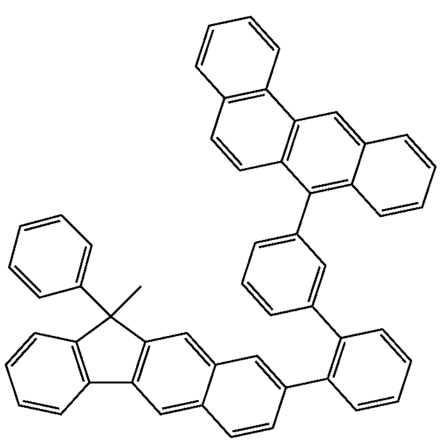
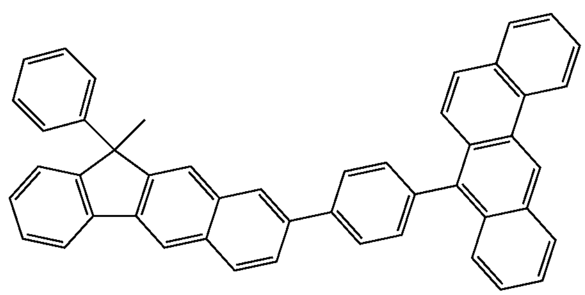
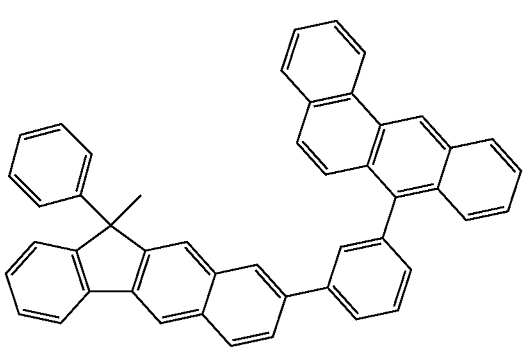
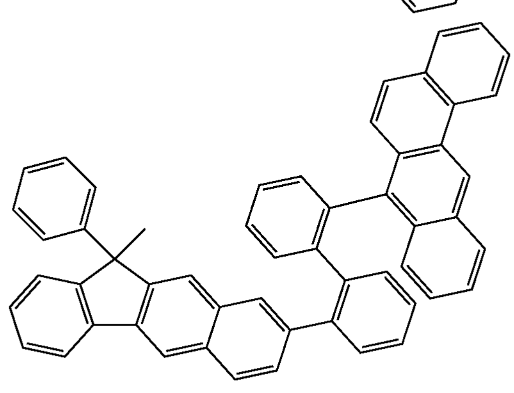

-continued
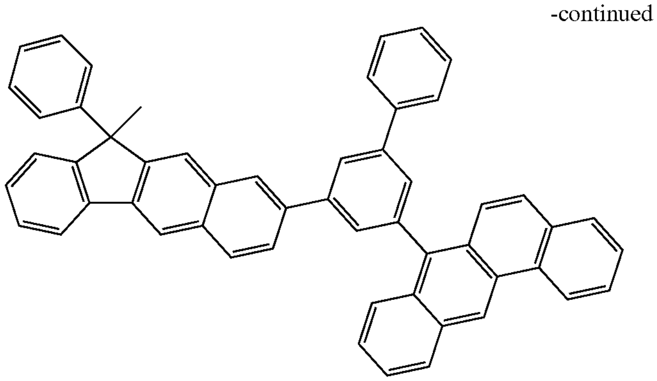
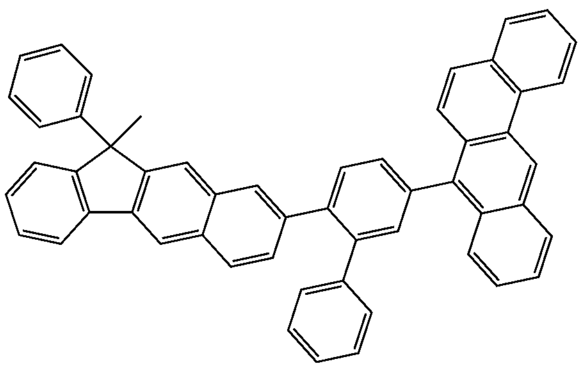
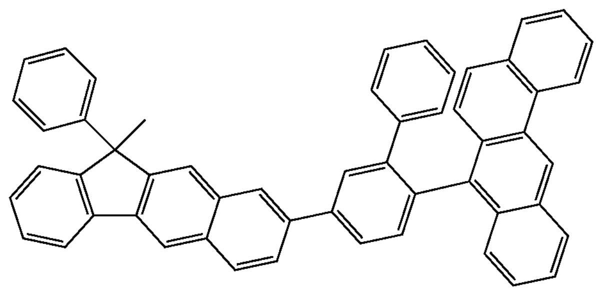
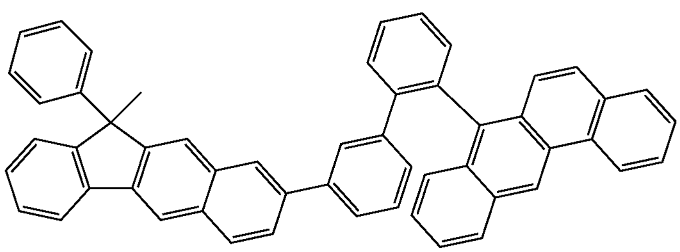
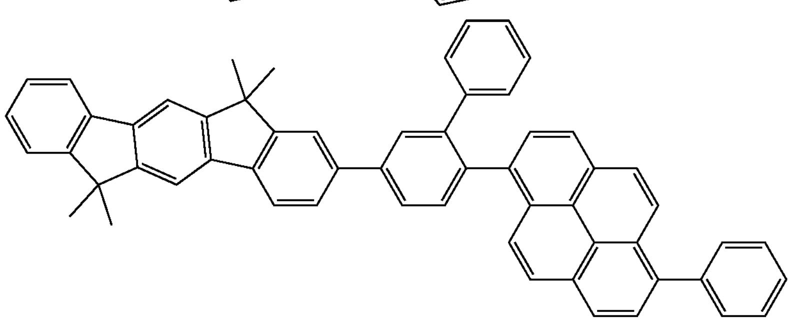
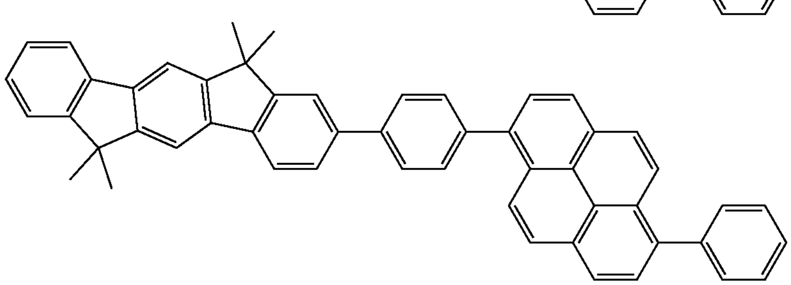

-continued
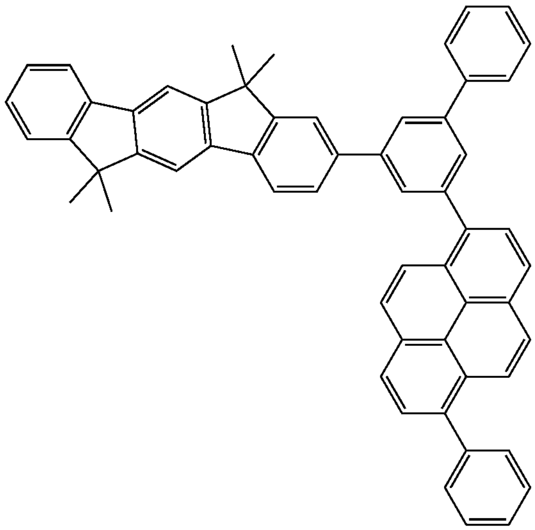
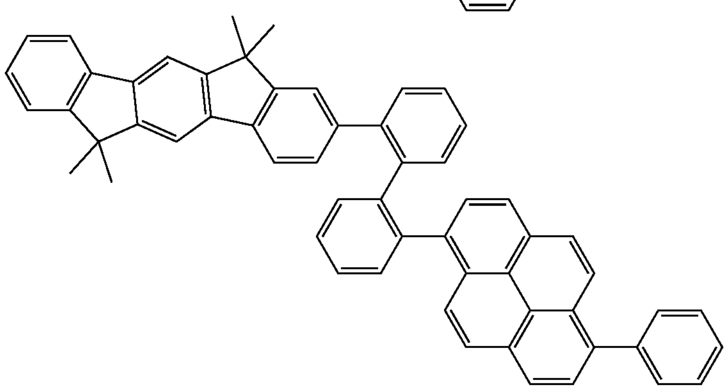
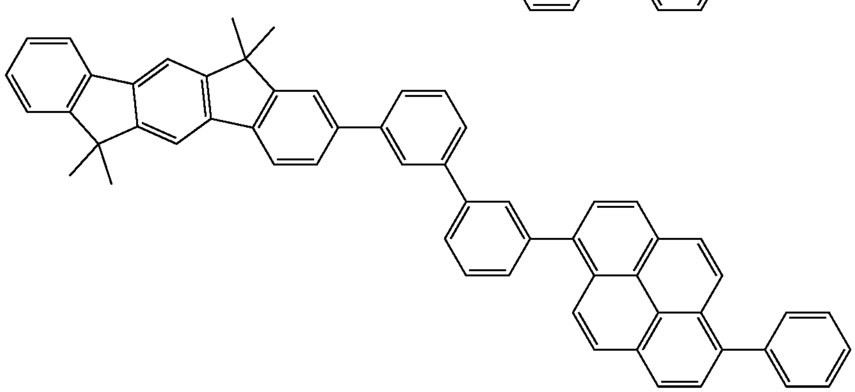
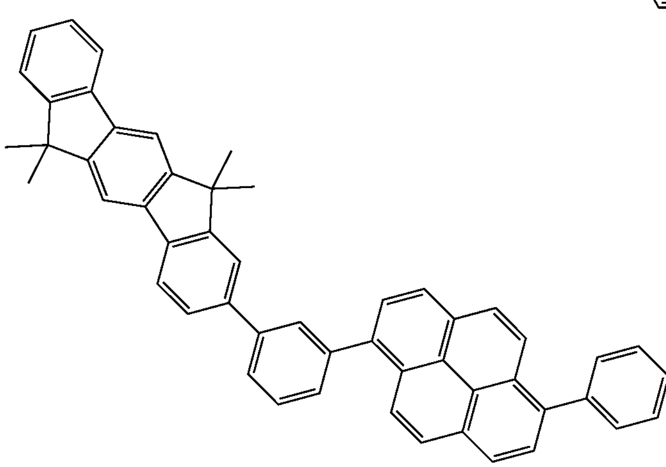

-continued
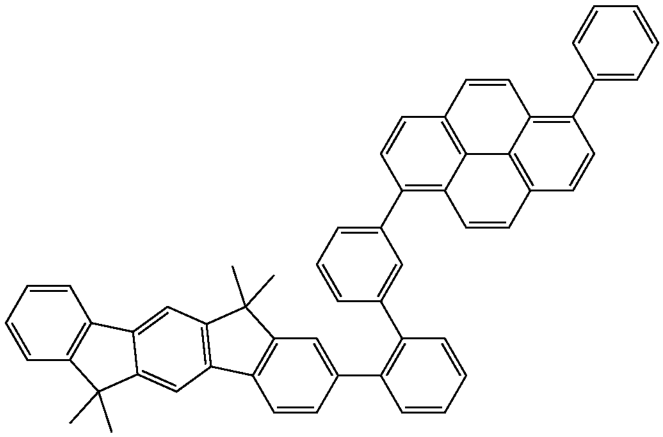
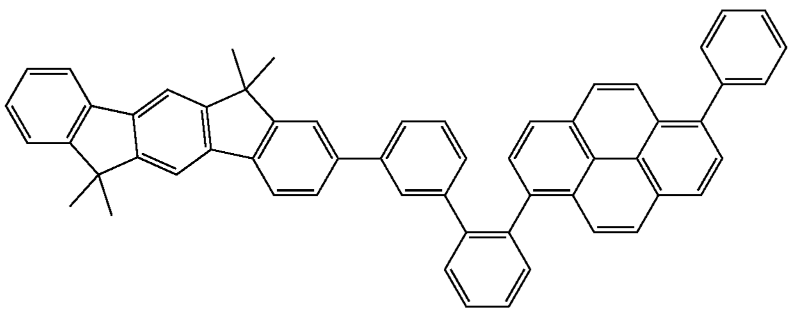
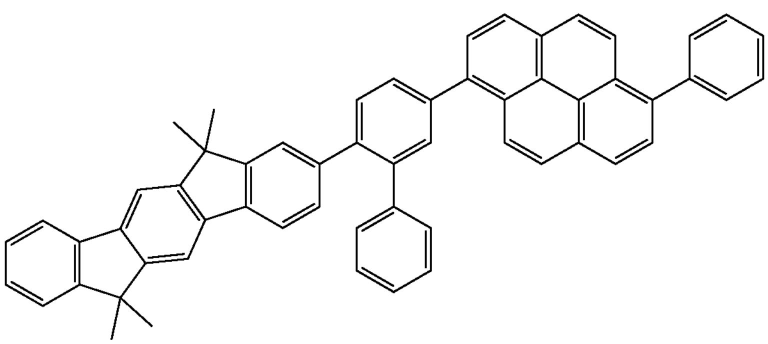
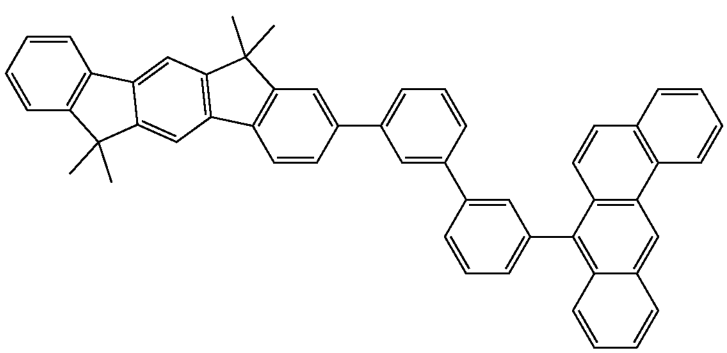

-continued
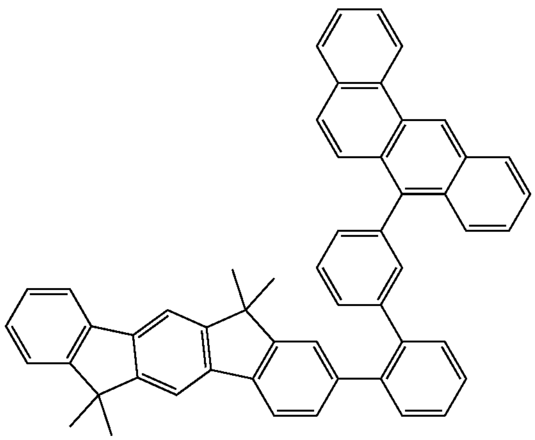
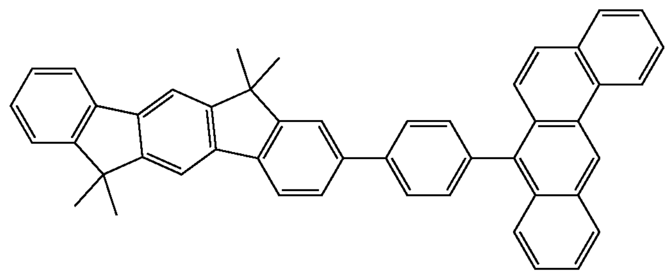
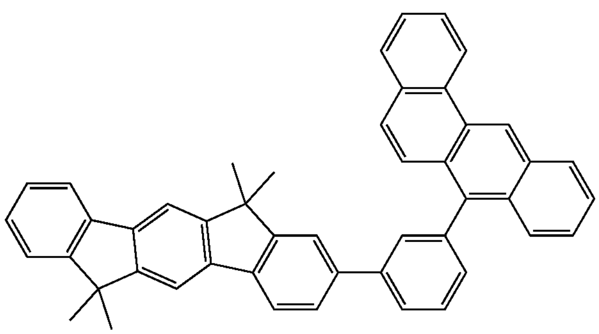
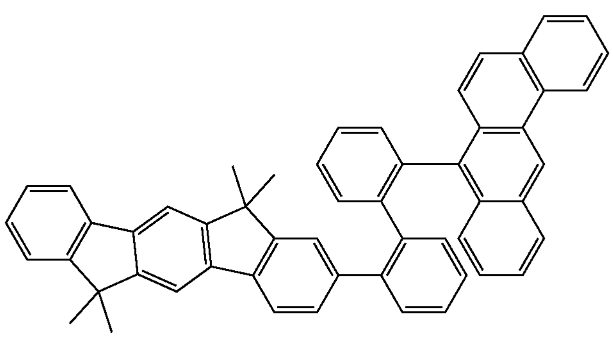
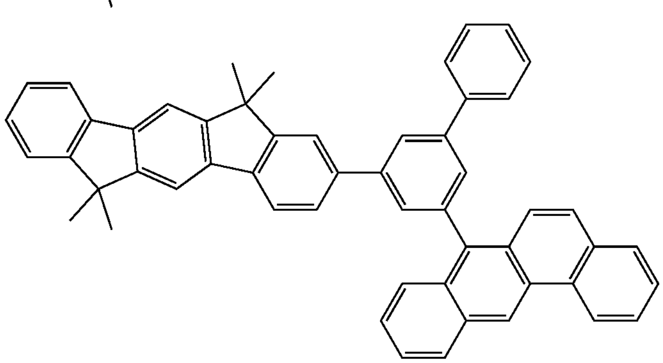

-continued
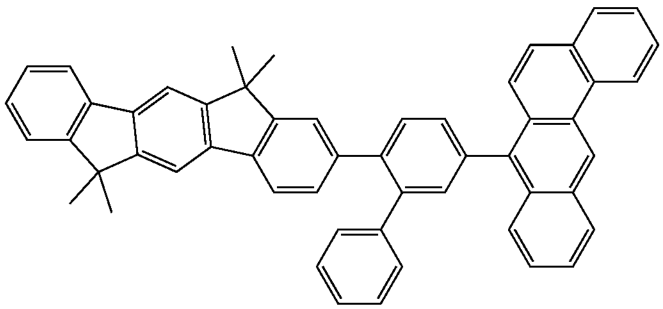
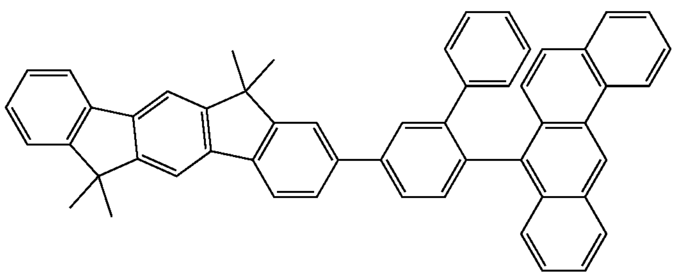
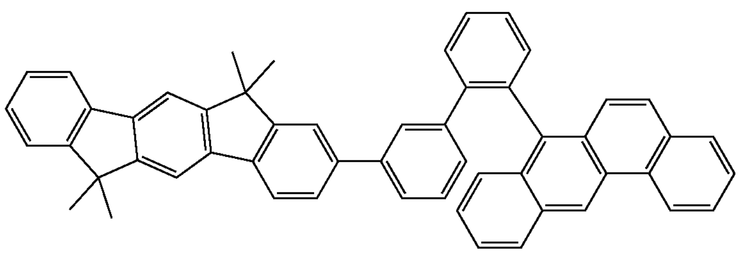
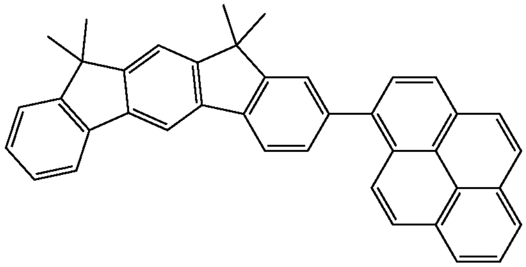
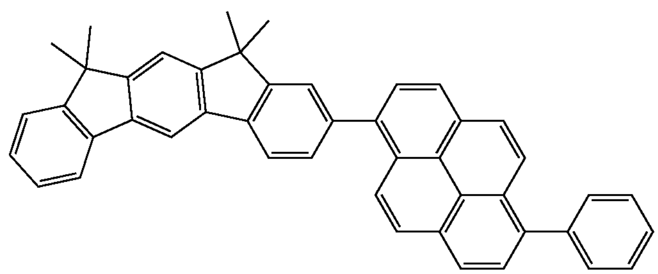
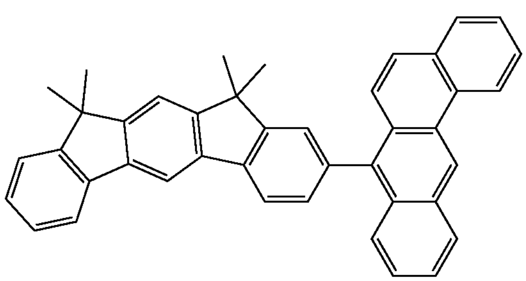
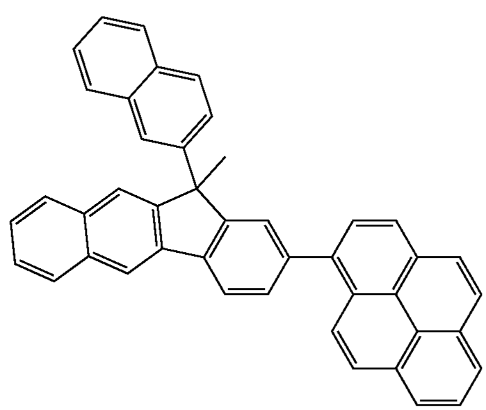

-continued
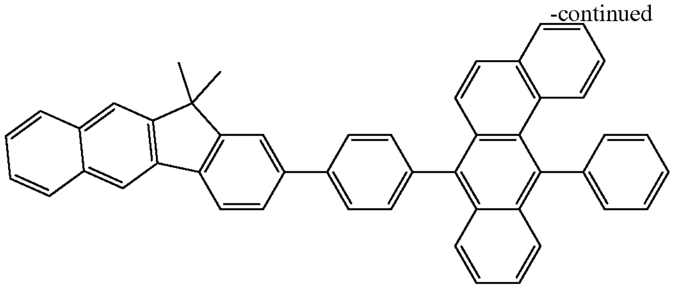
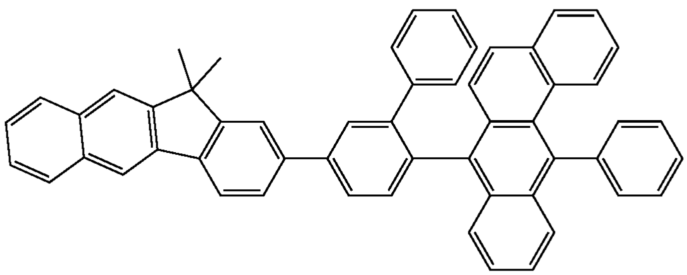
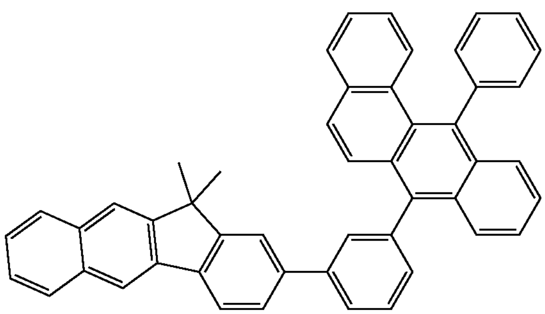
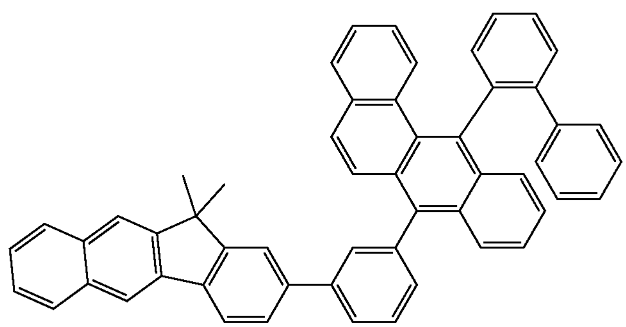
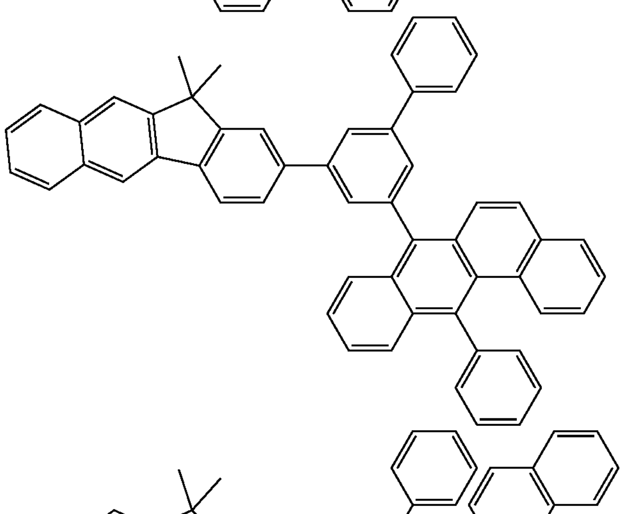
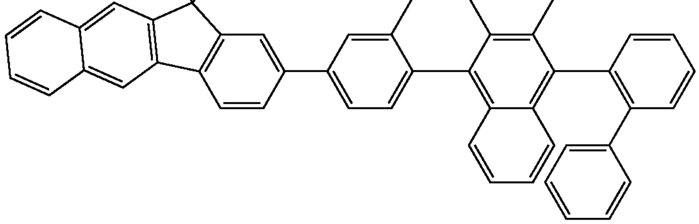

-continued
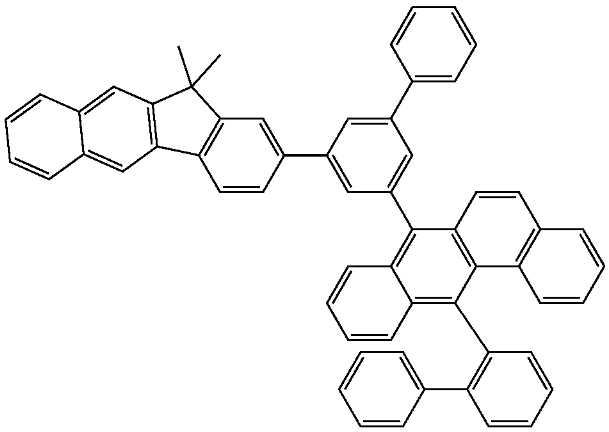
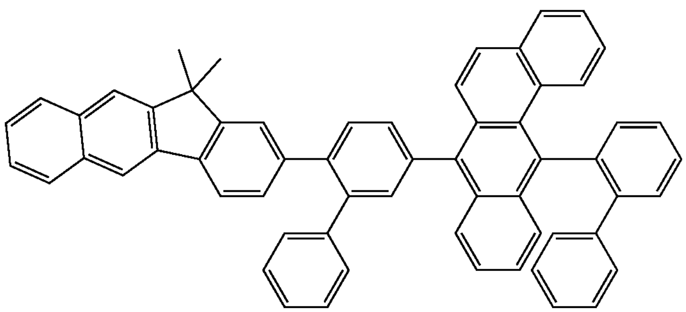
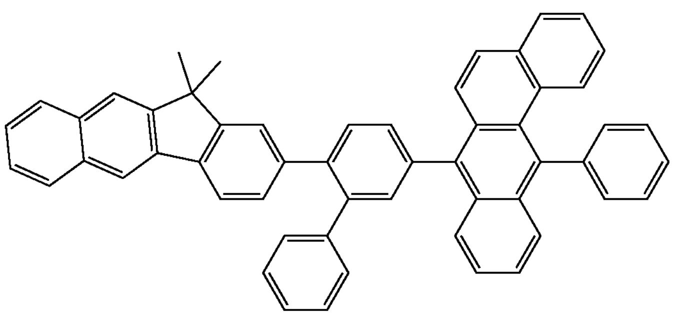
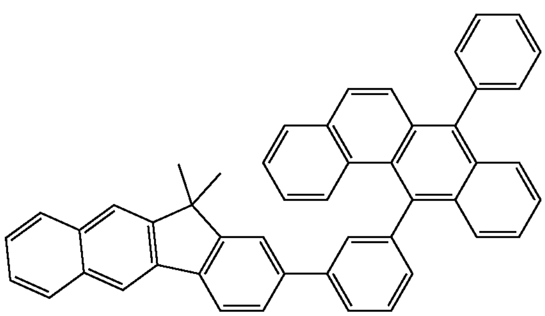
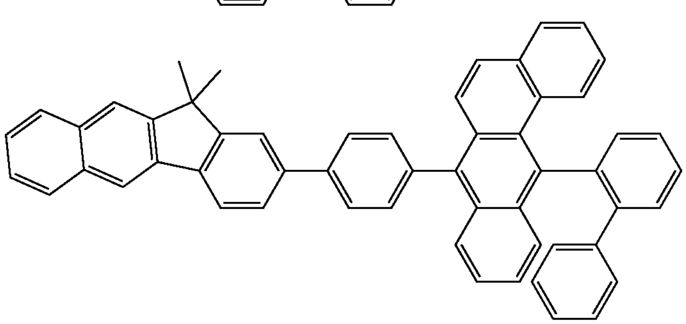

-continued
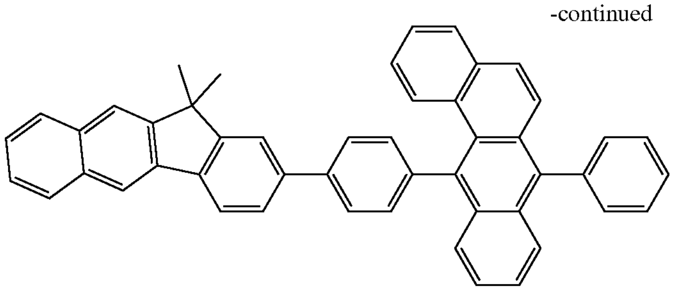
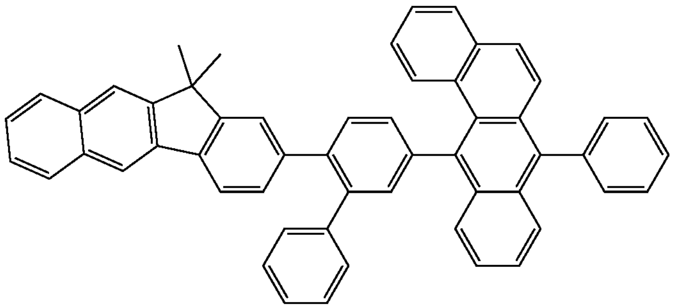
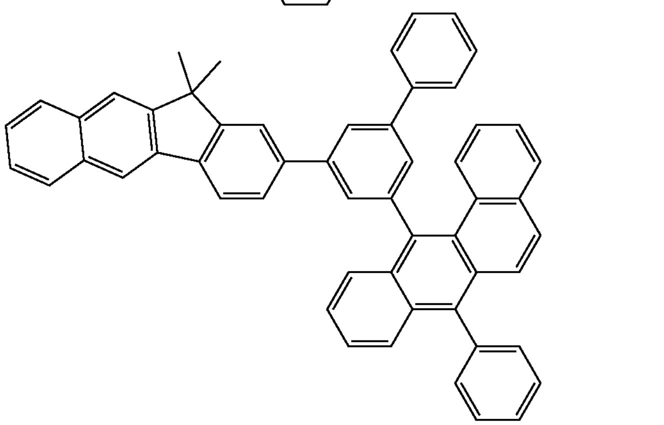
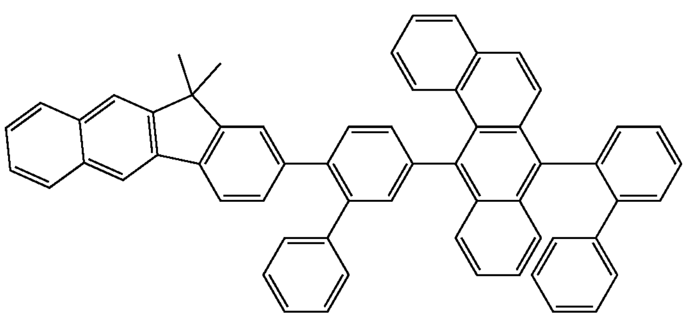
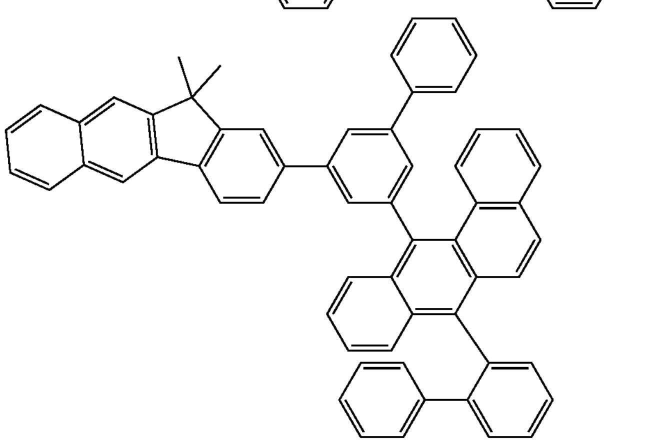

-continued
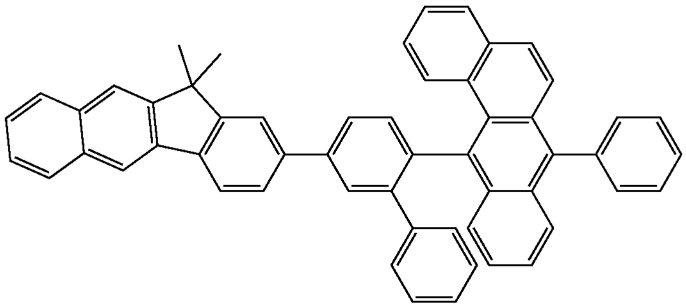
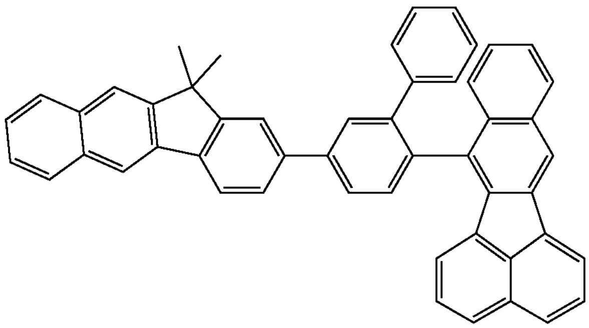
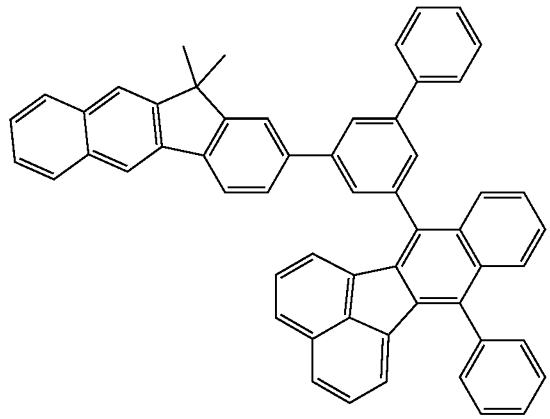
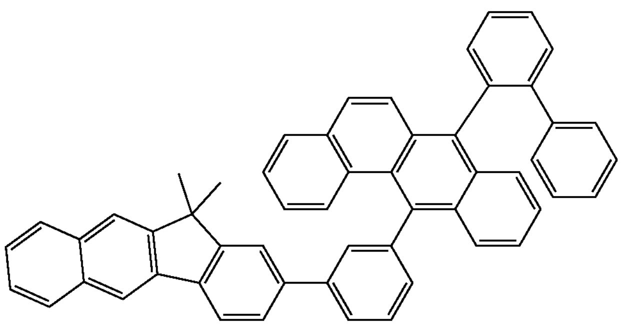
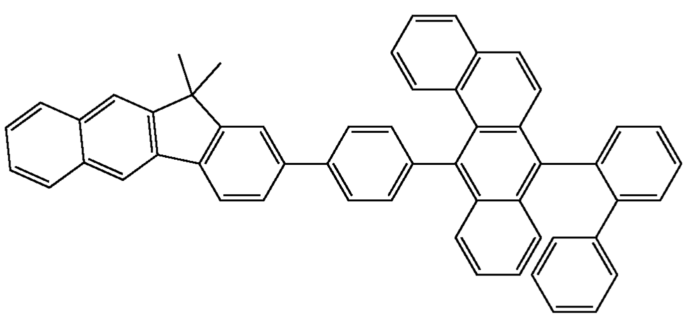
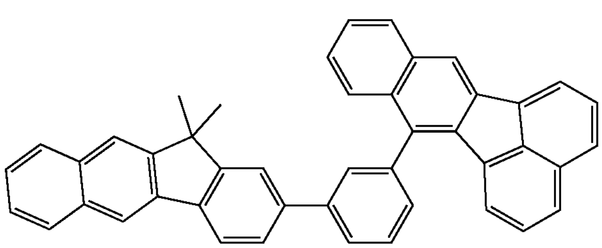

-continued
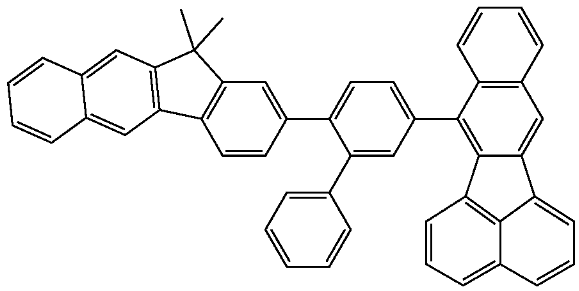
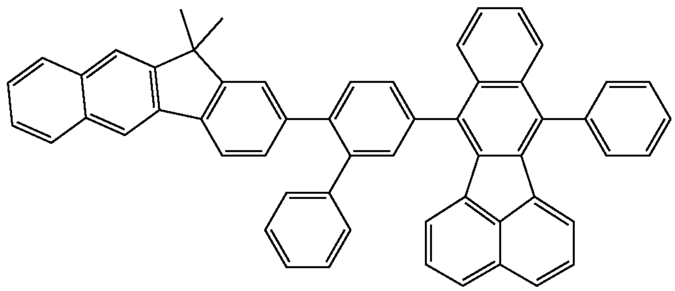
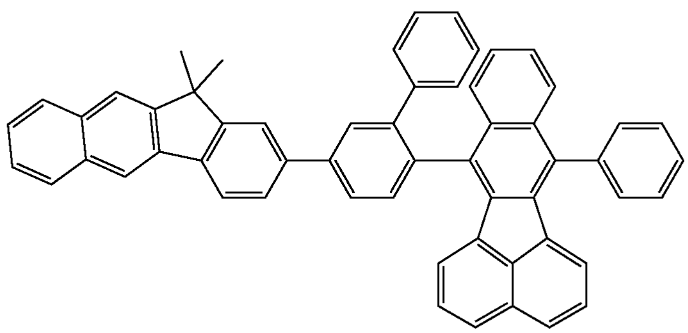
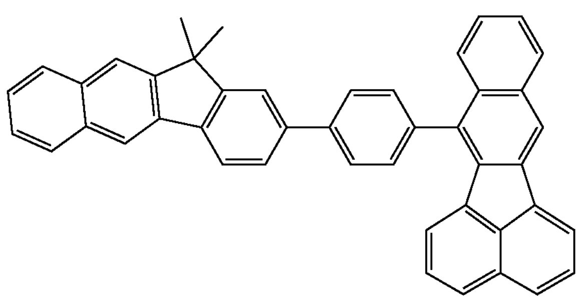
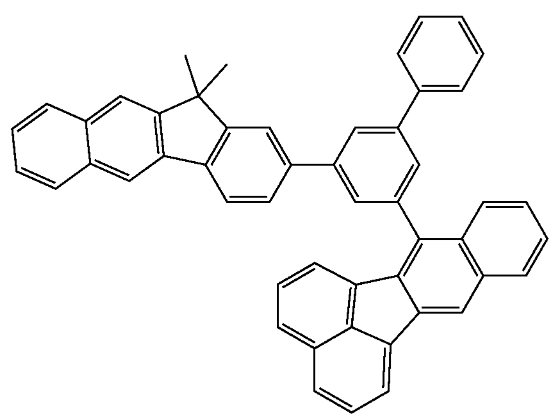
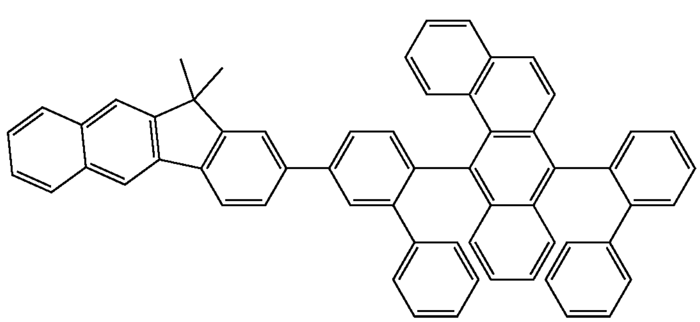

-continued
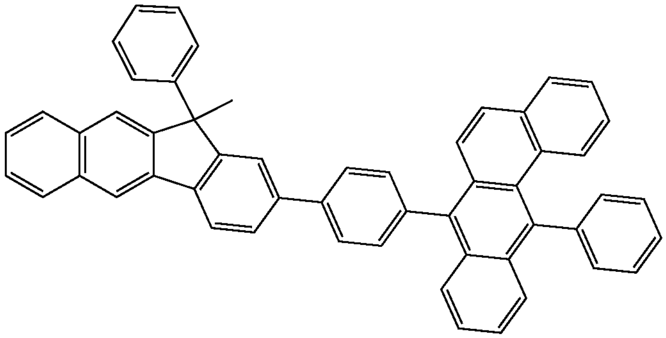
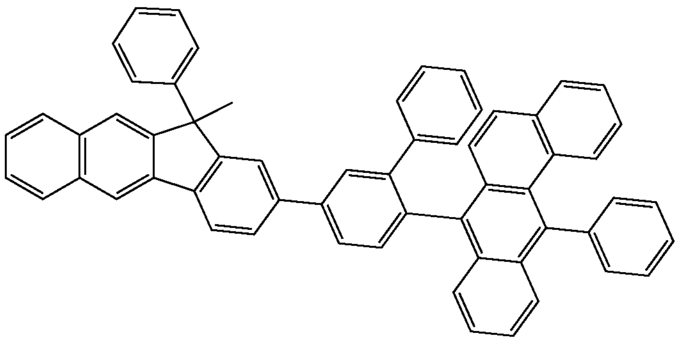
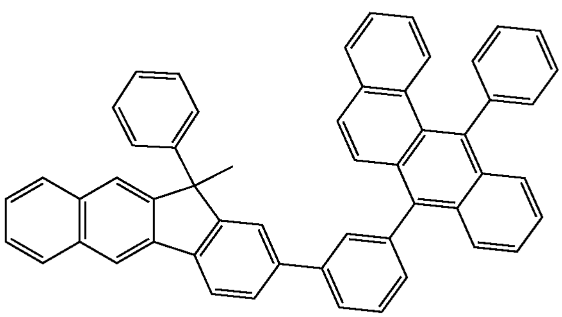
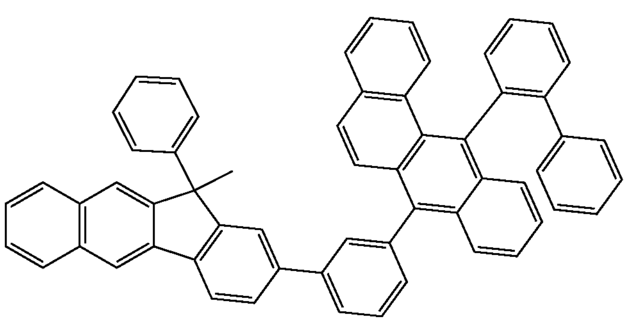

-continued
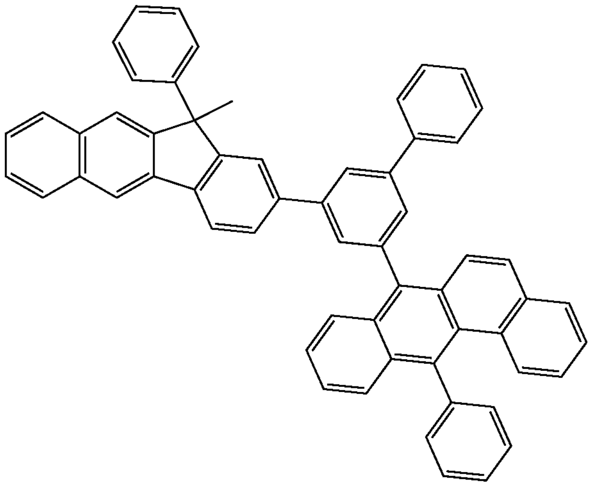
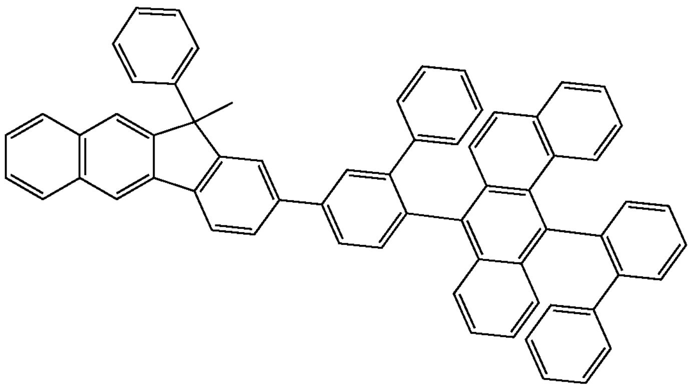
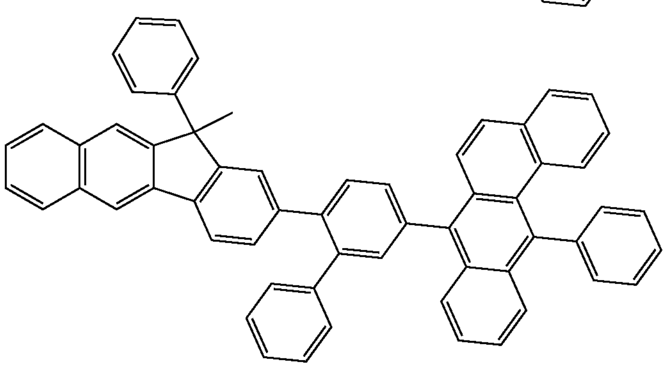
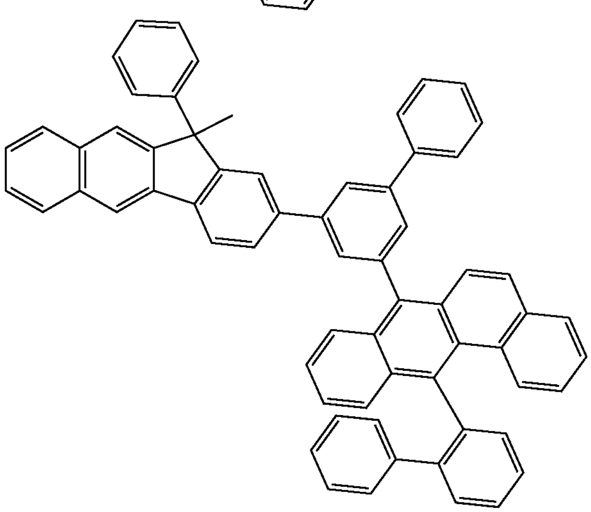

-continued
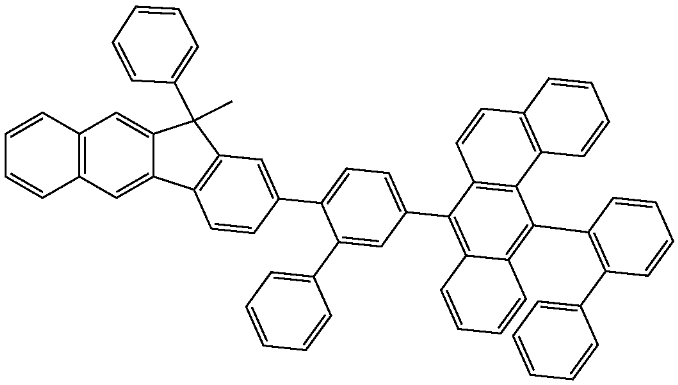
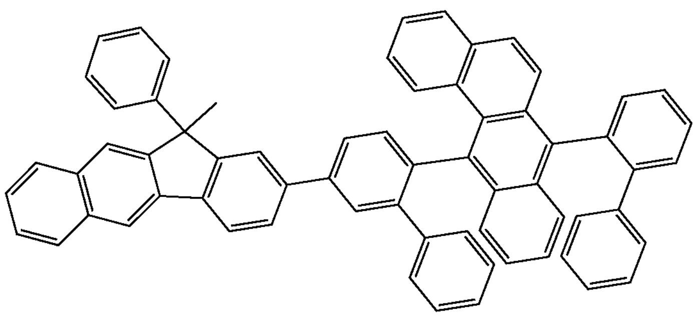
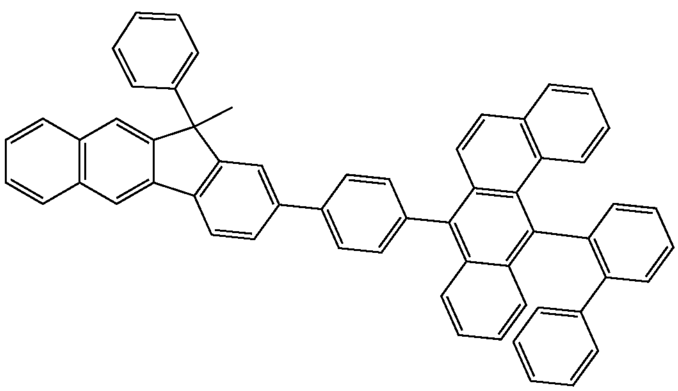
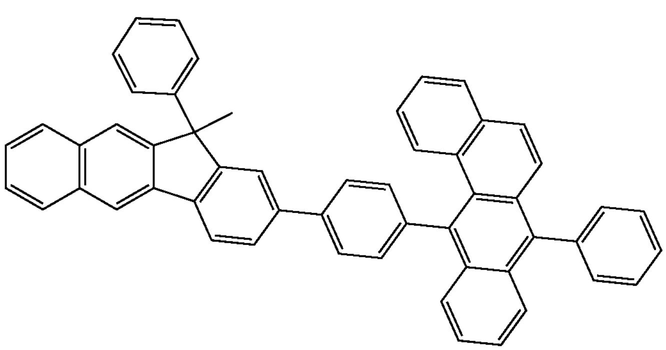

-continued
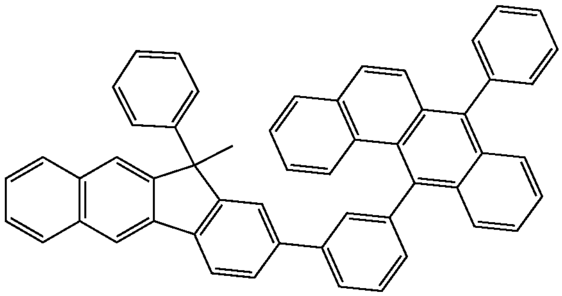
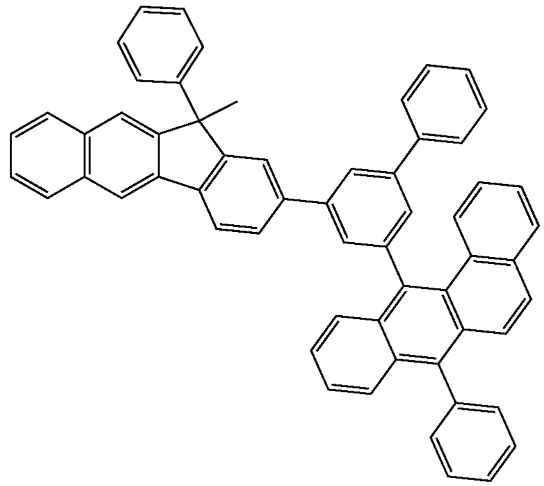
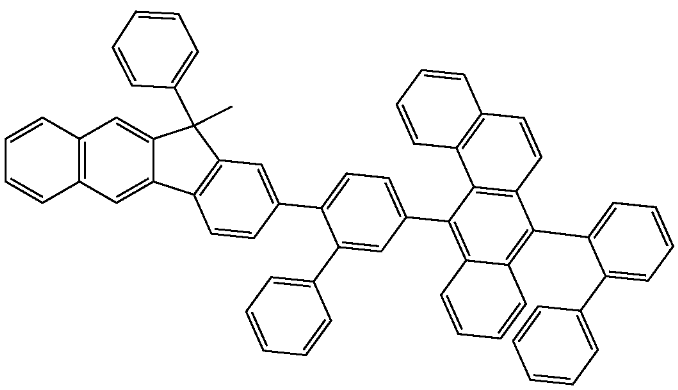
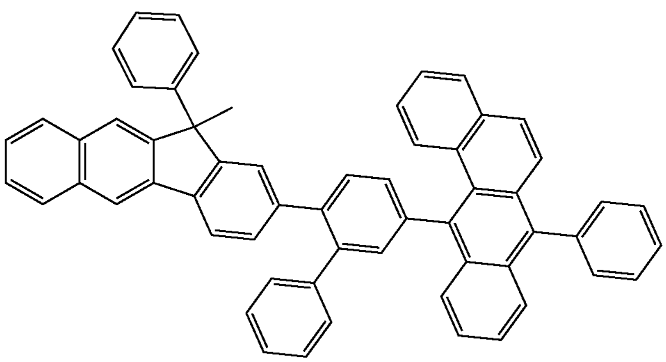
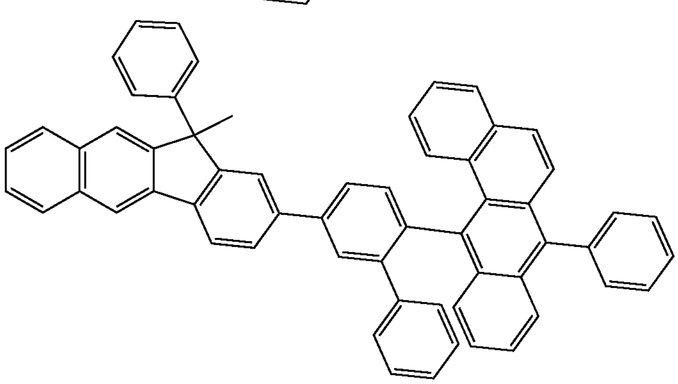

-continued
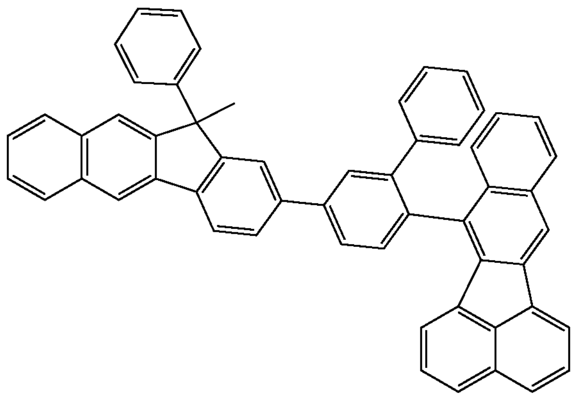
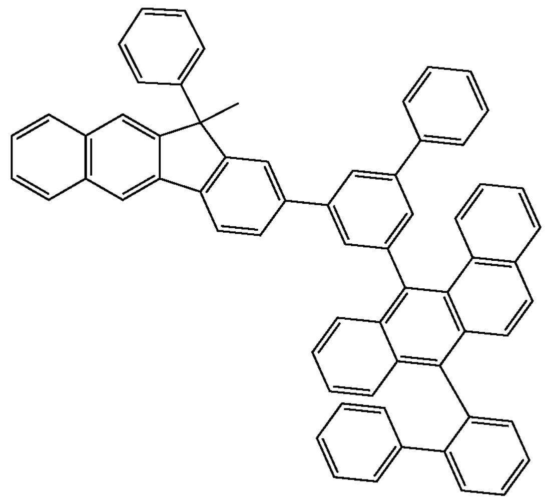
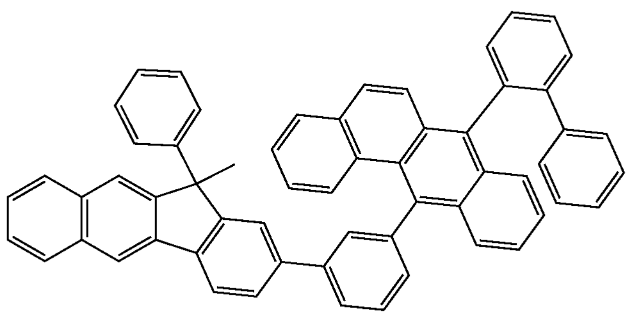
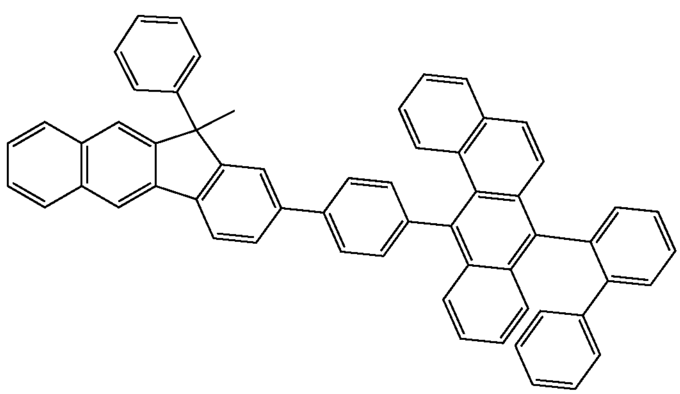
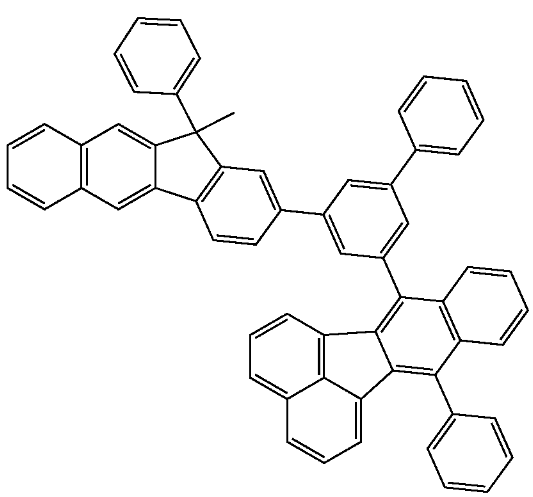
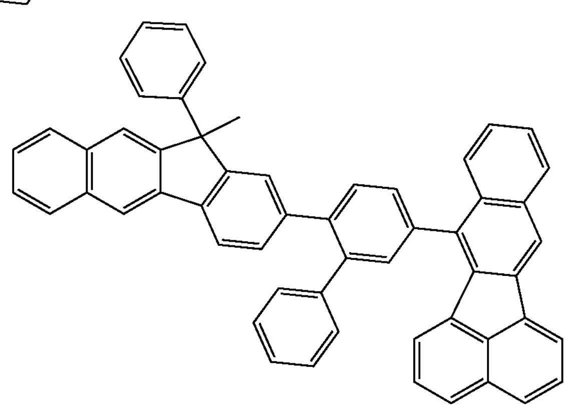

-continued
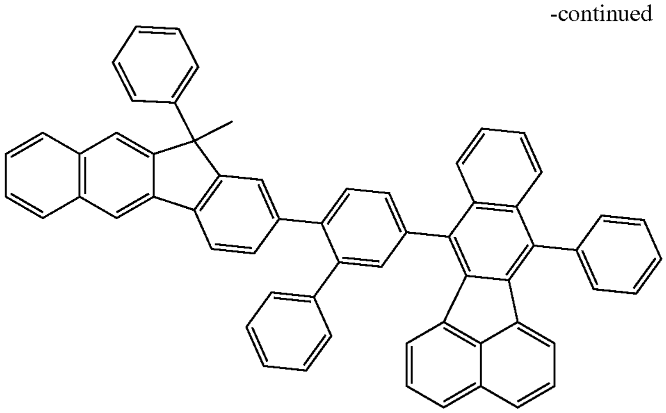
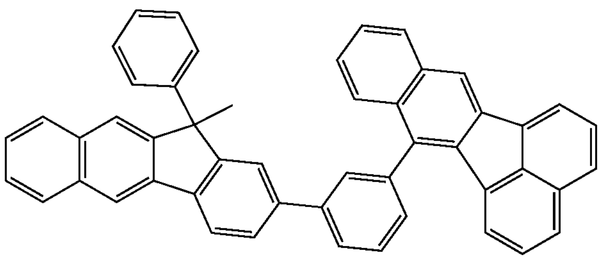
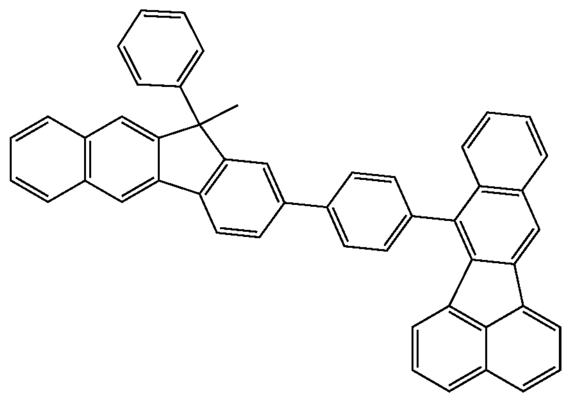
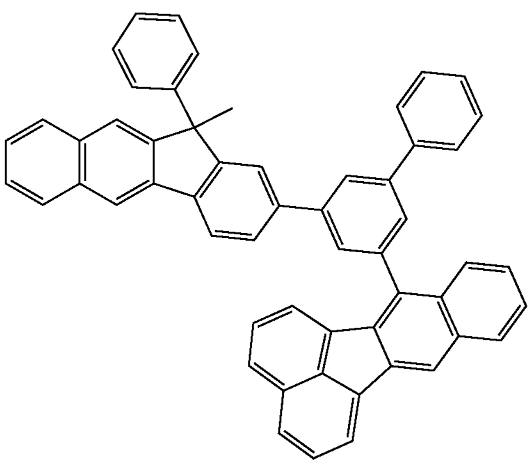
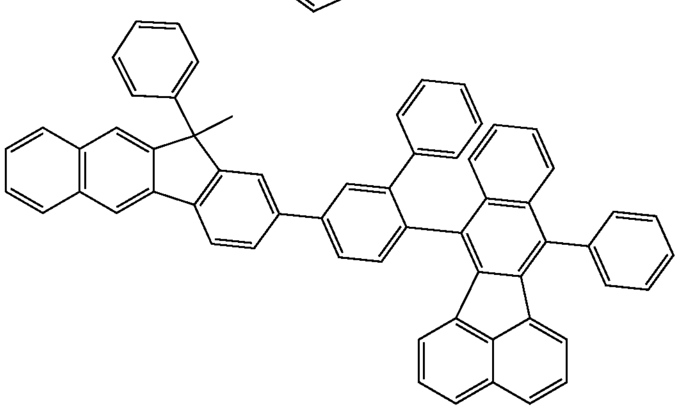

-continued
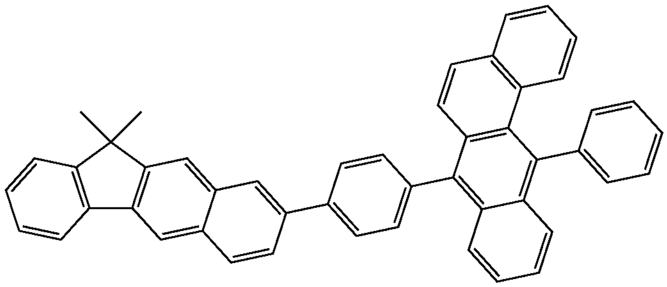
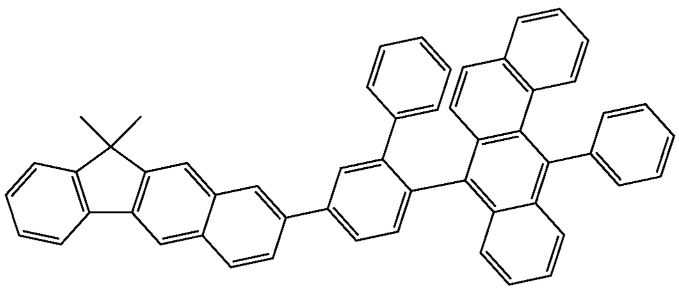
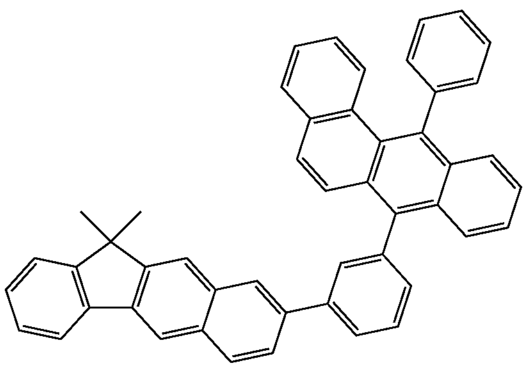
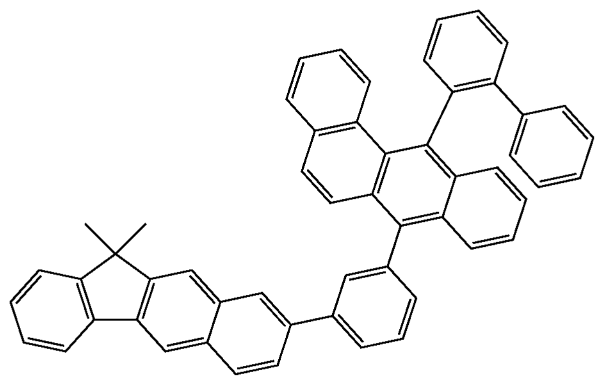
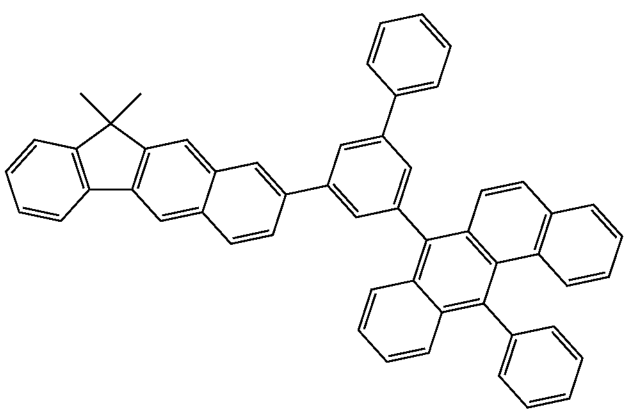
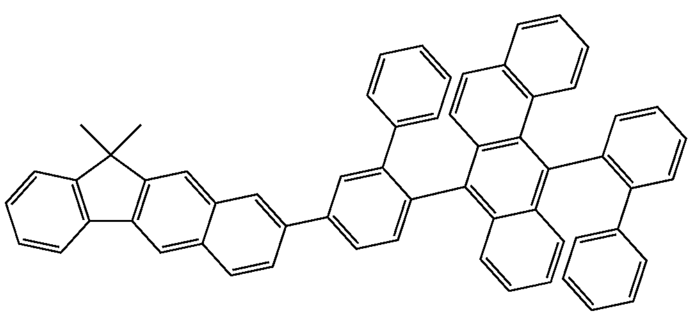

-continued
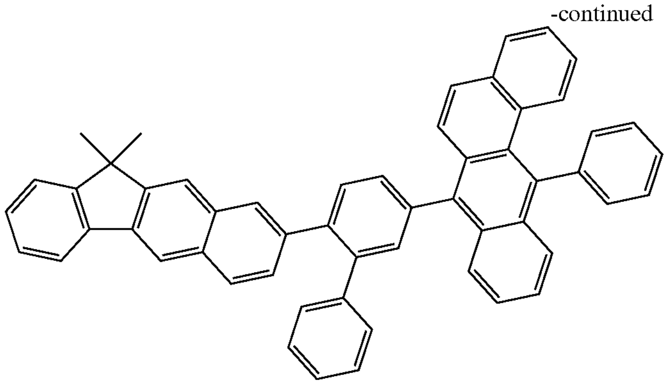
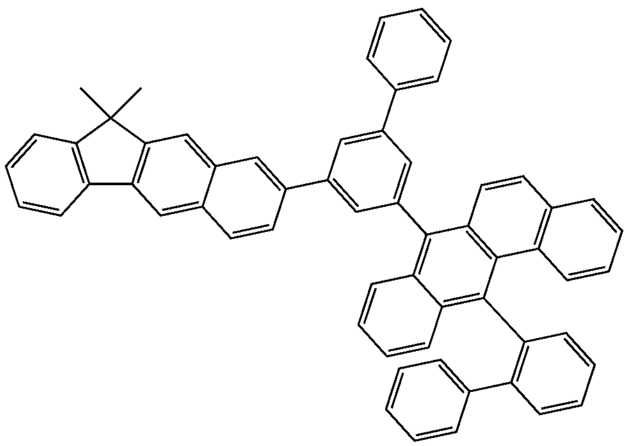
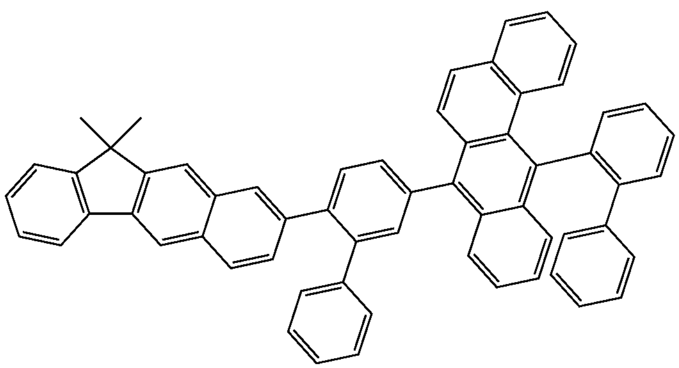
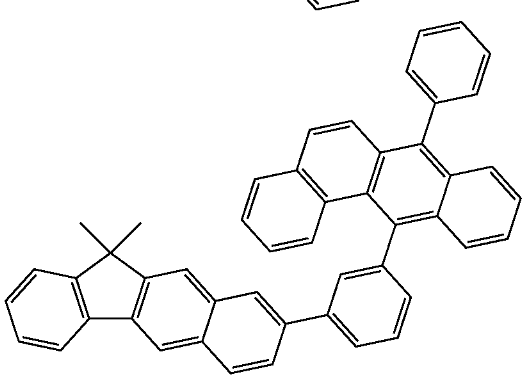

-continued
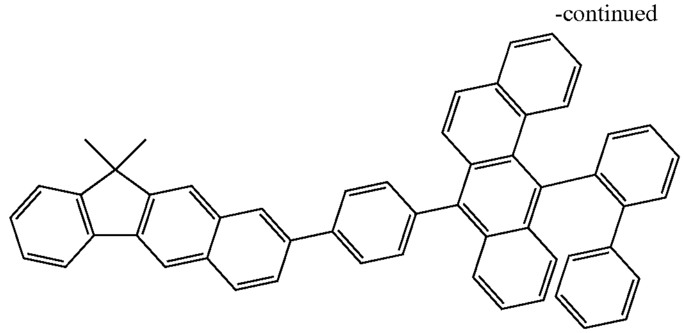
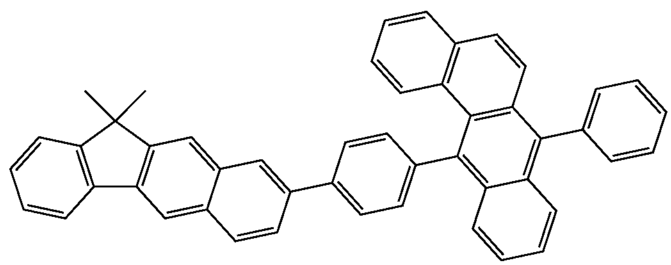
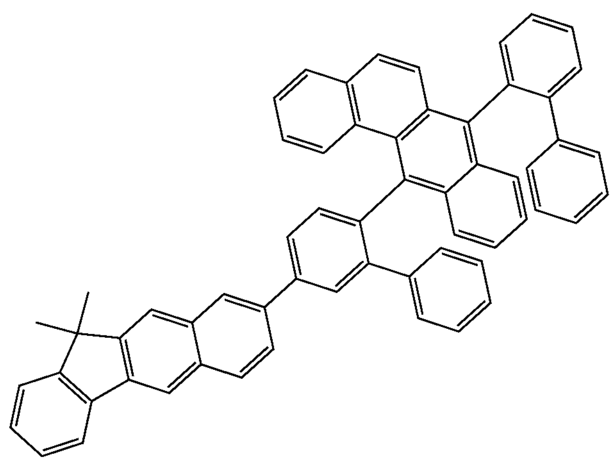
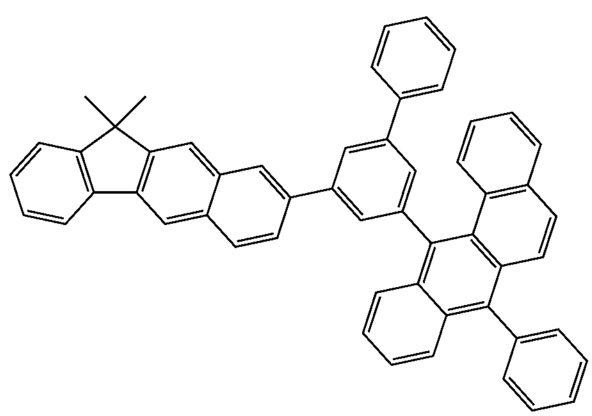

-continued
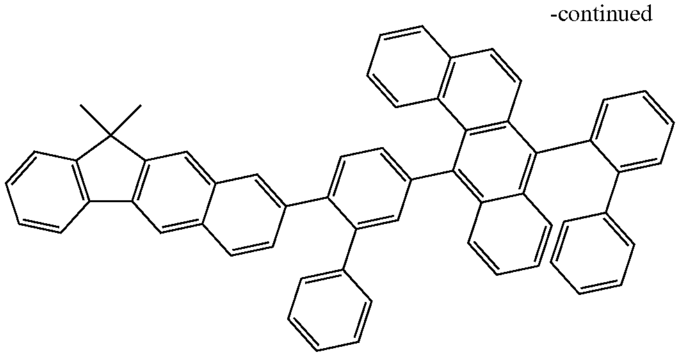
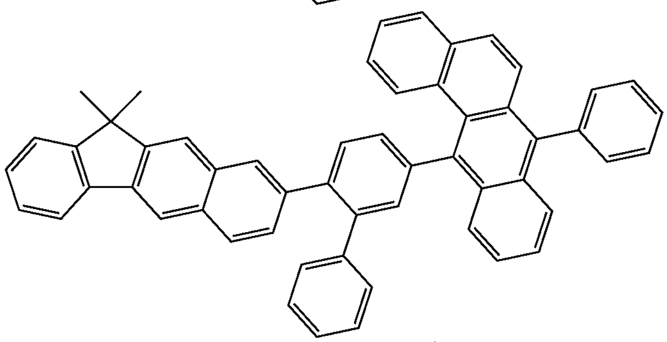
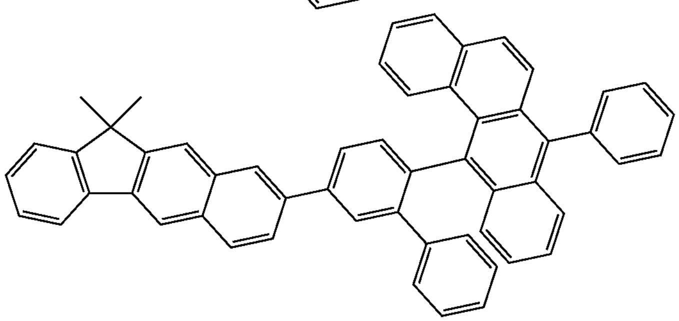
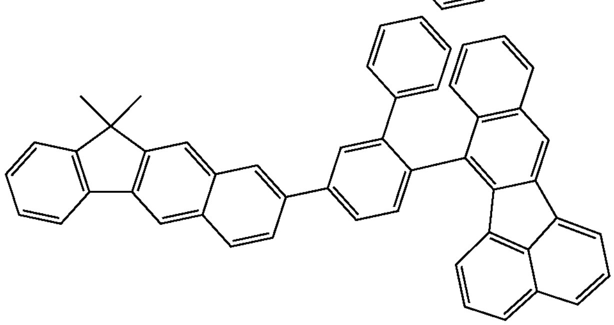
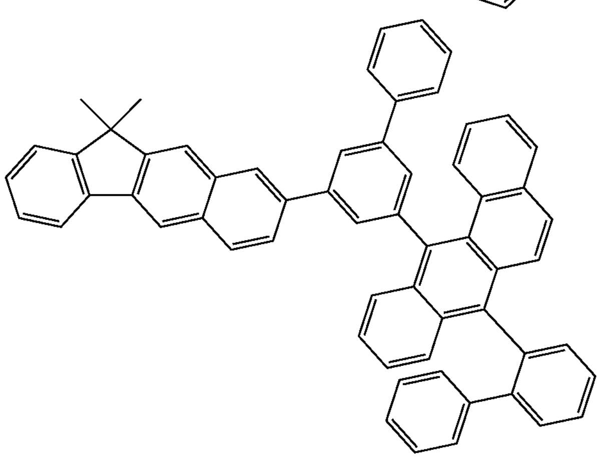
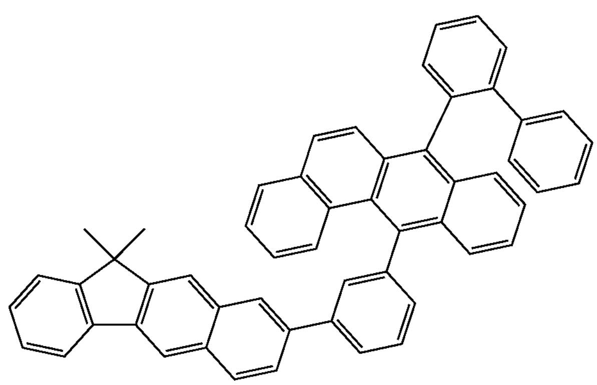

-continued
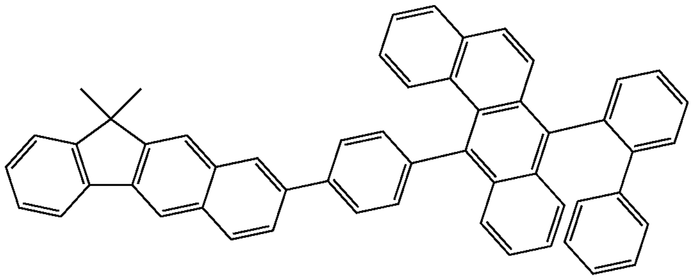
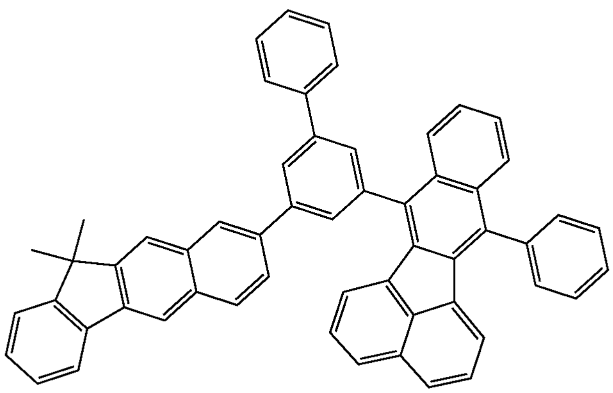
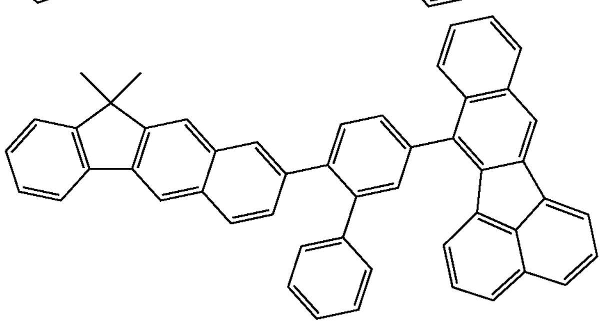
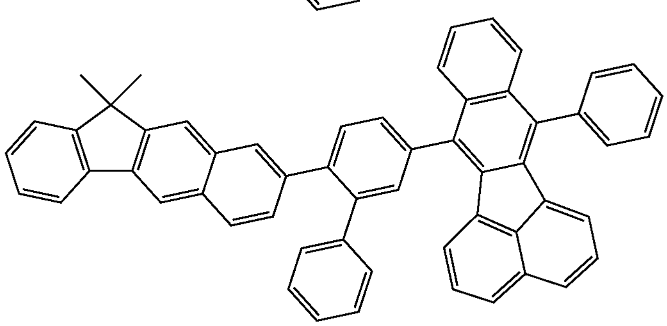
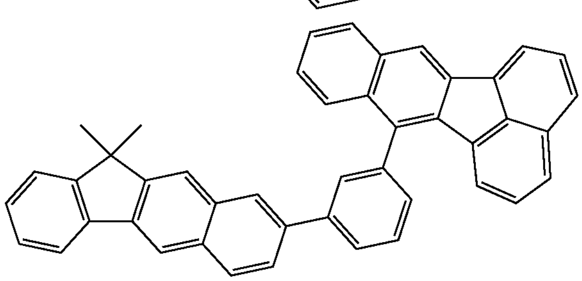
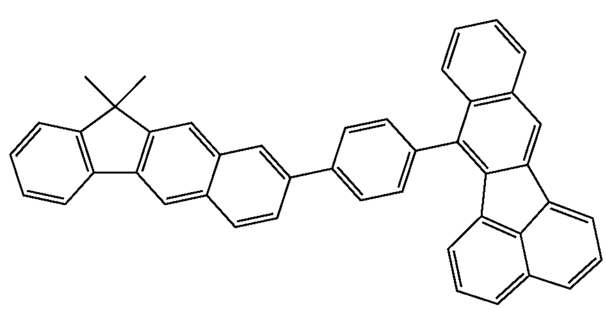

-continued
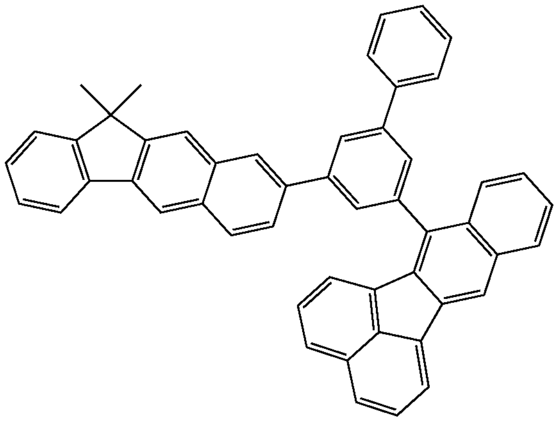
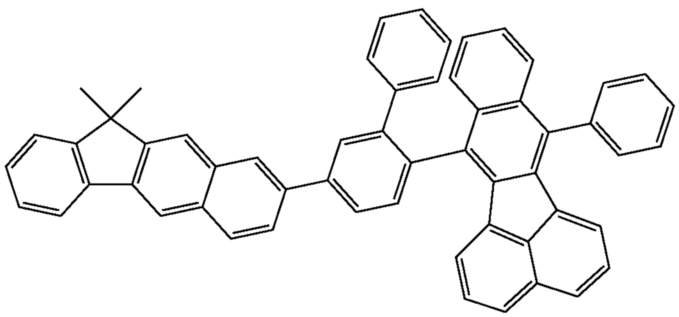
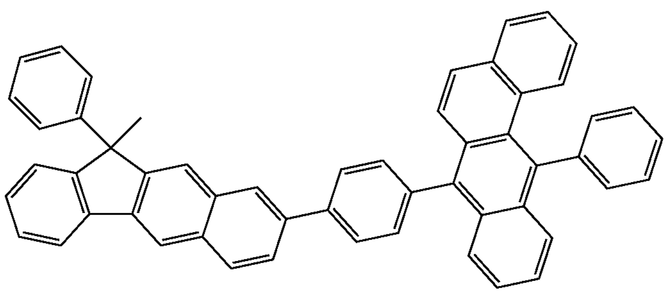
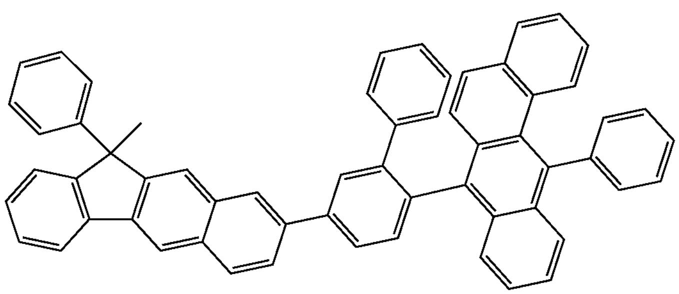
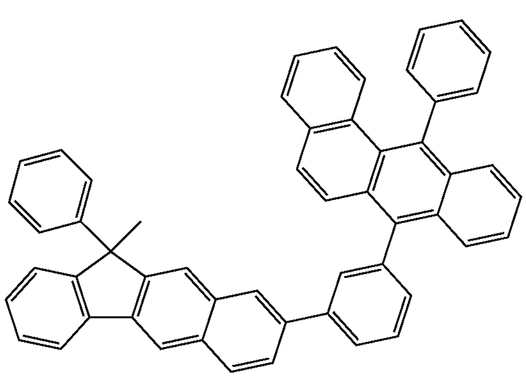
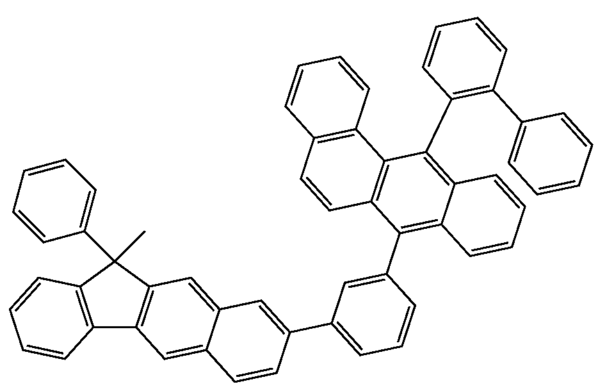

-continued
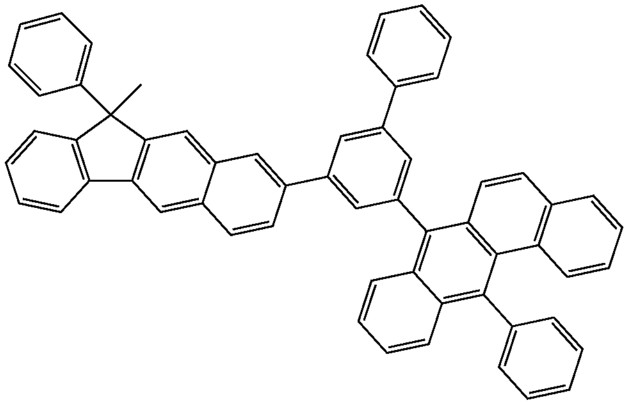
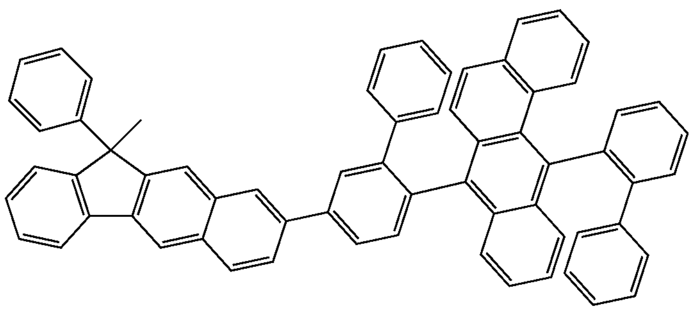
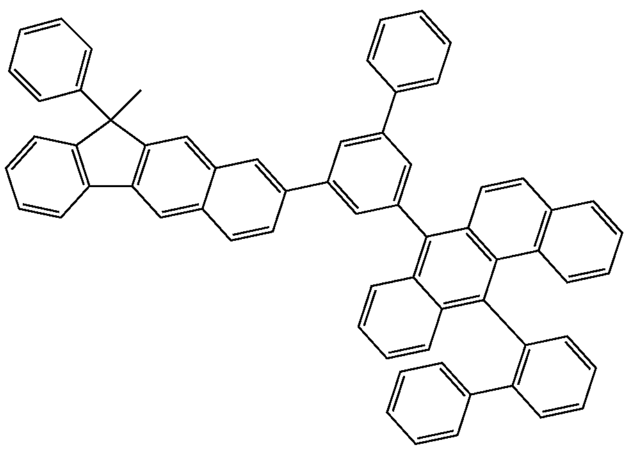
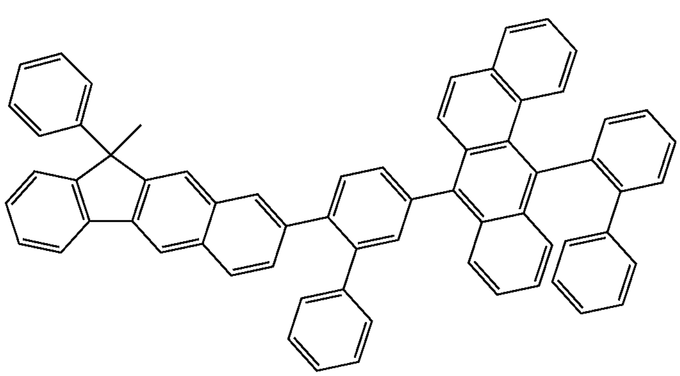

-continued
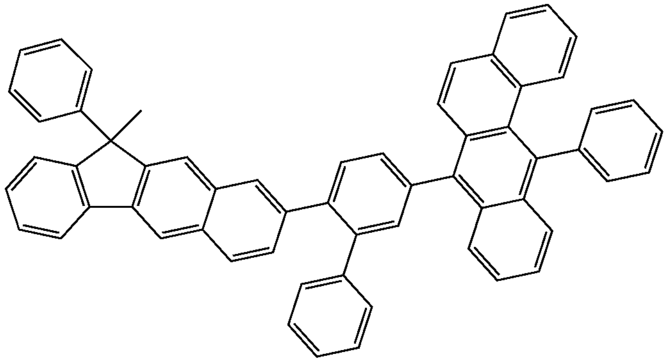
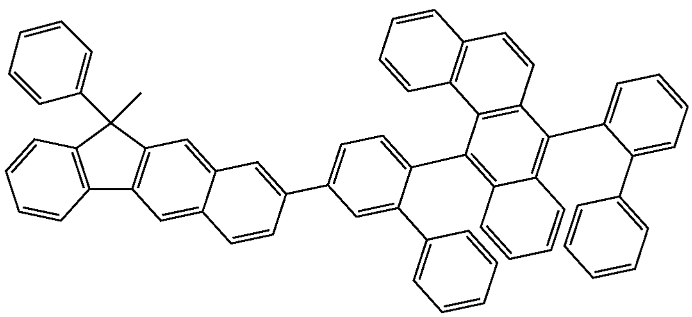
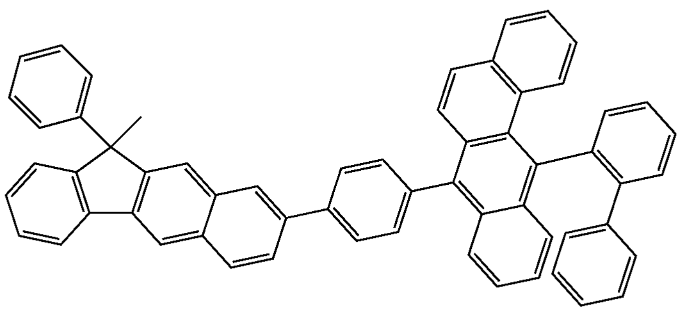
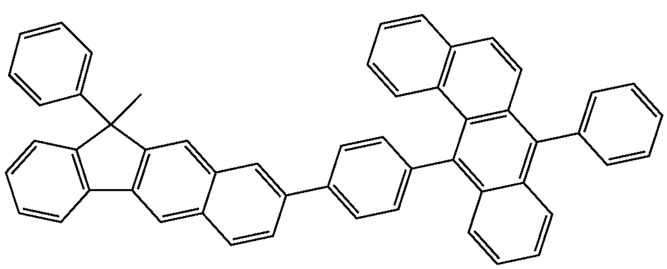
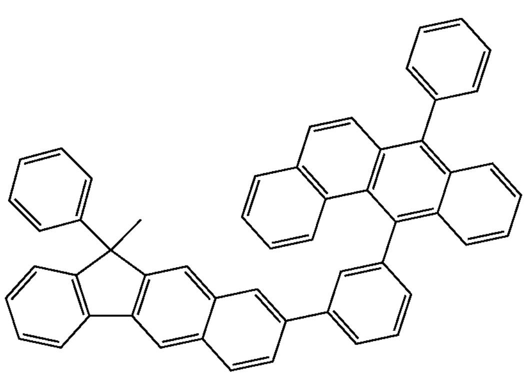

-continued
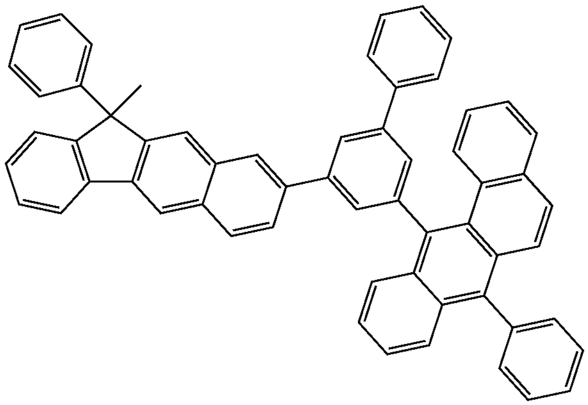
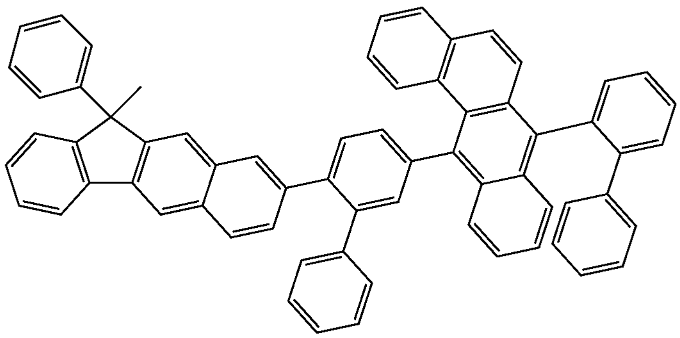
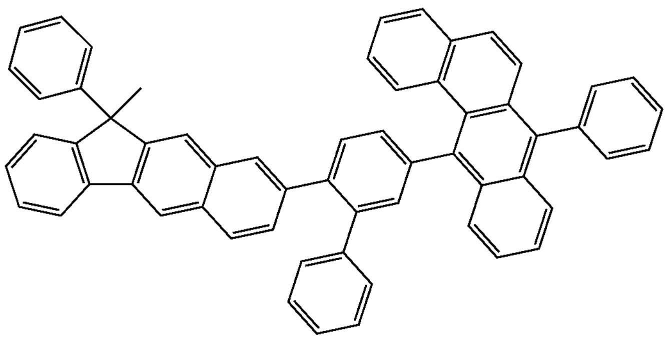
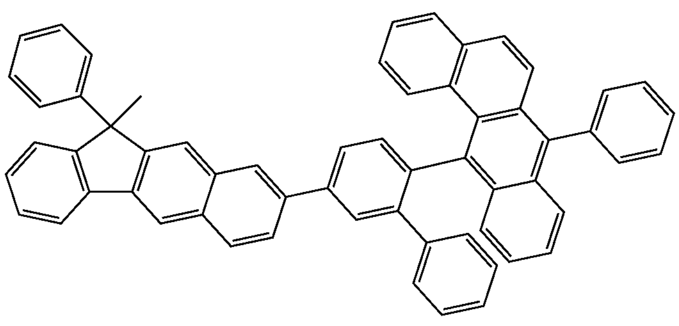
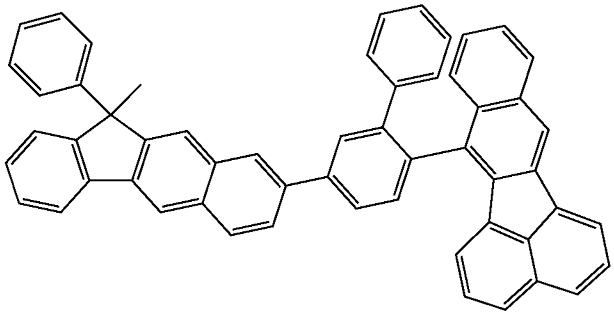

-continued
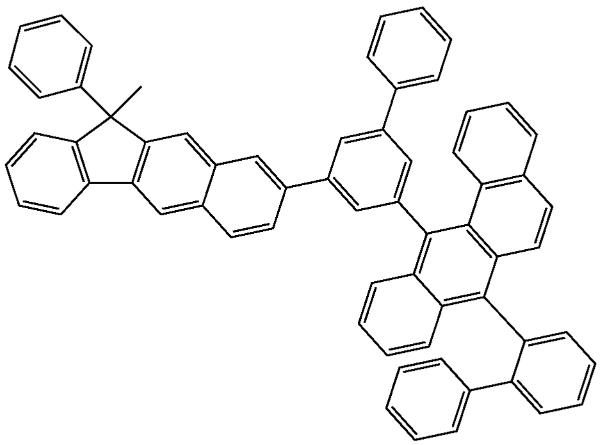
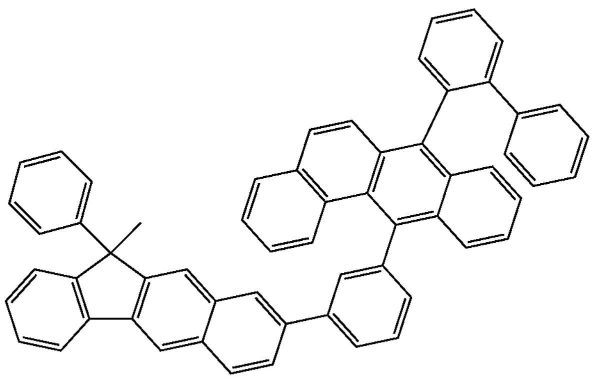
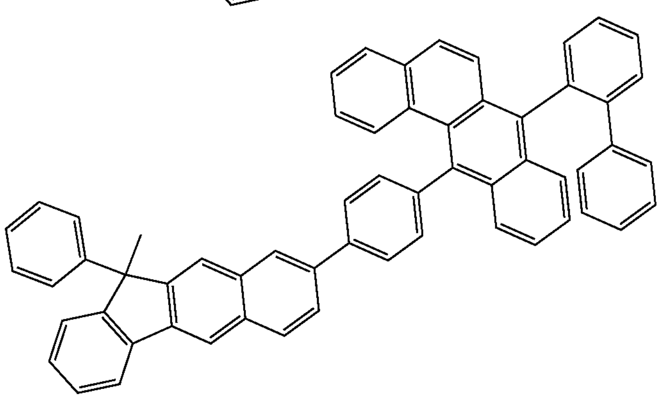
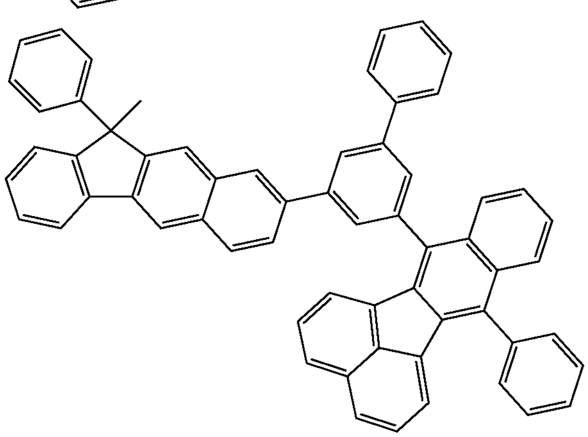

-continued
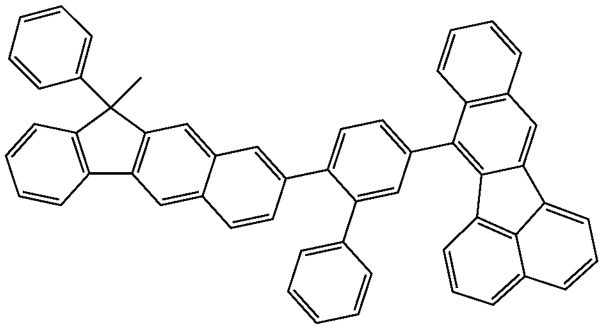
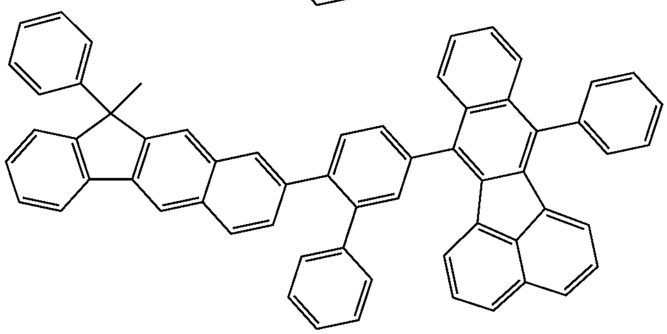
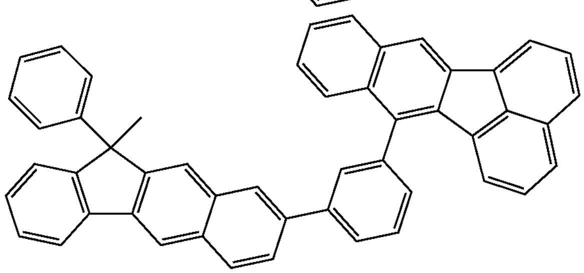
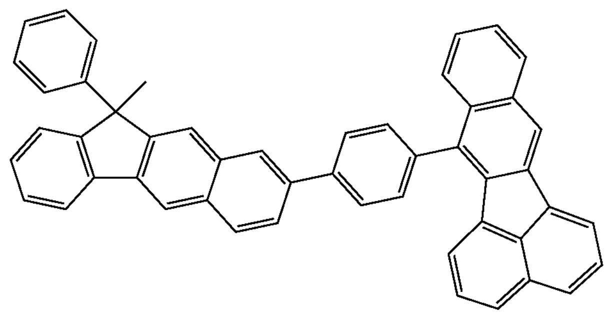
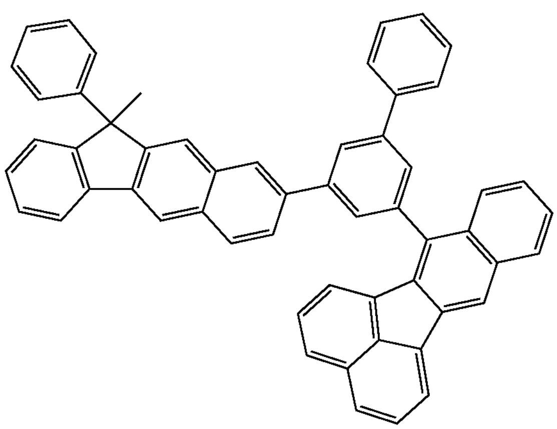
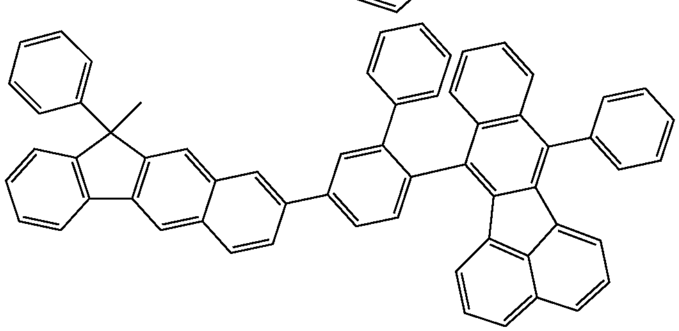

-continued
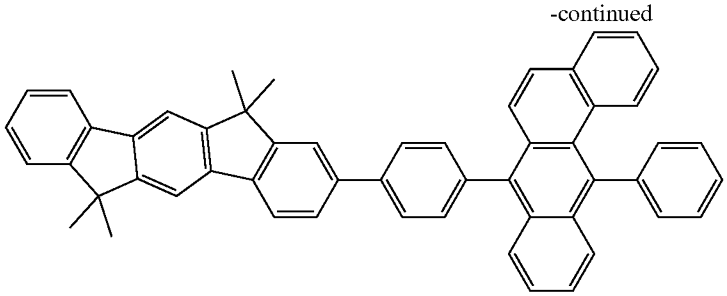
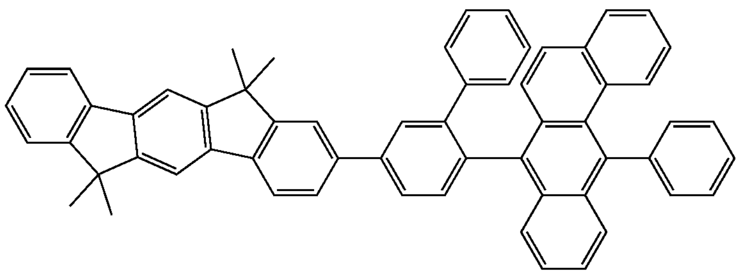
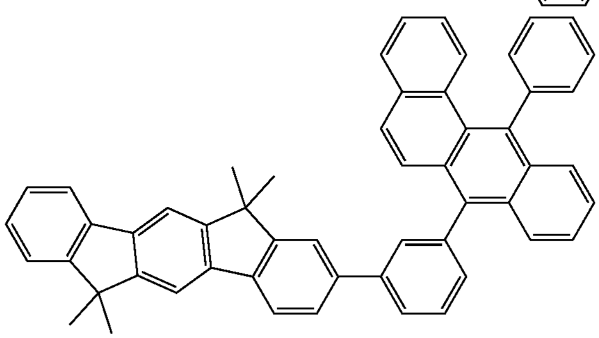
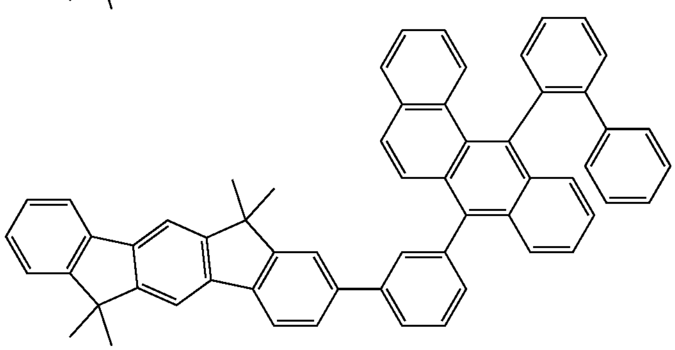
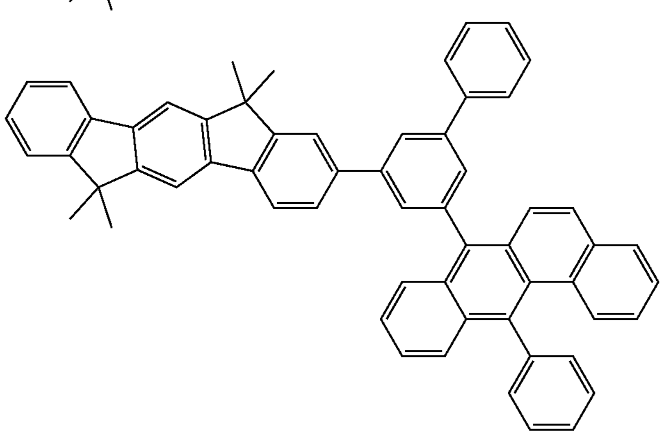

-continued
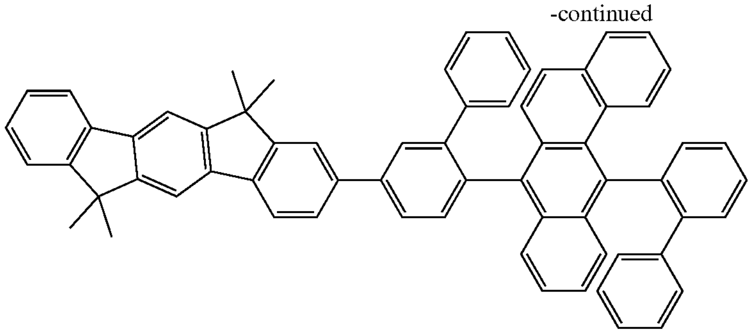
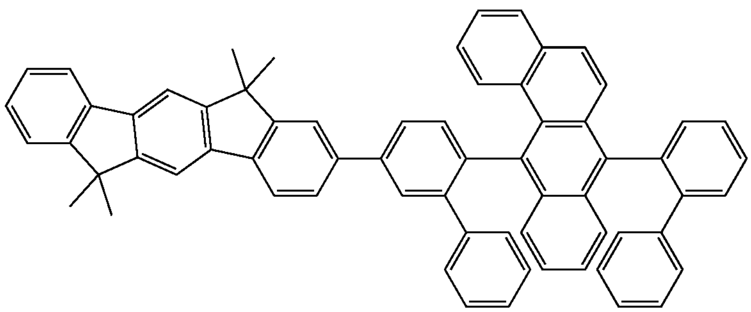
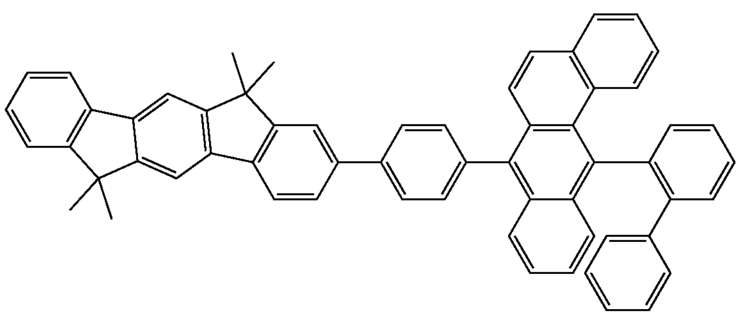
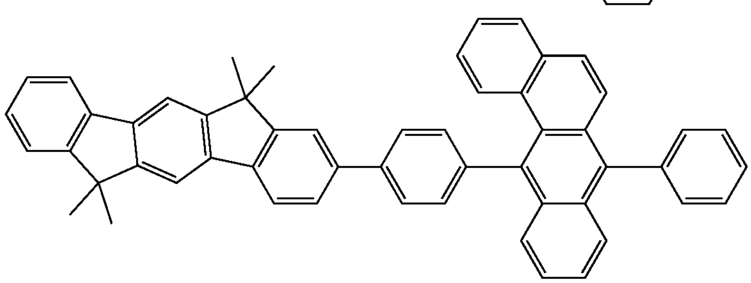
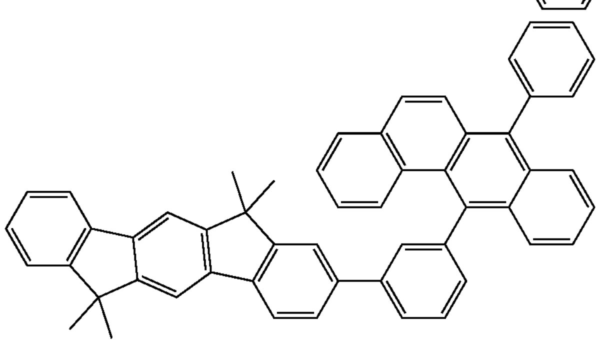

-continued
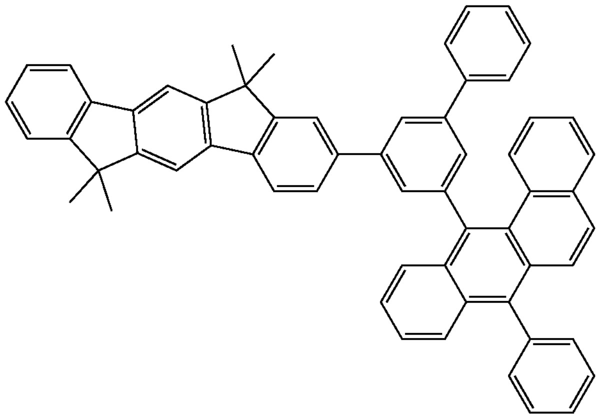
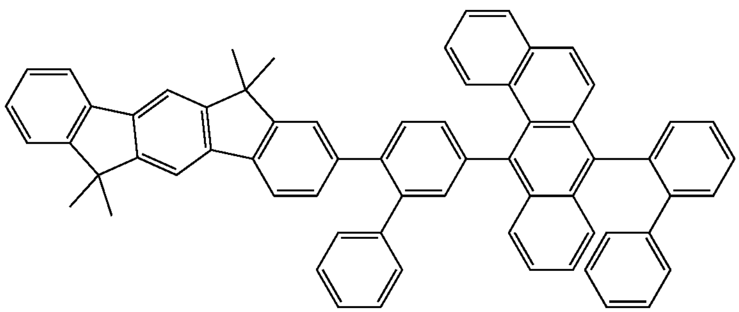
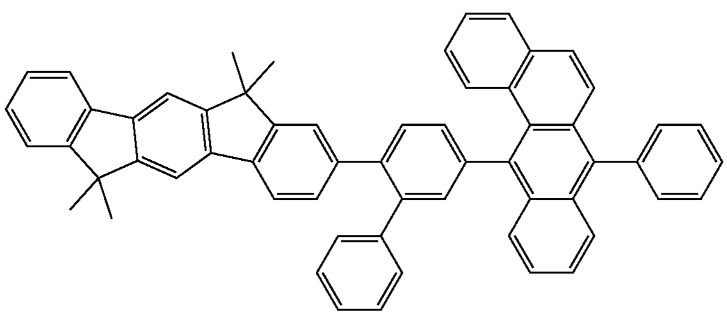
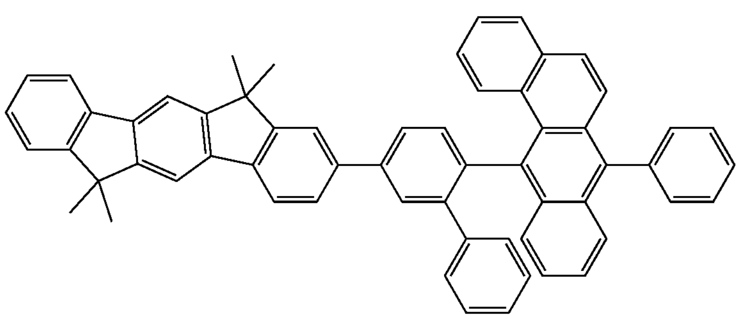
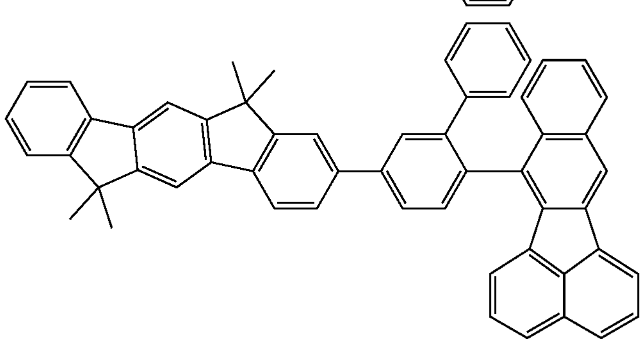

-continued
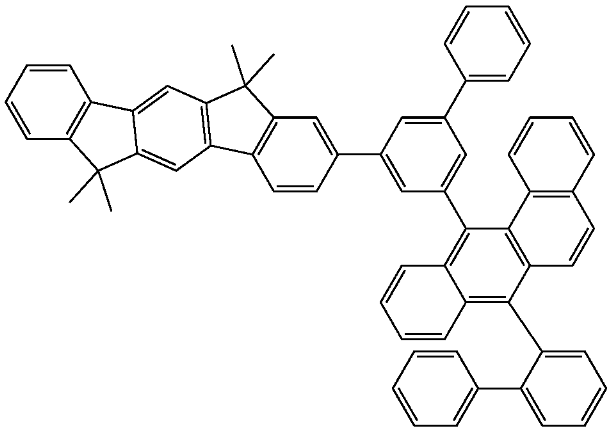
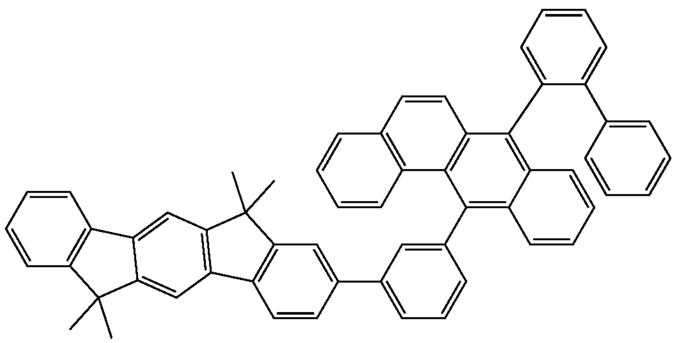
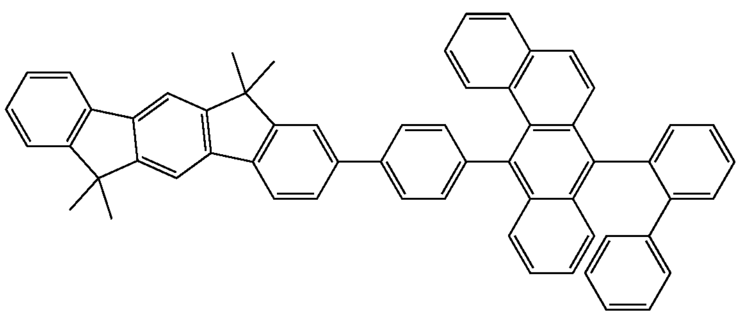
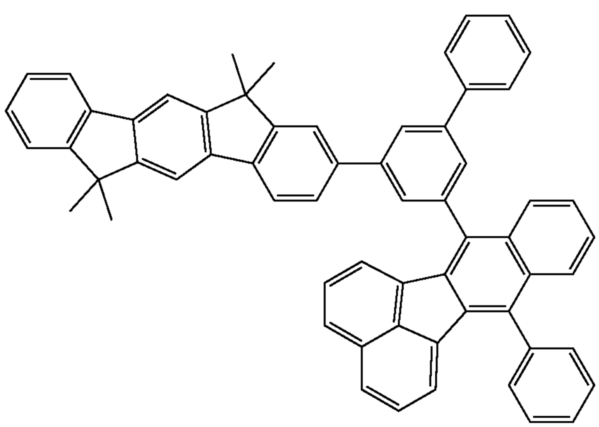

-continued
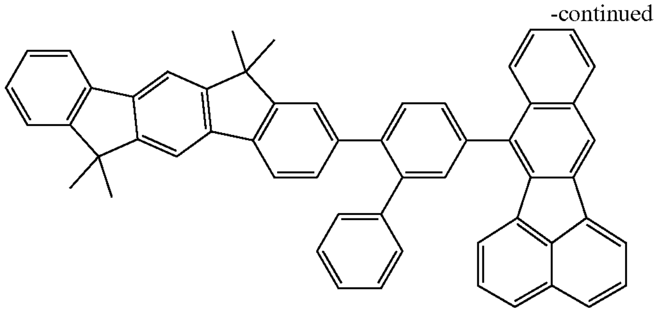
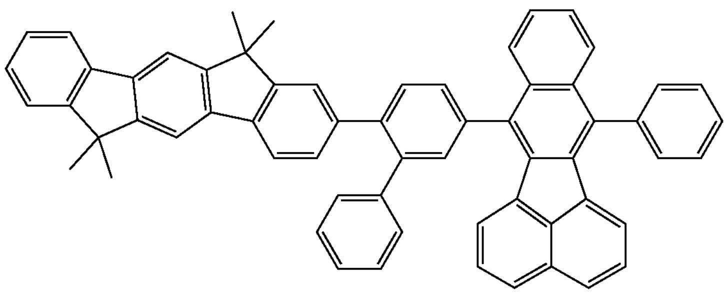
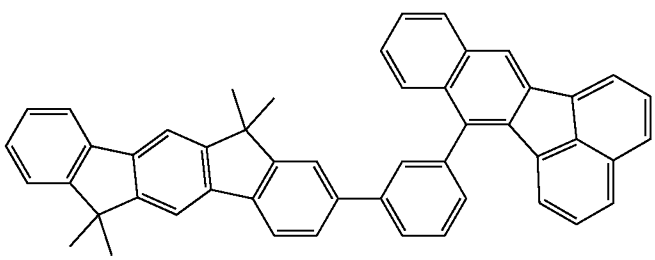
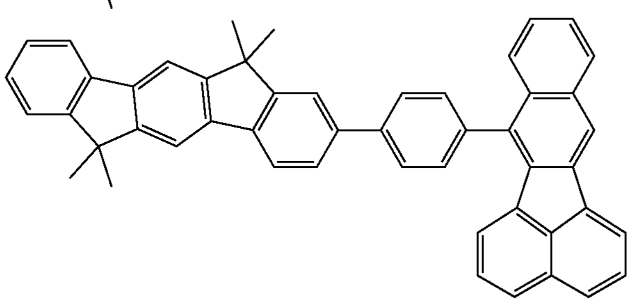
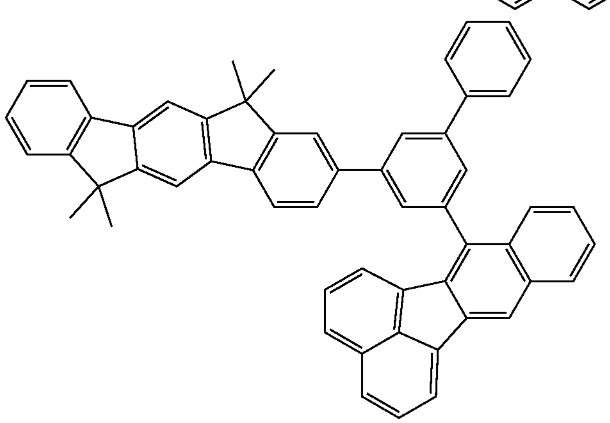

-continued
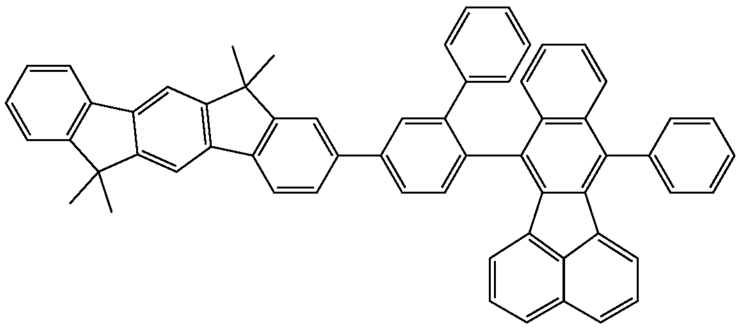
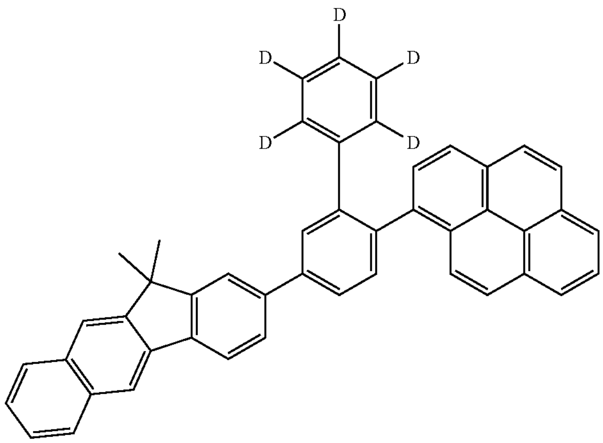
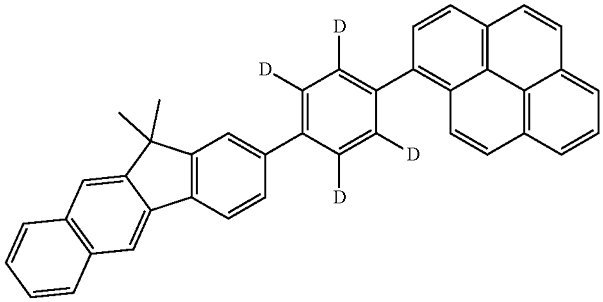
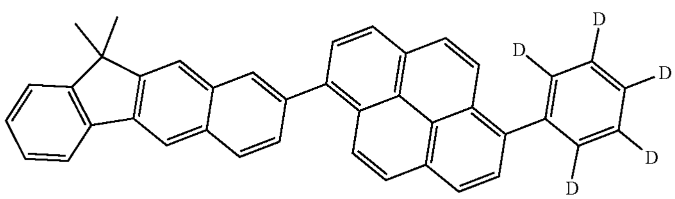
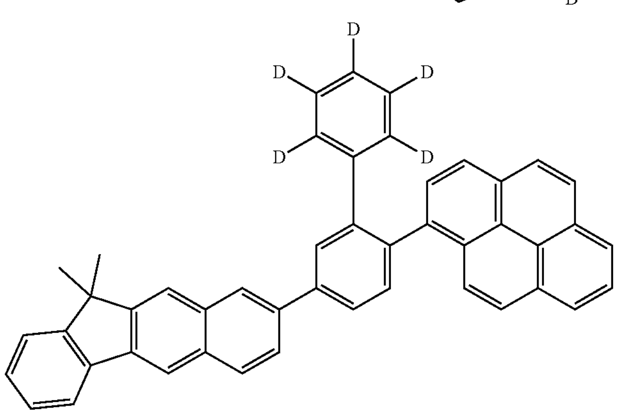
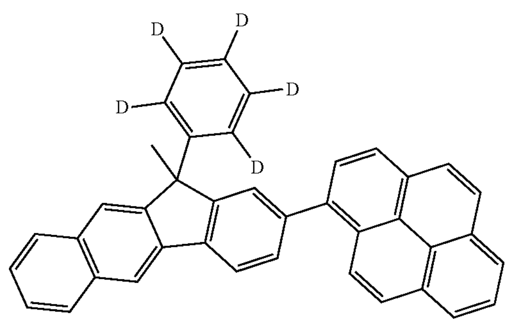

-continued
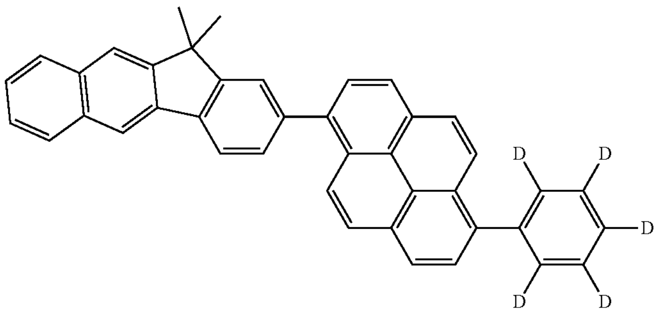
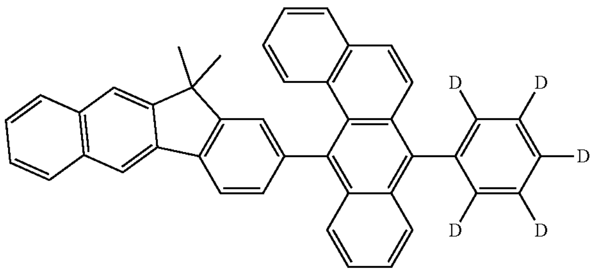
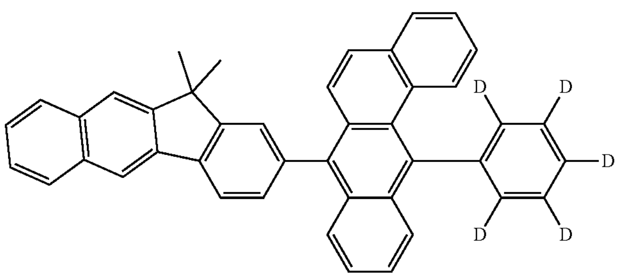
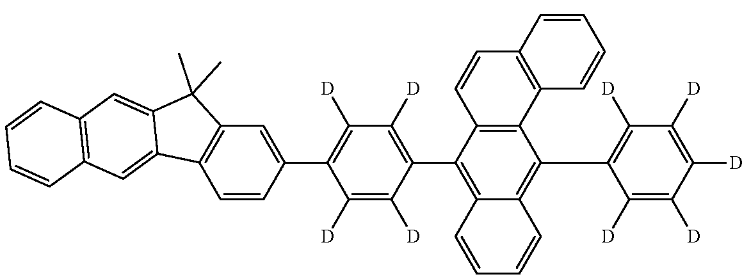
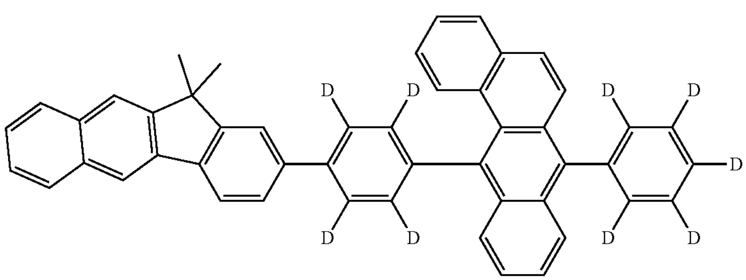
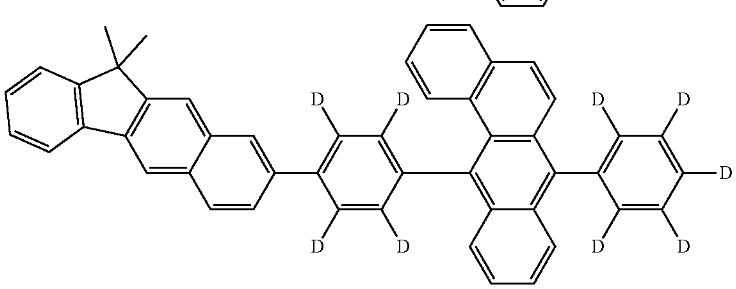

-continued

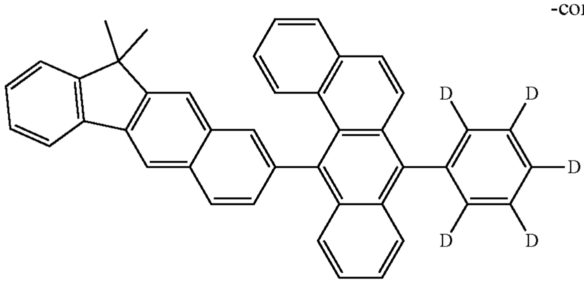

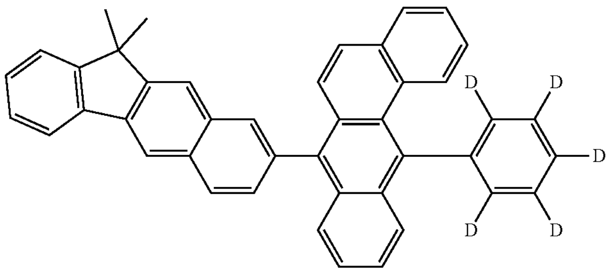

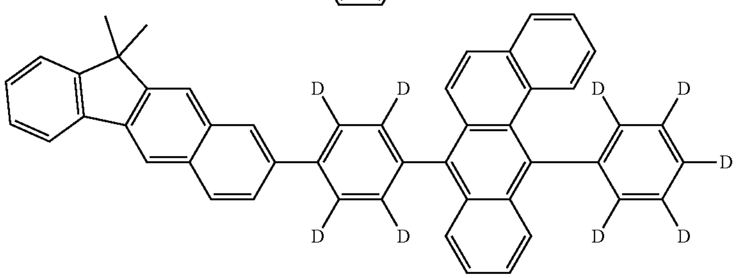

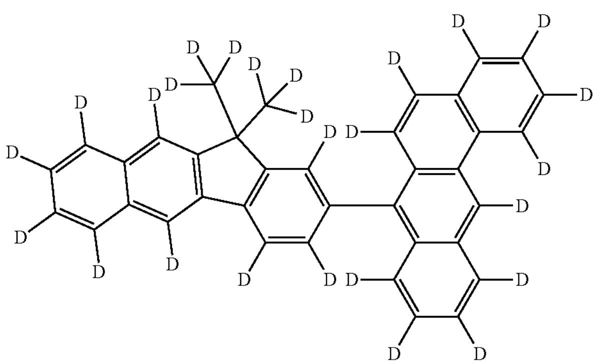

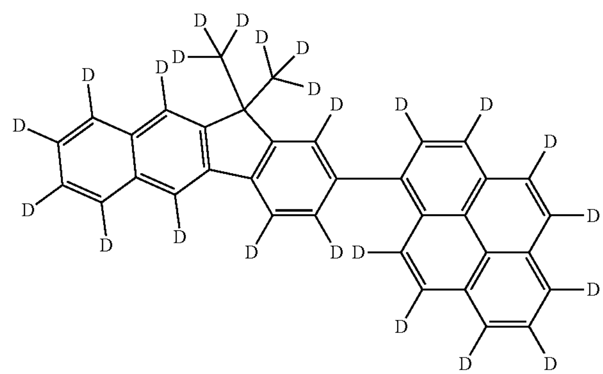

The compound according to the second exemplary embodiment is usable as an organic-electroluminescence-device material.

The compound according to the second exemplary embodiment is also usable for at least any of one or more organic layers provided between an anode and a cathode of an organic EL device. An organic EL device containing the compound according to the second exemplary embodiment includes an anode, a cathode, and one or more organic layers provided between the anode and the cathode, in which preferably, at least any of the organic layers contains the compound according to the second exemplary embodiment; more preferably, an emitting layer as the organic layer contains the compound according to the second exemplary embodiment; further preferably, the emitting layer contains the compound according to the second exemplary embodiment as a host material.

Further, the compound according to the second exemplary embodiment is also usable as the first host material (first compound) for the organic EL device according to the first exemplary embodiment. An organic EL device containing the compound according to the second exemplary embodiment as the first host material according to the first exemplary embodiment includes an anode, a cathode, and an emitting region provided between the anode and the cathode, in which the emitting region includes a first emitting layer and a second emitting layer, the first emitting layer contains a first host material and a first emitting compound, the second emitting layer contains a second host material and a second emitting compound, the first host material is the compound represented by the formula (1A), the first host material is different from the second host material, and the first emitting compound and the second emitting compound are mutually the same or different.

The compound according to the second exemplary embodiment can improve performance of the organic electroluminescence device. Use of the compound according to the second exemplary embodiment can decrease a drive voltage to improve luminous efficiency of the organic electroluminescence device.

Third Exemplary Embodiment

Compound

A compound according to a third exemplary embodiment is a compound represented by a formula (1B) below and has a group represented by a formula (10B) below.

(1B)

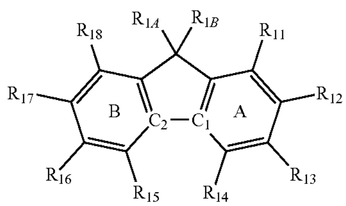

(10B)

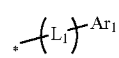

$R_{1A}$, $R_{1B}$ and $R_{11}$ to $R_{18}$ in the formula (1B) are each as defined in the formula (1);

in the formula (10B): $L_1$, mx and * are as defined in the formula (10); $Ar_1$ is a substituted or unsubstituted aryl group having four or more fused rings, or a substituted or unsubstituted heterocyclic group having four or more fused rings; and $Ar_1$ is not a substituted or unsubstituted pyrenyl group; and in a molecule of the first host material, the compound represented by the formula (1B) does not contain three or more of: a substituted or unsubstituted aryl group having four or more fused rings; and a substituted or unsubstituted heterocyclic group having four or more fused rings.

The compound according to the third exemplary embodiment is a compound that may also correspond to an exemplary arrangement of the first compound serving as the first host material in the first exemplary embodiment. A compound of the first host material of the first exemplary embodiment in which $Ar_1$ is not a substituted or unsubstituted pyrenyl group is usable as the compound according to the third exemplary embodiment.

Manufacturing Method of Compound According to Third Exemplary Embodiment

The compound according to the third exemplary embodiment can be manufactured by application of known substitution reactions and materials depending on a target compound, in accordance with or based on synthesis methods described later in Examples.

Specific Examples of Compound According to Third Exemplary Embodiment

Specific examples of the compound according to the third exemplary embodiment include a compound in which $Ar_1$ is not a substituted or unsubstituted pyrenyl group from among the specific examples of the first host material according to the first exemplary embodiment and the specific examples of the compound according to the second exemplary embodiment.

The compound according to the third exemplary embodiment is usable as an organic-electroluminescence-device material.

The compound according to the third exemplary embodiment is also usable for at least any of one or more organic layers provided between an anode and a cathode of an organic EL device. An organic EL device containing the compound according to the third exemplary embodiment includes an anode, a cathode, and one or more organic layers provided between the anode and the cathode, in which preferably, at least any of the organic layers contains the compound according to the third exemplary embodiment; more preferably, an emitting layer as the organic layer contains the compound according to the third exemplary embodiment; further preferably, the emitting layer contains the compound according to the third exemplary embodiment as a host material.

Further, the compound according to the third exemplary embodiment is also usable as the first host material (first compound) for the organic EL device according to the first exemplary embodiment. An organic EL device containing the compound according to the third exemplary embodiment as the first host material according to the first exemplary embodiment includes an anode, a cathode, and an emitting region provided between the anode and the cathode, in which the emitting region includes a first emitting layer and a second emitting layer, the first emitting layer contains a first host material and a first emitting compound, the second emitting layer contains a second host material and a second emitting compound, the first host material is the compound represented by the formula (1B), the first host material is different from the second host material, and the first emitting compound and the second emitting compound are mutually the same or different.

The compound according to the third exemplary embodiment can improve performance of the organic electroluminescence device. Use of the compound according to the third exemplary embodiment can decrease a drive voltage to improve luminous efficiency of the organic electroluminescence device.

Fourth Exemplary Embodiment

Electronic Device

An electronic device according to a fourth exemplary embodiment is installed with one of the organic EL devices according to the above exemplary embodiments. Examples of the electronic device include a display device and a light-emitting unit. Examples of the display device include a display component (e.g., an organic EL panel module), TV, mobile phone, tablet and personal computer. Examples of the light-emitting unit include an illuminator and a vehicle light.

Modification of Exemplary Embodiment(s)

The scope of the invention is not limited to the above-described exemplary embodiments but includes any modification and improvement as long as such modification and improvement are compatible with the invention.

For instance, the number of emitting layers is not limited to two, and more than two emitting layers may be provided and laminated with each other. When the organic EL device includes more than two emitting layers, it is only necessary that at least two of the emitting layers should satisfy the requirements mentioned in the above exemplary embodiments. For instance, the rest of the emitting layers may be a fluorescent emitting layer or a phosphorescent emitting layer with use of emission caused by electron transfer from the triplet excited state directly to the ground state.

When the organic EL device includes a plurality of emitting layers, these emitting layers may be mutually adjacently provided, or may form a so-called tandem organic EL device, in which a plurality of emitting units are layered via an intermediate layer.

Specific structure, shape and the like of the components in the invention may be designed in any manner as long as an object of the invention can be achieved.

EXAMPLE(S)

The invention will be described in further detail with reference to Example(s). It should be noted that the scope of the invention is by no means limited to Examples.

Compounds

Structures of the compound represented by the formula (1), (1A) or (1B) and used for manufacturing organic EL devices in Examples 1 to 12 are shown below.

BH1-1

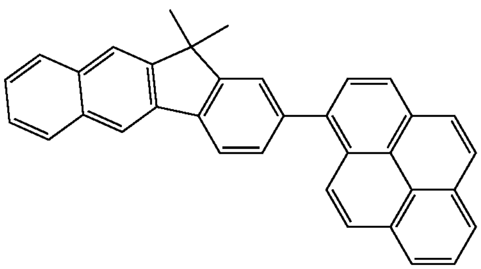

BH1-2

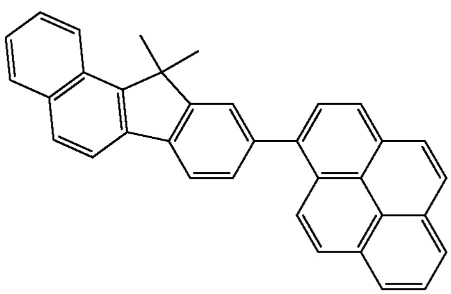

BH1-3

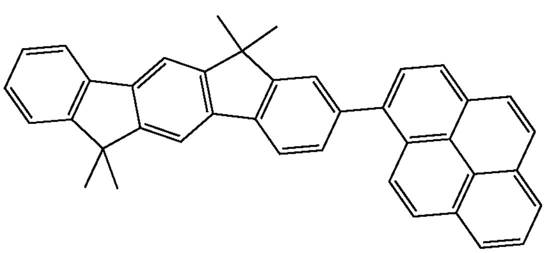

BH1-4

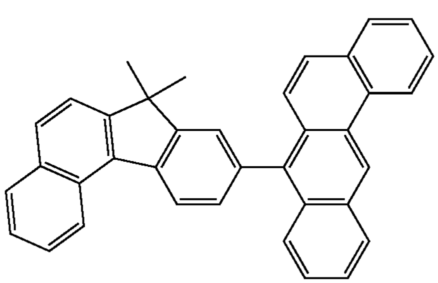

-continued

BH1-5

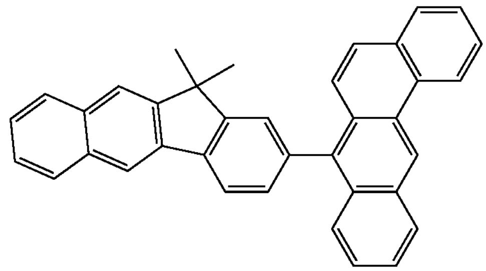

BH1-6

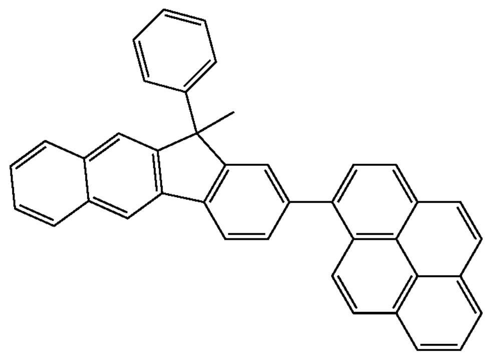

A structure of a comparative compound used for manufacturing organic EL devices in Comparatives 1 and 3 is shown below.

BH-R1

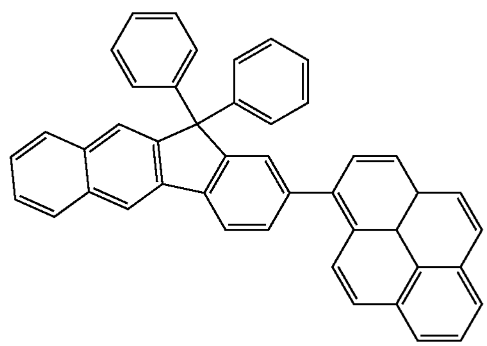

Structures of other compounds used for manufacturing the organic EL devices in Examples 1 to 12 and Comparatives 1 to 4 are shown below.

HIL-1

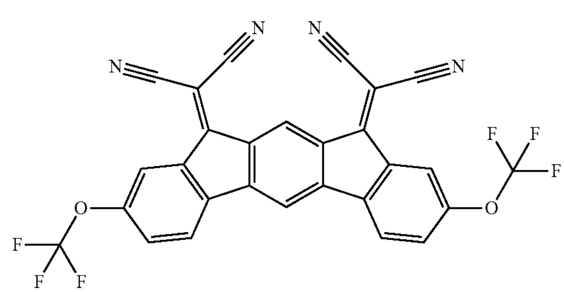

-continued
HTL-1
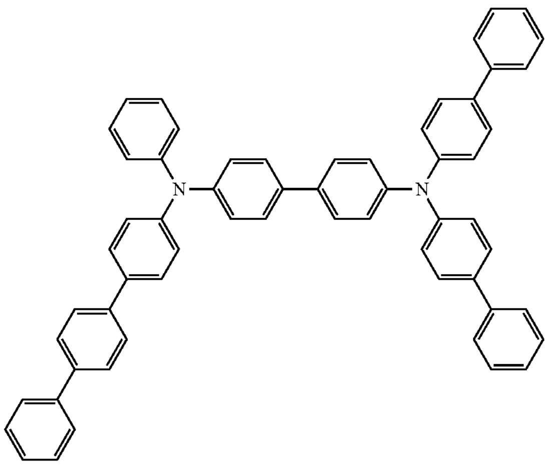
EBL-1
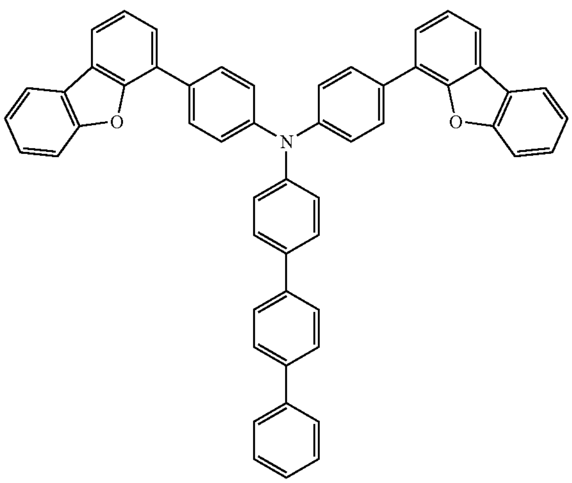
BH-2
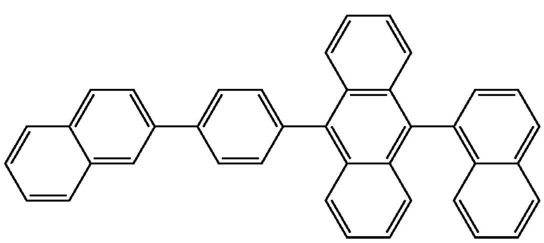
BD-1
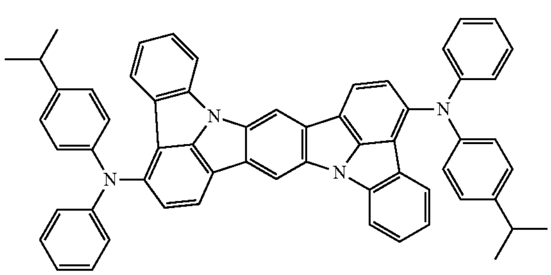
-continued
aET-1
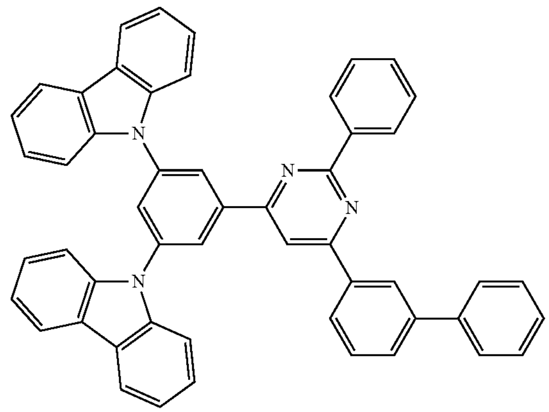
bET-1
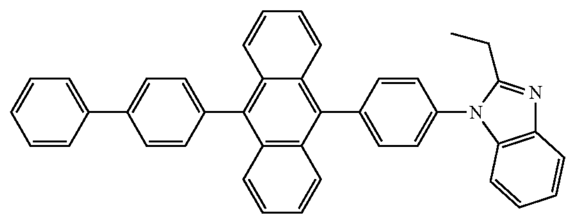
HIL-2
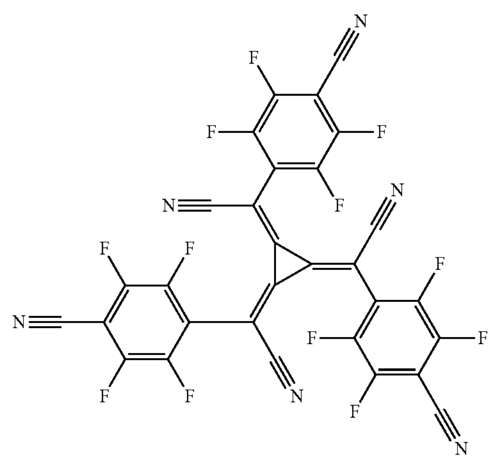
HTL-2
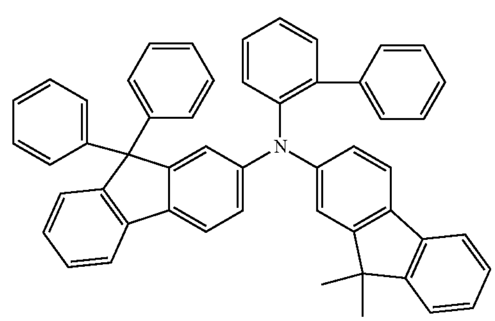

-continued

EBL-2

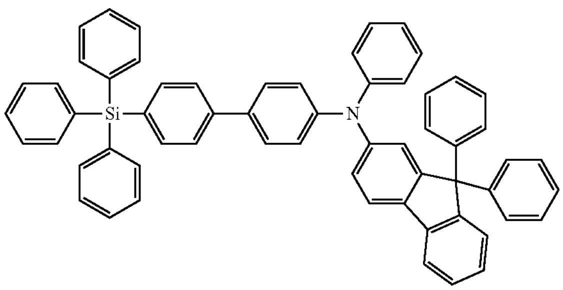

BH2-3

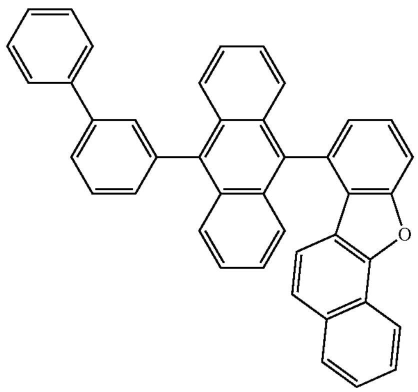

BD-2

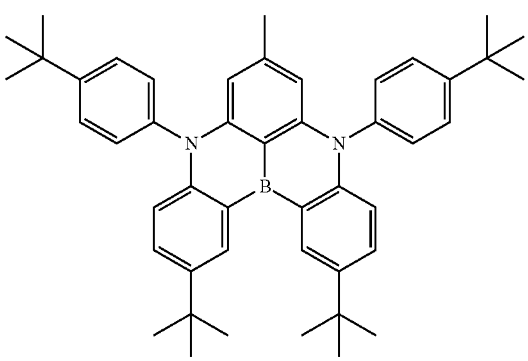

aET-2

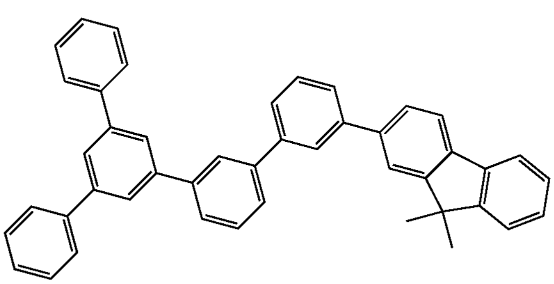

-continued bET-2

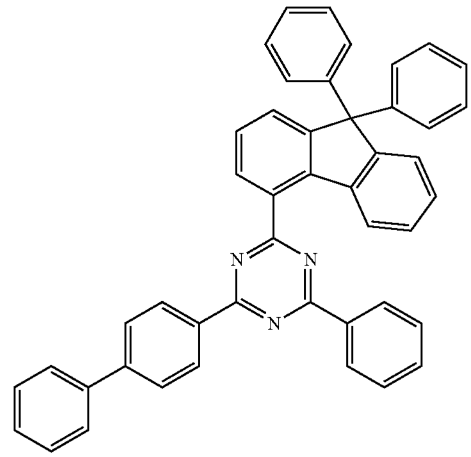

Preparation of Organic EL Device

The organic EL devices were prepared and evaluated as follows.

Example 1

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. The film thickness of the ITO transparent electrode was 130 nm.

After the glass substrate having the transparent electrode line was cleaned, the glass substrate was mounted on a substrate holder of a vacuum deposition apparatus. First, a compound HIL-1 was vapor-deposited on a surface of the glass substrate where the transparent electrode line was provided in a manner to cover the transparent electrode, thereby forming a 5-nm-thick hole injecting layer.

After the formation of the hole injecting layer, a compound HTL-1 was vapor-deposited to form an 80-nm-thick first hole transporting layer.

After the formation of the first hole transporting layer, a compound EBL-1 was vapor-deposited to form a 10-nm-thick second hole transporting layer (also referred to as an electron blocking layer (EBL)).

A compound BH1-1 (the first host material) and a compound BD-1 (the first emitting compound) were co-deposited on the second hole transporting layer so that a ratio of the compound BD-1 accounted for 2 mass %, thereby forming a 12.5-nm-thick first emitting layer.

A compound BH-2 (the second host material) and the compound BD-1 (the second emitting compound) were co-deposited on the first emitting layer so that a ratio of the compound BD-1 accounted for 2 mass %, thereby forming a 12.5-nm-thick second emitting layer. The ratio $D_{EM1}/D_{EM2}$ of the film thickness of the first emitting layer $D_{EM1}$ to the film thickness of the second emitting layer $D_{EM2}$ met 12.5 nm/12.5 nm=1.

A compound aET-1 was vapor-deposited on the second emitting layer to form a 10-nm-thick first electron transporting layer (also referred to as a hole blocking layer (HBL)).

A compound bET-1 was vapor-deposited on the first electron transporting layer to form a 15-nm-thick second electron transporting layer.

LiF was vapor-deposited on the second electron transporting layer to form a 1-nm-thick electron injecting layer.

Metal (Al) was vapor-deposited on the electron injecting layer to form an 80-nm-thick cathode.

A device arrangement of the organic EL device in Example 1 is roughly shown as follows.

ITO(130)/HIL-1(5)/HTL-1(80)/EBL-1(10)/BH1-1:BD-1 (12.5, 98%:2%)/BH-2:BD-1(12.5, 98%:2%)/aET-1(10)/bET-1(15)/LiF(1)/Al(80)

In the device arrangement roughly shown, the numerals in parentheses represent film thickness (unit: nm). The numerals (98%:2%) represented by percentage in the same parentheses indicate a ratio (mass %) between the host material (compound BH1-1 or BH-2) and the emitting compound (compound BD-1) in the first emitting layer or the second emitting layer. Similar notations apply to the description below.

Examples 2 to 6

The organic EL devices of Examples 2 to 6 were each manufactured in the same manner as the organic EL device in Example 1 except that the compound BH1-1 serving as the first host material and used for forming the first emitting layer in Example 1 was changed to a compound shown in Table 1.

Comparative 1

The organic EL device of Comparative 1 was manufactured in the same manner as the organic EL device in Example 1 except that the compound BH1-1 serving as the first host material and used for forming the first emitting layer in Example 1 was changed to a compound shown in Table 1.

Comparative 2

The organic EL device of Comparative 2 was manufactured in the same manner as the organic EL device in Example 1 except that the first emitting layer was not formed and a 25-nm-thick second emitting layer was formed on the second hole transporting layer in Comparative 2.

Example 7

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. The film thickness of the ITO transparent electrode was 130 nm.

After the glass substrate having the transparent electrode line was cleaned, the glass substrate was mounted on a substrate holder of a vacuum deposition apparatus. First, compounds HTL-2 and HIL-2 were co-deposited on a surface of the glass substrate where the transparent electrode line was provided in a manner to cover the transparent electrode, thereby forming a 10-nm-thick hole injecting layer. The ratios of the compound HTL-2 and the compound HIL-2 in the hole injecting layer were 90 mass % and 10 mass %, respectively.

After the formation of the hole injecting layer, the compound HTL-2 was vapor-deposited to form an 85-nm-thick first hole transporting layer.

After the formation of the first hole transporting layer, a compound EBL-2 was vapor-deposited to form a 5-nm-thick second hole transporting layer (also referred to as an electron blocking layer (EBL)).

The compound BH1-1 (the first host material) and a compound BD-2 (the first emitting compound) were co-deposited on the second hole transporting layer so that a ratio of the compound BD-2 accounted for 2 mass %, thereby forming a 10-nm-thick first emitting layer.

A compound BH2-3 (the second host material) and the compound BD-2 (the second emitting compound) were co-deposited on the first emitting layer so that a ratio of the compound BD-2 accounted for 2 mass %, thereby forming a 10-nm-thick second emitting layer. The ratio $D_{EM1}/D_{EM2}$ of the film thickness of the first emitting layer $D_{EM1}$ to the film thickness of the second emitting layer $D_{EM2}$ met 10 nm/10 nm=1.

A compound aET-2 was vapor-deposited on the second emitting layer to form a 5-nm-thick first electron transporting layer (also referred to as a hole blocking layer (HBL)).

Compounds bET-2 and Liq were co-deposited on the first electron transporting layer to form a 25-nm-thick second electron transporting layer. The ratios of the compound bET-2 and the compound Liq in the second electron transporting layer were 50 mass % and 50 mass %, respectively. Liq is an abbreviation of (8-quinolinolato)lithium.

Liq was vapor-deposited on the second electron transporting layer to form a 1-nm-thick electron injecting layer.

Metal (Al) was vapor-deposited on the electron injecting layer to form an 80-nm-thick cathode.

A device arrangement of the organic EL device in Example 7 is roughly shown as follows.

ITO(130)/HTL-2:HIL-2(10,90%:10%)/HTL-2(85)/EBL-2(5)/BH1-1:BD-2(10, 98%:2%)/BH2-3:BD-2(10, 98%:2%)/aET-2(5)/bET-2:Liq(25, 50%:50%)/Liq(1)/Al(80)

Examples 8 to 12

The organic EL devices of Examples 8 to 12 were each manufactured in the same manner as the organic EL device in Example 7 except that the compound BH1-1 serving as the first host material and used for forming the first emitting layer in Example 7 was changed to a compound shown in Table 2.

Comparative 3

The organic EL device of Comparative 3 was manufactured in the same manner as the organic EL device in Example 7 except that the compound BH1-1 serving as the first host material and used for forming the first emitting layer in Example 7 was changed to a compound shown in Table 2.

Comparative 4

The organic EL device of Comparative 4 was manufactured in the same manner as the organic EL device in Example 7 except that the first emitting layer was not formed and a 20-nm-thick second emitting layer was formed on the second hole transporting layer in Comparative 4.

Evaluation of Organic EL Devices

The organic EL devices manufactured were evaluated as follows. Evaluation results are shown in Tables 1 and 2. Further, Tables 1 and 2 show a singlet energy $S_1$ and a triplet energy $T_1$ of compounds used in emitting layers of each Example.

Drive Voltage

The voltage (unit: V) when electric current was applied between the anode and the cathode of the organic EL device so that the current density was 10 mA/cm$^2$ was measured.

External Quantum Efficiency EQE

Voltage was applied on the organic EL devices such that a current density became 10 mA/cm$^2$, where spectral radiance spectrum was measured by a spectroradiometer CS-2000 (manufactured by Konica Minolta, Inc.). The external quantum efficiency EQE (unit: %) was calculated based on the obtained spectral-radiance spectra, assuming that the spectra was provided under a Lambertian radiation.

TABLE 1

| | First Emitting Layer | | | | | | | Second Emitting Layer | | | | | Device Evaluation | |
|---|---|---|---|---|---|---|---|---|---|---|---|---|---|---|
| | First Host Material | | | First Emitting Compound | | | Film | Second Host Material | | | Second Emitting | Film | Drive | |
| | Name | $S_1$ [eV] | $T_1$ [eV] | Name | $S_1$ [eV] | $T_1$ [eV] | Thickness [nm] | Name | $S_1$ [eV] | $T_1$ [eV] | Compound Name | Thickness [nm] | Voltage [V] | EQE [%] |
| Example 1 | BH1-1 | 3.15 | 2.10 | BD-1 | 2.73 | 2.29 | 12.5 | BD-2 | 3.01 | 1.87 | BD-1 | 12.5 | 3.26 | 10.5 |
| Example 2 | BH1-2 | 3.16 | 2.10 | BD-1 | 2.73 | 2.29 | 12.5 | BD-2 | 3.01 | 1.87 | BD-1 | 12.5 | 3.29 | 10.2 |
| Example 3 | BH1-3 | 3.08 | 2.10 | BD-1 | 2.73 | 2.29 | 12.5 | BD-2 | 3.01 | 1.87 | BD-1 | 12.5 | 3.34 | 11.0 |
| Example 4 | BH1-4 | 3.12 | 2.08 | BD-1 | 2.73 | 2.29 | 12.5 | BD-2 | 3.01 | 1.87 | BD-1 | 12.5 | 3.25 | 10.7 |
| Example 5 | BH1-5 | 3.11 | 2.08 | BD-1 | 2.73 | 2.29 | 12.5 | BD-2 | 3.01 | 1.87 | BD-1 | 12.5 | 3.19 | 10.8 |
| Example 6 | BH1-6 | 3.14 | 2.10 | BD-1 | 2.73 | 2.29 | 12.5 | BD-2 | 3.01 | 1.87 | BD-1 | 12.5 | 3.31 | 10.3 |
| Comparative 1 | BH-R1 | 3.13 | 2.09 | BD-1 | 2.73 | 2.29 | 12.5 | BD-2 | 3.01 | 1.87 | BD-1 | 12.5 | 3.35 | 9.8 |
| Comparative 2 | — | — | — | — | — | — | — | BD-2 | 3.01 | 1.87 | BD-1 | 25 | 3.54 | 10.0 |

The organic EL devices of Examples 1 to 6 had a low drive voltage and enhanced luminous efficiency as compared with the organic EL devices of Comparatives 1 and 2.

TABLE 2

| | First Emitting Layer | | | | | | | Second Emitting Layer | | | | | Device Evaluation | |
|---|---|---|---|---|---|---|---|---|---|---|---|---|---|---|
| | First Host Material | | | First Emitting Compound | | | Film | Second Host Material | | | Second Emitting | Film | Drive | |
| | Name | $S_1$ [eV] | $T_1$ [eV] | Name | $S_1$ [eV] | $T_1$ [eV] | Thickness [nm] | Name | $S_1$ [eV] | $T_1$ [eV] | Compound Name | Thickness [nm] | Voltage [V] | EQE [%] |
| Example 7 | BH1-1 | 3.15 | 2.10 | BD-2 | 2.71 | 2.64 | 10 | BH2-3 | 3.01 | 1.79 | BD-2 | 10 | 3.11 | 9.9 |
| Example 8 | BH1-2 | 3.16 | 2.10 | BD-2 | 2.71 | 2.64 | 10 | BH2-3 | 3.01 | 1.79 | BD-2 | 10 | 3.14 | 9.5 |
| Example 9 | BH1-3 | 3.08 | 2.10 | BD-2 | 2.71 | 2.64 | 10 | BH2-3 | 3.01 | 1.79 | BD-2 | 10 | 3.19 | 10.1 |
| Example 10 | BH1-4 | 3.12 | 2.08 | BD-2 | 2.71 | 2.64 | 10 | BH2-3 | 3.01 | 1.79 | BD-2 | 10 | 3.03 | 9.4 |
| Example 11 | BH1-5 | 3.11 | 2.08 | BD-2 | 2.71 | 2.64 | 10 | BH2-3 | 3.01 | 1.79 | BD-2 | 10 | 3.13 | 9.4 |
| Example 12 | BH1-6 | 3.14 | 2.10 | BD-2 | 2.71 | 2.64 | 10 | BH2-3 | 3.01 | 1.79 | BD-2 | 10 | 3.18 | 10.6 |
| Comparative 3 | BH-R1 | 3.13 | 2.09 | BD-2 | 2.71 | 2.64 | 10 | BH2-3 | 3.01 | 1.79 | BD-2 | 10 | 3.21 | 9.0 |
| Comparative 4 | — | — | — | — | — | — | — | BH2-3 | 3.01 | 1.79 | BD-2 | 20 | 3.21 | 9.2 |

The organic EL devices of Examples 7 to 12 had a low drive voltage and enhanced luminous efficiency as compared with the organic EL devices of Comparatives 3 and 4.

Evaluation of Compounds

Triplet Energy $T_1$

A measurement target compound was dissolved in EPA (diethylether:isopentane:ethanol=5:5:2 in volume ratio) at a concentration of 10 μmol/L to prepare a solution. The obtained solution was put in a quartz cell to provide a measurement sample. A phosphorescence spectrum (ordinate axis: phosphorescent luminous intensity, abscissa axis: wavelength) of the measurement sample was measured at a low temperature (77K). A tangent was drawn to the rise of the phosphorescence spectrum close to the short-wavelength region. An energy amount was calculated by a conversion equation (F1) below on a basis of a wavelength value $\lambda_{edge}$ [nm] at an intersection of the tangent and the abscissa axis. The calculated energy amount was defined as triplet energy $T_1$. It should be noted that the triplet energy $T_1$ has an error of about plus or minus 0.02 eV depending on measurement conditions.

$$T_1\ [\text{eV}]=1239.85/\lambda_{edge} \qquad \text{Conversion Equation (F1):}$$

The tangent to the rise of the phosphorescence spectrum close to the short-wavelength region is drawn as follows. While moving on a curve of the phosphorescence spectrum from the short-wavelength region to the local maximum value closest to the short-wavelength region among the local maximum values of the phosphorescence spectrum, a tangent is checked at each point on the curve toward the long-wavelength of the phosphorescence spectrum. An inclination of the tangent is increased along the rise of the curve (i.e., a value of the ordinate axis is increased). A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted as the above-mentioned local maximum peak intensity closest to the short-wavelength region. The tangent drawn at a point that is closest to the local maximum peak intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 (manufactured by Hitachi High-Technologies Corporation) was used.

Singlet Energy $S_1$

A toluene solution of a measurement target compound at a concentration of 10 μmol/L was prepared and put in a quartz cell. An absorption spectrum (ordinate axis: absorption intensity, abscissa axis: wavelength) of the thus-obtained sample was measured at a normal temperature (300K). A tangent was drawn to the fall of the absorption spectrum close to the long-wavelength region, and a wavelength value $\lambda_{edge}$ (nm) at an intersection of the tangent and the abscissa axis was assigned to a conversion equation (F2) below to calculate the singlet energy.

$$S_1\ [\text{eV}]=1239.85/\lambda_{edge} \qquad \text{Conversion Equation (F2):}$$

A spectrophotometer (U3310 manufactured by Hitachi, Ltd.) was used for measuring absorption spectrum.

The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve falls (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region.

The local maximum absorbance of 0.2 or less is not counted as the above-mentioned local maximum absorbance closest to the long-wavelength region.

Measurement of Maximum Fluorescence Peak Wavelength (FL-Peak)

A measurement target compound was dissolved in toluene at a concentration of $4.9\times10^{-6}$ mol/L to prepare a toluene solution thereof. Using a fluorescence spectrometer (spectrophotofluorometer F-7000 manufactured by Hitachi High-Tech Science Corporation), the toluene solution of the measurement target compound was excited at 390 nm, where a maximum fluorescence peak wavelength A (unit: nm) was measured.

The maximum fluorescence peak wavelength λ of the compound BD-1 was 453 nm.

SYNTHESIS EXAMPLE(S)

Synthesis Example 1: Synthesis of BH1-1

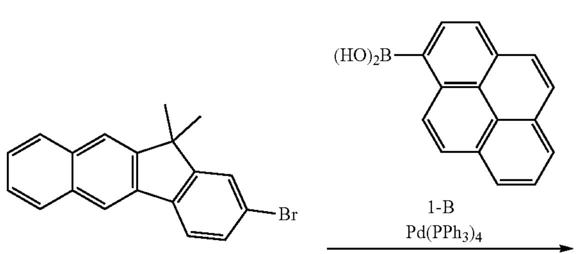

1-A

-continued

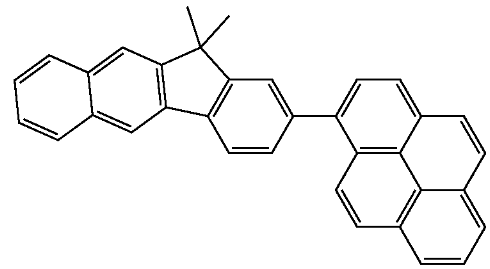

BH1-1

Under argon atmosphere, 7.0 g (21.6 mmol) of a compound 1-A, 5.9 g (23.8 mmol) of a compound 1-B, 2.31 g (2.00 mmol) of tetrakis(triphenylphosphine)palladium(0), 5.3 g (100 mmol) of sodium carbonate, 186 ml of 1,4-dioxane, and 31 ml of purified water were put into a flask and heated with agitation at 85 degrees C. for eight hours. After heating with agitation, the solution in the flask was cooled to a room temperature (25 degrees C.) and 300 ml of water was added into the flask to obtain a precipitated solid by filtration. Subsequently, the obtained solid was refined by silica-gel column chromatography to obtain 4.2 g (a yield of 44%) of a white solid. The white solid was identified as the compound BH1-1 by LC-MS (Liquid chromatography mass spectrometry) analysis. In a reaction scheme, tetrakis(triphenylphosphine)palladium(0) was abbreviated as "Pd(PPh$_3$)$_4$".

Synthesis Example 2: Synthesis of BH1-2

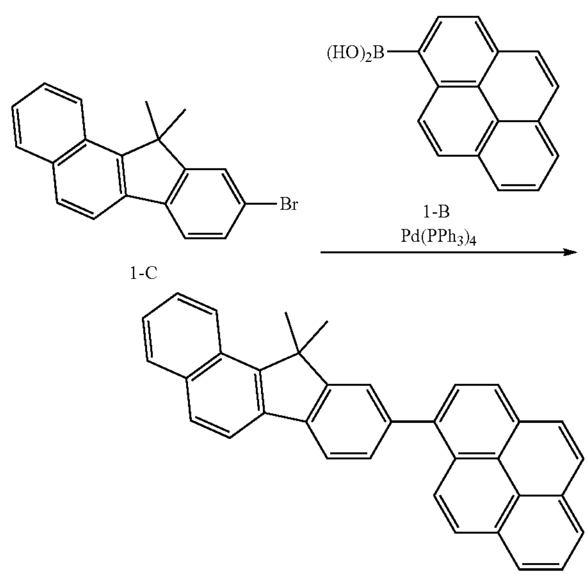

BH1-2

1.9 g (a yield of 69%) of a white solid was obtained in the same manner as in Synthesis Example 1 except for using a compound 1-C instead of the compound 1-A used in the synthesis of the compound BH1-1.

The white solid was identified as a compound BH1-2 by LC-MS analysis.

Synthesis Example 3: Synthesis of BH1-3

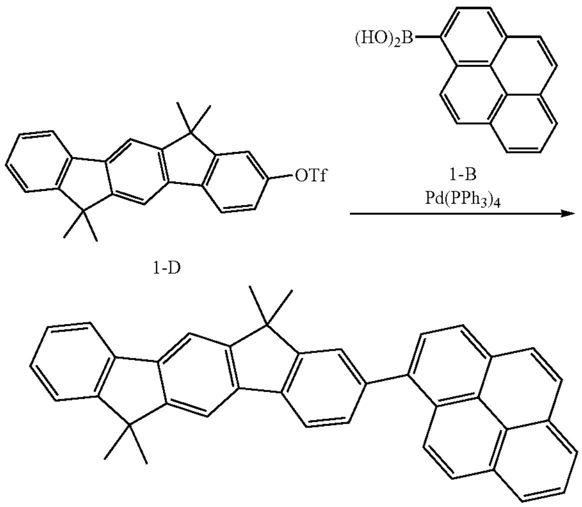

BH1-3

2.3 g (a yield of 69%) of a white solid was obtained in the same manner as in Synthesis Example 1 except for using a compound 1-D instead of the compound 1-A used in the synthesis of the compound BH1-1.

The white solid was identified as a compound BH1-3 by LC-MS analysis.

Synthesis Example 4: Synthesis of BH1-4

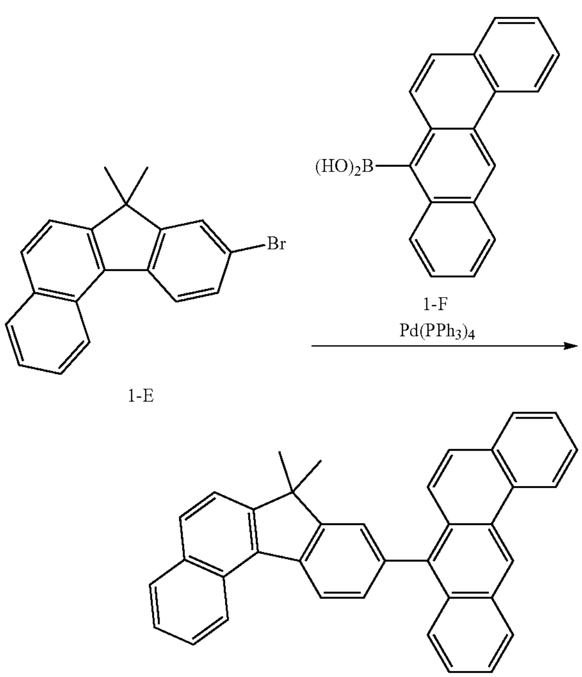

BH1-4

3.9 g (a yield of 89%) of a white solid was obtained in the same manner as in Synthesis Example 1 except for using compounds 1-E and 1-F instead of the compounds 1-A and 1-B used in the synthesis of the compound BH1-1.

The white solid was identified as a compound BH1-4 by LC-MS analysis.

Synthesis Example 5: Synthesis of BH1-5

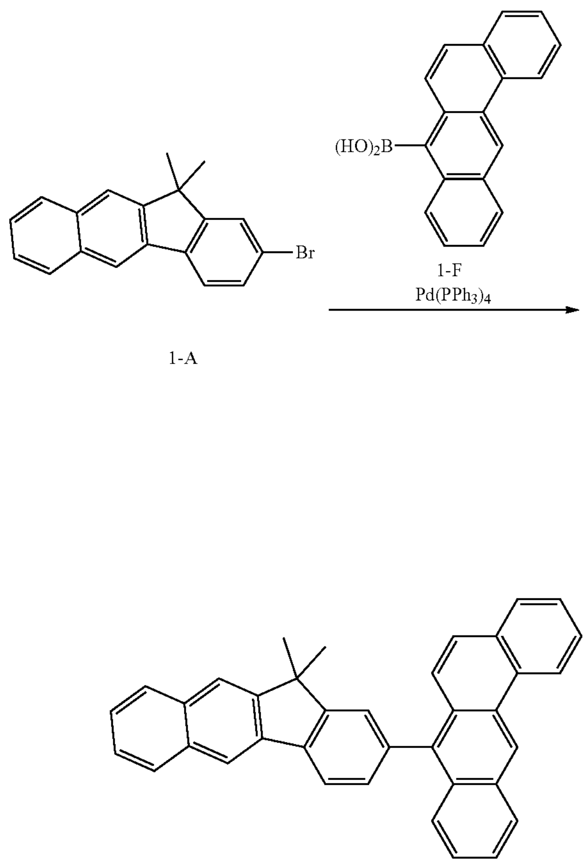

BH1-5

2.7 g (a yield of 92%) of a white solid was obtained in the same manner as in Synthesis Example 1 except for using the compound 1-F instead of the compound 1-B used in the synthesis of the compound BH1-1.

The white solid was identified as a compound BH1-5 by LC-MS analysis.

Synthesis Example 6: Synthesis of BH1-6

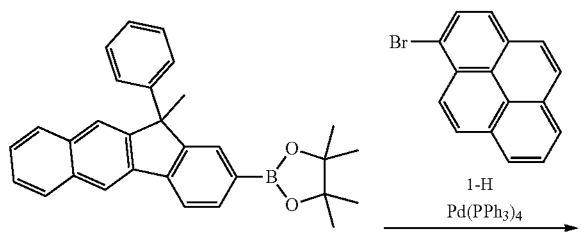

1-G

-continued

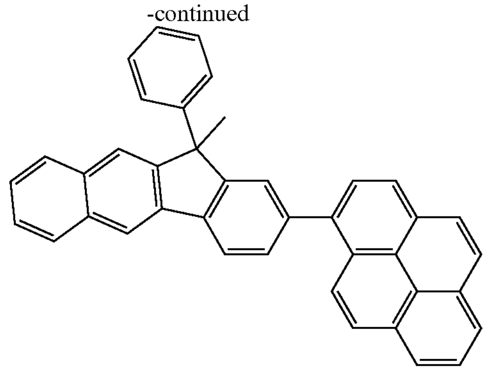

BH1-6

0.9 g (a yield of 37%) of a white solid was obtained in the same manner as in Synthesis Example 1 except for using compounds 1-G and 1-H instead of the compounds 1-A and 1-B used in the synthesis of the compound BH1-1.

The white solid was identified as a compound BH1-6 by LC-MS analysis.

What is claimed is:

1. An organic electroluminescence device comprising:

an anode;

a cathode; and an emitting region provided between the anode and the cathode, wherein the emitting region comprises a first emitting layer and a second emitting layer, a ratio $D_{EM1}/D_{EM2}$ of a film thickness of the first emitting layer $D_{EM1}$ to a film thickness of the second emitting layer $D_{EM2}$ is in a range from 2/3 to 3/2, the first emitting layer comprises a first host material and a first emitting compound, the second emitting layer comprises a second host material and a second emitting compound, the first host material is a compound represented by a formula (1) below, the first host material is different from the second host material, and the first emitting compound and the second emitting compound are mutually the same or different, (1)

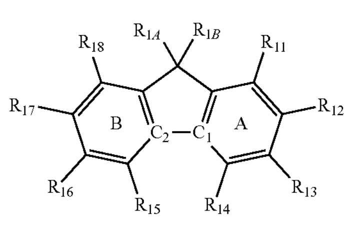

(10)

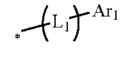

where in the formula (1):

$R_{1A}$ and $R_{1B}$ are each independently a substituted or unsubstituted alkyl group having 1 to 15 carbon atoms, a substituted or unsubstituted aryl group having 6 to 17 ring carbon atoms, or a substituted or unsubstituted heterocyclic group having 5 to 17 ring atoms;

at least one of $R_{1A}$ or $R_{1B}$ is a substituted or unsubstituted alkyl group having 1 to 15 carbon atoms;

one combination of a combination of adjacent two or more of $R_{11}$ to $R_{14}$ and a combination of adjacent two or more of $R_{15}$ to $R_{1}$, are mutually bonded to form a substituted or unsubstituted monocyclic ring, or mutually bonded to form a substituted or unsubstituted fused ring;

when the substituted or unsubstituted monocyclic ring or the substituted or unsubstituted fused ring is formed with a ring A, a group represented by a formula (10) is bonded to a carbon atom bonded to $R_{12}$ or a carbon atom, among carbon atoms forming the substituted or unsubstituted monocyclic ring or the substituted or unsubstituted fused ring, at a position farthest from a carbon atom $C_1$ of the ring A bonded by a single bond to a carbon atom $C_2$ of a ring B;

when the substituted or unsubstituted monocyclic ring or the substituted or unsubstituted fused ring is formed not with the ring A but with the ring B, the group represented by the formula (10) is bonded to the carbon atom bonded to $R_{12}$; and $R_{12}$ not bonded with the group represented by the formula (10), and $R_{11}$, $R_{13}$, $R_{14}$ and $R_{15}$ to $R_{18}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—($R_{904}$), a group represented by —S—($R_{905}$), a group represented by —$N(R_{906})(R_{907})$, a substituted or unsubstituted aralkyl group having 7 to 50 carbon atoms, a group represented by —C(═O)$R_{801}$, a group represented by —$COOR_{802}$, a halogen atom, a cyano group, a nitro group, a substituted or unsubstituted aryl group having 6 to 17 ring carbon atoms, or a substituted or unsubstituted heterocyclic group having 5 to 17 ring atoms, in the formula (10):

$Ar_1$ is a substituted or unsubstituted aryl group comprising four or more fused rings, or a substituted or unsubstituted heterocyclic group comprising four or more fused rings;

$L_1$ is a single bond, a substituted or unsubstituted arylene group having 6 to 17 ring carbon atoms, or a substituted or unsubstituted divalent heterocyclic group having 5 to 17 ring atoms;

mx is 0, 1, or 2;

* represents a bonding position to an atom forming a ring of the formula (1); and the first host material does not comprise, in a molecule of the first host material, three or more of: a substituted or unsubstituted aryl group comprising four or more fused rings; and a substituted or unsubstituted heterocyclic group comprising four or more fused rings, and in the first host material:

$R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 17 ring carbon atoms, or a substituted or unsubstituted heterocyclic group having 5 to 17 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

2. The organic electroluminescence device according to claim 1, wherein $R_{1A}$ and $R_{1B}$ are each independently a substituted or unsubstituted alkyl group having 1 to 10 carbon atoms.

3. The organic electroluminescence device according to claim 1, wherein when at least one combination of adjacent two or more of $R_{11}$ to $R_{14}$ are mutually bonded to form a substituted or unsubstituted monocyclic ring or mutually bonded to form a substituted or unsubstituted fused ring or when at least one combination of adjacent two or more of $R_{15}$ to $R_{18}$ are mutually bonded to form a substituted or unsubstituted monocyclic ring or mutually bonded to form a substituted or unsubstituted fused ring, the substituted or unsubstituted monocyclic ring is a ring represented by a formula (11) below, and the substituted or unsubstituted fused ring is a ring represented by a formula (12) below, (11)

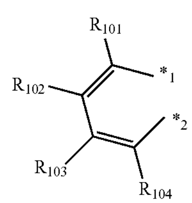

(12)

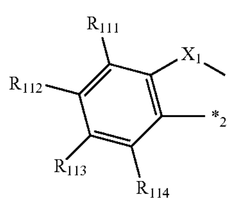

where in the formula (11):

at least one combination of adjacent two or more of $R_{101}$ to $R_{104}$ are mutually bonded to form a substituted or unsubstituted monocyclic ring, mutually bonded to form a substituted or unsubstituted fused ring, or not mutually bonded, and in the formula (12):

$X_1$ is $C(R_{115})(R_{116})$, $NR_{117}$, an oxygen atom, or a sulfur atom;

$R_{115}$, $R_{116}$ and $R_{117}$ are each independently a substituted or unsubstituted alkyl group having 1 to 15 carbon atoms, a substituted or unsubstituted aryl group having 6 to 17 ring carbon atoms, or a substituted or unsubstituted heterocyclic group having 5 to 17 ring atoms;

at least one of $R_{115}$ or $R_{116}$ is a substituted or unsubstituted alkyl group having 1 to 15 carbon atoms;

at least one combination of adjacent two or more of $R_{111}$ to $R_{114}$ are mutually bonded to form a substituted or unsubstituted monocyclic ring, mutually bonded to form a substituted or unsubstituted fused ring, or not mutually bonded;

$R_{101}$ to $R_{104}$ and $R_{111}$ to $R_{114}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 17 ring carbon atoms, or a substituted or unsubstituted heterocyclic group having 5 to 17 ring atoms; and

*1 and *2 each represent a bonding position to an atom forming a ring of the formula (1).

4. The organic electroluminescence device according to claim 1, wherein the first host material is a compound represented by a formula (101) below, (101)

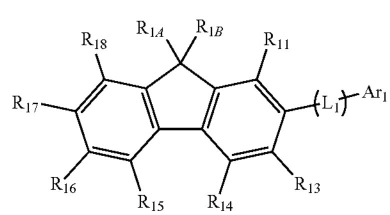

where in the formula (101):

$R_{1A}$, $R_{1B}$, $R_{11}$, $R_{13}$, $R_{14}$ and $R_{15}$ to $R_{18}$ respectively represent the same as $R_{1A}$, $R_{1B}$, $R_{11}$, $R_{13}$, $R_{14}$ and $R_{15}$ to $R_1$, in the formula (1); and $Ar_1$, $L_1$ and mx respectively represent the same as $Ar_1$, $L_1$ and mx in the formula (10).

5. The organic electroluminescence device according to claim 1, wherein at least one combination of adjacent two or more of $R_{15}$ to $R_1$, are mutually bonded to form a substituted or unsubstituted monocyclic ring, or mutually bonded to form a substituted or unsubstituted fused ring.

6. The organic electroluminescence device according to claim 1, wherein a combination of $R_{16}$ and $R_{17}$ are mutually bonded to form a substituted or unsubstituted monocyclic ring, or mutually bonded to form a substituted or unsubstituted fused ring.

7. The organic electroluminescence device according to claim 1, wherein a combination of $R_{16}$ and $R_{17}$ are mutually bonded to form a substituted or unsubstituted monocyclic ring.

8. The organic electroluminescence device according to claim 5, wherein the first host material is a compound represented by a formula (102), (102A) or (102B) below, (102)

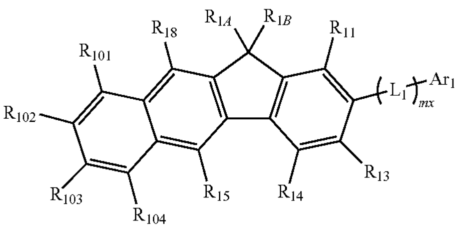

(102A)

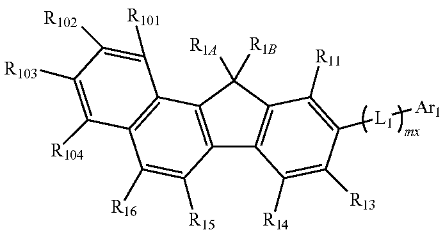

(102B)

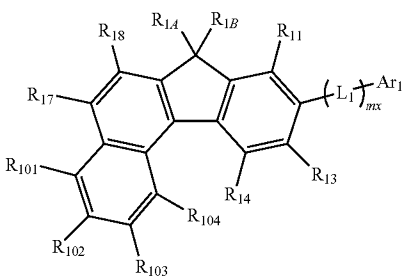

where in the formulae (102), (102A) and (102B):

$R_{1A}$, $R_{1B}$, $R_{11}$, $R_{13}$, $R_{14}$, $R_{15}$, $R_{16}$, $R_{17}$ and $R_{18}$ respectively represent the same as $R_{1A}$, $R_{1B}$, $R_{11}$, $R_{13}$, $R_{14}$, $R_{15}$, $R_{16}$, $R_{17}$ and $R_{18}$ in the formula (1);

$Ar_1$, $L_1$ and mx respectively represent the same as $Ar_1$, $L_1$ and mx in the formula (10);

none of a combination of adjacent two or more of $R_{101}$ to $R_{104}$ are mutually bonded; and $R_{101}$ to $R_{104}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—($R_{904}$), a group represented by —S—($R_{905}$), a group represented by —$N(R_{906})(R_{907})$, a substituted or unsubstituted aralkyl group having 7 to 50 carbon atoms, a group represented by —C(═O)$R_{801}$, a group represented by —$COOR_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

9. The organic electroluminescence device according to claim 1, wherein mx is 0.

10. The organic electroluminescence device according to claim 8, wherein the first host material is a compound represented by a formula (103), (103A) or (103B) below, (103)

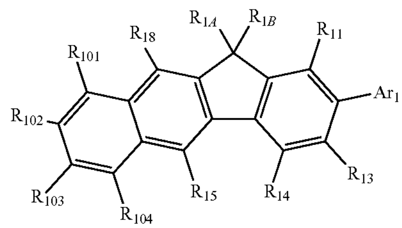

(103A)

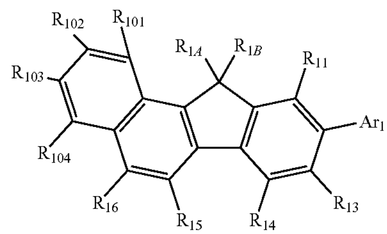

(103B)

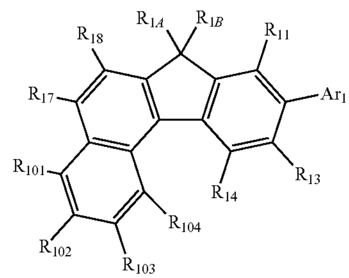

where in the formulae (103), (103A) and (103B):

$R_{1A}$, $R_{1B}$, $R_{11}$, $R_{13}$, $R_{14}$, $R_{15}$, $R_{16}$, $R_{17}$ and $R_{18}$ respectively represent the same as $R_{1A}$, $R_{1B}$, $R_{11}$, $R_{13}$, $R_{14}$, $R_{15}$, $R_{16}$, $R_{17}$ and $R_{18}$ in the formula (1);

$R_{101}$ to $R_{104}$ respectively represent the same as $R_{101}$ to $R_{104}$ in the formulae (102), (102A) and (102B); and $Ar_1$ represents the same as $Ar_1$ in the formula (10).

11. The organic electroluminescence device according to claim 1, wherein $Ar_1$ in the formula (10) is a group represented by a formula (110) or (120) below, (110)

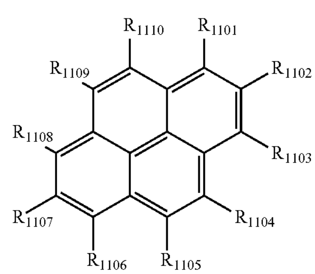

where in the formula (110):

one of $R_{1101}$ to $R_{1110}$ represents a bonding position to $L_1$; and $R_{1101}$ to $R_{1110}$ not being a bonding position to $L_1$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 17 ring carbon atoms, or a substituted or unsubstituted heterocyclic group having 5 to 17 ring atoms, and (120)

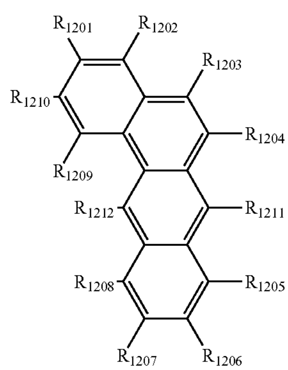

in the formula (120):

one of $R_{1201}$ to $R_{1212}$ represents a bonding position to $L_1$; and $R_{1201}$ to $R_{1212}$ not being a bonding position to $L_1$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

12. The organic electroluminescence device according to claim 10, wherein the first host material is a compound represented by a formula (103C) below, (103C)

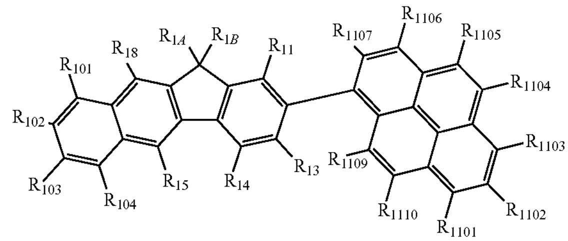

where in the formula (103C):

$R_{1A}$, $R_{1B}$, $R_{11}$, $R_{13}$, $R_{14}$ and $R_{15}$ and $R_{18}$ respectively represent the same as $R_{1A}$, $R_{1B}$, $R_{11}$, $R_{13}$, $R_{14}$ and $R_{15}$ and $R_{18}$ in the formula (1);

$R_{101}$ to $R_{104}$ respectively represent the same as $R_{101}$ to $R_{104}$ in the formula (102); and $R_{1101}$ to $R_{1107}$, $R_{1109}$ and $R_{1110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

13. The organic electroluminescence device according to claim 1, wherein the second host material is a second compound represented by a formula (2) below, (2)

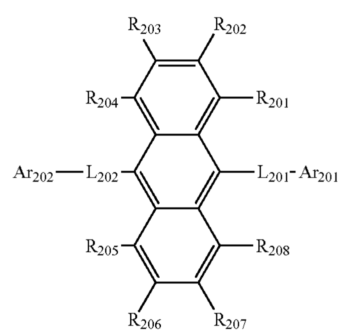

where in the formula (2):

$R_{201}$ to $R_{208}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(═O)$R_{801}$, a group represented by —COOR$_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms, and in the second host material:

$R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

14. The organic electroluminescence device according to claim 1, wherein a triplet energy of the first host material $T_1(H1)$ and a triplet energy of the second host material $T_1(H2)$ satisfy a relationship of a numerical formula (Numerical Formula 1) below, $$T_1(H1)>T_1(H2) \quad \text{(Numerical Formula 1)}.$$

15. The organic electroluminescence device according to claim 1, wherein the first emitting compound and the second emitting compound are each independently a compound exhibiting a maximum peak wavelength of 500 nm or less.

16. The organic electroluminescence device according to claim 1, wherein the first emitting compound is a compound represented by a formula (5) below or a compound represented by a formula (6) below, (5)

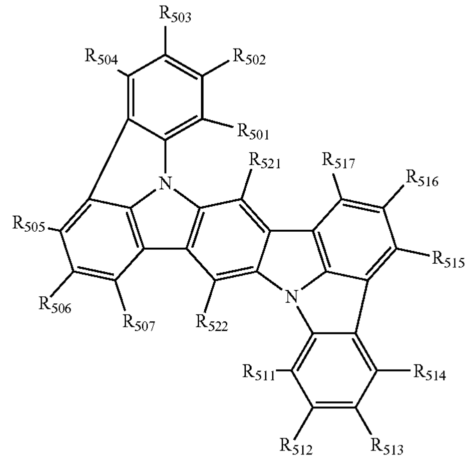

where in the formula (5):

at least one combination of adjacent two or more of $R_{501}$ to $R_{507}$ and $R_{511}$ to $R_{517}$ are mutually bonded to form a substituted or unsubstituted monocyclic ring, mutually bonded to form a substituted or unsubstituted fused ring, or not mutually bonded; and $R_{521}$, $R_{522}$, and $R_{501}$ to $R_{507}$ and $R_{511}$ to $R_{517}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms, and (6)

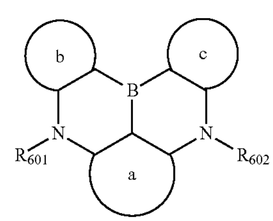

in the formula (6):

a ring, b ring and c ring are each independently a substituted or unsubstituted aromatic hydrocarbon ring having 6 to 50 ring carbon atoms, or a substituted or unsubstituted heterocycle having 5 to 50 ring atoms;

$R_{601}$ and $R_{602}$ are each independently bonded to the a ring, the b ring or the c ring to form a substituted or unsubstituted heterocycle, or not bonded to form no substituted or unsubstituted heterocycle; and $R_{601}$ and $R_{602}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

17. The organic electroluminescence device according to claim 1, wherein the first emitting layer is disposed between the anode and the second emitting layer.

18. An electronic device comprising the organic electroluminescence device according to claim 1.

19. A compound represented by a formula (1A) below, (1A)

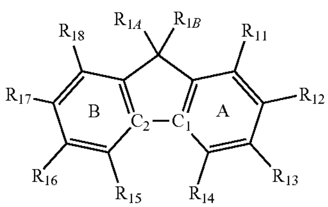

(10A)

where in the formula (1A):

$R_{1A}$ and $R_{1B}$ are each independently a substituted or unsubstituted alkyl group having 1 to 15 carbon atoms, a substituted or unsubstituted aryl group having 6 to 17 ring carbon atoms, or a substituted or unsubstituted heterocyclic group having 5 to 17 ring atoms;

at least one of $R_{1A}$ or $R_{1B}$ is a substituted or unsubstituted alkyl group having 1 to 15 carbon atoms;

at least one combination of a combination of $R_{11}$ and $R_{12}$, a combination of $R_{12}$ and $R_{13}$, a combination of $R_{16}$ and $R_{17}$, and a combination of $R_{17}$ and $R_1$, are mutually bonded to form a substituted or unsubstituted monocyclic ring, or mutually bonded to form a substituted or unsubstituted fused ring;

when the combination of $R_{11}$ and $R_{12}$ or the combination of $R_{12}$ and $R_{13}$ are mutually bonded to form a substituted or unsubstituted monocyclic ring or a substituted or unsubstituted fused ring with a ring A, a group represented by the formula (10A) is bonded to a carbon atom, among carbon atoms forming the substituted or unsubstituted monocyclic ring or the substituted or unsubstituted fused ring, at a position farthest from a carbon atom $C_1$ of the ring A bonded by a single bond to a carbon atom $C_2$ of a ring B;

$R_{12}$ not forming the substituted or unsubstituted monocyclic ring and not forming the substituted or unsubstituted fused ring is the group represented by the formula (10A); and $R_{11}$, $R_{13}$, $R_{14}$ and $R_{15}$ to $R_1$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 17 ring carbon atoms, or a substituted or unsubstituted heterocyclic group having 5 to 17 ring atoms, in the formula (10A):

$Ar_1$ is a substituted or unsubstituted aryl group comprising four or more fused rings, or a substituted or unsubstituted heterocyclic group comprising four or more fused rings;

$L_1$ is a single bond, a substituted or unsubstituted arylene group having 6 to 17 ring carbon atoms, or a substituted or unsubstituted divalent heterocyclic group having 5 to 17 ring atoms;

mx is 0, 1, or 2;

* represents a bonding position to an atom forming a ring of the formula (1A); and the compound represented by the formula (1A) does not comprise, in a molecule of the compound, three or more of: a substituted or unsubstituted aryl group comprising four or more fused rings; and a substituted or unsubstituted heterocyclic group comprising four or more fused rings, and in the compound represented by the formula (1A):

$R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 17 ring carbon atoms, or a substituted or unsubstituted heterocyclic group having 5 to 17 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

20. The compound according to claim 19, wherein $R_{1A}$ and $R_{1B}$ are each independently a substituted or unsubstituted alkyl group having 1 to 10 carbon atoms.

21. The compound according to claim 19, wherein the compound represented by the formula (1A) is a compound represented by a formula (101) below, (101)

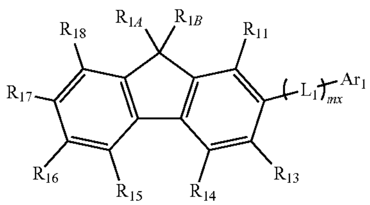

where in the formula (101):

a combination of $R_{16}$ and $R_{17}$ or a combination of $R_{17}$ and $R_{18}$ are mutually bonded to form a substituted or unsubstituted monocyclic ring, or mutually bonded to form a substituted or unsubstituted fused ring;

$R_{1A}$, $R_{1B}$, $R_{11}$, $R_{13}$, $R_{14}$ and $R_{15}$ respectively represent the same as $R_{1A}$, $R_{1B}$, $R_{11}$, $R_{13}$, $R_{14}$ and $R_{15}$ in the formula (1A);

$R_{16}$, $R_{17}$ and $R_{18}$ not forming the substituted or unsubstituted monocyclic ring and not forming the substituted or unsubstituted fused ring respectively represent the same as $R_{16}$, $R_{17}$ and $R_{18}$ not forming the substituted or unsubstituted monocyclic ring and not forming the substituted or unsubstituted fused ring in the formula (1A); and $Ar_1$, $L_1$ and mx respectively represent the same as $Ar_1$, $L_1$ and mx in the formula (10A).

22. The compound according to claim 19, wherein the combination of $R_{16}$ and $R_{17}$ are mutually bonded to form a substituted or unsubstituted monocyclic ring, or the combination of $R_{17}$ and $R_1$ are mutually bonded to form a substituted or unsubstituted monocyclic ring.

23. The compound according to claim 22, wherein the compound represented by the formula (1A) is a compound represented by a formula (102) or (102A) below, (102)

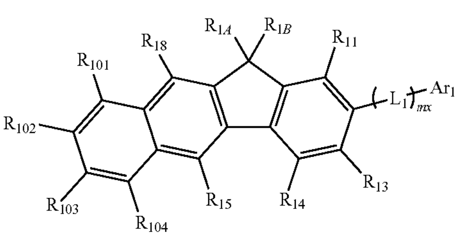

(102A)

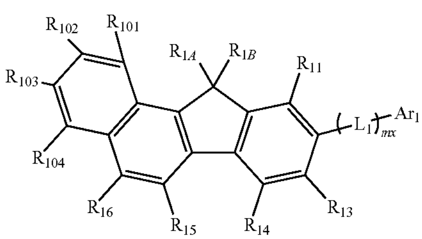

where in the formulae (102) and (102A):

$R_{1A}$, $R_{1B}$, $R_{11}$, $R_{13}$, $R_{14}$, $R_{15}$, $R_{16}$ and $R_1$ respectively represent the same as $R_{1A}$, $R_{1B}$, $R_{11}$, $R_{13}$, $R_{14}$, $R_{15}$, $R_{16}$ and $R_1$ in the formula (1A);

$Ar_1$, $L_1$ and mx respectively represent the same as $Ar_1$, $L_1$ and mx in the formula (10A);

none of a combination of adjacent two or more of $R_{101}$ to $R_{104}$ are mutually bonded; and $R_{101}$ to $R_{104}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a group represented by —S—$(R_{905})$, a group represented by —$N(R_{906})(R_{907})$, a substituted or unsubstituted aralkyl group having 7 to 50 carbon atoms, a group represented by —$C(=O)R_{801}$, a group represented by —$COOR_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

24. The compound according to claim 19, wherein mx is 0.

25. The compound according to claim 23, wherein the compound represented by the formula (1A) is a compound represented by a formula (103) or (103A) below, (103)

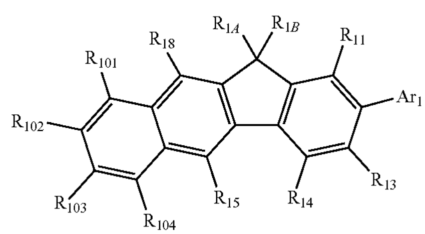

(103A)

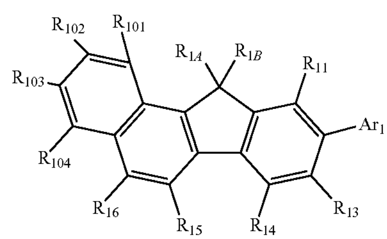

where in the formulae (103) and (103A):

$R_{1A}$, $R_{1B}$, $R_{11}$, $R_{13}$, $R_{14}$, $R_{15}$, $R_{16}$ and $R_{18}$ respectively represent the same as $R_{1A}$, $R_{1B}$, $R_{11}$, $R_{13}$, $R_{14}$, $R_{15}$, $R_{16}$ and $R_{18}$ in the formula (1A);

$R_{101}$ to $R_{104}$ respectively represent the same as $R_{101}$ to $R_{104}$ in the formulae (102) and (102A); and $Ar_1$ represents the same as $Ar_1$ in the formula (10A).

26. The compound according to claim 19, wherein $Ar_1$ in the formula (10A) is a group represented by a formula (110) or (120) below, (110)

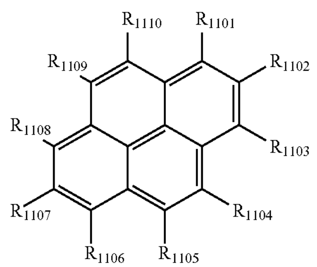

where in the formula (110):

one of $R_{1101}$ to $R_{1110}$ represents a bonding position to $L_1$; and $R_{1101}$ to $R_{1110}$ not being a bonding position to $L_1$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(═O)$R_{801}$, a group represented by —COOR$_{802}$, a halogen atom, a cyano group, a nitro group, a substituted or unsubstituted aryl group having 6 to 17 ring carbon atoms, or a substituted or unsubstituted heterocyclic group having 5 to 17 ring atoms, and (120)

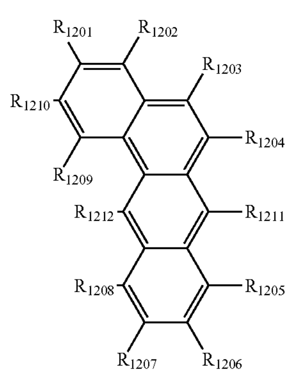

in the formula (120):

one of $R_{1201}$ to $R_{1212}$ represents a bonding position to $L_1$; and $R_{1201}$ to $R_{1212}$ not being a bonding position to $L_1$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(═O)$R_{801}$, a group represented by —COOR$_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

27. The compound according to claim 25, wherein the compound represented by the formula (1A) is a compound represented by a formula (103C) below, (103C)

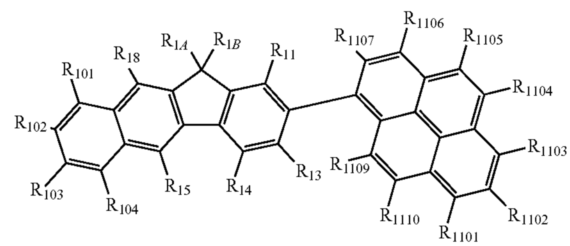

where in the formula (103C):

$R_{1A}$, $R_{1B}$, $R_{11}$, $R_{13}$, $R_{14}$, $R_{15}$ and $R_{18}$ respectively represent the same as $R_{1A}$, $R_{1B}$, $R_{11}$, $R_{13}$, $R_{14}$, $R_{15}$ and $R_{18}$ in the formula (1A);

$R_{101}$ to $R_{104}$ respectively represent the same as $R_{101}$ to $R_{104}$ in the formula (102); and $R_{1101}$ to $R_{1107}$, $R_{1109}$ and $R_{1110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(═O)$R_{801}$, a group represented by —COOR$_{802}$, a halogen atom, a cyano group, a nitro group, a substituted or unsubstituted aryl group having 6 to 17 ring carbon atoms, or a substituted or unsubstituted heterocyclic group having 5 to 17 ring atoms.

28. A compound represented by a formula (1B) below, (1B)

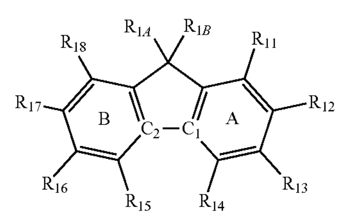

-continued $$*\!-\!\left[ L_1 \right]_{mx}\!-Ar_1 \qquad (10B)$$

where in the formula (1B):

$R_{1A}$ and $R_{1B}$ are each independently a substituted or unsubstituted alkyl group having 1 to 15 carbon atoms, a substituted or unsubstituted aryl group having 6 to 17 ring carbon atoms, or a substituted or unsubstituted heterocyclic group having 5 to 17 ring atoms;

at least one of $R_{1A}$ or $R_{1B}$ is a substituted or unsubstituted alkyl group having 1 to 15 carbon atoms;

one combination of a combination of adjacent two or more of $R_{11}$ to $R_{14}$ and a combination of adjacent two or more of $R_{15}$ to $R_1$, are mutually bonded to form a substituted or unsubstituted monocyclic ring, or mutually bonded to form a substituted or unsubstituted fused ring;

when the substituted or unsubstituted monocyclic ring or the substituted or unsubstituted fused ring is formed with a ring A, a group represented by a formula (10B) is bonded to a carbon atom bonded to $R_{12}$ or a carbon atom, among carbon atoms forming the substituted or unsubstituted monocyclic ring or the substituted or unsubstituted fused ring, at a position farthest from a carbon atom $C_1$ of the ring A bonded by a single bond to a carbon atom $C_2$ of a ring B;

when the substituted or unsubstituted monocyclic ring or the substituted or unsubstituted fused ring is formed not with the ring A but with the ring B, the group represented by the formula (10B) is bonded to the carbon atom bonded to $R_{12}$; and $R_{12}$ not bonded with the group represented by the formula (10B), and $R_{11}$, $R_{13}$, $R_{14}$ and $R_{15}$ to $R_1$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a substituted or unsubstituted aralkyl group having 7 to 50 carbon atoms, a group represented by $—C(=O)R_{801}$, a group represented by $—COOR_{802}$, a halogen atom, a cyano group, a nitro group, a substituted or unsubstituted aryl group having 6 to 17 ring carbon atoms, or a substituted or unsubstituted heterocyclic group having 5 to 17 ring atoms, in the formula (10B):

$Ar_1$ is a substituted or unsubstituted aryl group comprising four or more fused rings, or a substituted or unsubstituted heterocyclic group comprising four or more fused rings;

$Ar_1$ is not a substituted or unsubstituted pyrenyl group;

$L_1$ is a single bond, a substituted or unsubstituted arylene group having 6 to 17 ring carbon atoms, or a substituted or unsubstituted divalent heterocyclic group having 5 to 17 ring atoms;

mx is 0, 1, or 2;

* represents a bonding position to an atom forming a ring of the formula (1B); and the compound represented by the formula (11B) does not comprise, in a molecule of the compound, three or more of: a substituted or unsubstituted aryl group comprising four or more fused rings; and a substituted or unsubstituted heterocyclic group comprising four or more fused rings, and in the compound represented by the formula (1B):

$R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 17 ring carbon atoms, or a substituted or unsubstituted heterocyclic group having 5 to 17 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

* * * * *